US011437354B2

(12) United States Patent
Ishimatsu et al.

(10) Patent No.: US 11,437,354 B2
(45) Date of Patent: Sep. 6, 2022

(54) SEMICONDUCTOR DEVICE

(71) Applicant: ROHM CO., LTD., Kyoto (JP)

(72) Inventors: Yuji Ishimatsu, Kyoto (JP); Ryuichi Furutani, Kyoto (JP)

(73) Assignee: ROHM CO, LTD., Kyoto (JP)

( * ) Notice: Subject to any disclaimer, the term of this patent is extended or adjusted under 35 U.S.C. 154(b) by 0 days.

(21) Appl. No.: 17/055,044

(22) PCT Filed: Nov. 30, 2018

(86) PCT No.: PCT/JP2018/044138
§ 371 (c)(1),
(2) Date: Nov. 12, 2020

(87) PCT Pub. No.: WO2019/244372
PCT Pub. Date: Dec. 26, 2019

(65) Prior Publication Data

US 2021/0217741 A1 Jul. 15, 2021

(30) Foreign Application Priority Data

Jun. 20, 2018 (JP) ............................ JP2018-116658
Jun. 25, 2018 (JP) ............................ JP2018-120290

(51) Int. Cl.
*H01L 25/16* (2006.01)
*H01L 23/31* (2006.01)
(Continued)

(52) U.S. Cl.
CPC .......... *H01L 25/16* (2013.01); *H01L 23/3107* (2013.01); *H01L 23/49562* (2013.01);
(Continued)

(58) Field of Classification Search
CPC ................ H01L 25/16; H01L 23/3107; H01L 23/49562; H01L 23/49568;
(Continued)

(56) References Cited

U.S. PATENT DOCUMENTS

2009/0129038 A1* 5/2009 Takakusaki ....... H01L 23/49861 361/772
2010/0019391 A1 1/2010 Strzalkowski
(Continued)

FOREIGN PATENT DOCUMENTS

JP 55-159560 11/1980
JP 11-233712 A 8/1999
(Continued)

OTHER PUBLICATIONS

International Search Report issued in PCT/JP2018/044138, dated Jan. 15, 2019 (3 pages).

*Primary Examiner* — Marc Anthony Armand
(74) *Attorney, Agent, or Firm* — Hamre, Schumann, Mueller & Larson, P.C.

(57) ABSTRACT

A semiconductor device A1 includes a substrate 3, a conductive section 5 formed on the substrate 3 and including a conductive material, a lead 1A located on the substrate 3, a semiconductor chip 4A located on the lead 1A, a control chip 4G located on the substrate 3 and electrically connected to the conductive section 5 and the semiconductor chip 4A for controlling an operation of the semiconductor chip 4A, and a resin 7 covering the semiconductor chip 4A, the control chip 4G, at least a part of the substrate 3 and a part of the lead 1A. This configuration contributes to achieving a higher level of integration of the semiconductor device.

19 Claims, 103 Drawing Sheets

(51) Int. Cl.

| | |
|---|---|
| ***H01L 23/495*** | (2006.01) |
| ***H01L 23/522*** | (2006.01) |
| ***H01L 23/00*** | (2006.01) |

(52) U.S. Cl.

CPC .. *H01L 23/49568* (2013.01); *H01L 23/49575* (2013.01); *H01L 23/5227* (2013.01); *H01L 24/06* (2013.01); *H01L 24/48* (2013.01); *H01L 24/49* (2013.01); *H01L 24/73* (2013.01); *H01L 2224/0603* (2013.01); *H01L 2224/48091* (2013.01); *H01L 2224/48139* (2013.01); *H01L 2224/48247* (2013.01); *H01L 2224/4903* (2013.01); *H01L 2224/49111* (2013.01); *H01L 2224/49113* (2013.01); *H01L 2224/49171* (2013.01); *H01L 2224/73265* (2013.01); *H01L 2924/182* (2013.01); *H01L 2924/19042* (2013.01); *H01L 2924/19105* (2013.01)

(58) Field of Classification Search

CPC .......... H01L 23/49575; H01L 23/5227; H01L 24/06; H01L 24/48; H01L 24/49

See application file for complete search history.

(56) References Cited

U.S. PATENT DOCUMENTS

| | | | | |
|---|---|---|---|---|
| 2012/0241933 | A1* | 9/2012 | Doi .................. | H01L 23/49589 257/676 |
| 2013/0062745 | A1* | 3/2013 | Kimura .............. | H01L 23/4334 257/E23.116 |
| 2015/0085454 | A1 | 3/2015 | Hong et al. | |
| 2017/0033035 | A1* | 2/2017 | Sato .................... | H01L 27/0664 |
| 2019/0006258 | A1* | 1/2019 | Muto ............... | H01L 23/49562 |

FOREIGN PATENT DOCUMENTS

| | | | |
|---|---|---|---|
| JP | 2013-51547 | A | 3/2013 |
| JP | 2015-220429 | A1 | 12/2015 |
| WO | 2007/026944 | A1 | 3/2007 |
| WO | 2014/132483 | A1 | 9/2014 |
| WO | 2016/125363 | A1 | 8/2016 |
| WO | 2018/003827 | A1 | 1/2018 |

* cited by examiner

| DESIGN VALUE OF INTERLAYER FILM THICKNESS | VERTICAL BREAKDOWN | TRANSVERSE DIRECTION |
|---|---|---|
| 7.2μm | 10/10pcs | 0/10pcs |
| 9.6μm | 3/10pcs | 7/10pcs |
| 12.0μm | 7/20pcs | 13/20pcs |
| 14.4μm | 0/5pcs | 5/5pcs |

FIG.68 A6

SEMICONDUCTOR DEVICE

TECHNICAL FIELD

The present disclosure relates to a semiconductor device.

BACKGROUND ART

As conventionally known, a semiconductor device may include a semiconductor chip, a control chip in which a control current for controlling an operation current of the semiconductor chip passes, and a resin member encapsulating the semiconductor chip and the control chip (see Patent Literature 1).

CITATION LIST

Patent Literature

PTL 1: JP-A-2015-220429

SUMMARY

Technical Problem

A plurality of types of control signals are inputted to and outputted from the control chip. It is necessary to increase the number of conduction paths to the control chip in order to cope with an increase in number of control signals. However, employing a plurality of metal leads to constitute the conduction paths as is conventionally done may make it difficult to achieve a higher level of integration for the semiconductor device.

The present disclosure has been presented under the foregoing situation and provides semiconductor devices capable of achieving a higher level of integration.

Solution to Problem

In an aspect, the present disclosure provides a semiconductor device including: a substrate; a conductive section formed on the substrate and including a conductive material; a first lead located on the substrate and more heat-dissipative than the substrate; a semiconductor chip located on the first lead; a control chip that controls an operation of the semiconductor chip, where the chip is electrically connected to the conductive section and the semiconductor chip, and located on the substrate so as to be spaced apart from the semiconductor chip and the first lead in a plan view; and a resin covering the semiconductor chip, the control chip, at least a part of the substrate and a part of the lead.

Advantageous Effects of Invention

The present disclosure provides a semiconductor device that enables a higher level of integration to be realized, without compromising heat dissipation characteristics.

Other features and advantages of the present disclosure will become more apparent through the detailed description, given hereunder with reference to the accompanying drawings.

MODE FOR CARRYING OUT INVENTION

Figure 1:
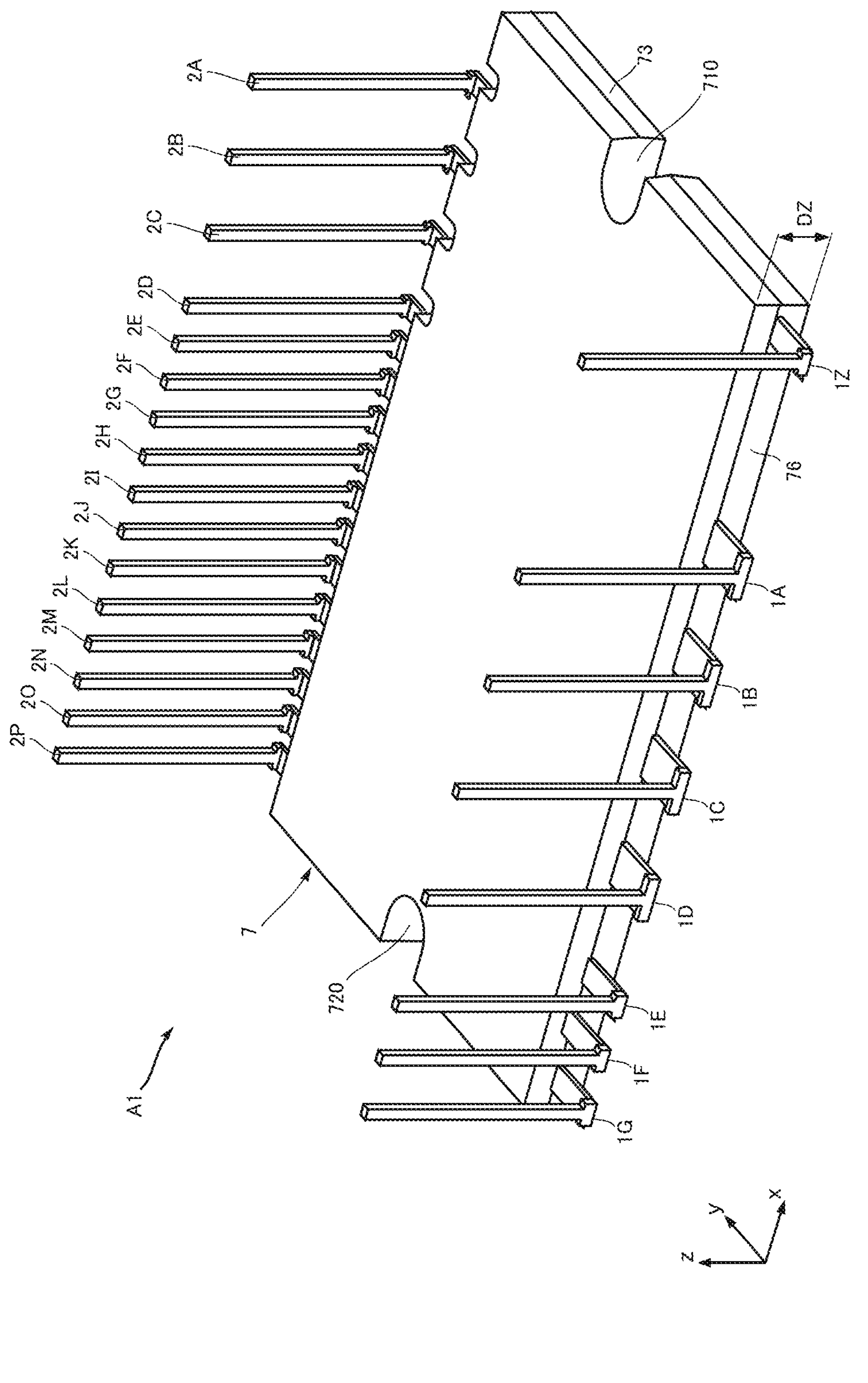
FIG. 1 is a perspective view showing a semiconductor device according to a first embodiment of the present disclosure.

Preferable embodiments of the present disclosure will be described below with reference to the drawings.

The terms "first", "second", "third" and so forth used in the present disclosure merely serve as a label, and are not intended to specify any order with respect to the objects accompanied by these terms.

First Embodiment

FIG. 1 to FIG. 19 illustrate a semiconductor device according to a first embodiment of the present disclosure. The semiconductor device A1 according to this embodiment includes a plurality of leads 1, a plurality of leads 2, a substrate 3, a plurality of semiconductor chips 4, a plurality of control chips 4, a plurality of diodes 49, a conductive section 5, a plurality of bonding sections 6, a plurality of first wires 91, a plurality of second wires 92, and an encapsulating resin 7. The semiconductor device A1 is applicable, for example, to a driver circuit that drives a compressor of an outdoor unit of an air-conditioning apparatus, or a driver circuit that drives a compressor of a refrigerator, or a driver circuit that drives a fan. These driver circuits may be configured to drive a three-phase AC motor, for example.

Figure 2:
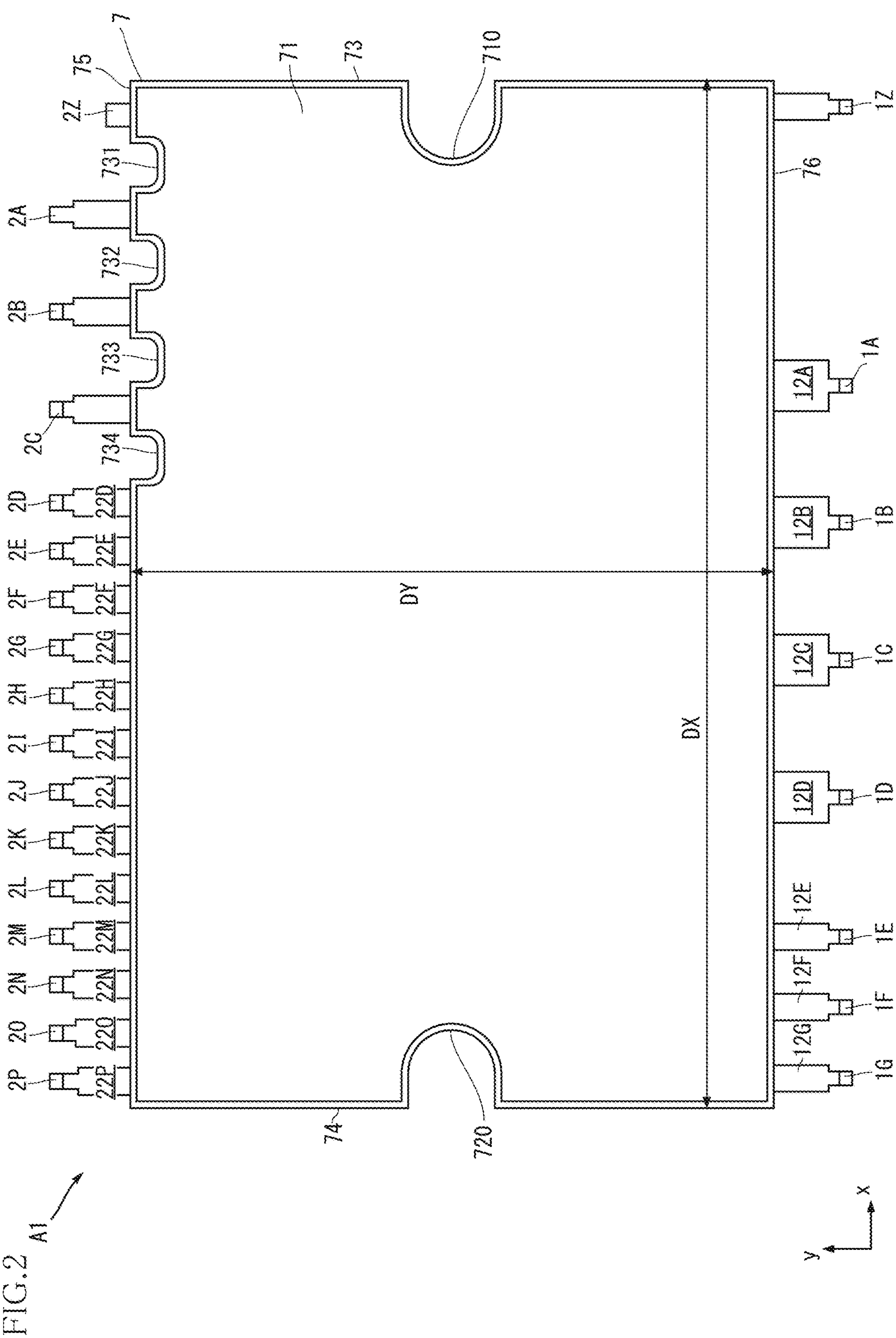
FIG. 2 is a plan view showing the semiconductor device according to the first embodiment of the present disclosure.
Figure 3:
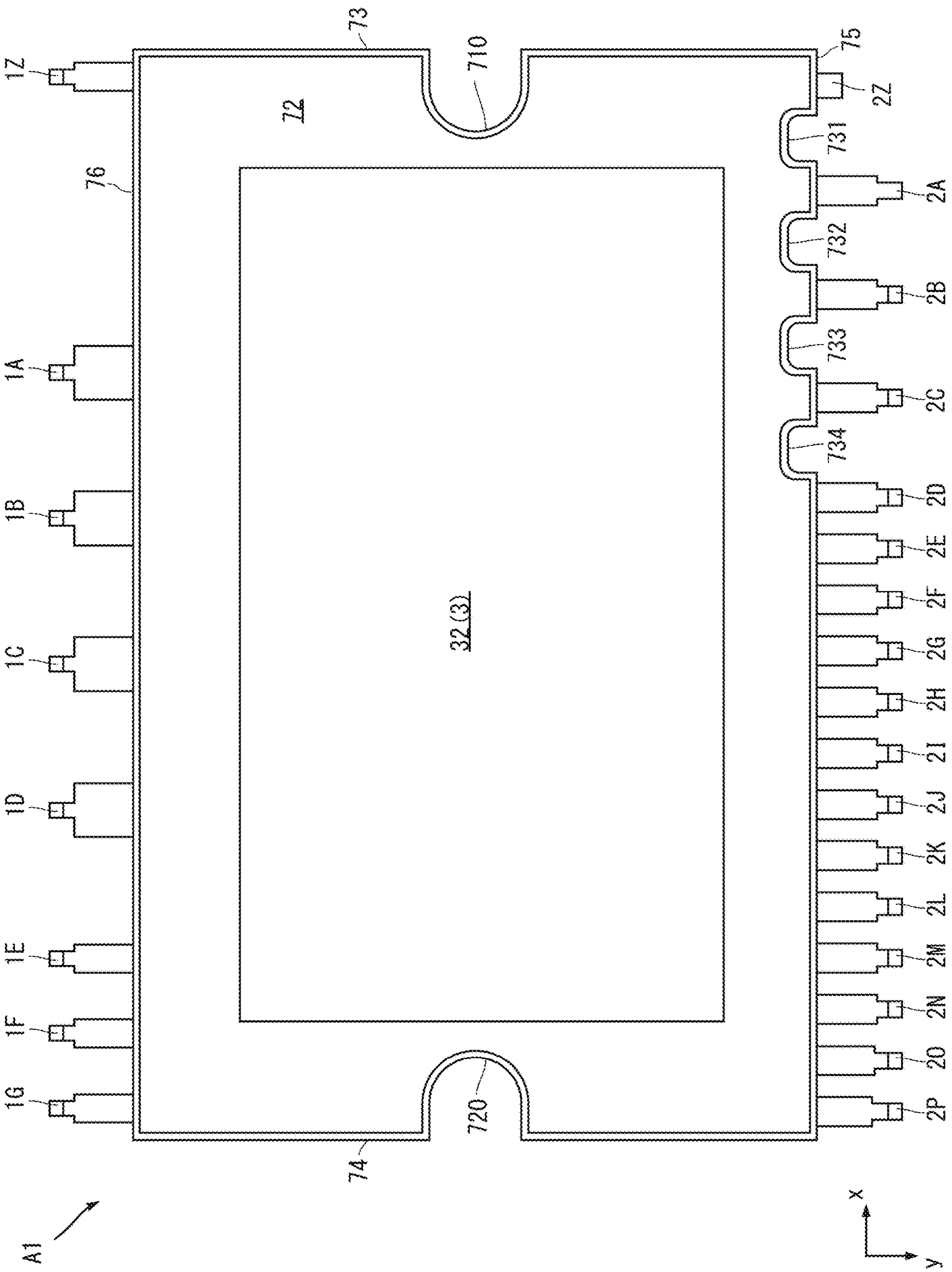
FIG. 3 is a bottom view showing the semiconductor device according to the first embodiment of the present disclosure.
Figure 4:
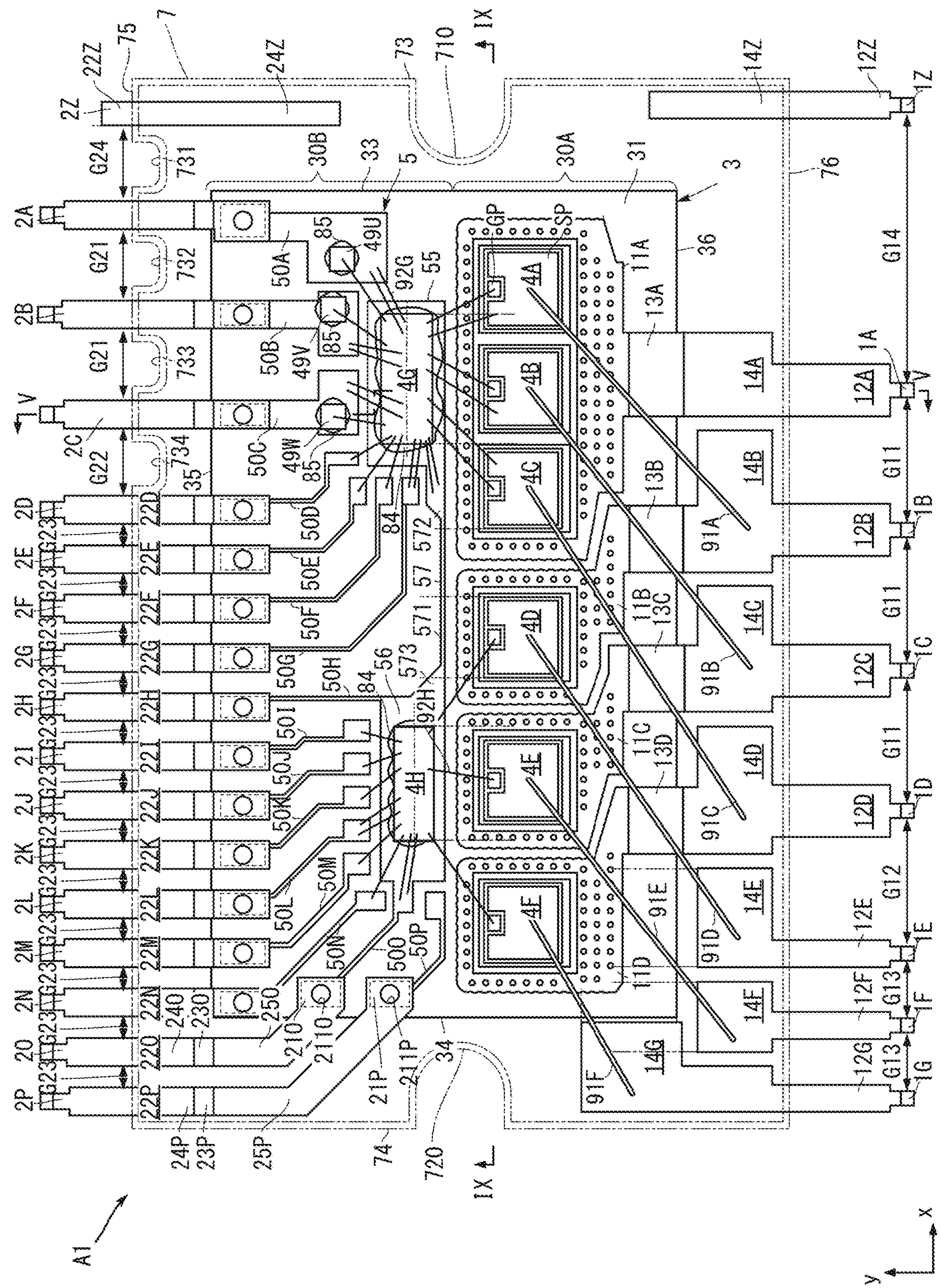
FIG. 4 is a partial plan view of the semiconductor device according to the first embodiment of the present disclosure.
Figure 5:
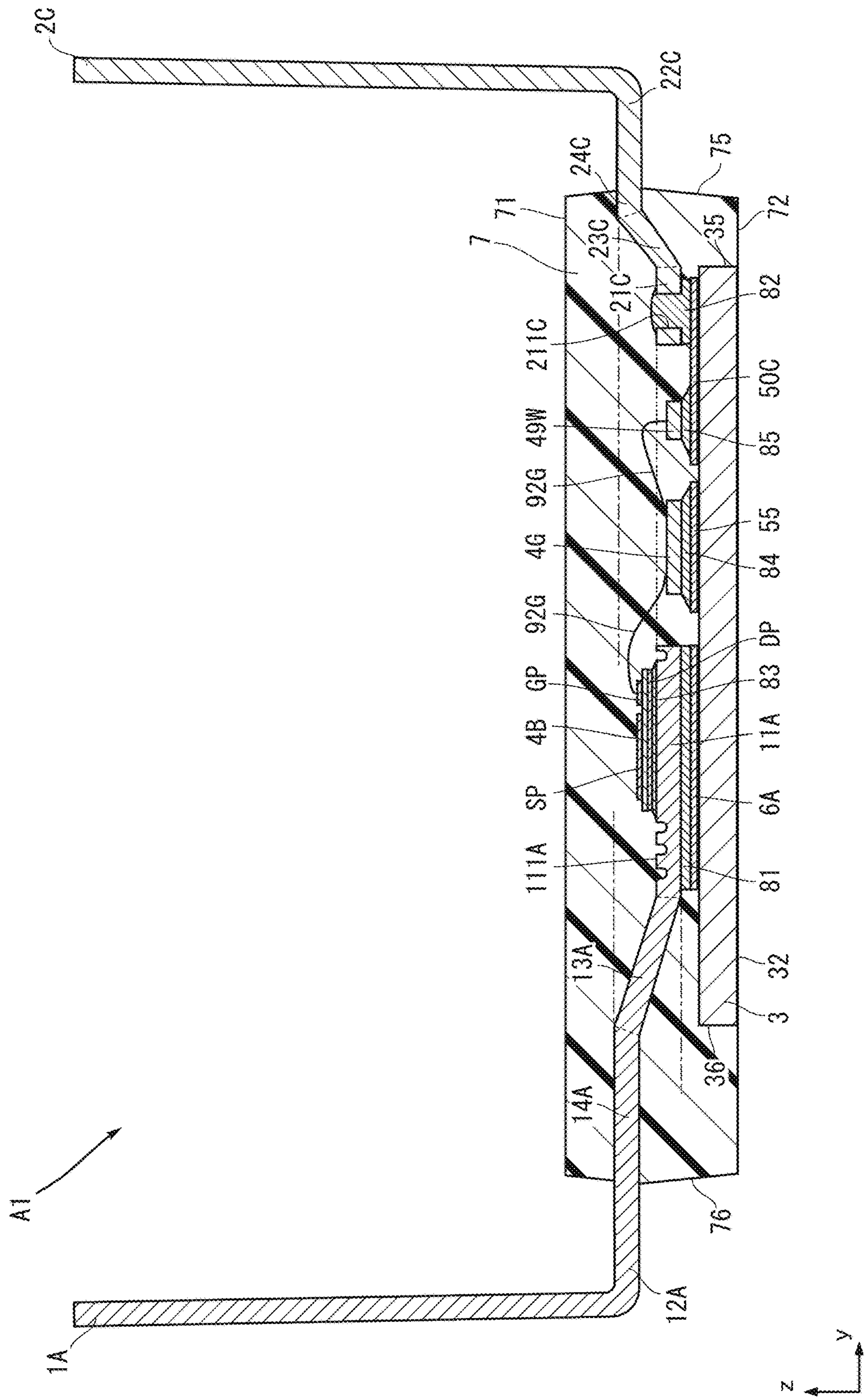
FIG. 5 is a cross-sectional view taken along a line V-V in FIG. 4.
Figure 6:
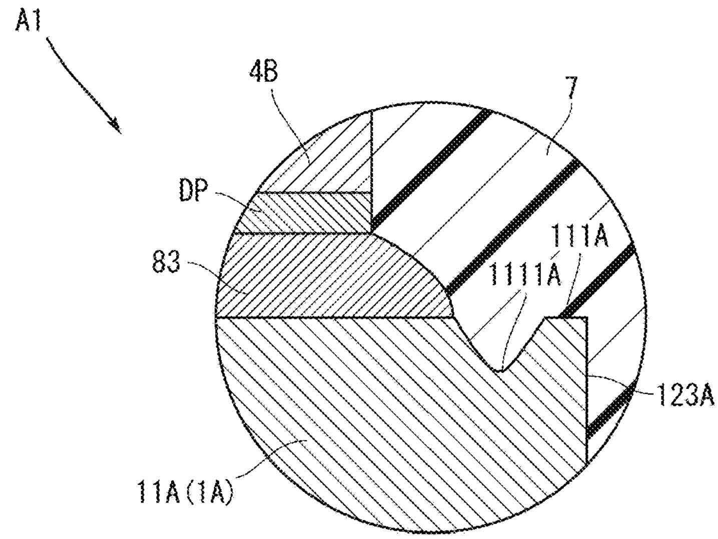
FIG. 6 is an enlarged partial cross-sectional view of the semiconductor device according to the first embodiment of the present disclosure.
Figure 7:
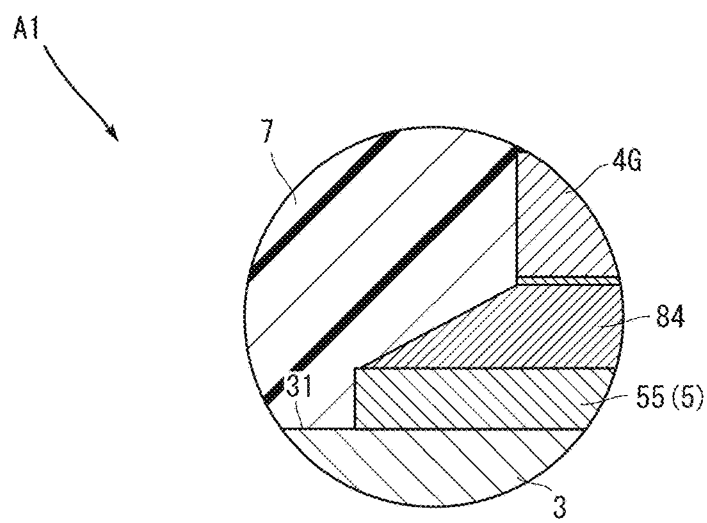
FIG. 7 is an enlarged partial cross-sectional view of the semiconductor device according to the first embodiment of the present disclosure.
Figure 8:
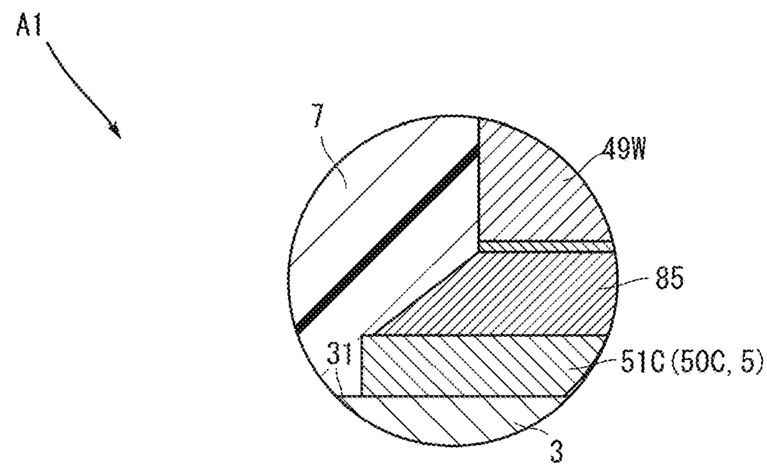
FIG. 8 is an enlarged partial cross-sectional view of the semiconductor device according to the first embodiment of the present disclosure.
Figure 9:
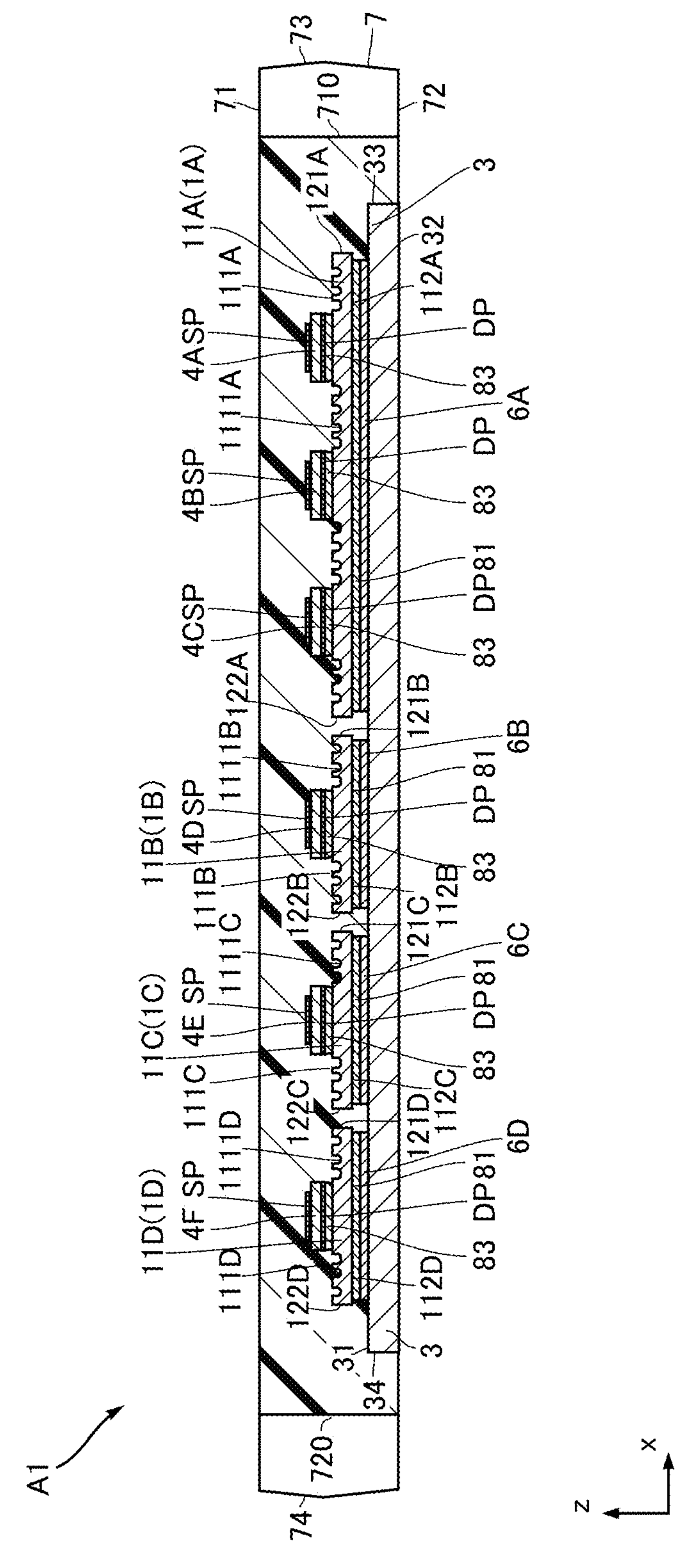
FIG. 9 is a cross-sectional view taken along a line IX-IX in FIG. 4.
Figure 10:
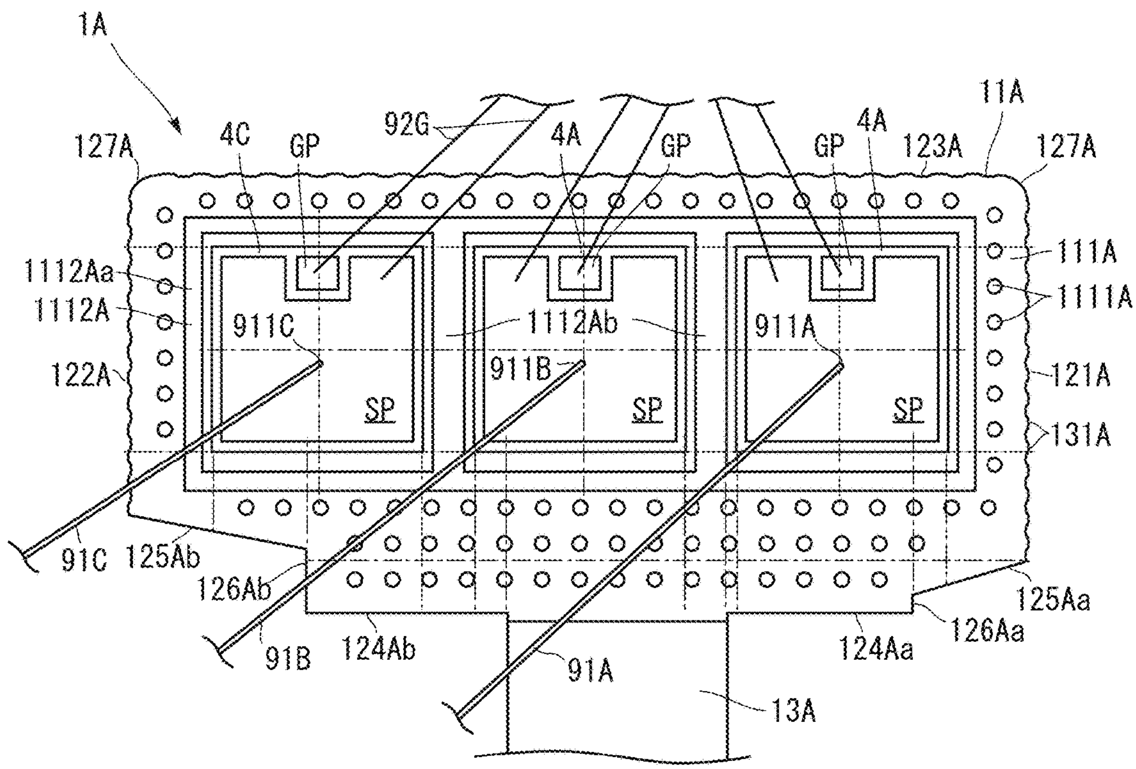
FIG. 10 is an enlarged partial plan view of the semiconductor device according to the first embodiment of the present disclosure.
Figure 14:
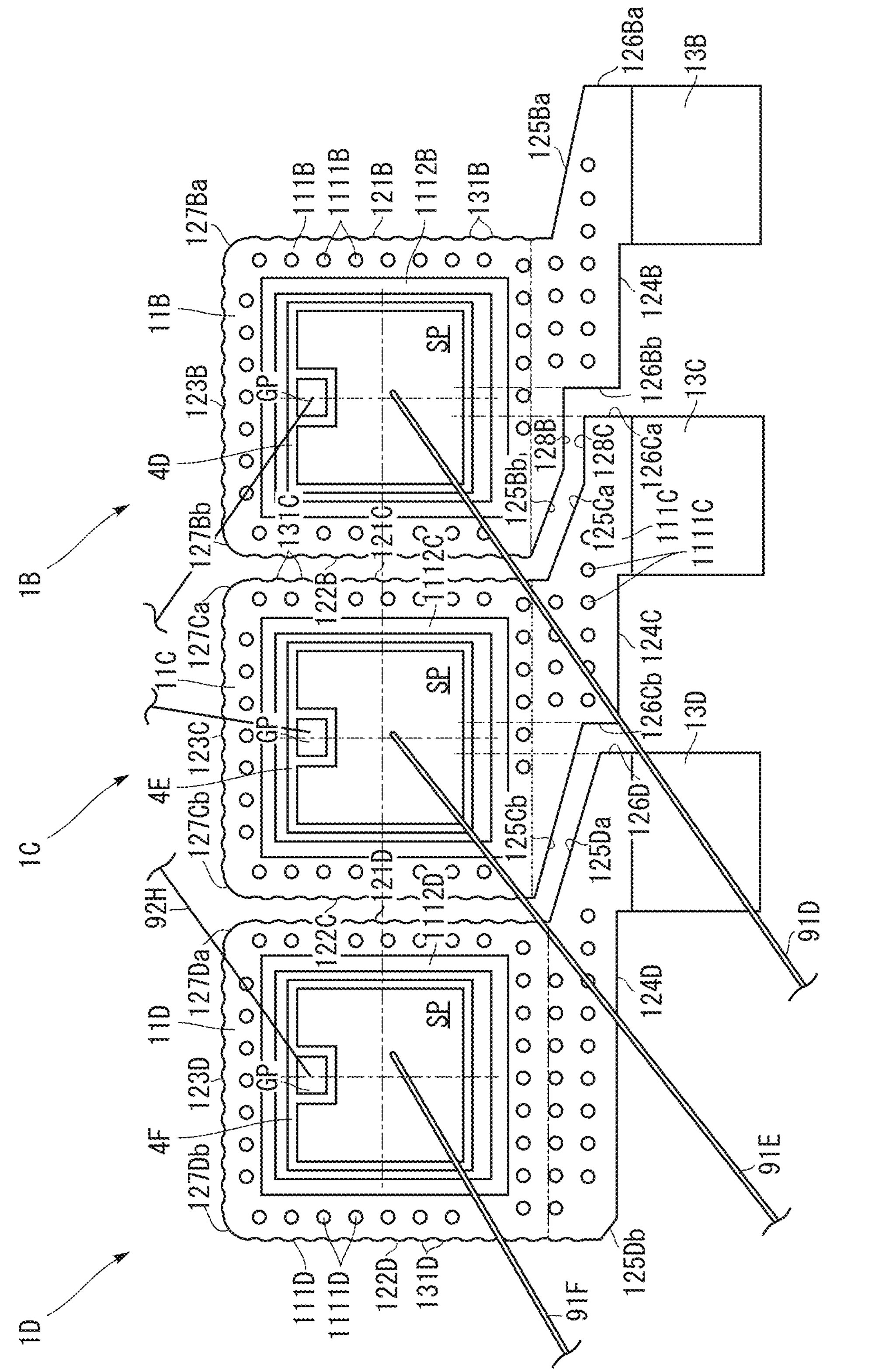
FIG. 14 is an enlarged partial plan view of the semiconductor device according to the first embodiment of the present disclosure.
Figure 15:
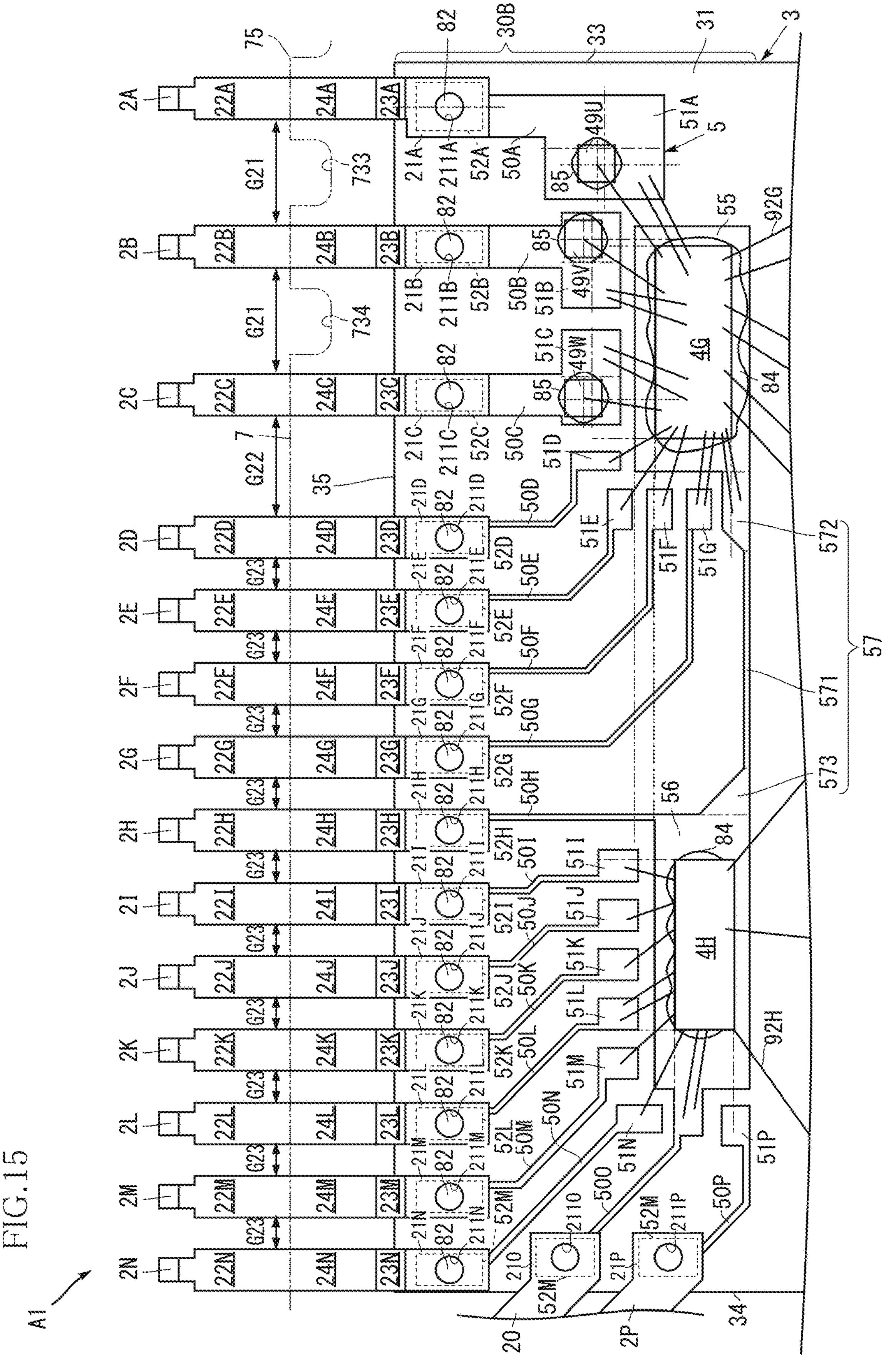
FIG. 15 is an enlarged partial plan view of the semiconductor device according to the first embodiment of the present disclosure.
Figure 16:
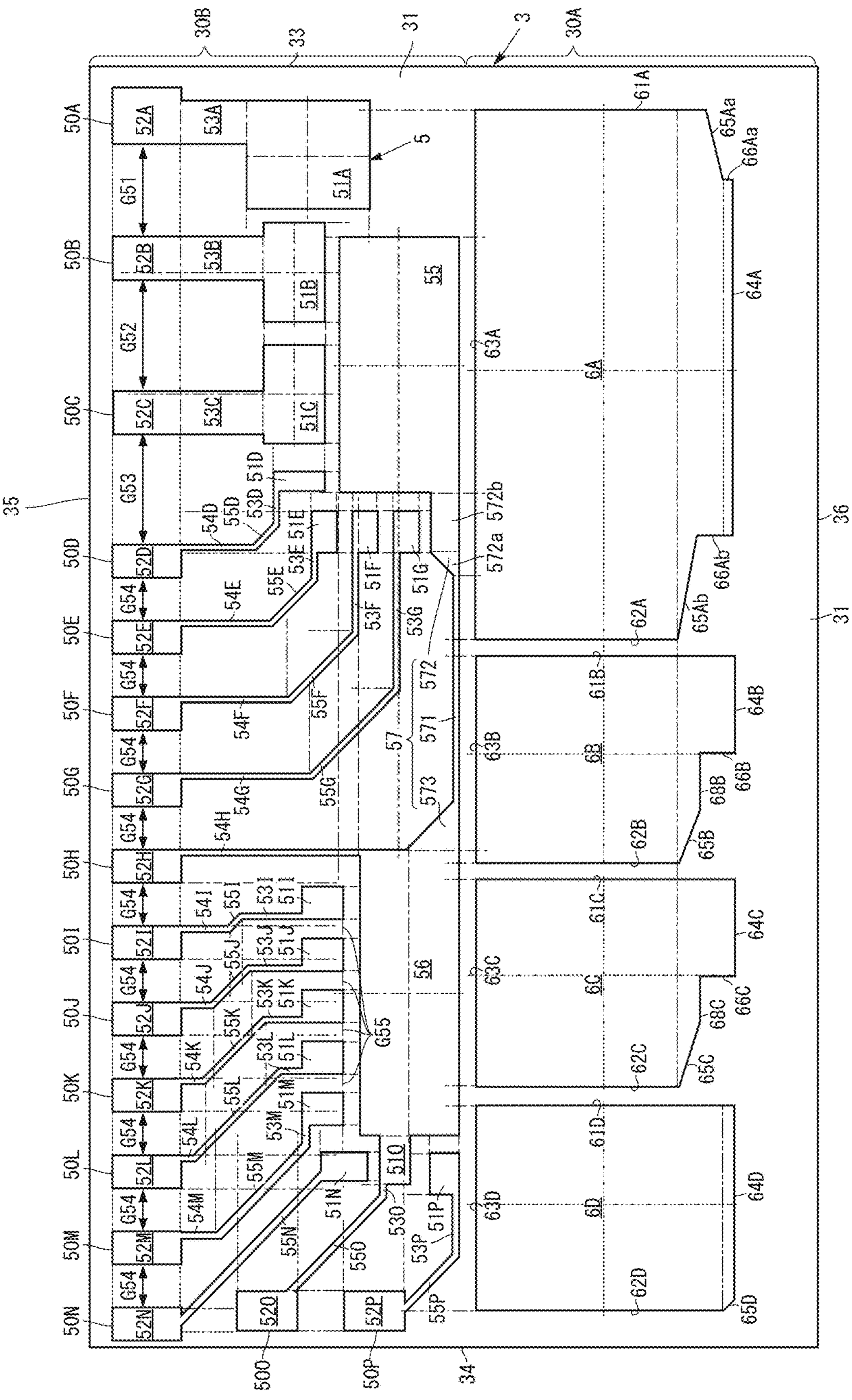
FIG. 16 is an enlarged partial plan view of a substrate of the semiconductor device according to the first embodiment of the present disclosure.
Figure 17:
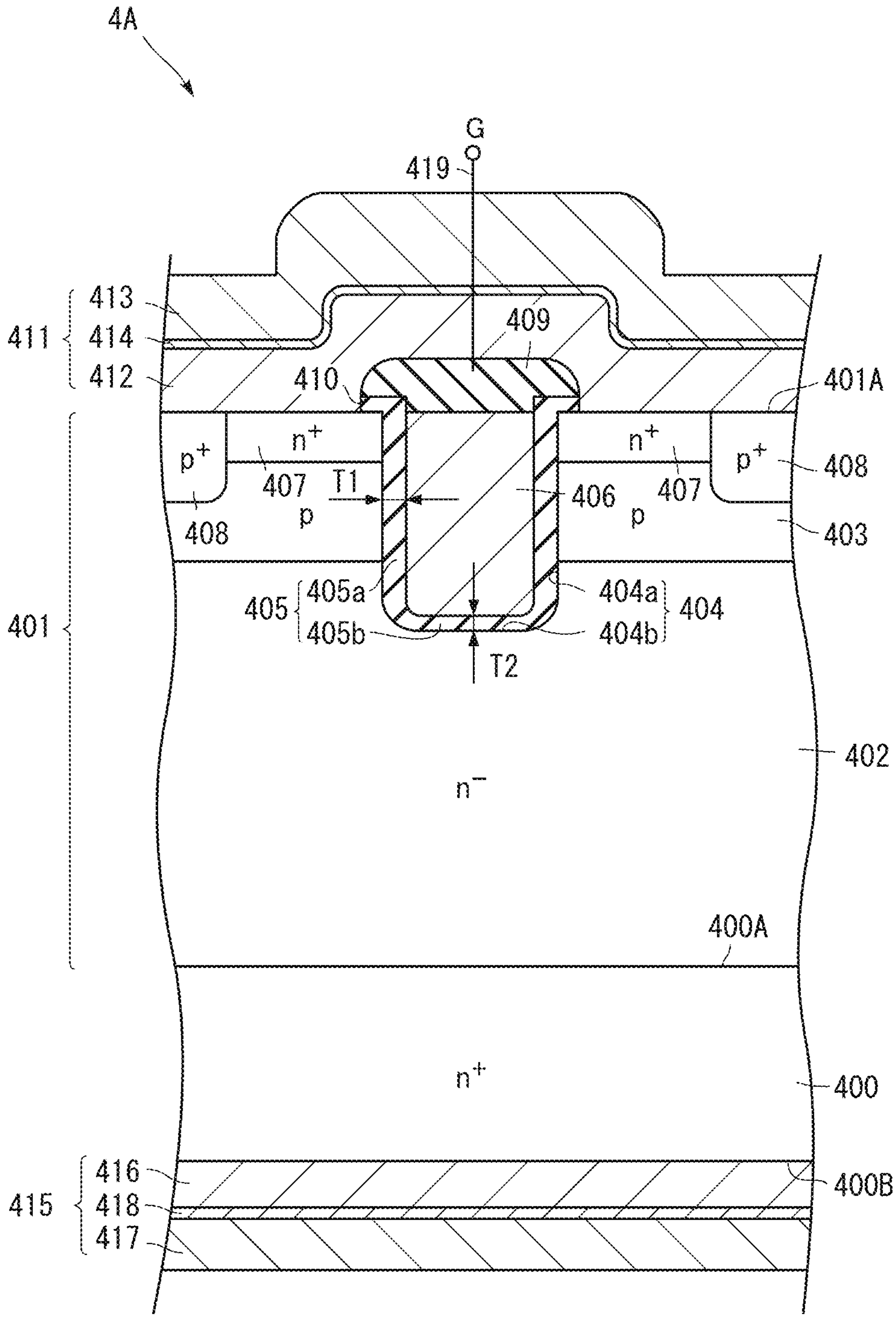
FIG. 17 is an enlarged partial cross-sectional view of the semiconductor device according to the first embodiment of the present disclosure.
Figure 18:
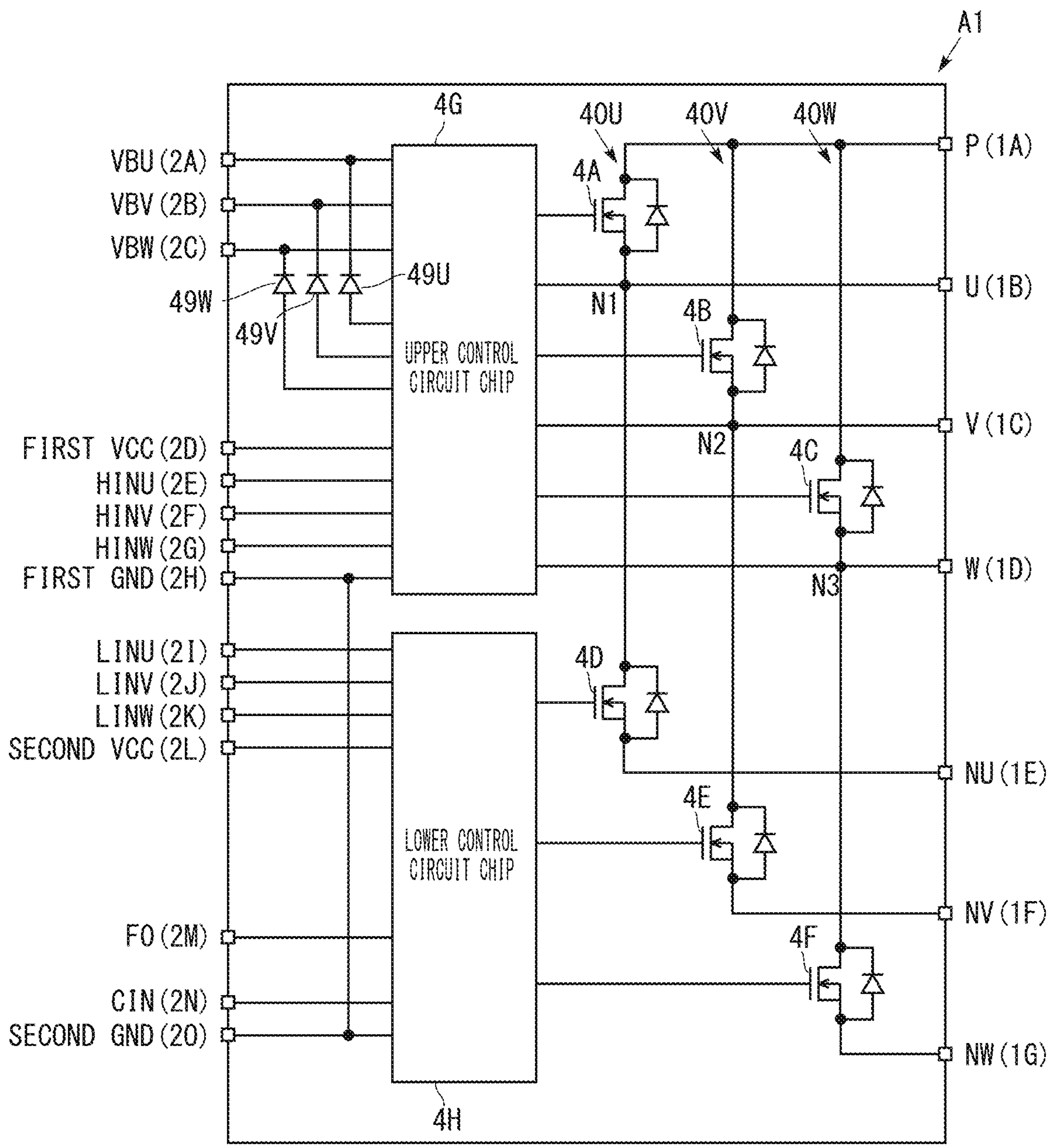
FIG. 18 is a schematic circuit diagram showing an electrical configuration of the semiconductor device according to the first embodiment of the present disclosure.
Figure 19:
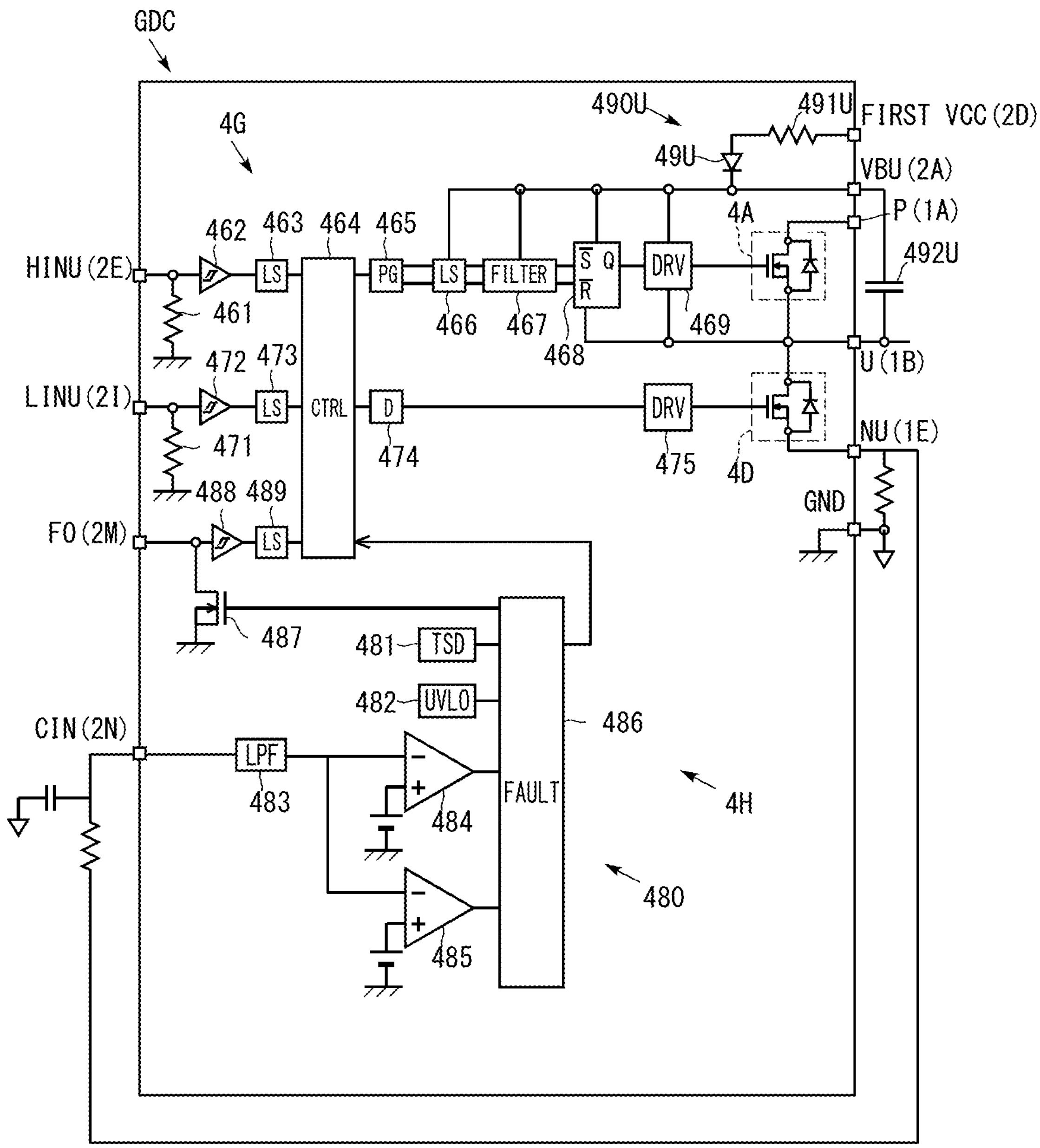
FIG. 19 is a circuit diagram showing a part of the circuit configuration of the semiconductor device according to the first embodiment of the present disclosure.

FIG. 1 is a perspective view showing the semiconductor device A1. FIG. 2 is a plan view showing the semiconductor device A1. FIG. 3 is a bottom view showing the semiconductor device A1. FIG. 4 is a partial plan view of the semiconductor device A1. FIG. 5 is a cross-sectional view taken along a line V-V in FIG. 4. FIG. 6 is an enlarged partial cross-sectional view of the semiconductor device A1. FIG. 7 is an enlarged partial cross-sectional view of the semiconductor device A1. FIG. 8 is an enlarged partial cross-sectional view of the semiconductor device A1. FIG. 9 is a cross-sectional view taken along a line IX-IX in FIG. 4. FIG. 10 is an enlarged partial plan view of the semiconductor device A1. FIG. 14 is an enlarged partial plan view of the semiconductor device A1. FIG. 15 is an enlarged partial plan view of the semiconductor device A1. FIG. 16 is an enlarged partial plan view of a substrate of the semiconductor device A1. FIG. 17 is an enlarged partial cross-sectional view of the semiconductor device A1. FIG. 18 is a schematic circuit diagram showing an electrical configuration of the semiconductor device A1. FIG. 19 is a circuit diagram showing a part of the circuit configuration of the semiconductor device A1.

In the mentioned drawings, a z-direction corresponds to a thickness direction of the substrate 3. An x-direction, which is orthogonal to the z-direction, corresponds to the first direction in the present disclosure. A y-direction is orthogonal to both of the z-direction and the x-direction.

<Substrate 3>

The material of the substrate 3 is not specifically limited. It is preferable that the material of the substrate 3 has higher thermal conductivity, for example than the material of the resin 7. Examples of the material of the substrate 3 include ceramics such as alumina ($Al_2O_3$), silicon nitride (SiN), aluminum nitride (AlN), and zirconia-containing alumina. The thickness of the substrate 3 is not specifically limited, but may be, for example, approximately 0.1 mm to 1.0 mm.

The shape of the substrate 3 is not specifically limited. In this embodiment, as shown in FIG. 4 to FIG. 9, the substrate 3 includes a first face 31, a second face 32, a third face 33, a fourth face 34, a fifth face 35, and a sixth face 36. The first face 31 is oriented in the z-direction. The second face 32 is oriented to the opposite side of the first face 31, in the z-direction. The third face 33 is located between the first face and the second face 32 in the z-direction and, in the illustrated example, connected to the first face 31 and the second face 32. The third face 33 is oriented in the x-direction. The fourth face 34 is located between the first face and the second face 32 in the z-direction and, in the illustrated example, connected to the first face 31 and the second face 32. The fourth face 34 is oriented to the opposite side of the third face 33, in the x-direction. The fifth face 35 is located between the first face 31 and the second face 32 in the z-direction and, in the illustrated example, connected to the first face 31 and the second face 32, The fifth face 35 is oriented in the y-direction. The sixth face 36 is located between the first face 31 and the second face 32 in the z-direction and, in the illustrated example, connected to the first face 31 and the second face 32. The sixth face 36 is oriented to the opposite side of the fifth face 35, in the y-direction. In the illustrated example, the substrate 3 has a rectangular shape as viewed in the z-direction. The substrate 3 has an elongate rectangular shape, having the long sides extending along the x-direction, as viewed in the z-direction.

<Conductive Section 5>

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

The shape of the conductive section 5 is not specifically limited. In this embodiment, for example as shown in FIG. 16, the conductive section 5 includes wirings 50A to 50P, a first base portion 55, a second base portion 56, and a connecting portion 57, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The shape of the second base portion 56 is not specifically limited, and a desired shape may be selected from a rectangular shape, a polygonal shape, a circular shape, an elliptical shape, and so forth. In the illustrated example, the second base portion 56 has a rectangular shape. In the illustrated example, the second base portion 56 has an elongate rectangular shape, having the long sides extending along the x-direction.

The second base portion 56 is located on the side of the fourth face 34 with respect to the first base portion 55, in the x-direction. In the illustrated example, the edge of the second base portion 56 on the side of the sixth face 36 in the y-direction is located generally at the same position as the edge of the first base portion 55 on the side of the sixth face 36, in the y-direction. Here, the expression "located generally at the same position" in the y-direction refers to, for example, being located exactly at the same position, or being deviated by within ±5% of the characteristic size (size of the first base portion 55 or second base portion 56 in the y-direction). In the illustrated example, the edge of the second base portion 56 on the side of the fifth face 35 in the y-direction is located on the side of the sixth face 36, with respect to the edge of the first base portion 55 on the side of the fifth face 35. In the illustrated example, the center of the second base portion 56 in the y-direction is located on the side of the sixth face 36, with respect to the center of the first base portion 55 in the y-direction.

The connecting portion 57 is interposed between the first base portion 55 and the second base portion 56 and, in the illustrated example, connecting the first base portion 55 and the second base portion 56. In the illustrated example, the connecting portion 57 is located between the first base portion 55 and the second base portion 56, as viewed in the y-direction. The shape of the connecting portion 57 is not specifically limited. In the illustrated example, the connecting portion 57 includes a first portion 571, a second portion 572, and a third portion 573, each of which will be described hereunder.

The first portion 571 is located between the first base portion 55 and the second base portion 56, as viewed in the y-direction. The shape of the first portion 571 is not specifically limited. In the illustrated example, the first portion 571 has a strip shape extending along the x-direction. In the illustrated example, the size of the first portion 571 in the y-direction is constant.

The second portion 572 is interposed between the first portion 571 and the first base portion 55 and, in the illustrated example, connected to the first portion 571 and the first base portion 55. The second portion 572 is larger in size in the y-direction, than the first portion 571. The shape of the second portion 572 is not specifically limited. In the illustrated example, the second portion 572 includes a fourth portion 572*a* and a fifth portion 572*b*, each of which will be described hereunder. The fourth portion 572*a* is a portion where the size in the y-direction increases in the direction from the first portion 571 toward the first base portion 55. In the fifth portion 572*b*, the size in the y-direction is constant. The fifth portion 572*b* is larger in size in the x-direction, than the fourth portion 572*a*.

The third portion 573 is interposed between the first portion 571 and the second base portion 56 and, in the illustrated example, connected to the first portion 571 and the second base portion 56. The third portion 573 is larger in size in the y-direction, than the first portion 571. The shape of the third portion 573 is not specifically limited. In the illustrated example, the size of the third portion 573 in the y-direction increases in the direction from the first portion 571 toward the second base portion 56.

In the illustrated example, the respective edges of the first base portion 55, the second base portion 56, and the connecting portion 57 on the side of the sixth face 36 in the y-direction are located generally at the same position in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The wiring 50A includes a first portion 51A, a second portion 52A, and a third portion 53A, each of which will be described hereunder.

The shape of the first portion 51A is not specifically limited, and a desired shape may be selected from a rectangular shape, a polygonal shape, a circular shape, an elliptical shape, and so forth. In the illustrated example, the first portion 51A has a rectangular shape. In this embodiment, the first portion 51A is located on the side of the third face 33 in the x-direction with respect to the first base portion 55, and spaced therefrom. In the illustrated example, in addition, the first portion 51A partially overlaps with the first base portion 55, as viewed in the x-direction. The center of the first portion 51A in the y-direction is located on the side of the fifth face 35, with respect to the first base portion 55.

The second portion 52A is located on the side of the fifth face 35 with respect to the first portion 51A, in the y-direction. The shape of the second portion 52A is not specifically limited, and a desired shape may be selected from a rectangular shape, a polygonal shape, a circular shape, an elliptical shape, and so forth. In the illustrated example, the first portion 51A has a rectangular shape. In the illustrated example, an end portion of the second portion 52A in the x-direction includes a portion extending toward the third face 33 in the x-direction, with respect to the first portion 51A. An end portion of the first portion 51A in the x-direction includes a portion extending toward the fourth face 34 in the x-direction, with respect to the second portion 52A.

The third portion 53A is interposed between the first portion 51A and the second portion 52A and, in the illustrated example, connected to the first portion 51A and the second portion 52A. The shape of the third portion 53A is not specifically limited. In the illustrated example, the third portion 53A has a rectangular shape. In the illustrated example, the edge of the third portion 53A on the side of the fourth face 34 in the x-direction is linearly connected to the edge of the second portion 52A on the side of the fourth face 34. The edge of the third portion 53A on the side of the third face 33 in the x-direction is linearly connected to the edge of the first portion 51A on the side of the third face 33. In the illustrated example, the second portion 52A and the third portion 53A are located on the side of the third face 33 in the x-direction, with respect to the center of the first portion 51A in the x-direction.

The wiring 50B includes a first portion 51B, a second portion 52B, and a third portion 53B, each of which will be described hereunder.

The shape of the first portion 51B is not specifically limited, and a desired shape may be selected from a rectangular shape, a polygonal shape, a circular shape, an elliptical shape, and so forth. In the illustrated example, the first portion 518 has a rectangular shape. In this embodiment, the first portion 51B is located on the side of the fifth face 35 in the y-direction with respect to the first base portion 55, and spaced therefrom. In addition, the first portion 51B is located on the side of the fourth face 34 in the x-direction with respect to the first portion 51A, and spaced therefrom. In the illustrated example, the first portion 51B at least partially overlaps with the first portion 51A, as viewed in the x-direction, and generally the entirety of the first portion 51B overlaps with the first portion 51A. Here, the expression "generally the entirety overlaps" refers to completely overlapping in its entirety, or being deviated by within 5% from each other. In the illustrated example, the center the first portion 51B in the y-direction is located on the side of the fifth face 35, with respect to the center of the first portion 51A in the y-direction. In the illustrated example, an end portion of the first portion 51B in the x-direction includes a portion extending toward the third face 33 in the x-direction, with respect to the first base portion 55. In the illustrated example, the center of the first portion 51B in the x-direction overlaps with the first base portion 55, as viewed in the y-direction.

The second portion 52B is located on the side of the fifth face 35 with respect to the first portion 51B, in the y-direction. In addition, the second portion 52B is located on the side of the fourth face 34 in the x-direction with respect to the second portion 52A, and spaced therefrom by a clearance G51. The shape of the second portion 52B is not specifically limited, and a desired shape may be selected from a rectangular shape, a polygonal shape, a circular shape, an elliptical shape, and so forth. In the illustrated example, the second portion 52B has a rectangular shape. In the illustrated example, in addition, generally the entirety of the second portion 52B overlaps with the first portion 51B, as viewed in the y-direction. Here, the expression "generally the entirety overlaps" refers to completely overlapping in its entirety, or being deviated by within 5% from each other. In the illustrated example, the second portion 52B generally coincides with the second portion 52A, as viewed in the x-direction. Here, the expression "generally coincides" as viewed in the x-direction refers to, for example, exactly coinciding with each other, or being deviated by within ±5% of the characteristic size (size of the second portion 52A or second portion 52B in the y-direction). In the illustrated example, the second portion 52B is shifted toward the third face 33, from the center of the first portion 51B in the x-direction.

The third portion 53B is interposed between the first portion 51B and the second portion 52B and, in the illustrated example, connected to the first portion 51B and the second portion 52B. The shape of the third portion 53B is not specifically limited. In the illustrated example, the third portion 53B has a rectangular shape. In the illustrated example, the third portion 53B generally coincides with the second portion 52B, as viewed in the y-direction. Here, the expression "generally coincides" as viewed in the y-direction refers to, for example, exactly coinciding with each other, or being deviated by within ±5% of the characteristic size (size of the second portion 52B or third portion 53B in the x-direction). In the illustrated example, the third portion 53B is shifted toward the third face 33, from the center of the first portion 51B in the x-direction.

The wiring 50C includes a first portion 51C, a second portion 52C, and a third portion 53C, each of which will be described hereunder.

The shape of the first portion 51C is not specifically limited, and a desired shape may be selected from a rectangular shape, a polygonal shape, a circular shape, an elliptical shape, and so forth. In the illustrated example, the first portion 51C has a rectangular shape. In this embodiment, the first portion 51C is located on the side of the fifth face 35 in the y-direction with respect to the first base portion 55, and spaced therefrom. In addition, the first portion 51C is located on the side of the fourth face 34 in the x-direction with respect to the first portion 51A, and spaced therefrom. In the illustrated example, the first portion 51C generally coincides with the first portion 51B, as viewed in the x-direction. Here, the expression "generally coincides" as viewed in the x-direction refers to, for example, exactly coinciding with each other, or being deviated by within ±5% of the characteristic size (size of the first portion 51B or first portion 51C in the y-direction). In the illustrated example, the center the first portion 51C in the y-direction is located on the side of the fifth face 35, with respect to the center of the first portion 51A in the y-direction. In the illustrated example, the first portion 51C is shifted toward the fourth face 34, from the center of the first base portion 55 in the x-direction. In the illustrated example, the center of the first portion 51C in the x-direction overlaps with the first base portion 55, as viewed in the y-direction.

The second portion 52C is located on the side of the fifth face 35 with respect to the first portion 51C, in the y-direction. In addition, the second portion 52C is located on the side of the fourth face 34 in the x-direction with respect to the second portion 52B, and spaced therefrom by a clearance G52. In the illustrated example, the clearance G52 is wider than the clearance G51. The shape of the second portion 52C is not specifically limited, and a desired shape may be selected from a rectangular shape, a polygonal shape, a circular shape, an elliptical shape, and so forth. In the illustrated example, the second portion 52C has a rectangular shape. In the illustrated example, in addition, generally the entirety of the second portion 52C overlaps with the first portion 51C, as viewed in the y-direction. Here, the expression "generally the entirety overlaps" refers to completely overlapping in its entirety, or being deviated by within 5% from each other. In the illustrated example, the second portion 52C generally coincides with the second portion 52B, as viewed in the x-direction. Here, the expression "generally coincides" as viewed in the x-direction refers to, for example, exactly coinciding with each other, or being deviated by within ±5% of the characteristic size (size of the second portion 52B or second portion 52C in the y-direction). In the illustrated example, the second portion 52C is shifted toward the fourth face 34, from the center of the first portion 51C in the x-direction.

The third portion 53C is interposed between the first portion 51C and the second portion 52C and, in the illustrated example, connected to the first portion 51C and the second portion 52C. The shape of the third portion 53C is not specifically limited. In the illustrated example, the third portion 53C has a rectangular shape. In the illustrated example, the third portion 53C generally coincides with the second portion 52C, as viewed in the y-direction. Here, the expression "generally coincides" as viewed in the y-direction refers to, for example, exactly coinciding with each other, or being deviated by within ±5% of the characteristic size (size of the second portion 52C and the third portion 53C in the x-direction). In the illustrated example, the third portion 53C generally coincides with the third portion 53B, as viewed in the x-direction. Here, the expression "generally coincides" as viewed in the x-direction refers to, for example, exactly coinciding with each other, or being deviated by within ±5% of the characteristic size (size of the third portion 53B and the third portion 53C in the y-direction). In the illustrated example, the third portion 53C is shifted toward the fourth face 34, from the center of the first portion 51C in the x-direction.

The wiring 50D includes a first portion 51D, a second portion 52D, a third portion 53D, a fourth portion 54D, and a fifth portion 55D, each of which will be described hereunder.

The first portion 51D is located on the side of the fifth face 35 in the y-direction with respect to the first base portion 55, and spaced therefrom. The shape of the first portion 51C is not specifically limited, and a desired shape may be selected from a rectangular shape, a polygonal shape, a circular shape, an elliptical shape, and so forth. In the illustrated example, the first portion 51C has an elongate rectangular shape, having the long sides extending along the y-direction. In the illustrated example, the first portion 51D overlaps with the first base portion 55, as viewed in the y-direction. The edge of the first portion 51D on the side of the fourth face 34 in the x-direction generally coincides with the edge of the first base portion 55 on the side of the fourth face 34, as viewed in the y-direction. Here, the expression "generally coincides" as viewed in the y-direction refers to, for example, exactly coinciding with each other, or being deviated by within ±5% of the characteristic size (size of the first portion 51D and the first base portion 55 in the x-direction). The first portion 51D is smaller in size in the y-direction, than the first portion 51C.

The second portion 52D is located on the side of the fifth face 35 with respect to the first portion 51D, in the y-direction. In addition, the second portion 52D is located on the side of the fourth face 34 with respect to the first portion 51D, in the x-direction. The second portion 52D is located on the side of the fourth face 34 in the x-direction with respect to the second portion 52C, and spaced therefrom by a clearance G53. The clearance G53 is generally the same in size as the clearance G52 (exactly the same, or different by within ±5%). The shape of the second portion 52D is not specifically limited, and a desired shape may be selected from a rectangular shape, a polygonal shape, a circular shape, an elliptical shape, and so forth. In the illustrated example, the second portion 52D has an elongate rectangular shape, having the long sides extending along the y-direction. In the illustrated example, the second portion 52D is spaced apart from the first portion 51D, as viewed in the y-direction. In the illustrated example, the second portion 52D generally coincides with the second portion 52C, as viewed in the x-direction. Here, the expression "generally coincides" as viewed in the x-direction refers to, for example, exactly coinciding with each other, or being deviated by within ±5% of the characteristic size (size of the second portion 52C or second portion 52D in the y-direction).

The third portion 53D is interposed between the first portion 51D and the second portion 52D and, in the illustrated example, connected to the edge of the first portion 51D on the side of the fourth face 34 in the x-direction. The shape of the third portion 53D is not specifically limited. In the illustrated example, the third portion 53D has a strip shape extending along the x-direction. The third portion 53D is spaced apart from the second portion 52D, as viewed in the y-direction.

The fourth portion 54D is interposed between the first portion 51D and the second portion 52D and, in the illustrated example, connected to the edge of the second portion 52D on the side of the sixth face 36 in the y-direction. The shape of the fourth portion 54D is not specifically limited. In the illustrated example, the fourth portion 54D has a strip shape extending along the y-direction. The fourth portion 54D is spaced apart from the first portion 51D, as viewed in the x-direction.

The fifth portion 55D is interposed between the third portion 53D and the fourth portion 54D and, in the illustrated example, connected to the third portion 53D and the fourth portion 54D. The shape of the fifth portion 55D is not specifically limited. In the illustrated example, the fifth portion 55D has a strip shape inclined with respect to the x-direction and the y-direction.

The wiring 50E includes a first portion 51E, a second portion 52E, a third portion 53E, a fourth portion 54E, and a fifth portion 55E, each of which will be described hereunder.

The first portion 51E is spaced apart from the first base portion 55 toward the fifth face 35 in the y-direction, and toward the fourth face 34 in the x-direction. In addition, the first portion 51E is located on the side of the fourth face 34 in the x-direction with respect to the first portion 51D, and spaced therefrom. The shape of the first portion 51E is not specifically limited, and a desired shape may be selected from a rectangular shape, a polygonal shape, a circular shape, an elliptical shape, and so forth. In the illustrated example, the first portion 51E has an elongate rectangular shape, having the long sides extending along the x-direction. In the illustrated example, first portion 51E is spaced apart from the first base portion 55, as viewed in the y-direction. In the illustrated example, the first portion 51D overlaps with the first base portion 55, as viewed in the y-direction. The first portion 51E overlaps with the first portion 51D, as viewed in the x-direction. Further, the first portion 51E overlaps with the second portion 52D, as viewed in the y-direction.

The second portion 52E is located on the side of the fifth face 35 with respect to the first portion 51E, in the y-direction. In addition, the second portion 52E is located on the side of the fourth face 34 with respect to the first portion 51E, in the x-direction. The second portion 52E is located on the side of the fourth face 34 in the x-direction with respect to the second portion 52D, and spaced therefrom by a clearance G54. The clearance G54 is narrower than the clearance G53. Here, a difference in size of the clearance G54, referred to in relation to the wirings 50E to 50N, is within ±5%. The shape of the second portion 52E is not specifically limited, and a desired shape may be selected from a rectangular shape, a polygonal shape, a circular shape, an elliptical shape, and so forth. In the illustrated example, the second portion 52E has an elongate rectangular shape, having the long sides extending along the y-direction. In the illustrated example, the second portion 52E is spaced apart from the first portion 51E, as viewed in the y-direction. In the illustrated example, the second portion 52E generally coincides with the second portion 52D, as viewed in the x-direction. Here, the expression "generally coincides" as viewed in the x-direction refers to, for example, exactly coinciding with each other, or being deviated by within ±5% of the characteristic size (size of the second portion 52D or second portion 52E in the y-direction).

The third portion 53E is interposed between the first portion 51E and the second portion 52E and, in the illustrated example, connected to the edge of the first portion 51E on the side of the fourth face 34 in the x-direction. The shape of the third portion 53E is not specifically limited. In the illustrated example, the third portion 53E has a strip shape extending along the x-direction. The third portion 53E is spaced apart from the second portion 52E, as viewed in the y-direction.

The fourth portion 54E is interposed between the first portion 51E and the second portion 52E and, in the illustrated example, connected to the edge of the second portion 52E on the side of the sixth face 35 in the y-direction. The shape of the fourth portion 54E is not specifically limited. In the illustrated example, the fourth portion 54E has a strip shape extending along the y-direction. The fourth portion 54E is spaced apart from the first portion 51E, as viewed in the x-direction.

The fifth portion 55E is interposed between the third portion 53E and the fourth portion 54E and, in the illustrated example, connected to the third portion 53E and the fourth portion 54E. The shape of the fifth portion 55E is not specifically limited. In the illustrated example, the fifth portion 55E has a strip shape inclined with respect to the x-direction and the y-direction.

The wiring 50F includes a first portion 51F, a second portion 52F, a third portion 53F, a fourth portion 54F, and a fifth portion 55F, each of which will be described hereunder.

The first portion 51F is located on the side of the fourth face 34 in the x-direction with respect to the first base portion 55, and spaced therefrom. The first portion 51F overlaps with the first base portion 55, as viewed in the x-direction. The shape of the first portion 51F is not specifically limited, and a desired shape may be selected from a rectangular shape, a polygonal shape, a circular shape, an elliptical shape, and so forth. In the illustrated example, the first portion 51F has an elongate rectangular shape, having the long sides extending along the x-direction. In addition, the first portion 51F generally coincides with the first portion 51E, as viewed in the y-direction. Here, the expression "generally coincides" as viewed in the y-direction refers to, for example, exactly coinciding with each other, or being deviated by within ±5% of the characteristic size (size of the first portion 51E or first portion 51F in the y-direction).

The second portion 52F is located on the side of the fifth face 35 with respect to the first portion 51F, in the y-direction. In addition, the second portion 52F is located on the side of the fourth face 34 with respect to the first portion 51F, in the x-direction. The second portion 52F is located on the side of the fourth face 34 in the x-direction with respect to the second portion 52E, and spaced therefrom by the clearance G54. The shape of the second portion 52F is not specifically limited, and a desired shape may be selected from a rectangular shape, a polygonal shape, a circular shape, an elliptical shape, and so forth. In the illustrated example, the second portion 52F has an elongate rectangular shape, having the long sides extending along the y-direction. In the illustrated example, the second portion 52F is spaced apart from the first portion 51F, as viewed in the y-direction. In the illustrated example, the second portion 52F generally coincides with the second portion 52E, as viewed in the x-direction. Here, the expression "generally coincides" as viewed in the x-direction refers to, for example, exactly coinciding with each other, or being deviated by within ±5% of the characteristic size (size of the second portion 52E or second portion 52F in the y-direction).

The third portion 53F is interposed between the first portion 51F and the second portion 52F and, in the illustrated example, connected to the edge of the first portion 51F on the side of the fourth face 34 in the x-direction. The shape of the third portion 53F is not specifically limited. In the illustrated example, the third portion 53F has a strip shape extending along the x-direction. The third portion 53F is spaced apart from the second portion 52F, as viewed in the y-direction. The third portion 53F is larger in size in the x-direction, than the third portion 53E.

The fourth portion 54F is interposed between the first portion 51F and the second portion 52F and, in the illustrated example, connected to the edge of the second portion 52F on the side of the sixth face 36 in the y-direction. The shape of the fourth portion 54F is not specifically limited. In the illustrated example, the fourth portion 54F has a strip shape extending along the y-direction. The fourth portion 54F is spaced apart from the first portion 51F, as viewed in the x-direction. The fourth portion 54F is larger in size in the y-direction, than the fourth portion 54E.

The fifth portion 55F is interposed between the third portion 53F and the fourth portion 54F and, in the illustrated example, connected to the third portion 53F and the fourth portion 54F. The shape of the fifth portion 55F is not specifically limited. In the illustrated example, the fifth portion 55F has a strip shape inclined with respect to the x-direction and the y-direction.

The wiring 50G includes a first portion 51G, a second portion 52G, a third portion 53G, a fourth portion 54G, and a fifth portion 55G, each of which will be described hereunder.

The first portion 51G is located on the side of the fourth face 34 in the x-direction with respect to the first base portion 55, and spaced therefrom. The first portion 51G overlaps with the first base portion 55, as viewed in the x-direction. The shape of the first portion 51G is not specifically limited, and a desired shape may be selected from a rectangular shape, a polygonal shape, a circular shape, an elliptical shape, and so forth. In the illustrated example, the first portion 51G has an elongate rectangular shape, having the long sides extending along the x-direction. In addition, the first portion 51G generally coincides with the first portion 51F, as viewed in the y-direction. Here, the expression "generally coincides" as viewed in the y-direction refers to, for example, exactly coinciding with each other, or being deviated by within ±5% of the characteristic size (size of the first portion 51F or first portion 51G in the x-direction). The first portion 51G overlaps with the fifth portion 572*b*, as viewed in the y-direction.

The second portion 52G is located on the side of the fifth face 35 with respect to the first portion 51G, in the y-direction. In addition, the second portion 52G is located on the side of the fourth face 34 with respect to the first portion 51G, in the x-direction. The second portion 52G is located on the side of the fourth face 34 in the x-direction with respect to the second portion 52F, and spaced therefrom by the clearance G54. The shape of the second portion 52G is not specifically limited, and a desired shape may be selected from a rectangular shape, a polygonal shape, a circular shape, an elliptical shape, and so forth. In the illustrated example, the second portion 52G has an elongate rectangular shape, having the long sides extending along the y-direction. In the illustrated example, the second portion 52G is spaced apart from the first portion 51G, as viewed in the y-direction. In the illustrated example, the second portion 52G generally coincides with the second portion 52F, as viewed in the x-direction. Here, the expression "generally coincides" as viewed in the x-direction refers to, for example, exactly coinciding with each other, or being deviated by within ±5% of the characteristic size (size of the second portion 52F or second portion 52G in the y-direction).

The third portion 53G is interposed between the first portion 51G and the second portion 52G and, in the illustrated example, connected to the edge of the first portion 51G on the side of the fourth face 34 in the x-direction. The shape of the third portion 53G is not specifically limited. In the illustrated example, the third portion 53G has a strip shape extending along the x-direction. The third portion 53G is spaced apart from the second portion 52G, as viewed in the y-direction. The third portion 53G is larger in size in the x-direction, than the third portion 53F.

The fourth portion 54G is interposed between the first portion 51G and the second portion 52G and, in the illustrated example, connected to the edge of the second portion 52G on the side of the sixth face 36 in the y-direction. The shape of the fourth portion 54G is not specifically limited. In the illustrated example, the fourth portion 54G has a strip shape extending along the y-direction. The fourth portion 54G is spaced apart from the first portion 51G, as viewed in the x-direction. The fourth portion 54G is larger in size in the y-direction, than the fourth portion 54F.

The fifth portion 55G is interposed between the third portion 53G and the fourth portion 54G and, in the illustrated example, connected to the third portion 53G and the fourth portion 54G. The shape of the fifth portion 55G is not specifically limited. In the illustrated example, the fifth portion 55G has a strip shape inclined with respect to the x-direction and the y-direction.

The wiring 50H includes a second portion 52H and a fourth portion 54H, each of which will be described hereunder.

The second portion 52H is located on the side of the fifth face 35 with respect to the second base portion 56, in the y-direction. The second portion 52H is located on the side of the fourth face 34 in the x-direction with respect to the second portion 52G, and spaced therefrom by the clearance G54. The shape of the second portion 52H is not specifically limited, and a desired shape may be selected from a rectangular shape, a polygonal shape, a circular shape, an elliptical shape, and so forth. In the illustrated example, the second portion 52H has an elongate rectangular shape, having the long sides extending along the y-direction. In addition, the second portion 52H overlaps with the second base portion 56, as viewed in the y-direction. In the illustrated example, the second portion 52H generally coincides with the second portion 52G, as viewed in the x-direction. Here, the expression "generally coincides" as viewed in the x-direction refers to, for example, exactly coinciding with each other, or being deviated by within ±5% of the characteristic size (size of the second portion 52G or second portion 52H in the y-direction).

The fourth portion 54H is interposed between the second base portion 56 and the second portion 52H and, in the illustrated example, connected to the second base portion 56 and the second portion 52H. The fourth portion 54H is connected to the edge of the second base portion 56 on the side of the fifth face 35 in the y-direction, and the edge of the second portion 52H on the side of the sixth face 36 in the y-direction. The shape of the fourth portion 54H is not specifically limited. In the illustrated example, the fourth portion 54H has a strip shape extending along the y-direction.

The wiring 50I includes a first portion 51I, a second portion 52I, a third portion 53I, a fourth portion 54I, and a fifth portion 55I, each of which will be described hereunder.

The first portion 51I is located on the side of the fifth face 35 in the y-direction with respect to the second base portion 56, and spaced therefrom. The shape of the first portion 51I is not specifically limited, and a desired shape may be selected from a rectangular shape, a polygonal shape, a circular shape, an elliptical shape, and so forth. In the illustrated example, the first portion 51I has an elongate rectangular shape, having the long sides extending along the x-direction. In the illustrated example, the first portion 51I overlaps with the second base portion 56, as viewed in the y-direction. In addition, the first portion 51I is spaced apart from the second portion 52H, as viewed in the y-direction.

The second portion 52I is located on the side of the fifth face 35 with respect to the first portion 51I, in the y-direction. In addition, the second portion 52I is located on the side of the fourth face 34 in the x-direction with respect to the second portion 52H, and spaced therefrom by the clearance G54. The shape of the second portion 52I is not specifically limited, and a desired shape may be selected from a rectangular shape, a polygonal shape, a circular shape, an elliptical shape, and so forth. In the illustrated example, the second portion 52I has an elongate rectangular shape, having the long sides extending along the y-direction. In the illustrated example, the second portion 52I is spaced apart from the first portion 51I, as viewed in the y-direction. In addition, generally the entirety of the second portion 52I overlaps with the second base portion 56, as viewed in the y-direction. Here, the expression "generally the entirety overlaps" refers to completely overlapping in its entirety, or being deviated by within 5% from each other. In the illustrated example, the second portion 52I generally coincides with the second portion 52H, as viewed in the x-direction. Here, the expression "generally coincides" as viewed in the x-direction refers to, for example, exactly coinciding with each other, or being deviated by within ±5% of the characteristic size (size of the second portion 52H or second portion 52I in the y-direction).

The third portion 53I is interposed between the first portion 51I and the second portion 52I and, in the illustrated example, connected to the edge of the first portion 51I on the side of the fifth face 35 in the y-direction. The shape of the third portion 53I is not specifically limited. In the illustrated example, the third portion 53I has a strip shape extending along the y-direction.

The fourth portion 54I is interposed between the first portion 51I and the second portion 52I and, in the illustrated example, connected to the edge of the second portion 52I on the side of the sixth face 36 in the y-direction. The shape of the fourth portion 54I is not specifically limited. In the illustrated example, the fourth portion 54I has a strip shape extending along the y-direction.

The fifth portion 55I is interposed between the third portion 53I and the fourth portion 54I and, in the illustrated example, connected to the third portion 53I and the fourth portion 54I. The shape of the fifth portion 55I is not specifically limited. In the illustrated example, the fifth portion 55I has a strip shape inclined with respect to the x-direction and the y-direction.

The wiring 50J includes a first portion 51J, a second portion 52J, a third portion 53J, a fourth portion 54J, and a fifth portion 55J, each of which will be described hereunder.

The first portion 51J is located on the side of the fourth face 34 in the x-direction with respect to the first portion 51I, and spaced therefrom by a clearance G55. In the illustrated example, the clearance G55 is narrower than the clearance G54. The first portion 51J is located on the side of the fifth face 35 in the y-direction with respect to the second base portion 56, and spaced therefrom. The shape of the first portion 51J is not specifically limited, and a desired shape may be selected from a rectangular shape, a polygonal shape, a circular shape, an elliptical shape, and so forth. In the illustrated example, the first portion 51J has an elongate rectangular shape, having the long sides extending along the y-direction. In the illustrated example, the first portion 51J overlaps with the second base portion 56, as viewed in the y-direction. In addition, the first portion 51J overlaps with the second portion 52I, as viewed in the y-direction. In the illustrated example, the first portion 51J generally coincides with the first portion 51I, as viewed in the x-direction. Here, the expression "generally coincides" as viewed in the x-direction refers to, for example, exactly coinciding with each other, or being deviated by within ±5% of the characteristic size (size of the first portion 51I or first portion 51J in the y-direction).

The second portion 52J is located on the side of the fifth face 35 with respect to the first portion 51J, in the y-direction. In addition, the second portion 52J is located on the side of the fourth face 34 in the x-direction with respect to the second portion 52I, and spaced therefrom by the clearance G54. The shape of the second portion 52J is not specifically limited, and a desired shape may be selected from a rectangular shape, a polygonal shape, a circular shape, an elliptical shape, and so forth. In the illustrated example, the second portion 52J has an elongate rectangular shape, having the long sides extending along the y-direction. In the illustrated example, the second portion 52J is spaced apart from the first portion 51J, as viewed in the y-direction. In addition, generally the entirety of the second portion 52J overlaps with the second base portion 56, as viewed in the y-direction. Here, the expression "generally the entirety overlaps" refers to completely overlapping in its entirety, or being deviated by within 5% from each other. In the illustrated example, the second portion 52J generally coincides with the second portion 52I, as viewed in the x-direction. Here, the expression "generally coincides" as viewed in the x-direction refers to, for example, exactly coinciding with each other, or being deviated by within ±5% of the characteristic size (size of the first portion 51I or second portion 52J in the y-direction).

The third portion 53J is interposed between the first portion 51J and the second portion 52J and, in the illustrated example, connected to the edge of the first portion 51J on the side of the fifth face 35 in the y-direction. The shape of the third portion 53J is not specifically limited. In the illustrated example, the third portion 53J has a strip shape extending along the y-direction. The third portion 53J is smaller in size in the y-direction, than the third portion 53I.

The fourth portion 54J is interposed between the first portion 51J and the second portion 52J and, in the illustrated example, connected to the edge of the second portion 52J on the side of the sixth face 36 in the y-direction. The shape of the fourth portion 54J is not specifically limited. In the illustrated example, the fourth portion 54J has a strip shape extending along the y-direction. The fourth portion 54J is smaller in size in the y-direction, than the fourth portion 54I.

The fifth portion 55J is interposed between the third portion 53J and the fourth portion 54J and, in the illustrated example, connected to the third portion 53J and the fourth portion 54J. The shape of the fifth portion 55J is not specifically limited. In the illustrated example, the fifth portion 55J has a strip shape inclined with respect to the x-direction and the y-direction.

The wiring 50K includes a first portion 51K, a second portion 52K, a third portion 53K, a fourth portion 54K, and a fifth portion 55K, each of which will be described hereunder.

The first portion 51K is located on the side of the fourth face 34 in the x-direction with respect to the first portion 51J, and spaced therefrom by the clearance G55. The first portion 51K is located on the side of the fifth face 35 in the y-direction with respect to the second base portion 56, and spaced therefrom. The shape of the first portion 51K is not specifically limited, and a desired shape may be selected from a rectangular shape, a polygonal shape, a circular shape, an elliptical shape, and so forth. In the illustrated example, the first portion 51K has an elongate rectangular shape, having the long sides extending along the y-direction. In the illustrated example, the first portion 51K overlaps with the second base portion 56, as viewed in the y-direction. In addition, the first portion 51K overlaps with the second portion 52J, as viewed in the y-direction. In the illustrated example, the first portion 51K generally coincides with the first portion 51J, as viewed in the x-direction. Here, the expression "generally coincides" as viewed in the x-direction refers to, for example, exactly coinciding with each other, or being deviated by within ±5% of the characteristic size (size of the first portion 51J or first portion 51K in the y-direction).

The second portion 52K is located on the side of the fifth face 35 with respect to the first portion 51K, in the y-direction. In addition, the second portion 52K is located on the side of the fourth face 34 in the x-direction with respect to the second portion 52J, and spaced therefrom by the clearance G54. The shape of the second portion 52K is not specifically limited, and a desired shape may be selected from a rectangular shape, a polygonal shape, a circular shape, an elliptical shape, and so forth. In the illustrated example, the second portion 52K has an elongate rectangular shape, having the long sides extending along the y-direction. In the illustrated example, the second portion 52K is spaced apart from the first portion 51K, as viewed in the y-direction. In addition, generally the entirety of the second portion 52K overlaps with the second base portion 56, as viewed in the y-direction. Here, the expression "generally the entirety overlaps" refers to completely overlapping in its entirety, or being deviated by within 5% from each other. In the illustrated example, the second portion 52K generally coincides with the second portion 52J, as viewed in the x-direction. Here, the expression "generally coincides" as viewed in the x-direction refers to, for example, exactly coinciding with each other, or being deviated by within ±5% of the characteristic size (size of the second portion 52J or second portion 52K in the y-direction).

The third portion 53K is interposed between the first portion 51K and the second portion 52K and, in the illustrated example, connected to the edge of the first portion 51K on the side of the fifth face 35 in the y-direction. The shape of the third portion 53K is not specifically limited. In the illustrated example, the third portion 53K has a strip shape extending along the y-direction. The third portion 53K is smaller in size in the y-direction, than the third portion 53J.

The fourth portion 54K is interposed between the first portion 51K and the second portion 52K and, in the illustrated example, connected to the edge of the second portion 52K on the side of the sixth face 36 in the y-direction. The shape of the fourth portion 54K is not specifically limited. In the illustrated example, the fourth portion 54K has a strip shape extending along the y-direction. The fourth portion 54K is smaller in size in the y-direction, than the fourth portion 54J.

The fifth portion 55K is interposed between the third portion 53K and the fourth portion 54K and, in the illustrated example, connected to the third portion 53K and the fourth portion 54K. The shape of the fifth portion 55K is not specifically limited. In the illustrated example, the fifth portion 55K has a strip shape inclined with respect to the x-direction and the y-direction.

The wiring 50L includes a first portion 51L, a second portion 52L, a third portion 53L, a fourth portion 54L, and a fifth portion 55L, each of which will be described hereunder.

The first portion 51L is located on the side of the fourth face 34 in the x-direction with respect to the first portion 51K, and spaced therefrom by the clearance G55. The first portion 51L is located on the side of the fifth face 35 in the y-direction with respect to the second base portion 56, and spaced therefrom. The shape of the first portion 51L is not specifically limited, and a desired shape may be selected from a rectangular shape, a polygonal shape, a circular shape, an elliptical shape, and so forth. In the illustrated example, the first portion 51L has an elongate rectangular shape, having the long sides extending along the y-direction. In the illustrated example, the first portion 51L overlaps with the second base portion 56, as viewed in the y-direction. In addition, the first portion 51L is located between the second portion 52J and the second portion 52K, as viewed in the y-direction. In the illustrated example, the first portion 51L generally coincides with the first portion 51K, as viewed in the x-direction. Here, the expression "generally coincides" as viewed in the x-direction refers to, for example, exactly coinciding with each other, or being deviated by within ±5% of the characteristic size (size of the first portion 51K or first portion 51L in the y-direction).

The second portion 52L is located on the side of the fifth face 35 with respect to the first portion 51L, in the y-direction. In addition, the second portion 52L is located on the side of the fourth face 34 in the x-direction with respect to the second portion 52K, and spaced therefrom by the clearance G54. The shape of the second portion 52L is not specifically limited, and a desired shape may be selected from a rectangular shape, a polygonal shape, a circular shape, an elliptical shape, and so forth. In the illustrated example, the second portion 52L has an elongate rectangular shape, having the long sides extending along the y-direction. In the illustrated example, the second portion 52L is spaced apart from the first portion 51L, as viewed in the y-direction. In addition, the second portion 52L is spaced apart from the second base portion 56, as viewed in the y-direction. In the illustrated example, the second portion 52L generally coincides with the second portion 52K, as viewed in the x-direction. Here, the expression "generally coincides" as viewed in the x-direction refers to, for example, exactly coinciding with each other, or being deviated by within ±5% of the characteristic size (size of the second portion 52K or second portion 52L in the y-direction).

The third portion 53L is interposed between the first portion 51L and the second portion 52L and, in the illustrated example, connected to the edge of the first portion 51L on the side of the fifth face 35 in the y-direction. The shape of the third portion 53L is not specifically limited. In the illustrated example, the third portion 53L has a strip shape extending along the y-direction. The third portion 53L is smaller in size in the y-direction, than the third portion 53K.

The fourth portion 54L is interposed between the first portion 51L and the second portion 52L and, in the illustrated example, connected to the edge of the second portion 52L on the side of the sixth face 36 in the y-direction. The shape of the fourth portion 54L is not specifically limited. In the illustrated example, the fourth portion 54L has a strip shape extending along the y-direction. The fourth portion 54L is smaller in size in the y-direction, than the fourth portion 54K.

The fifth portion 55L is interposed between the third portion 53L and the fourth portion 54L and, in the illustrated example, connected to the third portion 53L and the fourth portion 54L. The shape of the fifth portion 55L is not specifically limited. In the illustrated example, the fifth portion 55L has a strip shape inclined with respect to the x-direction and the y-direction.

The wiring 50M includes a first portion 51M, a second portion 52M, a third portion 53M, a fourth portion 54M, and a fifth portion 55M, each of which will be described hereunder.

The first portion 51M is located on the side of the fourth face 34 in the x-direction with respect to the first portion 51L, and spaced therefrom by the clearance G55. The first portion 51M is located on the side of the fifth face 35 in the y-direction with respect to the second base portion 56, and spaced therefrom. The shape of the first portion 51M is not specifically limited, and a desired shape may be selected from a rectangular shape, a polygonal shape, a circular shape, an elliptical shape, and so forth. In the illustrated example, the first portion 51M has a rectangular shape. In the illustrated example, the first portion 51M overlaps with the second base portion 56, as viewed in the y-direction. In addition, the first portion 51M overlaps with the second portion 52K, as viewed in the y-direction. In the illustrated example, the first portion 51M generally coincides with the first portion 51L, as viewed in the x-direction. Here, the expression "generally coincides" as viewed in the x-direction refers to, for example, exactly coinciding with each other, or being deviated by within ±5% of the characteristic size (size of the first portion 51L or first portion 51M in the y-direction).

The second portion 52M is located on the side of the fifth face 35 with respect to the first portion 51M, in the y-direction. In addition, the second portion 52M is located on the side of the fourth face 34 in the x-direction with respect to the second portion 52L, and spaced therefrom by the clearance G54. The shape of the second portion 52M is not specifically limited, and a desired shape may be selected from a rectangular shape, a polygonal shape, a circular shape, an elliptical shape, and so forth. In the illustrated example, the second portion 52M has an elongate rectangular shape, having the long sides extending along the y-direction. In the illustrated example, the second portion 52M is spaced apart from the first portion 51M, as viewed in the y-direction. In addition, the second portion 52M is spaced apart from the second base portion 56, as viewed in the y-direction. In the illustrated example, the second portion 52M generally coincides with the second portion 52L, as viewed in the x-direction. Here, the expression "generally coincides" as viewed in the x-direction refers to, for example, exactly coinciding with each other, or being deviated by within ±5% of the characteristic size (size of the second portion 52L or second portion 52M in the y-direction).

The third portion 53M is interposed between the first portion 51M and the second portion 52M and, in the illustrated example, connected to the edge of the first portion 51M on the side of the fourth face 34 in the x-direction. The shape of the third portion 53M is not specifically limited. In the illustrated example, the third portion 53M has a strip shape extending along the x-direction.

The fourth portion 54M is interposed between the first portion 51M and the second portion 52M and, in the illustrated example, connected to the edge of the second portion 52M on the side of the sixth face 36 in the y-direction. The shape of the fourth portion 54M is not specifically limited. In the illustrated example, the fourth portion 54M has a strip shape extending along the y-direction. The fourth portion 54M is larger in size in the y-direction, than the fourth portion 54L.

The fifth portion 55M is interposed between the third portion 53M and the fourth portion 54M and, in the illustrated example, connected to the third portion 53M and the fourth portion 54M. The shape of the fifth portion 55M is not specifically limited. In the illustrated example, the fifth portion 55M has a strip shape inclined with respect to the x-direction and the y-direction.

The wiring 50N includes a first portion 51N, a second portion 52N, and a fifth portion 55N, each of which will be described hereunder.

The first portion 51N is located on the side of the fifth face 35 with respect to the second base portion 56, in the y-direction. The shape of the first portion 51N is not specifically limited, and a desired shape may be selected from a rectangular shape, a polygonal shape, a circular shape, an elliptical shape, and so forth. In the illustrated example, the first portion 51N has a rectangular shape. In the illustrated example, the first portion 51N is spaced apart from the second base portion 56, as viewed in the y-direction. The first portion 51N overlaps with the second portion 52K, as viewed in the y-direction. Further, the first portion 51N overlaps with the second base portion 56 and the first portion 51M, as viewed in the x-direction.

The second portion 52N is located on the side of the fifth face 35 with respect to the first portion 51N, in the y-direction. In addition, the second portion 52N is located on the side of the fourth face 34 in the x-direction with respect to the second portion 52M, and spaced therefrom by the clearance G54. The shape of the second portion 52N is not specifically limited, and a desired shape may be selected from a rectangular shape, a polygonal shape, a circular shape, an elliptical shape, and so forth. In the illustrated example, the second portion 52N has an elongate rectangular shape, having the long sides extending along the y-direction. In the illustrated example, the second portion 52N is spaced apart from the first portion 51N, as viewed in the y-direction. In addition, the second portion 52N is spaced apart from the second base portion 56, as viewed in the y-direction. In the illustrated example, the second portion 52N generally coincides with the second portion 52M, as viewed in the x-direction. Here, the expression "generally coincides" as viewed in the x-direction refers to, for example, exactly coinciding with each other, or being deviated by within ±5% of the characteristic size (size of the second portion 52M or second portion 52N in the y-direction).

The fifth portion 55N is interposed between the first portion 51N and the second portion 52N and, in the illustrated example, connected to the first portion 51N and the second portion 52N. The shape of the fifth portion 55N is not specifically limited. In the illustrated example, the fifth portion 55N has a strip shape inclined with respect to the x-direction and the y-direction.

The wiring 50O includes a first portion 51O, a second portion 52O, a third portion 53O, and a fifth portion 55O, each of which will be described hereunder.

The first portion 51O is located on the side of the fourth face 34 in the x-direction with respect to the second base portion 56, and connected thereto. The shape of the first portion 51O is not specifically limited, and a desired shape may be selected from a rectangular shape, a polygonal shape, a circular shape, an elliptical shape, and so forth. In the illustrated example, the first portion 51O has an elongate rectangular shape, having the long sides extending along the x-direction. In the illustrated example, the first portion 51O overlaps with the second base portion 56, as viewed in the x-direction.

The second portion 52O is located on the side of the fifth face 35 in the y-direction, and on the side of the fourth face 34 in the x-direction, with respect to the first portion 51O. The second portion 52O is located on the side of the sixth face 36 with respect to the second portion 52N, in the y-direction. The shape of the second portion 52O is not specifically limited, and a desired shape may be selected from a rectangular shape, a polygonal shape, a circular shape, an elliptical shape, and so forth. In the illustrated example, the second portion 52O has an elongate rectangular shape, having the long sides extending along the y-direction. In the illustrated example, the second portion 52O is spaced apart from the first portion 51O and the first portion 51M, as viewed in the y-direction. In addition, the second portion 52O is spaced apart from the second base portion 56, and overlaps with the second portion 52N, as viewed in the y-direction.

The third portion 53O is interposed between the first portion 51O and the second portion 52O and, in the illustrated example, connected to the edge of the first portion 51O on the side of the fourth face 34 in the x-direction. The shape of the third portion 53O is not specifically limited. In the illustrated example, the third portion 53O has a strip shape extending along the x-direction.

The fifth portion 55O is interposed between the first portion 51O and the third portion 53O and, in the illustrated example, connected to the first portion 51O and the third portion 53O. The shape of the fifth portion 55O is not specifically limited. In the illustrated example, the fifth portion 55O has a strip shape inclined with respect to the x-direction and the y-direction.

The wiring 50P includes a first portion 51P, a second portion 52P, a third portion 53P, and a fifth portion 55P, each of which will be described hereunder.

The first portion 51P is located on the side of the fourth face 34 in the x-direction with respect to the second base portion 56, and spaced therefrom. The shape of the first portion 51P is not specifically limited, and a desired shape may be selected from a rectangular shape, a polygonal shape, a circular shape, an elliptical shape, and so forth. In the illustrated example, the first portion 51P has an elongate rectangular shape, having the long sides extending along the x-direction. In the illustrated example, the first portion 51P overlaps with the second base portion 56, as viewed in the x-direction. In addition, the first portion 51P overlaps with the first portion 51O, as viewed in the y-direction.

The second portion 52P is located on the side of the fifth face 35 in the y-direction, and on the side of the fourth face 34 in the x-direction, with respect to the first portion 51P. The second portion 52P is located on the side of the sixth face 36 with respect to the second portion 52O, in the y-direction. The shape of the second portion 52P is not specifically limited, and a desired shape may be selected from a rectangular shape, a polygonal shape, a circular shape, an elliptical shape, and so forth. In the illustrated example, the second portion 52P has an elongate rectangular shape, having the long sides extending along the y-direction. In the illustrated example, the second portion 52P is spaced apart from the first portion 51P and the second portion 52M, as viewed in the y-direction. In addition, the second portion 52P is spaced apart from the second base portion 56, and overlaps with the second portion 52N, as viewed in the y-direction. In the illustrated example, the second portion 52P generally coincides with the second portion 52O, as viewed in the y-direction. Here, the expression "generally coincides" as viewed in the y-direction refers to, for example, exactly coinciding with each other, or being deviated by within ±5% of the characteristic size (size of the second portion 52O or second portion 52P in the x-direction).

The third portion 53P is interposed between the first portion 51P and the second portion 52P and, in the illustrated example, connected to the edge of the first portion 51P on the side of the fourth face 34 in the x-direction. The shape of the third portion 53P is not specifically limited. In the illustrated example, the third portion 53P has a strip shape extending along the x-direction.

The fifth portion 55P is interposed between the first portion 51P and the third portion 53P and, in the illustrated example, connected to the first portion 51P and the third portion 53P. The shape of the fifth portion 55P is not specifically limited. In the illustrated example, the fifth portion 55P has a strip shape inclined with respect to the x-direction and the y-direction.

The wiring 50A to the wiring 50P are formed on a region in the substrate 3, on the side of the fifth face 35 in the y-direction. The region on the side of the fifth face 35 will be defined as a second region 30B.

<Bonding Section 6>

The plurality of bonding sections 6 are formed on the substrate 3. In this embodiment, the plurality of bonding sections 6 are formed on the first face 31 of the substrate 3. The material of the bonding section 6 is not specifically limited, provided that the material is capable of bonding the substrate 3 and the lead 1 together. The bonding section 6 is formed of, for example, a conductive material. The conductive material to form the bonding section 6 is not specifically limited. Examples of the conductive material to form the bonding section 6 include materials containing silver (Ag), copper (Cu), or gold (Au). In the subsequent description, it will be assumed that the bonding section 6 contains silver. The bonding section 6 according to this embodiment contains the same conductive material as that employed to form the conductive section 5. However, the bonding section 6 may contain copper instead of silver, or gold instead of silver or copper. Alternatively, the bonding section 6 may contain Ag—Pt or Ag—Pd. The forming method of the bonding section 6 is not limited. For example, the bonding section 6 may be formed, like the conductive section 5, by sintering a paste containing the mentioned metal. The thickness of the bonding section 6 is not specifically limited, but may be, for example, approximately 5 μm to 30 μm.

In this embodiment, the plurality of bonding sections 6 include a bonding section 6A to a bonding section 6D.

The bonding section 6A is located on the side of the sixth face 36 with respect to the conductive section 5, in the y-direction. The bonding section 6A overlaps with the entirety of the first base portion 55, as viewed in the y-direction. The shape of the bonding section 6A is not specifically limited. In the illustrated example, the bonding section 6A includes a first edge 61A, a second edge 62A, a third edge 63A, a fourth edge 64A, a fifth edge 65Aa, a sixth edge 66Aa, a seventh edge 65Ab, and an eighth edge 66Ab.

The first edge 61A extends along the y-direction. In the illustrated example, the first edge 61A overlaps with the first portion 51A, as viewed in the y-direction.

The second edge 62A is located on the opposite side of the first edge 61A in the x-direction, across the center of the bonding section 6A in the x-direction, and extends along the y-direction. In the illustrated example, the second edge 62A overlaps with the first portion 571 of the connecting portion 57, as viewed in the y-direction. The second edge 62A is smaller in size in the y-direction, than the first edge 61A.

The third edge 63A is connected to the respective ends of the first edge 61A and the second edge 62A, on the side of the fifth face 35 in the y-direction. The third edge 63A extends along the x-direction. The third edge 63A is spaced apart from the first base portion 55, in the y-direction. In the illustrated example, the third edge 63A overlaps at least with the first portion 51A, the first base portion 55, and the first portion 571, as viewed in the y-direction.

The fourth edge 64A is located on the opposite side of the third edge 63A in the y-direction, across the center of the bonding section 6A in the y-direction. The fourth edge 64A extends along the x-direction. The fourth edge 64A is smaller in size in the x-direction, than the third edge 63A. The entirety of the fourth edge 64A overlaps with the third edge 63A, as viewed in the y-direction.

The fifth edge 65Aa is connected to the end of the first edge 61A on the side of the sixth face 36 in the y-direction. In the illustrated example, the fifth edge 65Aa is inclined with respect to the x-direction and the y-direction. The seventh edge 65Ab is connected to the end of the second edge 62A on the side of the sixth face 36 in the y-direction. In the illustrated example, the seventh edge 65Ab is inclined with respect to the x-direction and the y-direction.

The sixth edge 66Aa is connected to the end of the fifth edge 65Aa on the side of the sixth face 36 in the y-direction, and the end of the fourth edge 64A in the x-direction. In the illustrated example, the sixth edge 66Aa extends along the y-direction. The eighth edge 66Ab is connected to the end of the seventh edge 65Ab on the side of the sixth face 36 in the y-direction, and the end of the fourth edge 64A in the x-direction. In the illustrated example, the eighth edge 66Ab extends along the y-direction.

The bonding section 6B is located on the side of the sixth face 36 with respect to the conductive section 5, in the y-direction. The bonding section 6B is located on the side of the fourth face 34 with respect to the bonding section 6A, in the x-direction. In the illustrated example, the bonding section 6B overlaps with the first portion 571, the third portion 573, and the second base portion 56, as viewed in the y-direction. The shape of the bonding section 6B is not specifically limited. In the illustrated example, the bonding section 6B includes a first edge 61B, a second edge 62B, a third edge 63B, a fourth edge 64B, a fifth edge 65B, a sixth edge 66B, and an eighth edge 68B.

The first edge 61B extends along the y-direction. The first edge 61B is opposed to the second edge 62A. In the illustrated example, the first edge 61B overlaps with the first portion 571, as viewed in the y-direction.

The second edge 62B is located on the opposite side of the first edge 61B in the x-direction, across the center of the bonding section 6B in the x-direction, and extends along the y-direction. In the illustrated example, the second edge 62B overlaps with the second base portion 56, as viewed in the y-direction. The second edge 62B is smaller in size in the y-direction, than the first edge 61B. In addition, the second edge 62B is generally the same in size in the y-direction, as the second edge 62A (exactly the same, or different by within ±5%).

The third edge 63B is connected to the respective ends of the first edge 61B and the second edge 62B, on the side of the fifth face 35 in the y-direction. The third edge 63B extends along the x-direction. In the illustrated example, the third edge 63B overlaps at least with the first portion 571, the third portion 573, and the second base portion 56, as viewed in the y-direction. In the illustrated example, in addition, the third edge 63B is located generally at the same position as the third edge 63A, in the y-direction. Here, the expression "located generally at the same position" in the y-direction refers to, for example, being located at exactly the same position, or being deviated by within ±5% of the characteristic size (size of the bonding section 6A or bonding section 6B in the y-direction).

The fourth edge 64B is located on the opposite side of the third edge 63B in the y-direction, across the center of the bonding section 6B in the y-direction. The fourth edge 64B extends along the x-direction. The fourth edge 64B is connected to the end of the first edge 61B on the side of the sixth face 36 in the y-direction. The fourth edge 64B is smaller in size in the x-direction, than the third edge 63B. The entirety of the fourth edge 64B overlaps with the third edge 63B, as viewed in the y-direction.

The fifth edge 65B is connected to the end of the second edge 62B on the side of the sixth face 36 in the y-direction. In the illustrated example, the fifth edge 65B is inclined with respect to the x-direction and the y-direction.

The sixth edge 66B is connected to the end of the fourth edge 64B on the side of the fourth face 34 in the x-direction. In the illustrated example, the sixth edge 66B extends along the y-direction.

The eighth edge 68B is connected to the fifth edge 65B and the sixth edge 66B. In the illustrated example, the eighth edge 68B extends along the x-direction.

The bonding section 6C is located on the side of the sixth face 36 with respect to the conductive section 5, in the y-direction. The bonding section 6C is located on the side of the fourth face 34 with respect to the bonding section 6B, in the x-direction. In the illustrated example, the entirety of the bonding section 6C overlaps with the second base portion 56, as viewed in the y-direction. The shape of the bonding section 6C is not specifically limited. In the illustrated example, the bonding section 6C includes a first edge 61C, a second edge 62C, a third edge 63C, a fourth edge 64C, a fifth edge 65C, a sixth edge 66C, and an eighth edge 68C.

The first edge 61C extends along the y-direction. The first edge 61C is opposed to the second edge 62B. In the illustrated example, the first edge 61C overlaps with the second base portion 56, as viewed in the y-direction.

The second edge 62C is located on the opposite side of the first edge 61C in the x-direction, across the center of the bonding section 6C in the x-direction, and extends along the y-direction. In the illustrated example, the second edge 62C overlaps with the second base portion 56, as viewed in the y-direction. The second edge 62C is smaller in size in the y-direction, than the first edge 61C. In addition, the second edge 62C is generally the same in size in the y-direction, as the second edge 62B (exactly the same, or different by within ±5%).

The third edge 63C is connected to the respective ends of the first edge 61C and the second edge 62C, on the side of the fifth face 35 in the y-direction. The third edge 63C extends along the x-direction. In the illustrated example, the third edge 63C overlaps with the second base portion 56, as viewed in the y-direction. In the illustrated example, in addition, the third edge 63C is located generally at the same position as the third edge 63B, in the y-direction. Here, the expression "located generally at the same position" in the y-direction refers to, for example, being located at exactly the same position, or being deviated by within ±5% of the characteristic size (size of the bonding section 6B or bonding section 6C in the y-direction).

The fourth edge 64C is located on the opposite side of the third edge 63C in the y-direction, across the center of the bonding section 6C in the y-direction. The fourth edge 64C extends along the x-direction. The fourth edge 64C is connected to the end of the first edge 61C on the side of the sixth face 36 in the y-direction. The fourth edge 64C is smaller in size in the x-direction, than the third edge 63C. The entirety of the fourth edge 64C overlaps with the third edge 63C, as viewed in the y-direction.

The fifth edge 65C is connected to the end of the second edge 62C on the side of the sixth face 36 in the y-direction. In the illustrated example, the fifth edge 65C is inclined with respect to the x-direction and the y-direction.

The sixth edge 66C is connected to the end of the fourth edge 64C on the side of the fourth face 34 in the x-direction. In the illustrated example, the sixth edge 66C extends along the y-direction.

The eighth edge 68C is connected to the fifth edge 65C and the sixth edge 66C. In the illustrated example, the eighth edge 68C extends along the x-direction.

The bonding section 6D is located on the side of the sixth face 36 with respect to the conductive section 5, in the y-direction. The bonding section 6D is located on the side of the fourth face 34 with respect to the bonding section 6C, in the x-direction. In the illustrated example, the bonding section 6D overlaps with the second base portion 56, the first portion 51P, the third portion 53P, and the second portion 52P, as viewed in the y-direction. The shape of the bonding section 6D is not specifically limited. In the illustrated example, the bonding section 6D includes a first edge 61D, a second edge 62D, a third edge 63D, a fourth edge 64D, and a fifth edge 65D.

The first edge 61D extends along the y-direction. The first edge 61D is opposed to the second edge 62C. In the illustrated example, the first edge 61D overlaps with the second base portion 56, as viewed in the y-direction.

The second edge 62D is located on the opposite side of the first edge 61D in the x-direction, across the center of the bonding section 6D in the x-direction, and extends along the y-direction. In the illustrated example, the second edge 62D overlaps with the second portion 52P, as viewed in the y-direction. The second edge 62D is smaller in size in the y-direction, than the first edge 61D.

The third edge 63D is connected to the respective ends of the first edge 61D and the second edge 62D, on the side of the fifth face 35 in the y-direction. The third edge 63D extends along the x-direction. In the illustrated example, the third edge 63D overlaps with the second base portion 56, the first portion 51P, the third portion 53P, and the second portion 52P, as viewed in the y-direction. In the illustrated example, in addition, the third edge 63D is located generally at the same position as the third edge 63C, in the y-direction. Here, the expression "located generally at the same position" in the y-direction refers to, for example, being located at exactly the same position, or being deviated by within ±5% of the characteristic size (size of the bonding section 6C or bonding section 6D in the y-direction).

The fourth edge 64D is located on the opposite side of the third edge 63D in the y-direction, across the center of the bonding section 6D in the y-direction. The fourth edge 64D extends along the x-direction. The fourth edge 64D is connected to the end of the first edge 61D on the side of the sixth face 36 in the y-direction. The fourth edge 64D is smaller in size in the x-direction, than the third edge 63D, The entirety of the fourth edge 64D overlaps with the third edge 63D, as viewed in the y-direction.

The fifth edge 65D is connected to the second edge 62D and the fourth edge 64D. In the illustrated example, the fifth edge 65D is inclined with respect to the x-direction and the y-direction.

The bonding section 6A to the bonding section 6D are formed on a region in the substrate 3 on the side of the sixth face 36, with respect to the conductive section 5 in the y-direction. The region in the substrate 3 on the side of the sixth face 36 in a plan view, where the bonding sections 6 are formed, will be defined as a first region 30A.

<Leads 1>

The plurality of leads 1 contain a metal, and have higher heat dissipation characteristics, for example than the substrate 3. The metal to form the lead 1 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 1 may be plated with nickel (Ni). Examples of the forming method of the plurality of leads 1 include pressing a metal plate with a die, and patterning a metal plate by etching, without limitation thereto. The thickness of the lead 1 is not specifically limited, but may be, for example, approximately 0.4 mm to 0.8 mm.

In this embodiment, the plurality of leads 1 include a plurality of leads 1A to 1G, and 1Z, as shown in FIG. 1 to FIG. 4. The plurality of leads 1A to 1G constitute conduction paths, for example to the semiconductor chips 4A to 4F.

The lead 1A is located on the substrate 3 and, in this embodiment, on the first face 31. The lead 1A exemplifies a first lead in the present disclosure. The lead 1A is bonded to the bonding section 6A, via a bonding material 81. The bonding material 81 may be any material that is capable of bonding the lead 1A to the bonding section 6A. From the viewpoint of efficient heat transmission from the lead 1A to the substrate 3, it is preferable to employ a material having high thermal conductivity as the bonding material 81, such as silver paste, copper paste, or solder. However, the bonding material 81 may be an insulative material such as an epoxy-based resin or a silicone-based resin. In the case where the bonding section 6A is not provided on the substrate 3, the lead 1A may be bonded to the substrate 3.

The configuration of the lead 1A is not specifically limited and, in this embodiment, the lead 1A includes a first portion 11A, a second portion 12A, a third portion 13A, and a fourth portion 14A, each of which will be described hereunder.

As shown in FIG. 5, FIG. 9, and FIG. 10, the first portion 11A includes a main surface 111A, a back surface 112A, a first face 121A, a second face 122A, a third face 123A, a fourth face 124Aa, a fifth face 125Aa, a sixth face 126Aa, a seventh face 127Aa, an eighth face 124Ab, a ninth face 125Ab, a tenth face 126Ab, an eleventh face 127Ab, a plurality of recesses and a groove 1112A.

The main surface 111A is oriented in the same direction as the first face 31, in the z-direction.

The back surface 112A is oriented to the opposite side of the main surface 111A in the z-direction and, in the illustrated example, a planar surface. The back surface 112A is bonded to the bonding section 6A via the bonding material 81, as shown in FIG. 5 and FIG. 9.

The first face 121A is located between the main surface 111A and the back surface 112A in the z-direction, and oriented in the same direction as the third face 33 as a whole, in the x-direction. In the illustrated example, the first face 121A is connected to the main surface 111A and the back surface 112A.

The second face 122A is located on the opposite side of the first face 121A in the x-direction, and oriented in the same direction as the fourth face 34, in the x-direction. The second face 122A is located between the main surface 111A and the back surface 112A in the z-direction and, in the illustrated example, connected to the main surface 111A and the back surface 112A. The second face 122A is smaller in size in the y-direction, than the first face 121A.

The third face 123A is located between the first face 121A and the second face 122A in the x-direction, and oriented in the same direction as the fifth face 35, in the y-direction. The third face 123A is located between the main surface 111A and the back surface 112A in the z-direction and, in the illustrated example, connected to the main surface 111A and the back surface 112A.

The fourth face 124Aa and the eighth face 124Ab are located on the opposite side of the third face 123A in the y-direction, and oriented in the same direction as the sixth face 36 in the y-direction. The fourth face 124Aaa and the eighth face 124Ab are spaced apart from each other in the x-direction. The fourth face 124A is located between the main surface 111A and the back surface 112A in the z-direction and, in the illustrated example, connected to the main surface 111A and the back surface 112A. The fourth face 124Aa and the eighth face 124Ab are located generally at the same position in the y-direction. Here, the expression "generally at the same position" in the y-direction refers to, for example, being at exactly the same position, or being deviated by within ±5% of the characteristic size (size of the first portion 11A in the y-direction).

The fifth face 125Aa and the ninth face 125Ab are located between the first face 121A and the second face 122A, in the x-direction. The fifth face 125Aa is connected to the end of the first face 121A on the side of the sixth face 36 in the y-direction. The ninth face 125Ab is connected to the end of the second face 122A on the side of the sixth face 36 in the y-direction. The fifth face 125Aa and the ninth face 125Ab are inclined with respect to the x-direction. The fifth face 125Aa and the ninth face 125Ab are located between the main surface 111A and the back surface 112A in the z-direction and, in the illustrated example, connected to the main surface 111A and the back surface 112A.

The sixth face 126Aa is located between the fifth face 125Aa and the fourth face 124Aa in the x-direction, and between the fifth face 125Aa and the fourth face 124Aa in the y-direction. In the illustrated example, the sixth face 126Aa is connected to the fourth face 124Aa and the fifth face 125Aa.

The tenth face 126Ab is located between the ninth face 125Ab and the eighth face 124Ab in the x-direction, and between the ninth face 125Ab and the eighth face 124Ab in the y-direction. In the illustrated example, the tenth face 126Ab is connected to the eighth face 124Ab and the ninth face 125Ab. The sixth face 126Aa and the tenth face 126Ab extend along the y-direction. The sixth face 126Aa and the tenth face 126Ab are located between the main surface 111A and the back surface 112A in the z-direction and, in the illustrated example, connected to the main surface 111A and the back surface 112A.

The seventh face 127Aa is located between the first face 121A and the third face 123A in the x-direction, and between the first face 121A and the third face 123A in the y-direction. The seventh face 127Aa is connected to the first face 121A and the third face 123A. In the illustrated example, the seventh face 127Aa forms a convex curved surface, as viewed in the z-direction. The seventh face 127Aa is located between the main surface 111A and the back surface 112A in the z-direction and, in the illustrated example, connected to the main surface 111A and the back surface 112A. The eleventh face 127Ab is located between the second face 122A and the third face 123A in the x-direction, and between the second face 122A and the third face 123A in the y-direction. The eleventh face 127Ab is connected to the second face 122A and the third face 123A. In the illustrated example, the eleventh face 127Ab forms a convex curved surface, as viewed in the z-direction. The eleventh face 127Ab is located between the main surface 111A and the back surface 112A in the z-direction and, in the illustrated example, connected to the main surface 111A and the back surface 112A.

In the illustrated example, the first face 121A, the second face 122A, and the third face 123A each include a plurality of protrusions 131A. The plurality of protrusions 131A each protrude outwardly of the first portion 11A as viewed in the z-direction, and extend along the z-direction. Here, the plurality of protrusions 131A may be formed on the first portion 11A, in portions other than the first face 121A, the second face 122A, and the third face 123A. In addition, at least one of the first face 121A, the second face 122A, and the third face 123A may be without the plurality of protrusions 131A.

The plurality of recesses 1111A are each recessed from the main surface 111A in the z-direction. The shape of the recess 1111A in a z-direction view is not specifically limited, and may be, for example, circular, elliptical, rectangular, or triangular. In the illustrated example, the plurality of recesses 1111A are arranged in a matrix pattern.

The groove 1112A is recessed from the main surface 111A in the z-direction. In the illustrated example, the shape of the groove 1112A in a z-direction view is not specifically limited. In the illustrated example, the groove 1112A includes a first portion 1112Aa of a rectangular shape, and a pair of second portions 1112Ab extending along the y-direction in the rectangular shape. The cross-sectional shape of the groove 1112A is not specifically limited, and may be, for example, circular, elliptical, rectangular, or triangular.

The number of rows of the plurality of recesses 1111A in the y-direction is larger in the region between the groove 1112A, and the fourth face 124Aa and eighth face 124Ab, than in the region between the groove 1112A and the third face 123A.

The third portion 13A and the fourth portion 14A are covered with the encapsulating resin 7. The third portion 13A is connected to the first portion 11A and the fourth portion 14A. In the illustrated example, the third portion 13A is connected to a portion of the first portion 11A between the fourth face 124Aa and the eighth face 124Ab. In addition, the third portion 13A overlaps with the sixth face 36, as viewed in the z-direction. As shown in FIG. 5, the fourth portion 14A is shifted from the first portion 11A in the z-direction, to the side to which the main surface 111A is oriented. The end portion of the fourth portion 14A is flush with a sixth face 76 of the resin 7.

The second portion 12A is connected to the end portion of the fourth portion 14A, and corresponds to a portion of the lead 1A sticking out from the encapsulating resin 7. The second portion 12A sticks out to the opposite side of the first portion 11A, in the y-direction. The second portion 12A is used, for example, to electrically connect the semiconductor device A1 to an external circuit. In the illustrated example, the second portion 12A is bent in the z-direction, to the side to which the main surface 111A is oriented.

The lead 1B is located on the substrate 3 and, in this embodiment, on the first face 31. The lead 1B exemplifies a first lead in the present disclosure. The lead 1B is bonded to the bonding section 6B, via the bonding material 81. In the case where the bonding section 6B is not provided on the substrate 3, the lead 1B may be bonded to the substrate 3.

The configuration of the lead 1B is not specifically limited. In this embodiment the lead 1B includes, as shown in FIG. 4 and FIG. 14, a first portion 11B, a second portion 12B, a third portion 13B, and a fourth portion 14B, each of which will be described hereunder.

As shown in FIG. 9 and FIG. 14, the first portion 11B includes a main surface 111B, a back surface 112B, a first face 121B, a second face 122B, a third face 123B, a fourth face 124B, a fifth face 125B, a sixth face 126B, a seventh face 127B, an eighth face 128B, a ninth face 125Bb, a tenth face 126Bb, an eleventh face 127Bb, a plurality of recesses 1111B, and a groove 1112B.

The main surface 111B is oriented in the same direction as the first face 31, in the z-direction.

The back surface 112B is oriented to the opposite side of the main surface 111B in the z-direction and, in the illustrated example, a planar surface. The back surface 112B is bonded to the bonding section 6B via the bonding material 81, as shown in FIG. 9.

The first face 121B is located between the main surface 111B and the back surface 112B in the z-direction, and oriented in the same direction as the third face 33 as a whole, in the x-direction. In the illustrated example, the first face 121B is connected to the main surface 111B and the back surface 112B. The first face 121B is opposed to the second face 122A.

The second face 122B is located on the opposite side of the first face 121B in the x-direction, and oriented in the same direction as the fourth face 34, in the x-direction. The second face 122B is located between the main surface 111B and the back surface 112B in the z-direction and, in the illustrated example, connected to the main surface 111B and the back surface 112B. The second face 122B is smaller in size in the y-direction, than the first face 121B.

The third face 123B is located between the first face 121B and the second face 122B in the x-direction, and oriented in the same direction as the fifth face 35, in the y-direction. The third face 123B is located between the main surface 111B and the back surface 112B in the z-direction and, in the illustrated example, connected to the main surface 111B and the back surface 112B.

The fourth face 124B is located on the opposite side of the third face 123B in the y-direction, and oriented in the same direction as the sixth face 36 in the y-direction. The fourth face 124B is located between the main surface 111B and the back surface 112B in the z-direction and, in the illustrated example, connected to the main surface 111B and the back surface 112B. In the illustrated example, the fourth face 124B overlaps with the third face 123B, as viewed in the y-direction.

The fifth face 125Ba is connected to the end of the first face 121B on the side of the sixth face 36 in the y-direction. The fifth face 125Ba is opposed to the ninth face 125Ab. The fifth face 125Ba is inclined with respect to the x-direction. The fifth face 125Ba is spaced apart from the third face 123B, as viewed in the y-direction. The fifth face 125Ba is located between the main surface 111B and the back surface 112B in the z-direction and, in the illustrated example, connected to the main surface 111B and the back surface 112B. The ninth face 125Bb is connected to the end of the second face 122B on the side of the sixth face 36 in the y-direction. The ninth face 125Bb is inclined with respect to the x-direction and the y-direction. The ninth face 125Bb overlaps with the third face 123B, as viewed in the y-direction. The ninth face 125Bb is located between the main surface 111B and the back surface 112B in the z-direction and, in the illustrated example, connected to the main surface 111B and the back surface 112B.

The sixth face 126Ba extends along the y-direction. In the illustrated example, the sixth face 126Ba is connected to the fifth face 125Ba. The sixth face 126Ba is located between the main surface 111B and the back surface 112B in the z-direction and, in the illustrated example, connected to the main surface 111B and the back surface 112B. The tenth face 126Bb extends along the y-direction. In the illustrated example, the tenth face 126Bb is connected to the fourth face 124B. The tenth face 126Bb is located between the main surface 111B and the back surface 112B in the z-direction and, in the illustrated example, connected to the main surface 111B and the back surface 112B.

The seventh face 127Ba is located between the first face 121B and the third face 123B in the x-direction, and between the first face 121B and the third face 123B in the y-direction. The seventh face 127Ba is connected to the first face 121B and the third face 123B. In the illustrated example, the seventh face 127Ba forms a convex curved surface, as viewed in the z-direction. The seventh face 127Ba is located between the main surface 111B and the back surface 112B in the z-direction and, in the illustrated example, connected to the main surface 111B and the back surface 112B. The eleventh face 127Bb is located between the second face 122B and the third face 123B in the x-direction, and between the second face 122B and the third face 123B in the y-direction. The eleventh face 127Bb is connected to the second face 122B and the third face 123B. In the illustrated example, the eleventh face 127Bb forms a convex curved surface, as viewed in the z-direction. The eleventh face 127Bb is located between the main surface 111B and the back surface 112B in the z-direction and, in the illustrated example, connected to the main surface 111B and the back surface 112B.

The eighth face 128B is located between the tenth face 126Bb and the ninth face 125Bb in the x-direction and the y-direction, and connected to the tenth face 126Bb and the ninth face 125Bb. In the illustrated example, the eighth face 128B extends along the x-direction. The eighth face 128B is located between the main surface 111B and the back surface 112B in the z-direction and, in the illustrated example, connected to the main surface 111B and the back surface 112B.

In the illustrated example, the first face 121B, the second face 122B, and the third face 123B each include a plurality of protrusions 131B. The plurality of protrusions 131B each protrude outwardly of the first portion 11B as viewed in the z-direction, and extend along the z-direction. Here, the plurality of protrusions 131B may be formed on the first portion 11B, in portions other than the first face 121B, the second face 122B, and the third face 123B. In addition, at least one of the first face 121B, the second face 122B, and the third face 123B may be without the plurality of protrusions 131B.

The plurality of recesses 1111B are each recessed from the main surface 111B in the z-direction. The shape of the recess 1111B in a z-direction view is not specifically limited, and may be, for example, circular, elliptical, rectangular, or triangular. In the illustrated example, the plurality of recesses 1111B are arranged in a matrix pattern.

The groove 1112B is recessed from the main surface 111B in the z-direction. In the illustrated example, the shape of the groove 1112B in a z-direction view is not specifically limited and, in the illustrated example, the groove 1112B has a rectangular shape. The cross-sectional shape of the groove 1112B is not specifically limited, and may be, for example, circular, elliptical, rectangular, or triangular.

The number of rows of the plurality of recesses 1111B in the y-direction is larger in the region between the groove 1112B and the fourth face 124B, than in the region between the groove 1112B and the third face 123B.

The third portion 13B and the fourth portion 14B are covered with the encapsulating resin 7. The third portion 13B is connected to the first portion 11B and the fourth portion 14B. In the illustrated example, the third portion 13B is connected to a portion of the first portion 11B adjacent to the fourth face 124B. In addition, the third portion 13B overlaps with the sixth face 36, as viewed in the z-direction. As shown in FIG. 5, the fourth portion 14B is, like the fourth portion 14A of the lead 1A, shifted from the first portion 11B in the z-direction, to the side to which the main surface 111B is oriented. The end portion of the fourth portion 14B is flush with the sixth face 76 of the resin 7.

The second portion 12B is connected to the end portion of the fourth portion 14B, and corresponds to a portion of the lead 1B sticking out from the encapsulating resin 7. The second portion 12B sticks out to the opposite side of the first portion 11B, in the y-direction. The second portion 12B is used, for example, to electrically connect the semiconductor device A1 to an external circuit. In the illustrated example, the second portion 12B is bent in the z-direction, to the side to which the main surface 111B is oriented.

The lead 1C is located on the substrate 3 and, in this embodiment, on the first face 31. The lead 1C exemplifies a first lead in the present disclosure. The lead 1C is bonded to the bonding section 6C, via the bonding material 81. In the case where the bonding section 6C is not provided on the substrate 3, the lead 1C may be bonded to the substrate 3.

The configuration of the lead 1C is not specifically limited. In this embodiment the lead 1C includes, as shown in FIG. 4 and FIG. 14, a first portion 11C, a second portion 12C, a third portion 13C, and a fourth portion 14C, each of which will be described hereunder.

As shown in FIG. 9 and FIG. 14, the first portion 11C includes a main surface 111C, a back surface 112C, a first face 121C, a second face 122C, a third face 123C, a fourth face 124C, a fifth face 125Ca, a sixth face 126Ca, a seventh face 127Ca, an eighth face 128C, a ninth face 125Cb, a tenth face 126Cb, an eleventh face 127Cb, a plurality of recesses 1111C, and a groove 1112C.

The main surface 111C is oriented in the same direction as the first face 31, in the z-direction.

The back surface 112C is oriented to the opposite side of the main surface 111C in the z-direction and, in the illustrated example, a planar surface. The back surface 112C is bonded to the bonding section 6C via the bonding material 81, as shown in FIG. 9.

The first face 121C is located between the main surface 111C and the back surface 112C in the z-direction, and oriented in the same direction as the third face 33 as a whole, in the x-direction. In the illustrated example, the first face 121C is connected to the main surface 111C and the back surface 112C. The first face 121C is opposed to the second face 122B.

The second face 122C is located on the opposite side of the first face 121C in the x-direction, and oriented in the same direction as the fourth face 34, in the x-direction. The second face 122C is located between the main surface 111C and the back surface 112C in the z-direction and, in the illustrated example, connected to the main surface 111C and the back surface 112C. The second face 122C is smaller in size in the y-direction, than the first face 121C.

The third face 123C is located between the first face 121C and the second face 122C in the x-direction, and oriented in the same direction as the fifth face 35, in the y-direction. The third face 123C is located between the main surface 111C and the back surface 112C in the z-direction and, in the illustrated example, connected to the main surface 111C and the back surface 112C.

The fourth face 124C is located on the opposite side of the third face 123C in the y-direction, and oriented in the same direction as the sixth face 36 in the y-direction. The fourth face 124C is located between the main surface 111C and the back surface 112C in the z-direction and, in the illustrated example, connected to the main surface 111C and the back surface 112C. In the illustrated example, the fourth face 124C overlaps with the third face 123C, as viewed in the y-direction.

The fifth face 125Ca is connected to the end of the first face 121C on the side of the sixth face 36 in the y-direction. The fifth face 125Ca is opposed to the ninth face 125Bb. The fifth face 125Ca is inclined with respect to the x-direction and the y-direction. The fifth face 125Ca is spaced apart from the third face 123C, as viewed in the y-direction. The fifth face 125Ca is located between the main surface 111C and the back surface 112C in the z-direction and, in the illustrated example, connected to the main surface 111C and the back surface 112C. The ninth face 125Cb is connected to the end of the second face 122C on the side of the sixth face 36 in the y-direction. The ninth face 125Cb is inclined with respect to the x-direction and the y-direction. The ninth face 125Cb overlaps with the third face 123C, as viewed in the y-direction. The ninth face 125Cb is located between the main surface 111C and the back surface 112C in the z-direction and, in the illustrated example, connected to the main surface 111C and the back surface 112C.

The sixth face 126Ca is located on the opposite side of the third face 123C with respect to the fifth face 125Ca, in the y-direction. In the illustrated example, the sixth face 126Ca is opposed to the tenth face 126Bb. The sixth face 126Ca extends along the y-direction. The sixth face 126Ca is located between the main surface 111C and the back surface 112C in the z-direction and, in the illustrated example, connected to the main surface 111C and the back surface 112C. The tenth face 126Cb is located on the opposite side of the third face 123C with respect to the ninth face 125Cb, in the y-direction. In the illustrated example, the tenth face 126Cb is connected to the fourth face 1240 and the ninth face 125Cb. The tenth face 126Cb extends along the y-direction. The tenth face 126Cb is located between the main surface 111C and the back surface 112C in the z-direction and, in the illustrated example, connected to the main surface 111C and the back surface 112C.

The seventh face 127Ca is located between the first face 121C and the third face 1230 in the x-direction, and between the first face 121C and the third face 123C in the y-direction. The seventh face 127Ca is connected to the first face 121C and the third face 123C. In the illustrated example, the seventh face 127Ca forms a convex curved surface, as viewed in the z-direction. The seventh face 127Ca is located between the main surface 111C and the back surface 112C in the z-direction and, in the illustrated example, connected to the main surface 111C and the back surface 1120. The eleventh face 127Cb is located between the second face 122C and the third face 123C in the x-direction, and between the second face 122C and the third face 123C in the y-direction. The eleventh face 127Cb is connected to the second face 122C and the third face 123C. In the illustrated example, the eleventh face 127Cb forms a convex curved surface, as viewed in the z-direction. The eleventh face 127Cb is located between the main surface 111C and the back surface 112C in the z-direction and, in the illustrated example, connected to the main surface 111C and the back surface 112C.

The eighth face 128C is located between the fifth face 125Ca and the sixth face 126Ca in the x-direction and the y-direction, and connected to the fifth face 125Ca and the sixth face 126Ca. In the illustrated example, the eighth face 128C extends along the x-direction, and is opposed to the eighth face 128B. The eighth face 128C is located between the main surface 111C and the back surface 112C in the z-direction and, in the illustrated example, connected to the main surface 111C and the back surface 112C.

In the illustrated example, the first face 121C, the second face 122C, and the third face 123C each include a plurality of protrusions 131C. The plurality of protrusions 131C each protrude outwardly of the first portion 11C as viewed in the z-direction, and extend along the z-direction. Here, the plurality of protrusions 131C may be formed on the first portion 11C, in portions other than the first face 121C, the second face 122C, and the third face 123C. In addition, at least one of the first face 121C, the second face 122C, and the third face 123C may be without the plurality of protrusions 131C.

The plurality of recesses 1111C are each recessed from the main surface 111C in the z-direction. The shape of the recess 1111C in a z-direction view is not specifically limited, and may be, for example, circular, elliptical, rectangular, or triangular. In the illustrated example, the plurality of recesses 1111C are arranged in a matrix pattern.

The groove 1112C is recessed from the main surface 111C in the z-direction. In the illustrated example, the shape of the groove 1112C in a z-direction view is not specifically limited and, in the illustrated example, the groove 1112C has a rectangular shape. The cross-sectional shape of the groove 1112C is not specifically limited, and may be, for example, circular, elliptical, rectangular, or triangular.

The number of rows of the plurality of recesses 1111C in the y-direction is larger in the region between the groove 1112C and the fourth face 124C, than in the region between the groove 1112C and the third face 123C.

The third portion 13C and the fourth portion 14C are covered with the encapsulating resin 7. The third portion 13C is connected to the first portion 11C and the fourth portion 14C. In the illustrated example, the third portion 13C is connected to a portion of the first portion 11C adjacent to the fourth face 1240. In addition, the third portion 13C overlaps with the sixth face 36, as viewed in the z-direction. The fourth portion 14C is, like the fourth portion 14A of the lead 1A, shifted from the first portion 11C in the z-direction, to the side to which the main surface 111C is oriented, and connected to the second portion 12C. The end portion of the fourth portion 14C is flush with the sixth face 76 of the resin 7.

The second portion 12C is connected to the end portion of the fourth portion 14C, and corresponds to a portion of the lead 1C sticking out from the encapsulating resin 7. The second portion 12C sticks out to the opposite side of the first portion 11C, in the y-direction. The second portion 12C is used, for example, to electrically connect the semiconductor device A1 to an external circuit. In the illustrated example, the second portion 12C is bent in the z-direction, to the side to which the main surface 111C is oriented.

The lead 1D is located on the substrate 3 and, in this embodiment, on the first face 31. The lead 1D exemplifies a first lead in the present disclosure. The lead 1D is bonded to the bonding section 6D, via the bonding material 81. In the case where the bonding section 6D is not provided on the substrate 3, the lead 1D may be bonded to the substrate 3.

The configuration of the lead 1D is not specifically limited. In this embodiment the lead 1D includes, as shown in FIG. 4 and FIG. 14, a first portion 11D, a second portion 12D, a third portion 13D, and a fourth portion 14D, each of which will be described hereunder.

As shown in FIG. 9 and FIG. 14, the first portion 11D includes a main surface 111D, a back surface 112D, a first face 121D, a second face 122D, a third face 123D, a fourth face 124D, a fifth face 125Da, a sixth face 126D, a seventh face 127Da, an eighth face 125Db, a ninth face 127Db, a plurality of recesses 1111D, and a groove 1112D.

The main surface 111D is oriented in the same direction as the first face 31, in the z-direction.

The back surface 112D is oriented to the opposite side of the main surface 111D in the z-direction and, in the illustrated example, a planar surface. The back surface 112D is bonded to the bonding section 6D via the bonding material 81, as shown in FIG. 9.

The first face 121D is located between the main surface 111D and the back surface 112D in the z-direction, and oriented in the same direction as the third face 33 as a whole, in the x-direction. In the illustrated example, the first face 121D is connected to the main surface 111D and the back surface 112D. The first face 121D is opposed to the second face 122C.

The second face 122D is located on the opposite side of the first face 121D in the x-direction, and oriented in the same direction as the fourth face 34, in the x-direction. The second face 122D is located between the main surface 111D and the back surface 112D in the z-direction and, in the illustrated example, connected to the main surface 111D and the back surface 112D. The second face 122D is larger in size in the y-direction, than the first face 121D.

The third face 123D is located between the first face 121D and the second face 122D in the x-direction, and oriented in the same direction as the fifth face 35, in the y-direction. The third face 123D is located between the main surface 111D and the back surface 112D in the z-direction and, in the illustrated example, connected to the main surface 111D and the back surface 112D.

The fourth face 124D is located on the opposite side of the third face 123D in the y-direction, and oriented in the same direction as the sixth face 36 in the y-direction. The fourth face 124D is located between the main surface 111D and the back surface 112D in the z-direction and, in the illustrated example, connected to the main surface 111D and the back surface 112D. In the illustrated example, the fourth face 124D overlaps with the third face 123D, as viewed in the y-direction.

The fifth face 125Da is connected to the end of the first face 121D on the side of the sixth face 36 in the y-direction. The fifth face 125Da is opposed to the ninth face 125Cb. The fifth face 125Da is inclined with respect to the x-direction and the y-direction. The fifth face 125Da is spaced apart from the third face 123D, as viewed in the y-direction. The fifth face 125Da is located between the main surface 111D and the back surface 112D in the z-direction and, in the illustrated example, connected to the main surface 111D and the back surface 112D. The eighth face 125Db is connected to the end of the second face 122D on the side of the sixth face 36 in the y-direction. The eighth face 125Db is inclined with respect to the x-direction and the y-direction. The eighth face 125Db overlaps with the third face 123D, as viewed in the y-direction. The eighth face 125Db is located between the main surface 111D and the back surface 112D in the z-direction and, in the illustrated example, connected to the main surface 111D and the back surface 112D.x The sixth face 126D is located on the opposite side of the third face 123D with respect to the fifth face 125Da, in the y-direction. In the illustrated example, the sixth face 126D is opposed to the sixth face 126C. The sixth face 126D is connected to the fifth face 125Da. The sixth face 126D extends along the y-direction. The sixth face 126D is located between the main surface 111D and the back surface 112D in the z-direction and, in the illustrated example, connected to the main surface 111D and the back surface 112D.

The seventh face 127Da is located between the first face 121D and the third face 123D in the x-direction, and between the first face 121D and the third face 123D in the y-direction. The seventh face 127Da is connected to the first face 121D and the third face 123D. In the illustrated example, the seventh face 127Da forms a convex curved surface, as viewed in the z-direction. The seventh face 127Da is located between the main surface 111D and the back surface 112D in the z-direction and, in the illustrated example, connected to the main surface 111D and the back surface 112D. The ninth face 127Db is located between the second face 122D and the third face 123D in the x-direction, and between the second face 122D and the third face 123D in the y-direction. The ninth face 127Db is connected to the second face 122D and the third face 123D. In the illustrated example, the ninth face 127Db forms a convex curved surface, as viewed in the z-direction. The ninth face 127Db is located between the main surface 111D and the back surface 112D in the z-direction and, in the illustrated example, connected to the main surface 111D and the back surface 112D.

In the illustrated example, the first face 121D, the second face 122D, and the third face 123D each include a plurality of protrusions 131D. The plurality of protrusions 131D each protrude outwardly of the first portion 11D as viewed in the z-direction, and extend along the z-direction. Here, the plurality of protrusions 131D may be formed on the first portion 11D, in portions other than the first face 121D, the second face 122D, and the third face 123D. In addition, at least one of the first face 121D, the second face 122D, and the third face 123D may be without the plurality of protrusions 131D.

The plurality of recesses 1111D are each recessed from the main surface 111D in the z-direction. The shape of the recess 1111D in a z-direction view is not specifically limited, and may be, for example, circular, elliptical, rectangular, or triangular. In the illustrated example, the plurality of recesses 1111D are arranged in a matrix pattern.

The groove 1112D is recessed from the main surface 111D in the z-direction. In the illustrated example, the shape of the groove 1112D in a z-direction view is not specifically limited and, in the illustrated example, the groove 1112D has a rectangular shape. The cross-sectional shape of the groove 1112D is not specifically limited, and may be, for example, circular, elliptical, rectangular, or triangular.

The number of rows of the plurality of recesses 1111D in the y-direction is larger in the region between the groove 1112D and the fourth face 124D, than in the region between the groove 1112D and the third face 123D.

Regarding the third portion 13D and the fourth portion 14D, the third portion 13D is connected to the first portion 11D and the fourth portion 14D. In the illustrated example, the third portion 13D is connected to a portion of the first portion 11D adjacent to the fourth face 124D. In addition, the third portion 13D overlaps with the sixth face 36, as viewed in the z-direction, and is covered with the encapsulating resin 7. The fourth portion 14D is, like the fourth portion 14A of the lead 1A, shifted from the first portion 11D in the z-direction, to the side to which the main surface 111D is oriented, and connected to the second portion 12D. The end portion of the fourth portion 14D is flush with the sixth face 76 of the resin 7.

The second portion 12D is connected to the end portion of the fourth portion 14D, and corresponds to a portion of the lead 1D sticking out from the encapsulating resin 7. The second portion 12D sticks out to the opposite side of the first portion 11D, in the y-direction. The second portion 12D is used, for example, to electrically connect the semiconductor device A1 to an external circuit. In the illustrated example, the second portion 12D is bent in the z-direction, to the side to which the main surface 111D is oriented.

The lead 1E is spaced apart from the substrate 3, as viewed in the z-direction. In this embodiment, the lead 1E is located on the side to which the sixth face 36 is oriented, with respect to the substrate 3 in the y-direction.

The configuration of the lead 1E is not specifically limited. In this embodiment the lead 1E includes, as shown in FIG. 4, a second portion 12E and a fourth portion 14E, each of which will be described hereunder.

The fourth portion 14E is covered with the encapsulating resin 7. The fourth portion 14E is, like the fourth portion 14D of the lead 1D, shifted from the first portion 11D in the z-direction, to the side to which the main surface 111D is oriented. The end portion of the fourth portion 14E is flush with the sixth face 76 of the resin 7.

The second portion 12E is connected to the end portion of the fourth portion 14E, and corresponds to a portion of the lead 1E sticking out from the encapsulating resin 7. The second portion 12E sticks out to the opposite side of the fourth portion 14E, in the y-direction. The second portion 12E is used, for example, to electrically connect the semiconductor device A1 to an external circuit. In the illustrated example, the second portion 12E is bent in the z-direction, to the side to which the first face 31 is oriented.

The lead 1F is spaced apart from the substrate 3, as viewed in the z-direction. In this embodiment, the lead 1F is located on the side to which the sixth face 36 is oriented, with respect to the substrate 3 in the y-direction.

The configuration of the lead 1F is not specifically limited. In this embodiment the lead 1F includes, as shown in FIG. 4, a second portion 12F and a fourth portion 14F, each of which will be described hereunder.

The fourth portion 14F is covered with the encapsulating resin 7. The fourth portion 14F is, like the fourth portion 14D of the lead 1D, shifted from the first portion 11D in the z-direction, to the side to which the main surface 111D is oriented. The end portion of the fourth portion 14F is flush with the sixth face 76 of the resin 7.

The second portion 12F is connected to the end portion of the fourth portion 14F, and corresponds to a portion of the lead 1F sticking out from the encapsulating resin 7. The second portion 12F sticks out to the opposite side of the fourth portion 14F, in the y-direction. The second portion 12F is used, for example, to electrically connect the semiconductor device A1 to an external circuit. In the illustrated example, the second portion 12F is bent in the z-direction, to the side to which the first face 31 is oriented.

The lead 1G is spaced apart from the substrate 3, as viewed in the z-direction. In this embodiment, the lead 1G is located on the side to which the fourth face 34 is oriented, with respect to the substrate 3 in the x-direction. In addition, the lead 1G is located on the opposite side of the fourth portion 14D, with respect to the lead 1G in the x-direction.

The configuration of the lead 1G is not specifically limited. In this embodiment the lead 1G includes, as shown in FIG. 4, a second portion 12G and a fourth portion 14G, each of which will be described hereunder.

The fourth portion 14G is covered with the encapsulating resin 7. The fourth portion 14G is, like the fourth portion 14D of the lead 1D, shifted from the first portion 11D in the z-direction, to the side to which the main surface 111D is oriented. The fourth portion 14G overlaps with the fourth portion 14F, as viewed in the y-direction. The end portion of the fourth portion 14G is flush with the sixth face 76 of the resin 7.

The second portion 12G is connected to the end portion of the fourth portion 14G, and corresponds to a portion of the lead 1G sticking out from the encapsulating resin 7. The second portion 12G sticks out to the opposite side of the fourth portion 14G, in the y-direction. The second portion 12G is used, for example, to electrically connect the semiconductor device A1 to an external circuit. In the illustrated example, the second portion 12G is bent in the z-direction, to the side to which the first face 31 is oriented.

The lead 1Z is spaced apart from the substrate 3, as viewed in the z-direction. In this embodiment, the lead 1Z is located on the side to which the third face 33 is oriented, with respect to the substrate 3 in the x-direction. In addition, the lead 1Z is located on the opposite side of the lead 13, with respect to the lead 1A in the x-direction.

The configuration of the lead 1Z is not specifically limited. In this embodiment the lead 1Z includes, as shown in FIG. 4, a second portion 12Z and a fourth portion 14Z, each of which will be described hereunder. In this embodiment, the lead 1Z is insulated from the circuit of the semiconductor device A1.

The fourth portion 14Z is covered with the encapsulating resin 7. The fourth portion 14Z is, like the fourth portion 14D of the lead 1D, shifted from the first portion 11D in the z-direction, to the side to which the main surface 111D is oriented. The shape of the fourth portion 14Z is not specifically limited and, in the illustrated example, the fourth portion 14Z has a strip shape extending along the y-direction. The end portion of the fourth portion 14Z is flush with the sixth face 76 of the resin 7.

The second portion 12Z is connected to the end portion of the fourth portion 14Z, and corresponds to a portion of the lead 1Z sticking out from the encapsulating resin 7. The second portion 12Z sticks out to the opposite side of the fourth portion 14Z, in the y-direction. The second portion 12Z is used, for example, when the semiconductor device A1 is mounted on an external circuit board. In the illustrated example, the second portion 12Z is bent in the z-direction, to the side to which the first face 31 is oriented.

As shown in FIG. 4, the second portion 12A, the second portion 123, the second portion 12C, and the second portion 12D are aligned in the x-direction, with clearances G11 between each other. The clearances G11 have generally the same width, with a difference within ±5% from each other. The second portion 12D and the second portion 12E are spaced apart from each other in the x-direction, by a clearance G12. The clearance G12 has generally the same width as the clearance G11, with a difference within ±5% from each other. The second portion 12E, the second portion 12F, and the second portion 12G are aligned in the x-direction, with clearances G13 between each other. The clearances G13 are narrower than the clearances G11, and the difference in length between the plurality of clearances G13 is within ±5%. The second portion 12A and the second portion 12Z are spaced apart from each other in the x-direction, by a clearance G14. The clearance G14 is wider than the clearance G11.

<Leads 2>

The plurality of leads 2 contain a metal, and have higher heat dissipation characteristics, for example than the substrate 3. The metal to form the lead 2 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 2 may be plated with nickel (Ni). Examples of the forming method of the plurality of leads 2 include pressing a metal plate with a die, and patterning a metal plate by etching, without limitation thereto. The thickness of the lead 2 is not specifically limited, but may be, for example, approximately 0.4 mm to 0.8 mm. The plurality of leads 2 are located so as to overlap with the second region 303, as viewed in the z-direction.

In this embodiment, the plurality of leads 2 include a plurality of leads 2A to 2P, and 2Z, as shown in FIG. 1 to FIG. 4. The plurality of leads 2A to 2O constitute conduction paths, for example to the control chips 4G and 4H.

The lead 2A is spaced apart from the plurality of leads 1. The lead 2A is located on the conductive section 5. The lead 2A is electrically connected to the conductive section 5. The lead 2A exemplifies a second lead in the present disclosure. The lead 2A is bonded to the second portion 52A of the wiring 50A in the conductive section 5, via a conductive bonding material 82. The conductive bonding material 82 may be any material that is capable of bonding, and electrically connecting, the lead 2A to the second portion 52A. For example, silver paste, copper paste, or solder may be employed as the conductive bonding material 82. The conductive bonding material 82 corresponds to the first conductive bonding material in the present disclosure.

The configuration of the lead 2A is not specifically limited. In this embodiment the lead 2A includes, as shown in FIG. 15, a first portion 21A, a second portion 22A, a third portion 23A, and a fourth portion 24A, each of which will be described hereunder.

The first portion 21A is bonded to the second portion 52A of the wiring 50A. The shape of the first portion 21A is not specifically limited, and a desired shape may be selected from a rectangular shape, a polygonal shape, a circular shape, an elliptical shape, and so forth. In the illustrated example, the first portion 21A has an elongate rectangular shape, having the long sides extending along the y-direction. In the illustrated example, the first portion 21A overlaps with the second portion 52A, as viewed in the z-direction. In addition, the first portion 21A includes a through hole 211A. The through hole 211A is formed so as to penetrate through the first portion 21A, in the z-direction. The inside of the through hole 211A is filled with the conductive bonding material 82, like a through hole 211C in a first portion 21C of the lead 2C shown in FIG. 5. The conductive bonding material 82 covers a part of the surface of the lead 2A. However, the conductive bonding material 82 may be provided only inside the through hole 211A, so as not to reach the surface of the lead 2A.

The third portion 23A and the fourth portion 24A are covered with the encapsulating resin 7. The third portion 23A is connected to the first portion 21A and the fourth portion 24A. The fourth portion 24A is shifted in the z-direction with respect to the first portion 21A, to the side to which the first face 31 is oriented, like a third portion 23C and a fourth portion 24C of the lead 2C shown in FIG. 5. The end portion of the fourth portion 24A is flush with a fifth face 75 of the resin 7. In the illustrated example, the third portion 23A and the fourth portion 24A generally coincide with each other, as viewed in the y-direction. Here, the expression "generally coincide" as viewed in the y-direction refers to, for example, exactly coinciding with each other, or being deviated by within ±5% of the characteristic size (size of the third portion 23A, or fourth portion 24A in the x-direction). In addition, the third portion 23A and the fourth portion 24A are shifted toward the third face 33 in the x-direction, from the center of the first portion 21A in the x-direction. The third portion 23A overlaps with the fifth face 35 of the substrate 3, as viewed in the z-direction.

The second portion 22A is connected to the end portion of the fourth portion 24A, and corresponds to a portion of the lead 2A sticking out from the encapsulating resin 7 to the opposite side of the plurality of leads 1, as viewed in the y-direction. The second portion 22A sticks out to the opposite side of the first portion 21A, in the y-direction. The second portion 22A is used, for example, to electrically connect the semiconductor device A1 to an external circuit. In the illustrated example, the second portion 22A is bent in the z-direction, to the side to which the first face 31 is oriented. The second portion 22A, the third portion 23A, and the fourth portion 24A each include, on the respective sides thereof in the x-direction, edges extending along the y-direction.

The lead 2B is spaced apart from the plurality of leads 1. The lead 2B is located on the conductive section 5. The lead 2B is electrically connected to the conductive section 5. The lead 2B exemplifies a second lead in the present disclosure. The lead 2B is bonded to the second portion 52B of the wiring 50B in the conductive section 5, via the conductive bonding material 82.

The configuration of the lead 2B is not specifically limited. In this embodiment the lead 2B includes, as shown in FIG. 15, a first portion 21B, a second portion 22B, a third portion 23B, and a fourth portion 24B, each of which will be described hereunder.

The first portion 21B is bonded to the second portion 52B of the wiring 50B. The shape of the first portion 21B is not specifically limited, and a desired shape may be selected from a rectangular shape, a polygonal shape, a circular shape, an elliptical shape, and so forth. In the illustrated example, the first portion 21B has an elongate rectangular shape, having the long sides extending along the y-direction. In the illustrated example, the first portion 21B overlaps with the second portion 52B, as viewed in the z-direction. In addition, the first portion 21B includes a through hole 211B. The through hole 211B is formed so as to penetrate through the first portion 21B, in the z-direction. The inside of the through hole 211B is filled with the conductive bonding material 82, like the through hole 211C in the first portion 21C of the lead 2C shown in FIG. 5. The conductive bonding material 82 covers a part of the surface of the lead 2B. However, the conductive bonding material 82 may be provided only inside the through hole 211B, so as not to reach the surface of the lead 2B.

The third portion 23B and the fourth portion 24B are covered with the encapsulating resin 7. The third portion 23B is connected to the first portion 21B and the fourth portion 24B. The fourth portion 24B is shifted in the z-direction with respect to the first portion 21B, to the side to which the first face 31 is oriented, like the third portion 23C and the fourth portion 24C of the lead 2C shown in FIG. 5. The end portion of the fourth portion 24B is flush with the sixth face 75 of the resin 7. In the illustrated example, the first portion 21B, the third portion 23B, and the fourth portion 24B generally coincide with each other, as viewed in the y-direction. Here, the expression "generally coincide" as viewed in the y-direction refers to, for example, exactly coinciding with each other, or being deviated by within ±5% of the characteristic size (size of the first portion 21B, third portion 23B, or fourth portion 24B in the x-direction). The third portion 23B overlaps with the fifth face 35 of the substrate 3, as viewed in the z-direction.

The second portion 22B is connected to the end portion of the fourth portion 24B, and corresponds to a portion of the lead 2B sticking out from the encapsulating resin 7 to the opposite side of the plurality of leads 1, as viewed in the y-direction. The second portion 22B sticks out to the opposite side of the first portion 21B, in the y-direction. The second portion 22B is used, for example, to electrically connect the semiconductor device A1 to an external circuit. In the illustrated example, the second portion 22B is bent in the z-direction, to the side to which the first face 31 is oriented. The second portion 22B, the third portion 23B, and the fourth portion 24B each include, on the respective sides thereof in the x-direction, edges extending along the y-direction. The edges of the second portion 22B, the third portion 23B, and the fourth portion 24B, on the side of the third face 33 in the x-direction, are respectively opposed to the edges of the second portion 22A, the third portion 23A, and the fourth portion 24A, on the side of the fourth face 34 in the x-direction.

The lead 2C is spaced apart from the plurality of leads 1. The lead 2C is located on the conductive section 5. The lead 2C is electrically connected to the conductive section 5. The lead 2C exemplifies a second lead in the present disclosure. The lead 2C is bonded to the second portion 52C of the wiring 50C in the conductive section 5, via the conductive bonding material 82.

The configuration of the lead 2C is not specifically limited. In this embodiment the lead 2C includes, as shown in FIG. 15, a first portion 21C, a second portion 22C, a third portion 23C, and a fourth portion 24C, each of which will be described hereunder.

The first portion 21C is bonded to the second portion 52C of the wiring 50C. The shape of the first portion 21C is not specifically limited, and a desired shape may be selected from a rectangular shape, a polygonal shape, a circular shape, an elliptical shape, and so forth. In the illustrated example, the first portion 21C has an elongate rectangular shape, having the long sides extending along the y-direction. In the illustrated example, the first portion 21C overlaps with the second portion 52C, as viewed in the z-direction. In addition, the first portion 21C includes a through hole 211C. The through hole 211C is formed so as to penetrate through the first portion 21C, in the z-direction. The inside of the through hole 211C is filled with the conductive bonding material 82, as shown in FIG. 5. The conductive bonding material 82 covers a part of the surface of the lead 2C.

However, the conductive bonding material 82 may be provided only inside the through hole 211C, so as not to reach the surface of the lead 2C.

The third portion 23C and the fourth portion 24C are covered with the encapsulating resin 7. The third portion 23C is connected to the first portion 21C and the fourth portion 24C. As shown in FIG. 5, the fourth portion 24C is shifted in the z-direction with respect to the first portion 21C, to the side to which the first face 31 is oriented. The end portion of the fourth portion 24C is flush with the sixth face 75 of the resin 7. In the illustrated example, the first portion 21C, the third portion 23C, and the fourth portion 24C generally coincide with each other, as viewed in the y-direction. Here, the expression "generally coincide" as viewed in the y-direction refers to, for example, exactly coinciding with each other, or being deviated by within ±5% of the characteristic size (size of the first portion 21C, third portion 23C, or fourth portion 24C in the x-direction). The third portion 23C overlaps with the fifth face 35 of the substrate 3, as viewed in the z-direction.

The second portion 22C is connected to the end portion of the fourth portion 24C, and corresponds to a portion of the lead 2C sticking out from the encapsulating resin 7 to the opposite side of the plurality of leads 1, as viewed in the y-direction. The second portion 22C sticks out to the opposite side of the first portion 21C, in the y-direction. The second portion 22C is used, for example, to electrically connect the semiconductor device A1 to an external circuit. In the illustrated example, the second portion 22C is bent in the z-direction, to the side to which the first face 31 is oriented. The second portion 22C, the third portion 23C, and the fourth portion 24C each include, on the respective sides thereof in the x-direction, edges extending along the y-direction. The edges of the second portion 22C, the third portion 23C, and the fourth portion 24C, on the side of the third face 33 in the x-direction, are respectively opposed to the edges of the second portion 22B, the third portion 23B, and the fourth portion 24B, on the side of the fourth face 34 in the x-direction.

The lead 2D is spaced apart from the plurality of leads 1. The lead 2D is located on the conductive section 5. The lead 2D is electrically connected to the conductive section 5. The lead 2D exemplifies a second lead in the present disclosure. The lead 2D is bonded to the second portion 52D of the wiring 50D in the conductive section 5, via the conductive bonding material 82.

The configuration of the lead 2D is not specifically limited. In this embodiment the lead 2D includes, as shown in FIG. 15, a first portion 21D, a second portion 22D, a third portion 23D, and a fourth portion 24D, each of which will be described hereunder.

The first portion 21D is bonded to the second portion 52D of the wiring 50D. The shape of the first portion 21D is not specifically limited, and a desired shape may be selected from a rectangular shape, a polygonal shape, a circular shape, an elliptical shape, and so forth. In the illustrated example, the first portion 21D has an elongate rectangular shape, having the long sides extending along the y-direction. In the illustrated example, the first portion 21D overlaps with the second portion 52D, as viewed in the z-direction. In addition, the first portion 21D includes a through hole 211D. The through hole 211D is formed so as to penetrate through the first portion 21D, in the z-direction. The inside of the through hole 211D is filled with the conductive bonding material 82, like the through hole 211C in the first portion 21C of the lead 2C shown in FIG. 5. The conductive bonding material 82 covers a part of the surface of the lead 2D. However, the conductive bonding material 82 may be provided only inside the through hole 211D, so as not to reach the surface of the lead 2D.

The third portion 23D and the fourth portion 24D are covered with the encapsulating resin 7. The third portion 23D is connected to the first portion 21D and the fourth portion 24D. The fourth portion 24D is shifted in the z-direction with respect to the first portion 21D, to the side to which the first face 31 is oriented, like the third portion 23C and the fourth portion 24C of the lead 2C shown in FIG. 5. The end portion of the fourth portion 24D is flush with the sixth face 75 of the resin 7. In the illustrated example, the first portion 21D, the third portion 23D, and the fourth portion 24D generally coincide with each other, as viewed in the y-direction. Here, the expression "generally coincide" as viewed in the y-direction refers to, for example, exactly coinciding with each other, or being deviated by within ±5% of the characteristic size (size of the first portion 21D, third portion 23D, or fourth portion 24D in the x-direction). The third portion 23D overlaps with the fifth face 35 of the substrate 3, as viewed in the z-direction.

The second portion 22D is connected to the end portion of the fourth portion 24D, and corresponds to a portion of the lead 2D sticking out from the encapsulating resin 7 to the opposite side of the plurality of leads 1, as viewed in the y-direction. The second portion 22D sticks out to the opposite side of the first portion 21D, in the y-direction. The second portion 22D is used, for example, to electrically connect the semiconductor device A1 to an external circuit. In the illustrated example, the second portion 22D is bent in the z-direction, to the side to which the first face 31 is oriented. The second portion 22D, the third portion 23D, and the fourth portion 24D each include, on the respective sides thereof in the x-direction, edges extending along the y-direction. The edges of the second portion 22D, the third portion 23D, and the fourth portion 24D, on the side of the third face 33 in the x-direction, are respectively opposed to the edges of the second portion 22C, the third portion 23C, and the fourth portion 24C, on the side of the fourth face 34 in the x-direction.

The lead 2E is spaced apart from the plurality of leads 1. The lead 2E is located on the conductive section 5. The lead 2E is electrically connected to the conductive section 5. The lead 2E exemplifies a second lead in the present disclosure. The lead 2E is bonded to the second portion 52E of the wiring 50E in the conductive section 5, via the conductive bonding material 82.

The configuration of the lead 2E is not specifically limited. In this embodiment the lead 2E includes, as shown in FIG. 15, a first portion 21E, a second portion 22E, a third portion 23E, and a fourth portion 24E, each of which will be described hereunder.

The first portion 21E is bonded to the second portion 52E of the wiring 50E. The shape of the first portion 21E is not specifically limited, and a desired shape may be selected from a rectangular shape, a polygonal shape, a circular shape, an elliptical shape, and so forth. In the illustrated example, the first portion 21E has an elongate rectangular shape, having the long sides extending along the y-direction. In the illustrated example, the first portion 21E overlaps with the second portion 52E, as viewed in the z-direction. In addition, the first portion 21E includes a through hole 211E. The through hole 211E is formed so as to penetrate through the first portion 21E, in the z-direction. The inside of the through hole 211E is filled with the conductive bonding material 82, like the through hole 211C in the first portion 21C of the lead 2C shown in FIG. 5. The conductive bonding material 82 covers a part of the surface of the lead 2E. However, the conductive bonding material 82 may be provided only inside the through hole 211E, so as not to reach the surface of the lead 2E.

The third portion 23E and the fourth portion 24E are covered with the encapsulating resin 7. The third portion 23E is connected to the first portion 21E and the fourth portion 24E. The fourth portion 24E is shifted in the z-direction with respect to the first portion 21E, to the side to which the first face 31 is oriented, like the fourth portion 24C of the lead 2C shown in FIG. 5. The end portion of the fourth portion 24E is flush with the sixth face 75 of the resin 7. In the illustrated example, the first portion 21E, the third portion 23E, and the fourth portion 24E generally coincide with each other, as viewed in the y-direction. Here, the expression "generally coincide" as viewed in the y-direction refers to, for example, exactly coinciding with each other, or being deviated by within ±5% of the characteristic size (size of the first portion 21E, third portion 23E, or fourth portion 24E in the x-direction). The third portion 23E overlaps with the fifth face 35 of the substrate 3, as viewed in the z-direction.

The second portion 22E is connected to the end portion of the fourth portion 24E, and corresponds to a portion of the lead 2E sticking out from the encapsulating resin 7 to the opposite side of the plurality of leads 1, as viewed in the y-direction. The second portion 22E sticks out to the opposite side of the first portion 21E, in the y-direction. The second portion 22E is used, for example, to electrically connect the semiconductor device A1 to an external circuit. In the illustrated example, the second portion 22E is bent in the z-direction, to the side to which the first face 31 is oriented. The second portion 22E, the third portion 23E, and the fourth portion 24E each include, on the respective sides thereof in the x-direction, edges extending along the y-direction. The edges of the second portion 22E, the third portion 23E, and the fourth portion 24E, on the side of the third face 33 in the x-direction, are respectively opposed to the edges of the second portion 22D, the third portion 23D, and the fourth portion 24D, on the side of the fourth face 34 in the x-direction.

The lead 2F is spaced apart from the plurality of leads 1. The lead 2F is located on the conductive section 5. The lead 2F is electrically connected to the conductive section 5. The lead 2F exemplifies a second lead in the present disclosure. The lead 2F is bonded to the second portion 52F of the wiring 50F in the conductive section 5, via the conductive bonding material 82.

The configuration of the lead 2F is not specifically limited. In this embodiment the lead 2F includes, as shown in FIG. 15, a first portion 21F, a second portion 22F, a third portion 23F, and a fourth portion 24F, each of which will be described hereunder.

The first portion 21F is bonded to the second portion 52F of the wiring 50F. The shape of the first portion 21F is not specifically limited, and a desired shape may be selected from a rectangular shape, a polygonal shape, a circular shape, an elliptical shape, and so forth. In the illustrated example, the first portion 21F has an elongate rectangular shape, having the long sides extending along the y-direction. In the illustrated example, the first portion 21F overlaps with the second portion 52F, as viewed in the z-direction. In addition, the first portion 21F includes a through hole 211F. The through hole 211F is formed so as to penetrate through the first portion 21F, in the z-direction. The inside of the through hole 211F is filled with the conductive bonding material 82, like the through hole 211E in the first portion 21E of the lead 2E shown in FIG. 5. The conductive bonding material 82 covers a part of the surface of the lead 2F. However, the conductive bonding material 82 may be provided only inside the through hole 211F, so as not to reach the surface of the lead 2F.

The third portion 23F and the fourth portion 24F are covered with the encapsulating resin 7. The third portion 23F is connected to the first portion 21F and the fourth portion 24F. The fourth portion 24F is shifted in the z-direction with respect to the first portion 21F, to the side to which the first face 31 is oriented, like the third portion 23E and the fourth portion 24E of the lead 2E shown in FIG. 5. The end portion of the fourth portion 24F is flush with the sixth face 75 of the resin 7. In the illustrated example, the first portion 21F, the third portion 23F, and the fourth portion 24F generally coincide with each other, as viewed in the y-direction. Here, the expression "generally coincide" as viewed in the y-direction refers to, for example, exactly coinciding with each other, or being deviated by within ±5% of the characteristic size (size of the first portion 21F, third portion 23F, or fourth portion 24F in the x-direction). The third portion 23F overlaps with the fifth face 35 of the substrate 3, as viewed in the z-direction.

The second portion 22F is connected to the end portion of the fourth portion 24F, and corresponds to a portion of the lead 2F sticking out from the encapsulating resin 7 to the opposite side of the plurality of leads 1, as viewed in the y-direction. The second portion 22F sticks out to the opposite side of the first portion 21F, in the y-direction. The second portion 22F is used, for example, to electrically connect the semiconductor device A1 to an external circuit. In the illustrated example, the second portion 22F is bent in the z-direction, to the side to which the first face 31 is oriented. The second portion 22F, the third portion 23F, and the fourth portion 24F each include, on the respective sides thereof in the x-direction, edges extending along the y-direction. The edges of the second portion 22F, the third portion 23F, and the fourth portion 24F, on the side of the third face 33 in the x-direction, are respectively opposed to the edges of the second portion 22E, the third portion 23E, and the fourth portion 24E, on the side of the fourth face 34 in the x-direction.

The lead 2G is spaced apart from the plurality of leads 1. The lead 2G is located on the conductive section 5. The lead 2G is electrically connected to the conductive section 5. The lead 2G exemplifies a second lead in the present disclosure. The lead 2G is bonded to the second portion 52G of the wiring 50G in the conductive section 5, via the conductive bonding material 82.

The configuration of the lead 2G is not specifically limited. In this embodiment the lead 2G includes, as shown in FIG. 15, a first portion 21G, a second portion 22G, a third portion 23G, and a fourth portion 24G, each of which will be described hereunder.

The first portion 21G is bonded to the second portion 52G of the wiring 50G. The shape of the first portion 21G is not specifically limited, and a desired shape may be selected from a rectangular shape, a polygonal shape, a circular shape, an elliptical shape, and so forth. In the illustrated example, the first portion 21G has an elongate rectangular shape, having the long sides extending along the y-direction. In the illustrated example, the first portion 21G overlaps with the second portion 52G, as viewed in the z-direction. In addition, the first portion 21G includes a through hole 211G. The through hole 211G is formed so as to penetrate through the first portion 21G, in the z-direction. The inside of the through hole 211G is filled with the conductive bonding material 82, like the through hole 211F in the first portion 21F of the lead 2F shown in FIG. 5. The conductive bonding material 82 covers a part of the surface of the lead 2G. However, the conductive bonding material 82 may be provided only inside the through hole 211G, so as not to reach the surface of the lead 2G.

The third portion 23G and the fourth portion 24G are covered with the encapsulating resin 7. The third portion 23G is connected to the first portion 21G and the fourth portion 24G. The fourth portion 24G is shifted in the z-direction with respect to the first portion 21G, to the side to which the first face 31 is oriented, like the third portion 23F and the fourth portion 24F of the lead 2F shown in FIG. 5. The end portion of the fourth portion 24G is flush with the sixth face 75 of the resin 7. In the illustrated example, the first portion 21G, the third portion 23G, and the fourth portion 24G generally coincide with each other, as viewed in the y-direction. Here, the expression "generally coincide" as viewed in the y-direction refers to, for example, exactly coinciding with each other, or being deviated by within ±5% of the characteristic size (size of the first portion 21G, third portion 23G, or fourth portion 24G in the x-direction). The third portion 23G overlaps with the fifth face 35 of the substrate 3, as viewed in the z-direction.

The second portion 22G is connected to the end portion of the fourth portion 24G, and corresponds to a portion of the lead 2G sticking out from the encapsulating resin 7 to the opposite side of the plurality of leads 1, as viewed in the y-direction. The second portion 22G sticks out to the opposite side of the first portion 21G, in the y-direction. The second portion 22G is used, for example, to electrically connect the semiconductor device A1 to an external circuit. In the illustrated example, the second portion 22G is bent in the z-direction, to the side to which the first face 31 is oriented. The second portion 22G, the third portion 23G, and the fourth portion 24G each include, on the respective sides thereof in the x-direction, edges extending along the y-direction. The edges of the second portion 22G, the third portion 23G, and the fourth portion 24G, on the side of the third face 33 in the x-direction, are respectively opposed to the edges of the second portion 22F, the third portion 23F, and the fourth portion 24F, on the side of the fourth face 34 in the x-direction.

The lead 2H is spaced apart from the plurality of leads 1. The lead 2H is located on the conductive section 5. The lead 2H is electrically connected to the conductive section 5. The lead 2H exemplifies a second lead in the present disclosure. The lead 2H is bonded to the second portion 52H of the wiring 50H in the conductive section 5, via the conductive bonding material 82.

The configuration of the lead 2H is not specifically limited. In this embodiment the lead 2H includes, as shown in FIG. 15, a first portion 21H, a second portion 22H, a third portion 23H, and a fourth portion 24H, each of which will be described hereunder.

The first portion 21H is bonded to the second portion 52H of the wiring 50H. The shape of the first portion 21H is not specifically limited, and a desired shape may be selected from a rectangular shape, a polygonal shape, a circular shape, an elliptical shape, and so forth. In the illustrated example, the first portion 21H has an elongate rectangular shape, having the long sides extending along the y-direction. In the illustrated example, the first portion 21H overlaps with the second portion 52H, as viewed in the z-direction. In addition, the first portion 21H includes a through hole 211H. The through hole 211H is formed so as to penetrate through the first portion 21H, in the z-direction. The inside of the through hole 211H is filled with the conductive bonding material 82, like the through hole 211G in the first portion 21G of the lead 2G shown in FIG. 5. The conductive bonding material 82 covers a part of the surface of the lead 2H. However, the conductive bonding material 82 may be provided only inside the through hole 211H, so as not to reach the surface of the lead 2H.

The third portion 23H and the fourth portion 24H are covered with the encapsulating resin 7. The third portion 23H is connected to the first portion 21H and the fourth portion 24H. The fourth portion 24H is shifted in the z-direction with respect to the first portion 21H, to the side to which the first face 31 is oriented, like the third portion 23G and the fourth portion 24G of the lead 2G shown in FIG. 5. The end portion of the fourth portion 24H is flush with the sixth face 75 of the resin 7. In the illustrated example, the first portion 21H, the third portion 23H, and the fourth portion 24H generally coincide with each other, as viewed in the y-direction. Here, the expression "generally coincide" as viewed in the y-direction refers to, for example, exactly coinciding with each other, or being deviated by within ±5% of the characteristic size (size of the first portion 21H, third portion 23H, or fourth portion 24H in the x-direction). The third portion 23H overlaps with the fifth face 35 of the substrate 3, as viewed in the z-direction.

The second portion 22H is connected to the end portion of the fourth portion 24H, and corresponds to a portion of the lead 2H sticking out from the encapsulating resin 7 to the opposite side of the plurality of leads 1, as viewed in the y-direction. The second portion 22H sticks out to the opposite side of the first portion 21H, in the y-direction. The second portion 22H is used, for example, to electrically connect the semiconductor device A1 to an external circuit. In the illustrated example, the second portion 22H is bent in the z-direction, to the side to which the first face 31 is oriented. The second portion 22H, the third portion 23H, and the fourth portion 24H each include, on the respective sides thereof in the x-direction, edges extending along the y-direction. The edges of the second portion 22H, the third portion 23H, and the fourth portion 24H, on the side of the third face 33 in the x-direction, are respectively opposed to the edges of the second portion 22G, the third portion 23G, and the fourth portion 24G, on the side of the fourth face 34 in the x-direction.

The lead 2I is spaced apart from the plurality of leads 1. The lead 2I is located on the conductive section 5. The lead 2I is electrically connected to the conductive section 5. The lead 2I exemplifies a second lead in the present disclosure. The lead 2I is bonded to the second portion 52I of the wiring 50I in the conductive section 5, via the conductive bonding material 82.

The configuration of the lead 2I is not specifically limited. In this embodiment the lead 2I includes, as shown in FIG. 15, a first portion 21I, a second portion 22I, a third portion 23I, and a fourth portion 24I, each of which will be described hereunder.

The first portion 21I is bonded to the second portion 52I of the wiring 50I. The shape of the first portion 21I is not specifically limited, and a desired shape may be selected from a rectangular shape, a polygonal shape, a circular shape, an elliptical shape, and so forth. In the illustrated example, the first portion 21I has an elongate rectangular shape, having the long sides extending along the y-direction. In the illustrated example, the first portion 21I overlaps with the second portion 52I, as viewed in the z-direction. In addition, the first portion 21I includes a through hole 211I. The through hole 211I is formed so as to penetrate through the first portion 21I, in the z-direction. The inside of the through hole 211I is filled with the conductive bonding material 82, like the through hole 211H in the first portion 21H of the lead 2H shown in FIG. 5. The conductive bonding material 82 covers a part of the surface of the lead 2I. However, the conductive bonding material 82 may be provided only inside the through hole 211I, so as not to reach the surface of the lead 2I.

The third portion 23I and the fourth portion 24I are covered with the encapsulating resin 7. The third portion 23I is connected to the first portion 21I and the fourth portion 24I. The fourth portion 24I is shifted in the z-direction with respect to the first portion 21I, to the side to which the first face 31 is oriented, like the third portion 23H and the fourth portion 24H of the lead 2H shown in FIG. 5. The end portion of the fourth portion 24I is flush with the sixth face 75 of the resin 7. In the illustrated example, the first portion 21I, the third portion 23I, and the fourth portion 24I generally coincide with each other, as viewed in the y-direction. Here, the expression "generally coincide" as viewed in the y-direction refers to, for example, exactly coinciding with each other, or being deviated by within ±5% of the characteristic size (size of the first portion 21I, third portion 23I, or fourth portion 24I in the x-direction). The third portion 23I overlaps with the fifth face 35 of the substrate 3, as viewed in the z-direction.

The second portion 22I is connected to the end portion of the fourth portion 24I, and corresponds to a portion of the lead 2I sticking out from the encapsulating resin 7 to the opposite side of the plurality of leads 1, as viewed in the y-direction. The second portion 22I sticks out to the opposite side of the first portion 21I, in the y-direction. The second portion 22I is used, for example, to electrically connect the semiconductor device A1 to an external circuit. In the illustrated example, the second portion 22I is bent in the z-direction, to the side to which the first face 31 is oriented. The second portion 22I, the third portion 23I, and the fourth portion 24I each include, on the respective sides thereof in the x-direction, edges extending along the y-direction. The edges of the second portion 22I, the third portion 23I, and the fourth portion 24I, on the side of the third face 33 in the x-direction, are respectively opposed to the edges of the second portion 22H, the third portion 23H, and the fourth portion 24H, on the side of the fourth face 34 in the x-direction.

The lead 2J is spaced apart from the plurality of leads 1. The lead 2J is located on the conductive section 5. The lead 2J is electrically connected to the conductive section 5. The lead 2J exemplifies a second lead in the present disclosure. The lead 2J is bonded to the second portion 52J of the wiring 50J in the conductive section 5, via the conductive bonding material 82.

The configuration of the lead 2J is not specifically limited. In this embodiment the lead 2J includes, as shown in FIG. 15, a first portion 21J, a second portion 22J, a third portion 23J, and a fourth portion 24J, each of which will be described hereunder.

The first portion 21J is bonded to the second portion 52J of the wiring 50J. The shape of the first portion 21J is not specifically limited, and a desired shape may be selected from a rectangular shape, a polygonal shape, a circular shape, an elliptical shape, and so forth. In the illustrated example, the first portion 21J has an elongate rectangular shape, having the long sides extending along the y-direction. In the illustrated example, the first portion 21J overlaps with the second portion 52J, as viewed in the z-direction. In addition, the first portion 21J includes a through hole 211J. The through hole 211J is formed so as to penetrate through the first portion 21J, in the z-direction. The inside of the through hole 211J is filled with the conductive bonding material 82, like the through hole 211I in the first portion 21I of the lead 2I shown in FIG. 5. The conductive bonding material 82 covers a part of the surface of the lead 2J. However, the conductive bonding material 82 may be provided only inside the through hole 211J, so as not to reach the surface of the lead 2J.

The third portion 23J and the fourth portion 24J are covered with the encapsulating resin 7. The third portion 23J is connected to the first portion 21J and the fourth portion 24J. The fourth portion 24J is shifted in the z-direction with respect to the first portion 21J, to the side to which the first face 31 is oriented, like the third portion 23I and the fourth portion 24I of the lead 2I shown in FIG. 5. The end portion of the fourth portion 24J is flush with the sixth face 75 of the resin 7. In the illustrated example, the first portion 21J, the third portion 23J, and the fourth portion 24J generally coincide with each other, as viewed in the y-direction. Here, the expression "generally coincide" as viewed in the y-direction refers to, for example, exactly coinciding with each other, or being deviated by within ±5% of the characteristic size (size of the first portion 21J, third portion 23J, or fourth portion 24J in the x-direction). The third portion 23J overlaps with the fifth face 35 of the substrate 3, as viewed in the z-direction.

The second portion 22J is connected to the end portion of the fourth portion 24J, and corresponds to a portion of the lead 2J sticking out from the encapsulating resin 7 to the opposite side of the plurality of leads 1, as viewed in the y-direction. The second portion 22J sticks out to the opposite side of the first portion 21J, in the y-direction. The second portion 22J is used, for example, to electrically connect the semiconductor device A1 to an external circuit. In the illustrated example, the second portion 22J is bent in the z-direction, to the side to which the first face 31 is oriented. The second portion 22J, the third portion 23J, and the fourth portion 24J each include, on the respective sides thereof in the x-direction, edges extending along the y-direction. The edges of the second portion 22J, the third portion 23J, and the fourth portion 24J, on the side of the third face 33 in the x-direction, are respectively opposed to the edges of the second portion 22I, the third portion 23I, and the fourth portion 24I, on the side of the fourth face 34 in the x-direction.

The lead 2K is spaced apart from the plurality of leads 1. The lead 2K is located on the conductive section 5. The lead 2K is electrically connected to the conductive section 5. The lead 2K exemplifies a second lead in the present disclosure. The lead 2K is bonded to the second portion 52K of the wiring 50K in the conductive section 5, via the conductive bonding material 82.

The configuration of the lead 2K is not specifically limited. In this embodiment the lead 2K includes, as shown in FIG. 15, a first portion 21K, a second portion 22K, a third portion 23K, and a fourth portion 24K, each of which will be described hereunder.

The first portion 21K is bonded to the second portion 52K of the wiring 50K. The shape of the first portion 21K is not specifically limited, and a desired shape may be selected from a rectangular shape, a polygonal shape, a circular shape, an elliptical shape, and so forth. In the illustrated example, the first portion 21K has an elongate rectangular shape, having the long sides extending along the y-direction. In the illustrated example, the first portion 21K overlaps with the second portion 52K, as viewed in the z-direction. In addition, the first portion 21K includes a through hole 211K. The through hole 211K is formed so as to penetrate through the first portion 21K, in the z-direction. The inside of the through hole 211K is filled with the conductive bonding material 82, like the through hole 211J in the first portion 21J of the lead 2J shown in FIG. 5. The conductive bonding material 82 covers a part of the surface of the lead 2K. However, the conductive bonding material 82 may be provided only inside the through hole 211K, so as not to reach the surface of the lead 2K.

The third portion 23K and the fourth portion 24K are covered with the encapsulating resin 7. The third portion 23K is connected to the first portion 21K and the fourth portion 24K. The fourth portion 24K is shifted in the z-direction with respect to the first portion 21K, to the side to which the first face 31 is oriented, like the third portion 23J and the fourth portion 24J of the lead 2J shown in FIG. 5. The end portion of the fourth portion 24K is flush with the sixth face 75 of the resin 7. In the illustrated example, the first portion 21K, the third portion 23K, and the fourth portion 24K generally coincide with each other, as viewed in the y-direction. Here, the expression "generally coincide" as viewed in the y-direction refers to, for example, exactly coinciding with each other, or being deviated by within ±5% of the characteristic size (size of the first portion 21K, third portion 23K, or fourth portion 24K in the x-direction). The third portion 23K overlaps with the fifth face 35 of the substrate 3, as viewed in the z-direction.

The second portion 22K is connected to the end portion of the fourth portion 24K, and corresponds to a portion of the lead 2K sticking out from the encapsulating resin 7 to the opposite side of the plurality of leads 1, as viewed in the y-direction. The second portion 22K sticks out to the opposite side of the first portion 21K, in the y-direction. The second portion 22K is used, for example, to electrically connect the semiconductor device A1 to an external circuit. In the illustrated example, the second portion 22K is bent in the z-direction, to the side to which the first face 31 is oriented. The second portion 22K, the third portion 23K, and the fourth portion 24K each include, on the respective sides thereof in the x-direction, edges extending along the y-direction. The edges of the second portion 22K, the third portion 23K, and the fourth portion 24K, on the side of the third face 33 in the x-direction, are respectively opposed to the edges of the second portion 22J, the third portion 23J, and the fourth portion 24J, on the side of the fourth face 34 in the x-direction.

The lead 2L is spaced apart from the plurality of leads 1. The lead 2L is located on the conductive section 5. The lead 2L is electrically connected to the conductive section 5. The lead 2L exemplifies a second lead in the present disclosure. The lead 2L is bonded to the second portion 52L of the wiring 50L in the conductive section 5, via the conductive bonding material 82.

The configuration of the lead 2L is not specifically limited. In this embodiment the lead 2L includes, as shown in FIG. 15, a first portion 21L, a second portion 22L, a third portion 23L, and a fourth portion 24L, each of which will be described hereunder.

The first portion 21L is bonded to the second portion 52L of the wiring 50L. The shape of the first portion 21L is not specifically limited, and a desired shape may be selected from a rectangular shape, a polygonal shape, a circular shape, an elliptical shape, and so forth. In the illustrated example, the first portion 21L has an elongate rectangular shape, having the long sides extending along the y-direction. In the illustrated example, the first portion 21L overlaps with the second portion 52L, as viewed in the z-direction. In addition, the first portion 21L includes a through hole 211L. The through hole 211L is formed so as to penetrate through the first portion 21L, in the z-direction. The inside of the through hole 211L is filled with the conductive bonding material 82, like the through hole 211K in the first portion 21K of the lead 2K shown in FIG. 5. The conductive bonding material 82 covers a part of the surface of the lead 2L. However, the conductive bonding material 82 may be provided only inside the through hole 211L, so as not to reach the surface of the lead 2L.

The third portion 23L and the fourth portion 24L are covered with the encapsulating resin 7. The third portion 23L is connected to the first portion 21L and the fourth portion 24L. The fourth portion 24L is shifted in the z-direction with respect to the first portion 21L, to the side to which the first face 31 is oriented, like the third portion 23K and the fourth portion 24K of the lead 2K shown in FIG. 5. The end portion of the fourth portion 24L is flush with the sixth face 75 of the resin 7. In the illustrated example, the first portion 21L, the third portion 23L, and the fourth portion 24L generally coincide with each other, as viewed in the y-direction. Here, the expression "generally coincide" as viewed in the y-direction refers to, for example, exactly coinciding with each other, or being deviated by within ±5% of the characteristic size (size of the first portion 21L, third portion 23L, or fourth portion 24L in the x-direction). The third portion 23L overlaps with the fifth face 35 of the substrate 3, as viewed in the z-direction.

The second portion 22L is connected to the end portion of the fourth portion 24L, and corresponds to a portion of the lead 2L sticking out from the encapsulating resin 7 to the opposite side of the plurality of leads 1, as viewed in the y-direction. The second portion 22L sticks out to the opposite side of the first portion 21L, in the y-direction. The second portion 22L is used, for example, to electrically connect the semiconductor device A1 to an external circuit. In the illustrated example, the second portion 22L is bent in the z-direction, to the side to which the first face 31 is oriented. The second portion 22L, the third portion 23L, and the fourth portion 24L each include, on the respective sides thereof in the x-direction, edges extending along the y-direction. The edges of the second portion 22L, the third portion 23L, and the fourth portion 24L, on the side of the third face 33 in the x-direction, are respectively opposed to the edges of the second portion 22K, the third portion 23K, and the fourth portion 24K, on the side of the fourth face 34 in the x-direction.

The lead 2M is spaced apart from the plurality of leads 1. The lead 2M is located on the conductive section 5. The lead 2M is electrically connected to the conductive section 5. The lead 2M exemplifies a second lead in the present disclosure. The lead 2M is bonded to the second portion 52M of the wiring 50M in the conductive section 5, via the conductive bonding material 82.

The configuration of the lead 2M is not specifically limited. In this embodiment the lead 2M includes, as shown in FIG. 15, a first portion 21M, a second portion 22M, a third portion 23M, and a fourth portion 24M, each of which will be described hereunder.

The first portion 21M is bonded to the second portion 52M of the wiring 50M. The shape of the first portion 21M is not specifically limited, and a desired shape may be selected from a rectangular shape, a polygonal shape, a circular shape, an elliptical shape, and so forth. In the illustrated example, the first portion 21M has an elongate rectangular shape, having the long sides extending along the y-direction. In the illustrated example, the first portion 21M overlaps with the second portion 52M, as viewed in the z-direction. In addition, the first portion 21M includes a through hole 211M. The through hole 211M is formed so as to penetrate through the first portion 21M, in the z-direction. The inside of the through hole 211M is filled with the conductive bonding material 82, like the through hole 211L in the first portion 21L of the lead 2L shown in FIG. 5. The conductive bonding material 82 covers a part of the surface of the lead 2M. However, the conductive bonding material 82 may be provided only inside the through hole 211M, so as not to reach the surface of the lead 2M.

The third portion 23M and the fourth portion 24M are covered with the encapsulating resin 7. The third portion 23M is connected to the first portion 21M and the fourth portion 24M. The fourth portion 24M is shifted in the z-direction with respect to the first portion 21M, to the side to which the first face 31 is oriented, like the third portion 23L and the fourth portion 24L of the lead 2L shown in FIG. 5. The end portion of the fourth portion 24M is flush with the sixth face 75 of the resin 7. In the illustrated example, the first portion 21M, the third portion 23M, and the fourth portion 24M generally coincide with each other, as viewed in the y-direction. Here, the expression "generally coincide" as viewed in the y-direction refers to, for example, exactly coinciding with each other, or being deviated by within ±5% of the characteristic size (size of the first portion 21M, third portion 23M, or fourth portion 24M in the x-direction). The third portion 23M overlaps with the fifth face 35 of the substrate 3, as viewed in the z-direction.

The second portion 22M is connected to the end portion of the fourth portion 24M, and corresponds to a portion of the lead 2M sticking out from the encapsulating resin 7 to the opposite side of the plurality of leads 1, as viewed in the y-direction. The second portion 22M sticks out to the opposite side of the first portion 21M, in the y-direction. The second portion 22M is used, for example, to electrically connect the semiconductor device A1 to an external circuit. In the illustrated example, the second portion 22M is bent in the z-direction, to the side to which the first face 31 is oriented. The second portion 22M, the third portion 23M, and the fourth portion 24M each include, on the respective sides thereof in the x-direction, edges extending along the y-direction. The edges of the second portion 22M, the third portion 23M, and the fourth portion 24M, on the side of the third face 33 in the x-direction, are respectively opposed to the edges of the second portion 22L, the third portion 23L, and the fourth portion 24L, on the side of the fourth face 34 in the x-direction.

The lead 2N is spaced apart from the plurality of leads 1. The lead 2N is located on the conductive section 5. The lead 2N is electrically connected to the conductive section 5. The lead 2N exemplifies a second lead in the present disclosure. The lead 2N is bonded to the second portion 52N of the wiring 50N in the conductive section 5, via the conductive bonding material 82.

The configuration of the lead 2N is not specifically limited. In this embodiment the lead 2N includes, as shown in FIG. 15, a first portion 21N, a second portion 22N, a third portion 23N, and a fourth portion 24N, each of which will be described hereunder.

The first portion 21N is bonded to the second portion 52N of the wiring 50N. The shape of the first portion 21N is not specifically limited, and a desired shape may be selected from a rectangular shape, a polygonal shape, a circular shape, an elliptical shape, and so forth. In the illustrated example, the first portion 21N has an elongate rectangular shape, having the long sides extending along the y-direction. In the illustrated example, the first portion 21N overlaps with the second portion 52N, as viewed in the z-direction. In addition, the first portion 21N includes a through hole 211N. The through hole 211N is formed so as to penetrate through the first portion 21N, in the z-direction. The inside of the through hole 211N is filled with the conductive bonding material 82, like the through hole 211M in the first portion 21M of the lead 2M shown in FIG. 5. The conductive bonding material 82 covers a part of the surface of the lead 2N. However, the conductive bonding material 82 may be provided only inside the through hole 211N, so as not to reach the surface of the lead 2N.

The third portion 23N and the fourth portion 24N are covered with the encapsulating resin 7. The third portion 23N is connected to the first portion 21N and the fourth portion 24N. The fourth portion 24N is shifted in the z-direction with respect to the first portion 21N, to the side to which the first face 31 is oriented, like the third portion 23M and the fourth portion 24M of the lead 2M shown in FIG. 5. The end portion of the fourth portion 24N is flush with the sixth face 75 of the resin 7. In the illustrated example, the first portion 21N, the third portion 23N, and the fourth portion 24N generally coincide with each other, as viewed in the y-direction. Here, the expression "generally coincide" as viewed in the y-direction refers to, for example, exactly coinciding with each other, or being deviated by within ±5% of the characteristic size (size of the first portion 21N, third portion 23N, or fourth portion 24N in the x-direction). The third portion 23N overlaps with the fifth face 35 of the substrate 3, as viewed in the z-direction.

The second portion 22N is connected to the end portion of the fourth portion 24N, and corresponds to a portion of the lead 2N sticking out from the encapsulating resin 7 to the opposite side of the plurality of leads 1, as viewed in the y-direction. The second portion 22N sticks out to the opposite side of the first portion 21N, in the y-direction. The second portion 22N is used, for example, to electrically connect the semiconductor device A1 to an external circuit. In the illustrated example, the second portion 22N is bent in the z-direction, to the side to which the first face 31 is oriented. The second portion 22N, the third portion 23N, and the fourth portion 24N each include, on the respective sides thereof in the x-direction, edges extending along the y-direction. The edges of the second portion 22N, the third portion 23N, and the fourth portion 24N, on the side of the third face 33 in the x-direction, are respectively opposed to the edges of the second portion 22M, the third portion 23M, and the fourth portion 24M, on the side of the fourth face 34 in the x-direction.

The lead 2O is spaced apart from the plurality of leads 1. The lead 2O is located on the conductive section 5, as shown in FIG. 4 and FIG. 15. The lead 2O is electrically connected to the conductive section 5. The lead 2O is bonded to the second portion 52O of the wiring 50O in the conductive section 5, via the conductive bonding material 82.

The configuration of the lead 2O is not specifically limited. In this embodiment the lead 2O includes, as shown in FIG. 4 and FIG. 15, a first portion 21O, a second portion 22O, a third portion 23O, a fourth portion 24O, and a fifth portion 25O, each of which will be described hereunder.

The first portion 21O is bonded to the second portion 52O of the wiring 50O. The shape of the first portion 21O is not specifically limited, and a desired shape may be selected from a rectangular shape, a polygonal shape, a circular shape, an elliptical shape, and so forth. In the illustrated example, the first portion 21O has an elongate rectangular shape, having the long sides extending along the y-direction. In the illustrated example, the first portion 21O overlaps with the second portion 52O, as viewed in the z-direction. In addition, the first portion 21O includes a through hole 211O. The through hole 211O is formed so as to penetrate through the first portion 21O, in the z-direction. The inside of the through hole 211O is filled with the conductive bonding material 82, like the through hole 211C in the first portion 21C of the lead 2C shown in FIG. 5. The conductive bonding material 82 covers a part of the surface of the lead 2O. However, the conductive bonding material 82 may be provided only inside the through hole 211O, so as not to reach the surface of the lead 2O.

The third portion 23O, the fourth portion 24O, and the fifth portion 25O are covered with the encapsulating resin 7. The fifth portion 25O is connected to the first portion 21O and the third portion 23O. In the illustrated example, the fifth portion 25O includes a portion extending along the y-direction and a portion inclined with respect to the y-direction. The third portion 23O is connected to the fourth portion 24O and the fifth portion 25O. The fifth portion 25O overlaps with the fourth face 34 of the substrate 3, as viewed in the z-direction. The fourth portion 24O is shifted in the z-direction with respect to the first portion 21O, to the side to which the first face 31 is oriented, like the third portion 23C and the fourth portion 24C of the lead 2C shown in FIG. 5. The end portion of the fourth portion 24O is flush with the sixth face 75 of the resin 7.

The second portion 22O is connected to the end portion of the fourth portion 24O, and corresponds to a portion of the lead 2O sticking out from the encapsulating resin 7 to the opposite side of the plurality of leads 1, as viewed in the y-direction. The second portion 22O sticks out to the opposite side of the first portion 21O, in the y-direction. The second portion 22O is used, for example, to electrically connect the semiconductor device A1 to an external circuit. In the illustrated example, the second portion 22O is bent in the z-direction, to the side to which the first face 31 is oriented. The second portion 22O, the third portion 23O, and the fourth portion 24O each include, on the respective sides thereof in the x-direction, edges extending along the y-direction. The edges of the second portion 22O, the third portion 23O, and the fourth portion 24O, on the side of the third face 33 in the x-direction, are respectively opposed to the edges of the second portion 22N, the third portion 23N, and the fourth portion 24N, on the side of the fourth face 34 in the x-direction.

The lead 2P is spaced apart from the plurality of leads 1. The lead 2P is located on the conductive section 5, as shown in FIG. 4 and FIG. 15. The lead 2P is electrically connected to the conductive section 5. The lead 2P is bonded to the second portion 52P of the wiring 50P in the conductive section 5, via the conductive bonding material 82.

The configuration of the lead 2P is not specifically limited. In this embodiment the lead 2P includes, as shown in FIG. 4 and FIG. 15, a first portion 21P, a second portion 22P, a third portion 23P, a fourth portion 24P, and a fifth portion 25P, each of which will be described hereunder.

The first portion 21P is bonded to the second portion 52P of the wiring 50P. The shape of the first portion 21P is not specifically limited, and a desired shape may be selected from a rectangular shape, a polygonal shape, a circular shape, an elliptical shape, and so forth. In the illustrated example, the first portion 21P has an elongate rectangular shape, having the long sides extending along the y-direction. In the illustrated example, the first portion 21P overlaps with the second portion 52P, as viewed in the z-direction. In addition, the first portion 21P includes a through hole 211P. The through hole 211P is formed so as to penetrate through the first portion 21P, in the z-direction. The inside of the through hole 211P is filled with the conductive bonding material 82, like the through hole 211C in the first portion 21C of the lead 2C shown in FIG. 5. The conductive bonding material 82 covers a part of the surface of the lead 2P. However, the conductive bonding material 82 may be provided only inside the through hole 211P, so as not to reach the surface of the lead 2P.

The third portion 23P, the fourth portion 24P, and the fifth portion 25P are covered with the encapsulating resin 7. The fifth portion 25P is connected to the first portion 21P and the third portion 23P. In the illustrated example, the fifth portion 25P includes a portion extending along the y-direction and a portion inclined with respect to the y-direction. The fifth portion 25P overlaps with the fourth face 34 of the substrate 3, as viewed in the z-direction. The third portion 23P is connected to the fourth portion 24P and the fifth portion 25P. The fourth portion 24P is shifted in the z-direction with respect to the first portion 21P, to the side to which the first face 31 is oriented, like the third portion 23C and the fourth portion 24C of the lead 2C shown in FIG. 5. The end portion of the fourth portion 24P is flush with the sixth face 75 of the resin 7.

The second portion 22P is connected to the end portion of the fourth portion 24P, and corresponds to a portion of the lead 2P sticking out from the encapsulating resin 7 to the opposite side of the plurality of leads 1, as viewed in the y-direction. The second portion 22P sticks out to the opposite side of the first portion 21P, in the y-direction. The second portion 22P is used, for example, to electrically connect the semiconductor device A1 to an external circuit. In the illustrated example, the second portion 22P is bent in the z-direction, to the side to which the first face 31 is oriented. The second portion 22P, the third portion 23P, and the fourth portion 24P each include, on the respective sides thereof in the x-direction, edges extending along the y-direction. The edges of the second portion 22P, the third portion 23P, and the fourth portion 24P, on the side of the third face 33 in the x-direction, are respectively opposed to the edges of the second portion 22O, the third portion 23O, and the fourth portion 24O, on the side of the fourth face 34 in the x-direction.

The lead 2Z is spaced apart from the substrate 3, as viewed in the z-direction. In this embodiment, the lead 2Z is located on the side to which the third face 33 is oriented, with respect to the substrate 3 in the x-direction. In addition, the lead 2Z is located on the opposite side of the lead 2B, with respect to the lead 2A in the x-direction.

The configuration of the lead 2Z is not specifically limited. In this embodiment the lead 2Z includes, as shown in FIG. 4, a second portion 22Z and a fourth portion 24Z, each of which will be described hereunder. In this embodiment, the lead 2Z is insulated from the circuit of the semiconductor device A1.

The fourth portion 24Z is connected to the second portion 22Z, and covered with the encapsulating resin 7. The fourth portion 24Z is, like the fourth portion 24C of the lead 2C, shifted from the first portion 21A in the z-direction, to the side to which the first face 31 is oriented. The shape of the fourth portion 24Z is not specifically limited and, in the illustrated example, the fourth portion 24Z has a strip shape extending along the y-direction. The end portion of the fourth portion 24Z is flush with the sixth face 75 of the resin 7.

The second portion 22Z is connected to the end portion of the fourth portion 24Z, and corresponds to a portion of the lead 2Z sticking out from the encapsulating resin 7. The second portion 22Z sticks out to the opposite side of the fourth portion 24Z, in the y-direction. The second portion 22Z is used, for example, when the semiconductor device A1 is mounted on an external circuit board. In the illustrated example, the second portion 22Z is bent in the z-direction, to the side to which the first face 31 is oriented.

As shown in FIG. 4 and FIG. 15, the second portions 22A, 22B, and 22C are aligned in the x-direction, with clearances G21. The clearances G21 have generally the same width, with a difference within ±5% from each other. The second portion 22C and the second portion 22D are aligned in the x-direction, with a clearance G22 therebetween. The clearance G22 has generally the same width as the clearance G21, with a difference within ±5% from each other. The second portions 22D to 22N are aligned in the x-direction, with clearances G23 between each other. The clearances G23 are narrower than the clearances G21, and the difference in length among the plurality of clearances G23 is within ±5%. The second portion 22A and the second portion 22Z are aligned in the x-direction, with a clearance G24 therebetween. The clearance G24 is different from the clearance G21, by within ±5%. In addition, the clearance G23 is narrower than the clearance G54 shown in FIG. 16.

<Semiconductor Chips 4A to 4F>

The semiconductor chips 4A to 4F, located on the plurality of leads 1, each exemplify a semiconductor chip in the present disclosure. The type and the function of the semiconductor chips 4A to 4F are not specifically limited. In this embodiment, the semiconductor chips 4A to 4F are a transistor. Although six semiconductor chips 4A to 4F are provided in the illustrated example, the number of semiconductor chips is by no means limited.

The semiconductor chips 4A to 4F in the illustrated example are, for example, a metal-oxide-semiconductor field-effect transistor (MOSFET) formed on a silicon carbide (SiC) substrate, in other words SiC MOSFET. Here, the semiconductor chips 4A to 4F may be a MOSFET formed on a silicon (Si) substrate instead of the SiC substrate, and may be configured as, for example, an IGBT element. Alternatively, the semiconductor chips 4A to 4F may be a MOSFET containing GaN. In this embodiment, each of the semiconductor chips 4A to 4F is an N-type MOSFET. The semiconductor chips 4A to 4F according to this embodiment are the same MOSFET as each other. Hereunder, the semiconductor chip 4A will be described as an example, and the description of the remaining semiconductor chips 4B to 4F will be omitted.

As shown in FIG. 4, FIG. 5, and FIG. 9, the semiconductor chip 4A is located on the first portion 11A of the lead 1A. The semiconductor chip 4A includes a gate electrode GP, a source electrode SP, and a drain electrode DP. In the illustrated example, the source electrode SP and the gate electrode GP are located on the face of the semiconductor chip 4A oriented in the same direction as the main surface 111A. The drain electrode DP is formed on the face of the semiconductor chip 4A opposed to the main surface 111A. The gate electrode GP and the source electrode SP are formed of, for example, Al or an Al alloy (e.g., Al—Si, Al—Cu, and Al—Si—Cu). The drain electrode DP is formed of, for example, Al or an Al alloy (e.g., Al—Si, Al—Cu, and Al—Si—Cu). The shape and size of the gate electrode GP, the source electrode SP, and the drain electrode DP are not specifically limited. In the illustrated example, the source electrode SP is larger than the gate electrode GP, as viewed in the z-direction. The gate electrode GP is located on the side of the fifth face of the substrate 3, with respect to the center of the semiconductor chip 4A in the y-direction, as viewed in the z-direction. The source electrode SP includes a portion located on one side of the gate electrode GP in the y-direction, and on both sides thereof in the x-direction. Here, the position of the gate electrode GP with respect to the source electrode SP is not specifically limited. The gate electrode GP may be formed in a square shape. The source electrode SP includes a recess formed on the side opposed to the fifth face 35, and the gate electrode GP is located inside the recess.

FIG. 17 is an enlarged partial cross-sectional view schematically showing the semiconductor chip 4A. The semiconductor chip 4A according to this embodiment includes a substrate 400, an epitaxial layer 401, a source interconnect 411, a drain interconnect 415, and a gate interconnect 419.

The substrate 400 is formed of silicon carbide (SiC), and doped with an n-type impurity in high concentration (e.g., 1e18 to 1e21 $cm^{-3}$). The substrate 400 includes a front surface 400A and a back surface 400B. The front surface 400A is a Si surface, and the back surface 400B is a C surface.

The epitaxial layer 401 is stacked on the front surface 400A of the substrate 400. The epitaxial layer 401 is an $n^-$-type layer formed of SiC doped with the n-type impurity in low concentration than the substrate 400. The epitaxial layer 401 is formed through what is known as epitaxial growth, on the substrate 400. The epitaxial layer 401 formed on the front surface 400A, which is a Si surface, grows utilizing the Si surface as the main growth surface. Accordingly, a surface 401A of the epitaxial layer 401 formed through the growth is also a Si surface, like the front surface 400A of the substrate 400.

The epitaxial layer 401 includes a drain region 402, a body region 403, a source region 407, and a body contact region 408.

The drain region 402 corresponds to the portion on the side of the C surface (base portion), opposite to the surface 401A. The drain region 402 is an $n^-$-type region, the entirety of which is maintained in the state after the epitaxial growth as it is. The n-type impurity concentration of the drain region 402 is, for example, 1e15 to 1e17 $cm^{-3}$.

The body region 403 is formed on the side of the surface 401A of the epitaxial layer 401. The body region 403 is in contact with the drain region 402, from the side of the surface 401A (Si surface) of the epitaxial layer 401. The p-type impurity concentration of the body region 403 is, for example, 1e16 to 1e19 $cm^{-3}$.

The epitaxial layer 401 includes a gate trench 404. The gate trench 404 is formed so as to recede from the surface 401A. Though not shown in FIG. 17, a plurality of gate trenches 404 are formed at certain intervals between each other, so as to extend in the same direction parallel to each other (direction perpendicular to the sheet face of FIG. 17, which may hereinafter be referred to as "direction along the gate width"), for example in a stripe pattern.

The gate trenches 404 each include two side faces 404*a* and a bottom face 404*b*. The two side faces 404*a* are opposed to each other with a clearance therebetween, and both are orthogonal to the surface 401A. The bottom face 404*b* is connected to the two side faces 404*a*, and includes a section parallel to the surface 401A. The gate trench 404 is formed so as to penetrate through the body region 403 in the layer thickness direction, such that a deepest portion (bottom face 404*b*) reaches the drain region 402.

A gate insulation film 405 is formed on the inner surface of the gate trench 404 and the surface 401A of the epitaxial layer 401, so as to cover the entirety of the inner surface of the gate trench 404 (side face 404*a* and bottom face 404*b*). The gate insulation film 405 is formed of an oxide film containing nitrogen (N), such as a silicon oxynitride film formed by thermal oxidation using a nitride-containing gas. The nitrogen content (nitrogen concentration) in the gate insulation film 405 is, for example, 0.1 to 10%.

The gate insulation film 405 includes an insulation film side portion 405*a* and an insulation film bottom portion 405*b*. The insulation film side portion 405*a* is provided over the side face 404*a* of the gate trench 404. The insulation film bottom portion 405*b* is provided over the bottom face 404*b* of the gate trench 404. In the illustrated example, the thickness T2 of the insulation film bottom portion 405*b* is equal to or thinner than the thickness T1 of the insulation film side portion 405*a*. More specifically, the ratio of the thickness T2 of the insulation film bottom portion 405*b* to the thickness T1 of the insulation film side portion 405*a* (thickness T2 of insulation film bottom portion 405*b*/thickness T1 of insulation film side portion 405*a*) is 0.3 to 1.0, and more preferably 0.5 to 1.0. The thickness T1 of the insulation film side portion 405*a* is, for example, 300 to 1000 Å, and the thickness T2 of insulation film bottom portion 405*b* is, for example, 150 to 500 Å.

A gate electrode 405 is buried inside the gate insulation film 405, The gate electrode 405 is formed by entirely filling the inside of the gate insulation film 405 with a polysilicon material doped with an N-type impurity in high concentration.

The source region 407 is located in an upper portion of the body region 403, and on both sides of the gate trench 404 in the direction orthogonal to the gate width (left-right direction in FIG. 17), and is an $n^+$-type region. The source region 407 is doped with the n-type impurity in higher concentration than the n-type impurity concentration of the drain region 402. The n-type impurity concentration of the source region 407 is, for example, 1e18 to 1e21 $cm^{-3}$. The source region 407 extends along the gate width direction, at the position adjacent to the gate trench 404.

The body contact region 408 penetrates through the central portion of the source region 407 in the direction orthogonal to the gate width, from the surface 401A, and is a $p^+$-type region connected to the body region 403. The body contact region 408 is doped with the p-type impurity in higher concentration than the p-type impurity concentration of the body region 403. The p-type impurity concentration of the body contact region 408 is, for example, 1e18 to 1e21 $cm^{-3}$.

The gate trench 404 and the source region 407 are alternately provided in the direction orthogonal to the gate width, and each extend along the gate width direction. Boundaries between unit cells, located adjacent to each other in the direction orthogonal to the gate width along the source region 407, are provided on the source region 407. At least one body contact region 408 is provided so as to span over the two unit cells located adjacent to each other in the direction orthogonal to the gate width. In addition, the boundary between the unit cells adjacent to each other along the direction of the gate width is provided such that a certain gate width is secured for the gate electrodes 405 of the respective unit cells.

An interlayer dielectric film 409 formed of silicon oxide ($SiO_2$) is stacked on the epitaxial layer 401. The interlayer dielectric film 409 and the gate insulation film 405 each include a contact hole 410, in which the surfaces of the source region 407 and the body contact region 408 are exposed.

The source interconnect 411 is formed on the interlayer dielectric film 409. The source interconnect 411 is brought into contact with (electrically connected to) the source region 407 and the body contact region 408, via the contact hole 410. The source interconnect 411 includes a polysilicon layer 412, a metal layer 413, and an intermediate layer 414.

The polysilicon layer 412 is in contact with the source region 407 and the body contact region 408. The polysilicon layer 412 is a doped layer formed of polysilicon doped with an impurity, and preferably a high-concentration doped layer, doped with an impurity in concentration as high as, for example, 1e19 to 1e21 $cm^{-3}$. Examples of the impurity that may be employed to form the polysilicon layer 412 as a doped layer (high-concentration doped layer inclusive) include an N-type impurity such as phosphor (P) or arsenic (As), and a p-type impurity such as boron (B). In addition, the polysilicon layer 412 covers the entirety of the contact hole 410. The thickness of the polysilicon layer 412 formed as above is, for example, 500 to 1000 Å, depending on the depth of the contact hole 410.

The metal layer 413 is formed over the polysilicon layer 412. The metal layer 413 is, for example, formed of aluminum (Al), gold (Au), silver (Ag), copper (Cu), an alloy thereof, or a metal material containing the cited metals. The metal layer 413 constitutes the outermost layer of the source interconnect 411 and, for example, the first wire 91A is connected (bonded) to the metal layer 413. The thickness of the metal layer 413 is, for example, 1 to 5 μm.

The intermediate layer 414 is interleaved between the polysilicon layer 412 and the metal layer 413, and contains titanium (Ti). The intermediate layer 414 is formed of a layer containing titanium, or a plurality of layers including the mentioned layer. The layer containing titanium can be formed from titanium or titanium nitride (TiN). The thickness of the intermediate layer 414 is, for example, 200 to 500 nm.

Preferably, the source interconnect 411 including the polysilicon layer 412, the intermediate layer 414, and the metal layer 413 formed as above, may have a layered structure in which polysilicon (polysilicon layer 412), titanium (intermediate layer 414), titanium nitride (intermediate layer 414), and aluminum (metal layer 413) are sequentially stacked (Po—Si/Ti/TiN/Al).

The drain interconnect 415 is formed on the back surface 4003 of the substrate 400. The drain interconnect 415 is in contact with (electrically connected to) the substrate 400. The drain interconnect 415 includes a polysilicon layer 416, a metal layer 417, and an intermediate layer 418.

The polysilicon layer 416 is in contact with the substrate 400. The polysilicon layer 416 may be formed of the material similar to that of the polysilicon layer 412. The thickness of the polysilicon layer 416 is, for example, 1000 to 2000 Å.

The metal layer 417 is formed over the polysilicon layer 416. The metal layer 417 may be formed of the material similar to that of the metal layer 413. The metal layer 417 constitutes the outermost layer of the drain interconnect 415, and is bonded to the first portion 11A, for example when the substrate 400 is mounted on the first portion 11A of the lead 1A. The thickness of the metal layer 417 is, for example, 0.5 to 1 μm.

The intermediate layer 418 is interleaved between the polysilicon layer 416 and the metal layer 417, and contains titanium (Ti). The intermediate layer 418 may be formed of the material similar to that of the intermediate layer 414.

The gate interconnect 419 is in contact with (electrically connected to) the gate electrode 406, via a contact hole (not shown) formed in the interlayer dielectric film 409. When a predetermined voltage (equal to or higher than a gate threshold voltage) is applied to the gate interconnect 419, with a predetermined potential difference generated between the source interconnect 411 and the drain interconnect 415 (between source-drain), a channel is formed in the vicinity of the interface between the body region 403 and the gate insulation film 405, by the electric field from the gate electrode 406. Accordingly, a current flows between the source interconnect 411 and the drain interconnect 415, so that the semiconductor chip 4A is turned on.

In this embodiment, as shown in FIG. 4, FIG. 5, FIG. 9, and FIG. 10, three semiconductor chips 4A, 4B, and 4C are provided on the main surface 111A of the first portion 11A of the lead 1A. The three semiconductor chips 4A, 4B, and 4C are spaced apart from each other in the x-direction, and overlap with each other as viewed in the x-direction. Here, the number of semiconductor chips to be mounted on the lead 1A is by no means limited. In a plan view, the three semiconductor chips 4A, 4B, and 4C are each located in a region of the main surface 111A surrounded by the groove 1112A. In the illustrated example, the semiconductor chips 4A, 4B, and 4C are arranged such that, as viewed in the z-direction, the respective gate electrodes GP are located on the side of the plurality of leads 2, with respect to the center of the semiconductor chips 4A, 4B, and 4C in the y-direction. In the illustrated example, in addition, the respective drain electrodes DP of the semiconductor chips 4A, 4B, and 4C are bonded to the main surface 111A, via the conductive bonding material 83.

The conductive bonding material 83 may be any material that is capable of bonding, and electrically connecting, the drain electrode DP of the semiconductor chips 4A, 4B, and 4C, to the main surface 111A. For example, silver paste, copper paste, or solder may be employed as the conductive bonding material 83. The conductive bonding material 83 corresponds to the second conductive bonding material in the present disclosure. In this embodiment, the conductive bonding material 83 extends outwardly from the outer periphery of the semiconductor chips 4A, 4B, and 4C, in a plan view. A reason of such a configuration is that, for example, when the conductive bonding material 83 performs the bonding function by curing after the fused state, the conductive bonding material 83 is apt to be formed in contact with the edge of the groove 1112A, as shown in FIG. 6. This is because the surface tension of the fused conductive bonding material 83, generated at the edge of the groove 1112A when the conductive bonding material 83 is about to spread around, prevents the conductive bonding material 83 from spreading further.

In this embodiment, as shown in FIG. 4, FIG. 5, FIG. 9, and FIG. 14, the semiconductor chip 4D is provided on the main surface 111B of the first portion 11B of the lead 1B. Here, the number of semiconductor chips to be mounted on the lead 1B is by no means limited. The semiconductor chip 4D is located in a region of the main surface 111B surrounded by the groove 1112B, in a plan view. In the illustrated example, the semiconductor chip 4D is arranged such that, as viewed in the z-direction, the gate electrode GP is located on the side of the plurality of leads 2, with respect to the center of the semiconductor chip 4D in the y-direction. In the illustrated example, in addition, the drain electrode DP of the semiconductor chip 4D is bonded to the main surface 111B, via the conductive bonding material 83.

In this embodiment, as shown in FIG. 4, FIG. 5, FIG. 9, and FIG. 14, the semiconductor chip 4E is provided on the main surface 111C of the first portion 11C of the lead 1C. Here, the number of semiconductor chips to be mounted on the lead 1C is by no means limited. The semiconductor chip 4E is located in a region of the main surface 111C surrounded by the groove 1112C, in a plan view. In the illustrated example, the semiconductor chip 4E is arranged such that, as viewed in the z-direction, the gate electrode GP is located on the side of the plurality of leads 2, with respect to the center of the semiconductor chip 4E in the y-direction. In the illustrated example, in addition, the drain electrode DP of the semiconductor chip 4E is bonded to the main surface 111C, via the conductive bonding material 83.

In this embodiment, as shown in FIG. 4, FIG. 5, FIG. 9, and FIG. 14, the semiconductor chip 4F is provided on the main surface 111D of the first portion 11D of the lead 1D. Here, the number of semiconductor chips to be mounted on the lead 1D is by no means limited. The semiconductor chip 4F is located in a region of the main surface 111D surrounded by the groove 1112D, in a plan view. In the illustrated example, the semiconductor chip 4F is arranged such that, as viewed in the z-direction, the gate electrode GP is located on the side of the plurality of leads 2, with respect to the center of the semiconductor chip 4F in the y-direction. In the illustrated example, in addition, the drain electrode DP of the semiconductor chip 4F is bonded to the main surface 111D, via the conductive bonding material 83. In the illustrated example, as shown in FIG. 4, the semiconductor chip 4C and the semiconductor chip 4D overlap with the connecting portion 57 of the conductive section 5, as viewed in the y-direction. As shown in FIG. 5, the semiconductor chip 43 is located on the side of the substrate 3 with respect to the upper face of the fourth portion 14A, in the z-direction.

<Control Chips 4G, 4H>

The control chips 4G and 4H serve to control the operation of at least one of the semiconductor chips 4A to 4F. As shown in FIG. 4 and FIG. 15, the control chips 4G and 4H are electrically connected to the conductive section 5 and at least one of the semiconductor chips 4A to 4F, and provided on the substrate 3. In this embodiment, the control chip 4G controls the operation of three semiconductor chips 4A, 4B, and 4C. The control chip 4H controls the operation of three semiconductor chips 4D, 4E, and 4F. The shape and size of the control chips 4G and 4H are not specifically limited. In the illustrated example, the control chips 4G and 4H have an elongate rectangular shape, having the long sides extending along the x-direction, as viewed in the z-direction.

In this embodiment, the control chip 4G is mounted on the first base portion 55 of the conductive section 5. The control chip 4H is mounted on the second base portion 55 of the conductive section 5. In this embodiment, the control chip 4G is bonded to the first base portion 55, via a conductive bonding material 84. The control chip 4H is bonded to the second base portion 55, via the conductive bonding material 84.

The conductive bonding material 84 may be any material that is capable of bonding, and electrically connecting, the control chip 4G to the first base portion 55, and the control chip 4H to the second base portion 55. For example, silver paste, copper paste, or solder may be employed as the conductive bonding material 84. The conductive bonding material 84 corresponds to the third conductive material in the present disclosure. In this embodiment, the conductive bonding material 84 extends outwardly from the outer periphery of the control chips 4G and 4H, in a plan view. A reason of such a configuration is that, for example, when the conductive bonding material 84 performs the bonding function by curing after the fused state, the conductive bonding material 84 in the fused state spreads around the control chip 4G (control chip 4H) as viewed in the z-direction, as shown in FIG. 7. Therefore, in the illustrated example, the conductive bonding material 84 protrudes from the respective outer edges of the control chips 4G and 4H, as viewed in the z-direction. However, the specific shape of the conductive bonding material 84 is by no means limited. Here, the control chips 4G and 4H may be bonded to the first base portion 55 via an insulative bonding material, instead of the conductive bonding material 84.

As shown in FIG. 4, the control chip 4G is located between the leads 2B to 2O and the leads 1A to 1G, as viewed in the x-direction. The control chip 4H is located between the leads 2B to 2O and the leads 1A to 1G, as viewed in the x-direction. The control chip 4G overlaps with the semiconductor chip 4B, as viewed in the y-direction. In the illustrated example, the control chip 4G also overlaps with the semiconductor chip 4A, as viewed in the y-direction. The control chip 4H overlaps with the semiconductor chip 4E, as viewed in the y-direction. The control chip 4G may overlap with the semiconductor chip 4C, as viewed in the y-direction. The control chip 4H may overlap with either or both of the semiconductor chips 4D and 4F, as viewed in the y-direction.

As shown in FIG. 15 and FIG. 16, in the illustrated example, the control chip 4G overlaps with the wiring 50B (first portion 51B) and the wiring 50C (first portion 51C), as viewed in the y-direction. In addition, the control chip 4G overlaps with the second base portion 56 and the control chip 4H, as viewed in the x-direction. The control chip 4H overlaps with the wiring 50I (first portion 51I), the wiring 50J (first portion 51J), wiring 50K (first portion 51K), and the wiring 50L (first portion 51L), as viewed in the y-direction. In addition, the control chip 4H overlaps with the wiring 50O (first portion 51O) and the wiring 50P (first portion 51P), as viewed in the x-direction.

As shown in FIG. 5, the control chip 4G is located on the side of the substrate 3, with respect to the upper end of the fourth portion 24C in the z-direction. Further, the control chip 4G is located on the side of the substrate 3, in other words on the lower side, with respect to the upper end of the first portion 21C in the z-direction. The control chip 4H is located on the side of the substrate 3, with respect to the upper end of the fourth portion 24C in the z-direction. Further, the control chip 4H is located on the side of the substrate 3, in other words on the lower side, with respect to the upper end of the first portion 21C in the z-direction.

<Diodes 49U, 49V, 49W>

The diodes 49U, 49V, and 49W are electrically connected to the control chip 4G. In this embodiment, the diodes 49U, 49V, and 49W each serve as what is known as a boot diode, to apply a higher voltage to the control chip 4G. As shown in FIG. 4, FIG. 15, and FIG. 16, the diode 49U is bonded to the first portion 51A of the wiring 50A of the conductive section 5, via a conductive bonding material 85. The conductive bonding material 85 is formed of, for example, a similar material to that of the conductive bonding material 84. The conductive bonding material 85 extends outwardly from the outer periphery of the diodes 49U, 49V, and 49W, in a plan view. A reason of such a configuration is that, for example, when the conductive bonding material 85 performs the bonding function by curing after the fused state, the conductive bonding material 85 of the fused phase spreads around the diode 49W (also diode 49U and diode 49V) as viewed in the z-direction, as shown in FIG. 8. Therefore, in the illustrated example, the conductive bonding material 85 protrudes from the outer edge of the diode 49U, as viewed in the z-direction. However, the specific shape of the conductive bonding material 85 is by no means limited.

As shown in FIG. 4, FIG. 15, and FIG. 16, the diode 49V is bonded to the first portion 51B of the wiring 50B of the conductive section 5, via the conductive bonding material 85. The diode 49W is bonded to the first portion 51C of the wiring 50C of the conductive section 5, via the conductive bonding material 85.

The actual positional arrangement of the diodes 49U, 49V, and 49W is not specifically limited. As shown in FIG. 15 and FIG. 16, in the illustrated example, the center of the diode 49U in the x-direction is shifted to the side of the wiring 50B (first portion 51B), with respect to the center of the first portion 51A in the x-direction. The center of the diode 49U in the y-direction is shifted to the opposite side of the lead 2A, with respect to the center of the first portion 51A in the y-direction. The center of the diode 49V in the x-direction is shifted to the side of the wiring 50A (first portion 51A), with respect to the center of the first portion 51B in the x-direction. In addition, the center of the diode 49V in the y-direction is shifted to the side of the lead 2B, with respect to the center of the first portion 51B in the y-direction. Further, the center of the diode 49W in the x-direction is shifted to the side of the wiring 50D (first portion 51D), with respect to the center of the first portion 51C in the x-direction. The center of the diode 49W in the y-direction is shifted to the side of the lead 2C, with respect to the center of the first portion 51C in the y-direction.

As shown in FIG. 5, the diode 49W is located on the side of the substrate 3, in other words on the lower side, with respect to the upper end of the fourth portion 24C in the z-direction. In addition, the diode 49W is located on the side of the substrate 3, in other words on the lower side, with respect to the upper end of the first portion 21C in the z-direction. The mentioned positional relations also apply to the diodes 49U and 49V.

<First Wires 91A to 91F>

The first wires 91A to 91F are each connected to one of the semiconductor chips 4A to 4F and one of the plurality of leads 1. The material of the first wires 91A to 91F is not specifically limited and, for example, aluminum (Al) or copper (Cu) may be employed. The wire diameter of the first wires 91A to 91F is not specifically limited and, for example, may be approximately 250 to 500 μm. The first wires 91A to 91F correspond to the first conductive material in the present disclosure. Here, for example leads formed of copper may be employed, in place of the first wires 91A to 91F.

As shown in FIG. 4, the first wire 91A has one end connected to the source electrode SP of the semiconductor chip 4A, and the other end connected to the fourth portion 14B of the lead 1B. The position on the source electrode SP and the fourth portion 14B to which the first wire 91A is to be connected is not specifically limited. As shown in FIG. 10, in the illustrated example, the one end of the first wire 91A is connected to a position spaced apart from the center of the source electrode SP of the semiconductor chip 4A in the y-direction, toward the opposite side of the gate electrode GP, as viewed in the z-direction. In addition, the first wire 91A overlaps with the center of the source electrode SP of the semiconductor chip 4A in the x-direction, as viewed in the y-direction. The first wire 91A is inclined with respect to the x-direction and the y-direction.

Figure 11:
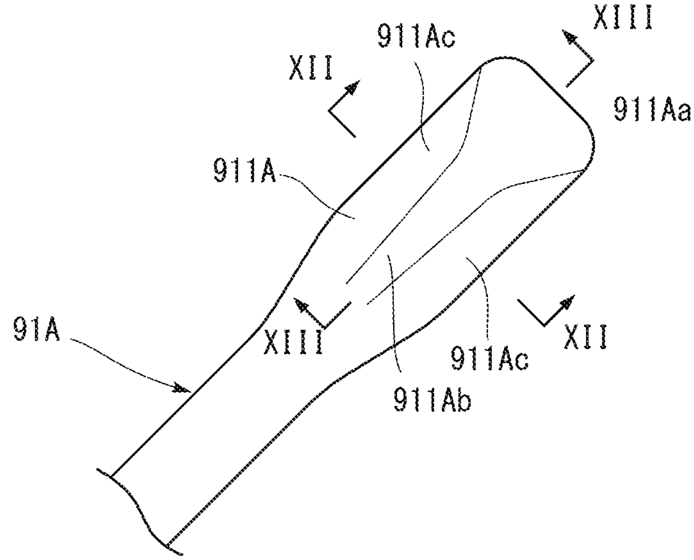
FIG. 11 is an enlarged partial plan view showing an end portion of a first wire 91A.
Figure 12:
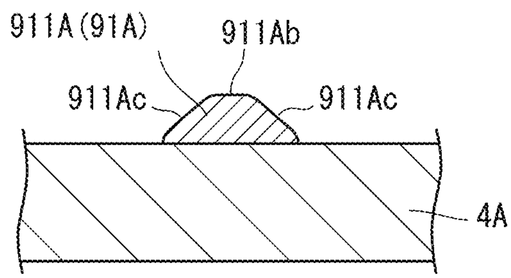
FIG. 12 is an enlarged partial cross-sectional view taken along a line XII-XII in FIG. 11.
Figure 13:
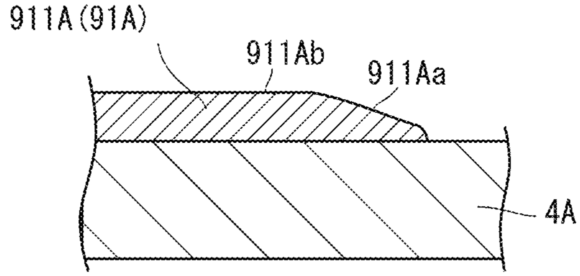
FIG. 13 is an enlarged partial cross-sectional view taken along a line XIII-XIII in FIG. 11.

As shown in FIG. 10, the first wires 91A, 91B, and 91C respectively include end portions 911A, 911B, and 911C. The end portion 911A will be described hereunder, and the end portions 911B and 911C may be similarly formed to the end portion 911A. This also applies to the first wires 91D, 91E, and 91F. FIG. 11 is an enlarged partial plan view showing an end portion of the first wire 91A. FIG. 12 is an enlarged partial cross-sectional view taken along a line XII-XII in FIG. 11. FIG. 13 is an enlarged partial cross-sectional view taken along a line XIII-XIII in FIG. 11. The end portion 911A is connected, for example, to the source electrode SP of the semiconductor chip 4A. The end portion 911A includes a first face 911Aa, a second face 911Ab, and a pair of third faces 911Ac. The first face 911Aa is formed so as to come closer to the semiconductor chip 4A, toward the tip portion of the end portion 911Aa. The second face 911Ab is oriented upward in the z-direction. The pair of third faces 911Ac are formed on the respective sides of the second face 911Ab, so as to come closer to the semiconductor chip 4A, in the direction away from the second face 911Ab. The wires 91B to 91F also include the end portion similarly formed to the end portion 911A.

As shown in FIG. 4, the first wire 91B has one end connected to the source electrode SP of the semiconductor chip 43, and the other end connected to the fourth portion 14C of the lead 1C. The position on the source electrode SP and the fourth portion 14C to which the first wire 91B is to be connected is not specifically limited. As shown in FIG. 10, in the illustrated example, the one end of the first wire 91B is connected to a position spaced apart from the center of the source electrode SP of the semiconductor chip 4B in the y-direction, toward the opposite side of the gate electrode CP, as viewed in the z-direction. In addition, the first wire 91B overlaps with the center of the source electrode SP of the semiconductor chip 48 in the x-direction, as viewed in the y-direction. The first wire 91B is inclined with respect to the x-direction and the y-direction.

As shown in FIG. 4, the first wire 91C has one end connected to the source electrode SP of the semiconductor chip 4C, and the other end connected to the fourth portion 14D of the lead 1D. The position on the source electrode SP and the fourth portion 14D to which the first wire 91C is to be connected is not specifically limited. As shown in FIG. 10, in the illustrated example, the one end of the first wire 91C is connected to a position spaced apart from the center of the source electrode SP of the semiconductor chip 4C in the y-direction, toward the opposite side of the gate electrode GP, as viewed in the z-direction. In addition, the first wire 91C overlaps with the center of the source electrode SP of the semiconductor chip 4C in the x-direction, as viewed in the y-direction. The first wire 91C is inclined with respect to the x-direction and the y-direction.

As shown in FIG. 4, the first wire 91D has one end connected to the source electrode SP of the semiconductor chip 4D, and the other end connected to the fourth portion 14E of the lead 1E. The position on the source electrode SP and the fourth portion 14E to which the first wire 91D is to be connected is not specifically limited. As shown in FIG. 10, in the illustrated example, the one end of the first wire 91D is connected to a position spaced apart from the center of the source electrode SP of the semiconductor chip 4D in the y-direction, toward the opposite side of the gate electrode GP, as viewed in the z-direction. In addition, the first wire 91D overlaps with the center of the source electrode SP of the semiconductor chip 4D in the x-direction, as viewed in the y-direction. The first wire 91D is inclined with respect to the x-direction and the y-direction.

As shown in FIG. 4, the first wire 91E has one end connected to the source electrode SP of the semiconductor chip 4E, and the other end connected to the fourth portion 14F of the lead 1F. The position on the source electrode SP and the fourth portion 14F to which the first wire 91E is to be connected is not specifically limited. As shown in FIG. 10, in the illustrated example, the one end of the first wire 91E is connected to a position spaced apart from the center of the source electrode SP of the semiconductor chip 4E in the y-direction, toward the opposite side of the gate electrode GP, as viewed in the z-direction. In addition, the first wire 91E overlaps with the center of the source electrode SP of the semiconductor chip 4E in the x-direction, as viewed in the y-direction. The first wire 91E is inclined with respect to the x-direction and the y-direction.

As shown in FIG. 4, the first wire 91F has one end connected to the source electrode SP of the semiconductor chip 4F, and the other end connected to the fourth portion 14G of the lead 1G. The position on the source electrode SP and the fourth portion 14G to which the first wire 91F is to be connected is not specifically limited. As shown in FIG. 10, in the illustrated example, the one end of the first wire 91F is connected to a position spaced apart from the center of the source electrode SP of the semiconductor chip 4F in the y-direction, toward the opposite side of the gate electrode GP, as viewed in the z-direction. In addition, the first wire 91F overlaps with the center of the source electrode SP of the semiconductor chip 4F in the x-direction, as viewed in the y-direction. The one end of the first wire 91F is, as viewed in the y-direction, shifted to the side of the semiconductor chip 4E, with respect to the center of the source electrode SP of the semiconductor chip 4F in the x-direction. The first wire 91F is inclined with respect to the x-direction and the y-direction.

<Second Wires 92>

The plurality of second wires 92 are each connected to one of the control chips 4G and 4H, as shown in FIG. 4. The material of the second wires 92 is not specifically limited and, for example, gold (Au), silver (Ag), copper (Cu), or aluminum (Al) may be employed. The wire diameter of the second wires 92 is not specifically limited and, in this embodiment, finer than the first wires 91A to 91F. The wire diameter of the second wires 92 is, for example, approximately 10 μm to 50 μm. The second wires 92 correspond to the second conductive material in the present disclosure. In the subsequent description, the second wires 92 connected to the control chip 4G will be referred to as second wires 92G, and the second wires 92 connected to the control chip 4H will be referred to as second wires 92H.

As shown in FIG. 4, the second wire 92G is connected to the gate electrode GP of the semiconductor chip 4A, and to a position on the control chip 4G on the side of the first portion 11A, with respect to the center of the control chip 4G in the y-direction. Another second wire 92G is connected to the source electrode SP of the semiconductor chip 4A, and to a position on the control chip 4G on the side of the first portion 11A, with respect to the center of the control chip 4G in the y-direction. The latter second wire 92G is connected to a position on the source electrode SP of the semiconductor chip 4A on the side of the semiconductor chip 4B in the x-direction, with respect to the gate electrode GP.

As shown in FIG. 4, the second wire 92G is connected to the gate electrode GP of the semiconductor chip 4B, and to a position on the control chip 4G on the side of the first portion 11A, with respect to the center of the control chip 4G in the y-direction. Another second wire 92G is connected to the source electrode SP of the semiconductor chip 4B, and to a position on the control chip 4G on the side of the first portion 11A, with respect to the center of the control chip 4G in the y-direction. The latter second wire 92G is connected to a position on the source electrode SP of the semiconductor chip 48 on the side of the semiconductor chip 4C in the x-direction, with respect to the gate electrode GP.

As shown in FIG. 4, the second wire 92G is connected to the gate electrode GP of the semiconductor chip 4C, and to a position on the control chip 4G on the side of the first portion 11A, with respect to the center of the control chip 4G in the y-direction. Another second wire 92G is connected to the source electrode SP of the semiconductor chip 4C, and to a position on the control chip 4G on the side of the first portion 11A, with respect to the center of the control chip 4G in the y-direction. The latter second wire 92G is connected to a position on the source electrode SP of the semiconductor chip 48 on the side of the semiconductor chip 48 in the x-direction, with respect to the gate electrode GP.

As shown in FIG. 4, the second wire 92H is connected to the gate electrode GP of the semiconductor chip 4D, and to a position on the control chip 4H on the side of the first portion 11A, with respect to the center of the control chip 4H in the y-direction. Another second wire 92H is connected to the gate electrode GP of the semiconductor chip 4B, and to a position on the control chip 4H on the side of the first portion 11A, with respect to the center of the control chip 4H in the y-direction. Further, still another second wire 92H is connected to the gate electrode GP of the semiconductor chip 4F, and to a position on the control chip 4H on the side of the first portion 11A, with respect to the center of the control chip 4H in the y-direction.

As shown in FIG. 15 and FIG. 16, a pair of second wires 92G each have one end connected to the first portion 51A of the wiring 50A, and the other end connected to the control chip 4G. Another second wire 92G has one end connected to the diode 49U, and the other end connected to the control chip 4G.

As shown in FIG. 15 and FIG. 16, a pair of second wires 92G each have one end connected to the first portion 51B of the wiring 50B, and the other end connected to the control chip 4G. Another second wire 92G has one end connected to the diode 49V, and the other end connected to the control chip 4G.

As shown in FIG. 15 and FIG. 16, a pair of second wires 92G each have one end connected to the first portion 51C of the wiring 50C, and the other end connected to the control chip 4G. Another second wire 92G has one end connected to the diode 49W, and the other end connected to the control chip 4G.

As shown in FIG. 15 and FIG. 16, a pair of second wires 92G each have one end connected to the first portion 51D of the wiring 50D, and the other end connected to the control chip 4G. Another second wire 92G has one end connected to the first portion 51E of the wiring 50E, and the other end connected to the control chip 4G. Still another second wire 92G has one end connected to the first portion 51F of the wiring 50F, and the other end connected to the control chip 4G. Still another second wire 92G has one end connected to the first portion 51G of the wiring 50G, and the other end connected to the control chip 4G. Further, another pair of second wires 92G each have one end connected to the second portion 572 of the connecting portion 57, and the other end connected to the control chip 4G.

As shown in FIG. 15 and FIG. 16, the second wire 92H has one end connected to the first portion 51I of the wiring 50I, and the other end connected to the control chip 4H. Another second wire 92H has one end connected to the first portion 51J of the wiring 50J, and the other end connected to the control chip 4H. Still another second wire 92H has one end connected to the first portion 51K of the wiring 50K, and the other end connected to the control chip 4H. A pair of second wires 92H each have one end connected to the first portion 51L of the wiring 50L, and the other end connected to the control chip 4H. Still another second wire 92H has one end connected to the first portion 51M of the wiring 50M, and the other end connected to the control chip 4H. Still another second wire 92H has one end connected to the first portion 51N of the wiring 50N, and the other end connected to the control chip 4H. Further, another pair of second wires 92H each have one end connected to the first portion 51O of the wiring 50O, and the other end connected to the control chip 4H.

<Resin 7>

The resin 7 covers at least the semiconductor chips 4A to 4F, the control chips 4G and 4H, a part of each of the plurality of leads 1, and a part of each of the plurality of leads 2. In this embodiment, in addition, the resin 7 covers the diodes 49U, 49V, and 49W, the plurality of first wires 91A to 91F, and the plurality of second wires 92. The material of the resin 7 is not specifically limited. Though not specifically limited, for example an insulative material such as an epoxy resin or silicone gel may be employed to form the resin 7.

It is preferable that the dimension DX in the x-direction of the resin 7 shown in FIG. 2 is equal to or smaller than 60 mm. It is preferable that the dimension DY of the resin 7 in the y-direction is equal to or smaller than 35 mm. It is preferable that the dimension DZ in the z-direction of the resin 7 shown in FIG. 1 is equal to or smaller than 6 mm. In this embodiment, the dimension DX of the resin 7 is approximately 57 mm, the dimension DY is approximately 30 mm, and the dimension DZ is approximately 5 mm.

In this embodiment, the resin 7 includes a first face 71, a second face 72, a third face 73, a fourth face 74, a fifth face 75, a sixth face 76, a recess 710, a recess 720, a recess 731, a recess 732, a recess 733, and a recess 734.

The first face 71 intersects with the z-direction and, in the illustrated example, is perpendicular to the z-direction. The first face 71 is oriented in the same direction as the first face 31 of the substrate 3. The second face 72 intersects with the z-direction and, in the illustrated example, is perpendicular to the z-direction. The second face 72 is oriented in the opposite direction to the first face 71, and in the same direction as the second face 32 of the substrate 3.

The third face 73 is located between the first face 71 and the second face 72 in the z-direction, and connected to the first face 71 and the second face 72, in the illustrated example. The third face 73 intersects with the x-direction, and is oriented in the same direction as the third face 33 of the substrate 3. The fourth face 74 is located between the first face 71 and the second face 72 in the z-direction, and connected to the first face 71 and the second face 72, in the illustrated example. The fourth face 74 intersects with the x-direction, and is oriented in the opposite direction to the third face 73, and in the same direction as the fourth face 34 of the substrate 3.

The fifth face 75 is located between the first face 71 and the second face 72 in the z-direction, and connected to the first face 71 and the second face 72, in the illustrated example. The fifth face 75 intersects with the y-direction, and is oriented in the same direction as the fifth face 35 of the substrate 3. The sixth face 76 is located between the first face 71 and the second face 72 in the z-direction, and connected to the first face 71 and the second face 72, in the illustrated example. The sixth face 76 intersects with the x-direction, and is oriented in the opposite direction to the fifth face 75, and in the same direction as the sixth face 36.

The recess 710 is a portion receding from the third face 73 in the x-direction. The recess 710 is formed so as to reach the first face 71 and the second face 72. The recess 720 is a portion receding from the fourth face 74 in the x-direction. The recess 720 is formed so as to reach the first face 71 and the second face 72.

As shown in FIG. 4, the recess 731, the recess 732, the recess 733, and the recess 734 are portions receding from the fifth face 75 in the y-direction. The recess 731 is located between the second portion 22Z of the lead 2Z and the second portion 22A of the lead 2A, as viewed in the y-direction. The recess 732 is located between the second portion 22A of the lead 2A and the second portion 22B of the lead 2B, as viewed in the y-direction. The recess 733 is located between the second portion 22B of the lead 2B and the second portion 22C of the lead 2C, as viewed in the y-direction. The recess 734 is located between the second portion 22C of the lead 2C and the second portion 22D of the lead 2D, as viewed in the y-direction.

<Circuit Configuration of Semiconductor Device A1>

A circuit configuration of the semiconductor device A1 will now be described hereunder.

As shown in FIG. 18, the semiconductor device A1 includes three switching arms 40U, 40V, and 40W connected in parallel to each other. The switching arm 40U includes the semiconductor chips 4A and 4D, the switching arm 40V includes the semiconductor chips 4B and 4E, and the switching arm 40W includes the semiconductor chips 4C and 4F.

The respective drains of the semiconductor chips 4A to 4C are connected to each other, and connected to a P terminal (lead 1A). the source of the semiconductor chip 4A is connected to the drain of the semiconductor chip 4D, the source of the semiconductor chip 4B is connected to the drain of the semiconductor chip 4E, and the source of the semiconductor chip 4C is connected to the drain of the semiconductor chip 4F. A node N1 between the source of the semiconductor chip 4A and the drain of the semiconductor chip 4D is connected to a U terminal (lead 1B). A node N2 between the source of the semiconductor chip 4B and the drain of the semiconductor chip 4E is connected to a V terminal (lead 1C). A node N3 between the source of the semiconductor chip 4C and the drain of the semiconductor chip 4F is connected to a W terminal (lead 1D). The source of the semiconductor chip 4D is connected to an NU terminal (lead 1E), the source of the semiconductor chip 4E is connected to an NV terminal (lead 1F), and the source of the semiconductor chip 4F is connected to an NW terminal (lead 1G).

A voltage level applied to the U terminal (lead 1B), the V terminal (lead 1C), and the W terminal (lead 1D) is, for example, approximately 0 V to 650 V. A voltage level applied to the NU terminal (lead 1E), the NV terminal (lead 1F), and the NW terminal (lead 1G) is, for example, approximately 0V, and lower than the voltage level applied to the terminal (lead 1B), the V terminal (lead 1C), and the W terminal (lead 1D). The semiconductor chips 4A to 4C each constitute a high-potential side transistor of a three-phase inverter circuit, and the semiconductor chips 4D to 4F each constitute a low-potential side transistor of the three-phase inverter circuit.

The respective gates of the semiconductor chip 4A to 4C are connected to the control chip 4G, and the respective sources of the semiconductor chips 4A to 4C are connected to the control chip 4G. The respective gates of the semiconductor chips 4D to 4F are connected to the control chip 4H.

The control chip 4G is electrically connected to a VBU terminal (lead 2A), a VBV terminal (lead 2B), a YEW terminal (lead 2C), a first VCC terminal (lead 2D), an HINU terminal (lead 2E), an HINV terminal (lead 2F), an HINW terminal (lead 2G), and a first GND terminal (lead 2H). The first VCC terminal supplies a source voltage VCC to the control chip 4G. A gate signal voltage is applied to the HINU terminal, the HINV terminal, and the HINW terminal, from an external gate driver circuit (not shown). The control chip 4G is a circuit for applying the gate signal voltages to the respective gates of the semiconductor chips 4A to 4C. The first GND terminal and the second GND terminal (lead 2O) are connected to each other inside the semiconductor device A1, more specifically in the conductive section 5 on the substrate 3.

The control chip 4H is electrically connected to an LINU terminal (lead 2I), an LINV terminal (lead 2J), an LINW terminal (lead 2K), a second VCC terminal (lead 2L), an FO terminal (lead 2M), a CIN terminal (lead 2N), and a second GND terminal (lead 2O). The second VCC terminal supplies the source voltage VCC to the control chip 4H. The gate signal voltage is applied to the LINU terminal, the LINV terminal, and the LINW terminal, from the external gate driver circuit. The control chip 4H is a circuit for applying the gate signal voltages to the respective gates of the semiconductor chips 4D to 4F.

A first voltage of the electrical signal provided to the HINU terminal (lead 2E), the HINV terminal (lead 2F), and the HINW terminal (lead 2G) is lower than a second voltage (source voltage VCC) applied by the first VCC terminal (lead 2D) to drive the control chip 4G. A first voltage of the electrical signal provided to the LINU terminal (lead 2I), the LINV terminal (lead 2J), and the LINW terminal (lead 2K) is lower than a second voltage (source voltage VCC) applied by the second VCC terminal (lead 2L) to drive the control chip 4H.

FIG. 19 illustrates an example of the configuration of the control chips 4G and 4H, for example for driving the switching arm 40U, in other words an example of the circuit in the control chips 4G and 4H (hereinafter, control circuit GDC) for controlling the switching arm 40U.

As shown in FIG. 19, the circuit in the control circuit GDC corresponding to the control chip 4G includes a resistance 461, a Schmitt trigger 462, a level shifter 463, a controller 464, a pulse generator 465, a level shifter 466, a filter circuit 467, an RS flip-flop circuit 468, and a driver 469, in this order from the input side (HINU terminal side) to the output side (U terminal side).

The resistance 461 pulls down the HINU terminal to the ground terminal. Accordingly, when the HINU terminal is open, an upper input signal HINU, representing the gate signal voltage inputted from the gate driver circuit to the HINU terminal, falls to a low level (logic level to turn off the semiconductor chip 4A), and therefore the semiconductor chip 4A is prevented from being unintentionally turned on.

The Schmitt trigger 462 transmits the upper input signal HINU inputted to the HINU terminal, to the level shifter 463. Here, a predetermined hysteresis is given to the threshold voltage of the Schmitt trigger 462. Such a configuration improves noise resistance.

The level shifter 463 shifts the level of the output signal of the Schmitt trigger 462 to an appropriate voltage level (VCC–GND) to be inputted to the controller 464, and outputs the shifted voltage. The controller 464 controls whether to transmit the output signal of the level shifter 463 to the pulse generator 465 (consequently, whether to drive the semiconductor chip 4A), on the basis of a fault signal inputted from a fault protection unit 480, or an external fault signal inputted from the FO terminal.

The pulse generator 465 generates pulse signals, such as an on-signal $S_{ON}$ and an off-signal $S_{OFF}$, on the basis of the output signal of the controller 464. More specifically, the pulse generator 465 sets the on-signal $S_{ON}$ to a high level for a predetermined on-period $T_{ON1}$, using the rising edge of the output signal of the controller 464 as the trigger, and sets the off-signal $S_{OFF}$ to a high level for a predetermined on-period T using the falling edge of the output signal of the controller 464 as the trigger. Here, the output signal of the controller 464 (based on the upper input signal HINU), the on-period $T_{ON1}$, and the on-period $T_{ON2}$ are set such that both of the on-signal $S_{ON}$ and the off-signal $S_{OFF}$ do not rise to the high level at the same time. Therefore, provided that the semiconductor device A1 is normally operating, when at least one of the on-signal $S_{ON}$ and the off-signal $S_{OFF}$ is at the high level, the other is at the low level.

The level shifter 466 is located between a high-potential block including the filter circuit 467, the RS flip-flop circuit 468, and the driver 469, and a low-potential block including the pulse generator 465, to shift the signal level and transmit the shifted signal from the low-potential block to the high-potential block. More specifically, the level shifter 466 receives the pulse signals, namely the on-signal $S_{ON}$ and the off-signal $S_{OFF}$, from the pulse generator 465 included in the low-potential block. The level shifter 466 shifts the level of these signals, and outputs the shifted signals to the filter circuit 467, as a first shifted signal and a second shifted signal. Here, the high-potential block operates between a boost voltage VBU applied to the VBU terminal, and a switch voltage VS applied to the U terminal.

The filter circuit 467 filtrates the first shifted signal and the second shifted signal inputted from the level shifter 466, and outputs the filtrated signals to the RS flip-flop circuit 468.

The RS flip-flop circuit 468 includes a set terminal (S terminal) to which the first shifted signal filtrated by the filter circuit 467 is inputted as a set signal $S_{SET}$, a reset terminal (R terminal) to which the second shifted signal filtrated by the filter circuit 467 is inputted as a reset signal $S_{RESET}$, and an output terminal (Q terminal) that outputs an output signal $S_Q$. The RS flip-flop circuit 468 sets the output signal $S_Q$ to the high level, using the falling edge of the set signal $S_{SET}$ as the trigger, and sets the output signal $S_Q$ to the low level, using the falling edge of the reset signal $S_{RESET}$ as the trigger. Here, the set signal $S_{SET}$ and the reset signal $S_{RESET}$ are both inputted from the level shifter 466.

The driver 469 generates an upper output signal HOU based on the output signal of the RS flip-flop circuit 468, and outputs the upper output signal HOU to the gate of the semiconductor chip 4A. Here, the high level of the upper output signal HOU corresponds to the boost voltage VBU, and the low level corresponds to the switch voltage VS.

The circuit in the control circuit GDC corresponding to the control chip 4H includes a resistance 471, a Schmitt trigger 472, a level shifter 473, a delay circuit 474, and a driver 475, in this order from the input side (LINU terminal side) to the output side (U terminal side). In this embodiment, the controller 464 of the control chip 4G is provided between the level shifter 473 and the delay circuit 474. Alternatively, the control chip 4H may include a controller, apart from the controller 464 of the control chip 4G. In this case, the controller of the control chip 4H may be provided between the delay circuit 474 and the driver 475 because, when a fault occurs, the semiconductor chip 4D can be more quickly turned off without the need to involve the delay circuit 474.

The resistance 471 pulls down the LINU terminal to the ground terminal. Accordingly, when the LINU terminal is open, a lower input signal LINU, representing the gate signal voltage inputted from the gate driver circuit, falls to the low level (logic level to turn off the semiconductor chip 4D), and therefore the semiconductor chip 4D is prevented from being unintentionally turned on.

The Schmitt trigger 472 transmits the lower input signal LINU inputted to the LINU terminal, to the level shifter 473. Here, a predetermined hysteresis is given to the threshold voltage of the Schmitt trigger 472. Such a configuration improves noise resistance.

The level shifter 473 shifts the level of the output signal of the Schmitt trigger 472 to an appropriate voltage level (VCC–GND) to be inputted to the controller 464, and outputs the shifted voltage.

The controller 464 controls whether to transmit the output signal of the delay circuit 474 to the driver 475 (consequently, whether to drive the semiconductor chip 4D), on the basis of a fault signal inputted from the fault protection unit 480, or an external fault signal inputted from the FO terminal.

The delay circuit 474 transmits the output signal of the controller 464 to the driver 475, giving a predetermined delay (corresponding to the circuit delay in the pulse generator 465, the level shifter 466, and the RS flip-flop circuit 468 of the control chip 4G) to the output signal.

The driver 475 outputs the lower output signal LOU to the gate of the semiconductor chip 4D, on the basis of the output signal of the controller 464, delayed by the delay circuit 474. Here, the high level of the lower output signal LOU corresponds to the source voltage VCC, and the low level corresponds to the ground voltage VGND.

The fault protection unit 480 includes a thermal shut down circuit (TSD circuit) 481, an under voltage lock out circuit (UVLO circuit) 482, a low-pass filter circuit 483, a current limiting circuit 484, a power fault protection circuit 485, a fault signal generation circuit 486, a transistor 487, a Schmitt trigger 488, and a level shifter 489.

The thermal shut down circuit 481 switches a thermal shut down signal from the logic level in the normal condition (e.g., low level) to the logic level in an abnormal condition (e.g., high level), when the junction temperature of the semiconductor device A1 exceeds a predetermined threshold.

The under voltage lock out circuit 482 switches a lock out signal from the logic level in the normal condition (e.g., low level) to the logic level in an abnormal condition (e.g., high level), when the source voltage VCC falls below a predetermined threshold voltage.

The low-pass filter circuit 483 is electrically connected to a detection terminal CIN. The low-pass filter circuit 483 outputs a detected voltage CIN to each of the current limiting circuit 484 and the power fault protection circuit 485.

The current limiting circuit 484 switches a current limiting signal from the logic level in the normal condition (e.g., low level) to the logic level in an abnormal condition (e.g., high level), when the detected voltage CIN exceeds a first threshold.

The power fault protection circuit 485 switches a power fault protection signal from the logic level in the normal condition (e.g., low level) to the logic level in an abnormal condition (e.g., high level), when the detected voltage CIN exceeds a second threshold. Here, an example of the second threshold is a higher voltage than the first threshold.

The fault signal generation circuit 486 monitors the thermal shut down signal inputted from the thermal shut down circuit 481, the lock out signal inputted from the under voltage lock out circuit 482, the current limiting signal inputted from the current limiting circuit 484, the power fault protection signal inputted from the power fault protection circuit 485, and the external fault signal inputted from the FO terminal. The fault signal generation circuit 486 switches a first fault signal from the logic level in the normal condition (e.g., low level) to the logic level in an abnormal condition (e.g., high level), when a fault occurs in the current limiting circuit 484. The fault signal generation circuit 486 switches a second fault signal from the logic level in the normal condition (e.g., low level) to the logic level in an abnormal condition (e.g., high level), when a fault occurs in at least one of thermal shut down circuit 481, the under voltage lock out circuit 482, and the power fault protection circuit 485, or when the external fault signal is inputted. The fault signal generation circuit 486 outputs the first fault signal and the second fault signal to the controller 464.

Upon receipt of the first fault signal, the controller 464 limits, for example, the current flowing to at least one of the semiconductor chip 4A and the semiconductor chip 4D, Upon receipt of the second fault signal, the controller 464 turns off both of the semiconductor chips 4A and 4D. The fault signal generation circuit 486 switches the first fault signal to the logic level in the abnormal condition, when the current limiting signal is inputted, and switches the second fault signal to the logic level in the abnormal condition, when one of the thermal shut down signal, the lock out signal, the power fault protection signal, and the external fault signal is inputted.

The transistor 487 forms an open drain output stage for outputting the external fault signal from the FO terminal. While the semiconductor device A1 is without a fault, the transistor 487 is turned off by the fault signal generation circuit 486, and the external fault signal is set to the high level. In contrast, when a fault occurs in the semiconductor device A1, the transistor 487 is turned on by the fault signal generation circuit 486, and the external fault signal is set to the low level.

The Schmitt trigger 488 transmits the external fault signal inputted to the FO terminal (e.g., external fault signal outputted from the FO terminal of another semiconductor device), to the level shifter 489. Here, a predetermined hysteresis is given to the threshold voltage of the Schmitt trigger 488. Such a configuration improves noise resistance.

The level shifter 489 shifts the level of the output signal of the Schmitt trigger 488 to an appropriate voltage level (VCC−GND) to be inputted to the controller 464, and outputs the shifted voltage.

A boot strap circuit 490U includes the diode 49U having the anode connected to the application terminal of the source voltage VCC via a resistance 491U, and a bootstrap capacitor 492U located between the cathode of the diode 49U and the source of the semiconductor chip 4A. The bootstrap capacitor 492U is electrically connected to the VBU terminal and the U terminal.

The boot strap circuit 490U generates a boost voltage VB (drive voltage for the high-potential block including the driver 469), at a connection node (U terminal) between the diode 49U and the bootstrap capacitor 492U. The resistance 491U limits the current supplied from an external power source to the diode 49U through the first VCC terminal. Thus, the charging current to the bootstrap capacitor 492U is limited.

When the semiconductor chip 4A is turned on and the semiconductor chip 4D is turned off, the current runs from the application terminal of the source voltage VCC, through the diode 49U, the bootstrap capacitor 492U, and the semiconductor chip 4D, when the switch voltage VS seen at the U terminal is set to the low level (GND). Accordingly, the bootstrap capacitor 492U provided between the VBU terminal and the U terminal is charged. At this point, the boost voltage VB (i.e., charging voltage for the bootstrap capacitor 492U) seen at the VBU terminal has a value obtained by subtracting a forward dropping voltage Vf of the diode 49U from the source voltage VCC(VCC−Vf).

In contrast, when the semiconductor chip 4A is turned on and the semiconductor chip 4D is turned off, with the bootstrap capacitor 492U being charged, the switch voltage VS is raised from the low level (GND) to the high level (HV). The boost voltage VB is raised to a value higher than the high level (HV) of the switch voltage VS, by an amount corresponding to the charging voltage (VCC−Vf) for the bootstrap capacitor 493U (i.e., HV+VCC−Vf). Employing thus the boost voltage VS as the drive voltage for the high-potential block (RS flip-flop circuit 468 and driver 469) and the level shifter 466 enables the on/off control (in particular, on control), in other words the switching control of the semiconductor chip 4A, to be performed.

<Manufacturing Method of Semiconductor Device A1>

An example of the manufacturing method of the semiconductor device A1 will be described hereunder, with reference to FIG. 20 to FIG. 30. The manufacturing method described hereunder is merely an exemplary method to obtain the semiconductor device A1, and in no way intended to limit the present disclosure.

Figure 20:
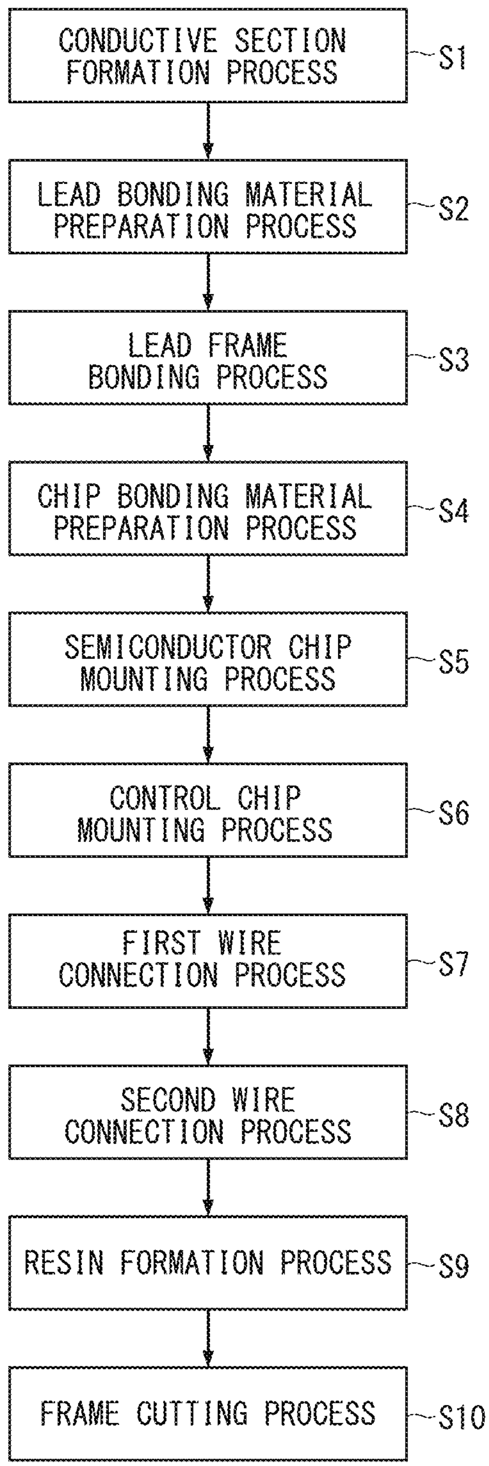
FIG. 20 is a flowchart showing a manufacturing method of the semiconductor device according to the first embodiment of the present disclosure.

As shown in FIG. 20, the manufacturing method according to this embodiment includes a conductive section formation process (step S1), a lead bonding material preparation process (step S2), a lead frame bonding process (step S3), a chip bonding material preparation process (step S4), a semiconductor chip mounting process (step S5), a control chip mounting process (step S6), a first wire connection process (step S7), a second wire connection process (step S8), a resin formation process (step S9), and a frame cutting process (step S10).

Figure 21:
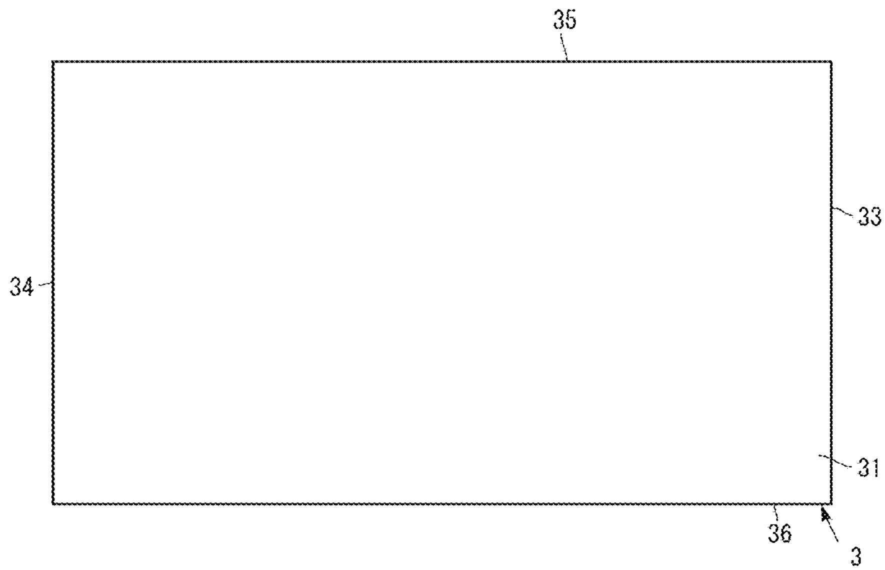
FIG. 21 is a plan view for explaining the manufacturing method of the semiconductor device according to the first embodiment of the present disclosure.
Figure 22:
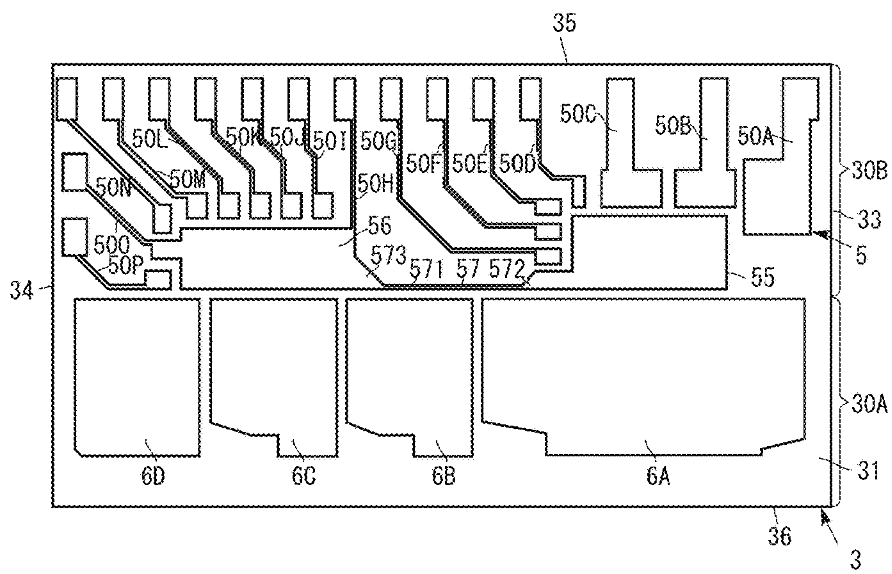
FIG. 22 is a plan view for explaining a process subsequent to FIG. 21.

In the conductive section formation process (step S1), the substrate 3 is prepared as shown in FIG. 21. For example, a ceramic is employed to form the substrate 3. Then the conductive section 5 and the plurality of bonding sections 6 are formed on the first face 31 of the substrate 3, as shown in FIG. 22. In this embodiment, the conductive section 5 and the plurality of bonding sections 6 are collectively formed. For example, the conductive section 5 and the plurality of bonding sections 6, containing a conductive material, for example a metal such as silver (Ag), can be obtained by printing a metal paste and then sintering the metal paste.

Figure 23:
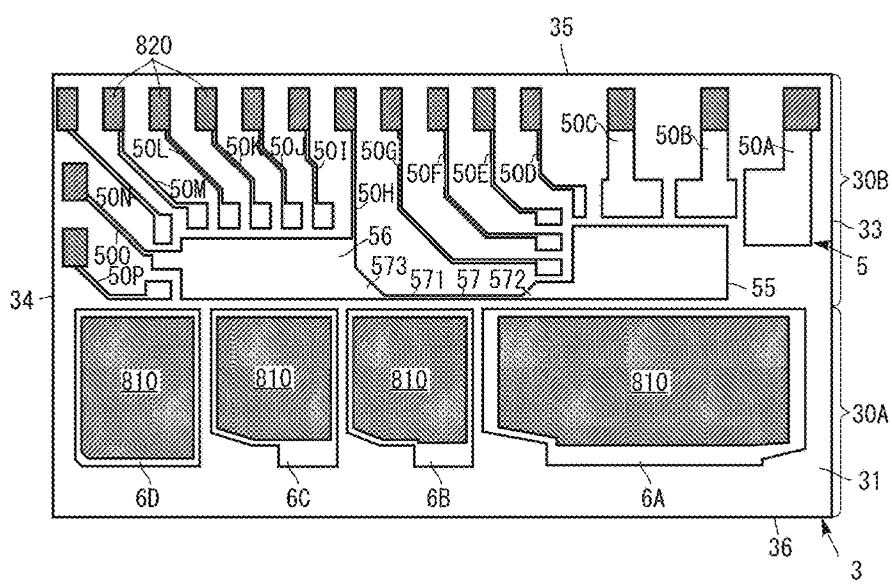
FIG. 23 is a plan view for explaining a process subsequent to FIG. 22.

In the lead bonding material preparation process (step S2), a bonding paste 810 and a conductive bonding paste 820 are printed on the conductive section 5 and the plurality of bonding sections 6, as shown in FIG. 23. The bonding paste 810 and the conductive bonding paste 820 are, for example, Ag paste or solder paste.

Figure 24:
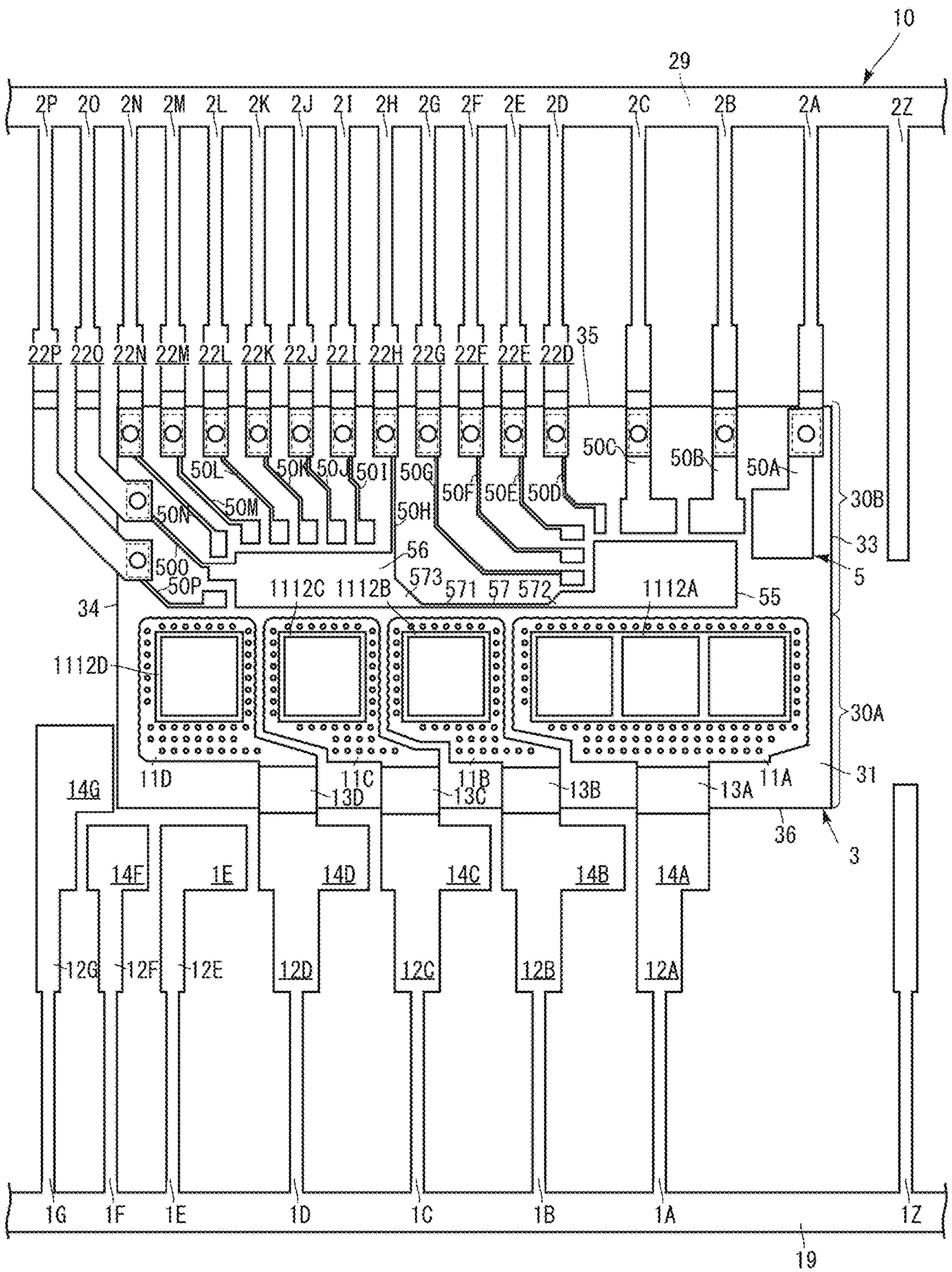
FIG. 24 is a plan view for explaining a process subsequent to FIG. 23.

In the lead frame bonding process (step S3), the lead frame 10 is prepared as shown in FIG. 24. The lead frame 10 includes the plurality of leads 1 and the plurality of leads 2, and also a frame 19 and a frame 29. The frame 19 is connected to the plurality of leads 1, to support the leads 1.

The frame 29 is connected to the plurality of leads 2, to support the leads 2. The shape of the lead frame 10 is by no means limited. Then the plurality of leads 1 are made to oppose the plurality of bonding regions 6, via the bonding paste 810. In addition, the plurality of leads 2 are made to oppose the conductive section 5, via the conductive bonding paste 820. For example, by heating the bonding paste 810 and the conductive bonding paste 820 and then cooling these pastes, the bonding material 81 is formed from the bonding paste 810, and the conductive bonding material 82 is formed from the conductive bonding paste 820. Thus, the plurality of leads 1 are bonded to the plurality of bonding sections 6 via the bonding material 81, and the plurality of leads 2 are bonded to the conductive section 5 via the conductive bonding material 82.

Figure 25:
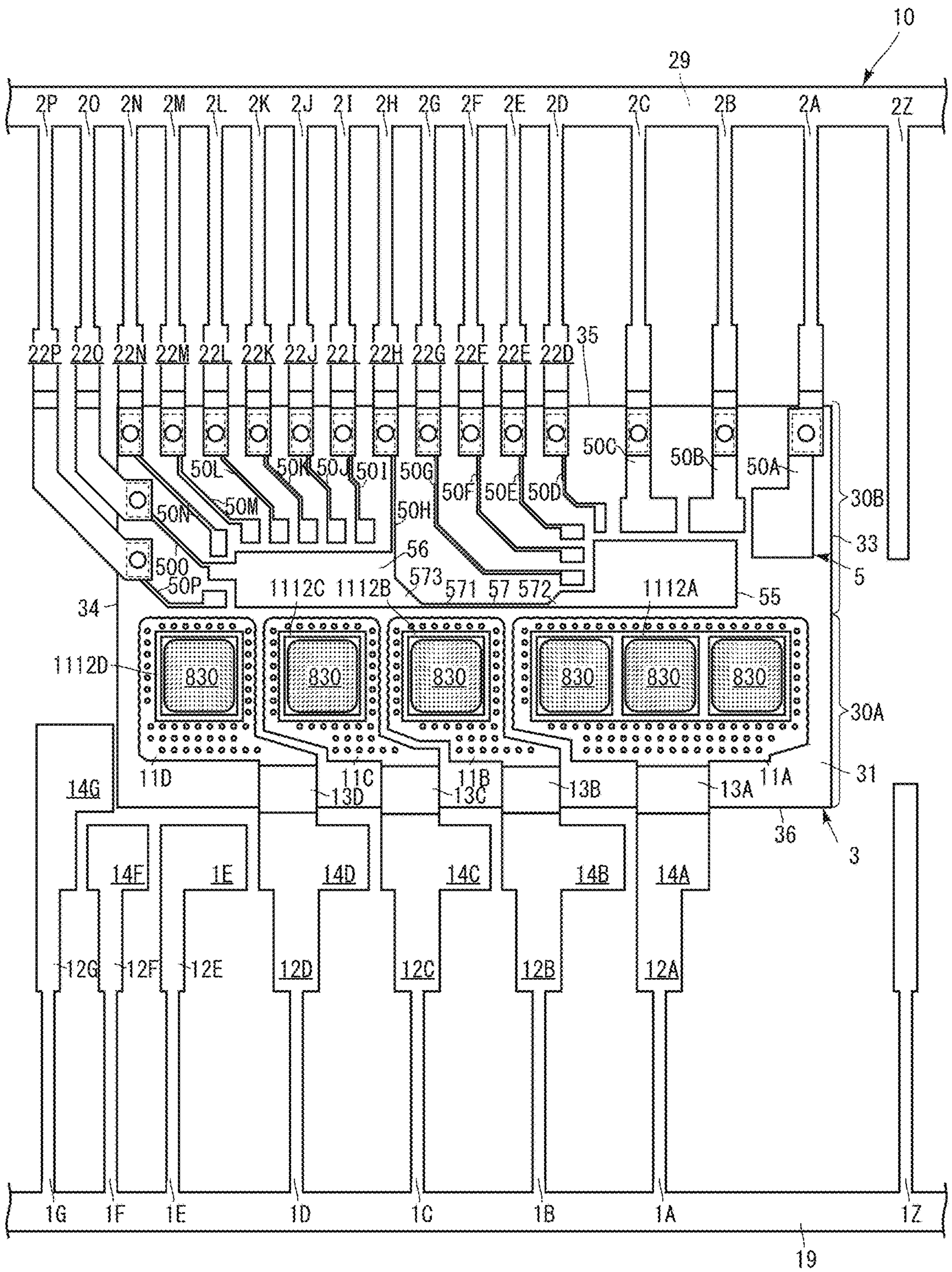
FIG. 25 is a plan view for explaining a process subsequent to FIG. 24.

In the chip bonding material preparation process (step S4), a conductive bonding paste 830 is printed on the main surface 111A of the first portion 11A, the main surface 111B of the first portion 11B, the main surface 111C of the first portion 11C, and the main surface 111D of the first portion 11D, for example as shown in FIG. 25. The conductive bonding paste 830 is, for example, Ag paste or solder paste.

Figure 26:
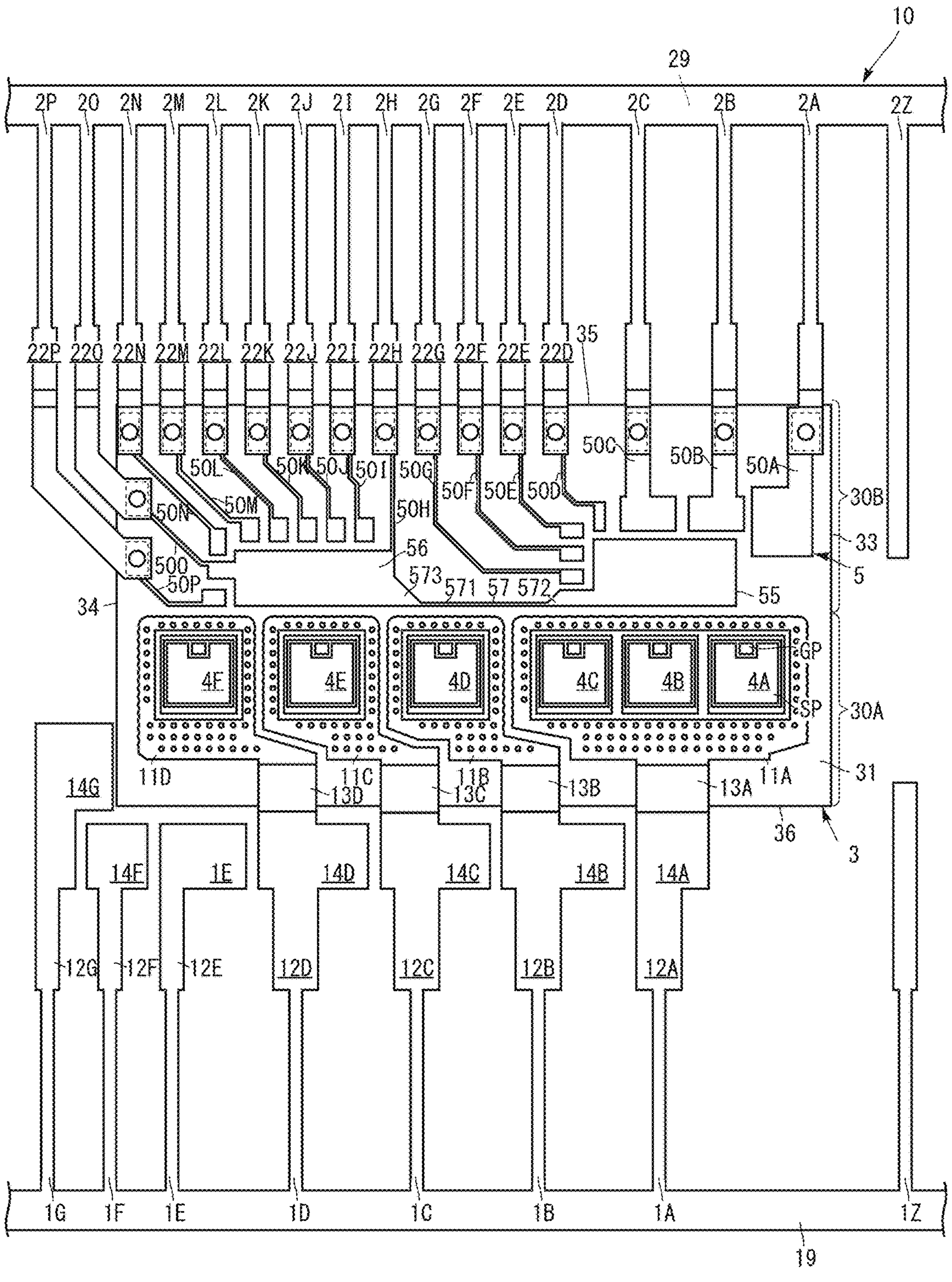
FIG. 26 is a plan view for explaining a process subsequent to FIG. 25.

In the semiconductor chip mounting process (step S5), the semiconductor chips 4A to 4F are each stuck to the conductive bonding paste 830, as shown in FIG. 26. Then the conductive bonding material 83 is formed from the conductive bonding paste 830, for example by heating the conductive bonding paste 830 and then cooling the same. Thus, the semiconductor chips 4A to 4F are each bonded to the corresponding one of the first portions 11A to 11D, via the conductive bonding material 83.

Figure 27:
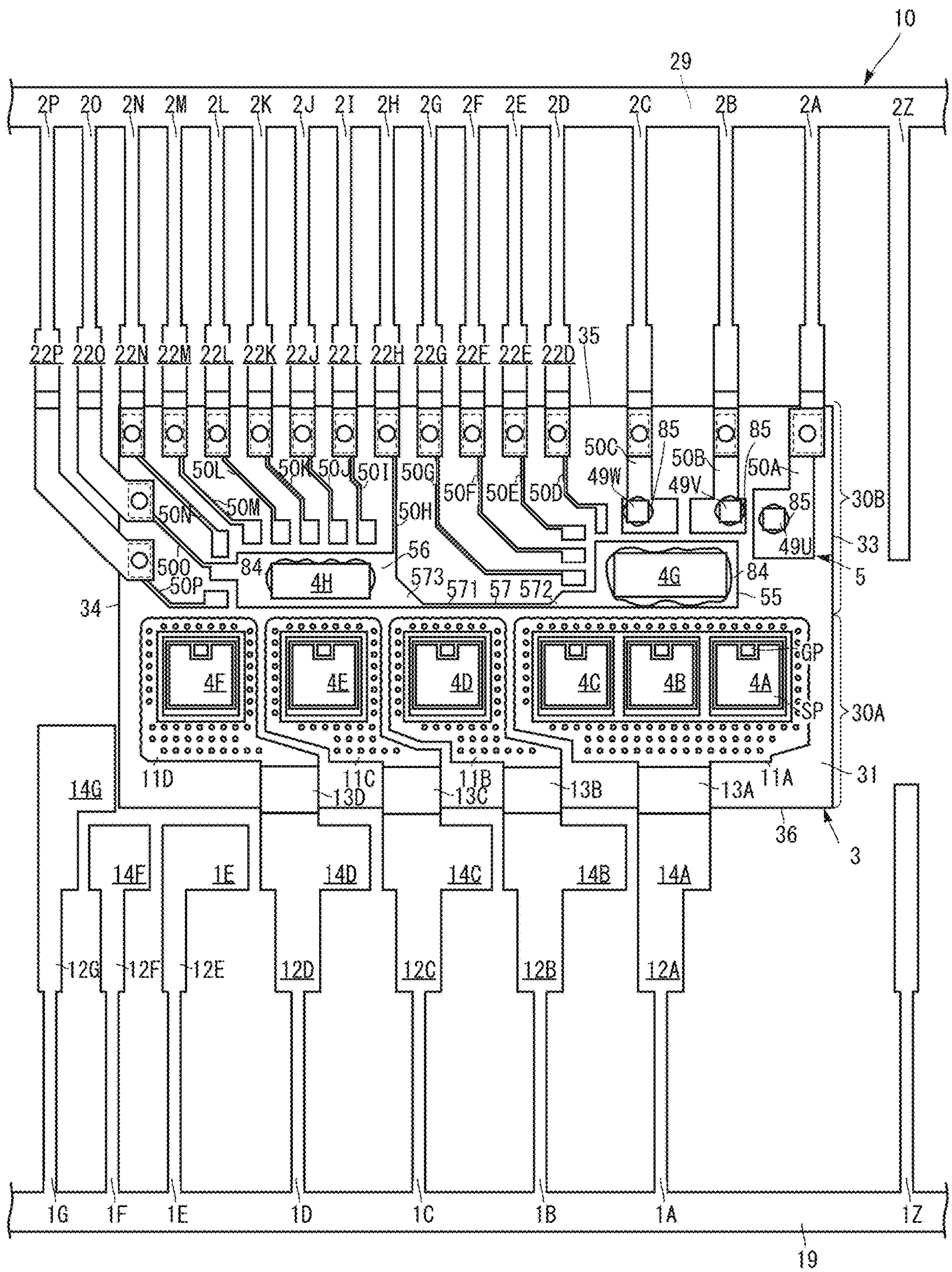
FIG. 27 is a plan view for explaining a process subsequent to FIG. 26.

In the control chip mounting process (step S6), a paste containing a metal is printed on the first base portion 55 and the second base portion 56 of the conductive section 5, as shown in FIG. 27. The mentioned paste may be, for example, Ag paste or solder paste. Then the control chip 4G and the control chip 4H are each stuck to the paste. Then the control chip 4G and the control chip 4H are respectively bonded to the first base portion 55 and the second base portion 56 via the conductive bonding material 84, for example by heating the paste and then cooling the same. In addition, through a similar process, the diodes 49U, 49V, and 49W are respectively bonded to the wirings 50A, 50B, and 50C, via the conductive bonding material 85.

Figure 28:
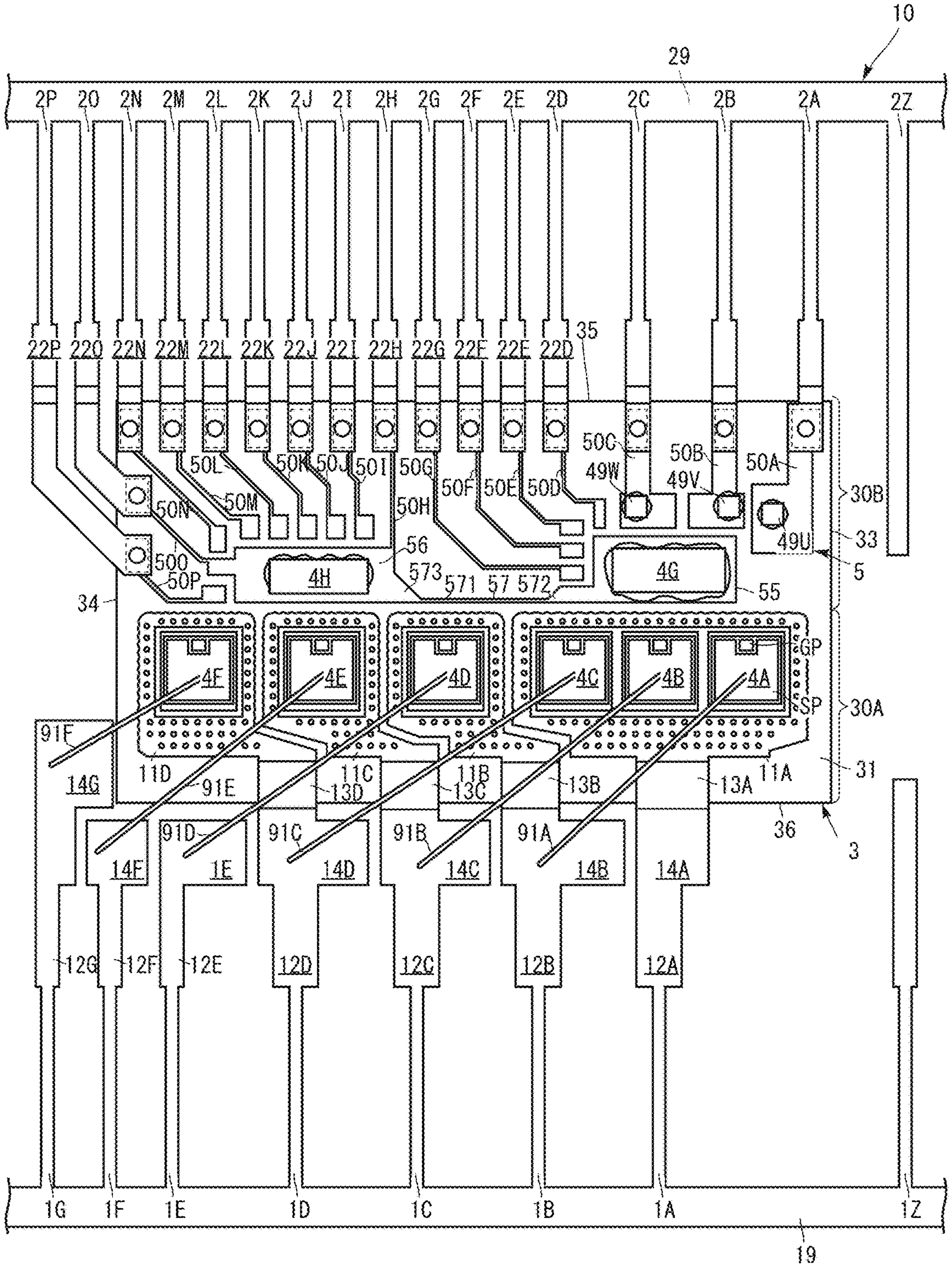
FIG. 28 is a plan view for explaining a process subsequent to FIG. 27.

In the first wire connection process (step S7), the first wires 91A to 91F are attached as shown in FIG. 28. In the illustrated example, wires formed of aluminum (Al) are sequentially attached, for example by a wedge bonding method. Thus, the first wires 91A to 91F can be obtained.

Figure 29:
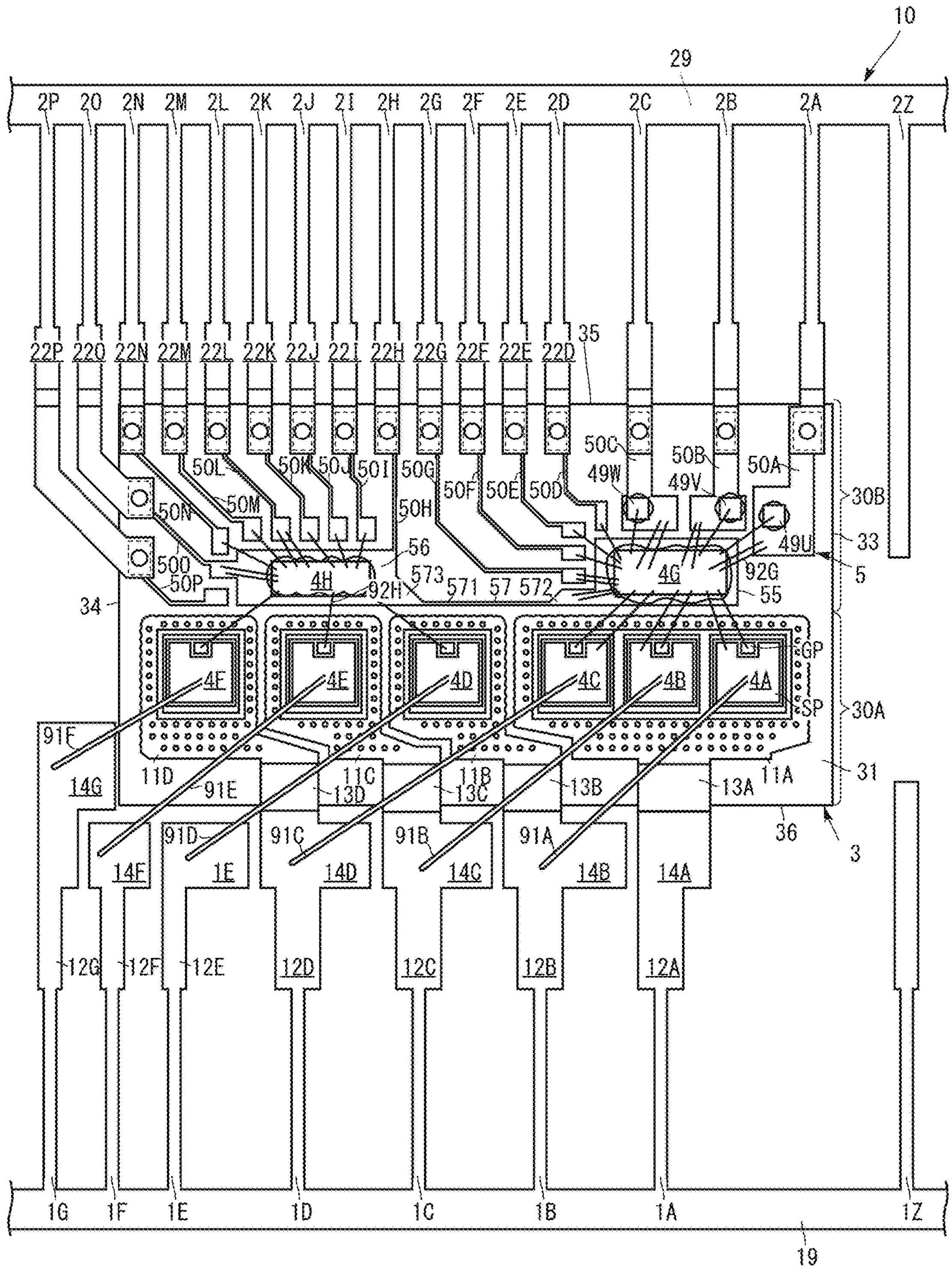
FIG. 29 is a plan view for explaining a process subsequent to FIG. 28.

In the second wire connection process (step S8), the plurality of second wires 92 are attached as shown in FIG. 29. In the illustrated example, wires formed of gold (Au) are sequentially attached, for example by a capillary bonding method. Thus, the plurality of second wires 92 can be obtained.

Figure 30:
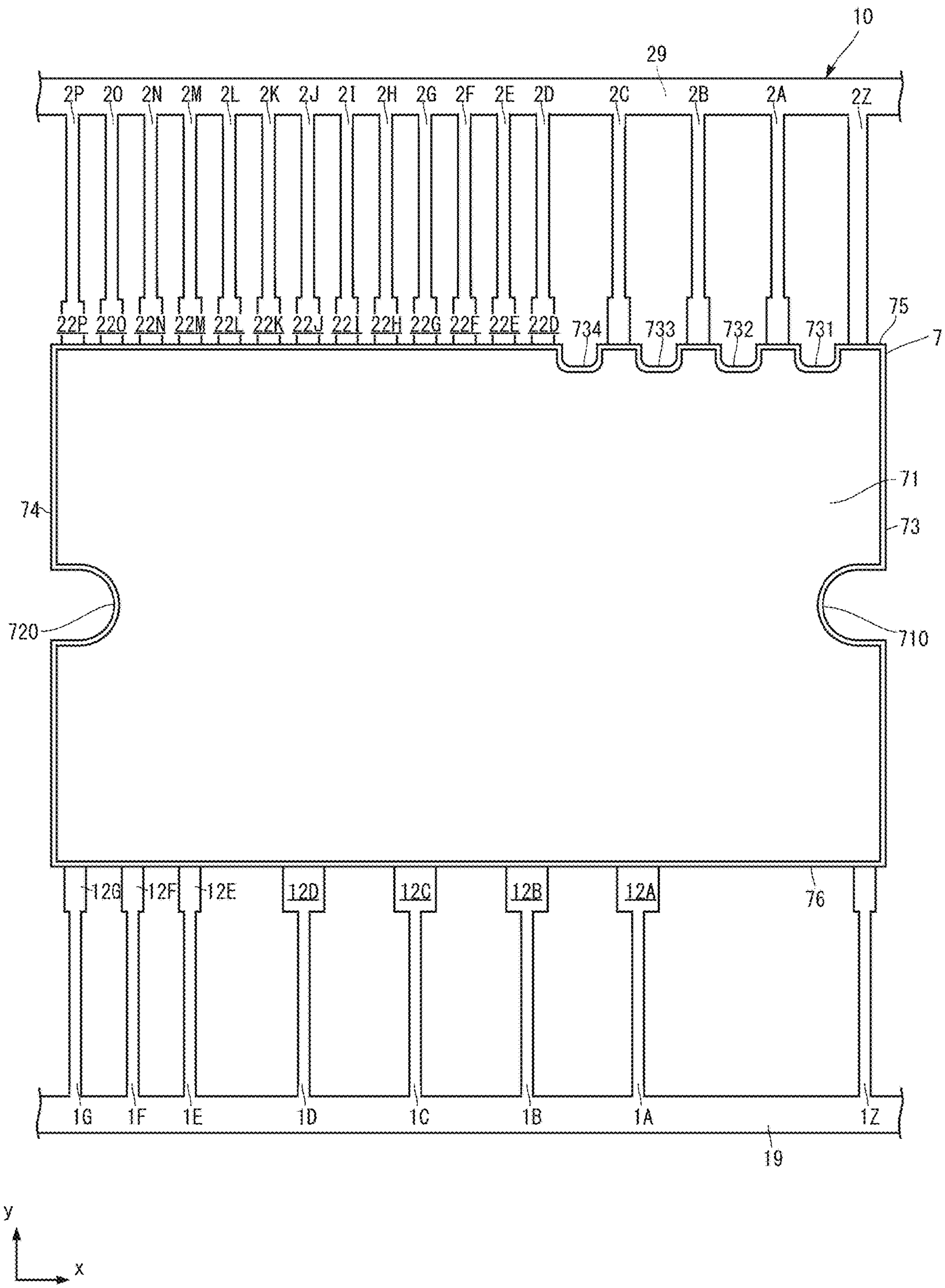
FIG. 30 is a plan view for explaining a process subsequent to FIG. 29.

In the resin formation process (step S9), for example a part of the lead frame 10, a part of the substrate 3, the semiconductor chips 4A to 4F, the control chips 4G and 4H, the diodes 49U, 49V, and 49W, the first wires 91A to 91F, and the plurality of second wires 92 are enclosed by a mold, as shown in FIG. 30. Then a resin material of a liquid phase is loaded in the space defined by the mold. Upon curing the resin material, the resin 7 can be obtained.

In the frame cutting process (step S10), portions of the lead frame 10 exposed from the resin 7 are cut, at predetermined positions. Therefore, the plurality of leads 1 and the plurality of leads 2 separated from each other. Then upon bending the plurality of leads 1 and the plurality of leads 2 if need be, the semiconductor device A1 can be obtained.

Advantageous effects of the semiconductor device A1 will now be described hereunder.

According to this embodiment, the control chips 4G and 4H are located on the conductive section 5 formed on the substrate 3. Utilizing the conductive section 5 as the conduction path to the control chips 4G and 4H allows the conduction path to be formed in a finer size and in higher density, compared with the case of employing a metal lead to form the conduction path. Therefore, the level of integration of the semiconductor device A1 can be upgraded. In addition, employing the leads 1A to 1D, which exhibit higher heat dissipation performance than the substrate 3, prevents degradation in heat dissipation performance of the semiconductor chips 4A to 4F, which may be incurred in the case of employing the substrate 3.

The bonding sections 6A to 6D are formed on the substrate 3, and the leads 1A to 1D are bonded to the substrate 3 via the bonding sections 6A to 6D. The surface of the bonding sections 6A to 6D can be finished to be smoother, compared with the surface roughness of the main surface 31 of the substrate 3, for example formed of a ceramic. Such a configuration prevents undesired appearance of a minute void in the heat conduction path from the leads 1A to 1D to the substrate 3, thereby further improving the heat dissipation performance of the semiconductor chips 4A to 4F.

Since the leads 1A to 1D are exposed from the resin 7, conduction paths from outside to the semiconductor chips 4A to 4F can be provided, and the semiconductor chips 4A to 4F can attain a higher level of heat dissipation characteristics.

The second face 32 of the substrate 3 is exposed from the resin 7. Therefore, the heat transmitted from the semiconductor chips 4A to 4F to the substrate 3 can be more efficiently released to outside.

Since the conductive section 5 and the bonding sections 6A to 6D contain the same conductive material, the conductive section 5 and the bonding sections 6A to 6D can be collectively formed on the substrate 3. Such a configuration contributes to improving the manufacturing efficiency of the semiconductor device A1.

The plurality of leads 2 are bonded to the conductive section 5 via the conductive bonding material 82. Accordingly, the plurality of leads 2 can be more firmly fixed to the substrate 3. Further, the resistance between the plurality of leads 2 and the conductive section 5 can be reduced.

As shown in FIG. 15 and FIG. 16, the clearances G23 between the adjacent ones of the leads 2D to 2N are narrower than the clearance G54 between the adjacent ones of the second portions 52D to 52N shown in FIG. 16. Therefore, the leads 2D to 2N can be located closer to each other.

The first portion 21A to the first portion 21N of the lead 2A to 2N have a rectangular shape, with the longer sides extending along the y-direction. Therefore, the clearances G21, G22, and G23 between the adjacent ones of the leads 2A to 2N can be narrowed, while an increased bonding area of the leads 2A to 2N can be secured.

The first portions 21O and 21P of the leads 2O, 2P are aligned in the y-direction, so as to overlap with the first portion 21N as viewed in the y-direction. Such a configuration allows a sufficient number of leads 2 to be secured, and yet prevents an increase in size of the substrate 3.

The control chips 4G and 4H are located between the semiconductor chips 4A to 4F and the plurality of leads 2, as viewed in the x-direction. Accordingly, the plurality of leads 2, electrically connected to the control chips 4G and 4H via the conductive section 5, can be spaced apart from the semiconductor chips 4A to 4F, to insulate the plurality of leads 2 from the semiconductor chips 4A to 4F.

The semiconductor chips 4A to 4C are directly bonded to the lead 1A via the conductive bonding material 83, the semiconductor chip 4D is directly bonded to the lead 1B via the conductive bonding material 83, the semiconductor chip 4E is directly bonded to the lead 1C via the conductive bonding material 83, and the semiconductor chip 4F is directly bonded to the lead 1D via the conductive bonding material 83. Therefore, the semiconductor chips 4A to 4F can each be electrically connected to the corresponding one of the leads 1A to 1D, and the heat of the semiconductor chips 4A to 4F can be more efficiently conducted to the leads 1A to 1D.

The semiconductor chip 4A is connected to the lead 1B via the first wire 91A. The semiconductor chip 4B is connected to the lead 1C via the first wire 91B. The semiconductor chip 4C is connected to the lead 1D via the first wire 91C. The semiconductor chip 4D is connected to the lead 1E via the first wire 91D. The semiconductor chip 4E is connected to the lead 1F via the first wire 91A. The semiconductor chip 4F is connected to the lead 10 via the first wire 91A. Such a configuration suppresses an increase in resistance, in each of the conduction paths between the leads 1B to 1G and the semiconductor chips 4A to 4F spaced therefrom.

The control chips 4G and 4H are bonded to the conductive section 5 formed on the substrate 3, via the conductive bonding material 84. Therefore, the control chips 4G and 4H can be electrically connected to the conductive section 5.

The control chip 4G is connected to the conductive section 5 via the second wire 92G, and the control chip 4H is connected to the conductive section 5 via the second wire 92H. Such a configuration allows the control chips 4G and 4H to be electrically connected to the respective portions of the conductive section 5 spaced apart from the control chips 4G and 4H.

In the case of selecting a ceramic such as alumina ($Al_2O_3$), silicon nitride (SiN), aluminum nitride (AlN), or alumina containing zirconia, to form the substrate 3, and forming the substrate 3 in a thickness of, for example, approximately 0.1 mm to 1.0 mm, the conductive section 5 and the bonding section 6 can be seen through the substrate 3, from the side of the second face 32 of the substrate 3. Therefore, after the manufacturing of the semiconductor device A1, whether the conductive section 5 or the bonding sections 6 have been unintentionally formed in an irregular shape can be visually checked from outside, without the need to disassemble the semiconductor device. Here, the material and the thickness of the substrate 3 may be selected as desired without limitation to the above, provided that the shape of at least a part of the conductive section 5 can be visually checked from outside.

Figure 31:
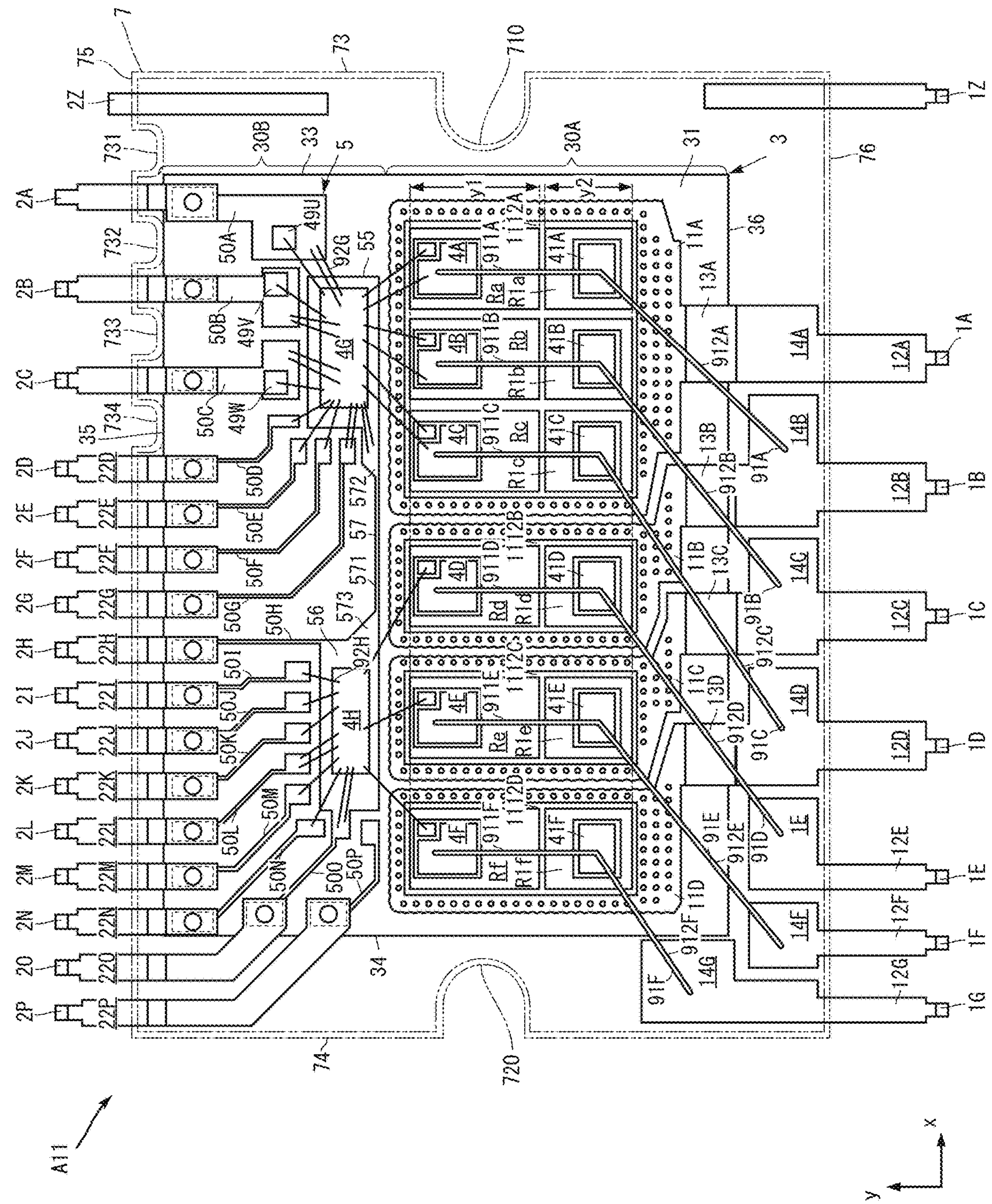
FIG. 31 is a partial plan view showing a first variation of the semiconductor device according to the first embodiment of the present disclosure.

FIG. 31 and the subsequent drawings illustrate variations and other embodiments of the present disclosure. In these drawings, elements that are the same as or similar to those of the foregoing embodiment are given the same numeral as in the mentioned embodiment.

First Variation of First Embodiment

FIG. 31 illustrates a first variation of the semiconductor device A1. A semiconductor device A11 according to this variation is different from the foregoing embodiment, in the configuration of the semiconductor chips 4A to 4F. In addition, the semiconductor device A11 includes diodes 41A to 41F.

<Semiconductor Chips 4A to 4F>

Figure 32:
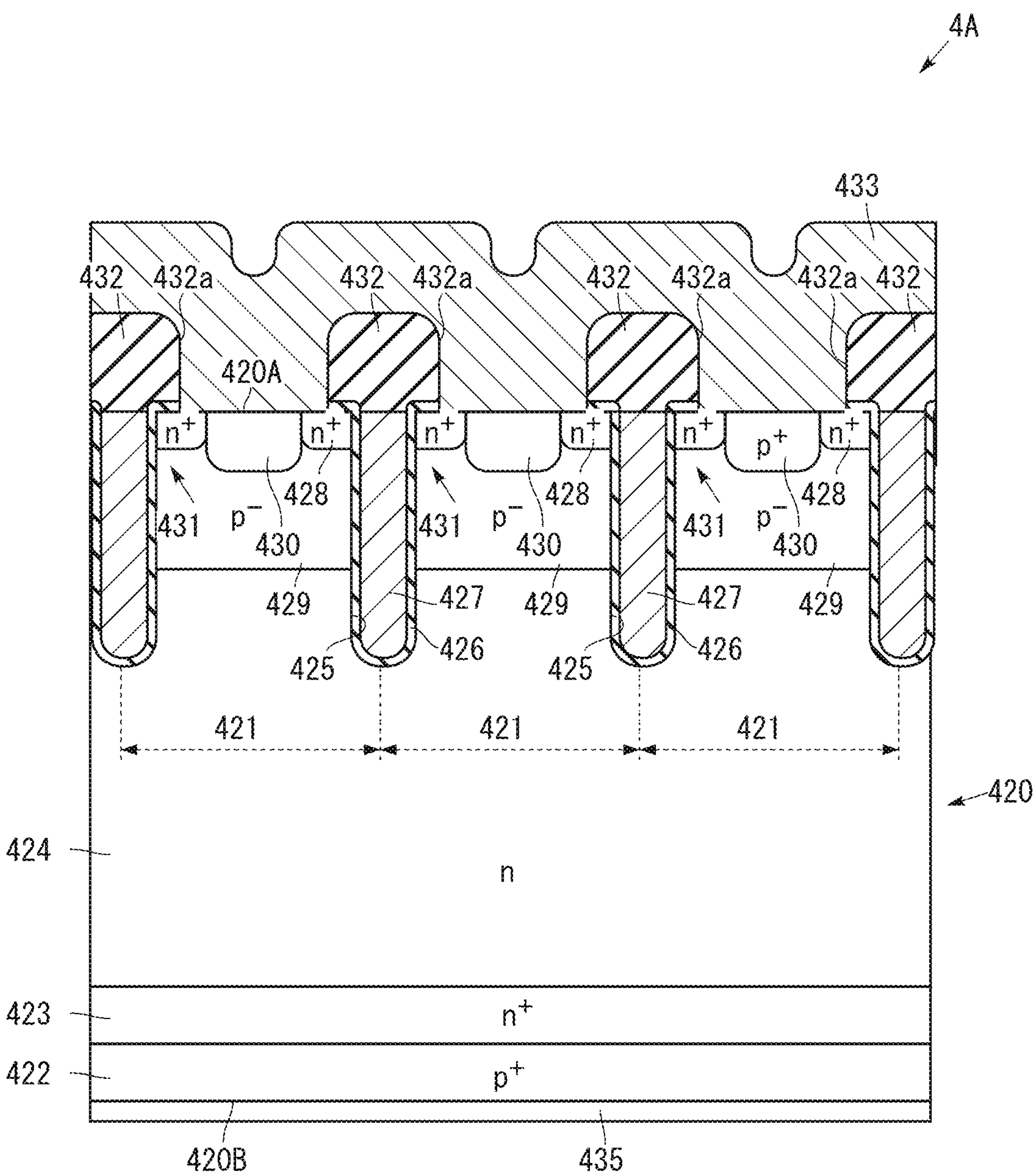
FIG. 32 is an enlarged partial cross-sectional view of a semiconductor chip of the first variation of the semiconductor device according to the first embodiment of the present disclosure.

In this variation, the semiconductor chips 4A to 4F are a transistor configured as an IGBT. FIG. 32 illustrates an example of the detailed configuration of the semiconductor chip 4A. The semiconductor chips 4A to 4F have the same configuration as each other. Therefore, the configuration of the semiconductor chip 4A will be described hereunder, and the description of the remaining semiconductor chips 4B to 4F will be omitted. The configuration of the semiconductor chips 4A to 4F is not limited to the example shown in FIG. 32, but may be modified in various manners.

The semiconductor chip 4A according to this variation is a trench gate-type IGBT. The semiconductor chip 4A includes an n-type semiconductor substrate 420. The semiconductor substrate 420 is for example a silicon substrate, and includes a front surface 420A and a back surface 420B on the opposite side of the front surface 420A. A unit cell 421, constituting a part of the semiconductor chip 4A, is fabricated on the front surface region of the semiconductor substrate 420.

The semiconductor substrate 420 includes a $P^+$-type collector region 422, an $n^+$-type buffer region 423, and an n-type drift region 424, in this order from the side of the back surface 420B. The collector region 422 and the buffer region 423 are formed in the back surface region of the semiconductor substrate 420. The collector region 422 is exposed from the back surface 420B of the semiconductor substrate 420. The collector region 422 contains boron (B) as the p-type impurity. The buffer region 423 is formed on the collector region 422, in contact therewith. The drift region 424 is formed from a part of the semiconductor substrate 420. A part of the drift region 424 is exposed from the front surface 420A of the semiconductor substrate 420 (not shown). The buffer region 423 and the drift region 424 each contain one of phosphor (P), arsenic (As), and antimony (Sb), as the n-type impurity.

A plurality of gate trenches 425 are formed in the front surface region of the semiconductor substrate 420, at predetermined intervals between each other. The gate trenches 425 are each formed so as to penetrate through a base region 429, and include a bottom portion located in the drift region 424. A gate electrode 427 is filled in each of the gate trenches 425, via a gate insulation film 426. On the lateral faces of the plurality of gate trenches 425, an $n^+$-type emitter region 428, the $p^-$-type base region 429, and the drift region 424 are formed in this order, from the side of the front surface 420A toward the back surface 420B of the semiconductor substrate 420.

The base region 429 is shared by one of the gate trenches 425 and another gate trench 425. The emitter region 428 is formed along the lateral face on one side and the opposite side of each gate trench 425, so as to be exposed from the front surface 420A of the semiconductor substrate 420. The emitter region 428 contains one of phosphor (P), arsenic (As), and antimony (Sb), as the n-type impurity. A $p^+$-type contact region 430 is formed in the front surface region of the base region 429, so as to be interposed between the emitter regions 428. The base region 429 and the contact region 430 contain boron (B), as the p-type impurity.

A region in the base region 429 between the emitter region 428 and the drift region 424 serves as a channel region 431, so that a plurality of unit cells 421, constituting a part of the semiconductor chip 4A, are formed. The unit cell 421 is defined as a region between the center line of one gate trench 425 and the center line of another gate trench 425.

An insulation film 432, for example formed of silicon dioxide ($SiO_2$), is provided on the front surface 420A of the semiconductor substrate 420, so as to cover the gate trench 425. The insulation film 432 includes a contact hole 432*a* for exposing a part of the emitter region 428, and the contact region 430. An emitter electrode 433, for example formed of Ti/TiN, is provided on the insulation film 432. The emitter electrode 433 enters into the contact hole 432*a* from the insulation film 432, to be electrically connected to the emitter region 428 and the contact region 430, inside the contact hole 432*a*.

A collector electrode 435, for example formed of aluminum (AlSiCu, AlCu, or the like), is provided on the side of the back surface 4203 of the semiconductor substrate 420. The collector electrode 435 is electrically connected to the collector region 422.

<Diodes 41A to 41F>

Figure 33:
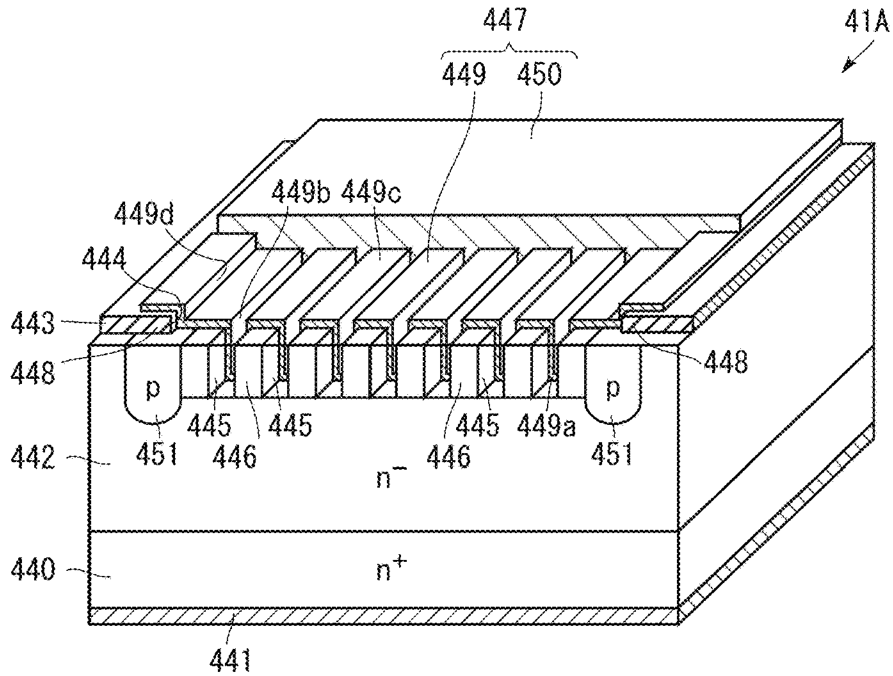
FIG. 33 is an enlarged partial perspective view of a diode of the first variation of the semiconductor device according to the first embodiment of the present disclosure.
Figure 34:
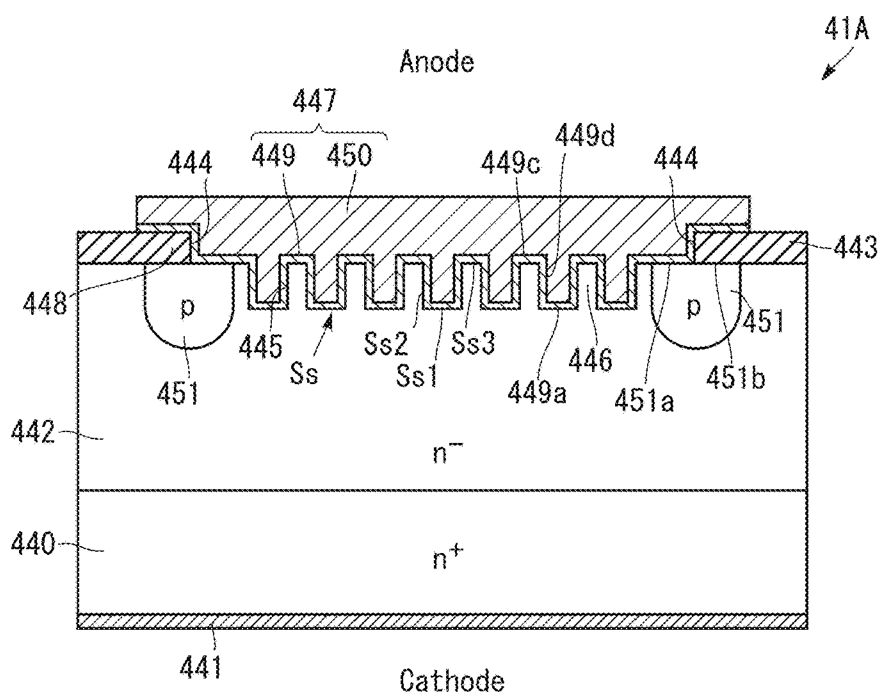
FIG. 34 is an enlarged partial cross-sectional view of the diode of the first variation of the semiconductor device according to the first embodiment of the present disclosure.

Referring to FIG. 33 and FIG. 34, an example of the detailed configuration of the diodes 41A to 41F will be described. The diodes 41A to 46F have the same configuration as each other. Therefore, the configuration of the diode 46A will be described hereunder, and the description of the remaining diodes 46E to 46F will be omitted. The configuration of the diodes 41A to 46F is not limited to the example shown in FIG. 33 and FIG. 34, but may be modified in various manners.

The diode 41A includes an $n^+$-type silicon substrate 440 (with n-type impurity concentration of, for example, 1e18 to 1e21 $cm^{-3}$). A cathode electrode 441 is formed so as to cover the entirety of the back surface of the silicon substrate 440. The cathode electrode 441 is formed of a metal that makes an ohmic contact with n-type silicon (e.g., gold (Au), nickel (Ni), silicide, or cobalt (Co) silicide).

An $n^-$-type epitaxial layer 442 (semiconductor layer), lower in concentration than the silicon substrate 440 (with n-type impurity concentration of, for example, 1e15 to 1e17 $cm^{-3}$), is stacked on the surface of the silicon substrate 440. The thickness of the epitaxial layer 442 is, for example, 2 μm to 20 μm.

A field insulation film 443, for example formed of silicon dioxide ($SiO_2$), is stacked on the surface of the epitaxial layer 442. The thickness of the field insulation film 443 is, for example, equal to or thicker than 1000 Å, preferably 7000 Å to 40000 Å. Here the, field insulation film 443 may be formed of other insulative materials, such as silicon nitride (SiN).

The field insulation film 443 includes an opening 444, in which the central region of the epitaxial layer 442 is exposed. A plurality of trenches 445 are formed in the superficial portion of the central region of the epitaxial layer 442, so as to recede from the surface of the epitaxial layer 442. Each of the trenches 445 is a vertical groove extending in a predetermined direction. The bottom face of the trench 445 is planar, along the surface of the epitaxial layer 442. Accordingly, the cross-section of the trench 445 has a generally rectangular shape. In this embodiment, seven trenches 445 extend in parallel, at predetermined intervals. In other words, the seven trenches 445 are formed in a stripe pattern, in a plan view.

In the superficial portion of the epitaxial layer 442, a mesa portion 446 is formed in a region between the trenches 445 adjacent to each other. When the trench 445 has a cross-section of a generally rectangular shape, accordingly the mesa portion 446 also has a cross-section of a generally rectangular shape. The mesa portions 446 each include a pair of side walls (side walls of the trench 445) erected generally vertically from the end of the respective bottom faces of two trenches 445 adjacent to each other, and a top face (surface of the epitaxial layer 442) connecting the pair of side walls.

An anode electrode 447 is formed on the epitaxial layer 442. The anode electrode 447 is completely filled in the opening 444 of the field insulation film 443, and protrudes outwardly from the opening 444, so as to cover the peripheral edge 448 of the opening 444 in the field insulation film 443. In other words, the peripheral edge 448 of the field insulation film 443 is interposed between the epitaxial layer 442 and the anode electrode 447 from the upper and lower sides, along the entire circumference. The protruding range of the anode electrode 447, covering the peripheral edge 448 of the field insulation film 443, from the end portion of the opening 444 of the field insulation film 443 is, for example, equal to or wider than 10 μm, preferably 10 μm to 100 μm.

The anode electrode 447 has a multilayer structure (in this embodiment, two-layer structure), including a Schottky metal 449 bonded to the epitaxial layer 442 in the opening 444 of the field insulation film 443, and a contact metal 450 stacked on the Schottky metal 449.

The Schottky metal 449 is formed of a metal that forms a Schottky junction upon being bonded to an N-type silicon (e.g., titanium (Ti), molybdenum (Mo), palladium (Pd), and so forth). The Schottky metal 449 according to this embodiment is formed of titanium. The Schottky metal 449 is formed in contact with the surface of the epitaxial layer 442, including the inner wall (bottom face and a pair of side walls) of the trench 445. Accordingly, the Schottky metal 449 is in contact with the surface of the epitaxial layer 442, along the inner wall of all the trenches 445, and outside the trenches 445. In addition, the Schottky metal 449 covers the entirety of the inner wall of each of the trenches 445, and continuously extends outwardly of the trench 445. Thus, the Schottky metal 449 is bonded to the surface of the epitaxial layer 442 exposed in the opening 444 of the field insulation film 443, so as to cover the entirety of the mentioned surface. The Schottky metal 449 according to this embodiment includes bottom faces 449*a* each formed in contact with the bottom face of the trench 445, side faces 449*b* each formed in contact with the side wall of the trench 445 (side wall of the mesa portion 446), and top faces 449*c* each formed in contact with the top face of the mesa portion 446.

In this case, as indicated by bold lines in FIG. 34, the interface S between the Schottky metal 449 and the surface of the epitaxial layer 442 (Schottky interface) has an uneven cross-section, inside the opening 444 of the field insulation film 443. Accordingly, the area of the Schottky interface Ss is larger than the apparent area of the epitaxial layer 442, in a plan view of the surface of the epitaxial layer 442 (horizontal portion in FIG. 34) along the normal direction thereof. More specifically, the Schottky interface Ss includes bottom faces Ss1 each formed in contact with the bottom face of the trench 445, side faces Ss2 each formed in contact with the side wall of the trench 445 (side wall of the mesa portion 446), and top faces Ss3 each formed in contact with the top face of the mesa portion 446. When the trenches 445 each have a generally rectangular shape, the area of the Schottky interface Ss can be increased by an amount corresponding to the side faces Ss2, compared with the case where the trenches 445 are not provided.

The Schottky metal 449 bonded to the epitaxial layer 442 forms a Schottky barrier (potential barrier) of 0.52 eV to 0.9 eV for example, against the silicon semiconductor constituting the epitaxial layer 442. The thickness of the Schottky metal 449 according to this embodiment is 0.02 μm to 0.2 μm.

The contact metal 450 is a portion of the anode electrode 447 exposed on the outermost surface of the diode 41A, to which the first wire 91A is connected. In other words, the contact metal 450 serves as the anode electrode pad of the diode 41A. The contact metal 450 is, for example, formed of aluminum (Al). In this embodiment, the thickness of the contact metal 450 is, for example, 0.5 μm to 5 μm. The contact metal 450 is filled in each of the trenches 445, in contact with the Schottky metal 449 covering the inner wall of the trenches 445. Thus, the contact metal 450 is in contact with the bottom face 449*a*, the pair of side faces 449*b*, and the top face 449*c* of the Schottky metal 449. Accordingly, the contact metal 450 is formed so as to have an uneven cross-section, on the side in contact with the Schottky metal 449 in the trenches 445. The surface of the contact metal 450 on the opposite side of the Schottky metal 449 is formed in a planar shape, along the surface of the epitaxial layer 442 (except the inner wall of the trenches 445).

When the Schottky metal 449 is formed of titanium, it is preferable that a titanium nitride (TiN) layer is interposed between the Schottky metal 449 and the contact metal 450, which is formed of aluminum. The titanium nitride layer serves as a barrier layer that bonds the titanium of the Schottky metal 449 and the aluminum of the contact metal 450 together, and secures conduction between the titanium and the aluminum, and further suppresses mutual diffusion of the titanium and the aluminum. The barrier layer suppresses or prevents the diffusion of the material of the contact metal 450 to the Schottky metal 449, to thereby protect the Schottky interface Ss.

A surface cover film (not shown) may be formed on the outermost surface of the diode 41A. In this case, it is preferable to form an opening for exposing the contact metal 450, at a central region of the surface cover film. The first wire 91A is connected to the contact metal 450, through this opening.

A guard ring 451, formed of a p-type diffusion layer, is provided in the superficial portion of the epitaxial layer 442, in contact with the Schottky metal 449. The guard ring 451 is formed along the contour of the opening 444 of the field insulation film 443, so as to cover both the outer and inner sides of the opening 444, in a plan view. Accordingly, the guard ring 451 includes an inner portion 451*a* extending inwardly of the opening 444 of the field insulation film 443, and contacting an outer edge 449*d*, corresponding to the extremity of the portion of the Schottky metal 449 located inside the opening 444, and an outer portion 451*b* extending outwardly of the opening 444, and opposed to the anode electrode 447 (Schottky metal 449 on the peripheral edge 448), via the peripheral edge 448 of the field insulation film 443. The depth of the guard ring 451 from the surface of the epitaxial layer 442 is, for example, 0.5 μm to 8 μm.

The guard ring 451, formed over the outer and inner sides of the opening 444 of the field insulation film 443, covers the boundary between the peripheral edge 448 of the field insulation film 443 and the Schottky metal 449, from the side of the epitaxial layer 442. Without the guard ring 451, the electric field concentrates at the boundary when a reverse bias is applied to the diode 41A, and therefore leakage is prone to be incurred. Because of the presence of the guard ring 451 covering the mentioned boundary in the diode 41A, the depletion layer spreading from the guard ring 451 when the reverse bias is applied mitigates the concentration of the electric field, to thereby suppress the leakage. Consequently, the withstand voltage of the diode 41A is improved.

In this variation, as shown in FIG. 31, the main surface 111A includes three first regions Ra, Rb, and Rc, and three second regions R1*a*, R1*b*, and R1*c*, defined by the groove 1112A. The three first regions Ra, Rb, and Rc are located on the side of the lead 2, in the y-direction. The shape of the three first regions Ra, Rb, and Rc is not specifically limited. In the illustrated example, the mentioned regions have an elongate rectangular shape having the long sides extending along the y-direction, as viewed in the z-direction. The three first regions Ra, Rb, and Rc overlap with each other as viewed in the x-direction. In the illustrated example, further, the three first regions Ra, Rb, and Rc generally coincide with each other, as viewed in the x-direction. Here, the expression “generally coincide” as viewed in the x-direction refers to, for example, exactly coinciding with each other, or being deviated by within ±5% of the characteristic size (size of the first region Ra, Rb, or Rc in the y-direction).

The second regions R1*a*, R1*b*, and R1*c* are located on the opposite side of the lead 2 with respect to the first regions Ra, Rb, and Rc, in the y-direction. The shape of the three second regions R1*a*, R1*b*, and R1*c* is not specifically limited. In the illustrated example, the mentioned regions have a rectangular shape, as viewed in the z-direction. The three second regions R1*a*, R1*b*, and R1*c* overlap with each other, as viewed in the x-direction. In the illustrated example, further, the three second regions R1*a*, R1*b*, and R1*c* generally coincide with each other, as viewed in the x-direction. Here, the expression “generally coincide” as viewed in the x-direction refers to, for example, exactly coinciding with each other, or being deviated by within ±5% of the characteristic size (size of the second region R1*a*, R1*b*, or R1*c* in the y-direction).

The sizes of the three first regions Ra, Rb, and Rc, and the three second regions R1*a*, R1*b*, and R1*c*, are not specifically limited. In the illustrated example, a size y1 of the first regions Ra, Rb, and Rc in the y-direction is larger than a size y2 of the second regions R1*a*, R1*b*, and R1*c* in the y-direction.

The main surface 111E includes a first region Rd and a second region R1*d*, defined by the groove 1112B. The first region Rd is located on the side of the lead 2, in the y-direction. The shape of the first region Rd is not specifically limited. In the illustrated example, the first region Rd has an elongate rectangular shape having the long sides extending along the y-direction, as viewed in the z-direction. The second region R1*d* is located on the opposite side of the lead 2 with respect to the first region Rd, in the y-direction. The shape of the second region R1*d* is not specifically limited. In the illustrated example, the second region R1*d* has a rectangular shape, as viewed in the z-direction.

The main surface 111C includes a first region Re and a second region R1*e*, defined by the groove 1112C. The first region Re is located on the side of the lead 2, in the y-direction. The shape of the first region Re is not specifically limited. In the illustrated example, the first region Re has an elongate rectangular shape having the long sides extending along the y-direction, as viewed in the z-direction. The second region R1*e* is located on the opposite side of the lead 2 with respect to the first region Re, in the y-direction. The shape of the second region R1*e* is not specifically limited. In the illustrated example, the second region R1*e* has a rectangular shape, as viewed in the z-direction.

The main surface 111D includes a first region Rf and a second region R1*f*, defined by the groove 1112D. The first region Rf is located on the side of the lead 2, in the y-direction. The shape of the first region Rf is not specifically limited. In the illustrated example, the first region Rf has an elongate rectangular shape having the long sides extending along the y-direction, as viewed in the z-direction. The second region R1*f* is located on the opposite side of the lead 2 with respect to the first region Rf, in the y-direction. The shape of the second region R1*f* is not specifically limited. In the illustrated example, the second region R1*f* has a rectangular shape, as viewed in the z-direction.

The three first regions Rd, Re, and Rf overlap with each other, as viewed in the x-direction. In addition, in the illustrated example, the three first regions Rd, Re, and Rf generally coincide with each other, as viewed in the x-direction. Here, the expression "generally coincide" as viewed in the x-direction refers to, for example, exactly coinciding with each other, or being deviated by within ±5% of the characteristic size (size of the first region Rd, Re, or Rf in the y-direction). The three second regions R1*d*, R1*e*, and R1*f* overlap with each other, as viewed in the x-direction. In the illustrated example, further, the three second regions R1*d*, R1*e*, and R1*f* generally coincide with each other, as viewed in the x-direction. Here, the expression "generally coincide" as viewed in the x-direction refers to, for example, exactly coinciding with each other, or being deviated by within ±5% of the characteristic size (size of the second region R1*d*, R1*e*, or R1*f* in the y-direction).

The sizes of the three first regions Rd, Re, and Rf and the three second regions R1*d*, R1*e*, and R1*f* are not specifically limited. In the illustrated example, the size y1 of the first regions Rd, Re, and Rf in the y-direction is larger than the size y2 of the second regions R1*d*, R1*e*, and R1*f* in the y-direction.

In this variation, the semiconductor chip 4A is located on the first region Ra. The semiconductor chip 4B is located on the first region Rb. The semiconductor chip 4C is located on the first region Rc. The diode 41A is mounted on the second region R1*a*. The diode 41B is mounted on the second region R1*b*. The diode 41C is mounted on the second region R1*c*. In the illustrated example, the semiconductor chip 4A is mounted at a position on the side of the lead 2, with respect to the center of the first region Ra in the y-direction. The semiconductor chip 4B is mounted at a position on the side of the lead 2, with respect to the center of the first region Rb in the y-direction. The semiconductor chip 4C is mounted at a position on the side of the lead 2, with respect to the center of the first region Rc in the y-direction. The diode 41A is mounted at a position on the opposite side of the lead 2, with respect to the center of the second region R1*a* in the y-direction. The diode 41B is mounted at a position on the opposite side of the lead 2, with respect to the center of the second region R1*b* in the y-direction. The diode 41C is mounted at a position on the opposite side of the lead 2, with respect to the center of the second region R1*c* in the y-direction.

The collector electrode of the semiconductor chip 4A and the cathode electrode of the diode 41A are connected to each other, via the first portion 11A and the conductive bonding material 83. The collector electrode of the semiconductor chip 48 and the cathode electrode of the diode 41B are connected to each other, via the first portion 11A and the conductive bonding material 83. The collector electrode of the semiconductor chip 4C and the cathode electrode of the diode 41C are connected to each other, via the first portion 11A and the conductive bonding material 83.

In this variation, the first wire 91A includes a first portion 911A and a second portion 912A, each of which will be described hereunder. An end of the first portion 911A is connected to the emitter electrode of the semiconductor chip 4A, and the other end is connected to the anode electrode of the diode 41A. In the illustrated example, the first portion 911A extends along the y-direction. An end of the second portion 912A is connected to the anode electrode of the diode 41A, and the other end is connected to the fourth portion 14B of the lead 1B. In the illustrated example, the second portion 912A is inclined with respect to the x-direction and the y-direction.

In this variation, the first wire 91B includes a first portion 911B and a second portion 912B, each of which will be described hereunder. An end of the first portion 911B is connected to the emitter electrode of the semiconductor chip 4B, and the other end is connected to the anode electrode of the diode 41B. In the illustrated example, the first portion 911B extends along the y-direction. An end of the second portion 912B is connected to the anode electrode of the diode 41B, and the other end is connected to the fourth portion 14C of the lead 1C. In the illustrated example, the second portion 912B is inclined with respect to the x-direction and the y-direction.

In this variation, the first wire 91C includes a first portion 911C and a second portion 912C, each of which will be described hereunder. An end of the first portion 911C is connected to the emitter electrode of the semiconductor chip 4C, and the other end is connected to the anode electrode of the diode 41C. In the illustrated example, the first portion 911C extends along the y-direction. An end of the second portion 912C is connected to the anode electrode of the diode 41C, and the other end is connected to the fourth portion 14D of the lead 1D. In the illustrated example, the second portion 912C is inclined with respect to the x-direction and the y-direction.

In this variation, the gate electrode of the semiconductor chip 4A and the control chip 4G are connected via the second wire 92G, and the emitter electrode of the semiconductor chip 4A and the control chip 4G are connected via the second wire 92G.

In this variation, the gate electrode of the semiconductor chip 4B and the control chip 4G are connected via the second wire 92G, and the emitter electrode of the semiconductor chip 4B and the control chip 4G are connected via the second wire 92G.

In this variation, the gate electrode of the semiconductor chip 4C and the control chip 4G are connected via the second wire 92GG, and the emitter electrode of the semiconductor chip 4C and the control chip 4G are connected via the second wire 92.

In this variation, the gate electrode of the semiconductor chip 4D and the control chip 4H are connected via the second wire 92H. The gate electrode of the semiconductor chip 4E and the control chip 4H are connected via the second wire 92H. The gate electrode of the semiconductor chip 4F and the control chip 4H are connected via the second wire 92H.

The collector electrode of the semiconductor chip 4D and the cathode electrode of the diode 41D are connected to each other, via the first portion 11B and the conductive bonding material 83. The collector electrode of the semiconductor chip 4E and the cathode electrode of the diode 41E are connected to each other, via the first portion 11C and the conductive bonding material 83. The collector electrode of the semiconductor chip 4F and the cathode electrode of the diode 41F are connected to each other, via the first portion 11D and the conductive bonding material 83.

In this variation, the first wire 91D includes a first portion 911D and a second portion 912D, each of which will be described hereunder. An end of the first portion 911D is connected to the emitter electrode of the semiconductor chip 4D, and the other end is connected to the anode electrode of the diode 41D. In the illustrated example, the first portion 911D extends along the y-direction. An end of the second portion 912D is connected to the anode electrode of the diode 41D, and the other end is connected to the fourth portion 14E of the lead 1E. In the illustrated example, the second portion 912D is inclined with respect to the x-direction and the y-direction.

In this variation, the first wire 91E includes a first portion 911E and a second portion 912E, each of which will be described hereunder. An end of the first portion 911E is connected to the emitter electrode of the semiconductor chip 4E, and the other end is connected to the anode electrode of the diode 41E. In the illustrated example, the first portion 911E extends along the y-direction. An end of the second portion 912E is connected to the anode electrode of the diode 41E, and the other end is connected to the fourth portion 14F of the lead 1F. In the illustrated example, the second portion 912E is inclined with respect to the x-direction and the y-direction.

In this variation, the first wire 91F includes a first portion 911F and a second portion 912F, each of which will be described hereunder. An end of the first portion 911F is connected to the emitter electrode of the semiconductor chip 4F, and the other end is connected to the anode electrode of the diode 41F. In the illustrated example, the first portion 911F extends along the y-direction. An end of the second portion 912F is connected to the anode electrode of the diode 41F, and the other end is connected to the fourth portion 14G of the lead 1G. In the illustrated example, the second portion 912F is inclined with respect to the x-direction and the y-direction.

Second Embodiment

Referring to FIG. 35 to FIG. 57, a semiconductor device according to a second embodiment of the present disclosure will be described. The semiconductor device A2 according to this embodiment includes a plurality of leads 1, a plurality of leads 2, a substrate 3, a plurality of semiconductor chips 4, a diode 41, a plurality of control chips 4, a transmission circuit chip 4I, a primary-side circuit chip 4J, a plurality of diodes 49, a conductive section 5, a plurality of bonding sections 6, a plurality of first wires 91, a plurality of second wires 92, a plurality of third wires 93, a plurality of fourth wires 94, a plurality of fifth wires 95, a plurality of sixth wires 96, a plurality of seventh wires 97, and an encapsulating resin 7.

The semiconductor device A2 according to this embodiment is different from the semiconductor device A1 according to the first embodiment, in further including a transformer 690, in the locations of the plurality of leads 1 and the plurality of leads 2, and in the configuration of the conductive section 5. In the description of this embodiment, the similar elements to those of the first embodiment will be given the same numeral, and a part or the whole of the description thereof may be omitted.

Figure 35:
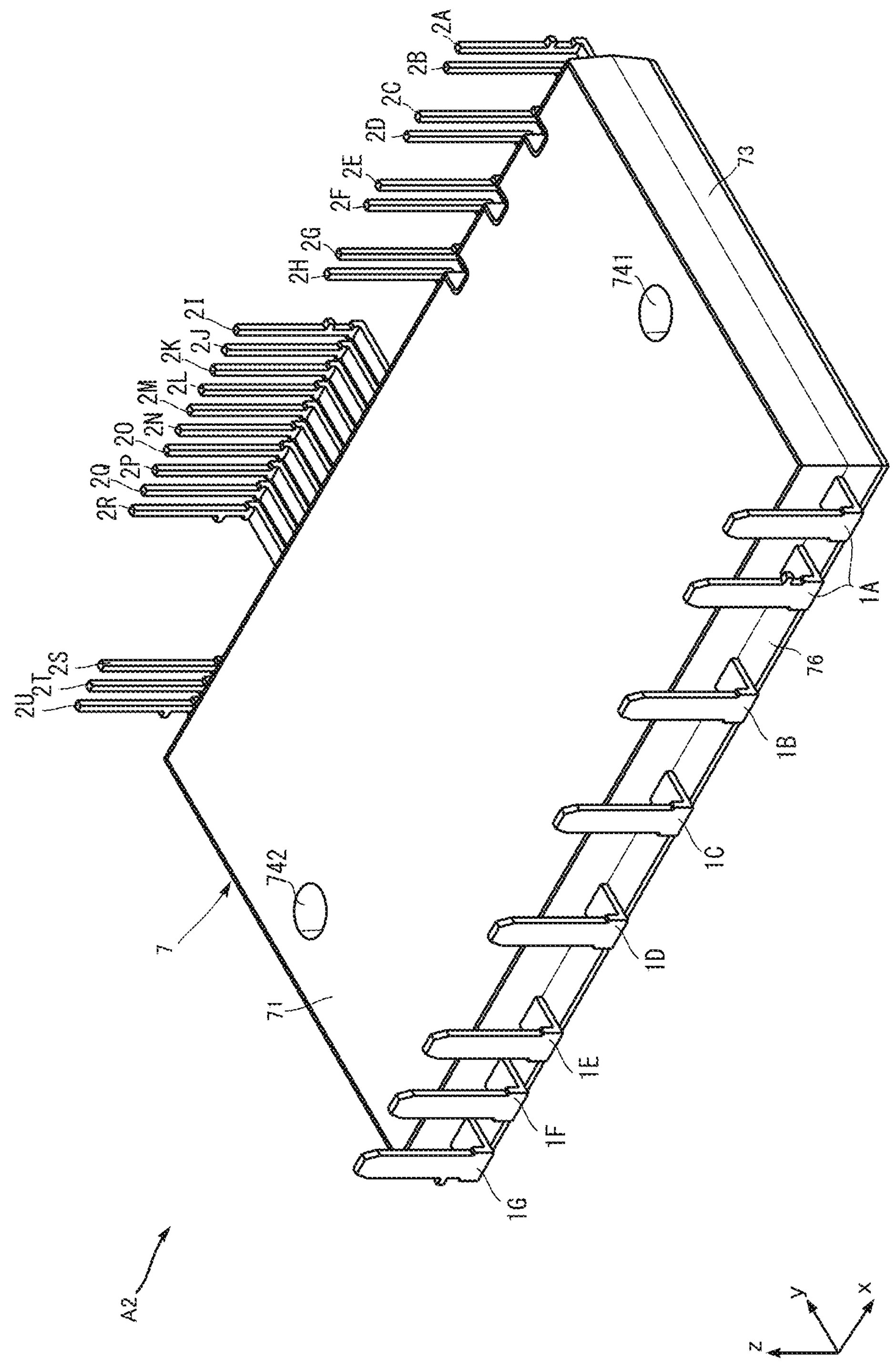
FIG. 35 is a perspective view showing a semiconductor device according to a second embodiment of the present disclosure.
Figure 36:
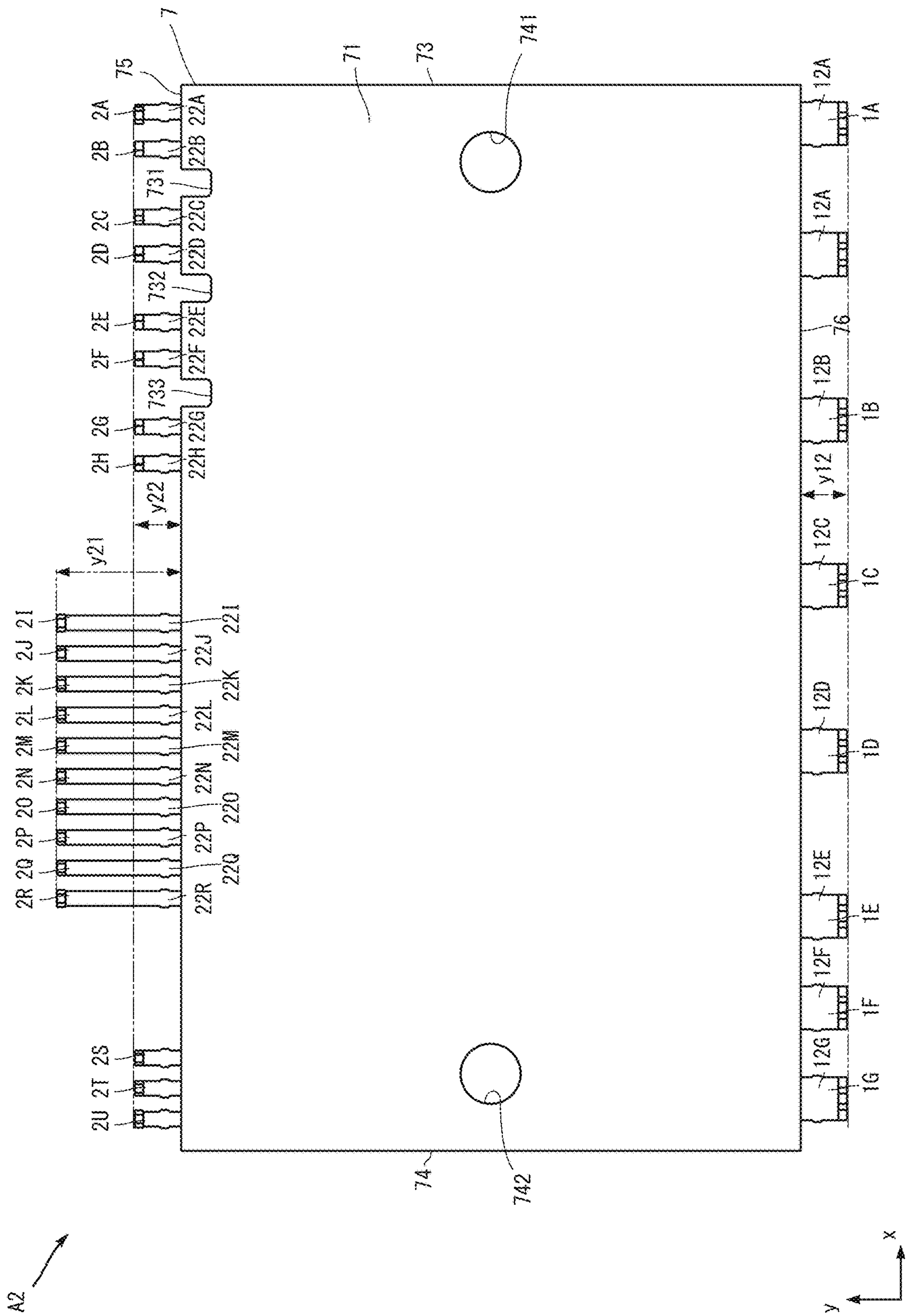
FIG. 36 is a plan view showing the semiconductor device according to the second embodiment of the present disclosure.
Figure 37:
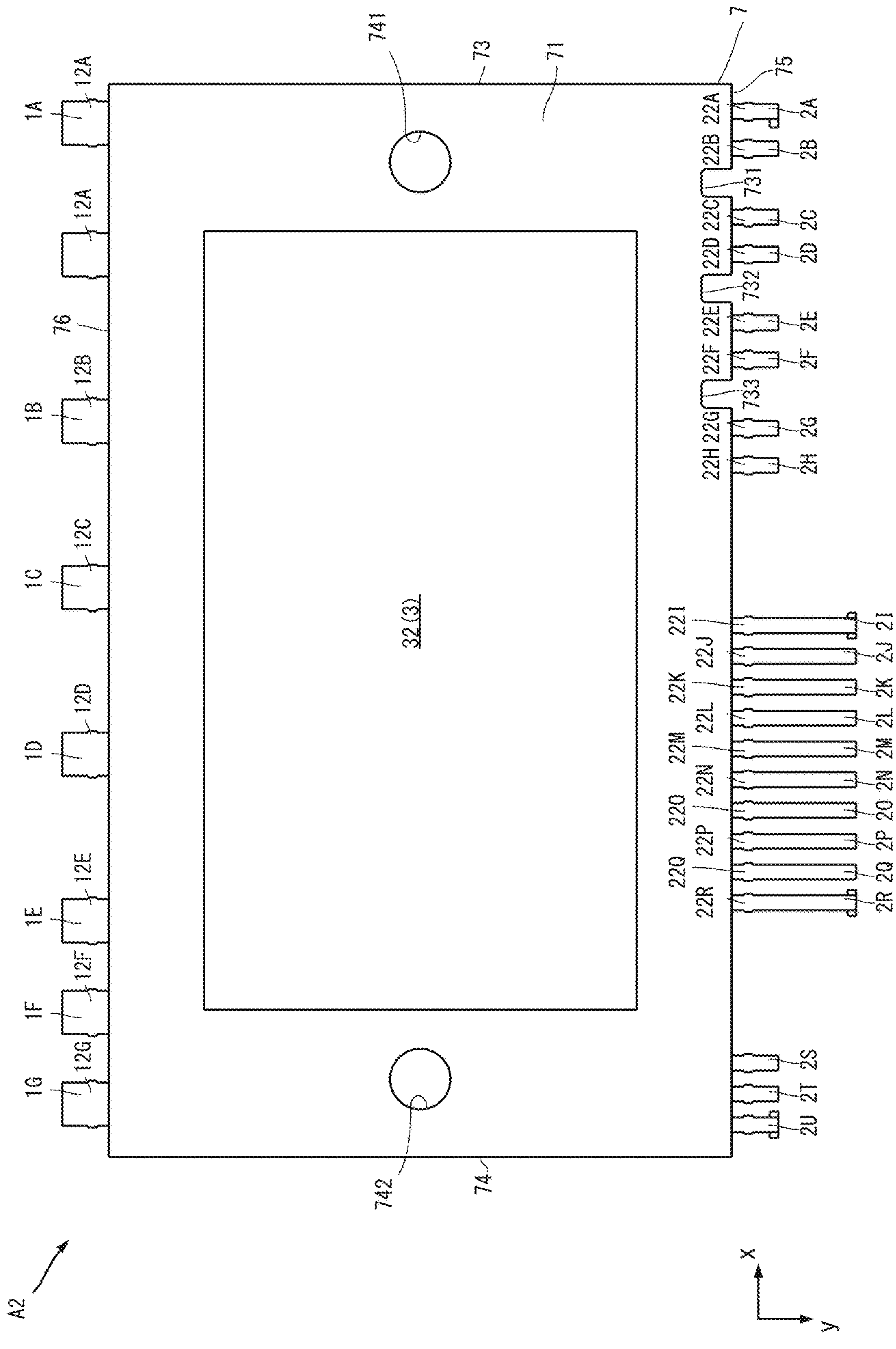
FIG. 37 is a bottom view showing the semiconductor device according to the second embodiment of the present disclosure.
Figure 38:
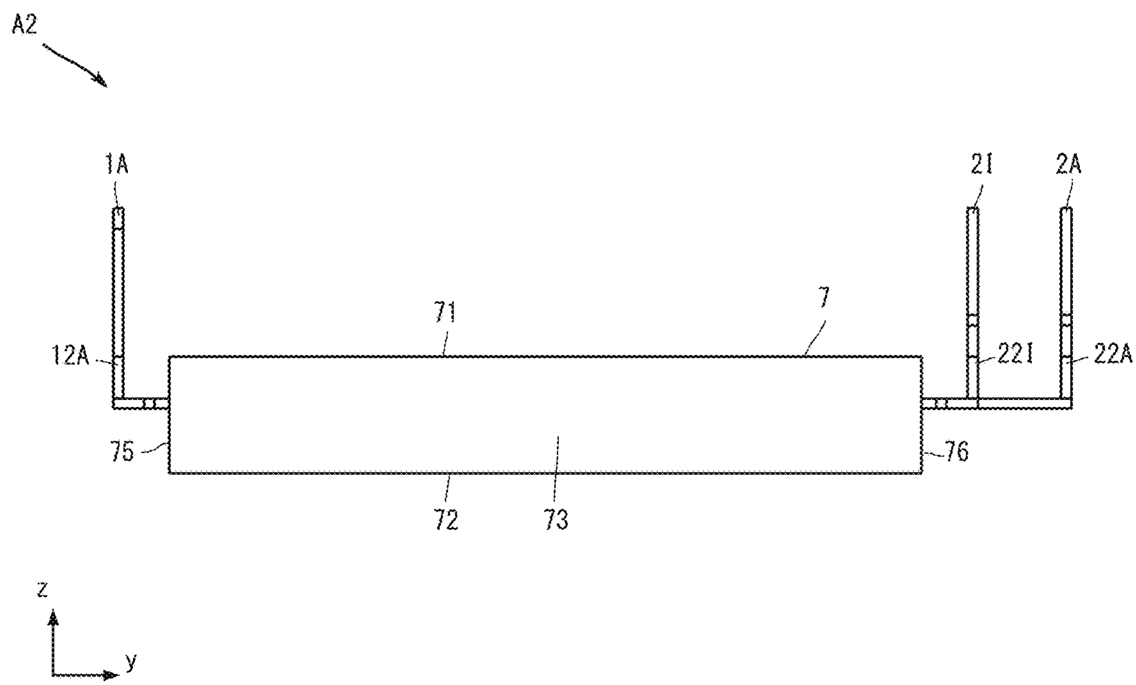
FIG. 38 is a side view showing the semiconductor device according to the second embodiment of the present disclosure.
Figure 39:
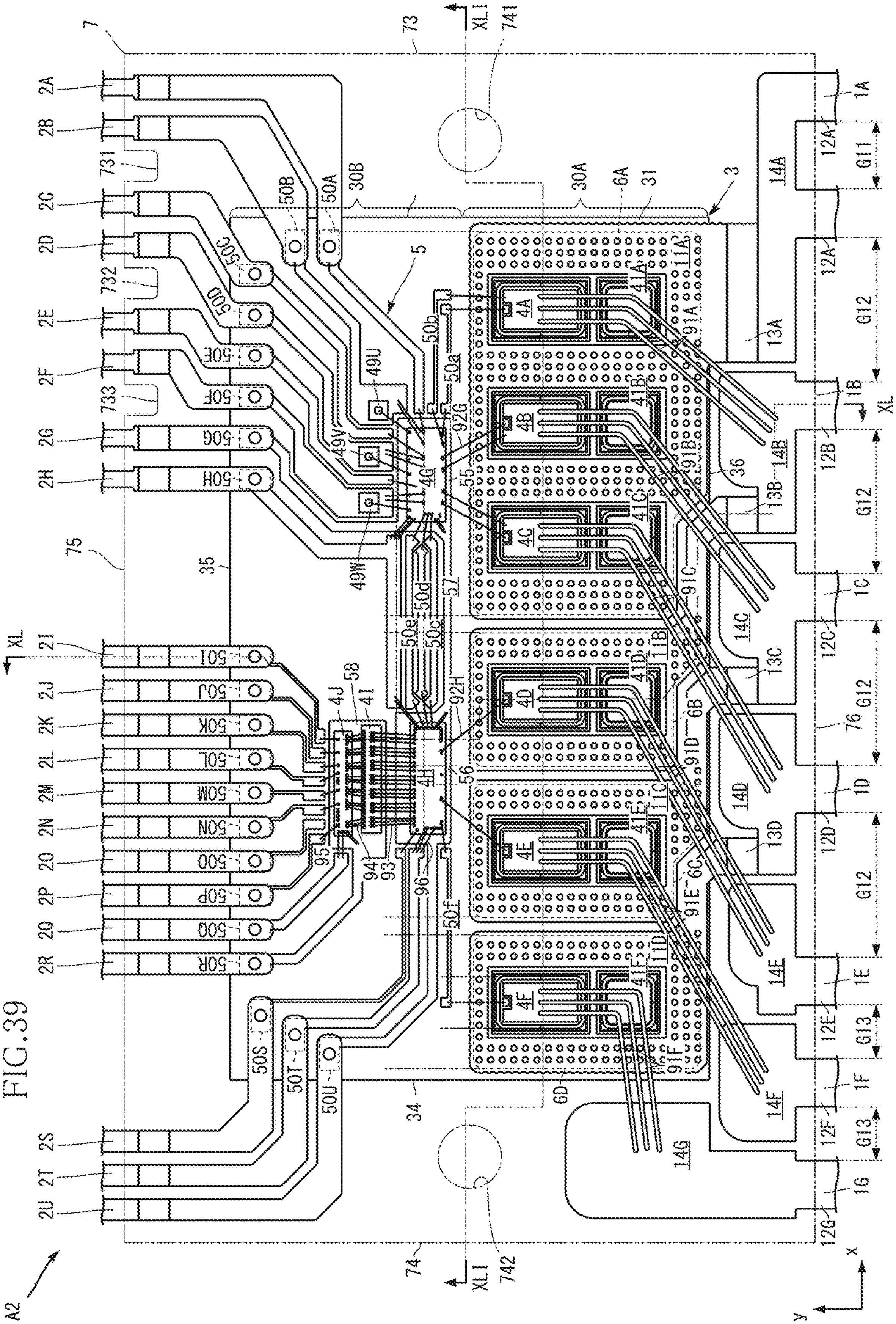
FIG. 39 is a partial plan view of the semiconductor device according to the second embodiment of the present disclosure.
Figure 40:
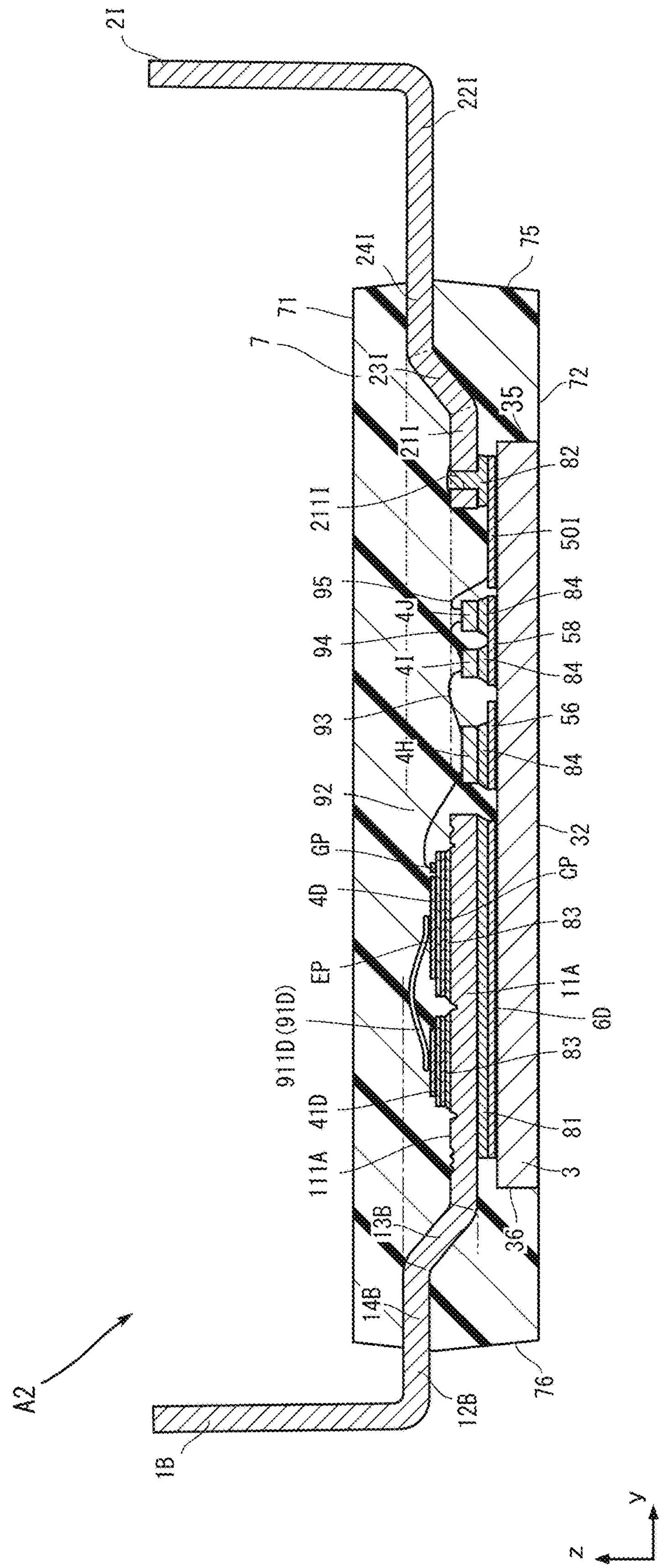
FIG. 40 is a cross-sectional view taken along a line XL-XL in FIG. 39.
Figure 41:
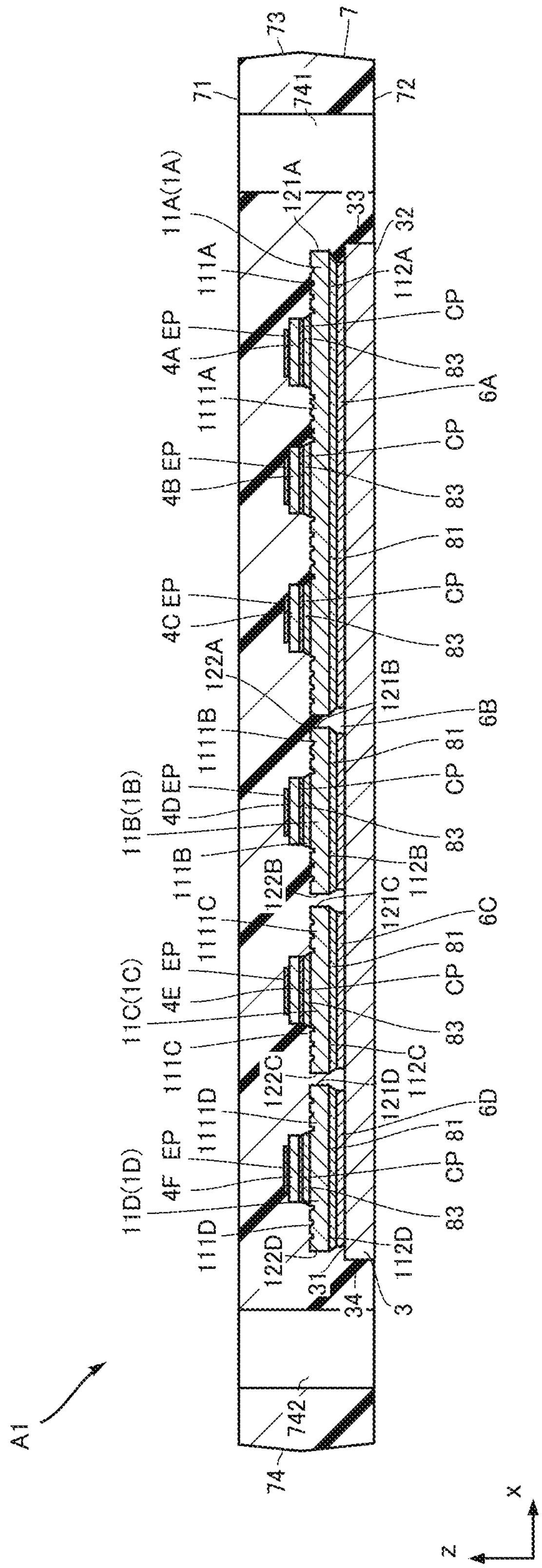
FIG. 41 is a cross-sectional view taken along a line XLI-XLI in FIG. 39.
Figure 42:
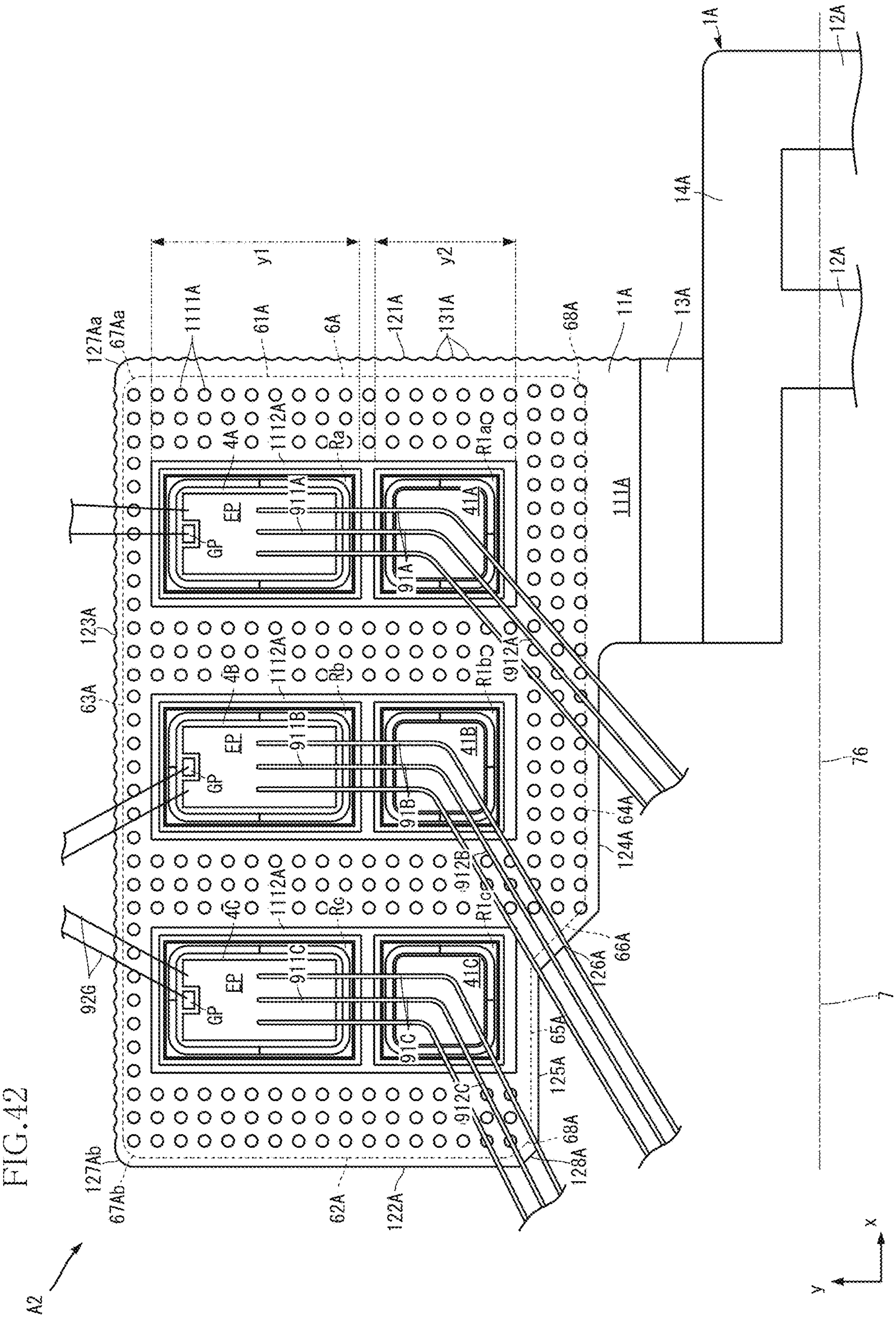
FIG. 42 is a partial plan view of the semiconductor device according to the second embodiment of the present disclosure.
Figure 43:
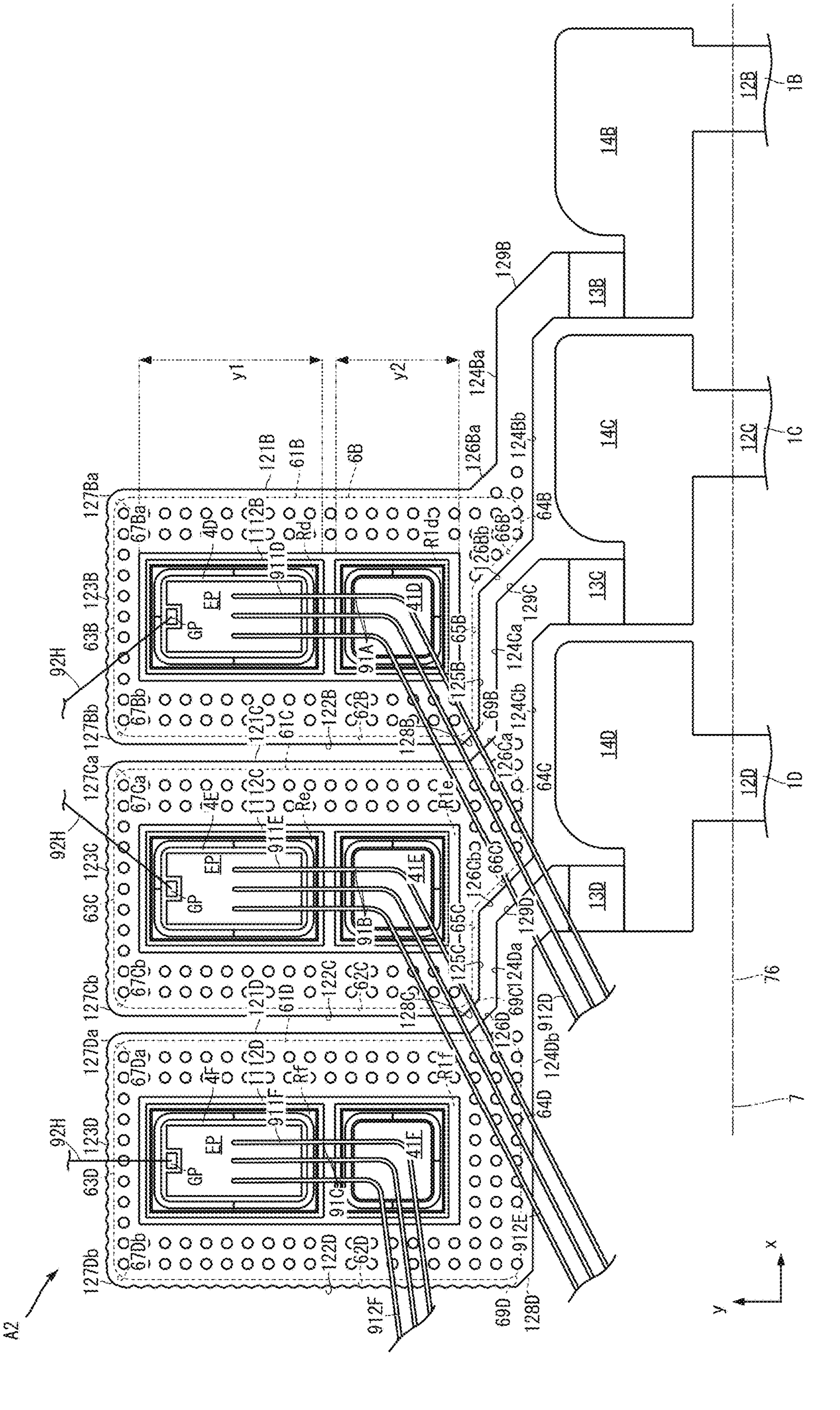
FIG. 43 is a partial plan view of the semiconductor device according to the second embodiment of the present disclosure.
Figure 44:
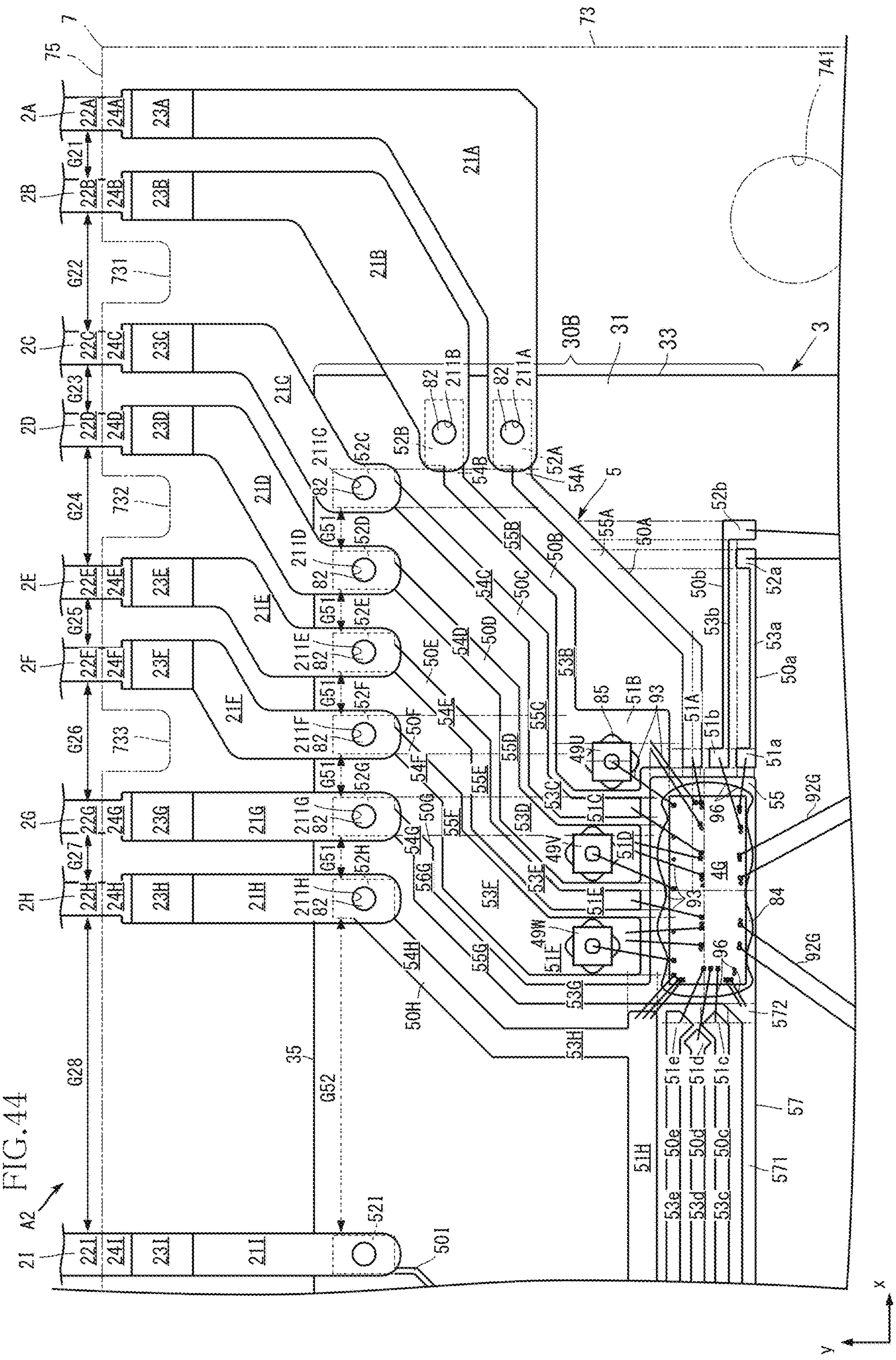
FIG. 44 is a schematic circuit diagram showing an electrical configuration of the semiconductor device according to the second embodiment of the present disclosure.
Figure 45:
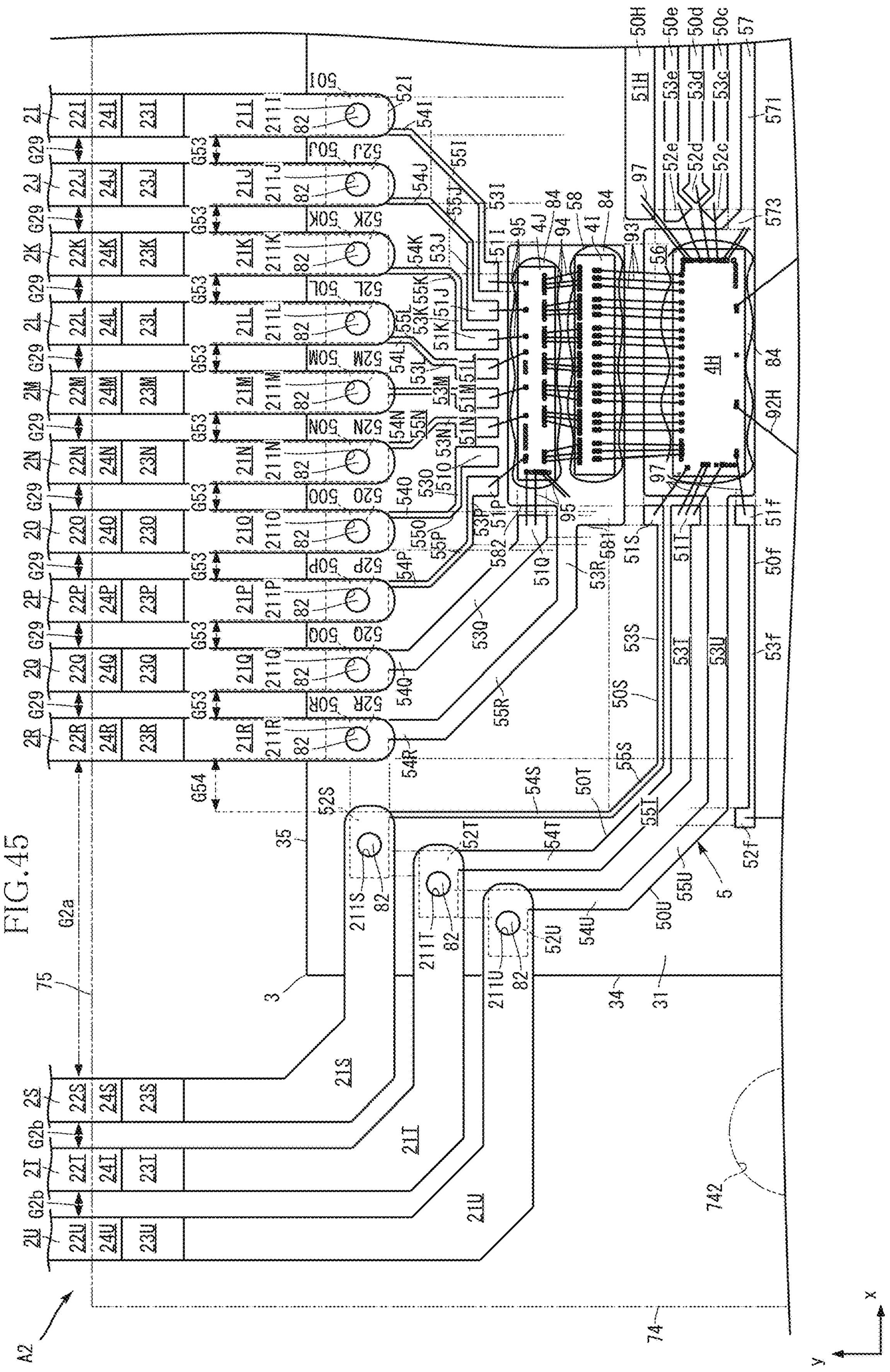
FIG. 45 is a partial plan view of the semiconductor device according to the second embodiment of the present disclosure.
Figure 46:
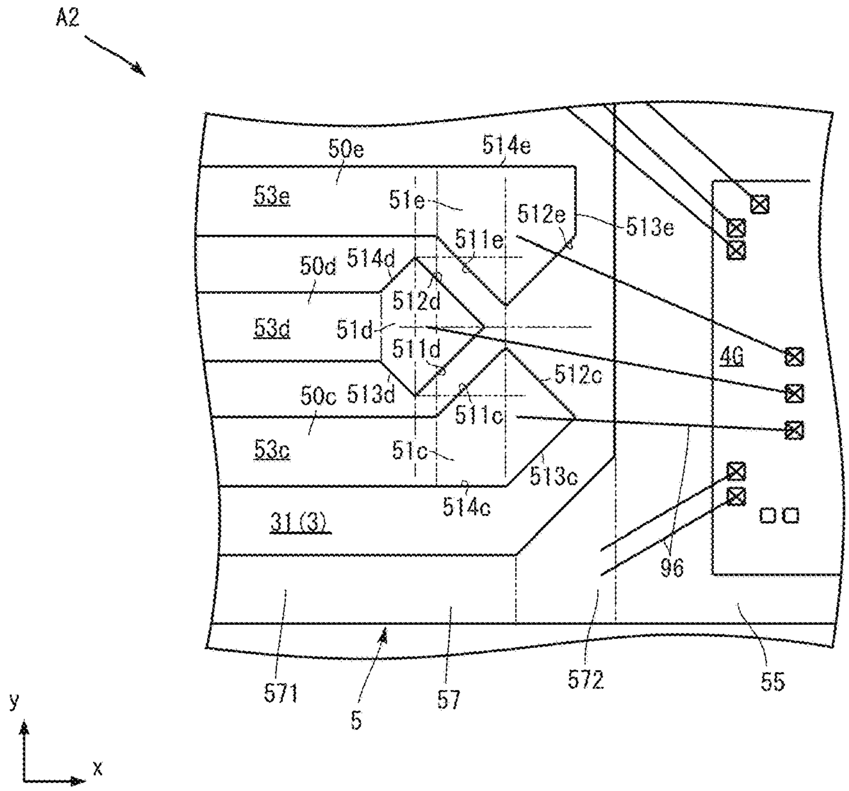
FIG. 46 is an enlarged partial plan view of the semiconductor device according to the second embodiment of the present disclosure.
Figure 47:
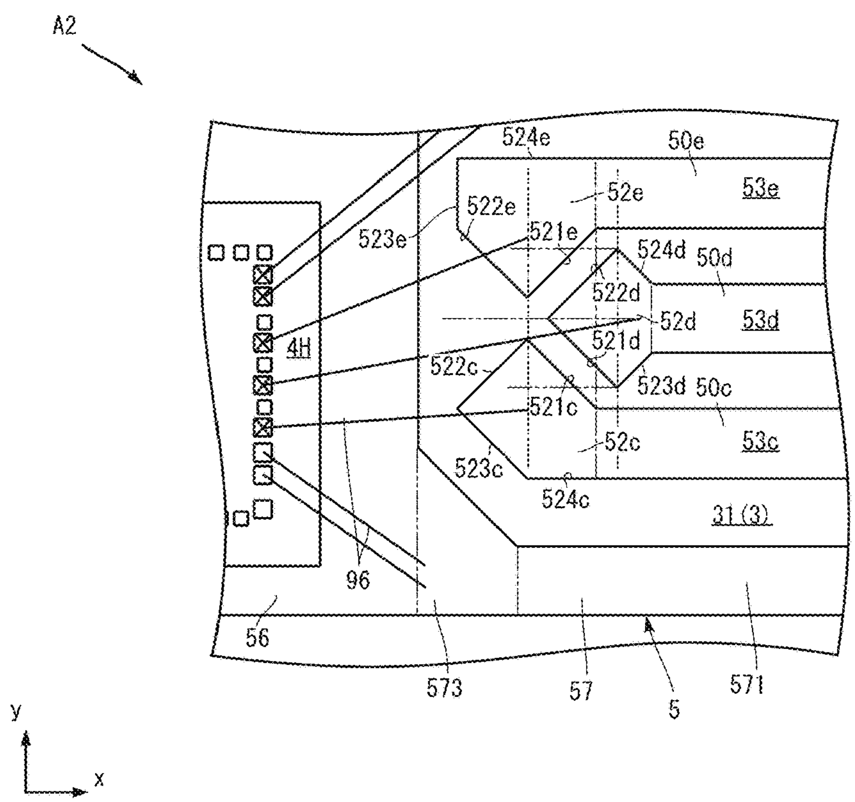
FIG. 47 is an enlarged partial plan view of the semiconductor device according to the second embodiment of the present disclosure.
Figure 48:
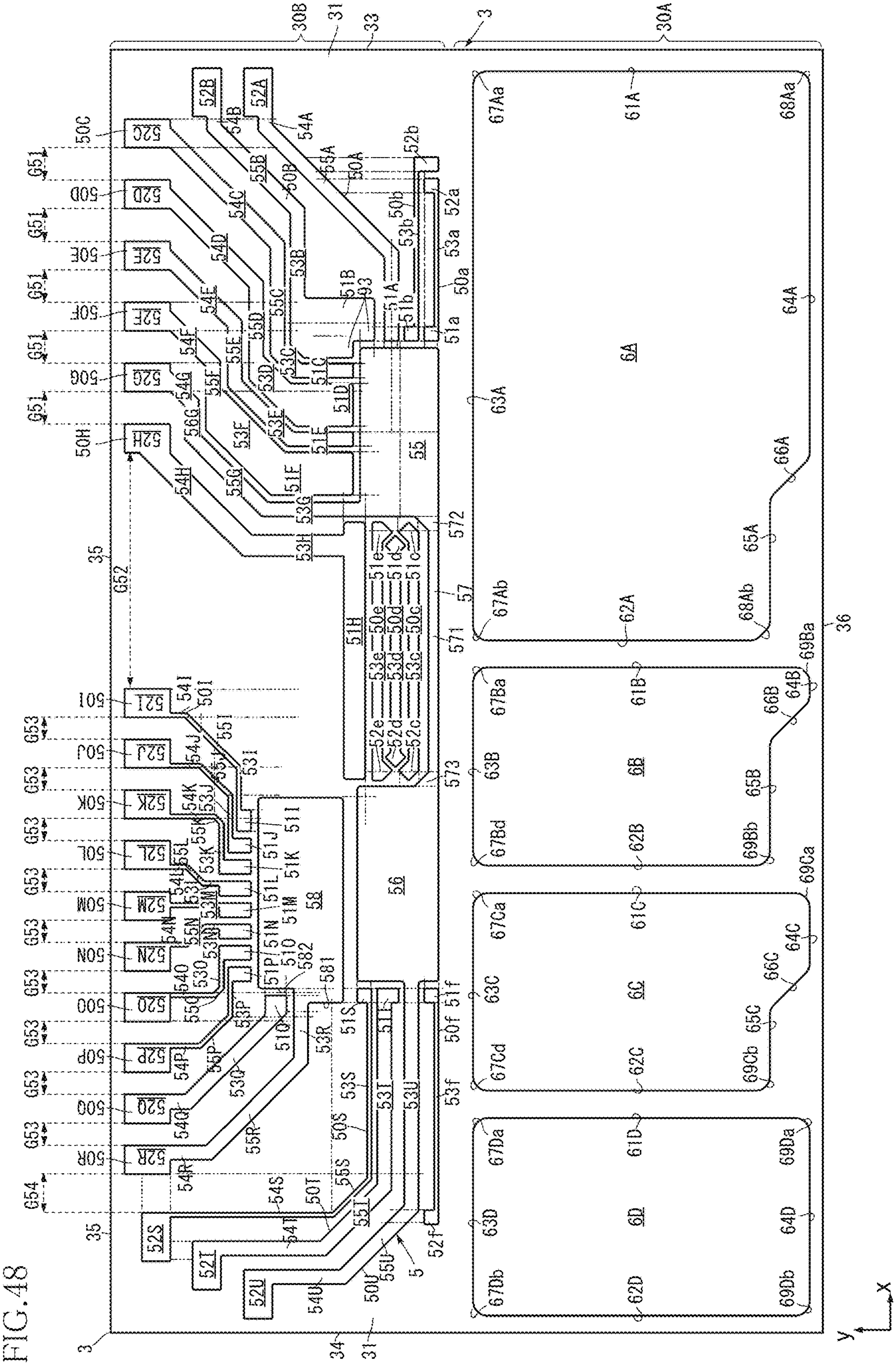
FIG. 48 is an enlarged partial plan view of a substrate of the semiconductor device according to the second embodiment of the present disclosure.
Figure 49:
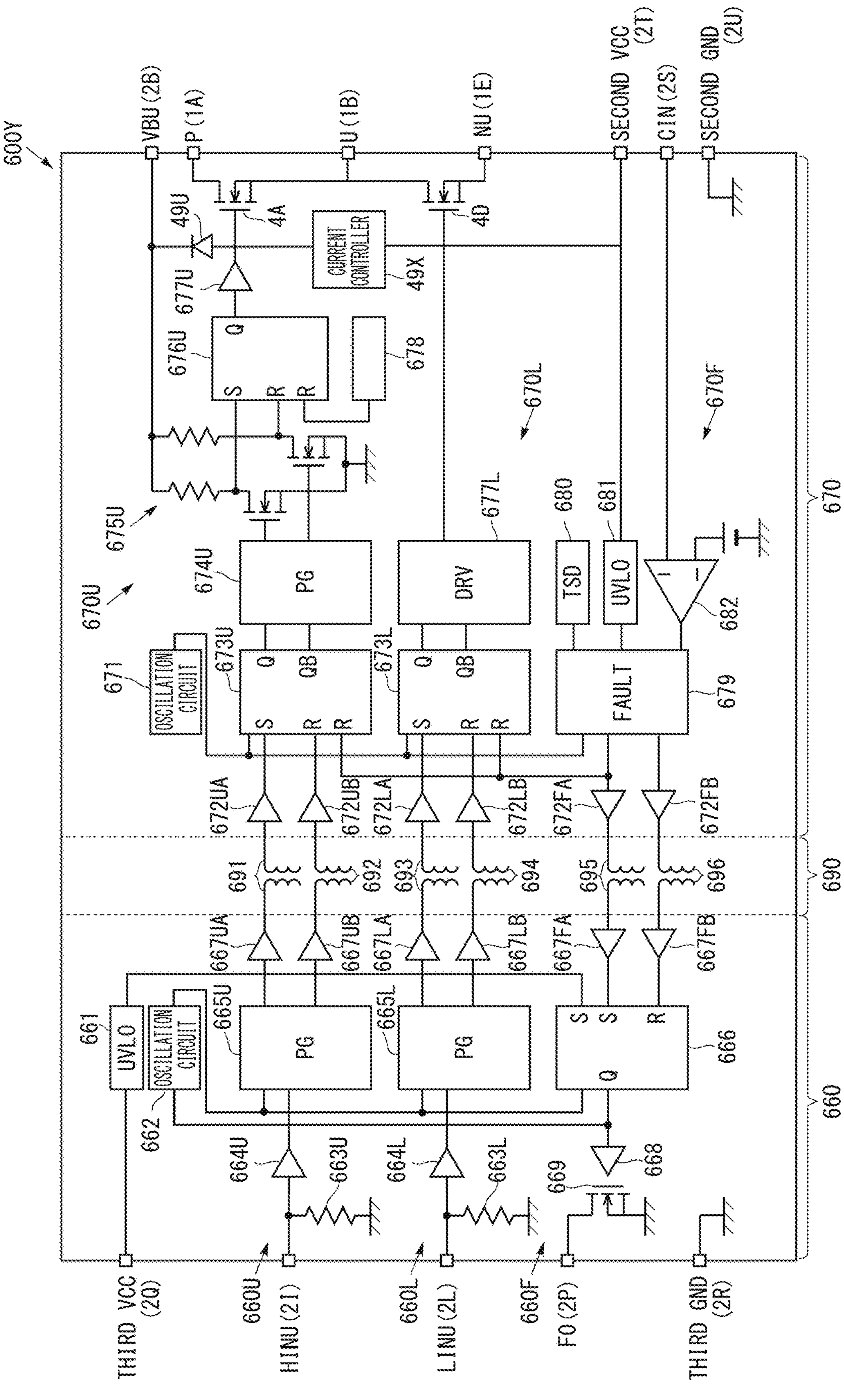
FIG. 49 is a schematic circuit diagram showing an electrical configuration of the semiconductor device according to the second embodiment of the present disclosure.
Figure 50:
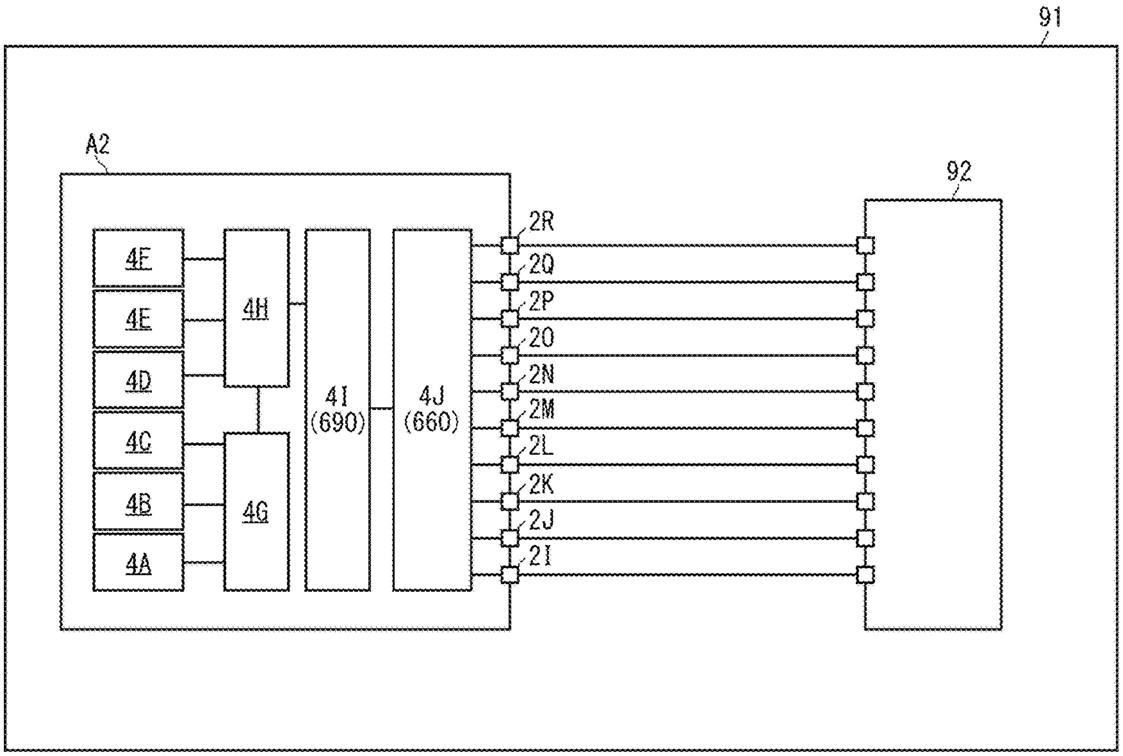
FIG. 50 is a schematic circuit diagram showing an electrical configuration of a circuit board, on which the semiconductor device according to the second embodiment of the present disclosure is mounted.
Figure 51:
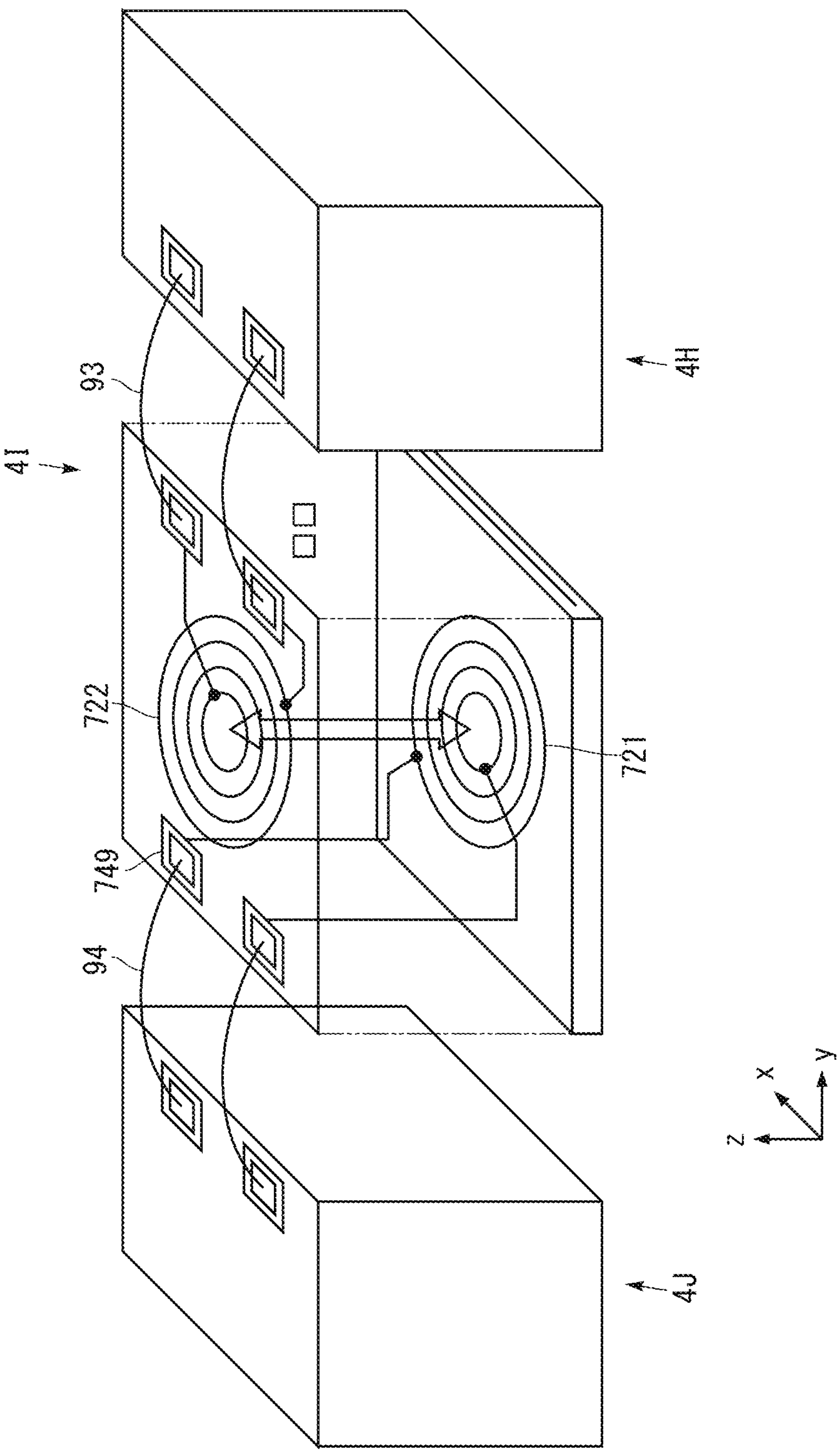
FIG. 51 is a schematic perspective view showing a first transmission circuit chip, a primary-side circuit chip, and a control chip of the semiconductor device according to the second embodiment of the present disclosure.
Figure 52:
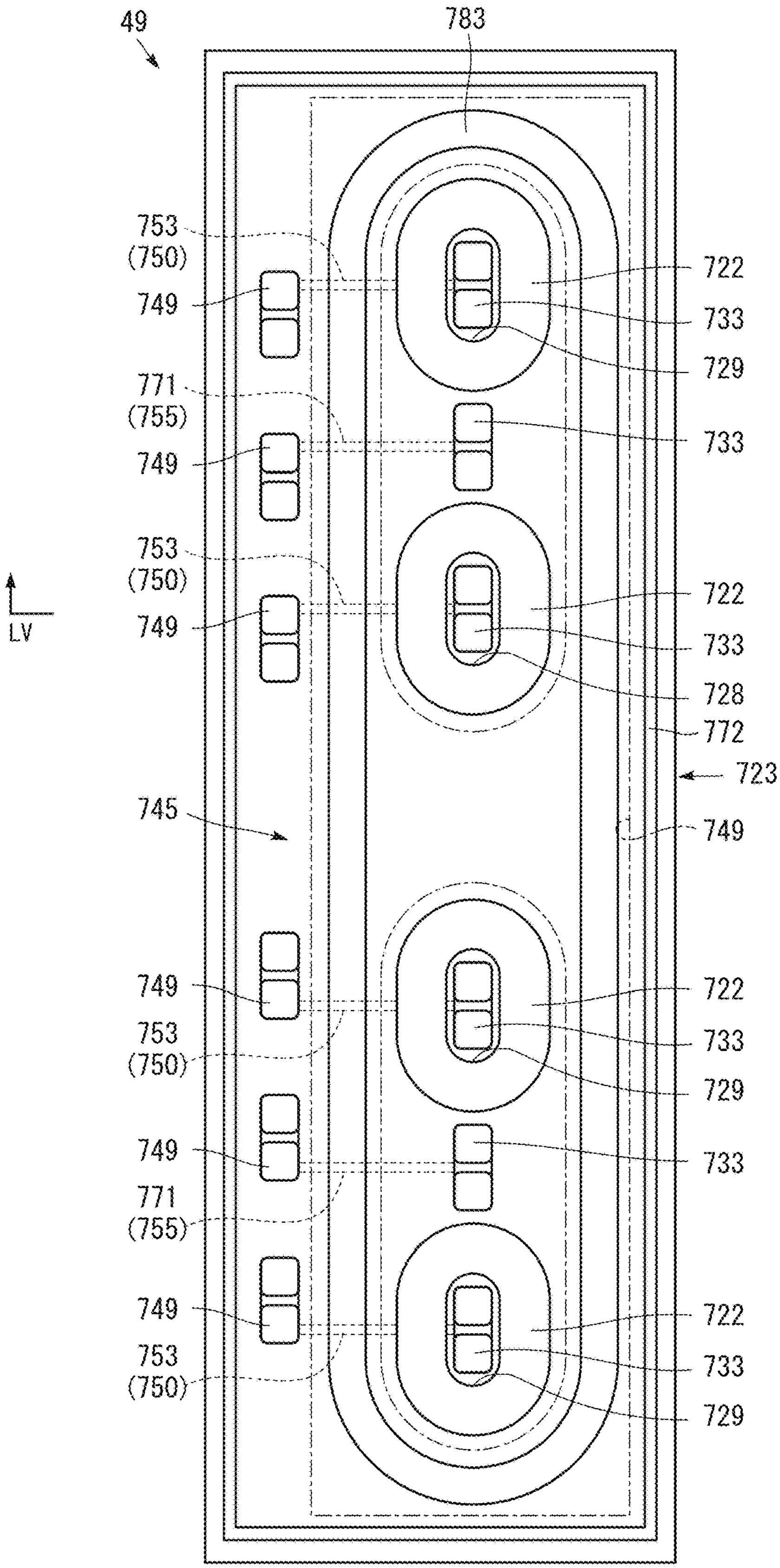
FIG. 52 is a partial plan view of the first transmission circuit chip.
Figure 53:
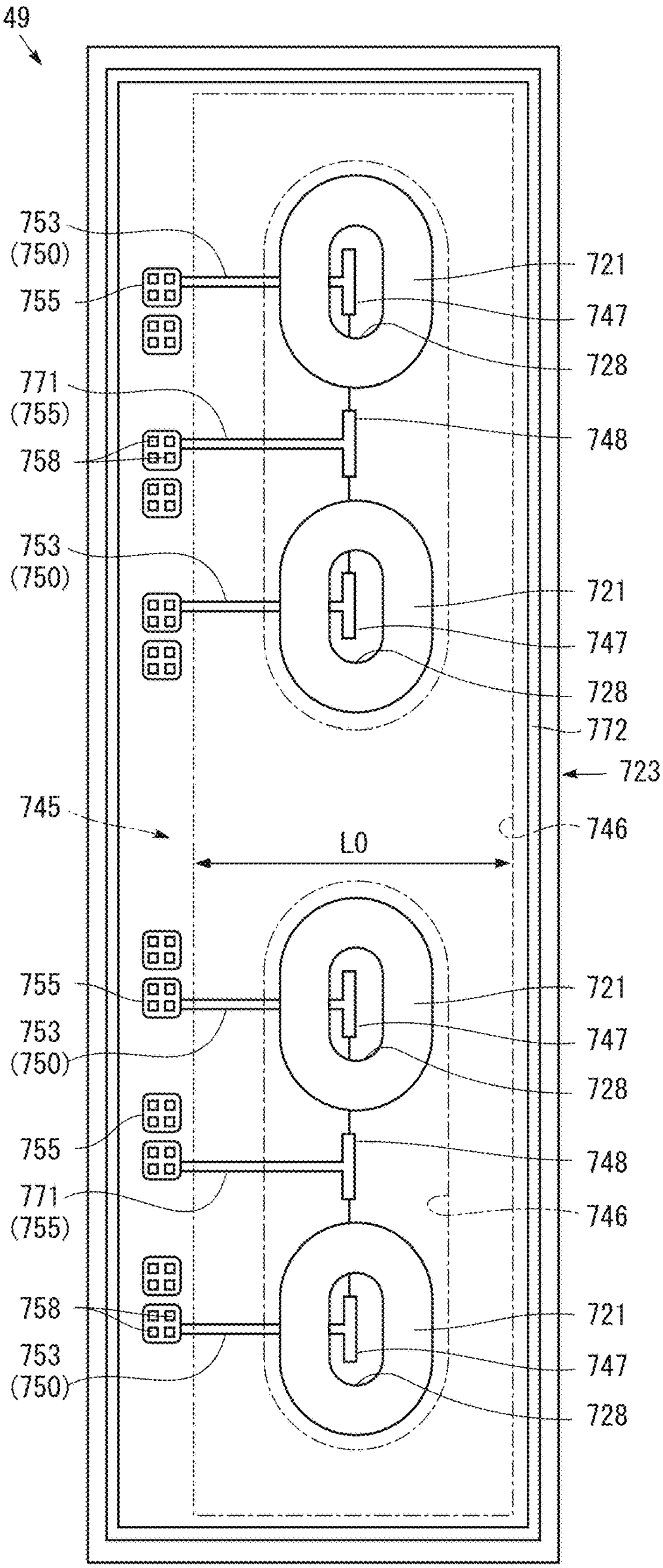
FIG. 53 is a partial bottom view of the first transmission circuit chip.
Figure 54:
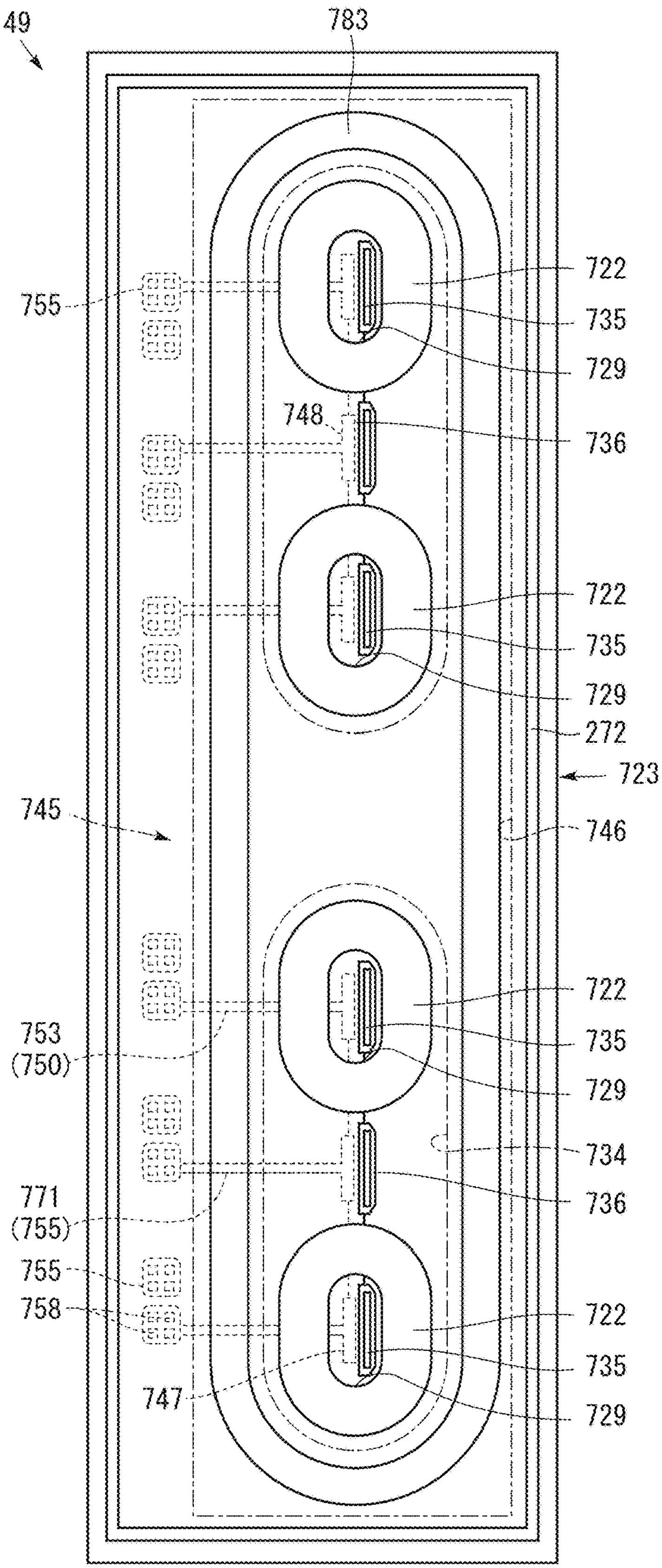
FIG. 54 is a partial plan view of the first transmission circuit chip.
Figure 55:
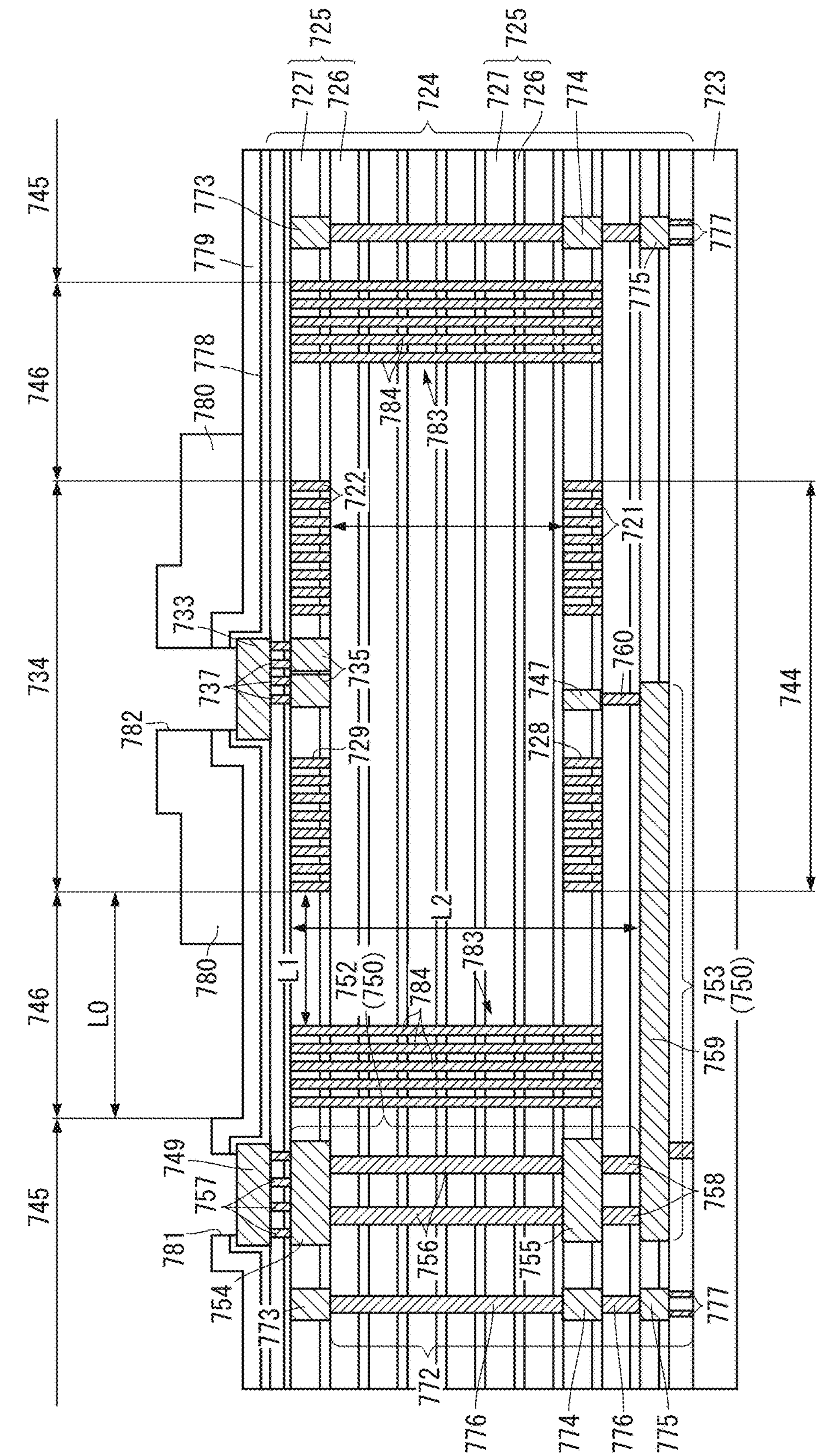
FIG. 55 is a cross-sectional view taken along a line LV-LV in FIG. 52.
Figure 56:
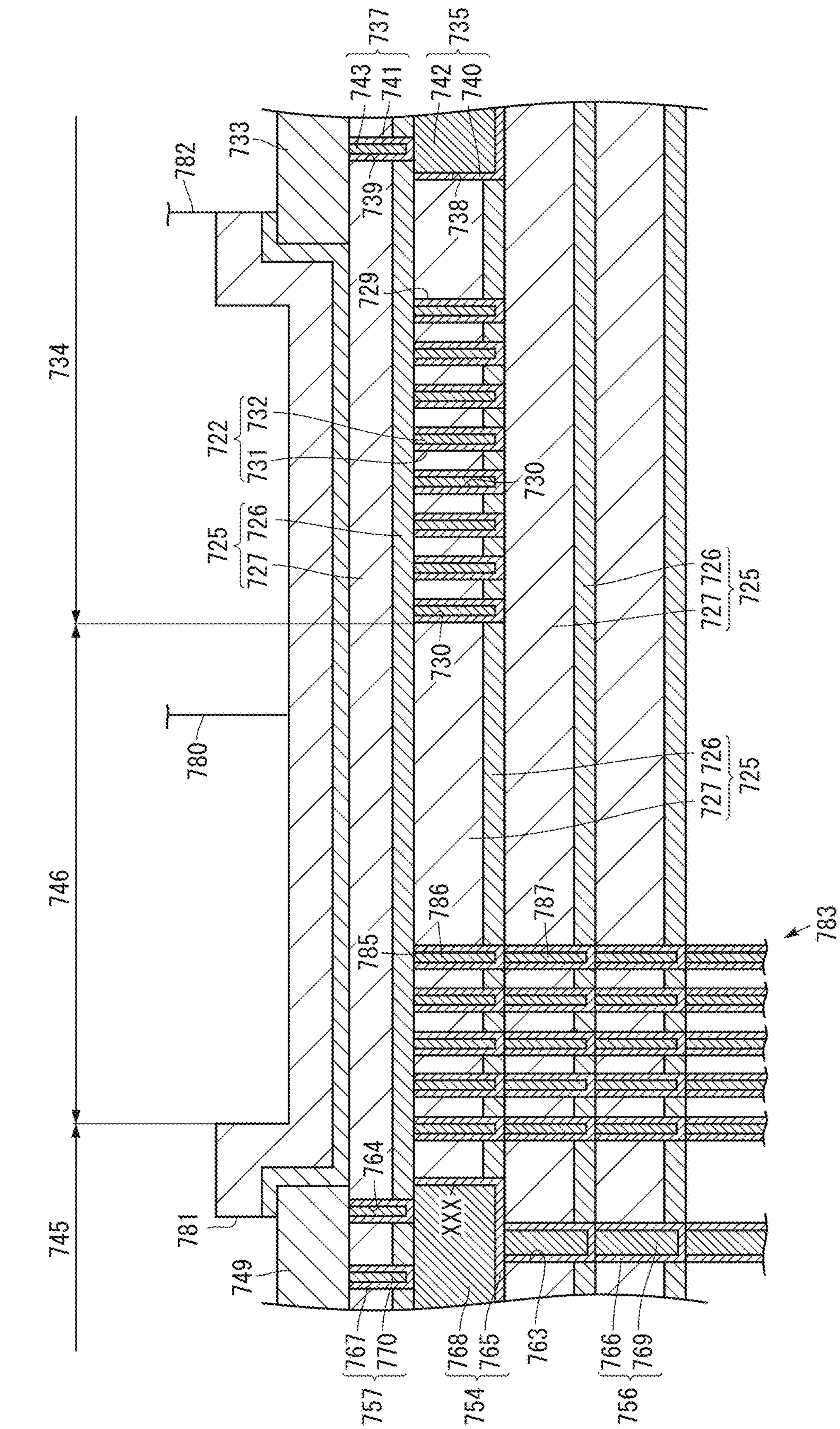
FIG. 56 is an enlarged partial cross-sectional view of the first transmission circuit chip.
Figure 57:
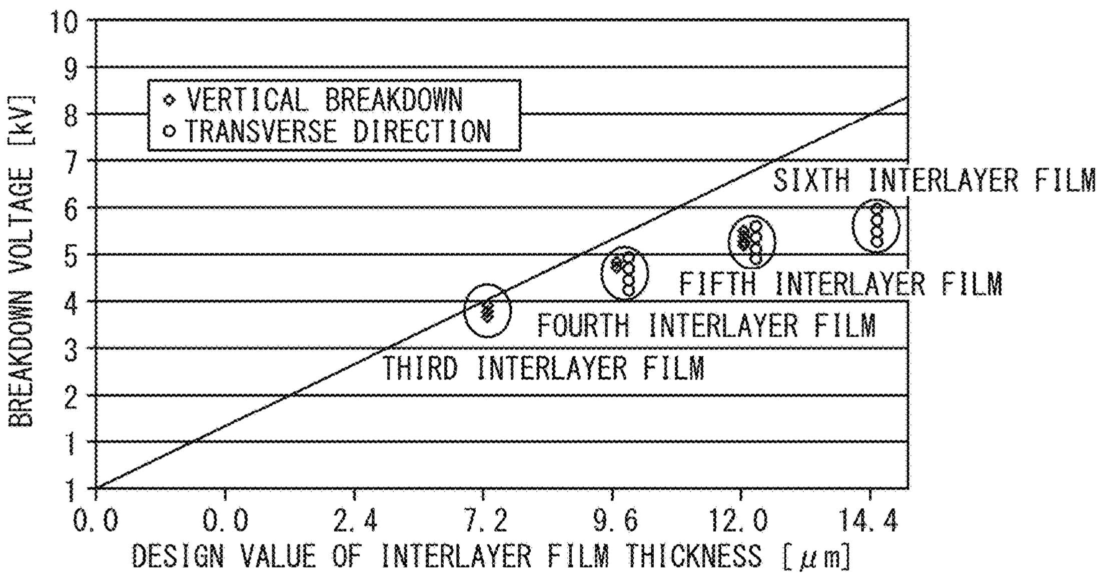
FIG. 57 includes graphs indicating a relation between a thickness of an interlayer film and a breakdown voltage of the first transmission circuit chip.

FIG. 35 is a perspective view showing the semiconductor device A2. FIG. 36 is a plan view showing the semiconductor device A2. FIG. 37 is a bottom view showing the semiconductor device A2. FIG. 38 is a side view showing the semiconductor device A2. FIG. 39 is a partial plan view of the semiconductor device A2. FIG. 40 is a cross-sectional view taken along a line XL-XL in FIG. 39. FIG. 41 is a cross-sectional view taken along a line XLI-XLI in FIG. 39. FIG. 42 is a partial plan view of the semiconductor device A2. FIG. 43 is a partial plan view of the semiconductor device A2. FIG. 44 is a schematic circuit diagram showing an electrical configuration of the semiconductor device A2. FIG. 45 is a partial plan view of the semiconductor device A2. FIG. 46 is an enlarged partial plan view of the semiconductor device A2. FIG. 47 is an enlarged partial plan view of the semiconductor device A2. FIG. 48 is an enlarged partial plan view of a substrate of the semiconductor device A2. FIG. 49 is a schematic circuit diagram showing an electrical configuration of the semiconductor device A2. FIG. 50 is a schematic circuit diagram showing an electrical configuration of a circuit board, on which the semiconductor device A2 is mounted. FIG. 51 is a schematic perspective view showing a first transmission circuit chip, a primary-side circuit chip, and a control chip of the semiconductor device A2. FIG. 52 is a partial plan view of the first transmission circuit chip. FIG. 53 is a partial bottom view of the first transmission circuit chip. FIG. 54 is a partial plan view of the first transmission circuit chip. FIG. 55 is a cross-sectional view taken along a line LV-LV in FIG. 52. FIG. 56 is an enlarged partial cross-sectional view of the first transmission circuit chip. FIG. 57 includes graphs indicating a relation between a thickness of an interlayer film and a breakdown voltage of the first transmission circuit chip.

<Substrate 3>

The shape, size, and material of the substrate 3 are not specifically limited, but may be, for example, similar to those of the substrate 3 in the semiconductor device A1.

<Conductive Section 5>

Regarding the conductive section 5 according to this embodiment, although any of the elements is apparently given, for the sake of convenience of description, the same numeral as that of the conductive section 5 according to the first embodiment, it does not necessarily mean that the mentioned element has the same or similar configuration. The configuration of an element with a numeral is defined by the description relevant to this embodiment.

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 39, FIG. 44 to FIG. 47, and FIG. 48, the conductive section 5 includes wirings 50A to 50U, wirings 50*a* to 50*f*, a first base portion 55, a second base portion 56, and a third base portion 58, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The shape of the second base portion 56 is not specifically limited, and a desired shape may be selected from a rectangular shape, a polygonal shape, a circular shape, an elliptical shape, and so forth. In the illustrated example, the second base portion 56 has a rectangular shape. In the illustrated example, the second base portion 56 has an elongate rectangular shape, having the long sides extending along the x-direction.

The second base portion 56 is located on the side of the fourth face 34 with respect to the first base portion 55, in the x-direction. In the illustrated example, the edge of the second base portion 56 on the side of the sixth face 36 in the y-direction is located generally at the same position as the edge of the first base portion 55 on the side of the sixth face 36, in the y-direction. Here, the expression "located generally at the same position" in the y-direction refers to, for example, being located exactly at the same position, or being deviated by within ±5% of the characteristic size (size of the first base portion 55 or second base portion 56 in the y-direction). In the illustrated example, the edge of the second base portion 56 on the side of the fifth face 35 in the y-direction is located generally at the same position as the edge of the first base portion 55 on the side of the fifth face 35, in the y-direction. Here, the expression "located generally at the same position" in the y-direction refers to, for example, being located exactly at the same position, or being deviated by within ±5% of the characteristic size (size of the first base portion 55 or second base portion 56 in the y-direction). In the illustrated example, the center of the second base portion 56 in the y-direction is located generally at the same position in the y-direction, as the center of the first base portion 55 in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The connecting portion 57 is interposed between the first base portion 55 and the second base portion 56 and, in the illustrated example, connecting the first base portion 55 and the second base portion 56. In the illustrated example, the connecting portion 57 is located between the first base portion 55 and the second base portion 56, as viewed in the y-direction. The shape of the connecting portion 57 is not specifically limited. In the illustrated example, the connecting portion 57 includes a first portion 571, a second portion 572, and a third portion 573, each of which will be described hereunder.

The first portion 571 is located between the first base portion 55 and the second base portion 56, as viewed in the y-direction. The shape of the first portion 571 is not specifically limited. In the illustrated example, the first portion 571 has a strip shape extending along the x-direction. In the illustrated example, the size of the first portion 571 in the y-direction is constant.

The second portion 572 is interposed between the first portion 571 and the first base portion 55 and, in the illustrated example, connected to the first portion 571 and the first base portion 55. The second portion 572 is larger in size in the y-direction, than the first portion 571. The shape of the second portion 572 is not specifically limited. In the illustrated example, the size of the second portion 572 in the y-direction increases in the direction from the first portion 571 toward the first base portion 55.

The third portion 573 is interposed between the first portion 571 and the second base portion 56 and, in the illustrated example, connected to the first portion 571 and the second base portion 56. The third portion 573 is larger in size in the y-direction, than the first portion 571. The shape of the third portion 573 is not specifically limited. In the illustrated example, the size of the third portion 573 in the y-direction increases in the direction from the first portion 571 toward the second base portion 56.

In the illustrated example, the respective edges of the first base portion 55, the second base portion 56, and the connecting portion 57 on the side of the sixth face 36 in the y-direction are located generally at the same position in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The shape of the third base portion 58 is not specifically limited, and a desired shape may be selected from a rectangular shape, a polygonal shape, a circular shape, an elliptical shape, and so forth. In the illustrated example, the third base portion 58 includes two edges extending along the x-direction and two edges extending along the y-direction, the edges along the x-direction constituting the long sides. In addition, the illustrated third base portion 58 includes edges 581 and 582. One of the edges 581 and 582 corresponds to one of the two edges extending along the y-direction. The edge 582 is located on the side of the fifth face 35 in the y-direction, with respect to the edge 581. Further, the edge 582 is located on the side of the third face 33 in the x-direction, with respect to the edge 581.

The edge of the third base portion 58 on the side of the third face 33 in the x-direction is located on the side of the fourth face 34 in the x-direction, with respect to the edge of the second base portion 56 on the side of the third face 33 in the x-direction. In addition, the edge of the third base portion 58 on the side of the fourth face 34 in the x-direction is located on the side of the fourth face 34 in the x-direction, with respect to the edge of the second base portion 56 on the side of the fourth face 34 in the x-direction. The third base portion 58 is spaced apart from the first base portion 55, as viewed in the x-direction.

The wiring 50A includes a first portion 51A, a second portion 52A, and a third portion 53A, each of which will be described hereunder.

The first portion 51A is located on the side of the third face 33 in the x-direction with respect to the first base portion 55, and spaced therefrom. The shape of the first portion 51A is not specifically limited, and a desired shape may be selected from a rectangular shape, a polygonal shape, a circular shape, an elliptical shape, and so forth. In the illustrated example, the first portion 51A has an elongate strip shape extending along the x-direction. In the illustrated example, in addition, the first portion 51A overlaps with the first base portion 55, as viewed in the x-direction. The center of the first portion 51A in the y-direction is located on the side of the fifth face 35, with respect to the center of the first base portion 55 in the y-direction.

The second portion 52A is located on the side of the fifth face 35 in the y-direction, and on the side of the third face 33 in the x-direction, with respect to the first portion 51A. The shape of the second portion 52A is not specifically limited, and a desired shape may be selected from a rectangular shape, a polygonal shape, a circular shape, an elliptical shape, and so forth. In the illustrated example, the first portion 51A has a rectangular shape.

The fourth portion 54A is interposed between the first portion 51A and the second portion 52A and, in the illustrated example, connected to the edge of the second portion 52A on the side of the fourth face 34 in the x-direction. The shape of the fourth portion 54A is not specifically limited. The fourth portion 54A is spaced apart from the first portion 51A, as viewed in the x-direction.

The fifth portion 55A is interposed between the first portion 51A and the fourth portion 54A and, in the illustrated example, connected to the first portion 51A and the fourth portion 54A. The shape of the fifth portion 55A is not specifically limited. In the illustrated example, the fifth portion 55A has a strip shape inclined with respect to the x-direction and the y-direction.

The wiring 50B includes a first portion 51B, a second portion 52B, a third portion 53B, a fourth portion 54B, and a fifth portion 55B, each of which will be described hereunder.

The shape of the first portion 51B is not specifically limited, and a desired shape may be selected from a rectangular shape, a polygonal shape, a circular shape, an elliptical shape, and so forth. The first portion 51B is located on the side of the third face 33 in the x-direction, and on the side of the fifth face 35 in the y-direction, with respect to the first base portion 55, and spaced therefrom. In the illustrated example, a part of the first portion 51B overlaps with the first base portion 55 as viewed in the x-direction, and also as viewed in the y-direction. The first portion 51B includes portions respectively opposed to the edge of the first base portion 55 on the side of the third face 33 in a view in the x-direction, and the edge on the side of the fifth face 35 in the y-direction.

The second portion 52B is located on the side of the fifth face 35 with respect to the first portion 51B, in the y-direction. The second portion 52B overlaps with the first portion 51B, as viewed in the y-direction. The shape of the second portion 52B is not specifically limited, and a desired shape may be selected from a rectangular shape, a polygonal shape, a circular shape, an elliptical shape, and so forth. In the illustrated example, the second portion 52B has a rectangular shape.

The third portion 53B is interposed between the first portion 51B and the second portion 52B and, in the illustrated example, connected to the edge of the first portion 51B on the side of the third face 33 in the x-direction. The shape of the third portion 53B is not specifically limited. In the illustrated example, the third portion 53B has a strip shape extending along the x-direction. The third portion 53B is spaced apart from the second portion 52B, as viewed in the x-direction.

The fourth portion 54B is interposed between the first portion 51B and the second portion 52B and, in the illustrated example, connected to the edge of the second portion 52B on the side of the fourth face 34 in the x-direction. The shape of the fourth portion 54B is not specifically limited. The fourth portion 54B is spaced apart from the first portion 51B, as viewed in the x-direction.

The fifth portion 55B is interposed between the first portion 51B and the fourth portion 54B and, in the illustrated example, connected to the third portion 53B and the fourth portion 54B. The shape of the fifth portion 55A is not specifically limited. In the illustrated example, the fifth portion 55A has a strip shape inclined with respect to the x-direction and the y-direction. In the illustrated example, the fifth portion 55A and the fifth portion 55B are generally parallel to each other. Here, the expression "generally parallel" refers to, for example, being exactly parallel to each other, or a situation where the angles with respect to the x-direction or y-direction are different by within ±5%.

The wiring 50C includes a first portion 51C, a second portion 52C, a third portion 53C, a fourth portion 54C, and a fifth portion 55C, each of which will be described hereunder.

The first portion 51C is located on the side of the fifth face 35 in the y-direction, with respect to the first base portion 55 with a spacing therefrom, and on the side of the fourth face 34 in the x-direction, with respect to the first portion 51B with a spacing therefrom. In the illustrated example, the first portion 51C overlaps with the first base portion 55, as viewed in the y-direction. The shape of the first portion 51C is not specifically limited. In the illustrated example, the first portion 51C has a strip shape extending along the y-direction.

The second portion 52C is located on the side of the fifth face 35 with respect to the first portion 51C, in the y-direction. The second portion 52C is located between the second portions 52A and 52B, and the first portion 51C, as viewed in the y-direction. The second portion 52C is spaced apart from the second portion 52B toward the fifth face 35, as viewed in the x-direction. The shape of the second portion 52C is not specifically limited, and a desired shape may be selected from a rectangular shape, a polygonal shape, a circular shape, an elliptical shape, and so forth. In the illustrated example, the second portion 52C has a rectangular shape.

The third portion 53C is interposed between the first portion 51C and the second portion 52C and, in the illustrated example, connected to the end portion of the first portion 51C on the side of the fifth face 35 in the y-direction. The shape of the third portion 53C is not specifically limited. In the illustrated example, the third portion 53C is inclined with respect to the x-direction and the y-direction. The third portion 53C is spaced apart from the second portion 52C, as viewed in the x-direction.

The fourth portion 54C is interposed between the first portion 51C and the second portion 52C and, in the illustrated example, connected to the edge of the second portion 52C on the side of the sixth face 36 in the y-direction. The shape of the fourth portion 54C is not specifically limited. In the illustrated example, the fourth portion 54C has a strip shape inclined with respect to the x-direction and the y-direction. The fourth portion 54C is spaced apart from the first portion 51C, as viewed in the x-direction.

The fifth portion 55C is interposed between the first portion 51C and the fourth portion 54C and, in the illustrated example, connected to the third portion 53C and the fourth portion 54C. The shape of the fifth portion 55C is not specifically limited. In the illustrated example, the fifth portion 55C has a strip shape extending along the x-direction.

The wiring 50D includes a first portion 51D, a second portion 52D, a third portion 53D, a fourth portion 54D, and a fifth portion 55D, each of which will be described hereunder.

The shape of the first portion 51D is not specifically limited, and a desired shape may be selected from a rectangular shape, a polygonal shape, a circular shape, an elliptical shape, and so forth. In the illustrated example, the first portion 51D has a rectangular shape. The first portion 51D is located on the side of the fifth face 35 in the y-direction, with respect to the first base portion 55, and spaced therefrom. The first portion 51D is located on the side of the fourth face 34 in the x-direction with respect to the first portion 51C, and spaced therefrom. In addition, in the illustrated example, the first portion 51D overlaps with the first portion 51C as viewed in the x-direction, and with the first base portion 55 as viewed in the y-direction.

The second portion 52D is located on the side of the fifth face 35 with respect to the first portion 51D, in the y-direction. The second portion 52D is located on the side of the fourth face 34 in the x-direction with respect to the second portion 52C, and spaced therefrom. The second portion 52D overlaps with the second portion 52C, as viewed in the x-direction. The second portion 52D is located between the second portions 52A, 52B, and the first portion 51B, as viewed in the y-direction. The shape of the second portion 52D is not specifically limited, and a desired shape may be selected from a rectangular shape, a polygonal shape, a circular shape, an elliptical shape, and so forth. In the illustrated example, the second portion 52E has a rectangular shape.

The third portion 53D is interposed between the first portion 51D and the second portion 52D and, in the illustrated example, connected to the end portion of the first portion 51D on the side of the fifth face 35 in the y-direction. The shape of the third portion 53D is not specifically limited. In the illustrated example, the third portion 53D is inclined with respect to the x-direction and the y-direction. The third portion 53D is spaced apart from the second portion 52D, as viewed in the x-direction. In addition, the third portion 53D is generally parallel to the third portion 53C. Here, the expression "generally parallel" refers to, for example, being exactly parallel to each other, or a situation where the angles with respect to the x-direction or y-direction are different by within ±5%.

The fourth portion 54D is interposed between the first portion 51D and the second portion 52D and, in the illustrated example, connected to the edge of the second portion 52D on the side of the sixth face 35 in the y-direction. The shape of the fourth portion 54D is not specifically limited. In the illustrated example, the fourth portion 54D has a strip shape inclined with respect to the x-direction and the y-direction. The fourth portion 54D is spaced apart from the first portion 51D, as viewed in the x-direction. In addition, the fourth portion 54D is generally parallel to the fourth portion 54C. Here, the expression "generally parallel" refers to, for example, being exactly parallel to each other, or a situation where the angles with respect to the x-direction or y-direction are different by within ±5%.

The fifth portion 55D is interposed between the third portion 53D and the fourth portion 54D and, in the illustrated example, connected to the third portion 53D and the fourth portion 54D. The shape of the fifth portion 55D is not specifically limited. In the illustrated example, the fifth portion 55D has a strip shape extending along the x-direction.

The wiring 50E includes a first portion 51E, a second portion 52E, a third portion 53E, a fourth portion 54E, and a fifth portion 55E, each of which will be described hereunder.

The first portion 51E is located on the side of the fifth face 35 in the y-direction, with respect to the first base portion 55 with a spacing therefrom, and on the side of the fourth face 34 in the x-direction, with respect to the first portion 51D with a spacing therefrom. In the illustrated example, the first portion 51B overlaps with the first base portion 55, as viewed in the y-direction. The shape of the first portion 51E is not specifically limited. In the illustrated example, the first portion 51E has a strip shape extending along the y-direction.

The second portion 52E is located on the side of the fifth face 35 with respect to the first portion 51E, in the y-direction. The second portion 52E is located on the side of the fifth face 35 with respect to the second portion 52C and spaced therefrom, as viewed in the x-direction. The shape of the second portion 52E is not specifically limited, and a desired shape may be selected from a rectangular shape, a polygonal shape, a circular shape, an elliptical shape, and so forth. In the illustrated example, the second portion 52B has a rectangular shape.

The third portion 53E is interposed between the first portion 51E and the second portion 52E and, in the illustrated example, connected to the end portion of the first portion 51E on the side of the fifth face 35 in the y-direction. The shape of the third portion 53E is not specifically limited. In addition, the third portion 53E is generally parallel to the third portion 53D. Here, the expression "generally parallel" refers to, for example, being exactly parallel to each other, or a situation where the angles with respect to the x-direction or y-direction are different by within ±5%.

The fourth portion 54E is interposed between the first portion 51E and the second portion 52E and, in the illustrated example, connected to the edge of the second portion 52E on the side of the sixth face 36 in the y-direction. The shape of the fourth portion 54E is not specifically limited. In the illustrated example, the fourth portion 54E has a strip shape inclined with respect to the x-direction and the y-direction. In addition, the fourth portion 54E is generally parallel to the fourth portion 54D. Here, the expression "generally parallel" refers to, for example, being exactly parallel to each other, or a situation where the angles with respect to the x-direction or y-direction are different by within ±5%.

The fifth portion 55E is interposed between the first portion 51E and the fourth portion 54E and, in the illustrated example, connected to the third portion 53E and the fourth portion 54E. The shape of the fifth portion 55E is not specifically limited. In the illustrated example, the fifth portion 55E has a strip shape extending along the x-direction.

The wiring 50F includes a first portion 51F, a second portion 52F, a third portion 53F, a fourth portion 54F, and a fifth portion 55F, each of which will be described hereunder.

The shape of the first portion 51F is not specifically limited, and a desired shape may be selected from a rectangular shape, a polygonal shape, a circular shape, an elliptical shape, and so forth. The first portion 51F is located on the side of the fifth face 35 in the y-direction, with respect to the first base portion 55, and spaced therefrom. The first portion 51F is located on the side of the fourth face 34 in the x-direction with respect to the first portion 51E, and spaced therefrom. In addition, in the illustrated example, the first portion 51F overlaps with the first portion 51E as viewed in the x-direction, and with the first base portion 55 as viewed in the y-direction.

The second portion 52F is located on the side of the fifth face 35 with respect to the first portion 51F, in the y-direction. The second portion 52F is located on the side of the fourth face 34 in the x-direction with respect to the second portion 52E, and spaced therefrom. The second portion 52F overlaps with the second portion 52E, as viewed in the x-direction. The second portion 52F overlaps with the first portion 51B, as viewed in the y-direction. The shape of the second portion 52F is not specifically limited, and a desired shape may be selected from a rectangular shape, a polygonal shape, a circular shape, an elliptical shape, and so forth. In the illustrated example, the second portion 52F has a rectangular shape.

The third portion 53F is interposed between the first portion 51F and the second portion 52F and, in the illustrated example, connected to the end portion of the first portion 51F on the side of the fifth face 35 in the y-direction. The shape of the third portion 53F is not specifically limited. In the illustrated example, the third portion 53F is inclined with respect to the x-direction and the y-direction. The third portion 53F is spaced apart from the second portion 52F, as viewed in the x-direction. In addition, the third portion 53F is generally parallel to the third portion 53E. Here, the expression "generally parallel" refers to, for example, being exactly parallel to each other, or a situation where the angles with respect to the x-direction or y-direction are different by within ±5%.

The fourth portion 54F is interposed between the first portion 51F and the second portion 52F and, in the illustrated example, connected to the edge of the second portion 52F on the side of the sixth face 36 in the y-direction. The shape of the fourth portion 54F is not specifically limited. In the illustrated example, the fourth portion 54F has a strip shape inclined with respect to the x-direction and the y-direction. The fourth portion 54F is spaced apart from the first portion 51F, as viewed in the x-direction. In addition, the fourth portion 54F is generally parallel to the fourth portion 54E. Here, the expression "generally parallel" refers to, for example, being exactly parallel to each other, or a situation where the angles with respect to the x-direction or y-direction are different by within ±5%.

The fifth portion 55F is interposed between the third portion 53F and the fourth portion 54F and, in the illustrated example, connected to the third portion 53F and the fourth portion 54F. The shape of the fifth portion 55F is not specifically limited. In the illustrated example, the fifth portion 55F has a strip shape extending along the x-direction.

The wiring 50G includes a second portion 52G, a third portion 53G, a fourth portion 54G, a fifth portion 55G, and a sixth portion 56G, each of which will be described hereunder.

The second portion 52G is located on the side of the fifth face 35 with respect to the first base portion 55, in the y-direction. The second portion 52G is located on the side of the fourth face 34 in the x-direction with respect to the second portion 52F, and spaced therefrom. The second portion 52G overlaps with the second portion 52F, as viewed in the x-direction. The second portion 52G overlaps with the first base portion 55, as viewed in the y-direction. The shape of the second portion 52G is not specifically limited, and a desired shape may be selected from a rectangular shape, a polygonal shape, a circular shape, an elliptical shape, and so forth. In the illustrated example, the second portion 52G has a rectangular shape.

The third portion 53G is interposed between the first base portion 55 and the second portion 52G and, in the illustrated example, connected to the edge of the first base portion 55 on the side of the fifth face 35 in the y-direction. The shape of the third portion 53G is not specifically limited. In the illustrated example, the third portion 53G has a strip shape extending along the y-direction. The edge of the third portion 53G on the side of the fourth face 34 in the x-direction generally coincides with the edge of the first base portion 55 on the side of the fourth face 34 in the x-direction, as viewed in the y-direction. Here, the expression "generally coincides" as viewed in the y-direction refers to, for example, exactly coinciding with each other, or being deviated by within ±5% of the characteristic size (size of the third portion 53G or first base portion 55 in the x-direction). The third portion 53G is spaced apart from the second portion 52G, as viewed in the x-direction.

The fourth portion 54G is interposed between the third portion 53G and the second portion 52G and, in the illustrated example, connected to the edge of the second portion 52G on the side of the sixth face 36 in the y-direction. The shape of the fourth portion 54G is not specifically limited. In the illustrated example, the fourth portion 54G has a strip shape inclined with respect to the x-direction and the y-direction. The fourth portion 54G is spaced apart from the first base portion 55, as viewed in the x-direction. In addition, the fourth portion 54G is generally parallel to the third portion 54F. Here, the expression "generally parallel" refers to, for example, being exactly parallel to each other, or a situation where the angles with respect to the x-direction or y-direction are different by within ±5%.

The fifth portion 55G is interposed between the third portion 53G and the fourth portion 54G and, in the illustrated example, connected to the third portion 53G. The shape of the fifth portion 55G is not specifically limited. In the illustrated example, the fifth portion 55G has a strip shape inclined with respect to the x-direction and the y-direction. The fifth portion 55G is generally parallel to the third portion 53F. Here, the expression "generally parallel" refers to, for example, being exactly parallel to each other, or a situation where the angles with respect to the x-direction or y-direction are different by within ±5%.

The sixth portion 56G is interposed between the fifth portion 55G and the fourth portion 54G and, in the illustrated example, connected to the fifth portion 55G and the fourth portion 54G. The shape of the sixth portion 56G is not specifically limited. In the illustrated example, the sixth portion 56G has a strip shape extending along the x-direction.

The wiring 50H includes a first portion 51H, a second portion 52H, a third portion 53H, and a fourth portion 54H, each of which will be described hereunder.

The first portion 51H is located between the first base portion 55 and the second base portion 56, as viewed in the y-direction. In the illustrated example, a part of the first portion 51H overlaps with the first base portion 55 and the second base portion 56, as viewed in the x-direction. The shape of the first portion 51H is not specifically limited. In the illustrated example, the first portion 51H has a strip shape extending in the x-direction.

The second portion 52H is located on the side of the fifth face 35 in the y-direction, and on the side of the third face 33 in the x-direction, with respect to the first portion 51H. The second portion 52H is located on the side of the fourth face 34 in the x-direction with respect to the second portion 52G. The second portion 52H overlaps with the second portion 52G, as viewed in the x-direction. The shape of the second portion 52H is not specifically limited, and a desired shape may be selected from a rectangular shape, a polygonal shape, a circular shape, an elliptical shape, and so forth. In the illustrated example, the second portion 52H has a rectangular shape.

The third portion 53H is interposed between the first portion 51H and the second portion 52H and, in the illustrated example, connected to the edge of the first portion 51H on the side of the fifth face 35 in the y-direction, at a position on the side of the third face 33, in the x-direction. The shape of the third portion 53H is not specifically limited.

In the illustrated example, the third portion 53H has a strip shape extending along the y-direction.

The fourth portion 54H is interposed between the first portion 51H and the second portion 52H and, in the illustrated example, connected to the third portion 53H and the second portion 52H. The shape of the fourth portion 54H is not specifically limited. In the illustrated example, the fourth portion 54H has a strip shape inclined with respect to the x-direction and the y-direction. The fourth portion 54H is generally parallel to the fifth portion 55G. Here, the expression "generally parallel" refers to, for example, being exactly parallel to each other, or a situation where the angles with respect to the x-direction or y-direction are different by within ±5%.

The wiring 50I includes a first portion 51I, a second portion 52I, a third portion 53I, a fourth portion 54I, and a fifth portion 55I, each of which will be described hereunder.

The first portion 51I is located on the side of the fifth face 35 in the y-direction with respect to the third base portion 58, and spaced therefrom. In the illustrated example, the first portion 51I overlaps with the third base portion 58, as viewed in the y-direction. The shape of the first portion 51I is not specifically limited. In the illustrated example, the first portion 51I has a rectangular shape.

The second portion 52I is located on the side of the fifth face 35 with respect to the first portion 51I, in the y-direction. The second portion 52I is located on the side of the fourth face 34 in the x-direction with respect to the second portion 52H, and spaced therefrom. The second portion 52I is spaced apart from the third base portion 58, as viewed in the y-direction. The second portion 52I overlaps with the second portion 52H, as viewed in the x-direction. The shape of the second portion 52I is not specifically limited, and a desired shape may be selected from a rectangular shape, a polygonal shape, a circular shape, an elliptical shape, and so forth. In the illustrated example, the second portion 52I has a rectangular shape.

The third portion 53I is interposed between the first portion 51I and the second portion 52I and, in the illustrated example, connected to the edge of the first portion 51I on the side of the third face 33 in the x-direction. The shape of the third portion 53I is not specifically limited. In the illustrated example, the third portion 53I has a strip shape extending along the x-direction. An end portion of the third portion 53I includes a portion extending from the third base portion 58 toward the third face 33, as viewed in the y-direction.

The fourth portion 54I is interposed between the first portion 51I and the second portion 52I and, in the illustrated example, connected to the edge of the second portion 52I on the side of the sixth face 36 in the y-direction. The shape of the fourth portion 54I is not specifically limited. In the illustrated example, the fourth portion 54I has a strip shape extending along the y-direction. The fourth portion 54I is spaced apart from the first portion 51I, as viewed in the x-direction.

The fifth portion 55I is interposed between the third portion 53I and the fourth portion 54I and, in the illustrated example, connected to the third portion 53I and the fourth portion 54I. The shape of the fifth portion 55I is not specifically limited. In the illustrated example, the fifth portion 55I has a strip shape inclined with respect to the x-direction and the y-direction.

The wiring 50J includes a first portion 51J, a second portion 52J, a third portion 53J, a fourth portion 54J, and a fifth portion 55J, each of which will be described hereunder.

The first portion 51J is located on the side of the fifth face 35 in the y-direction with respect to the third base portion 58, and spaced therefrom. In the illustrated example, the first portion 51J overlaps with the third base portion 58, as viewed in the y-direction. The first portion 51J is located on the side of the fourth face 34 in the x-direction with respect to the first portion 51I, and spaced therefrom. The first portion 51J overlaps with the first portion 51I, as viewed in the x-direction. The shape of the first portion 51J is not specifically limited. In the illustrated example, the first portion 51J has a rectangular shape.

The second portion 52J is located on the side of the fifth face 35 with respect to the first portion 51J, in the y-direction. The second portion 52J is located on the side of the fourth face 34 in the x-direction with respect to the second portion 52I, and spaced therefrom. The second portion 52J is spaced apart from the third base portion 58, as viewed in the y-direction. The second portion 52J overlaps with the second portion 52I, as viewed in the x-direction. The shape of the second portion 52J is not specifically limited, and a desired shape may be selected from a rectangular shape, a polygonal shape, a circular shape, an elliptical shape, and so forth. In the illustrated example, the second portion 52J has a rectangular shape.

The third portion 53J is interposed between the first portion 51J and the second portion 52J and, in the illustrated example, connected to the edge of the first portion 51J on the side of the third face 33 in the x-direction. The shape of the third portion 53J is not specifically limited. In the illustrated example, the third portion 53J has a strip shape extending along the x-direction. An end portion of the third portion 53J includes a portion extending from the third base portion 58 toward the third face 33, as viewed in the y-direction. The third portion 53J is located on the side of the fifth face 35 in the y-direction with respect to the third portion 53I, and spaced therefrom.

The fourth portion 54J is interposed between the first portion 51J and the second portion 52J and, in the illustrated example, connected to the edge of the second portion 52J on the side of the sixth face 35 in the y-direction. The shape of the fourth portion 54J is not specifically limited. In the illustrated example, the fourth portion 54J has a strip shape extending along the y-direction. The fourth portion 54J is spaced apart from the first portion 51J, as viewed in the x-direction. The fourth portion 54J is longer than the fourth portion 54I.

The fifth portion 55J is interposed between the third portion 53J and the fourth portion 54J and, in the illustrated example, connected to the third portion 53J and the fourth portion 54J. The shape of the fifth portion 55J is not specifically limited. In the illustrated example, the fifth portion 55J has a strip shape inclined with respect to the x-direction and the y-direction. The fifth portion 55J is generally parallel to the fifth portion 55I. Here, the expression "generally parallel" refers to, for example, being exactly parallel to each other, or a situation where the angles with respect to the x-direction or y-direction are different by within ±5%. The fifth portion 55J is shorter than the fifth portion 55I.

The wiring 50K includes a first portion 51K, a second portion 52K, a third portion 53K, a fourth portion 54K, and a fifth portion 55K, each of which will be described hereunder.

The first portion 51K is located on the side of the fifth face 35 in the y-direction with respect to the third base portion 58, and spaced therefrom. In the illustrated example, the first portion 51K overlaps with the third base portion 58, as viewed in the y-direction. The first portion 51K is located on the side of the fourth face 34 in the x-direction with respect to the first portion 51J, and spaced therefrom. The first portion 51K overlaps with the first portion 51J, as viewed in the x-direction. The shape of the first portion 51K is not specifically limited. In the illustrated example, the first portion 51K has a rectangular shape.

The second portion 52K is located on the side of the fifth face 35 with respect to the first portion 51K, in the y-direction. The second portion 52K is located on the side of the fourth face 34 in the x-direction with respect to the second portion 52J, and spaced therefrom. The second portion 52K overlaps with the third base portion 58, as viewed in the y-direction. The second portion 52K overlaps with the second portion 52J, as viewed in the x-direction. The shape of the second portion 52K is not specifically limited, and a desired shape may be selected from a rectangular shape, a polygonal shape, a circular shape, an elliptical shape, and so forth. In the illustrated example, the second portion 52K has a rectangular shape.

The third portion 53K is interposed between the first portion 51K and the second portion 52K and, in the illustrated example, connected to the edge of the first portion 51K on the side of the third face 33 in the x-direction. The shape of the third portion 53K is not specifically limited. In the illustrated example, the third portion 53K has a strip shape extending along the x-direction. The third portion 53K overlaps with the third base portion 58, as viewed in the y-direction. The third portion 53K is located on the side of the fifth face 35 in the y-direction with respect to the third portion 53J, and spaced therefrom.

The fourth portion 54K is interposed between the first portion 51K and the second portion 52K and, in the illustrated example, connected to the edge of the second portion 52K on the side of the sixth face 36 in the y-direction. The shape of the fourth portion 54K is not specifically limited. In the illustrated example, the fourth portion 54K has a strip shape extending along the y-direction. The fourth portion 54K is spaced apart from the first portion 51K, as viewed in the x-direction. The fourth portion 54K is longer than the fourth portion 54J.

The fifth portion 55K is interposed between the third portion 53K and the fourth portion 54K and, in the illustrated example, connected to the third portion 53K and the fourth portion 54K. The shape of the fifth portion 55K is not specifically limited. In the illustrated example, the fifth portion 55K has a strip shape inclined with respect to the x-direction and the y-direction. The fifth portion 55K is generally parallel to the fifth portion 55J. Here, the expression "generally parallel" refers to, for example, being exactly parallel to each other, or a situation where the angles with respect to the x-direction or y-direction are different by within ±5%. The fifth portion 55K is shorter than the fifth portion 55J.

The wiring 50L includes a first portion 51L, a second portion 52L, a third portion 53L, a fourth portion 54L, and a fifth portion 55L, each of which will be described hereunder.

The first portion 51L is located on the side of the fifth face 35 in the y-direction with respect to the third base portion 58, and spaced therefrom. In the illustrated example, the first portion 51L overlaps with the third base portion 58, as viewed in the y-direction. The first portion 51L is located on the side of the fourth face 34 in the x-direction with respect to the first portion 51K, and spaced therefrom. The first portion 51L overlaps with the first portion 51K, as viewed in the x-direction. The shape of the first portion 51L is not specifically limited. In the illustrated example, the first portion 51L has a rectangular shape.

The second portion 52L is located on the side of the fifth face 35 with respect to the first portion 51L, in the y-direction. The second portion 52L is located on the side of the fourth face 34 in the x-direction with respect to the second portion 52K, and spaced therefrom. The second portion 52L overlaps with the third base portion 58, as viewed in the y-direction. The second portion 52L overlaps with the second portion 52K, as viewed in the x-direction. The shape of the second portion 52L is not specifically limited, and a desired shape may be selected from a rectangular shape, a polygonal shape, a circular shape, an elliptical shape, and so forth. In the illustrated example, the second portion 52L has a rectangular shape.

The third portion 53L is interposed between the first portion 51L and the second portion 52L and, in the illustrated example, connected to the edge of the first portion 51L on the side of the fifth face 35 in the y-direction. The shape of the third portion 53L is not specifically limited. In the illustrated example, the third portion 53L has a strip shape extending along the y-direction. The third portion 53L overlaps with the third base portion 58, as viewed in the y-direction.

The fourth portion 54L is interposed between the first portion 51L and the second portion 52L and, in the illustrated example, connected to the edge of the second portion 52L on the side of the sixth face 36 in the y-direction. The shape of the fourth portion 54L is not specifically limited. In the illustrated example, the fourth portion 54L has a strip shape extending along the y-direction. The fourth portion 54L is spaced apart from the first portion 51L, as viewed in the x-direction.

The fifth portion 55L is interposed between the third portion 53L and the fourth portion 54L and, in the illustrated example, connected to the third portion 53L and the fourth portion 54L. The shape of the fifth portion 55L is not specifically limited. In the illustrated example, the fifth portion 55L has a strip shape inclined with respect to the x-direction and the y-direction. The fifth portion 55L is generally parallel to the fifth portion 55K. Here, the expression "generally parallel" refers to, for example, being exactly parallel to each other, or a situation where the angles with respect to the x-direction or y-direction are different by within ±5%. The fifth portion 55L is longer than the fifth portion 55K.

The wiring 50M includes a first portion 51M, a second portion 52M, and a third portion 53M, each of which will be described hereunder.

The first portion 51M is located on the side of the fifth face 35 in the y-direction with respect to the third base portion 58, and spaced therefrom. In the illustrated example, the first portion 51M overlaps with the third base portion 58, as viewed in the y-direction. The first portion 51M is located on the side of the fourth face 34 in the x-direction with respect to the first portion 51L, and spaced therefrom. The first portion 51M overlaps with the first portion 51L, as viewed in the x-direction. The shape of the first portion 51M is not specifically limited. In the illustrated example, the first portion 51M has a rectangular shape.

The second portion 52M is located on the side of the fifth face 35 with respect to the first portion 51M, in the y-direction. The second portion 52M is located on the side of the fourth face 34 in the x-direction with respect to the second portion 52L, and spaced therefrom. The second portion 52M overlaps with the third base portion 58, as viewed in the y-direction. The second portion 52M overlaps with the second portion 52L, as viewed in the x-direction. The shape of the second portion 52M is not specifically limited, and a desired shape may be selected from a rectangular shape, a polygonal shape, a circular shape, an elliptical shape, and so forth. In the illustrated example, the second portion 52M has a rectangular shape.

The third portion 53M is interposed between the first portion 51M and the second portion 52M and, in the illustrated example, connected to the first portion 51M and the second portion 52M. The shape of the third portion 53M is not specifically limited. In the illustrated example, the third portion 53M has a strip shape extending along the y-direction. The third portion 53M overlaps with the third base portion 58, as viewed in the y-direction.

The wiring 50N includes a first portion 51N, a second portion 52N, a third portion 53N, a fourth portion 54N, and a fifth portion 55N, each of which will be described hereunder.

The first portion 51N is located on the side of the fifth face 35 in the y-direction with respect to the third base portion 58, and spaced therefrom. In the illustrated example, the first portion 51N overlaps with the third base portion 58, as viewed in the y-direction. The first portion 51N is located on the side of the fourth face 34 in the x-direction with respect to the first portion 51M, and spaced therefrom. The first portion 51N overlaps with the first portion 51M, as viewed in the x-direction. The shape of the first portion 51N is not specifically limited. In the illustrated example, the first portion 51N has a rectangular shape.

The second portion 52N is located on the side of the fifth face 35 with respect to the first portion 51N, in the y-direction. The second portion 52N is located on the side of the fourth face 34 in the x-direction with respect to the second portion 52M, and spaced therefrom. The second portion 52N overlaps with the third base portion 58, as viewed in the y-direction. The second portion 52N overlaps with the second portion 52M, as viewed in the x-direction. The shape of the second portion 52N is not specifically limited, and a desired shape may be selected from a rectangular shape, a polygonal shape, a circular shape, an elliptical shape, and so forth. In the illustrated example, the second portion 52N has a rectangular shape.

The third portion 53N is interposed between the first portion 51N and the second portion 52N and, in the illustrated example, connected to the edge of the first portion 51N on the side of the fifth face 35 in the y-direction. The shape of the third portion 53N is not specifically limited. In the illustrated example, the third portion 53N has a strip shape extending along the y-direction. The third portion 53N overlaps with the third base portion 58, as viewed in the y-direction.

The fourth portion 54N is interposed between the first portion 51N and the second portion 52N and, in the illustrated example, connected to the edge of the second portion 52N on the side of the sixth face 36 in the y-direction. The shape of the fourth portion 54N is not specifically limited. In the illustrated example, the fourth portion 54N has a strip shape extending along the y-direction. The fourth portion 54N is spaced apart from the first portion 51N, as viewed in the x-direction.

The fifth portion 55N is interposed between the third portion 53N and the fourth portion 54N and, in the illustrated example, connected to the third portion 53N and the fourth portion 54N. The shape of the fifth portion 55N is not specifically limited. In the illustrated example, the fifth portion 55N has a strip shape inclined with respect to the x-direction and the y-direction.

The wiring 50O includes a first portion 51O, a second portion 52O, a third portion 53O, a fourth portion 54O, and a fifth portion 55O, each of which will be described hereunder.

The first portion 51O is located on the side of the fifth face 35 in the y-direction with respect to the third base portion 58, and spaced therefrom. In the illustrated example, the first portion 51O overlaps with the third base portion 58, as viewed in the y-direction. The first portion 51O is located on the side of the fourth face 34 in the x-direction with respect to the first portion 51N, and spaced therefrom. The first portion 51O overlaps with the first portion 51N, as viewed in the x-direction. The shape of the first portion 51O is not specifically limited. In the illustrated example, the first portion 51O has a rectangular shape.

The second portion 52O is located on the side of the fifth face 35 with respect to the first portion 51O, in the y-direction. The second portion 52O is located on the side of the fourth face 34 in the x-direction with respect to the second portion 52N, and spaced therefrom. The second portion 52O overlaps with the third base portion 58, as viewed in the y-direction. The second portion 52O overlaps with the second portion 52N, as viewed in the x-direction. The shape of the second portion 52O is not specifically limited, and a desired shape may be selected from a rectangular shape, a polygonal shape, a circular shape, an elliptical shape, and so forth. In the illustrated example, the second portion 52O has a rectangular shape.

The third portion 53O is interposed between the first portion 51O and the second portion 52O and, in the illustrated example, connected to the edge of the first portion 51O on the side of the fourth face 34 in the x-direction. The shape of the third portion 53O is not specifically limited. In the illustrated example, the third portion 53O has a strip shape extending along the x-direction. The third portion 53O overlaps with the third base portion 58, as viewed in the y-direction.

The fourth portion 54O is interposed between the first portion 51O and the second portion 52O and, in the illustrated example, connected to the edge of the second portion 52O on the side of the sixth face 36 in the y-direction. The shape of the fourth portion 54O is not specifically limited. In the illustrated example, the fourth portion 54O has a strip shape extending along the y-direction. The fourth portion 54O is spaced apart from the first portion 51O, as viewed in the x-direction.

The fifth portion 55O is interposed between the third portion 53O and the fourth portion 54O and, in the illustrated example, connected to the third portion 53O and the fourth portion 54O. The shape of the fifth portion 55O is not specifically limited. In the illustrated example, the fifth portion 55O has a strip shape inclined with respect to the x-direction and the y-direction. The fifth portion 55O is generally parallel to the fifth portion 55N. Here, the expression "generally parallel" refers to, for example, being exactly parallel to each other, or a situation where the angles with respect to the x-direction or y-direction are different by within ±5%.

The wiring 50P includes a first portion 51P, a second portion 52P, a third portion 53P, a fourth portion 54P, and a fifth portion 55P, each of which will be described hereunder.

The first portion 51P is located on the side of the fifth face 35 in the y-direction with respect to the third base portion 58, and spaced therefrom. In the illustrated example, the first portion 51P overlaps with the third base portion 58, as viewed in the y-direction. The first portion 51P is located on the side of the fourth face 34 in the x-direction with respect to the first portion 51O, and spaced therefrom. The first portion 51P overlaps with the first portion 51O, as viewed in the x-direction. The shape of the first portion 51P is not specifically limited. In the illustrated example, the first portion 51P has a rectangular shape.

The second portion 52P is located on the side of the fifth face 35 with respect to the first portion 51P, in the y-direction. The second portion 52P is located on the side of the fourth face 34 in the x-direction with respect to the second portion 52O, and spaced therefrom. The second portion 52P is spaced apart from the third base portion 58, as viewed in the y-direction. The second portion 52P overlaps with the second portion 52O, as viewed in the x-direction. The shape of the second portion 52P is not specifically limited, and a desired shape may be selected from a rectangular shape, a polygonal shape, a circular shape, an elliptical shape, and so forth. In the illustrated example, the second portion 52P has a rectangular shape.

The third portion 53P is interposed between the first portion 51P and the second portion 52P and, in the illustrated example, connected to the edge of the first portion 51P on the side of the fourth face 34 in the x-direction. The shape of the third portion 53P is not specifically limited. In the illustrated example, the third portion 53P has a strip shape extending along the x-direction. An end portion of the third portion 53P includes a portion extending from the third base portion 58 toward the fourth face 34, as viewed in the y-direction.

The fourth portion 54P is interposed between the first portion 51P and the second portion 52P and, in the illustrated example, connected to the edge of the second portion 52P on the side of the sixth face 36 in the y-direction. The shape of the fourth portion 54P is not specifically limited. In the illustrated example, the fourth portion 54P has a strip shape extending along the y-direction. The fourth portion 54P is spaced apart from the first portion 51P, as viewed in the x-direction.

The fifth portion 55P is interposed between the third portion 53P and the fourth portion 54P and, in the illustrated example, connected to the third portion 53P and the fourth portion 54P. The shape of the fifth portion 55P is not specifically limited. In the illustrated example, the fifth portion 55P has a strip shape inclined with respect to the x-direction and the y-direction. The fifth portion 55P is generally parallel to the fifth portion 55O. Here, the expression "generally parallel" refers to, for example, being exactly parallel to each other, or a situation where the angles with respect to the x-direction or y-direction are different by within ±5%. The fifth portion 55P is longer than the fifth portion 55O.

The wiring 50Q includes a first portion 51Q, a second portion 52Q, a third portion 53Q, and a fourth portion 54Q, each of which will be described hereunder.

The first portion 51Q is located on the side of the fourth face 34 in the x-direction, with respect to the third base portion 58. The first portion 51Q overlaps with the edge 582 of the third base portion 58, as viewed in the x-direction. The first portion 51Q overlaps with the edge 581 of the third base portion 58, as viewed in the y-direction. The shape of the first portion 51Q is not specifically limited. In the illustrated example, the first portion 51Q has a rectangular shape.

The second portion 52Q is located on the side of the fifth face 35 with respect to the first portion 51Q, in the y-direction. The second portion 52Q is located on the side of the fourth face 34 in the x-direction with respect to the second portion 52P, and spaced therefrom. The second portion 52Q is spaced apart from the third base portion 58, as viewed in the y-direction. The second portion 52Q overlaps with the second portion 52P, as viewed in the x-direction. The shape of the second portion 52Q is not specifically limited, and a desired shape may be selected from a rectangular shape, a polygonal shape, a circular shape, an elliptical shape, and so forth. In the illustrated example, the second portion 52Q has a rectangular shape.

The third portion 53Q is interposed between the first portion 51Q and the second portion 52Q and, in the illustrated example, connected to the edge of the first portion 51Q on the side of the fourth face 34 in the x-direction. The shape of the third portion 53Q is not specifically limited. In the illustrated example, the third portion 53Q has a strip shape inclined with respect to the x-direction and the y-direction. The third portion 53Q is spaced apart from the third base portion 58 toward the fourth face 34, as viewed in the y-direction. The third portion 53Q is generally parallel to the fifth portion 55P. Here, the expression "generally parallel" refers to, for example, being exactly parallel to each other, or a situation where the angles with respect to the x-direction or y-direction are different by within ±5%. The third portion 53Q is longer and wider than the fifth portion 55P.

The fourth portion 54Q is interposed between the first portion 51Q and the second portion 52Q and, in the illustrated example, connected to the edge of the second portion 52Q on the side of the sixth face 36 in the y-direction, and the third portion 53Q. The shape of the fourth portion 54Q is not specifically limited. In the illustrated example, the fourth portion 54Q extends along the y-direction. The fourth portion 54Q is spaced apart from the first portion 51Q, as viewed in the x-direction. The fourth portion 54Q is shorter and wider than the fourth portion 54P.

The wiring 50R includes a second portion 52R, a third portion 53R, a fourth portion 54R, and a fifth portion 55R, each of which will be described hereunder.

The second portion 52R is located on the side of the fifth face 35 with respect to the first portion 51R, in the y-direction. The second portion 52R is located on the side of the fourth face 34 in the x-direction with respect to the second portion 52Q, and spaced therefrom. The second portion 52R is spaced apart from the third base portion 58, as viewed in the y-direction. The second portion 52R overlaps with the second portion 52Q, as viewed in the x-direction. The shape of the second portion 52R is not specifically limited, and a desired shape may be selected from a rectangular shape, a polygonal shape, a circular shape, an elliptical shape, and so forth. In the illustrated example, the second portion 52R has a rectangular shape.

The third portion 53R is connected to the end portion of the third base portion 58 on the side of the fourth face 34 in the x-direction. The third portion 53R is located between the edge 581 and the edge 582, as viewed in the x-direction, and connected to the edge 581 and the edge 582. The shape of the third portion 53R is not specifically limited. In the illustrated example, the third portion 53R has a strip shape extending along the x-direction. The third portion 53R is wider than the third portion 53P.

The fourth portion 54R is interposed between the second portion 52R and the third portion 53R and, in the illustrated example, connected to the edge of the second portion 52R on the side of the sixth face 36 in the y-direction. The shape of the fourth portion 54R is not specifically limited. In the illustrated example, the fourth portion 54R extends along the y-direction. The fourth portion 54R is spaced apart from the first portion 51R, as viewed in the x-direction. The fourth portion 54R is shorter than the fourth portion 54Q. The fourth portion 54R has generally the same width as the fourth portion 54Q. Here, the expression "generally the same width" refers to, for example, being exactly the same, or different by within ±5% from each other's width.

The fifth portion 55R is interposed between the third portion 53R and the fourth portion 54R and, in the illustrated example, connected to the third portion 53R and the fourth portion 54R. The shape of the fifth portion 55R is not specifically limited. In the illustrated example, the fifth portion 55R has a strip shape inclined with respect to the x-direction and the y-direction. The fifth portion 55R is generally parallel to the third portion 53Q. Here, the expression "generally parallel" refers to, for example, being exactly parallel to each other, or a situation where the angles with respect to the x-direction or y-direction are different by within ±5%. The fifth portion 55R has generally the same width as the third portion 53Q. Here, the expression "generally the same width" refers to, for example, being exactly the same, or different by within ±5% from each other's width.

The wiring 50S includes a first portion 51S, a second portion 52S, a third portion 53S, a fourth portion 54S, and a fifth portion 55S, each of which will be described hereunder.

The first portion 51S is located on the side of the fourth face 34 in the x-direction, with respect to the third base portion 58, and spaced therefrom. The first portion 51S is located on the side of the sixth face 36 in the y-direction, with respect to the third base portion 58, and spaced therefrom. In the illustrated example, the first portion 51S overlaps with the third base portion 58, as viewed in the y-direction. The first portion 51S overlaps with the second base portion 56, as viewed in the x-direction. The shape of the first portion 51S is not specifically limited. In the illustrated example, the first portion 51S has a rectangular shape.

The second portion 52S is located on the side of the fifth face 35 with respect to the first portion 51S, in the y-direction. The second portion 52S is located on the side of the fourth face 34 in the x-direction with respect to the second portion 52R, and spaced therefrom. The second portion 52S is spaced apart from the third base portion 58, as viewed in the y-direction. The second portion 52S overlaps with the second portion 52R, as viewed in the x-direction. The shape of the second portion 52S is not specifically limited, and a desired shape may be selected from a rectangular shape, a polygonal shape, a circular shape, an elliptical shape, and so forth. In the illustrated example, the second portion 52S has a rectangular shape.

The third portion 53S is interposed between the first portion 51S and the second portion 52S and, in the illustrated example, connected to the edge of the first portion 51S on the side of the fourth face 34 in the x-direction. The shape of the third portion 53S is not specifically limited. In the illustrated example, the third portion 53S has a strip shape extending along the x-direction. The third portion 53S overlaps with the third portion 53R, the fourth portion 54R, and the fifth portion 55R, as viewed in the y-direction.

The fourth portion 54S is interposed between the first portion 51S and the second portion 52S and, in the illustrated example, connected to the edge of the second portion 52S on the side of the sixth face 36 in the y-direction. The shape of the fourth portion 54S is not specifically limited. In the illustrated example, the fourth portion 54S has a strip shape extending along the y-direction. The fourth portion 54S overlaps with the third base portion 58, the third portion 53R, the fourth portion 54R, and the fifth portion 55R, as viewed in the x-direction.

The fifth portion 55S is interposed between the third portion 53S and the fourth portion 54S and, in the illustrated example, connected to the third portion 53S and the fourth portion 54S. The shape of the fifth portion 55S is not specifically limited. In the illustrated example, the fifth portion 55S has a strip shape inclined with respect to the x-direction and the y-direction. The fifth portion 55S is generally parallel to the fifth portion 55R. Here, the expression "generally parallel" refers to, for example, being exactly parallel to each other, or a situation where the angles with respect to the x-direction or y-direction are different by within ±5%. The fifth portion 55S is shorter than the fifth portion 55R.

The wiring 50T includes a first portion 51T, a second portion 52T, a third portion 53T, a fourth portion 54T, and a fifth portion 55T, each of which will be described hereunder.

The first portion 51T is located on the side of the fourth face 34 in the x-direction, with respect to the third base portion 58, and spaced therefrom. The first portion 51T is located on the side of the sixth face 36 in the y-direction, with respect to the first portion 51S, and spaced therefrom. In the illustrated example, the first portion 51T overlaps with the first portion 51S, as viewed in the y-direction. The first portion 51T overlaps with the second base portion 56, as viewed in the x-direction. The shape of the first portion 51T is not specifically limited. In the illustrated example, the first portion 51T has a rectangular shape.

The second portion 52T is located on the side of the fifth face 35 with respect to the first portion 51T, in the y-direction. The second portion 52T is located on the side of the sixth face 36 in the y-direction with respect to the second portion 52S, and spaced therefrom. The second portion 52T is spaced apart from the third base portion 58, as viewed in the y-direction. The second portion 52T overlaps with the second portion 52S, and includes a portion extending toward the fourth face 34, as viewed in the y-direction. The second portion 52T is spaced apart from the second portion 52R toward the sixth face 36, as viewed in the x-direction. The shape of the second portion 52T is not specifically limited, and a desired shape may be selected from a rectangular shape, a polygonal shape, a circular shape, an elliptical shape, and so forth. In the illustrated example, the second portion 52T has a rectangular shape.

The third portion 53T is interposed between the first portion 51T and the second portion 52T and, in the illustrated example, connected to the edge of the first portion 51T on the side of the fourth face 34 in the x-direction. The shape of the third portion 53T is not specifically limited. In the illustrated example, the third portion 53T has a strip shape extending along the x-direction. The third portion 53T overlaps with the third portion 53S, as viewed in the y-direction. In the illustrated example, the third portion 53T is longer and wider than the third portion 53S.

The fourth portion 54T is interposed between the first portion 51T and the second portion 52T and, in the illustrated example, connected to the edge of the second portion 52T on the side of the sixth face 36 in the y-direction. The shape of the fourth portion 54T is not specifically limited. In the illustrated example, the fourth portion 54T has a strip shape extending along the y-direction. The fourth portion 54T overlaps with the third base portion 58 and the fourth portion 54S, as viewed in the x-direction. The fourth portion 54T is wider than the fourth portion 54S.

The fifth portion 55T is interposed between the third portion 53T and the fourth portion 54T and, in the illustrated example, connected to the third portion 53T and the fourth portion 54T. The shape of the fifth portion 55T is not specifically limited. In the illustrated example, the fifth portion 55T has a strip shape inclined with respect to the x-direction and the y-direction. The fifth portion 55T is generally parallel to the fifth portion 55S. Here, the expression "generally parallel" refers to, for example, being exactly parallel to each other, or a situation where the angles with respect to the x-direction or y-direction are different by within ±5%. The fifth portion 55T is longer and wider than the fifth portion 55S.

The wiring 50U includes a second portion 52U, a third portion 53U, a fourth portion 54U, and a fifth portion 55U, each of which will be described hereunder.

The second portion 52U is located on the side of the fifth face 35 with respect to the second base portion 56, in the y-direction. The second portion 52U is located on the side of the sixth face 36 in the y-direction with respect to the second portion 52T, and spaced therefrom. The second portion 52U is spaced apart from the third base portion 58, as viewed in the y-direction. The second portion 52U overlaps with the second portion 52T, and includes a portion extending from the second portion 52T toward the fourth face 34, as viewed in the y-direction. The second portion 52U is spaced apart from the second portion 52R toward the sixth face 36, as viewed in the x-direction. The shape of the second portion 52U is not specifically limited, and a desired shape may be selected from a rectangular shape, a polygonal shape, a circular shape, an elliptical shape, and so forth. In the illustrated example, the second portion 52U has a rectangular shape.

The third portion 53U is located on the side of the sixth face 36 in the y-direction, with respect to the first portion 51T and the third portion 53T. The third portion 53U is connected to the edge of the second base portion 56 on the side of the fourth face 34 in the x-direction. The shape of the third portion 53U is not specifically limited. In the illustrated example, the third portion 53U has a strip shape extending along the x-direction. The third portion 53U overlaps with the third portion 53S, the third portion 53T, and the first portion 51T, as viewed in the y-direction. In the illustrated example, the third portion 53U is longer than the third portion 53T. Further, the third portion 53U has generally the same width as the third portion 53T. Here, the expression "generally the same width" refers to, for example, being exactly the same, or different by within ±5% from each other's width.

The fourth portion 54U is interposed between the first portion 51U and the second portion 52U and, in the illustrated example, connected to the edge of the second portion 52U on the side of the sixth face 36 in the y-direction. The shape of the fourth portion 54U is not specifically limited. In the illustrated example, the fourth portion 54U has a strip shape extending along the y-direction. The fourth portion 54U overlaps with the third base portion 58, the fourth portion 54S, and the fourth portion 54T, as viewed in the x-direction. The fourth portion 54U has generally the same width as the fourth portion 54T. Here, the expression "generally the same width" refers to, for example, being exactly the same, or different by within ±5% from each other's width.

The fifth portion 55U is interposed between the third portion 53U and the fourth portion 54U and, in the illustrated example, connected to the third portion 53U and the fourth portion 54U. The shape of the fifth portion 55U is not specifically limited. In the illustrated example, the fifth portion 55U has a strip shape inclined with respect to the x-direction and the y-direction. The fifth portion 55U is generally parallel to the fifth portion 55T. Here, the expression "generally parallel" refers to, for example, being exactly parallel to each other, or a situation where the angles with respect to the x-direction or y-direction are different by within ±5%. The fifth portion 55U has generally the same width as the fifth portion 55T. Here, the expression "generally the same width" refers to, for example, being exactly the same, or different by within ±5% from each other's width.

The wiring 50*a* includes a first portion 51*a*, a second portion 52*a*, and a third portion 53*a*, each of which will be described hereunder.

The first portion 51*a* is located on the side of the third face 33 in the x-direction with respect to the first base portion 55, and spaced therefrom. The first portion 51*a* is located on the side of the sixth face 36 in the y-direction with respect to the first portion 51A, and spaced therefrom. In the illustrated example, the first portion 51*a* overlaps with the first portion 51A and the first portion 513, as viewed in the y-direction. The first portion 51*a* overlaps with the first base portion 55, as viewed in the x-direction. The shape of the first portion 51*a* is not specifically limited. In the illustrated example, the first portion 51*a* has a rectangular shape.

The second portion 52*a* is located on the side of the third face 33 in the x-direction with respect to the first portion 51*a*, and spaced therefrom. The second portion 52*a* overlaps with the first portion 51*a* and the first base portion 55, as viewed in the x-direction. The second portion 52*a* overlaps with the fifth portion 55A, as viewed in the y-direction. The shape of the second portion 52*a* is not specifically limited, and a desired shape may be selected from a rectangular shape, a polygonal shape, a circular shape, an elliptical shape, and so forth. In the illustrated example, the second portion 52*a* has a rectangular shape.

The third portion 53*a* is interposed between the first portion 51*a* and the second portion 52*a* and, in the illustrated example, connected to the first portion 51*a* and the second portion 52*a*. The shape of the third portion 53*a* is not specifically limited. In the illustrated example, the third portion 53*a* has a strip shape extending along the x-direction. The third portion 53*a* overlaps with the first portion 51*a*, the second portion 52*a*, and the first base portion 55, as viewed in the x-direction. The third portion 53*a* overlaps with the first portion 51A and the fifth portion 55A, as viewed in the y-direction.

The wiring 50*b* includes a first portion 51*b*, a second portion 52*b*, and a third portion 53*b*, each of which will be described hereunder.

The first portion 51*b* is located on the side of the third face 33 in the x-direction with respect to the first base portion 55, and spaced therefrom. The first portion 51*b* is located between the first portion 51*a* and the first portion 51A, in the y-direction. In the illustrated example, the first portion 51*b* overlaps with the first portion 51*a* and the first portion 51A, as viewed in the y-direction. The first portion 51*b* overlaps with the first base portion 55, as viewed in the x-direction. The shape of the first portion 51*b* is not specifically limited. In the illustrated example, the first portion 51*b* has a rectangular shape.

The second portion 52*b* is located on the side of the third face 33 in the x-direction with respect to the first portion 51*b*, and spaced therefrom. In addition, the second portion 52*b* is located on the side of the third face 33 in the x-direction with respect to the second portion 52*b*, and spaced therefrom. The second portion 52*b* overlaps with the first portion 51*b*, the first portion 51*a*, and the second portion 52*a*, as viewed in the x-direction. An end portion of the second portion 52*b* includes a portion extending from the second portion 52*a* toward the fifth face 35, as viewed in the x-direction. The second portion 52*b* overlaps with the fifth portion 55A, as viewed in the y-direction. The shape of the second portion 52*b* is not specifically limited, and a desired shape may be selected from a rectangular shape, a polygonal shape, a circular shape, an elliptical shape, and so forth. In the illustrated example, the second portion 52*b* has a rectangular shape.

The third portion 53*b* is interposed between the first portion 51*b* and the second portion 52*b* and, in the illustrated example, connected to the first portion 51*b* and the second portion 52*b*. The shape of the third portion 53*b* is not specifically limited. In the illustrated example, the third portion 53*b* has a strip shape extending along the x-direction. The third portion 53*b* overlaps with the first portion 51*b*, the second portion 52*b*, and the first base portion 55, as viewed in the x-direction. The third portion 53*b* overlaps with the first portion 51A and the fifth portion 55A, as viewed in the y-direction. In the illustrated example, the third portion 53*b* is longer than the third portion 53*a*, and has generally the same width as the third portion 53*a*. Here, the expression "generally the same width" refers to, for example, being exactly the same, or different by within ±5% from each other's width.

The wiring 50*c* includes a first portion 51*c*, a second portion 52*c*, and a third portion 53*c*, each of which will be described hereunder.

The first portion 51*c* is located on the side of the fourth face 34 in the x-direction with respect to the first base portion 55, and spaced therefrom. The first portion 51*c* is located between the connecting portion 57 and the first portion 51H, in the y-direction. In the illustrated example, the first portion 51*c* overlaps with the first portion 571 and the second portion 572 of the connecting portion 57, as viewed in the y-direction. The first portion 51*c* overlaps with the first base portion 55, as viewed in the x-direction. The shape of the first portion 51*c* is not specifically limited. In the illustrated example, the first portion 51*c* has a polygonal shape including three sides inclined with respect to the x-direction and the y-direction.

The second portion 52*c* is located on the side of the fourth face 34 in the x-direction with respect to the first portion 51*c*, with a spacing therefrom, and on the side of the third face 33 in the x-direction with respect to the second base portion 56, with a spacing therefrom. The second portion 52*c* overlaps with the second base portion 56, as viewed in the x-direction. The second portion 52*c* overlaps with the first portion 571 and the third portion 573 of the connecting portion 57, as viewed in the y-direction. The shape of the second portion 52*c* is not specifically limited, and a desired shape may be selected from a rectangular shape, a polygonal shape, a circular shape, an elliptical shape, and so forth. In the illustrated example, the second portion 52*c* has a polygonal shape including three sides inclined with respect to the x-direction and the y-direction.

The third portion 53*c* is interposed between the first portion 51*c* and the second portion 52*c* and, in the illustrated example, connected to the first portion 51*c* and the second portion 52*c*. The shape of the third portion 53*c* is not specifically limited. In the illustrated example, the third portion 53*c* has a strip shape extending along the x-direction. The third portion 53*c* overlaps with the first portion 51*c*, the second portion 52*c*, the first base portion 55, and the second base portion 56, as viewed in the x-direction. The third portion 53*c* overlaps with the first portion 571 of the connecting portion 57, as viewed in the y-direction. In the illustrated example, the third portion 53*c* has generally the same width as the first portion 571. Here, the expression "generally the same width" refers to, for example, being exactly the same, or different by within ±5% from each other's width.

The wiring 50*d* includes a first portion 51*d*, a second portion 52*d*, and a third portion 53*d*, each of which will be described hereunder.

The first portion 51*d* is located on the side of the fourth face 34 in the x-direction with respect to the first base portion 55, with a spacing therefrom, and on the side of the fourth face 34 with respect to the first portion 51*c*, with a spacing therefrom. The first portion 51*d* is located between the connecting portion 57 and the first portion 51H in the y-direction, at a position shifted toward the fifth face 35 from the first portion 51*c*. In the illustrated example, the first portion 51*d* overlaps with the first portion 571 of the connecting portion 57, as viewed in the y-direction. The first portion 51*d* overlaps with the first base portion 55 and the first portion 51*c*, as viewed in the x-direction. The shape of the first portion 51*d* is not specifically limited. In the illustrated example, the first portion 51*d* has a polygonal shape including three sides inclined with respect to the x-direction and the y-direction.

The second portion 52*d* is located on the side of the fourth face 34 in the x-direction with respect to the first portion Sid, with a spacing therefrom, and on the side of the third face 33 in the x-direction with respect to the second base portion 56, with a spacing therefrom. The second portion 52*d* is located at a position shifted toward the third face 33 in the x-direction, from the second portion 52*c*. The second portion 52*d* overlaps with the second base portion 56, as viewed in the x-direction. The second portion 52*d* overlaps with the first portion 571 of the connecting portion 57, as viewed in the y-direction. The shape of the second portion 52*d* is not specifically limited, and a desired shape may be selected from a rectangular shape, a polygonal shape, a circular shape, an elliptical shape, and so forth. In the illustrated example, the second portion 52*d* has a polygonal shape including three sides inclined with respect to the x-direction and the y-direction.

The third portion 53*d* is interposed between the first portion 51*d* and the second portion 52*d* and, in the illustrated example, connected to the first portion 51*d* and the second portion 52*d*. The shape of the third portion 53*d* is not specifically limited. In the illustrated example, the third portion 53*d* has a strip shape extending along the x-direction. The third portion 53*d* overlaps with the first portion 51*d*, the second portion 52*d*, the first base portion 55, and the second base portion 56, as viewed in the x-direction. The third portion 53*d* overlaps with the first portion 571 of the connecting portion 57, as viewed in the y-direction. In the illustrated example, the third portion 53*d* is shorter than the third portion 53*c*, and has generally the same width as the third portion 53*c*. Here, the expression "generally the same width" refers to, for example, being exactly the same, or different by within ±5% from each other's width.

The wiring 50*e* includes a first portion 51*e*, a second portion 52*e*, and a third portion 53*e*, each of which will be described hereunder.

The first portion 51*e* is located on the side of the fourth face 34 in the x-direction with respect to the first base portion 55, and spaced therefrom. The first portion 51*e* is located between the connecting portion 57 and the first portion 51H in the y-direction, at a position shifted toward the fifth face 35 from the first portion 51*d*. In the illustrated example, the first portion 51*e* overlaps with the first portion 571 and the second portion 572 of the connecting portion 57, as viewed in the y-direction. The first portion 51*e* overlaps with the first base portion 55 and the first portion 51*d*, as viewed in the x-direction. The shape of the first portion 51*e* is not specifically limited. In the illustrated example, the first portion 51*e* has a polygonal shape including two sides inclined with respect to the x-direction and the y-direction.

The second portion 52*e* is located on the side of the fourth face 34 in the x-direction with respect to the first portion 51*e*, with a spacing therefrom, and on the side of the third face 33 in the x-direction with respect to the second base portion 56, with a spacing therefrom. The second portion 52*e* is located at a position shifted toward the fourth face 34 in the x-direction, from the second portion 52*d*. The second portion 52*e* overlaps with the second base portion 56, as viewed in the x-direction. The second portion 52*e* overlaps with the second portion 52*c*, the second portion 52*d*, and the first portion 571 and the third portion 573 of the connecting portion 57, as viewed in the y-direction. The shape of the second portion 52*e* is not specifically limited, and a desired shape may be selected from a rectangular shape, a polygonal shape, a circular shape, an elliptical shape, and so forth. In the illustrated example, the second portion 52*e* has a polygonal shape including two sides inclined with respect to the x-direction and the y-direction.

The third portion 53*e* is interposed between the first portion 51*e* and the second portion 52*e* and, in the illustrated example, connected to the first portion 51*e* and the second portion 52*e*. The shape of the third portion 53*e* is not specifically limited. In the illustrated example, the third portion 53*e* has a strip shape extending along the x-direction. The third portion 53*e* overlaps with the first portion 51*e*, the second portion 52*e*, the first base portion 55, and the second base portion 56, as viewed in the x-direction. The third portion 53*e* overlaps with the first portion 571 of the connecting portion 57, as viewed in the y-direction. In the illustrated example, the third portion 53*e* is longer than the third portion 53*d*, and has generally the same length as the third portion 53*c*. Here, the expression "generally the same length" refers to, for example, being exactly the same, or different by within ±5% from each other's length. Further, the third portion 53*e* has generally the same width as the third portion 53*d*. Here, the expression "generally the same width" refers to, for example, being exactly the same, or different by within ±5% from each other's width.

Referring to FIG. 46, in the illustrated example, the first portion 51*c* includes a first edge 511*c*, a second edge 512*c*, a third edge 513*c*, and a fourth edge 514*c*. The first edge 511*c* is connected to the third portion 53*c*, and inclined so as to be closer to the fifth face 35 in the y-direction, toward the third face 33 in the x-direction. The second edge 512*c* is connected to the first edge 511*c*, and inclined so as to be closer to the sixth face 36 in the y-direction, toward the third face 33 in the x-direction. The third edge 513*c* is connected to the second edge 512*c*, and inclined so as to be closer to the fifth face 35 in the y-direction, toward the third face 33 in the x-direction. The fourth edge 514*c* is connected to the third edge 513*c* and the third portion 53*c*, and extends along the x-direction.

In the illustrated example, the first portion 51*d* includes a first edge 511*d*, a second edge 512*d*, a third edge 513*d*, and a fourth edge 514*d*. The third edge 513*d* is connected to the third portion 53*d*, and inclined so as to be closer to the sixth face in the y-direction, toward the third face 33 in the x-direction. The first edge 511*d* is connected to the third edge 513*d*, and inclined so as to be closer to the fifth face 35 in the y-direction, toward the third face 33 in the x-direction. The first edge 511*d* is opposed to the first edge 511*c*. The second edge 512*d* is connected to the first edge 511*d*, and inclined so as to be closer to the sixth face 36 in the y-direction, toward the third face 33 in the x-direction. The fourth edge 514*d* is connected to the second edge 512*d* and the third portion 53*d*, and inclined so as to be closer to the fifth face 35 in the y-direction, toward the third face 33 in the x-direction.

In the illustrated example, the first portion 51*e* includes a first edge 511*e*, a second edge 512*e*, a third edge 513*e*, and a fourth edge 514*e*. The first edge 511*e* is connected to the third portion 53*e*, and inclined so as to be closer to the sixth face in the y-direction, toward the third face 33 in the x-direction. The first edge 511*e* is opposed to the second edge 512*d*. The second edge 512*e* is connected to the first edge 511*e*, and inclined so as to be closer to the fifth face 35 in the y-direction, toward the third face 33 in the x-direction. The third edge 513*e* is connected to the second edge 512*e*, and extends along the y-direction. The third edge 513*e* is opposed to the first base portion 55. The fourth edge 514*e* is connected to the third edge 513*e* and the third portion 53*e*, and extends along the x-direction.

Referring to FIG. 47, in the illustrated example, the second portion 52*c* includes a first edge 521*c*, a second edge 522*c*, a third edge 523*c*, and a fourth edge 524*c*. The first edge 521*c* is connected to the third portion 53*c*, and inclined so as to be closer to the fifth face 35 in the y-direction, toward the fourth face 34 in the x-direction. The second edge 522*c* is connected to the first edge 521*c*, and inclined so as to be closer to the sixth face 36 in the y-direction, toward the fourth face 34 in the x-direction. The third edge 523*c* is connected to the second edge 522*c*, and inclined so as to be closer to the fifth face 35 in the y-direction, toward the fourth face 34 in the x-direction. The fourth edge 524*c* is connected to the third edge 523*c* and the third portion 53*c*, and extends along the x-direction.

In the illustrated example, the second portion 52*d* includes a first edge 521*d*, a second edge 522*d*, a third edge 523*d*, and a fourth edge 524*d*. The third edge 523*d* is connected to the third portion 53*d*, and inclined so as to be closer to the sixth face 36 in the y-direction, toward the fourth face 34 in the x-direction. The first edge 521*d* is connected to the third edge 523*d*, and inclined so as to be closer to the fifth face 35 in the y-direction, toward the fourth face 34 in the x-direction. The first edge 521*d* is opposed to the first edge 521*c*. The second edge 522*d* is connected to the first edge 521*d*, and inclined so as to be closer to the sixth face 36 in the y-direction, toward the fourth face 34 in the x-direction. The fourth edge 524*d* is connected to the second edge 522*d* and the third portion 53*d*, and inclined so as to be closer to the fifth face 35 in the y-direction, toward the fourth face 34 in the x-direction.

In the illustrated example, the second portion 52*e* includes a first edge 521*e*, a second edge 522*e*, a third edge 523*e*, and a fourth edge 524*e*. The first edge 521*e* is connected to the third portion 53*e*, and inclined so as to be closer to the sixth face 36 in the y-direction, toward the fourth face 34 in the x-direction. The first edge 521*e* is opposed to the second edge 522*d*. The second edge 522*e* is connected to the first edge 521*e*, and inclined so as to be closer to the fifth face 35 in the y-direction, toward the fourth face 34 in the x-direction. The third edge 523*e* is connected to the second edge 522*e*, and extends along the y-direction. The third edge 523*e* is opposed to the second base portion 56. The fourth edge 524*e* is connected to the third edge 523*e* and the third portion 53*e*, and extends along the x-direction.

As shown in FIG. 45, the wiring **50*f* includes a first portion 51*f*, a second portion 52*f*, and a third portion 53*f***, each of which will be described hereunder.

The first portion **51*f* is located on the side of the fourth face 34 in the x-direction with respect to the second base portion 56, and spaced therefrom. The first portion 51*f* is located on the side of the sixth face 36 in the y-direction with respect to the third portion 53U, and spaced therefrom. In the illustrated example, the first portion 51*f* overlaps with the second base portion 56, as viewed in the x-direction. The first portion 51*f* overlaps with the third portion 53U, the first portion 51T, and the first portion 51S, as viewed in the y-direction. The shape of the first portion 51*f* is not specifically limited, and a desired shape may be selected from a rectangular shape, a polygonal shape, a circular shape, an elliptical shape, and so forth. In the illustrated example, the first portion 51*f*** has a rectangular shape.

The second portion **52*f* is located on the side of the fourth face 34 in the x-direction with respect to the first portion 51*f*. The second portion 52*f* is located on the side of the sixth face 36 in the y-direction with respect to the third portion 53U, and spaced therefrom. In the illustrated example, the second portion 52*f* overlaps with the first portion 51*f* and the second base portion 56, as viewed in the x-direction. The second portion 52*f* also overlaps with the fifth portion 55U, as viewed in the y-direction. The shape of the second portion 52*f* is not specifically limited, and a desired shape may be selected from a rectangular shape, a polygonal shape, a circular shape, an elliptical shape, and so forth. In the illustrated example, the second portion 52*f*** has a rectangular shape.

The third portion **53*f* is interposed between the first portion 51*f* and the second portion 52*f* and, in the illustrated example, connected to the first portion 51*f* and the second portion 52*f*. The shape of the third portion 53*f* is not specifically limited. In the illustrated example, the third portion 53*f* has a strip shape extending along the x-direction. The third portion 53*f* overlaps with the first portion 51*f*, the second portion 52*f*, and the second base portion 56, as viewed in the x-direction. The third portion 53*f* overlaps with the third portion 53U and the third portion 53T, as viewed in the y-direction. In the illustrated example, the third portion 53*f* is longer than the third portion 53Td, and narrower than the third portion 53T and the third portion 53**U.

As shown in FIG. 44 and FIG. 45, the second portion 52C to the second portion 52H are aligned in the x-direction, with clearances G51 between each other. A difference in size among the clearances G51 is within ±5%. The second portion 52H and the second portion 52I are aligned in the x-direction, with a clearance G52 therebetween. The clearance G52 is wider than the clearance G51. The second portion 52I to the second portion 52R are aligned in the x-direction, with clearances G53 between each other. The clearances G53 are narrower than the clearance G51 and the clearance G52, and a difference among the clearances G53 is within ±5%. The second portion 52R and the second portion 52S are aligned in the x-direction, with a clearance G54 therebetween. The clearance G54 is wider than the clearance G53 and the clearance G51, and narrower than the clearance G52.

<Bonding Section 6>

Regarding the bonding section 6 according to this embodiment, although any of the elements is apparently given, for the sake of convenience of description, the same numeral as that of the bonding section 6 according to the first embodiment, it does not necessarily mean that the mentioned element has the same or similar configuration. The configuration of an element with a numeral is defined by the description relevant to this embodiment.

The plurality of bonding sections 6 are formed on the substrate 3. In this embodiment, the plurality of bonding sections 6 are formed on the first face 31 of the substrate 3. The bonding section 6 is formed of, for example, a conductive material. The conductive material to form the bonding section 6 is not specifically limited. Examples of the conductive material to form the bonding section 6 include materials containing silver (Ag), copper (Cu), or gold (Au). In the subsequent description, it will be assumed that the bonding section 6 contains silver. The bonding section 6 according to this embodiment contains the same conductive material as that employed to form the conductive section 5. However, the bonding section 6 may contain copper instead of silver, or gold instead of silver or copper. Alternatively, the bonding section 6 may contain Ag—Pt or Ag—Pd. The forming method of the bonding section 6 is not limited. For example, the bonding section 6 may be formed, like the conductive section 5, by sintering a paste containing the mentioned metal. The thickness of the bonding section 6 is not specifically limited, but may be, for example, approximately 5 μm to 30 μm.

In this embodiment, as shown in FIG. 39 to FIG. 43 and FIG. 48, the plurality of bonding sections 6 include a bonding section 6A to a bonding section 6D.

As shown in FIG. 39, FIG. 41, FIG. 42, and FIG. 48, the bonding section 6A is located on the side of the sixth face 36 with respect to the conductive section 5, in the y-direction. The bonding section 6A overlaps with the entirety of the first base portion 55, as viewed in the y-direction. The shape of the bonding section 6A is not specifically limited. In the illustrated example, the bonding section 6A includes a first edge 61A, a second edge 62A, a third edge 63A, a fourth edge 64A, a fifth edge 65A, a sixth edge 66A, a seventh edge 67Aa, an eighth edge 68Ab, and a ninth edge 67Ab.

The first edge 61A extends along the y-direction. In the illustrated example, the first edge 61A overlaps with the second portion 52A, as viewed in the y-direction.

The second edge 62A is located on the opposite side of the first edge 61A in the x-direction, across the center of the bonding section 6A in the x-direction, and extends along the y-direction. In the illustrated example, the second edge 62A overlaps with the first portion 571 of the connecting portion 57, the third portion **53*c*, the third portion 53*d*, the third portion 53*e*, and the first portion 51H, as viewed in the y-direction. The second edge 62A is smaller in size in the y-direction, than the first edge 61**A.

The third edge 63A is located between the first edge 61A and the second edge 62A, as viewed in the y-direction. The third edge 63A extends along the x-direction. The third edge 63A is spaced apart from the first base portion 55, in the y-direction. In the illustrated example, the third edge 63A overlaps with the first portion 51A to the first portion 51H, and the wirings **50*a* to 50*e***, as viewed in the y-direction.

The fourth edge 64A is located on the opposite side of the third edge 63A in the y-direction, across the center of the bonding section 6A in the y-direction. The fourth edge 64A extends along the x-direction. The fourth edge 64A is smaller in size in the x-direction, than the third edge 63A. The entirety of the fourth edge 64A overlaps with the third edge 63A, as viewed in the y-direction.

The fifth edge 65A is located between the second edge 62A and the fourth edge 64A, in the y-direction. The fifth edge 65A, extending along the x-direction, overlaps with the first edge 61A, as viewed in the x-direction.

The sixth edge 66A is connected to the end of the fifth edge 65A on the side of the third face 33 in the x-direction, and the end of the fourth edge 64A on the side of the fourth face 34 in the x-direction. In the illustrated example, the sixth edge 66A is inclined with respect to the x-direction and the y-direction.

The seventh edge 67Aa is located between the first edge 61A and the third edge 63A in the x-direction, and between the first edge 61A and the third edge 63A in the y-direction. The seventh edge 67Aa is connected to the first edge 61A and the third edge 63A. In the illustrated example, the seventh edge 67Aa forms a convex curved surface, as viewed in the z-direction. The ninth edge 67Ab is located between the second edge 62A and the third edge 63A in the x-direction, and between the second edge 62A and the third edge 63A in the y-direction. The ninth edge 67Ab is connected to the second edge 62A and the third edge 63A. In the illustrated example, the ninth edge 67Ab forms a convex curved surface, as viewed in the z-direction.

The eighth edge 68Ab is located between the second edge 62A and the fifth edge 65A in the y-direction. In the illustrated example, the eighth edge 68A is connected to the end of the second edge 62A on the side of the sixth face 36 in the y-direction, and the end of the fifth edge 65A on the side of the fourth face 34 in the x-direction. In the illustrated example, the eighth edge 68A is inclined with respect to the x-direction and the y-direction.

As shown in FIG. 39, FIG. 41, and FIG. 43, the bonding section 6B is located on the side of the sixth face 36 with respect to the conductive section 5, in the y-direction. The bonding section 6B is located on the side of the fourth face 34 with respect to the bonding section 6A, in the x-direction. In the illustrated example, the bonding section 6B overlaps with the connecting portion 57, the wirings 50*c* to 50*e*, and the second base portion 56, as viewed in the y-direction. The shape of the bonding section 6B is not specifically limited. In the illustrated example, the bonding section 6B includes a first edge 61B, a second edge 62B, a third edge 63B, a fourth edge 64B, a fifth edge 65B, a sixth edge 66B, a seventh edge 67Ba, a ninth edge 69Ba, a tenth edge 67Bb, and an eleventh edge 69Bb.

The first edge 61B extends along the y-direction. The first edge 61B is opposed to the second edge 62A. In the illustrated example, the first edge 61B overlaps with the first portion 571 of the connecting portion 57, the third portion 53*c*, the third portion 53*d*, the third portion 53*e*, and the first portion 51H, as viewed in the y-direction.

The second edge 62B is located on the opposite side of the first edge 61B in the x-direction, across the center of the bonding section 6B in the x-direction, and extends along the y-direction. In the illustrated example, the second edge 62B overlaps with the second base portion 56, as viewed in the y-direction. The second edge 62B is smaller in size in the y-direction, than the first edge 61B. In addition, the second edge 62B is generally the same in size in the y-direction, as the second edge 62A (exactly the same, or different by within ±5%).

The third edge 63B is located between the first edge 61B and the second edge 62B, as viewed in the y-direction. The third edge 63B extends along the x-direction. The third edge 63B is spaced apart from the second base portion 56, in the y-direction. In the illustrated example, the third edge 63B overlaps with the second base portion 56, the connecting portion 57, and the wirings 50*a* to 50*e*, as viewed in the y-direction. In the illustrated example, in addition, the third edge 63B is located generally at the same position as the third edge 63A, in the y-direction. Here, the expression "located generally at the same position" in the y-direction refers to, for example, being located exactly at the same position, or being deviated by within ±5% of the characteristic size (size of the bonding section 6A or bonding section 6B in the y-direction).

The fourth edge 64B is located on the opposite side of the third edge 63B in the y-direction, across the center of the bonding section 6B in the y-direction. The fourth edge 64B extends along the x-direction. The fourth edge 64B is connected to the end of the first edge 61B on the side of the sixth face 36 in the y-direction. The fourth edge 64B is smaller in size in the x-direction, than the third edge 63B. The entirety of the fourth edge 64B overlaps with the third edge 63B, as viewed in the y-direction.

The fifth edge 65B is located between the second edge 62B and the fourth edge 64B, in the x-direction and the y-direction. In the illustrated example, the fifth edge 65B extends along the x-direction. The fifth edge 65B is smaller in size in the x-direction, than the third edge 63B.

The sixth edge 66B is connected to the fourth edge 64B and the fifth edge 65B. In the illustrated example, the sixth edge 66B is inclined with respect to the x-direction and the y-direction.

The seventh edge 67Ba is located between the first edge 61B and the third edge 63B in the x-direction, and between the first edge 61B and the third edge 63B in the y-direction. The seventh edge 67Ba is connected to the first edge 61B and the third edge 63B. In the illustrated example, the seventh edge 67Ba forms a convex curved surface, as viewed in the z-direction. The tenth edge 67Bb is located between the second edge 62B and the third edge 63B in the x-direction, and between the second edge 62B and the third edge 63B in the y-direction. The tenth edge 67Bb is connected to the second edge 62B and the third edge 63B. In the illustrated example, the tenth edge 67Bb forms a convex curved surface, as viewed in the z-direction.

The ninth edge 69Ba is located between the first edge 61B and the fourth edge 64B, in the y-direction. In the illustrated example, the ninth edge 69Ba is connected to the end of the first edge 61B on the side of the sixth face 36 in the y-direction, and the end of the fourth edge 64B on the side of the third face 33 in the x-direction. In the illustrated example, the ninth edge 69Ba is inclined with respect to the x-direction and the y-direction.

The eleventh edge 69Bb is located between the second edge 62B and the fifth edge 65B, in the y-direction. In the illustrated example, the eleventh edge 69Bb is connected to the end of the second edge 62B on the side of the sixth face 36 in the y-direction, and the end of the fifth edge 65B on the side of the fourth face 34 in the x-direction. In the illustrated example, the eleventh edge 69Bb is inclined with respect to the x-direction and the y-direction.

As shown in FIG. 39, FIG. 41, and FIG. 43, the bonding section 6C is located on the side of the sixth face 36 with respect to the conductive section 5, in the y-direction. The bonding section 6C is located on the side of the fourth face 34 with respect to the bonding section 6B, in the x-direction. In the illustrated example, the bonding section 6C overlaps with the wirings 50S to 50U, the wiring 50*f*, and the second base portion 56, as viewed in the y-direction. The shape of the bonding section 6C is not specifically limited. In the illustrated example, the bonding section 6C includes a first edge 61C, a second edge 62C, a third edge 63C, a fourth edge 64C, a fifth edge 65C, a sixth edge 66C, a seventh edge 67Ca, a ninth edge 69Ca, a tenth edge 67Cb, and an eleventh edge 69Cb.

The first edge 61C extends along the y-direction. The first edge 61C is opposed to the second edge 62B. In the illustrated example, the first edge 61C overlaps with the second base portion 56, as viewed in the y-direction.

The second edge 62C is located on the opposite side of the first edge 61C in the x-direction, across the center of the bonding section 6C in the x-direction, and extends along the y-direction. In the illustrated example, the second edge 62C overlaps with the wirings 50S to 50U and the wiring 50*f*, as viewed in the y-direction. The second edge 62C is smaller in size in the y-direction, than the first edge 61C. In addition, the second edge 62C is generally the same in size in the y-direction, as the second edge 62B (exactly the same, or different by within ±5%).

The third edge 63C is located between the first edge 61C and the second edge 62C, as viewed in the y-direction. The third edge 63C extends along the x-direction. The third edge 63C is spaced apart from the second base portion 56, in the y-direction. In the illustrated example, the third edge 63C overlaps with the wirings 50S to 50U, the wiring 50*f*, and the second base portion 56, as viewed in the y-direction. In the illustrated example, in addition, the third edge 63C is located generally at the same position as the third edge 63B, in the y-direction. Here, the expression "located generally at the same position" in the y-direction refers to, for example, being located exactly at the same position, or being deviated by within ±5% of the characteristic size (size of the bonding section 6B or bonding section 6C in the y-direction).

The fourth edge 64C is located on the opposite side of the third edge 63C in the y-direction, across the center of the bonding section 6C in the y-direction. The fourth edge 64C extends along the x-direction. The fourth edge 64C is connected to the end of the first edge 61C on the side of the sixth face 36 in the y-direction. The fourth edge 64C is smaller in size in the x-direction, than the third edge 63C. The entirety of the fourth edge 64C overlaps with the third edge 63C, as viewed in the y-direction.

The fifth edge 65C is located between the second edge 62C and the fourth edge 64C, in the x-direction and the y-direction. In the illustrated example, the fifth edge 65C extends along the x-direction. The fifth edge 65C is smaller in size in the x-direction, than the third edge 63C.

The sixth edge 66C is connected to the fourth edge 64C and the fifth edge 65C. In the illustrated example, the sixth edge 66C is inclined with respect to the x-direction and the y-direction.

The seventh edge 67Ca is located between the first edge 61C and the third edge 63C in the x-direction, and between the first edge 61C and the third edge 63C in the y-direction. The seventh edge 67Ca is connected to the first edge 61C and the third edge 63C. In the illustrated example, the seventh edge 67Ca forms a convex curved surface, as viewed in the z-direction. The tenth edge 67Cb is located between the second edge 62C and the third edge 63C in the x-direction, and between the second edge 62C and the third edge 63C in the y-direction. The tenth edge 67Cb is connected to the second edge 62C and the third edge 63C. In the illustrated example, the tenth edge 67Cb forms a convex curved surface, as viewed in the z-direction.

The ninth edge 69Ca is located between the first edge 61C and the fourth edge 64C, in the y-direction. In the illustrated example, the ninth edge 69Ca is connected to the end of the first edge 61C on the side of the sixth face 36 in the y-direction, and the end of the fourth edge 64C on the side of the third face 33 in the x-direction. In the illustrated example, the ninth edge 69Ca is inclined with respect to the x-direction and the y-direction.

The eleventh edge 69Cb is located between the second edge 62C and the fifth edge 65C, in the y-direction. In the illustrated example, the eleventh edge 69Cb is connected to the end of the second edge 62C on the side of the sixth face 36 in the y-direction, and the end of the fifth edge 65C on the side of the fourth face 34 in the x-direction. In the illustrated example, the ninth edge 69Cb is inclined with respect to the x-direction and the y-direction.

As shown in FIG. 39, FIG. 41, and FIG. 43, the bonding section 6D is located on the side of the sixth face 36 with respect to the conductive section 5, in the y-direction. The bonding section 6D is located on the side of the fourth face 34 with respect to the bonding section 6C, in the x-direction. In the illustrated example, the bonding section 6D overlaps with the wirings 50S to 50U and the wiring 50*f*, as viewed in the y-direction, and is spaced apart from the second base portion 56. The shape of the bonding section 6D is not specifically limited. In the illustrated example, the bonding section 6D includes a first edge 61D, a second edge 62D, a third edge 63D, a fourth edge 64D, a seventh edge 67Da, a ninth edge 69Da, a tenth edge 67Db, and an eleventh edge 69Db.

The first edge 61D extends along the y-direction. The first edge 61D is opposed to the second edge 62C. In the illustrated example, the first edge 61D overlaps with the wirings 50S to 50U and the wiring 50*f*, as viewed in the y-direction.

The second edge 62D is located on the opposite side of the first edge 61D in the x-direction, across the center of the bonding section 6D in the x-direction, and extends along the y-direction. In the illustrated example, the second edge 62D overlaps with the wirings 50S to 50U, as viewed in the y-direction. The second edge 62D is generally the same in size in the y-direction, as the first edge 61D (exactly the same, or different by within ±5%). Further, the second edge 62D is larger in size in the y-direction, than the second edge 62C.

The third edge 63D is located between the first edge 61D and the second edge 62D, as viewed in the y-direction. The third edge 63D extends along the x-direction. The third edge 63D is spaced apart from the second base portion 56, in the y-direction. In the illustrated example, the third edge 63D overlaps with the wirings 50S to 50U, the wiring 50*f*, and the second base portion 56, as viewed in the y-direction. In the illustrated example, in addition, the third edge 63D is located generally at the same position as the third edge 63C, in the y-direction. Here, the expression "located generally at the same position" in the y-direction refers to, for example, being located exactly at the same position, or being deviated by within ±5% of the characteristic size (size of the bonding section 6C or bonding section 6D in the y-direction).

The fourth edge 64D is located on the opposite side of the third edge 63D in the y-direction, across the center of the bonding section 6D in the y-direction. The fourth edge 64D extends along the x-direction. The fourth edge 64D is connected to the end of the first edge 61D on the side of the sixth face 36 in the y-direction. The fourth edge 64D is generally the same in size in the x-direction, as the third edge 63D (exactly the same, or different by within ±5%).

The seventh edge 67Da is located between the first edge 61D and the third edge 63D in the x-direction, and between the first edge 61D and the third edge 63D in the y-direction. The seventh edge 67Da is connected to the first edge 61D and the third edge 63D. In the illustrated example, the seventh edge 67Da forms a convex curved surface, as viewed in the z-direction. The tenth edge 67Db is located between the second edge 62D and the third edge 63D in the x-direction, and between the second edge 62D and the third edge 63D in the y-direction. The tenth edge 67Db is connected to the second edge 62D and the third edge 63D. In the illustrated example, the tenth edge 67Db forms a convex curved surface, as viewed in the z-direction.

The ninth edge 69Da is located between the first edge 61D and the fourth edge 64D, in the y-direction. In the illustrated example, the ninth edge 69Da is connected to the end of the first edge 61D on the side of the sixth face 36 in the y-direction, and the end of the fourth edge 64D on the side of the third face 33 in the x-direction. In the illustrated example, the ninth edge 69Da is inclined with respect to the x-direction and the y-direction.

The eleventh edge 69Db is located between the second edge 62D and the fourth edge 64D, in the y-direction. In the illustrated example, the eleventh edge 69Db is connected to the end of the second edge 62D on the side of the sixth face 36 in the y-direction, and the end of the fourth edge 64D on the side of the fourth face 34 in the x-direction. In the illustrated example, the eleventh edge 69Db is inclined with respect to the x-direction and the y-direction.

<Leads 1>

Regarding the lead 1 according to this embodiment, although any of the elements is apparently given the same numeral, for the sake of convenience of description, as that of the lead 1 according to the first embodiment, it does not necessarily mean that the mentioned element has the same or similar configuration. The configuration of an element with a numeral is defined by the description relevant to this embodiment. The plurality of leads 1 contain a metal, and have higher heat dissipation characteristics, for example than the substrate 3. The metal to form the lead 1 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 1 may be plated with nickel (Ni). Examples of the forming method of the plurality of leads 1 include pressing a metal plate with a die, and patterning a metal plate by etching, without limitation thereto. The thickness of the lead 1 is not specifically limited, but may be, for example, approximately 0.4 mm to 0.8 mm.

The plurality of leads 1 include a plurality of leads 1A to 1G, as shown in FIG. 35 to FIG. 43. The plurality of leads 1A to 1G constitute conduction paths, for example to the semiconductor chips 4A to 4F.

The lead 1A is located on the substrate 3 and, in this embodiment, on the first face 31. The lead 1A exemplifies a first lead in the present disclosure. The lead 1A is bonded to the bonding section 6A, via a bonding material 81. It is preferable to employ a material having high thermal conductivity as the bonding material 81, such as silver paste, copper paste, or solder. However, the bonding material 81 may be an insulative material such as an epoxy-based resin or a silicone-based resin. In the case where the bonding section 6A is not provided on the substrate 3, the lead 1A may be bonded to the substrate 3.

The configuration of the lead 1A is not specifically limited and, in this embodiment, the lead 1A includes a first portion 11A, a second portion 12A, a third portion 13A, and a fourth portion 14A, each of which will be described hereunder.

As shown in FIG. 39, FIG. 40, FIG. 41, and FIG. 42, the first portion 11A includes a main surface 111A, a back surface 112A, a first face 121A, a second face 122A, a third face 123A, a fourth face 124A, a fifth face 125A, a sixth face 126A, a seventh face 127Aa, an eighth face 128A, a ninth face 127Ab, a plurality of recesses 1111A, and a groove 1112A. The first portion 11A overlaps with the sixth face 36 of the substrate 3, as viewed in the z-direction.

The main surface 111A is oriented in the same direction as the first face 31, in the z-direction.

The back surface 112A is oriented to the opposite side of the main surface 111A in the z-direction and, in the illustrated example, a planar surface. The back surface 112A is bonded to the bonding section 6A via the bonding material 81, as shown in FIG. 41 and FIG. 42.

The first face 121A is located between the main surface 111A and the back surface 112A in the z-direction, and oriented in the same direction as the third face 33 as a whole, in the x-direction. In the illustrated example, the first face 121A is connected to the main surface 111A and the back surface 112A.

The second face 122A is located on the opposite side of the first face 121A in the x-direction, and oriented in the same direction as the fourth face 34, in the x-direction. The second face 122A is located between the main surface 111A and the back surface 112A in the z-direction and, in the illustrated example, connected to the main surface 111A and the back surface 112A. The second face 122A is smaller in size in the y-direction, than the first face 121A.

The third face 123A is located between the first face 121A and the second face 122A in the x-direction, and oriented in the same direction as the fifth face 35, in the y-direction. The third face 123A is located between the main surface 111A and the back surface 112A in the z-direction and, in the illustrated example, connected to the main surface 111A and the back surface 112A.

The fourth face 124A is located on the opposite side of the third face 123A in the y-direction, and oriented in the same direction as the sixth face 36 in the y-direction. The fourth face 124A is located between the main surface 111A and the back surface 112A in the z-direction and, in the illustrated example, connected to the main surface 111A and the back surface 112A. The fourth face 124A is smaller in size in the x-direction, than the third face 123A.

The fifth face 125A is located between the first face 121A and the second face 122A in the x-direction, at a position close to the second face 122A. The fifth face 125A extends along the x-direction. The fifth face 125A is located between the main surface 111A and the back surface 112A in the z-direction and, in the illustrated example, connected to the main surface 111A and the back surface 112A.

The sixth face 126A is located between the fourth face 124A and the fifth face 125A, in the x-direction, and the y-direction. In the illustrated example, the sixth face 126A is connected to the fourth face 124A and the fifth face 125A. The sixth face 126A is inclined with respect to the x-direction and the y-direction. The sixth face 126A is located between the main surface 111A and the back surface 112A in the z-direction and, in the illustrated example, connected to the main surface 111A and the back surface 112A.

The seventh face 127Aa is located between the first face 121A and the third face 123A in the x-direction, and between the first face 121A and the third face 123A in the y-direction. The seventh face 127Aa is connected to the first face 121A and the third face 123A. In the illustrated example, the seventh face 127Aa forms a convex curved surface, as viewed in the z-direction. The seventh face 127Aa is located between the main surface 111A and the back surface 112A in the z-direction and, in the illustrated example, connected to the main surface 111A and the back surface 112A. The eleventh face 127Ab is located between the second face 122A and the third face 123A in the x-direction, and between the second face 122A and the third face 123A in the y-direction. The ninth face 127Ab is connected to the second face 122A and the third face 123A. In the illustrated example, the ninth face 127Ab forms a convex curved surface, as viewed in the z-direction. The ninth face 127Ab is located between the main surface 111A and the back surface 112A in the z-direction and, in the illustrated example, connected to the main surface 111A and the back surface 112A.

The eighth face 128A is located between the second face 122A and the fifth face 125A, in the x-direction and the y-direction. In the illustrated example, the eighth face 128A is connected to the second face 122A and the fifth face 125A. In the illustrated example, the eighth face 128A is inclined with respect to the x-direction and the y-direction. The eighth face 128A is located between the main surface 111A and the back surface 112A in the z-direction and, in the illustrated example, connected to the main surface 111A and the back surface 112A.

In the illustrated example, the first face 121A and the second face 122A each include a plurality of protrusions 131A. The plurality of protrusions 131A each protrude outwardly of the first portion 11A as viewed in the z-direction, and extend along the z-direction. Here, the plurality of protrusions 131A may be formed on the first portion 11A, in portions other than the first face 121A and the second face 122A. In addition, at least one of the first face 121A and the second face 122A may be without the plurality of protrusions 131A.

The plurality of recesses 1111A are each recessed from the main surface 111A in the z-direction. The shape of the recess 1111A in a z-direction view is not specifically limited, and may be, for example, circular, elliptical, rectangular, or triangular. In the illustrated example, the plurality of recesses 1111A are arranged in a matrix pattern.

The number of rows of the plurality of recesses 1111A in the y-direction is larger in the region between the groove 1112A and the third face 123A, than in the region between the groove 1112A and the fourth face 124A.

The number of rows of the plurality of recesses 1111A in the y-direction is larger in the region between the groove 1112A and the third face 123A, than in the region between the groove 1112A and the fourth face 124A.

The groove 1112A is recessed from the main surface 111A in the z-direction. The shape of the groove 1112A in a z-direction view is not specifically limited. In the illustrated example, the groove 1112A includes three rectangular sections, and three sections extending along the x-direction in the respective rectangular sections. The cross-sectional shape of the groove 1112A is not specifically limited and may be, for example, circular, elliptical, rectangular, or triangular.

The third portion 13A and the fourth portion 14A are covered with the encapsulating resin 7. The third portion 13A is connected to the first portion 11A and the fourth portion 14A. In the illustrated example, the third portion 13A is connected to a portion of the first portion 11A adjacent to the fourth face 124A. In addition, the third portion 13A is spaced apart from the sixth face 36, as viewed in the z-direction. Like a third portion 133 and a fourth portion 143 shown in FIG. 40, the fourth portion 14A is shifted from the first portion 11A in the z-direction, to the side to which the main surface 111A is oriented. The end portion of the fourth portion 14A is flush with a sixth face 76 of the resin 7.

The second portion 12A is connected to the end portion of the fourth portion 14A, and corresponds to a portion of the lead 1A sticking out from the encapsulating resin 7. The second portion 12A sticks out to the opposite side of the first portion 11A, in the y-direction. The second portion 12A is used, for example, to electrically connect the semiconductor device A2 to an external circuit. In the illustrated example, the second portion 12A is bent in the z-direction, to the side to which the main surface 111A is oriented. In this embodiment, the lead 1A includes a pair of second portions 12A, which are spaced apart from each other in the x-direction.

The lead 1B is located on the substrate 3 and, in this embodiment, on the first face 31. The lead 1B exemplifies a first lead in the present disclosure. The lead 13 is bonded to the bonding section 6B, via the bonding material 81. In the case where the bonding section 6B is not provided on the substrate 3, the lead 1B may be bonded to the substrate 3.

The configuration of the lead 1B is not specifically limited. In this embodiment the lead 1B includes, as shown in FIG. 39 to FIG. 41, and FIG. 43, a first portion 11B, a second portion 12B, a third portion 13B, and a fourth portion 14B, each of which will be described hereunder.

The first portion 11B includes a main surface 111B, a back surface 112B, a first face 121B, a second face 122B, a third face 123B, a fourth face 124Ba, a fifth face 125B, a sixth face 126Ba, a seventh face 127Ba, an eighth face 128B, a ninth face 129B, a tenth face 124Bb, an eleventh face 126Bb, a twelfth face 127Bb, a plurality of recesses 1111B, and a groove 1112B.

The main surface 111B is oriented in the same direction as the first face 31, in the z-direction.

The back surface 112B is oriented to the opposite side of the main surface 111B in the z-direction and, in the illustrated example, a planar surface. The back surface 112B is bonded to the bonding section 6B via the bonding material 81.

The first face 121B is located between the main surface 111B and the back surface 112B in the z-direction, and oriented in the same direction as the third face 33 as a whole, in the x-direction. In the illustrated example, the first face 121B is connected to the main surface 111B and the back surface 112B. The first face 121B is opposed to the second face 122A.

The second face 122B is located on the opposite side of the first face 121B in the x-direction, and oriented in the same direction as the fourth face 34, in the x-direction. The second face 122B is located between the main surface 111B and the back surface 112B in the z-direction and, in the illustrated example, connected to the main surface 111B and the back surface 112B. The second face 122B is generally the same in size in the y-direction, as the first face 121B (exactly the same, or different by within ±5%).

The third face 123B is located between the first face 121B and the second face 122B in the x-direction, and oriented in the same direction as the fifth face 35, in the y-direction. The third face 123B is located between the main surface 111B and the back surface 112B in the z-direction and, in the illustrated example, connected to the main surface 111B and the back surface 112B.

The fourth face 124Ba is located on the side of the sixth face 36 in the y-direction, with respect to the first face 121B and the second face 122B, and extends along the x-direction. The fourth face 124Ba is oriented in the same direction as the fifth face 35 in the y-direction, and opposed to the fifth face 125A. The fourth face 124Ba is located between the main surface 111B and the back surface 112B in the z-direction and, in the illustrated example, connected to the main surface 111B and the back surface 112B. In the illustrated example, the fourth face 124Ba overlaps with the first portion 11A, as viewed in the y-direction. The tenth face 124Bb is located on the side of the sixth face 36 in the y-direction, with respect to the first face 121B and the second face 122B, and extends along the x-direction. The tenth face 124Bb is oriented in the same direction as the sixth face 36 in the y-direction. The tenth face 1248*b* is located between the main surface 111B and the back surface 112B in the z-direction and, in the illustrated example, connected to the main surface 111B and the back surface 112B. In the illustrated example, the tenth face 124Bb overlaps with the first portion 11A, as viewed in the y-direction.

The fifth face 125B is located between the second face 122B and the fourth face 124Ba in the x-direction, at a position close to the second face 122B. The fifth face 125B extends along the x-direction. The fifth face 125B overlaps with the third face 123B, as viewed in the y-direction. The fifth face 125B is located between the main surface 111B and the back surface 112B in the z-direction and, in the illustrated example, connected to the main surface 111B and the back surface 112B.

The sixth face 126Ba is inclined with respect to the x-direction and the y-direction. In the illustrated example, the sixth face 126Ba is connected to the fourth face 124Ba and the fifth face 125B. The sixth face 126Ba is connected to the first face 121B and the fourth face 124Ba, and opposed to the eighth face 128A. The sixth face 126Ba is located between the main surface 111B and the back surface 112B in the z-direction and, in the illustrated example, connected to the main surface 111B and the back surface 112B. The eleventh face 126Bb is inclined with respect to the x-direction and the y-direction. In the illustrated example, the eleventh face 126Bb is connected to the fifth face 125B and the fourth face 124Ba. The eleventh face 126Bb is located between the main surface 111B and the back surface 112B in the z-direction and, in the illustrated example, connected to the main surface 111B and the back surface 112B.

The seventh face 127Ba is located between the second face 122B and the third face 123B in the x-direction, and between the first face 121B and the second face 122B in the y-direction. The seventh face 127Ba is connected to the first face 121B and the third face 123B. In the illustrated example, the seventh face 127Ba forms a convex curved surface, as viewed in the z-direction. The seventh face 127Ba is located between the main surface 111B and the back surface 112B in the z-direction and, in the illustrated example, connected to the main surface 111B and the back surface 112B. The twelfth face 127Bb is located between the second face 122B and the third face 123B in the x-direction, and between the second face 122B and the third face 123B in the y-direction. The twelfth face 127Bb is connected to the second face 122B and the third face 123B. In the illustrated example, the twelfth face 127Bb forms a convex curved surface, as viewed in the z-direction. The twelfth face 127Bb is located between the main surface 111B and the back surface 112B in the z-direction and, in the illustrated example, connected to the main surface 111B and the back surface 112B.

The eighth face 128B is located between the second face 122B and the fifth face 125B, in the x-direction and the y-direction, and connected to the second face 122B and the fifth face 125B. In the illustrated example, the eighth face 128B is inclined with respect to the x-direction and the y-direction. The eighth face 128B is located between the main surface 111B and the back surface 112B in the z-direction and, in the illustrated example, connected to the main surface 111B and the back surface 112B.

The ninth face 129B is connected to the end of the fourth face 124Ba on the side of the third face 33 in the x-direction. The ninth face 129B is inclined with respect to the x-direction and the y-direction. The ninth face 129B is opposed to the sixth face 126A. The ninth face 129B is located between the main surface 111B and the back surface 112B in the z-direction and, in the illustrated example, connected to the main surface 111B and the back surface 112B.

In the illustrated example, the third face 123B includes a plurality of protrusions 131B. The plurality of protrusions 131B each protrude outwardly of the first portion 11B as viewed in the z-direction, and extend along the z-direction. Here, the plurality of protrusions 131B may be formed on the first portion 11B, in portions other than the third face 123B. In addition, the third face 123B may be without the plurality of protrusions 131B.

The plurality of recesses 1111B are each recessed from the main surface 111B in the z-direction. The shape of the recess 1111B in a z-direction view is not specifically limited, and may be, for example, circular, elliptical, rectangular, or triangular. In the illustrated example, the plurality of recesses 1111B are arranged in a matrix pattern.

The groove 1112B is recessed from the main surface 111B in the z-direction. In the illustrated example, the shape of the groove 1112B in a z-direction view is not specifically limited and, in the illustrated example, the groove 1112B includes a rectangular section, and a section extending along the x-direction inside the rectangular section. The cross-sectional shape of the groove 1112B is not specifically limited, and may be, for example, circular, elliptical, rectangular, or triangular.

The number of rows of the plurality of recesses 1111B in the y-direction is larger in the region between the groove 1112B and the tenth face 124Bb, than in the region between the groove 1112B and the third face 123B.

The third portion 13B and the fourth portion 14B are covered with the encapsulating resin 7. The third portion 13B is connected to the first portion 11B and the fourth portion 14B. In the illustrated example, the third portion 13B is connected to a portion of the first portion 11B adjacent to the fourth face 124Ba. In addition, the third portion 13B overlaps with the sixth face 36, as viewed in the z-direction. The fourth portion 14B is shifted from the first portion 11B in the z-direction, to the side to which the main surface 111B is oriented. The end portion of the fourth portion 14B is flush with the sixth face 76 of the resin 7.

The second portion 12B is connected to the fourth portion 14B, and corresponds to a portion of the lead 1B sticking out from the encapsulating resin 7. The second portion 12B sticks out to the opposite side of the first portion 11B, in the y-direction. The second portion 12B is used, for example, to electrically connect the semiconductor device A2 to an external circuit. In the illustrated example, the second portion 12B is bent in the z-direction, to the side to which the main surface 111B is oriented.

The lead 1C is located on the substrate 3 and, in this embodiment, on the first face 31. The lead 1C exemplifies a first lead in the present disclosure. The lead 1C is bonded to the bonding section 6C, via the bonding material 81. In the case where the bonding section 6C is not provided on the substrate 3, the lead 1C may be bonded to the substrate 3.

The configuration of the lead 1C is not specifically limited. In this embodiment the lead 1C includes, as shown in FIG. 39, FIG. 41, and FIG. 43, a first portion 11C, a second portion 12C, a third portion 13C, and a fourth portion 14C, each of which will be described hereunder.

The first portion 11C includes a main surface 111C, a back surface 112C, a first face 121C, a second face 122C, a third face 123C, a fourth face 124Ca, a fifth face 125C, a sixth face 126Ca, a seventh face 127Ca, an eighth face 128C, a ninth face 129C, a tenth face 124Cb, an eleventh face 126Cb, a twelfth face 127Cb, a plurality of recesses 1111C, and a groove 1112C. The first portion 11C overlaps with the sixth face 36 of the substrate 3, as viewed in the z-direction.

The main surface 111C is oriented in the same direction as the first face 31, in the z-direction.

The back surface 112C is oriented to the opposite side of the main surface 111C in the z-direction and, in the illustrated example, a planar surface. The back surface 112C is bonded to the bonding section 6C via the bonding material 81.

The first face 121C is located between the main surface 111C and the back surface 112C in the z-direction, and oriented in the same direction as the third face 33 as a whole, in the x-direction. In the illustrated example, the first face 121C is connected to the main surface 111C and the back surface 112C. The first face 121C is opposed to the second face 122B.

The second face 122C is located on the opposite side of the first face 121C in the x-direction, and oriented in the same direction as the fourth face 34, in the x-direction. The second face 122C is located between the main surface 111C and the back surface 112C in the z-direction and, in the illustrated example, connected to the main surface 111C and the back surface 112C. The second face 122C is generally the same in size in the y-direction, as the first face 121C (exactly the same, or different by within ±5%).

The third face 123C is located between the first face 121C and the second face 122C in the x-direction, and oriented in the same direction as the fifth face 35, in the y-direction. The third face 123C is located between the main surface 111C and the back surface 112C in the z-direction and, in the illustrated example, connected to the main surface 111C and the back surface 112C.

The fourth face 124Ca is located on the side of the sixth face 36 in the y-direction, with respect to the first face 121C and the second face 122C, and extends along the x-direction. The fourth face 124Ca is oriented in the same direction as the fifth face 35 in the y-direction, and opposed to the fifth face 125B. The fourth face 124Ca is located between the main surface 111C and the back surface 112C in the z-direction and, in the illustrated example, connected to the main surface 111C and the back surface 112C. In the illustrated example, the fourth face 124Ca overlaps with the first portion 11B, as viewed in the y-direction. The tenth face 124Cb is located on the side of the sixth face 36 in the y-direction, with respect to the first face 121C and the second face 122C, and extends along the x-direction. The tenth face 124Cb is oriented in the same direction as the sixth face 36 in the y-direction. The tenth face 124Cb is located between the main surface 111C and the back surface 112C in the z-direction and, in the illustrated example, connected to the main surface 111C and the back surface 112C. In the illustrated example, the tenth face 124Cb overlaps with the first portion 11B, as viewed in the y-direction.

The fifth face 125C is located between the second face 122C and the fourth face 124Ca in the x-direction, at a position close to the second face 122C. The fifth face 125C extends along the x-direction. The fifth face 125C overlaps with the third face 123C, as viewed in the y-direction. The fifth face 125C is located between the main surface 111C and the back surface 112C in the z-direction and, in the illustrated example, connected to the main surface 111C and the back surface 112C.

The sixth face 126Ca is inclined with respect to the x-direction and the y-direction. In the illustrated example, the sixth face 126Ca is connected to the fourth face 124C and the fifth face 125C. The sixth face 126Ca is connected to the first face 121C and the fourth face 124Ca, and opposed to the eighth face 1283. The sixth face 126Ca is located between the main surface 111C and the back surface 112C in the z-direction and, in the illustrated example, connected to the main surface 111C and the back surface 112C. The eleventh face 126Cb is inclined with respect to the x-direction and the y-direction. In the illustrated example, the eleventh face 126Cb is connected to the tenth face 124Cb and the fifth face 125C. The eleventh face 126Cb is located between the main surface 111C and the back surface 112C in the z-direction and, in the illustrated example, connected to the main surface 111C and the back surface 112C.

The seventh face 127Ca is located between the first face 121C and the third face 123C in the x-direction, and between the first face 121C and the third face 123C in the y-direction. The seventh face 127Ca is connected to the first face 121C and the third face 123C. In the illustrated example, the seventh face 127Ca forms a convex curved surface, as viewed in the z-direction. The seventh face 127Ca is located between the main surface 111C and the back surface 112C in the z-direction and, in the illustrated example, connected to the main surface 111C and the back surface 112C, The twelfth face 127Cb is located between the second face 122C and the third face 123C in the x-direction, and between the second face 122C and the third face 123C in the y-direction. The twelfth face 127Cb is connected to the second face 122C and the third face 123C. In the illustrated example, the twelfth face 127Cb forms a convex curved surface, as viewed in the z-direction. The twelfth face 127Cb is located between the main surface 111C and the back surface 112C in the z-direction and, in the illustrated example, connected to the main surface 111C and the back surface 112C.

The eighth face 128C is located between the second face 122C and the fifth face 125C in the x-direction and the y-direction, and connected to the second face 122C and the fifth face 125C. In the illustrated example, the eighth face 128C is inclined with respect to the x-direction and the y-direction. The eighth face 128C is located between the main surface 111C and the back surface 112C in the z-direction and, in the illustrated example, connected to the main surface 111C and the back surface 112C.

The ninth face 129C is connected to the end portion of the fourth face 124C on the side of the third face 33 in the x-direction. The ninth face 129C is inclined with respect to the x-direction and the y-direction. The ninth face 129C is opposed to the sixth face 126B. The ninth face 129C is located between the main surface 111C and the back surface 112C in the z-direction and, in the illustrated example, connected to the main surface 111C and the back surface 112C.

In the illustrated example, the third face 123C includes a plurality of protrusions 131C. The plurality of protrusions 131C each protrude outwardly of the first portion 11C as viewed in the z-direction, and extend along the z-direction. Here, the plurality of protrusions 131C may be formed on the first portion 11C, in portions other than the third face 123C. In addition, the third face 123C may be without the plurality of protrusions 131C.

The plurality of recesses 1111C are each recessed from the main surface 111C in the z-direction. The shape of the recess 1111C in a z-direction view is not specifically limited, and may be, for example, circular, elliptical, rectangular, or triangular. In the illustrated example, the plurality of recesses 1111C are arranged in a matrix pattern.

The groove 1112C is recessed from the main surface 111C in the z-direction. In the illustrated example, the shape of the groove 1112C in a z-direction view is not specifically limited and, in the illustrated example, the groove 1112C includes a rectangular section, and a section extending along the x-direction inside the rectangular shape. The cross-sectional shape of the groove 1112C is not specifically limited, and may be, for example, circular, elliptical, rectangular, or triangular.

The number of rows of the plurality of recesses 1111C in the y-direction is larger in the region between the groove 1112C and the tenth face 124Cb, than in the region between the groove 1112C and the third face 123C.

The third portion 13C and the fourth portion 14C are covered with the encapsulating resin 7. The third portion 13C is connected to the first portion 11C and the fourth portion 14C. In the illustrated example, the third portion 13C is connected to a portion of the first portion 11C adjacent to the fourth face 124Ca. The fourth portion 14C is, like the fourth portion 14B of the lead 1B, shifted from the first portion 11C in the z-direction, to the side to which the main surface 111C is oriented. The end portion of the fourth portion 14C is flush with the sixth face 76 of the resin 7.

The second portion 12C is connected to the end portion of the fourth portion 14C, and corresponds to a portion of the lead 1C sticking out from the encapsulating resin 7. The second portion 12C sticks out to the opposite side of the first portion 11C, in the y-direction. The second portion 12C is used, for example, to electrically connect the semiconductor device A2 to an external circuit. In the illustrated example, the second portion 12C is bent in the z-direction, to the side to which the main surface 111C is oriented.

The lead 1D is located on the substrate 3 and, in this embodiment, on the first face 31. The lead 1D exemplifies a first lead in the present disclosure. The lead 1D is bonded to the bonding section 6D, via the bonding material 81. In the case where the bonding section 6D is not provided on the substrate 3, the lead 1D may be bonded to the substrate 3.

The configuration of the lead 1D is not specifically limited. In this embodiment the lead 1D includes, as shown in FIG. 4 and FIG. 14, a first portion 11D, a second portion 12D, a third portion 13D, and a fourth portion 14D, each of which will be described hereunder.

As shown in FIG. 41 and FIG. 43, the first portion 11D includes a main surface 111D, a back surface 112D, a first face 121D, a second face 122D, a third face 123D, a fourth face 124Da, a sixth face 126D, a seventh face 127Da, an eighth face 128D, a ninth face 129D, a tenth face 124Db, an eleventh face 127Db, a plurality of recesses 1111D, and a groove 1112D. The first portion 11D overlaps with the sixth face 36 of the substrate 3, as viewed in the z-direction.

The main surface 111D is oriented in the same direction as the first face 31, in the z-direction.

The back surface 112D is oriented to the opposite side of the main surface 111D in the z-direction and, in the illustrated example, a planar surface. The back surface 112D is bonded to the bonding section 6D via the bonding material 81.

The first face 121D is located between the main surface 111D and the back surface 112D in the z-direction, and oriented in the same direction as the third face 33 as a whole, in the x-direction. In the illustrated example, the first face 121D is connected to the main surface 111D and the back surface 112D. The first face 121D is opposed to the second face 122C.

The second face 122D is located on the opposite side of the first face 121D in the x-direction, and oriented in the same direction as the fourth face 34, in the x-direction. The second face 122D is located between the main surface 111D and the back surface 112D in the z-direction and, in the illustrated example, connected to the main surface 111D and the back surface 112D. The second face 122D is larger in size in the y-direction, than the first face 121D.

The third face 123D is located between the first face 121D and the second face 122D in the x-direction, and oriented in the same direction as the fifth face 35, in the y-direction. The third face 123D is located between the main surface 111D and the back surface 112D in the z-direction and, in the illustrated example, connected to the main surface 111D and the back surface 112D.

The fourth face 124Da is located on the side of the sixth face 36 in the y-direction, with respect to the first face 121D and the second face 122D, and extends along the x-direction. The fourth face 124Da is oriented in the same direction as the fifth face 35 in the y-direction, and opposed to the fifth face 125C. The fourth face 124Da is located between the main surface 111D and the back surface 112D in the z-direction and, in the illustrated example, connected to the main surface 111D and the back surface 112D. In the illustrated example, the fourth face 124Da overlaps with the first portion 11C, as viewed in the y-direction. The tenth face 124Db is located on the side of the sixth face 36 in the y-direction, with respect to the first face 121D and the second face 122D, and extends along the x-direction. The tenth face 124Db is oriented in the same direction as the sixth face 36 in the y-direction. The tenth face 124Db is located between the main surface 111D and the back surface 112D in the z-direction and, in the illustrated example, connected to the main surface 111D and the back surface 112D. In the illustrated example, the tenth face 124Db overlaps with the first portion 11C, as viewed in the y-direction.

The sixth face 126D is located between the first face 121D and the fourth face 124Da, in the x-direction and the y-direction. In the illustrated example, the sixth face 126D is connected to the first face 121D and the fourth face 124Da. The sixth face 126D is inclined with respect to the x-direction and the y-direction. The sixth face 126D is opposed to the eighth face 128C. The sixth face 126D is located between the main surface 111D and the back surface 112D in the z-direction and, in the illustrated example, connected to the main surface 111D and the back surface 112D.

The seventh face 127Da is located between the first face 121D and the third face 123D, and between the second face 122D and the third face 123D in the x-direction, and between the first face 121D and second face 122D, and the third face 123D, in the y-direction. The seventh face 127Da is connected to the first face 121D and the third face 123D. In the illustrated example, the seventh face 127Da forms a convex curved surface, as viewed in the z-direction. The seventh face 127Da is located between the main surface 111D and the back surface 112D in the z-direction and, in the illustrated example, connected to the main surface 111D and the back surface 112D. The eleventh face 127Db is located between the second face 122D and the third face 123D in the x-direction, and between the second face 122D and the third face 123D in the y-direction. The eleventh face 127Db is connected to the second face 122D and the third face 123D.

In the illustrated example, the eleventh face 127Db forms a convex curved surface, as viewed in the z-direction. The eleventh face 127Db is located between the main surface 111D and the back surface 112D in the z-direction and, in the illustrated example, connected to the main surface 111D and the back surface 112D.

The eighth face 128D is located between the second face 122D and the tenth face 124Db in the x-direction and the y-direction, and connected to the second face 122D and the tenth face 124Db. In the illustrated example, the eighth face 128D is inclined with respect to the x-direction and the y-direction. The eighth face 128D is located between the main surface 111D and the back surface 112D in the z-direction and, in the illustrated example, connected to the main surface 111D and the back surface 112D.

The ninth face 129D is connected to the end portion of the fourth face 124Da on the side of the third face 33 in the x-direction. The ninth face 129D is inclined with respect to the x-direction and the y-direction. The ninth face 129D is opposed to the sixth face 126C. The ninth face 129D is located between the main surface 111D and the back surface 112D in the z-direction and, in the illustrated example, connected to the main surface 111D and the back surface 112D.

In the illustrated example, the second face 122D and the third face 123D each include a plurality of protrusions 131D. The plurality of protrusions 131D each protrude outwardly of the first portion 11D as viewed in the z-direction, and extend along the z-direction. Here, the plurality of protrusions 131D may be formed on the first portion 11D, in portions other than the second face 122D and the third face 123D. In addition, at least one of the second face 122D and the third face 123D may be without the plurality of protrusions 131D.

The plurality of recesses 1111D are each recessed from the main surface 111D in the z-direction. The shape of the recess 1111D in a z-direction view is not specifically limited, and may be, for example, circular, elliptical, rectangular, or triangular. In the illustrated example, the plurality of recesses 1111D are arranged in a matrix pattern.

The groove 1112D is recessed from the main surface 111D in the z-direction. In the illustrated example, the shape of the groove 1112D in a z-direction view is not specifically limited and, in the illustrated example, the groove 1112D includes a rectangular section, and a section extending along the x-direction inside the rectangular shape. The cross-sectional shape of the groove 1112D is not specifically limited, and may be, for example, circular, elliptical, rectangular, or triangular.

The number of rows of the plurality of recesses 1111D in the y-direction is larger in the region between the groove 1112D and the tenth face 124Db, than in the region between the groove 1112D and the third face 123D.

The third portion 13D and the fourth portion 14D are covered with the encapsulating resin 7. The third portion 13D is connected to the first portion 11D and the fourth portion 14D. In the illustrated example, the third portion 13D is connected to a portion of the first portion 11D adjacent to the fourth face 124Da. The fourth portion 14D is, like the fourth portion 14B of the lead 1B, shifted from the first portion 11D in the z-direction, to the side to which the main surface 111D is oriented. The end portion of the fourth portion 14D is flush with the sixth face 76 of the resin 7.

The second portion 12D is connected to the end portion of the fourth portion 14D, and corresponds to a portion of the lead 1D sticking out from the encapsulating resin 7. The second portion 12D sticks out to the opposite side of the first portion 11D, in the y-direction. The second portion 12D is used, for example, to electrically connect the semiconductor device A2 to an external circuit. In the illustrated example, the second portion 12D is bent in the z-direction, to the side to which the main surface 111D is oriented.

The lead 1E is spaced apart from the substrate 3, as viewed in the z-direction. In this embodiment, the lead 1E located on the side to which the sixth face 36 is oriented, with respect to the substrate 3 in the y-direction.

The configuration of the lead 1E is not specifically limited. In this embodiment the lead 1E includes, as shown in FIG. 4, a second portion 12E and a fourth portion 14E, each of which will be described hereunder.

The fourth portion 14E is covered with the encapsulating resin 7. The fourth portion 14E is, like the fourth portion 14D of the lead 1D, shifted from the first portion 11E in the z-direction, to the side to which the main surface 111E is oriented. The fourth portion 14E overlaps with the first portion 11C and the first portion 11D, as viewed in the y-direction. The end portion of the fourth portion 14E is flush with the sixth face 76 of the resin 7.

The second portion 12E is connected to the end portion of the fourth portion 14E, and corresponds to a portion of the lead 1E sticking out from the encapsulating resin 7. The second portion 12E sticks out to the opposite side of the fourth portion 14E, in the y-direction. The second portion 12E is used, for example, to electrically connect the semiconductor device A2 to an external circuit. In the illustrated example, the second portion 12E is bent in the z-direction, to the side to which the first face 31 is oriented.

The lead 1F is spaced apart from the substrate 3, as viewed in the z-direction. In this embodiment, the lead 1F is located on the side to which the sixth face 36 is oriented, with respect to the substrate 3 in the y-direction. The lead 1F is located on the opposite side of the fourth portion 14D, across the lead 1E.

The configuration of the lead 1F is not specifically limited. In this embodiment the lead 1F includes, as shown in FIG. 4, a second portion 12F and a fourth portion 14F, each of which will be described hereunder.

The fourth portion 14F is covered with the encapsulating resin 7. The fourth portion 14F is, like the fourth portion 14D of the lead 1D, shifted from the first portion 11D in the z-direction, to the side to which the main surface 111D is oriented. The fourth portion 14F overlaps with the first portion 11D, as viewed in the y-direction. The end portion of the fourth portion 14F is flush with the sixth face 76 of the resin 7.

The second portion 12F is connected to the end portion of the fourth portion 14F, and corresponds to a portion of the lead 1F sticking out from the encapsulating resin 7. The second portion 12F sticks out to the opposite side of the fourth portion 14F, in the y-direction. The second portion 12F is used, for example, to electrically connect the semiconductor device A2 to an external circuit. In the illustrated example, the second portion 12F is bent in the z-direction, to the side to which the first face 31 is oriented.

The lead 1G is spaced apart from the substrate 3, as viewed in the z-direction. In this embodiment, the lead 1G is located on the side to which the fourth face 34 is oriented, with respect to the substrate 3 in the x-direction. The lead 1G is located on the opposite side of the fourth portion 14E, across the lead 1F.

The configuration of the lead 1G is not specifically limited. In this embodiment the lead 1G includes, as shown in FIG. 4, a second portion 12G and a fourth portion 14G, each of which will be described hereunder.

The fourth portion 14G is covered with the encapsulating resin 7. The fourth portion 14G is, like the fourth portion 14D of the lead 1D, shifted from the first portion 11D in the z-direction, to the side to which the main surface 111D is oriented. The fourth portion 14G overlaps with the fourth portion 14F, as viewed in the y-direction. In addition, the fourth portion 14G overlaps with the first portion 11D, as viewed in the x-direction. The end portion of the fourth portion 14G is flush with the sixth face 76 of the resin 7.

The second portion 12G is connected to the end portion of the fourth portion 14G, and corresponds to a portion of the lead 1G sticking out from the encapsulating resin 7. The second portion 12G sticks out to the opposite side of the fourth portion 14G, in the y-direction. The second portion 12G is used, for example, to electrically connect the semiconductor device A2 to an external circuit. In the illustrated example, the second portion 12G is bent in the z-direction, to the side to which the first face 31 is oriented.

As shown in FIG. 39, the pair of second portions 12A are aligned with a clearances G11 therebetween, as viewed in the x-direction. The second portions 12A to 12E are aligned in the x-direction, with clearances G12 between each other. The difference among the clearances G12 is within ±5% from each other. The clearances G12 are wider than the clearance G11. The second portions 12E to G are aligned in the x-direction, with clearances G13 between each other. The clearances G13 are narrower than the clearances G12 and, in the illustrated example, also narrower than the clearance G11. The difference among the clearances G13 is within ±5% from each other.

In this embodiment, as shown in FIG. 42 and FIG. 43, the main surface 111A includes three first regions Ra, Rb, and Rc, and three second regions R1*a*, R1*b*, and R1*c*, defined by the groove 1112A. The three first regions Ra, Rb, and Rc are located on the side of the lead 2, in the y-direction. The shape of the three first regions Ra, Rb, and Rc is not specifically limited. In the illustrated example, the mentioned regions have an elongate rectangular shape having the long sides extending along the y-direction, as viewed in the z-direction. The three first regions Ra, Rb, and Rc overlap with each other, as viewed in the x-direction. In the illustrated example, further, the three first regions Ra, Rb, and Rc generally coincide with each other, as viewed in the x-direction. Here, the expression "generally coincide" as viewed in the x-direction refers to, for example, exactly coinciding with each other, or being deviated by within ±5% of the characteristic size (size of the first region Ra, Rb, or Rc in the y-direction).

The three second regions R1*a*, R1*b*, and R1*c* are located on the opposite side of the lead 2 with respect to the first regions Ra, Rb, and Rc, in the y-direction. The shape of the three second regions R1*a*, R1*b*, and R1*c* is not specifically limited. In the illustrated example, the mentioned regions have a rectangular shape, as viewed in the z-direction. The three second regions R1*a*, R1*b*, and R1*c* overlap with each other, as viewed in the x-direction. In the illustrated example, further, the three second regions R1*a*, R1*b*, and R1*c* generally coincide with each other, as viewed in the x-direction. Here, the expression "generally coincide" as viewed in the x-direction refers to, for example, exactly coinciding with each other, or being deviated by within ±5% of the characteristic size (size of the second region R1*a*, R1*b*, or R1*c* in the y-direction).

The sizes of the three first regions Ra, Rb, and Rc, and the three second regions R1*a*, R1*b*, and R1*c*, are not specifically limited. In the illustrated example, a size y1 of the first regions Ra, Rb, and Rc in the y-direction is larger than a size y2 of the second regions R1*a*, R1*b*, and R1*c* in the y-direction.

The main surface 111B includes a first region Rd and a second region R1*d*, defined by the groove 1112B. The first region Rd is located on the side of the lead 2, in the y-direction. The shape of the first region Rd is not specifically limited. In the illustrated example, the first region Rd has an elongate rectangular shape having the long sides extending along the y-direction, as viewed in the z-direction. The second region R1*d* is located on the opposite side of the lead 2 with respect to the first region Rd, in the y-direction. The shape of the second region R1*d* is not specifically limited. In the illustrated example, the second region R1*d* has a rectangular shape, as viewed in the z-direction.

The main surface 111C includes a first region Re and a second region R1*e*, defined by the groove 1112C. The first region Re is located on the side of the lead 2, in the y-direction. The shape of the first region Re is not specifically limited. In the illustrated example, the first region Re has an elongate rectangular shape having the long sides extending along the y-direction, as viewed in the z-direction. The second region R1*e* is located on the opposite side of the lead 2 with respect to the first region Re, in the y-direction. The shape of the second region R1*e* is not specifically limited. In the illustrated example, the second region R1*e* has a rectangular shape, as viewed in the z-direction.

The main surface 111D includes a first region Rf and a second region R1*f*, defined by the groove 1112D. The first region Rf is located on the side of the lead 2, in the y-direction. The shape of the first region Rf is not specifically limited. In the illustrated example, the first region Rf has an elongate rectangular shape having the long sides extending along the y-direction, as viewed in the z-direction. The second region R1*f* is located on the opposite side of the lead 2 with respect to the first region Rf, in the y-direction. The shape of the second region R1*f* is not specifically limited. In the illustrated example, the second region R1*f* has a rectangular shape, as viewed in the z-direction.

The three first regions Rd, Re, and Rf overlap with each other, as viewed in the x-direction. In addition, in the illustrated example, the three first regions Rd, Re, and Rf generally coincide with each other, as viewed in the x-direction. Here, the expression "generally coincide" as viewed in the x-direction refers to, for example, exactly coinciding with each other, or being deviated by within ±5% of the characteristic size (size of the first region Rd, Re, or Rf in the y-direction). The three second regions R1*d*, R1*e*, and R1*f* overlap with each other, as viewed in the x-direction. In the illustrated example, further, the three second regions R1*d*, R1*e*, and R1*f* generally coincide with each other, as viewed in the x-direction. Here, the expression "generally coincide" as viewed in the x-direction refers to, for example, exactly coinciding with each other, or being deviated by within ±5% of the characteristic size (size of the second region R1*d*, R1*e*, or R1*f* in the y-direction).

The sizes of the three first regions Rd, Re, and Rf and the three second regions R1*d*, R1*e*, and R1*f* are not specifically limited. In the illustrated example, the size y1 of the first regions Rd, Re, and Rf in the y-direction is larger than the size y2 of the second regions R1*d*, R1*e*, and R1*f* in the y-direction.

<Leads 2>

Regarding the lead 2 according to this embodiment, although any of the elements is apparently given, for the sake of convenience of description, the same numeral as that of the lead 2 according to the first embodiment, it does not necessarily mean that the mentioned element has the same or similar configuration. The configuration of an element with a numeral is defined by the description relevant to this embodiment.

The plurality of leads 2 contain a metal, and have higher heat dissipation characteristics, for example than the substrate 3. The metal to form the lead 2 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 2 may be plated with nickel (Ni). Examples of the forming method of the plurality of leads 2 include pressing a metal plate with a die, and patterning a metal plate by etching, without limitation thereto. The thickness of the lead 2 is not specifically limited, but may be, for example, approximately 0.4 mm to 0.8 mm. The plurality of leads 2 are located so as to overlap with the second region 303, as viewed in the z-direction.

In this embodiment, the plurality of leads 2 include a plurality of leads 2A to 2U, as shown in FIG. 35 to FIG. 40, FIG. 44, and FIG. 45. The plurality of leads 2A to 2H, and 2S to 2U respectively constitute conduction paths to the control chips 4G and 4H. The plurality of leads 2I to 2R constitute conduction paths to the primary-side circuit chip 4J.

The lead 2A is spaced apart from the plurality of leads 1. The lead 2A is located on the conductive section 5. The lead 2A is electrically connected to the conductive section 5. The lead 2A exemplifies a second lead in the present disclosure. The lead 2A is bonded to the second portion 52A of the wiring 50A in the conductive section 5, via a conductive bonding material 82. The conductive bonding material 82 may be any material that is capable of bonding, and electrically connecting, the lead 2A to the second portion 52A. For example, silver paste, copper paste, or solder may be employed as the conductive bonding material 82. The conductive bonding material 82 corresponds to the first conductive bonding material in the present disclosure.

The configuration of the lead 2A is not specifically limited. In this embodiment the lead 2A includes, as shown in FIG. 44, a first portion 21A, a second portion 22A, a third portion 23A, and a fourth portion 24A, each of which will be described hereunder.

The first portion 21A is bonded to the second portion 52A of the wiring 50A. The shape of the first portion 21A is not specifically limited, and a desired shape may be selected from a rectangular shape, a polygonal shape, a circular shape, an elliptical shape, and so forth. In the illustrated example, the first portion 21A has a bent shape including a portion extending along the x-direction, and a portion extending along the y-direction. The first portion 21A overlaps with the third face 33 of the substrate 3 as viewed in the z-direction, and sticks out in the x-direction, toward the side to which the third face 33 is oriented. In the illustrated example, the first portion 21A overlaps with the second portion 52A, as viewed in the z-direction. In addition, the first portion 21A includes a through hole 211A. The through hole 211A is formed so as to penetrate through the first portion 21A, in the z-direction. The inside of the through hole 211A is filled with the conductive bonding material 82, like a through hole 211I in a first portion 21I of the lead 2I shown in FIG. 40. The conductive bonding material 82 covers a part of the surface of the lead 2A. However, the conductive bonding material 82 may be provided only inside the through hole 211A, so as not to reach the surface of the lead 2A.

The third portion 23A and the fourth portion 24A are covered with the encapsulating resin 7. The third portion 23A is connected to the first portion 21A and the fourth portion 24A. The fourth portion 24A is shifted in the z-direction with respect to the first portion 21A, to the side to which the first face 31 is oriented, like a third portion 23I and a fourth portion 24I of the lead 2I shown in FIG. 40. The end portion of the fourth portion 24A is flush with a fifth face 75 of the resin 7. In the illustrated example, the third portion 23A and the fourth portion 24A generally coincide with each other, as viewed in the y-direction. Here, the expression "generally coincide" as viewed in the y-direction refers to, for example, exactly coinciding with each other, or being deviated by within ±5% of the characteristic size (size of the third portion 23A, or fourth portion 24A in the x-direction).

The second portion 22A is connected to the end portion of the fourth portion 24A, and corresponds to a portion of the lead 2A sticking out from the encapsulating resin 7 to the opposite side of the plurality of leads 1, as viewed in the y-direction. The second portion 22A sticks out to the opposite side of the first portion 21A, in the y-direction. The second portion 22A is used, for example, to electrically connect the semiconductor device A1 to an external circuit. In the illustrated example, the second portion 22A is bent in the z-direction, to the side to which the first face 31 is oriented. The second portion 22A, the third portion 23A, and the fourth portion 24A each include, on the respective sides thereof in the x-direction, edges extending along the y-direction.

The lead 2B is spaced apart from the plurality of leads 1. The lead 2B is located on the conductive section 5. The lead 2B is electrically connected to the conductive section 5. The lead 2B exemplifies a second lead in the present disclosure. The lead 2B is bonded to the second portion 52B of the wiring 50B in the conductive section 5, via the conductive bonding material 82.

The configuration of the lead 2B is not specifically limited. In this embodiment the lead 2B includes, as shown in FIG. 44, a first portion 21B, a second portion 22B, a third portion 23B, and a fourth portion 24B, each of which will be described hereunder.

The first portion 21B is bonded to the second portion 52B of the wiring 50B. The shape of the first portion 21B is not specifically limited, and a desired shape may be selected from a rectangular shape, a polygonal shape, a circular shape, an elliptical shape, and so forth. In the illustrated example, the first portion 21B has a bent shape including a portion inclined with respect to the x-direction and the y-direction, and a portion extending along the y-direction. The first portion 21B overlaps with the third face 33 of the substrate 3 as viewed in the z-direction, and sticks out in the x-direction, toward the side to which the third face 33 is oriented. In the illustrated example, the first portion 21B overlaps with the second portion 52B, as viewed in the z-direction. In addition, the first portion 21B includes a through hole 211B. The through hole 211B is formed so as to penetrate through the first portion 21B, in the z-direction. The inside of the through hole 21B is filled with the conductive bonding material 82, like the through hole 211I in the first portion 21I of the lead 2I shown in FIG. 40. The conductive bonding material 82 covers a part of the surface of the lead 2B. However, the conductive bonding material 82 may be provided only inside the through hole 211B, so as not to reach the surface of the lead 2B.

The third portion 23B and the fourth portion 24B are covered with the encapsulating resin 7. The third portion 23B is connected to the first portion 21B and the fourth portion 24B. The fourth portion 24B is shifted in the z-direction with respect to the first portion 21B, to the side to which the first face 31 is oriented, like the third portion 23I and the fourth portion 24I of the lead 2I shown in FIG. 40. The end portion of the fourth portion 24B is flush with the fifth face 75 of the resin 7. In the illustrated example, the third portion 23B and the fourth portion 24B generally coincide with each other, as viewed in the y-direction. Here, the expression "generally coincide" as viewed in the y-direction refers to, for example, exactly coinciding with each other, or being deviated by within ±5% of the characteristic size (size of the third portion 23B or fourth portion 24B in the x-direction).

The second portion 22B is connected to the end portion of the fourth portion 24B, and corresponds to a portion of the lead 2B sticking out from the encapsulating resin 7 to the opposite side of the plurality of leads 1, as viewed in the y-direction. The second portion 22B sticks out to the opposite side of the first portion 21B, in the y-direction. The second portion 22B is used, for example, to electrically connect the semiconductor device A2 to an external circuit. In the illustrated example, the second portion 22B is bent in the z-direction, to the side to which the first face 31 is oriented. The second portion 22B, the third portion 23B, and the fourth portion 24B each include, on the respective sides thereof in the x-direction, edges extending along the y-direction. The edges of the second portion 22B, the third portion 23B, and the fourth portion 24B, on the side of the third face 33 in the x-direction, are respectively opposed to the edges of the second portion 22A, the third portion 23A, and the fourth portion 24A, on the side of the fourth face 34 in the x-direction.

The lead 2C is spaced apart from the plurality of leads 1. The lead 2C is located on the conductive section 5. The lead 2C is electrically connected to the conductive section 5. The lead 2C exemplifies a second lead in the present disclosure. The lead 2C is bonded to the second portion 52C of the wiring 50C in the conductive section 5, via the conductive bonding material 82.

The configuration of the lead 2C is not specifically limited. In this embodiment the lead 2C includes, as shown in FIG. 44, a first portion 21C, a second portion 22C, a third portion 23C, and a fourth portion 24C, each of which will be described hereunder.

The first portion 21C is bonded to the second portion 52C of the wiring 50C. The shape of the first portion 21C is not specifically limited, and a desired shape may be selected from a rectangular shape, a polygonal shape, a circular shape, an elliptical shape, and so forth. In the illustrated example, the first portion 21C has a bent shape including two portions extending along the y-direction, and a portion interposed therebetween and inclined with respect to the x-direction and the y-direction. The first portion 21C overlaps with the fifth face 35 of the substrate 3 as viewed in the z-direction, and sticks out in the y-direction, toward the side to which the fifth face 35 is oriented. In the illustrated example, the first portion 21C overlaps with the second portion 52C, as viewed in the z-direction. In addition, the first portion 21C includes a through hole 211C. The through hole 211C is formed so as to penetrate through the first portion 21C, in the z-direction. The inside of the through hole 211C is filled with the conductive bonding material 82, like the through hole 211I in the first portion 21I of the lead 2I shown in FIG. 40. The conductive bonding material 82 covers a part of the surface of the lead 2C. However, the conductive bonding material 82 may be provided only inside the through hole 211C, so as not to reach the surface of the lead 2C.

The third portion 23C and the fourth portion 24C are covered with the encapsulating resin 7. The third portion 23C is connected to the first portion 21C and the fourth portion 24C. The fourth portion 24C is shifted in the z-direction with respect to the first portion 21C, to the side to which the first face 31 is oriented, like the third portion 23I and the fourth portion 24I of the lead 2I shown in FIG. 40. The end portion of the fourth portion 24C is flush with the fifth face 75 of the resin 7. In the illustrated example, the third portion 23C and the fourth portion 24C generally coincide with each other, as viewed in the y-direction. Here, the expression "generally coincide" as viewed in the y-direction refers to, for example, exactly coinciding with each other, or being deviated by within ±5% of the characteristic size (size of the third portion 23C or fourth portion 24C in the x-direction).

The second portion 22C is connected to the end portion of the fourth portion 24C, and corresponds to a portion of the lead 2C sticking out from the encapsulating resin 7 to the opposite side of the plurality of leads 1, as viewed in the y-direction. The second portion 22C sticks out to the opposite side of the first portion 21C, in the y-direction. The second portion 22C is used, for example, to electrically connect the semiconductor device A2 to an external circuit. In the illustrated example, the second portion 22C is bent in the z-direction, to the side to which the first face 31 is oriented. The second portion 22C, the third portion 23C, and the fourth portion 24C each include, on the respective sides thereof in the x-direction, edges extending along the y-direction. The edges of the second portion 22C, the third portion 23C, and the fourth portion 24C, on the side of the third face 33 in the x-direction, are respectively opposed to the edges of the second portion 22B, the third portion 23B, and the fourth portion 24B, on the side of the fourth face 34 in the x-direction.

The lead 2D is spaced apart from the plurality of leads 1. The lead 2D is located on the conductive section 5. The lead 2D is electrically connected to the conductive section 5. The lead 2D exemplifies a second lead in the present disclosure. The lead 2D is bonded to the second portion 52D of the wiring 50D in the conductive section 5, via the conductive bonding material 82.

The configuration of the lead 2D is not specifically limited. In this embodiment the lead 2D includes, as shown in FIG. 44, a first portion 21D, a second portion 22D, a third portion 23D, and a fourth portion 24D, each of which will be described hereunder.

The first portion 21D is bonded to the second portion 52D of the wiring 50D. The shape of the first portion 21D is not specifically limited, and a desired shape may be selected from a rectangular shape, a polygonal shape, a circular shape, an elliptical shape, and so forth. In the illustrated example, the first portion 21D has a bent shape including two portions extending along the y-direction, and a portion interposed therebetween and inclined with respect to the x-direction and the y-direction. The first portion 21D overlaps with the fifth face 35 of the substrate 3 as viewed in the z-direction, and sticks out in the y-direction, toward the side to which the fifth face 35 is oriented. In the illustrated example, the first portion 21D overlaps with the second portion 52D, as viewed in the z-direction. In addition, the first portion 21D includes a through hole 211D. The through hole 211D is formed so as to penetrate through the first portion 21D, in the z-direction. The inside of the through hole 211D is filled with the conductive bonding material 82, like the through hole 211I in the first portion 21I of the lead 2I shown in FIG. 40. The conductive bonding material 82 covers a part of the surface of the lead 2D. However, the conductive bonding material 82 may be provided only inside the through hole 211D, so as not to reach the surface of the lead 2D.

The third portion 23D and the fourth portion 24D are covered with the encapsulating resin 7. The third portion 23D is connected to the first portion 21D and the fourth portion 24D. The fourth portion 24D is shifted in the z-direction with respect to the first portion 21D, to the side to which the first face 31 is oriented, like the third portion 23I and the fourth portion 24I of the lead 2I shown in FIG. 40. The end portion of the fourth portion 24D is flush with the fifth face 75 of the resin 7. In the illustrated example, the third portion 23D and the fourth portion 24D generally coincide with each other, as viewed in the y-direction. Here, the expression "generally coincide" as viewed in the y-direction refers to, for example, exactly coinciding with each other, or being deviated by within ±5% of the characteristic size (size of the third portion 23D or fourth portion 24D in the x-direction).

The second portion 22D is connected to the end portion of the fourth portion 24D, and corresponds to a portion of the lead 2D sticking out from the encapsulating resin 7 to the opposite side of the plurality of leads 1, as viewed in the y-direction. The second portion 22D sticks out to the opposite side of the first portion 21D, in the y-direction. The second portion 22D is used, for example, to electrically connect the semiconductor device A2 to an external circuit. In the illustrated example, the second portion 22D is bent in the z-direction, to the side to which the first face 31 is oriented. The second portion 22D, the third portion 23D, and the fourth portion 24D each include, on the respective sides thereof in the x-direction, edges extending along the y-direction. The edges of the second portion 22D, the third portion 23D, and the fourth portion 24D, on the side of the third face 33 in the x-direction, are respectively opposed to the edges of the second portion 22C, the third portion 23C, and the fourth portion 24C, on the side of the fourth face 34 in the x-direction.

The lead 2E is spaced apart from the plurality of leads 1. The lead 2E is located on the conductive section 5. The lead 2E is electrically connected to the conductive section 5. The lead 2E exemplifies a second lead in the present disclosure. The lead 2E is bonded to the second portion 52E of the wiring 50E in the conductive section 5, via the conductive bonding material 82.

The configuration of the lead 2E is not specifically limited. In this embodiment the lead 2E includes, as shown in FIG. 44, a first portion 21E, a second portion 22E, a third portion 23E, and a fourth portion 24E, each of which will be described hereunder.

The first portion 21E is bonded to the second portion 52E of the wiring 50E. The shape of the first portion 21E is not specifically limited, and a desired shape may be selected from a rectangular shape, a polygonal shape, a circular shape, an elliptical shape, and so forth. In the illustrated example, the first portion 21E has a bent shape including two portions extending along the y-direction, and a portion interposed therebetween and inclined with respect to the x-direction and the y-direction. The first portion 21E overlaps with the fifth face 35 of the substrate 3 as viewed in the z-direction, and sticks out in the y-direction, toward the side to which the fifth face 35 is oriented. In the illustrated example, the first portion 21E overlaps with the second portion 52E, as viewed in the z-direction. In addition, the first portion 21E includes a through hole 211E. The through hole 211E is formed so as to penetrate through the first portion 21E, in the z-direction. The inside of the through hole 211E is filled with the conductive bonding material 82, like the through hole 211I in the first portion 21I of the lead 2I shown in FIG. 40. The conductive bonding material 82 covers a part of the surface of the lead 2E. However, the conductive bonding material 82 may be provided only inside the through hole 211E, so as not to reach the surface of the lead 2E.

The third portion 23E and the fourth portion 24E are covered with the encapsulating resin 7. The third portion 23E is connected to the first portion 21E and the fourth portion 24E. The fourth portion 24E is shifted in the z-direction with respect to the first portion 21E, to the side to which the first face 31 is oriented, like the third portion 23I and the fourth portion 24I of the lead 2I shown in FIG. 40. The end portion of the fourth portion 24E is flush with the fifth face 75 of the resin 7. In the illustrated example, the third portion 23E and the fourth portion 24E generally coincide with each other, as viewed in the y-direction. Here, the expression "generally coincide" as viewed in the y-direction refers to, for example, exactly coinciding with each other, or being deviated by within ±5% of the characteristic size (size of the third portion 23E or fourth portion 24E in the x-direction).

The second portion 22E is connected to the end portion of the fourth portion 24E, and corresponds to a portion of the lead 2E sticking out from the encapsulating resin 7 to the opposite side of the plurality of leads 1, as viewed in the y-direction. The second portion 22E sticks out to the opposite side of the first portion 21E, in the y-direction. The second portion 22E is used, for example, to electrically connect the semiconductor device A2 to an external circuit. In the illustrated example, the second portion 22E is bent in the z-direction, to the side to which the first face 31 is oriented. The second portion 22E, the third portion 23E, and the fourth portion 24E each include, on the respective sides thereof in the x-direction, edges extending along the y-direction. The edges of the second portion 22E, the third portion 23E, and the fourth portion 24E, on the side of the third face 33 in the x-direction, are respectively opposed to the edges of the second portion 22D, the third portion 23D, and the fourth portion 24D, on the side of the fourth face 34 in the x-direction.

The lead 2F is spaced apart from the plurality of leads 1. The lead 2F is located on the conductive section 5. The lead 2F is electrically connected to the conductive section 5. The lead 2F exemplifies a second lead in the present disclosure. The lead 2F is bonded to the second portion 52F of the wiring 50F in the conductive section 5, via the conductive bonding material 82.

The configuration of the lead 2F is not specifically limited. In this embodiment the lead 2F includes, as shown in FIG. 44, a first portion 21F, a second portion 22F, a third portion 23F, and a fourth portion 24F, each of which will be described hereunder.

The first portion 21F is bonded to the second portion 52F of the wiring 50F. The shape of the first portion 21F is not specifically limited, and a desired shape may be selected from a rectangular shape, a polygonal shape, a circular shape, an elliptical shape, and so forth. In the illustrated example, the first portion 21F has a bent shape including a portion extending along the y-direction, and a portion inclined with respect to the x-direction and the y-direction. The first portion 21F overlaps with the fifth face 35 of the substrate 3 as viewed in the z-direction, and sticks out in the y-direction, toward the side to which the fifth face 35 is oriented. In the illustrated example, the first portion 21F overlaps with the second portion 52F, as viewed in the z-direction. In addition, the first portion 21F includes a through hole 211F. The through hole 211F is formed so as to penetrate through the first portion 21F, in the z-direction. The inside of the through hole 211F is filled with the conductive bonding material 82, like the through hole 211I in the first portion 21I of the lead 2I shown in FIG. 40. The conductive bonding material 82 covers a part of the surface of the lead 2F. However, the conductive bonding material 82 may be provided only inside the through hole 211F, so as not to reach the surface of the lead 2F.

The third portion 23F and the fourth portion 24F are covered with the encapsulating resin 7. The third portion 23F is connected to the first portion 21F and the fourth portion 24F. The fourth portion 24F is shifted in the z-direction with respect to the first portion 21F, to the side to which the first face 31 is oriented, like the third portion 23I and the fourth portion 24I of the lead 2I shown in FIG. 40. The end portion of the fourth portion 24F is flush with the fifth face 75 of the resin 7. In the illustrated example, the third portion 23F and the fourth portion 24F generally coincide with each other, as viewed in the y-direction. Here, the expression "generally coincide" as viewed in the y-direction refers to, for example, exactly coinciding with each other, or being deviated by within ±5% of the characteristic size (size of the third portion 23F or fourth portion 24F in the x-direction).

The second portion 22F is connected to the end portion of the fourth portion 24F, and corresponds to a portion of the lead 2F sticking out from the encapsulating resin 7 to the opposite side of the plurality of leads 1, as viewed in the y-direction. The second portion 22F sticks out to the opposite side of the first portion 21F, in the y-direction. The second portion 22F is used, for example, to electrically connect the semiconductor device A2 to an external circuit. In the illustrated example, the second portion 22F is bent in the z-direction, to the side to which the first face 31 is oriented. The second portion 22F, the third portion 23F, and the fourth portion 24F each include, on the respective sides thereof in the x-direction, edges extending along the y-direction. The edges of the second portion 22F, the third portion 23F, and the fourth portion 24F, on the side of the third face 33 in the x-direction, are respectively opposed to the edges of the second portion 22E, the third portion 23E, and the fourth portion 24E, on the side of the fourth face 34 in the x-direction.

The lead 2G is spaced apart from the plurality of leads 1. The lead 2G is located on the conductive section 5. The lead 2G is electrically connected to the conductive section 5. The lead 2G exemplifies a second lead in the present disclosure. The lead 2G is bonded to the second portion 52G of the wiring 50G in the conductive section 5, via the conductive bonding material 82.

The configuration of the lead 2G is not specifically limited. In this embodiment the lead 2G includes, as shown in FIG. 44, a first portion 21G, a second portion 22G, a third portion 23G, and a fourth portion 24G, each of which will be described hereunder.

The first portion 21G is bonded to the second portion 52G of the wiring 50G. The shape of the first portion 21G is not specifically limited, and a desired shape may be selected from a rectangular shape, a polygonal shape, a circular shape, an elliptical shape, and so forth. In the illustrated example, the first portion 21G has a strip shape extending along the y-direction. The first portion 21G overlaps with the fifth face 35 of the substrate 3 as viewed in the z-direction, and sticks out in the y-direction, toward the side to which the fifth face 35 is oriented. In the illustrated example, the first portion 21G overlaps with the second portion 52G, as viewed in the z-direction. In addition, the first portion 21G includes a through hole 211G. The through hole 211E is formed so as to penetrate through the first portion 21G, in the z-direction. The inside of the through hole 211G is filled with the conductive bonding material 82, like the through hole 211I in the first portion 21I of the lead 2I shown in FIG. 40. The conductive bonding material 82 covers a part of the surface of the lead 2G. However, the conductive bonding material 82 may be provided only inside the through hole 211G, so as not to reach the surface of the lead 2G.

The third portion 23G and the fourth portion 24G are covered with the encapsulating resin 7. The third portion 23G is connected to the first portion 21G and the fourth portion 24G. The fourth portion 24G is shifted in the z-direction with respect to the first portion 21G, to the side to which the first face 31 is oriented, like the third portion 23I and the fourth portion 24I of the lead 2I shown in FIG. 40. The end portion of the fourth portion 24G is flush with the fifth face 75 of the resin 7. In the illustrated example, the third portion 23G and the fourth portion 24G generally coincide with each other, as viewed in the y-direction. Here, the expression "generally coincide" as viewed in the y-direction refers to, for example, exactly coinciding with each other, or being deviated by within ±5% of the characteristic size (size of the third portion 23G or fourth portion 24G in the x-direction).

The second portion 22G is connected to the fourth portion 24G, and corresponds to a portion of the lead 2G sticking out from the encapsulating resin 7 to the opposite side of the plurality of leads 1, as viewed in the y-direction. The second portion 22G sticks out to the opposite side of the first portion 21G, in the y-direction. The second portion 22G is used, for example, to electrically connect the semiconductor device A2 to an external circuit. In the illustrated example, the second portion 22G is bent in the z-direction, to the side to which the first face 31 is oriented. The second portion 22G, the third portion 23G, and the fourth portion 24G each include, on the respective sides thereof in the x-direction, edges extending along the y-direction. The edges of the second portion 22G, the third portion 23G, and the fourth portion 24G, on the side of the third face 33 in the x-direction, are respectively opposed to the edges of the second portion 22F, the third portion 23F, and the fourth portion 24F, on the side of the fourth face 34 in the x-direction.

The lead 2H is spaced apart from the plurality of leads 1. The lead 2H is located on the conductive section 5. The lead 2H is electrically connected to the conductive section 5. The lead 2H exemplifies a second lead in the present disclosure. The lead 2H is bonded to the second portion 52H of the wiring 50H in the conductive section 5, via the conductive bonding material 82.

The configuration of the lead 2H is not specifically limited. In this embodiment the lead 2H includes, as shown in FIG. 44, a first portion 21H, a second portion 22H, a third portion 23H, and a fourth portion 24H, each of which will be described hereunder.

The first portion 21H is bonded to the second portion 52H of the wiring 50H. The shape of the first portion 21H is not specifically limited, and a desired shape may be selected from a rectangular shape, a polygonal shape, a circular shape, an elliptical shape, and so forth. In the illustrated example, the first portion 21H has a strip shape extending along the y-direction. The first portion 21H overlaps with the fifth face 35 of the substrate 3 as viewed in the z-direction, and sticks out in the y-direction, toward the side to which the fifth face 35 is oriented. In the illustrated example, the first portion 21H overlaps with the second portion 52H, as viewed in the z-direction. In addition, the first portion 21H includes a through hole 211H. The through hole 211H is formed so as to penetrate through the first portion 21H, in the z-direction. The inside of the through hole 211H is filled with the conductive bonding material 82, like the through hole 211I in the first portion 21I of the lead 2I shown in FIG. 40. The conductive bonding material 82 covers a part of the surface of the lead 2H. However, the conductive bonding material 82 may be provided only inside the through hole 211H, so as not to reach the surface of the lead 2H.

The third portion 23H and the fourth portion 24H are covered with the encapsulating resin 7. The third portion 23H is connected to the first portion 21H and the fourth portion 24H. The fourth portion 24H is shifted in the z-direction with respect to the first portion 21H, to the side to which the first face 31 is oriented, like the third portion 23I and the fourth portion 24I of the lead 2I shown in FIG. 40. The end portion of the fourth portion 24H is flush with the fifth face 75 of the resin 7. In the illustrated example, the third portion 23H and the fourth portion 24H generally coincide with each other, as viewed in the y-direction. Here, the expression "generally coincide" as viewed in the y-direction refers to, for example, exactly coinciding with each other, or being deviated by within ±5% of the characteristic size (size of the third portion 23H or fourth portion 24H in the x-direction).

The second portion 22H is connected to the end portion of the fourth portion 24H, and corresponds to a portion of the lead 2H sticking out from the encapsulating resin 7 to the opposite side of the plurality of leads 1, as viewed in the y-direction. The second portion 22H sticks out to the opposite side of the first portion 21H, in the y-direction. The second portion 22H is used, for example, to electrically connect the semiconductor device A2 to an external circuit. In the illustrated example, the second portion 22H is bent in the z-direction, to the side to which the first face 31 is oriented. The second portion 22H, the third portion 23H, and the fourth portion 24H each include, on the respective sides thereof in the x-direction, edges extending along the y-direction. The edges of the second portion 22H, the third portion 23H, and the fourth portion 24H, on the side of the third face 33 in the x-direction, are respectively opposed to the edges of the second portion 22G, the third portion 23G, and the fourth portion 24G, on the side of the fourth face 34 in the x-direction.

The lead 2I is spaced apart from the plurality of leads 1. The lead 2I is located on the conductive section 5. The lead 2I is electrically connected to the conductive section 5. The lead 2I exemplifies a second lead in the present disclosure. The lead 2I is bonded to the second portion 52I of the wiring 50I in the conductive section 5, via the conductive bonding material 82.

The configuration of the lead 2I is not specifically limited. In this embodiment the lead 2I includes, as shown in FIG. 45, a first portion 21I, a second portion 22I, a third portion 23I, and a fourth portion 24I, each of which will be described hereunder.

The first portion 21I is bonded to the second portion 52I of the wiring 50I. The shape of the first portion 21I is not specifically limited, and a desired shape may be selected from a rectangular shape, a polygonal shape, a circular shape, an elliptical shape, and so forth. In the illustrated example, the first portion 21I has a strip shape extending along the y-direction. The first portion 21I overlaps with the fifth face 35 of the substrate 3 as viewed in the z-direction, and includes a portion sticking out in the y-direction, toward the side to which the fifth face 35 is oriented. In the illustrated example, the first portion 21I overlaps with the second portion 52I, as viewed in the z-direction. In addition, the first portion 21I includes a through hole 211I. The through hole 211I is formed so as to penetrate through the first portion 21I, in the z-direction. The inside of the through hole 211I is filled with the conductive bonding material 82, as shown in FIG. 40 illustrating the lead 2I. The conductive bonding material 82 covers a part of the surface of the lead 2I. However, the conductive bonding material 82 may be provided only inside the through hole 211I, so as not to reach the surface of the lead 2I.

The third portion 23I and the fourth portion 24I are covered with the encapsulating resin 7. The third portion 23I is connected to the first portion 21I and the fourth portion 24I. The fourth portion 24I is shifted in the z-direction with respect to the first portion 21I, to the side to which the first face 31 is oriented, as shown in FIG. 40 illustrating the lead 2I. The end portion of the fourth portion 24I is flush with the fifth face 75 of the resin 7. In the illustrated example, the third portion 23I and the fourth portion 24I generally coincide with each other, as viewed in the y-direction. Here, the expression "generally coincide" as viewed in the y-direction refers to, for example, exactly coinciding with each other, or being deviated by within ±5% of the characteristic size (size of the third portion 23I or fourth portion 24I in the x-direction).

The second portion 22I is connected to the end portion of the fourth portion 24I, and corresponds to a portion of the lead 2I sticking out from the encapsulating resin 7 to the opposite side of the plurality of leads 1, as viewed in the y-direction. The second portion 22I sticks out to the opposite side of the first portion 21I, in the y-direction. The second portion 22I is used, for example, to electrically connect the semiconductor device A2 to an external circuit. In the illustrated example, the second portion 22I is bent in the z-direction, to the side to which the first face 31 is oriented. The second portion 22I, the third portion 23I, and the fourth portion 24I each include, on the respective sides thereof in the x-direction, edges extending along the y-direction. The edges of the second portion 22I, the third portion 23I, and the fourth portion 24I, on the side of the third face 33 in the x-direction, are respectively opposed to the edges of the second portion 22H, the third portion 23H, and the fourth portion 24H, on the side of the fourth face 34 in the x-direction.

The lead 2J is spaced apart from the plurality of leads 1. The lead 2J is located on the conductive section 5. The lead 2J is electrically connected to the conductive section 5. The lead 2J exemplifies a second lead in the present disclosure. The lead 2J is bonded to the second portion 52J of the wiring 50J in the conductive section 5, via the conductive bonding material 82.

The configuration of the lead 2J is not specifically limited. In this embodiment the lead 2J includes, as shown in FIG. 45, a first portion 21J, a second portion 22J, a third portion 23J, and a fourth portion 24J, each of which will be described hereunder.

The first portion 21J is bonded to the second portion 52J of the wiring 50J. The shape of the first portion 21J is not specifically limited, and a desired shape may be selected from a rectangular shape, a polygonal shape, a circular shape, an elliptical shape, and so forth. In the illustrated example, the first portion 21J has a strip shape extending along the y-direction. The first portion 21J overlaps with the fifth face 35 of the substrate 3 as viewed in the z-direction, and includes a portion extending from the fifth face 35 in the y-direction, toward the side to which the fifth face 35 is oriented. In the illustrated example, the first portion 21J overlaps with the second portion 52J, as viewed in the z-direction. In addition, the first portion 21J includes a through hole 211J. The through hole 211J is formed so as to penetrate through the first portion 21J, in the z-direction. The inside of the through hole 211J is filled with the conductive bonding material 82, as illustrated in FIG. 45 with regard to the lead 2J. The conductive bonding material 82 covers a part of the surface of the lead 2J. However, the conductive bonding material 82 may be provided only inside the through hole 211J, so as not to reach the surface of the lead 2J.

The third portion 23J and the fourth portion 24J are covered with the encapsulating resin 7. The third portion 23J is connected to the first portion 21J and the fourth portion 24J. The fourth portion 24J is shifted in the z-direction with respect to the first portion 21J, to the side to which the first face 31 is oriented, as illustrated in FIG. 40 with regard to the lead 2I. The end portion of the fourth portion 24J is flush with the fifth face 75 of the resin 7. In the illustrated example, the third portion 23J and the fourth portion 24J generally coincide with each other, as viewed in the y-direction. Here, the expression "generally coincide" as viewed in the y-direction refers to, for example, exactly coinciding with each other, or being deviated by within ±5% of the characteristic size (size of the third portion 23J or fourth portion 24J in the x-direction).

The second portion 22J is connected to the end portion of the fourth portion 24J, and corresponds to a portion of the lead 2J sticking out from the encapsulating resin 7 to the opposite side of the plurality of leads 1, as viewed in the y-direction. The second portion 22J sticks out to the opposite side of the first portion 21J, in the y-direction. The second portion 22J is used, for example, to electrically connect the semiconductor device A2 to an external circuit. In the illustrated example, the second portion 22J is bent in the z-direction, to the side to which the first face 31 is oriented. The second portion 22J, the third portion 23J, and the fourth portion 24J each include, on the respective sides thereof in the x-direction, edges extending along the y-direction. The edges of the second portion 22J, the third portion 23J, and the fourth portion 24J, on the side of the third face 33 in the x-direction, are respectively opposed to the edges of the second portion 22I, the third portion 23I, and the fourth portion 24I, on the side of the fourth face 34 in the x-direction.

The lead 2K is spaced apart from the plurality of leads 1. The lead 2K is located on the conductive section 5. The lead 2K is electrically connected to the conductive section 5. The lead 2K exemplifies a second lead in the present disclosure. The lead 2K is bonded to the second portion 52K of the wiring 50K in the conductive section 5, via the conductive bonding material 82.

The configuration of the lead 2K is not specifically limited. In this embodiment the lead 2K includes, as shown in FIG. 45, a first portion 21K, a second portion 22K, a third portion 23K, and a fourth portion 24K, each of which will be described hereunder.

The first portion 21K is bonded to the second portion 52K of the wiring 50K. The shape of the first portion 21K is not specifically limited, and a desired shape may be selected from a rectangular shape, a polygonal shape, a circular shape, an elliptical shape, and so forth. In the illustrated example, the first portion 21K has a strip shape extending along the y-direction. The first portion 21K overlaps with the fifth face 35 of the substrate 3 as viewed in the z-direction, and includes a portion extending from the fifth face 35 in the y-direction, toward the side to which the fifth face 35 is oriented. In the illustrated example, the first portion 21K overlaps with the second portion 52K, as viewed in the z-direction. In addition, the first portion 21K includes a through hole 211K. The through hole 211K is formed so as to penetrate through the first portion 21K, in the z-direction. The inside of the through hole 211K is filled with the conductive bonding material 82, as illustrated in FIG. 45 with regard to the lead 2K. The conductive bonding material 82 covers a part of the surface of the lead 2K. However, the conductive bonding material 82 may be provided only inside the through hole 211K, so as not to reach the surface of the lead 2K.

The third portion 23K and the fourth portion 24K are covered with the encapsulating resin 7. The third portion 23K is connected to the first portion 21K and the fourth portion 24K. The fourth portion 24K is shifted in the z-direction with respect to the first portion 21K, to the side to which the first face 31 is oriented, as illustrated in FIG. 40 with regard to the lead 2I. The end portion of the fourth portion 24K is flush with the fifth face 75 of the resin 7. In the illustrated example, the third portion 23K and the fourth portion 24K generally coincide with each other, as viewed in the y-direction. Here, the expression "generally coincide" as viewed in the y-direction refers to, for example, exactly coinciding with each other, or being deviated by within ±5% of the characteristic size (size of the third portion 23K or fourth portion 24K in the x-direction).

The second portion 22K is connected to the end portion of the fourth portion 24K, and corresponds to a portion of the lead 2K sticking out from the encapsulating resin 7 to the opposite side of the plurality of leads 1, as viewed in the y-direction. The second portion 22K sticks out to the opposite side of the first portion 21K, in the y-direction. The second portion 22K is used, for example, to electrically connect the semiconductor device A2 to an external circuit. In the illustrated example, the second portion 22K is bent in the z-direction, to the side to which the first face 31 is oriented. The second portion 22K, the third portion 23K, and the fourth portion 24K each include, on the respective sides thereof in the x-direction, edges extending along the y-direction. The edges of the second portion 22K, the third portion 23K, and the fourth portion 24K, on the side of the third face 33 in the x-direction, are respectively opposed to the edges of the second portion 22J, the third portion 23J, and the fourth portion 24J, on the side of the fourth face 34 in the x-direction.

The lead 2L is spaced apart from the plurality of leads 1. The lead 2L is located on the conductive section 5. The lead 2L is electrically connected to the conductive section 5. The lead 2L exemplifies a second lead in the present disclosure. The lead 2L is bonded to the second portion 52L of the wiring 50L in the conductive section 5, via the conductive bonding material 82.

The configuration of the lead 2L is not specifically limited. In this embodiment the lead 2L includes, as shown in FIG. 45, a first portion 21L, a second portion 22L, a third portion 23L, and a fourth portion 24L, each of which will be described hereunder.

The first portion 21L is bonded to the second portion 52L of the wiring 50L. The shape of the first portion 21L is not specifically limited, and a desired shape may be selected from a rectangular shape, a polygonal shape, a circular shape, an elliptical shape, and so forth. In the illustrated example, the first portion 21L has a strip shape extending along the y-direction. The first portion 21L overlaps with the fifth face 35 of the substrate 3 as viewed in the z-direction, and includes a portion extending from the fifth face 35 in the y-direction, toward the side to which the fifth face 35 is oriented. In the illustrated example, the first portion 21L overlaps with the second portion 52L, as viewed in the z-direction. In addition, the first portion 21L includes a through hole 211L. The through hole 211L is formed so as to penetrate through the first portion 21L, in the z-direction. The inside of the through hole 211L is filled with the conductive bonding material 82, as illustrated in FIG. 45 with regard to the lead 2L. The conductive bonding material 82 covers a part of the surface of the lead 2L. However, the conductive bonding material 82 may be provided only inside the through hole 211L, so as not to reach the surface of the lead 2L.

The third portion 23L and the fourth portion 24L are covered with the encapsulating resin 7. The third portion 23L is connected to the first portion 21L and the fourth portion 24L. The fourth portion 24L is shifted in the z-direction with respect to the first portion 21L, to the side to which the first face 31 is oriented, as illustrated in FIG. 40 with regard to the lead 2I. The end portion of the fourth portion 24L is flush with the fifth face 75 of the resin 7. In the illustrated example, the third portion 23L and the fourth portion 24L generally coincide with each other, as viewed in the y-direction. Here, the expression "generally coincide" as viewed in the y-direction refers to, for example, exactly coinciding with each other, or being deviated by within ±5% of the characteristic size (size of the third portion 23L or fourth portion 24L in the x-direction).

The second portion 22L is connected to the end portion of the fourth portion 24L, and corresponds to a portion of the lead 2L sticking out from the encapsulating resin 7 to the opposite side of the plurality of leads 1, as viewed in the y-direction. The second portion 22L sticks out to the opposite side of the first portion 21L, in the y-direction. The second portion 22L is used, for example, to electrically connect the semiconductor device A2 to an external circuit. In the illustrated example, the second portion 22L is bent in the z-direction, to the side to which the first face 31 is oriented. The second portion 22L, the third portion 23L, and the fourth portion 24L each include, on the respective sides thereof in the x-direction, edges extending along the y-direction. The edges of the second portion 22L, the third portion 23L, and the fourth portion 24L, on the side of the third face 33 in the x-direction, are respectively opposed to the edges of the second portion 22K, the third portion 23K, and the fourth portion 24K, on the side of the fourth face 34 in the x-direction.

The lead 2M is spaced apart from the plurality of leads 1. The lead 2M is located on the conductive section 5. The lead 2M is electrically connected to the conductive section 5. The lead 2M exemplifies a second lead in the present disclosure. The lead 2M is bonded to the second portion 52M of the wiring 50M in the conductive section 5, via the conductive bonding material 82.

The configuration of the lead 2M is not specifically limited. In this embodiment the lead 2M includes, as shown in FIG. 45, a first portion 21M, a second portion 22M, a third portion 23M, and a fourth portion 24M, each of which will be described hereunder.

The first portion 21M is bonded to the second portion 52M of the wiring 50M. The shape of the first portion 21M is not specifically limited, and a desired shape may be selected from a rectangular shape, a polygonal shape, a circular shape, an elliptical shape, and so forth. In the illustrated example, the first portion 21M has a strip shape extending along the y-direction. The first portion 21M overlaps with the fifth face 35 of the substrate 3 as viewed in the z-direction, and includes a portion extending from the fifth face 35 in the y-direction, toward the side to which the fifth face 35 is oriented. In the illustrated example, the first portion 21M overlaps with the second portion 52M, as viewed in the z-direction. In addition, the first portion 21M includes a through hole 211M. The through hole 211M is formed so as to penetrate through the first portion 21M, in the z-direction. The inside of the through hole 211M is filled with the conductive bonding material 82, as illustrated in FIG. 45 with regard to the lead 2M. The conductive bonding material 82 covers a part of the surface of the lead 2M. However, the conductive bonding material 82 may be provided only inside the through hole 211M, so as not to reach the surface of the lead 2M.

The third portion 23M and the fourth portion 24M are covered with the encapsulating resin 7. The third portion 23M is connected to the first portion 21M and the fourth portion 24M. The fourth portion 24M is shifted in the z-direction with respect to the first portion 21M, to the side to which the first face 31 is oriented, as illustrated in FIG. 40 with regard to the lead 2I. The end portion of the fourth portion 24M is flush with the fifth face 75 of the resin 7. In the illustrated example, the third portion 23M and the fourth portion 24M generally coincide with each other, as viewed in the y-direction. Here, the expression "generally coincide" as viewed in the y-direction refers to, for example, exactly coinciding with each other, or being deviated by within ±5% of the characteristic size (size of the third portion 23M or fourth portion 24M in the x-direction).

The second portion 22M is connected to the end portion of the fourth portion 24M, and corresponds to a portion of the lead 2M sticking out from the encapsulating resin 7 to the opposite side of the plurality of leads 1, as viewed in the y-direction. The second portion 22M sticks out to the opposite side of the first portion 21M, in the y-direction. The second portion 22M is used, for example, to electrically connect the semiconductor device A2 to an external circuit. In the illustrated example, the second portion 22M is bent in the z-direction, to the side to which the first face 31 is oriented. The second portion 22M, the third portion 23M, and the fourth portion 24M each include, on the respective sides thereof in the x-direction, edges extending along the y-direction. The edges of the second portion 22M, the third portion 23M, and the fourth portion 24M, on the side of the third face 33 in the x-direction, are respectively opposed to the edges of the second portion 22L, the third portion 23L, and the fourth portion 24L, on the side of the fourth face 34 in the x-direction.

The lead 2N is spaced apart from the plurality of leads 1. The lead 2N is located on the conductive section 5. The lead 2N is electrically connected to the conductive section 5. The lead 2N exemplifies a second lead in the present disclosure. The lead 2N is bonded to the second portion 52N of the wiring 50N in the conductive section 5, via the conductive bonding material 82.

The configuration of the lead 2N is not specifically limited. In this embodiment the lead 2N includes, as shown in FIG. 45, a first portion 21N, a second portion 22N, a third portion 23N, and a fourth portion 24N, each of which will be described hereunder.

The first portion 21N is bonded to the second portion 52N of the wiring 50N. The shape of the first portion 21N is not specifically limited, and a desired shape may be selected from a rectangular shape, a polygonal shape, a circular shape, an elliptical shape, and so forth. In the illustrated example, the first portion 21N has a strip shape extending along the y-direction. The first portion 21N overlaps with the fifth face 35 of the substrate 3 as viewed in the z-direction, and includes a portion extending from the fifth face 35 in the y-direction, toward the side to which the fifth face 35 is oriented. In the illustrated example, the first portion 21N overlaps with the second portion 52N, as viewed in the z-direction. In addition, the first portion 21N includes a through hole 211N. The through hole 211N is formed so as to penetrate through the first portion 21N, in the z-direction. The inside of the through hole 211N is filled with the conductive bonding material 82, as illustrated in FIG. 45 with regard to the lead 2N. The conductive bonding material 82 covers a part of the surface of the lead 2N. However, the conductive bonding material 82 may be provided only inside the through hole 211N, so as not to reach the surface of the lead 2N.

The third portion 23N and the fourth portion 24N are covered with the encapsulating resin 7. The third portion 23N is connected to the first portion 21N and the fourth portion 24N. The fourth portion 24N is shifted in the z-direction with respect to the first portion 21N, to the side to which the first face 31 is oriented, as illustrated in FIG. 40 with regard to the lead 2I. The end portion of the fourth portion 24N is flush with the fifth face 75 of the resin 7. In the illustrated example, the third portion 23N and the fourth portion 24N generally coincide with each other, as viewed in the y-direction. Here, the expression "generally coincide" as viewed in the y-direction refers to, for example, exactly coinciding with each other, or being deviated by within ±5% of the characteristic size (size of the third portion 23N or fourth portion 24N in the x-direction).

The second portion 22N is connected to the end portion of the fourth portion 24N, and corresponds to a portion of the lead 2N sticking out from the encapsulating resin 7 to the opposite side of the plurality of leads 1, as viewed in the y-direction. The second portion 22N sticks out to the opposite side of the first portion 21N, in the y-direction. The second portion 22N is used, for example, to electrically connect the semiconductor device A2 to an external circuit. In the illustrated example, the second portion 22N is bent in the z-direction, to the side to which the first face 31 is oriented. The second portion 22N, the third portion 23N, and the fourth portion 24N each include, on the respective sides thereof in the x-direction, edges extending along the y-direction. The edges of the second portion 22N, the third portion 23N, and the fourth portion 24N, on the side of the third face 33 in the x-direction, are respectively opposed to the edges of the second portion 22M, the third portion 23M, and the fourth portion 24M, on the side of the fourth face 34 in the x-direction.

The lead 2O is spaced apart from the plurality of leads 1. The lead 2O is located on the conductive section 5. The lead 2O is electrically connected to the conductive section 5. The lead 2O exemplifies a second lead in the present disclosure. The lead 2O is bonded to the second portion 52O of the wiring 50O in the conductive section 5, via the conductive bonding material 82.

The configuration of the lead 2O is not specifically limited. In this embodiment the lead 2O includes, as shown in FIG. 45, a first portion 21O, a second portion 22O, a third portion 23O, and a fourth portion 24O, each of which will be described hereunder.

The first portion 21O is bonded to the second portion 52O of the wiring 50O. The shape of the first portion 21O is not specifically limited, and a desired shape may be selected from a rectangular shape, a polygonal shape, a circular shape, an elliptical shape, and so forth. In the illustrated example, the first portion 21O has a strip shape extending along the y-direction. The first portion 21O overlaps with the fifth face 35 of the substrate 3 as viewed in the z-direction, and includes a portion extending from the fifth face 35 in the y-direction, toward the side to which the fifth face 35 is oriented. In the illustrated example, the first portion 21O overlaps with the second portion 52O, as viewed in the z-direction. In addition, the first portion 21O includes a through hole 211O. The through hole 211O is formed so as to penetrate through the first portion 21O, in the z-direction. The inside of the through hole 211O is filled with the conductive bonding material 82, as illustrated in FIG. 45 with regard to the lead 2O. The conductive bonding material 82 covers a part of the surface of the lead 2O. However, the conductive bonding material 82 may be provided only inside the through hole 211O, so as not to reach the surface of the lead 2O.

The third portion 23O and the fourth portion 24O are covered with the encapsulating resin 7. The third portion 23O is connected to the first portion 21O and the fourth portion 24O. The fourth portion 24O is shifted in the z-direction with respect to the first portion 21O, to the side to which the first face 31 is oriented, as illustrated in FIG. 45 with regard to the lead 2O. The end portion of the fourth portion 24O is flush with the fifth face 75 of the resin 7. In the illustrated example, the third portion 23O and the fourth portion 24O generally coincide with each other, as viewed in the y-direction. Here, the expression "generally coincide" as viewed in the y-direction refers to, for example, exactly coinciding with each other, or being deviated by within ±5% of the characteristic size (size of the third portion 23O or fourth portion 24O in the x-direction).

The second portion 22O is connected to the end portion of the fourth portion 24O, and corresponds to a portion of the lead 2O sticking out from the encapsulating resin 7 to the opposite side of the plurality of leads 1, as viewed in the y-direction. The second portion 22O sticks out to the opposite side of the first portion 21O, in the y-direction. The second portion 22O is used, for example, to electrically connect the semiconductor device A2 to an external circuit. In the illustrated example, the second portion 22O is bent in the z-direction, to the side to which the first face 31 is oriented. The second portion 22O, the third portion 23O, and the fourth portion 24O each include, on the respective sides thereof in the x-direction, edges extending along the y-direction. The edges of the second portion 22O, the third portion 23O, and the fourth portion 24O, on the side of the third face 33 in the x-direction, are respectively opposed to the edges of the second portion 22N, the third portion 23N, and the fourth portion 24N, on the side of the fourth face 34 in the x-direction.

The lead 2P is spaced apart from the plurality of leads 1. The lead 2P is located on the conductive section 5. The lead 2P is electrically connected to the conductive section 5. The lead 2P exemplifies a second lead in the present disclosure. The lead 2P is bonded to the second portion 52P of the wiring 50P in the conductive section 5, via the conductive bonding material 82.

The configuration of the lead 2P is not specifically limited. In this embodiment the lead 2P includes, as shown in FIG. 45, a first portion 21P, a second portion 22P, a third portion 23P, and a fourth portion 24P, each of which will be described hereunder.

The first portion 21P is bonded to the second portion 52P of the wiring 50P. The shape of the first portion 21P is not specifically limited, and a desired shape may be selected from a rectangular shape, a polygonal shape, a circular shape, an elliptical shape, and so forth. In the illustrated example, the first portion 21P has a strip shape extending along the y-direction. The first portion 21P overlaps with the fifth face 35 of the substrate 3 as viewed in the z-direction, and includes a portion extending from the fifth face 35 in the y-direction, toward the side to which the fifth face 35 is oriented. In the illustrated example, the first portion 21P overlaps with the second portion 52P, as viewed in the z-direction. In addition, the first portion 21P includes a through hole 211P. The through hole 211P is formed so as to penetrate through the first portion 21P, in the z-direction. The inside of the through hole 211P is filled with the conductive bonding material 82, as illustrated in FIG. 45 with regard to the lead 2P. The conductive bonding material 82 covers a part of the surface of the lead 2P. However, the conductive bonding material 82 may be provided only inside the through hole 211P, so as not to reach the surface of the lead 2P.

The third portion 23P and the fourth portion 24P are covered with the encapsulating resin 7. The third portion 23P is connected to the first portion 21P and the fourth portion 24P. The fourth portion 24P is shifted in the z-direction with respect to the first portion 21P, to the side to which the first face 31 is oriented, as illustrated in FIG. 40 with regard to the lead 2I. The end portion of the fourth portion 24P is flush with the fifth face 75 of the resin 7. In the illustrated example, the third portion 23P and the fourth portion 24P generally coincide with each other, as viewed in the y-direction. Here, the expression "generally coincide" as viewed in the y-direction refers to, for example, exactly coinciding with each other, or being deviated by within ±5% of the characteristic size (size of the third portion 23P or fourth portion 24P in the x-direction).

The second portion 22P is connected to the end portion of the fourth portion 24P, and corresponds to a portion of the lead 2P sticking out from the encapsulating resin 7 to the opposite side of the plurality of leads 1, as viewed in the y-direction. The second portion 22P sticks out to the opposite side of the first portion 21P, in the y-direction. The second portion 22P is used, for example, to electrically connect the semiconductor device A2 to an external circuit. In the illustrated example, the second portion 22P is bent in the z-direction, to the side to which the first face 31 is oriented. The second portion 22P, the third portion 23P, and the fourth portion 24P each include, on the respective sides thereof in the x-direction, edges extending along the y-direction. The edges of the second portion 22P, the third portion 23P, and the fourth portion 24P, on the side of the third face 33 in the x-direction, are respectively opposed to the edges of the second portion 22O, the third portion 23O, and the fourth portion 24O, on the side of the fourth face 34 in the x-direction.

The lead 2Q is spaced apart from the plurality of leads 1. The lead 2Q is located on the conductive section 5. The lead 2Q is electrically connected to the conductive section 5. The lead 2Q exemplifies a second lead in the present disclosure. The lead 2Q is bonded to the second portion 52Q of the wiring 50Q in the conductive section 5, via the conductive bonding material 82.

The configuration of the lead 2Q is not specifically limited. In this embodiment the lead 2Q includes, as shown in FIG. 45, a first portion 21Q, a second portion 22Q, a third portion 23Q, and a fourth portion 24Q, each of which will be described hereunder.

The first portion 21Q is bonded to the second portion 52Q of the wiring 50Q. The shape of the first portion 21Q is not specifically limited, and a desired shape may be selected from a rectangular shape, a polygonal shape, a circular shape, an elliptical shape, and so forth. In the illustrated example, the first portion 21Q has a strip shape extending along the y-direction. The first portion 21Q overlaps with the fifth face 35 of the substrate 3 as viewed in the z-direction, and includes a portion extending from the fifth face 35 in the y-direction, toward the side to which the fifth face 35 is oriented. In the illustrated example, the first portion 21Q overlaps with the second portion 52Q, as viewed in the z-direction. In addition, the first portion 21Q includes a through hole 211Q. The through hole 211Q is formed so as to penetrate through the first portion 21Q, in the z-direction. The inside of the through hole 211Q is filled with the conductive bonding material 82, as illustrated in FIG. 45 with regard to the lead 2Q. The conductive bonding material 82 covers a part of the surface of the lead 2Q. However, the conductive bonding material 82 may be provided only inside the through hole 211Q, so as not to reach the surface of the lead 2Q.

The third portion 23Q and the fourth portion 24Q are covered with the encapsulating resin 7. The third portion 23Q is connected to the first portion 21Q and the fourth portion 24Q. The fourth portion 24Q is shifted in the z-direction with respect to the first portion 21Q, to the side to which the first face 31 is oriented, as illustrated in FIG. 40 with regard to the lead 2I. The end portion of the fourth portion 24Q is flush with the fifth face 75 of the resin 7. In the illustrated example, the third portion 23Q and the fourth portion 24Q generally coincide with each other, as viewed in the y-direction. Here, the expression "generally coincide" as viewed in the y-direction refers to, for example, exactly coinciding with each other, or being deviated by within ±5% of the characteristic size (size of the third portion 23Q or fourth portion 24Q in the x-direction).

The second portion 22Q is connected to the end portion of the fourth portion 24Q, and corresponds to a portion of the lead 2Q sticking out from the encapsulating resin 7 to the opposite side of the plurality of leads 1, as viewed in the y-direction. The second portion 22Q sticks out to the opposite side of the first portion 21Q, in the y-direction. The second portion 22Q is used, for example, to electrically connect the semiconductor device A2 to an external circuit. In the illustrated example, the second portion 22Q is bent in the z-direction, to the side to which the first face 31 is oriented. The second portion 22Q, the third portion 23Q, and the fourth portion 24Q each include, on the respective sides thereof in the x-direction, edges extending along the y-direction. The edges of the second portion 22Q, the third portion 23Q, and the fourth portion 24Q, on the side of the third face 33 in the x-direction, are respectively opposed to the edges of the second portion 22P, the third portion 23P, and the fourth portion 24P, on the side of the fourth face 34 in the x-direction.

The lead 2R is spaced apart from the plurality of leads 1. The lead 2R is located on the conductive section 5. The lead 2R is electrically connected to the conductive section 5. The lead 2R exemplifies a second lead in the present disclosure. The lead 2R is bonded to the second portion 52R of the wiring 50R in the conductive section 5, via the conductive bonding material 82.

The configuration of the lead 2R is not specifically limited. In this embodiment the lead 2R includes, as shown in FIG. 45, a first portion 21R, a second portion 22R, a third portion 23R, and a fourth portion 24R, each of which will be described hereunder.

The first portion 21R is bonded to the second portion 52R of the wiring 50R. The shape of the first portion 21R is not specifically limited, and a desired shape may be selected from a rectangular shape, a polygonal shape, a circular shape, an elliptical shape, and so forth. In the illustrated example, the first portion 21R has a strip shape extending along the y-direction. The first portion 21R overlaps with the fifth face 35 of the substrate 3 as viewed in the z-direction, and includes a portion extending from the fifth face 35 in the y-direction, toward the side to which the fifth face 35 is oriented. In the illustrated example, the first portion 21R overlaps with the second portion 52R, as viewed in the z-direction. In addition, the first portion 21R includes a through hole 211R. The through hole 211R is formed so as to penetrate through the first portion 21R, in the z-direction. The inside of the through hole 211R is filled with the conductive bonding material 82, as illustrated in FIG. 45 with regard to the lead 2R. The conductive bonding material 82 covers a part of the surface of the lead 2R. However, the conductive bonding material 82 may be provided only inside the through hole 211R, so as not to reach the surface of the lead 2R.

The third portion 23R and the fourth portion 24R are covered with the encapsulating resin 7. The third portion 23R is connected to the first portion 21R and the fourth portion 24R. The fourth portion 24R is shifted in the z-direction with respect to the first portion 21R, to the side to which the first face 31 is oriented, as illustrated in FIG. 40 with regard to the lead 2I. The end portion of the fourth portion 24R is flush with the fifth face 75 of the resin 7. In the illustrated example, the third portion 23R and the fourth portion 24R generally coincide with each other, as viewed in the y-direction. Here, the expression “generally coincide” as viewed in the y-direction refers to, for example, exactly coinciding with each other, or being deviated by within ±5% of the characteristic size (size of the third portion 23R or fourth portion 24R in the x-direction).

The second portion 22R is connected to the end portion of the fourth portion 24R, and corresponds to a portion of the lead 2R sticking out from the encapsulating resin 7 to the opposite side of the plurality of leads 1, as viewed in the y-direction. The second portion 22R sticks out to the opposite side of the first portion 21R, in the y-direction. The second portion 22R is used, for example, to electrically connect the semiconductor device A2 to an external circuit. In the illustrated example, the second portion 22R is bent in the z-direction, to the side to which the first face 31 is oriented. The second portion 22R, the third portion 23R, and the fourth portion 24R each include, on the respective sides thereof in the x-direction, edges extending along the y-direction. The edges of the second portion 22R, the third portion 23R, and the fourth portion 24R, on the side of the third face 33 in the x-direction, are respectively opposed to the edges of the second portion 22Q, the third portion 23Q, and the fourth portion 24Q, on the side of the fourth face 34 in the x-direction.

The lead 2S is spaced apart from the plurality of leads 1. The lead 2S is located on the conductive section 5. The lead 2S is electrically connected to the conductive section 5. The lead 2S exemplifies a second lead in the present disclosure. The lead 2S is bonded to the second portion 52S of the wiring 50S in the conductive section 5, via the conductive bonding material 82.

The configuration of the lead 2S is not specifically limited. In this embodiment the lead 2S includes, as shown in FIG. 45, a first portion 21S, a second portion 22S, a third portion 23S, and a fourth portion 24S, each of which will be described hereunder.

The first portion 21S is bonded to the second portion 52S of the wiring 50S. The shape of the first portion 21S is not specifically limited, and a desired shape may be selected from a rectangular shape, a polygonal shape, a circular shape, an elliptical shape, and so forth. In the illustrated example, the first portion 21S has a bent shape including a portion extending along the x-direction, and a portion inclined with respect to the x-direction and the y-direction. The first portion 21S overlaps with the fourth face 34 of the substrate 3 as viewed in the z-direction, and sticks out in the x-direction, toward the side to which the fourth face 34 is oriented. In the illustrated example, the first portion 21S overlaps with the second portion 52S, as viewed in the z-direction. In addition, the first portion 21S includes a through hole 211S. The through hole 211S is formed so as to penetrate through the first portion 21S, in the z-direction. The inside of the through hole 211S is filled with the conductive bonding material 82, like the through hole 211I in the first portion 21I of the lead 2I shown in FIG. 40. The conductive bonding material 82 covers a part of the surface of the lead 2S. However, the conductive bonding material 82 may be provided only inside the through hole 211S, so as not to reach the surface of the lead 2S.

The third portion 23S and the fourth portion 24S are covered with the encapsulating resin 7. The third portion 23S is connected to the first portion 21S and the fourth portion 24S. The fourth portion 24S is shifted in the z-direction with respect to the first portion 21S, to the side to which the first face 31 is oriented, like the third portion 23I and the fourth portion 24I of the lead 2I shown in FIG. 40. The end portion of the fourth portion 24S is flush with the fifth face 75 of the resin 7. In the illustrated example, the third portion 23S and the fourth portion 24S generally coincide with each other, as viewed in the y-direction. Here, the expression “generally coincide” as viewed in the y-direction refers to, for example, exactly coinciding with each other, or being deviated by within ±5% of the characteristic size (size of the third portion 23S or fourth portion 24S in the x-direction).

The second portion 22S is connected to the end portion of the fourth portion 24S, and corresponds to a portion of the lead 2S sticking out from the encapsulating resin 7 to the opposite side of the plurality of leads 1, as viewed in the y-direction. The second portion 22S sticks out to the opposite side of the first portion 21S, in the y-direction. The second portion 22S is used, for example, to electrically connect the semiconductor device A2 to an external circuit. In the illustrated example, the second portion 22S is bent in the z-direction, to the side to which the first face 31 is oriented. The second portion 22S, the third portion 23S, and the fourth portion 24S each include, on the respective sides thereof in the x-direction, edges extending along the y-direction. The edges of the second portion 22S, the third portion 23S, and the fourth portion 24S, on the side of the third face 33 in the x-direction, are respectively opposed to the edges of the second portion 22R, the third portion 23R, and the fourth portion 24R, on the side of the fourth face 34 in the x-direction.

The lead 2T is spaced apart from the plurality of leads 1. The lead 2T is located on the conductive section 5. The lead 2T is electrically connected to the conductive section 5. The lead 2T exemplifies a second lead in the present disclosure. The lead 2T is bonded to the second portion 52T of the wiring 50T in the conductive section 5, via the conductive bonding material 82.

The configuration of the lead 2T is not specifically limited. In this embodiment the lead 2T includes, as shown in FIG. 45, a first portion 21T, a second portion 22T, a third portion 23T, and a fourth portion 24T, each of which will be described hereunder.

The first portion 21T is bonded to the second portion 52T of the wiring 50T. The shape of the first portion 21T is not specifically limited, and a desired shape may be selected from a rectangular shape, a polygonal shape, a circular shape, an elliptical shape, and so forth. In the illustrated example, the first portion 21T has a bent shape including a portion extending along the x-direction, a portion inclined with respect to the x-direction and the y-direction, and a portion extending along the y-direction. The first portion 21T overlaps with the fourth face 34 of the substrate 3 as viewed in the z-direction, and sticks out in the x-direction, toward the side to which the fourth face 34 is oriented. In the illustrated example, the first portion 21T overlaps with the second portion 52T, as viewed in the z-direction. In addition, the first portion 21T includes a through hole 211T. The through hole 211T is formed so as to penetrate through the first portion 21T, in the z-direction. The inside of the through hole 211T is filled with the conductive bonding material 82, like the through hole 211I in the first portion 21I of the lead 2I shown in FIG. 40. The conductive bonding material 82 covers a part of the surface of the lead 2T. However, the conductive bonding material 82 may be provided only inside the through hole 211T, so as not to reach the surface of the lead 2T.

The third portion 23T and the fourth portion 24T are covered with the encapsulating resin 7. The third portion 23T is connected to the first portion 21T and the fourth portion 24T. The fourth portion 24T is shifted in the z-direction with respect to the first portion 21T, to the side to which the first face 31 is oriented, like the third portion 23I and the fourth portion 24I of the lead 2I shown in FIG. 40. The end portion of the fourth portion 24T is flush with the fifth face 75 of the resin 7. In the illustrated example, the third portion 23T and the fourth portion 24T generally coincide with each other, as viewed in the y-direction. Here, the expression "generally coincide" as viewed in the y-direction refers to, for example, exactly coinciding with each other, or being deviated by within ±5% of the characteristic size (size of the third portion 23T or fourth portion 24T in the x-direction).

The second portion 22T is connected to the end portion of the fourth portion 24T, and corresponds to a portion of the lead 2T sticking out from the encapsulating resin 7 to the opposite side of the plurality of leads 1, as viewed in the y-direction. The second portion 22T sticks out to the opposite side of the first portion 21T, in the y-direction. The second portion 22T is used, for example, to electrically connect the semiconductor device A2 to an external circuit. In the illustrated example, the second portion 22T is bent in the z-direction, to the side to which the first face 31 is oriented. The second portion 22T, the third portion 23T, and the fourth portion 24T each include, on the respective sides thereof in the x-direction, edges extending along the y-direction. The edges of the second portion 22T, the third portion 23T, and the fourth portion 24T, on the side of the third face 33 in the x-direction, are respectively opposed to the edges of the second portion 22S, the third portion 23S, and the fourth portion 24S, on the side of the fourth face 34 in the x-direction.

The lead 2U is spaced apart from the plurality of leads 1. The lead 2U is located on the conductive section 5. The lead 2U is electrically connected to the conductive section 5. The lead 2U exemplifies a second lead in the present disclosure. The lead 2U is bonded to the second portion 52U of the wiring 50U in the conductive section 5, via the conductive bonding material 82.

The configuration of the lead 2U is not specifically limited. In this embodiment the lead 2U includes, as shown in FIG. 45, a first portion 21U, a second portion 22U, a third portion 23U, and a fourth portion 24U, each of which will be described hereunder.

The first portion 21U is bonded to the second portion 52U of the wiring 50U. The shape of the first portion 21U is not specifically limited, and a desired shape may be selected from a rectangular shape, a polygonal shape, a circular shape, an elliptical shape, and so forth. In the illustrated example, the first portion 21U has a bent shape including a portion extending along the x-direction, a portion inclined with respect to the x-direction and the y-direction, and a portion extending along the y-direction. The first portion 21U overlaps with the fourth face 34 of the substrate 3 as viewed in the z-direction, and sticks out in the x-direction, toward the side to which the fourth face 34 is oriented. In the illustrated example, the first portion 21U overlaps with the second portion 52U, as viewed in the z-direction. In addition, the first portion 21U includes a through hole 211U. The through hole 211U is formed so as to penetrate through the first portion 21U, in the z-direction. The inside of the through hole 211U is filled with the conductive bonding material 82, like the through hole 211I in the first portion 21I of the lead 2I shown in FIG. 40. The conductive bonding material 82 covers a part of the surface of the lead 2U. However, the conductive bonding material 82 may be provided only inside the through hole 211U, so as not to reach the surface of the lead 2U.

The third portion 23U and the fourth portion 24U are covered with the encapsulating resin 7. The third portion 23U is connected to the first portion 21U and the fourth portion 24U. The fourth portion 24U is shifted in the z-direction with respect to the first portion 21U, to the side to which the first face 31 is oriented, like the third portion 23I and the fourth portion 24I of the lead 2I shown in FIG. 40. The end portion of the fourth portion 24U is flush with the fifth face 75 of the resin 7. In the illustrated example, the third portion 23U and the fourth portion 24U generally coincide with each other, as viewed in the y-direction. Here, the expression "generally coincide" as viewed in the y-direction refers to, for example, exactly coinciding with each other, or being deviated by within ±5% of the characteristic size (size of the third portion 23U or fourth portion 24U in the x-direction).

The second portion 22U is connected to the end portion of the fourth portion 24U, and corresponds to a portion of the lead 2U sticking out from the encapsulating resin 7 to the opposite side of the plurality of leads 1, as viewed in the y-direction. The second portion 22U sticks out to the opposite side of the first portion 21U, in the y-direction. The second portion 22U is used, for example, to electrically connect the semiconductor device A2 to an external circuit.

In the illustrated example, the second portion 22U is bent in the z-direction, to the side to which the first face 31 is oriented. The second portion 22U, the third portion 23U, and the fourth portion 24U each include, on the respective sides thereof in the x-direction, edges extending along the y-direction. The edges of the second portion 22U, the third portion 23U, and the fourth portion 24U, on the side of the third face 33 in the x-direction, are respectively opposed to the edges of the second portion 22T, the third portion 23T, and the fourth portion 24T, on the side of the fourth face 34 in the x-direction.

As shown in FIG. 44 and FIG. 45, the second portion 22A and the second portion 22B are aligned in the x-direction, with a clearance G21 therebetween. The second portion 22B and the second portion 22C are aligned in the x-direction, with a clearance G22 therebetween. The clearances G22 is wider than the clearance G21. The second portion 22C and the second portion 22D are aligned in the x-direction, with a clearance G23 therebetween. The clearance G23 is narrower than the clearances G22, and generally the same as the clearance G21 (exactly the same, or different by within ±5%). The second portion 22D and the second portion 22E are aligned in the x-direction, with a clearance G24 therebetween. The clearance G24 is wider than the clearance G23, and generally the same as the clearance G22 (exactly the same, or different by within ±5%). The second portion 22E and the second portion 22F are aligned in the x-direction, with a clearance G25 therebetween. The clearance G25 is narrower than the clearances G24, and generally the same as the clearance G23 (exactly the same, or different by within ±5%). The second portion 22F and the second portion 22G are aligned in the x-direction, with a clearance G26 therebetween. The clearance G26 is wider than the clearance G25, and generally the same as the clearance G24 (exactly the same, or different by within ±5%). The second portion 22G and the second portion 22H are aligned in the x-direction, with a clearance G27 therebetween. The clearance G27 is narrower than the clearances G26, and generally the same as the clearance G25 (exactly the same, or different by within ±5%). The second portion 22H and the second portion 22I are aligned in the x-direction, with a clearance G28 therebetween. The clearance G28 is wider than the clearances G21 to G27. The second portions 22I to 22R are aligned in the x-direction, with clearances G29 therebetween. The clearances G29 are narrower than the clearances G21 to G28. The difference in width of the clearances G29 is within ±5% from each other. The second portion 22R and the second portion 22S are aligned in the x-direction, with a clearance G2*a* therebetween. The clearance G2*a* is generally the same as the clearance G28 (exactly the same, or different by within ±5%). The second portion 22S and the second portion 22T are aligned in the x-direction, with a clearance G2*b* therebetween. The clearance G2*b* is generally the same as the clearance G29 (exactly the same, or different by within ±5%). The second portion 22T and the second portion 22U are aligned in the x-direction, with the clearance G2*b* therebetween. The clearance G2*b* is generally the same as the clearance G29 (exactly the same, or different by within ±5%).

As shown in FIG. 36, projection lengths y12 of the second portions 12A to 12G from the sixth face 76 in the y-direction are generally the same (exactly the same, or different by within ±5%), in this embodiment. Projection lengths y22 of the second portions 22A to 22H and the second portions 22S to 22U from the fifth face 75 are generally the same (exactly the same, or different by within ±5%). Projection lengths y21 of the second portions 22I to 22R from the fifth face 75 are generally the same (exactly the same, or different by within ±5%). The projection length y21 is longer than the projection length y22.

<Semiconductor Chips 4A to 4F>

The semiconductor chips 4A to 4F, located on the plurality of leads 1, each exemplify a semiconductor chip in the present disclosure. The type and the function of the semiconductor chips 4A to 4F are not specifically limited. In this embodiment, the semiconductor chips 4A to 4F are a transistor. Although six semiconductor chips 4A to 4F are provided in the illustrated example, the number of semiconductor chips is by no means limited.

The semiconductor chips 4A to 4F in the illustrated example are, for example, a transistor configured as an IGBT, like the ones in the semiconductor device A11.

In this embodiment, as shown in FIG. 39, FIG. 40, FIG. 41, and FIG. 42, three semiconductor chips 4A, 4B, and 4C are provided on the main surface 111A of the first portion 11A of the lead 1A. The three semiconductor chips 4A, 4B, and 4C are spaced apart from each other in the x-direction, and overlap with each other as viewed in the x-direction. Here, the number of semiconductor chips to be mounted on the lead 1A is by no means limited. The semiconductor chip 4A is located in the first region Ra surrounded by the groove 1112A in the main surface 111A, in a plan view. The semiconductor chip 4B is located in the first region Rb surrounded by the groove 1112A in the main surface 111A, in a plan view. The semiconductor chip 4C is located in the first region Rc surrounded by the groove 1112A in the main surface 111A, in a plan view. In the illustrated example, the semiconductor chips 4A, 4B, and 4C are arranged such that, as viewed in the z-direction, the respective gate electrodes GP are located on the side of the plurality of leads 2, with respect to the center of the semiconductor chips 4A, 4B, and 4C in the y-direction. In the illustrated example, in addition, the respective collector electrodes CP of the semiconductor chips 4A, 4B, and 4C are bonded to the main surface 111A, via the conductive bonding material 83.

The conductive bonding material 83 may be any material that is capable of bonding, and electrically connecting, the collector electrode CP of the semiconductor chips 4A, 4B, and 4C, to the main surface 111A. For example, silver paste, copper paste, or solder may be employed as the conductive bonding material 83. The conductive bonding material 83 corresponds to the second conductive bonding material in the present disclosure. In this embodiment, the conductive bonding material 83 extends outwardly from the outer periphery of the semiconductor chips 4A, 4B, and 4C, in a plan view. A reason of such a configuration is that, for example, when the conductive bonding material 83 performs the bonding function by curing after the fused state, the conductive bonding material 83 is apt to be formed in contact with the edge of the groove 1112A. This is because the surface tension of the fused conductive bonding material 83, generated at the edge of the groove 1112A when the conductive bonding material 83 is about to spread around, prevents the conductive bonding material 83 from spreading further.

In this embodiment, as shown in FIG. 39, FIG. 40, FIG. 41, and FIG. 43, the semiconductor chip 4D is provided on the main surface 111B of the first portion 11B of the lead 1B. Here, the number of semiconductor chips to be mounted on the lead 1B is by no means limited. In the illustrated example, the semiconductor chip 4D is arranged such that, as viewed in the z-direction, the gate electrode GP is located on the side of the plurality of leads 2, with respect to the center of the semiconductor chip 4D in the y-direction. In the illustrated example, in addition, the collector electrode CP of the semiconductor chip 4D is bonded to the main surface 111B, via the conductive bonding material 83.

In this embodiment, as shown in FIG. 39, FIG. 40, FIG. 41, and FIG. 43, the semiconductor chip 4E is provided on the main surface 111C of the first portion 11C of the lead 1C. Here, the number of semiconductor chips to be mounted on the lead 1C is by no means limited. In the illustrated example, the semiconductor chip 4E is arranged such that, as viewed in the z-direction, the gate electrode GP is located on the side of the plurality of leads 2, with respect to the center of the semiconductor chip 4E in the y-direction. In the illustrated example, in addition, the collector electrode CP of the semiconductor chip 4E is bonded to the main surface 111C, via the conductive bonding material 83.

In this embodiment, as shown in FIG. 39, FIG. 40, FIG. 41, and FIG. 43, the semiconductor chip 4F is provided on the main surface 111D of the first portion 11D of the lead 1D. Here, the number of semiconductor chips to be mounted on the lead 1D is by no means limited. In the illustrated example, the semiconductor chip 4F is arranged such that, as viewed in the z-direction, the gate electrode GP is located on the side of the plurality of leads 2, with respect to the center of the semiconductor chip 4F in the y-direction. In the illustrated example, in addition, the collector electrode CP of the semiconductor chip 4F is bonded to the main surface 111D, via the conductive bonding material 83. In the illustrated example, as shown in FIG. 39, the semiconductor chip 4C and the semiconductor chip 4D overlap with the connecting portion 57 of the conductive section 5, as viewed in the y-direction. As shown in FIG. 40, the semiconductor chip 4D is located on the side of the substrate 3 with respect to the upper face of the fourth portion 14B, in the z-direction.

<Diodes 41A to 41F>

The configuration of the diodes 41A to 41F is not specifically limited and may be, for example, similar to that of the diodes 41A to 41F of the semiconductor device A11.

As in the semiconductor device A11, the semiconductor chip 4A is mounted in the first region Ra. The semiconductor chip 4B is mounted in the first region Rb. The semiconductor chip 4C is mounted in the first region Rc. The diode 41A is mounted in the second region R1$a$. The diode 4B is mounted in the second region R1$b$. The diode 41C is mounted in the second region R1$c$. The semiconductor chip 4D is mounted in the first region Rd. The semiconductor chip 4E is mounted in the first region Re. The semiconductor chip 4F is mounted in the first region Rf. The diode 41D is mounted in the second region R1$d$. The diode 41E is mounted in the second region R1$e$. The diode 41F is mounted in the second region R1$f$.

As shown in FIG. 42, the diode 41A is located in the second region R1$a$ on the main surface 111A of the first portion 11A of the lead 1A. In the illustrated example, in addition, the diode 41A is bonded to the main surface 111A via the conductive bonding material 85. The conductive bonding material 85 is constituted of, for example, a material similar to that of the conductive bonding material 83.

As shown in FIG. 42, the diode 4B is located in the second region R1$b$ on the main surface 111A of the first portion 11A of the lead 1A. In the illustrated example, in addition, the diode 4B is bonded to the main surface 111A via the conductive bonding material 85.

As shown in FIG. 42, the diode 41C is located in the second region R1$a$ on the main surface 111A of the first portion 11A of the lead 1A. In the illustrated example, in addition, the diode 41C is bonded to the main surface 111A via the conductive bonding material 85.

The diode 41A overlaps with the semiconductor chip 4A, as viewed in the y-direction. The diode 41B overlaps with the semiconductor chip 4B, as viewed in the y-direction. The diode 41C overlaps with the semiconductor chip 4C, as viewed in the y-direction. The diodes 41A, 41B, and 41C overlap with each other, as viewed in the x-direction.

As shown in FIG. 43, the diode 41D is located in the second region R1$d$ on the main surface 111B of the first portion 11B of the lead 1B. In the illustrated example, in addition, the diode 41D is bonded to the main surface 111B via the conductive bonding material 85.

As shown in FIG. 43, the diode 41E is located in the second region R1$e$ on the main surface 111C of the first portion 11C of the lead 1C. In the illustrated example, in addition, the diode 41E is bonded to the main surface 111C via the conductive bonding material 85.

As shown in FIG. 43, the diode 41F is located in the second region R1$f$ on the main surface 111D of the first portion 11D of the lead 1D. In the illustrated example, in addition, the diode 41F is bonded to the main surface 111D via the conductive bonding material 85.

The diode 41D overlaps with the semiconductor chip 4D, as viewed in the y-direction. The diode 41E overlaps with the semiconductor chip 4E, as viewed in the y-direction. The diode 41F overlaps with the semiconductor chip 4F, as viewed in the y-direction. The diodes 41D, 41E, and 41F overlap with each other, as viewed in the x-direction.

<Control Chips 4G, 4H>

The configuration of the control chips 4G and 4H is not specifically limited and may be, for example, similar to that of the control chips 4G and 4H of the semiconductor device A1.

In this embodiment, the control chip 4G is mounted on the first base portion 55 of the conductive section 5. The control chip 4H is mounted on the second base portion 56 of the conductive section 5. In this embodiment, the control chip 4G is bonded to the first base portion 55, via the conductive bonding material 84. The control chip 4H is bonded to the second base portion 56, via the conductive bonding material 84.

The conductive bonding material 84 may be any material that is capable of bonding, and electrically connecting, the control chip 4G to the first base portion 55, and the control chip 4H to the second base portion 56. For example, silver paste, copper paste, or solder may be employed as the conductive bonding material 84. The conductive bonding material 84 corresponds to the third conductive material in the present disclosure. In this embodiment, the conductive bonding material 84 extends outwardly from the outer periphery of the control chips 4G and 4H, in a plan view. A reason of such a configuration is that, for example, when the conductive bonding material 84 performs the bonding function by curing after the fused state, the conductive bonding material 84 in the fused state spreads around the control chip 4G (control chip 4H) as viewed in the z-direction. Therefore, in the illustrated example, the conductive bonding material 84 protrudes from the respective outer edges of the control chips 4G and 4H, as viewed in the z-direction. However, the specific shape of the conductive bonding material 84 is by no means limited. Here, the control chips 4G and 4H may be bonded to the first base portion 55 via an insulative bonding material, instead of the conductive bonding material 84. In the illustrated example, the conductive bonding material 84 has an uneven outer edge, as viewed in the z-direction. Such formation of the conductive bonding material 84 allows the control chips 4G and 4H to be bonded to a region of the conductive section 5 more distant from the control chips 4G and 4H, thereby further stabilizing the adhesion of the control chips 4G and 4H.

As shown in FIG. 44, the control chip 4G is located between the leads 2B to 2O and the leads 1A to 1G, as viewed in the x-direction. The control chip 4H is located between the leads 2B to 2O and the leads 1A to 1G, as viewed in the x-direction. The control chips 4G and the control chips 4H overlap with each other, as viewed in the x-direction. The control chip 4G overlaps with the semiconductor chips 4B and 4C, as viewed in the y-direction. As shown in FIG. 45, the control chip 4H overlaps with the semiconductor chips 4D and 4E, as viewed in the y-direction. The control chip 4H overlaps with the transmission circuit chip 4I and the primary-side circuit chip 4J, as viewed in the y-direction. The control chip 4G may overlap with the semiconductor chip 4A, as viewed in the y-direction. The control chip 4H may overlap with the semiconductor chip 4F, as viewed in the y-direction.

As shown in FIG. 44, in the illustrated example, the control chip 4G overlaps with the wiring 50C (first portion 51C), the wiring 50D (first portion 51D), the wiring 50E (first portion 51E), and the wiring 50F (first portion 51F), as viewed in the y-direction. In addition, the control chip 4G overlaps with the second base portion 56 and the control chip 4H, as viewed in the x-direction. As shown in FIG. 45, the control chip 4H overlaps with the wirings 50I to 50P (first portions 51I to 51P), as viewed in the y-direction.

The control chip 4G is located on the side of the substrate 3, with respect to the upper end of the fourth portion 24C in the z-direction. Further, the control chip 4G is located on the side of the substrate 3, in other words on the lower side, with respect to the upper end of the first portion 21C in the z-direction. The control chip 4H is located on the side of the substrate 3, with respect to the upper end of the fourth portion 24C in the z-direction. Further, the control chip 4H is located on the side of the substrate 3, in other words on the lower side, with respect to the upper face of the first portion 21C in the z-direction.

As shown in FIG. 44, a portion of the first base portion 55 extending from the control chip 4G toward the lead 2 in the y-direction is longer than a portion of the first base portion 55 extending from the control chip 4G toward the lead 1A in the y-direction. As shown in FIG. 45, a portion of the second base portion 56 extending from the control chip 4H toward the lead 2 in the y-direction is longer than a portion of the second base portion 56 extending from the control chip 4H toward the lead 1C in the y-direction.

<Transmission Circuit Chip 4I>

The transmission circuit chip 4I includes the first transmission circuit in the present disclosure. The transmission circuit chip 4I has a transformer structure including at least two coils opposed to each other with a gap therebetween, to transmit electrical signals. In this embodiment, as shown in FIG. 40 and FIG. 45, the transmission circuit chip 4I is, for example, mounted on the third base portion 58 via the conductive bonding material 84. As shown in FIG. 45, the transmission circuit chip 4I is located between the control chip 4H and the primary-side circuit chip 4J, as viewed in the x-direction. The transmission circuit chip 4I overlaps with the control chip 4H, as viewed in the y-direction. Further, the transmission circuit chip 4I overlaps with the first portions 51I to 51O (wirings 50I to 50O), as viewed in the y-direction. In the illustrated example, the conductive bonding material 84 protrudes from the outer edge of the transmission circuit chip 4I, as viewed in the z-direction.

Referring to FIG. 51 to FIG. 57, an example of the configuration of the transmission circuit chip 4I will be described. Here, although the transmission circuit chip 4I according to this embodiment includes six transformers, the description will be given on the assumption that four transformers are provided, for the sake of simplicity. The four transformer correspond, for example, to transformers 691 to 694 (see FIG. 49).

FIG. 51 schematically illustrates the connection arrangement among the primary-side circuit chip 4J, the transmission circuit chip 4I, and the control chip 4H. In FIG. 51, the number of fourth wires 94 connecting the primary-side circuit chip 4J and the transmission circuit chip 4I, and the number of third wires 93 connecting the transmission circuit chip 4I and the control chip 4H, are reduced to two each, for the sake of clarity.

The transmission circuit chip 4I includes a lower coil 721, an upper coil 722, a semiconductor substrate 723, an insulation multilayer structure 724, a plurality of high-voltage pads 733, an inner coil end wiring 735, an outer coil end wiring 736, a via 737, an inner coil end wiring 747, an outer coil end wiring 748, a plurality of low-voltage pads 749, a low-voltage a wiring 750, a low-voltage wiring 751, shield layers 772 to 775, a cover film 778, a passivation film 779, a coil cover film 780, and a capacitor 783.

The lower coil 721 is a primary-side low-voltage coil. The upper coil 722 is a secondary-side high-voltage coil. The lower coil 721 and the upper coil 722 are opposed to each other in the z-direction (in the up-down direction), with a gap therebetween. The lower coil 721 and the upper coil 722 are each formed of a helical conductor wire. To the inner coil end (inner end of the helix) and the outer coil end (outer end of the helix) of the lower coil 721, the primary-side circuit chip 4J is electrically connected. To the inner coil end (inner end of the helix) and the outer coil end (outer end of the helix) of the upper coil 722, the control chip 4H is electrically connected.

In the transmission circuit chip 4I, a periodical pulse voltage is generated in the lower coil 721, for example by pulse generators 665U and 665L (see FIG. 49). In the transmission circuit chip 4I, only AC signals, based on the pulse voltage generated in the lower coil 721, are selectively transmitted to the upper coil 722 by electromagnetic induction, while DC signals are blocked between the lower coil 721 and the upper coil 722. The AC signals thus transmitted are boosted according to a transformation ratio between the lower coil 721 and the upper coil 722, and transmitted to the control chip 4H through the plurality of third wires 93.

Referring to FIG. 55, the semiconductor substrate 723 may be a silicon (Si) substrate, or a silicon carbide (SiC) substrate. The insulation multilayer structure 724 is formed on the semiconductor substrate 723.

The insulation multilayer structure 724 is composed of a plurality of insulation layers 725. The plurality of insulation layers 725 are sequentially stacked on the surface of the semiconductor substrate 723, and twelve layers are formed in the example shown in FIG. 55. The plurality of insulation layers 725 each include an etch stopper film 726 on the lower side, and an interlayer dielectric film 727 on the upper side, except the lowermost insulation layer 725 in contact with the surface of the semiconductor substrate 723. The lowermost insulation layer 725 only includes the interlayer dielectric film 727. The etch stopper film 726 may be formed of, for example, a silicon nitride (SiN) film, a silicon carbide (SiC) film, or a nitrogen-added silicon carbide (SiCN) film, and the interlayer dielectric film 727 may be formed of, for example, a silicon dioxide ($SiO_2$) film.

The lower coil 721 and the upper coil 722 are respectively formed in different insulation layers 725 in the insulation multilayer structure 724, and opposed to each other across one or more insulation layers 725. In this embodiment, the lower coil 721 is formed in the fourth insulation layer 725 from the semiconductor substrate 723, and the upper coil 722 is formed in the eleventh insulation layer 725, with six insulation layers 725 interposed between the upper coil 722 and the lower coil 721.

The shape of the lower coil 721 and the upper coil 722 is not specifically limited and may be, for example, an elliptical shape as viewed in the z-direction, as shown in FIG. 52 to FIG. 54. The lower coil 721 and the upper coil 722 are internally provided with inner regions 728 and 729, respectively.

FIG. 56 illustrates an essential part of the upper coil 722. In a region surrounding the inner region 729, a coil groove 730 is formed in the insulation layer 725. The coil groove 730 is used to form the upper coil 722 therein. The coil groove 730 is formed so as to penetrate through the interlayer dielectric film 727, and the etch stopper film 726 located thereunder, which are formed, for example, in an elliptical helical shape. Accordingly, the upper and lower ends of the coil groove 730 respectively reach the etch stopper film 726 of the insulation layer 725 on the upper side and the interlayer dielectric film 727 of the insulation layer 725 on the lower side.

In the illustrated example, the upper coil 722 includes a barrier metal 731 and a copper wiring material 732. The barrier metal 731 is formed on the inner face (side face and bottom face) of the coil groove 730. The barrier metal 731 is formed in a film shape according to the side face and the bottom face, with an opening oriented upward. In this embodiment, the barrier metal 731 includes, for example, a tantalum (Ta) film, a tantalum nitride (TaN) film, and a tantalum film formed in this order from the side of the inner face of the coil groove 730. The copper wiring material 732 is formed by filling the inside of the barrier metal 731, for example with copper (Cu).

The upper coil 722 is formed such that the upper face becomes flush with the upper face of the insulation layer 725. Accordingly, the upper coil 722 is in contact with different ones of the insulation layers 725, via the side face, the upper face, and the lower face. More specifically, in the insulation layer 725 in which the upper coil 722 is buried, the etch stopper film 726 and the interlayer dielectric film 727 is in contact with the upper coil 722, and only the etch stopper film 726 on the lower side, in another insulation layer 725 formed on the first mentioned insulation layer 725, is in contact with the upper coil 722. As to the insulation layer 725 formed under the upper coil 722, only the interlayer dielectric film 727 on the upper side is in contact with the upper coil 722.

Here, although detailed description is omitted, the lower coil 721 is also formed by filling the coil groove with the barrier metal and the copper (Cu) wiring material, like the upper coil 722.

As shown in FIG. 52, FIG. 55, and FIG. 56, the plurality of high-voltage pads 733 are formed on the surface of the insulation multilayer structure 724 (interlayer dielectric film 727 of the uppermost insulation layer 725), and the third wire 93 is connected to the high-voltage pads 733. The high-voltage pad 733 is located in the central high-voltage region (HV region) 734 where the upper coil 722 is provided, as viewed in the z-direction.

The high-voltage region 734 includes a region where a wiring of the same potential as the upper coil 722 and the lower coil 721 is formed, and the periphery of the mentioned region, in the insulation layer 725 in which the upper coil 722 is buried. In this embodiment, as shown in FIG. 54, four upper coils 722 are aligned along the longitudinal direction of the transmission circuit chip 4I, so as to form two pairs with a spacing between the pairs.

The inner coil end wiring 735 and the outer coil end wiring 736 are respectively formed in the inner region 729 of each of the upper coils 722, and between the upper coils 722 adjacent to each other, in each pair. In each pair, one upper coil 722 and the other upper coil 722 are electrically connected to each other via the common outer coil end wiring 736, and both of the upper coils 722, the outer coil end wiring 736 interposed therebetween, and the inner coil end wiring 735 in each of the upper coils 722, all have the same potential. In the relevant insulation layer 725, the inner region 729 of each of the upper coils 722, and the region between the upper coils 722 in each pair, are included in the high-voltage region 734, because these regions are within the range covered with the electric field from the upper coil 722, the inner coil end wiring 735, or the outer coil end wiring 736. Here, although the region where the lower coil 721 (low-voltage coil) is located coincides with the high-voltage region 734, as viewed in the z-direction, this region is isolated from the upper coil 722 by the plurality of insulation layers 725. Therefore, this region is not included in the high-voltage region 734 referred to this embodiment, because the mentioned region is barely affected by the electric field from the upper coil 722.

As shown in FIG. 52, the high-voltage pad 733 is located on the upper side of the inner region 729 of each of the upper coils 722, and on the upper side of the region between the upper coils 722 in each pair, in other words totally six high-voltage pads 733 are provided.

As shown in FIG. 55 and FIG. 56 for example, the via 737 is connecting a high-voltage pad 733 to the inner coil end wiring 735 buried in the same insulation layer 725 in which the upper coil 722 is buried. Though not illustrated, another high-voltage pad 733 is likewise connected, by means of the via, to the outer coil end wiring 736 buried in the same insulation layer 725 in which the upper coil 722 is buried. With such an arrangement, the AC signal transmitted to the upper coil 722 can be outputted from the high-voltage pad 733, through the inner coil end wiring 735 and the via 737, as well as through the outer coil end wiring 736 and another via (not shown).

The inner coil end wiring 735 and the via 737 are, like the upper coil 722, respectively formed by filling the wiring trenches 738 and 739 with the barrier metals 740 and 741 and the copper (Cu) wiring materials 742 and 743, as shown in FIG. 56 (the same applies to the outer coil end wiring 736 and the via connected thereto). The barrier metals 740 and 741 may be formed of the same material as the barrier metal 731.

In the insulation multilayer structure 724, a low-voltage region 744 (FIG. 53 and FIG. 55), an outer low-voltage region 745 (FIG. 52 and FIG. 53), and an intermediate region 746 (FIG. 51 to FIG. 56) are provided, as low-potential regions (LV regions) electrically isolated from the high-voltage region 734.

The low-voltage region 744 includes regions of the insulation layer 725 in which the lower coil 721 is buried, such as a region formed with the lower coil 721, a region formed with a wiring of the same potential as that of the lower coil 721, and peripheral regions of the former two regions. The low-voltage region 744 is opposed to the high-voltage region 734 across one or more insulation layers 725, like the positional relation between the lower coil 721 and the upper coil 722. In this embodiment, two pairs, namely four lower coils 721 are aligned in the x-direction so as to oppose the upper coil 722, with a spacing between the pairs, as shown in FIG. 53.

The inner coil end wiring 747 and the outer coil end wiring 748 are respectively formed in the inner region 728 of each of the lower coils 721, and between the lower coils 721 adjacent to each other, in each pair. In each pair, accordingly, one lower coil 721 and the other lower coil 721 are electrically connected to each other via the common outer coil end wiring 748, and both of the lower coils 721, the outer coil end wiring 748 interposed therebetween, and the inner coil end wiring 747 in each of the lower coils 721, all have the same potential. Therefore, in the relevant insulation layer 725, the inner region 728 of each of the lower coils 721, and the region between the lower coils 721 in each pair, are included in the low-voltage region 744, because these regions are within the range covered with the electric field from the lower coil 721, the inner coil end wiring 747, or the outer coil end wiring 748. Here, the inner coil end wiring 747 is located at a position shifted from the inner coil end wiring 735 of the high-voltage position in a plan view, as shown in FIG. 54.

The outer low-voltage region 745 is provided so as to surround the high-voltage region 734 and the low-voltage region 744, and the intermediate region 746 is provided between the high-voltage region 734 and the outer low-voltage region 745, and between the low-voltage region 744 and the outer low-voltage region 745, as shown in FIG. 55.

As shown in FIG. 52, FIG. 55, and FIG. 56, the low-voltage pad 749 is formed on the surface of the insulation multilayer structure 724 (interlayer dielectric film 727 of the uppermost insulation layer 725), in the outer low-voltage region 745, and the fourth wire 94 is connected to the low-voltage pad 749. In this embodiment, the low-voltage pad 749 is located on the lateral side of each of the six high-voltage pads 733, aligned with a spacing in the x-direction, in other words totally six low-voltage pads 749 are provided. The low-voltage pads 749 are each connected to the lower coil 721, via the low-voltage wirings 750 and 751 routed in the insulation multilayer structure 724.

The low-voltage wiring 750 includes a through wiring 752 and a lead-out wiring 753. The through wiring 752 is formed in the outer low-voltage region 745, in a column shape extending from the low-voltage pad 749, so as to penetrate at least the insulation layer 725 in which the lower coil 721 is formed, and reach the insulation layer 725 on the lower side of the lower coil 721. More specifically, the through wiring 752 includes low-voltage layer wirings 754 and 755, and a plurality of vias 756, 757, and 758.

Each of the low-voltage layer wirings 754 and 755 is an island-shaped portion (rectangular shape) buried in the same insulation layer 725 in which the upper coil 722 and the lower coil 721 are buried. The plurality of vias 756 each serve to connect between the low-voltage layer wirings 754 and 755. The via 757 is for connecting the low-voltage layer wiring 754 on the upper side and the low-voltage pad 749. The via 758 is for connecting the low-voltage layer wiring 755 on the lower side and the lead-out wiring 753.

The lead-out wiring 753 is formed in a linear shape, drawn out from the low-voltage region 744 to the outer low-voltage region 745 through the insulation layer 725 on the lower side of the lower coil 721. More specifically, the lead-out wiring 753 includes the inner coil end wiring 747, a linear lead-out layer wiring 759 buried in the insulation layer 725 on the lower side of the lower coil 721 so as to cross the insulation layer 725 under the lower coil 721, and a via 760 connecting between the lead-out layer wiring 759 and the inner coil end wiring 747. The lead-out layer wiring 759 is connected to the semiconductor substrate 723, through the via 761. Thus, the low-voltage wiring 750 is fixed to the substrate voltage (e.g., ground voltage).

Here, the wirings 747, 754, 755, and 759, and the vias 756 to 758 and 760 are each formed by filling the wiring trenches with the copper (Cu) wiring material, like the upper coil 722. As shown in FIG. 56 for example, the low-voltage layer wiring 754 and the vias 756 and 757 are each formed by filling the wiring trenches 762 to 764 with the barrier metals 765 to 767 and the copper (Cu) wiring materials 768 to 770. The barrier metals 765 to 767 may be formed of the same material as the barrier metal 731.

Though details are omitted, the low-voltage wiring 755 also includes a through wiring (not shown) and a lead-out wiring 771 (FIG. 52 to FIG. 54), like the low-voltage layer wiring 754.

One of the low-voltage pads 749 is connected to the inner coil end wiring 747 of the lower coil 721, through the through wiring 752 and the lead-out wiring 753, as shown in FIG. 52 to FIG. 55. Another low-voltage pad 749 is connected to the outer coil end wiring 748 of the lower coil 721, through the through wiring and the lead-out wiring 771, as shown in FIG. 52 to FIG. 54. Therefore, the signal inputted to the low-voltage pad 749 can be transmitted to the lower coil 721, through the through wiring 752 and the lead-out wiring 753.

The shield layer 772 is formed on a further outer side of the low-voltage layer wiring 754, in the insulation multilayer structure 724. The shield layer 772 prevents intrusion of moisture from outside into the device, and spreading of a crack on an end face into an inner region.

The shield layer 772 is, as shown in FIG. 52 to FIG. 55, formed in a wall shape along the end face of the transmission circuit chip 4I, and connected to the semiconductor substrate 723 via the bottom portion. Accordingly, the shield layer 772 is fixed to the substrate voltage (e.g., ground voltage). More specifically, the shield layer 772 includes shield layer wirings 773 to 775 and a plurality of vias 777, as shown in FIG. 55. The shield layer wirings 773 to 775 are buried in the same insulation layer 725 in which the upper coil 722, the lower coil 721, and the lead-out layer wiring 759 are buried. One of the vias 777 is connecting the shield layer wirings 773 to 775 to each other. Another via 777 is connecting the lowermost shield layer wiring 775 and the semiconductor substrate 723. The shield layer wirings 773 to 775 and the vias 776 and 777 are each formed by filling the wiring trenches with the barrier metal and the copper (Cu) wiring material, like the upper coil 722.

The cover film 778 and the passivation film 779 are stacked in this order, over the entirety of the insulation multilayer structure 724. The coil cover film 780 is formed in an elliptical ring shape, so as to selectively cover a region right above the upper coil 722, on the passivation film 779. The cover film 778, the passivation film 779, and the coil cover film 780 include pad openings 781 and 782, to expose the low-voltage pad 749 and the high-voltage pad 733, respectively.

The cover film 778 is formed of silicon dioxide ($SiO_2$) for example, and has a thickness of approximately 150 nm. The passivation film 779 is formed of silicon nitride (SiN) for example, and has a thickness of approximately 1000 nm. The coil cover film 780 is formed of polyimide for example, and has a thickness of approximately 4000 nm.

A large potential difference (e.g., approximately 1200V) is generated between the lower coil 721 and the upper coil 722, constituting a transformer 690 (FIG. 49) to be subsequently described. Accordingly, the insulation layer 725 provided between the lower coil 721 and the upper coil 722 has to have a thickness that can secure a sufficient withstand voltage to prevent insulation breakdown due to the potential difference.

In this embodiment, therefore, a plurality of insulation layers 725 (e.g., six layers), each including the etch stopper film 726 of approximately 300 nm and the interlayer dielectric film 727 of approximately 2100 nm, are interposed between the coils as shown in FIG. 55, so that the insulation layer 725 attains a total thickness L2 of 12.0 μm to 16.8 μm, thus securing DC insulation in the vertical direction between the lower coil 721 and the upper coil 722.

However, the experiment carried out by the present inventors, with regard to the relation between the thickness of an interlayer film in a semiconductor device having a transformer and a surge breakdown voltage, has provided a result shown in FIG. 57. In FIG. 57, the interlayer film refers to a film having a similar structure to that of the insulation layer 725 according to this embodiment. From FIG. 57, it is understood that, although the DC insulation in the vertical direction is sufficiently achieved, by increasing the number of layers of the interlayer film between the coils, thus increasing the total film thickness, breakdown in the transverse direction, for example between the upper coil 722 and the low-voltage pad 749 (between coil and pad), and between the upper coil 722 and the shield layer 772 (between coil and shield), predominantly takes place.

Normally, a distance L0 between the upper coil 722 and the outer low-voltage region 745 (in this embodiment, width of the intermediate region 746) shown in FIG. 53 is larger than the total thickness L2 of the insulation layer 725 between the lower coil 721 and the upper coil 722 shown in FIG. 55. For example, the distance L0 is normally 100 μm to 450 μm, which corresponds to a ratio of 6/1 to 40/1 to the thickness L2 (distance L0/thickness L2). Accordingly, for example, even though a potential difference, equivalent to a difference between the lower coil 721 and the upper coil 722 (between the high-voltage region 734 and the low-voltage region 744), is generated between the high-voltage region 734 and the outer low-voltage region 745, the insulation breakdown is not incurred theoretically, since the distance L0 is larger than the thickness L2, when only the distance between these regions is taken into account. However, as proven by FIG. 57, the breakdown in the transverse direction predominantly takes place, when the thickness of the interlayer film between the coils is increased. Here, although the thickness L2 is apparently larger than the distance L0 in FIG. 55, actually the distance L0 is much larger than the thickness L2.

In this relation, the present inventors have discovered that providing a shield, formed of an electrically floating metal material, between the high-voltage region 734 and the outer low-voltage region 745 mitigates concentration of an electric field to a specific portion of the outer low-voltage region 745, to thereby prevent the breakdown in the transverse direction.

In this embodiment, therefore, a capacitor 783 is provided in the intermediate region 746, so as to surround the high-voltage region 734 in a plan view, as shown in FIG. 52 and FIG. 54. Although the plurality of high-voltage regions 734 are surrounded by the same capacitor 783 in FIG. 52 and FIG. 53, each of the high-voltage regions 734 may be individually surrounded.

The cross-sectional structure of the capacitor 783 is shown in FIG. 55 and FIG. 56. The capacitor 783 is buried in the insulation layer 725 in which the upper coil 722 is buried, the insulation layer 725 in which the lower coil 721 is buried, and each of the insulation layers 725 provided therebetween, and formed in a wall shape as a whole, so as to surround the region in the insulation layer 725 where the coils are formed.

The capacitor 783 includes a plurality of electrode plates 784 buried in each of the insulation layers 725. At least three (five in FIG. 55 and FIG. 56) electrode plates 784 are provided at regular intervals, each of which is electrically floating. In addition, the electrode plates 784 buried in the respective insulation layers 725 are serially aligned in the up-down direction. In other words, in terms of the cross-section of the insulation multilayer structure 724, the electrode plate 784 constituting a given capacitor 783 is superposed on the adjacent electrode plate 784 on the upper and lower sides. Accordingly, the plurality of electrode plates 784, respectively buried in different insulation layers 725, form a shield plate without a gap, along the stacking direction of the insulation multilayer structure 724.

The electrode plates 784 are each formed by filling the wiring trench 785 with the barrier metal 786 and the copper (Cu) wiring material 787 as shown in FIG. 56, like the upper coil 722. The barrier metal 786 may be formed of a similar material to that of the barrier metal 731.

Further, a distance L1 in the transverse direction between the upper coil 722 and the capacitor 783 shown in FIG. 55 is larger than the total thickness L2 of the insulation layers 725 between the upper coil 722 and the lower coil 721. The distance L1 is, for example, 25 μm to 400 μm. Here, although the thickness L2 is apparently larger than the distance L1 in FIG. 33, actually the distance L1 is much larger than the thickness L2.

The capacitor 783 serves to mitigate concentration of an electric field to the low-potential conductive section (e.g., low-voltage pad 749, low-voltage layer wiring 754, via 756, low-voltage layer wiring 755, and shield layer 772) located in the outer low-voltage region 745, when a high voltage is applied between the upper coil 722 and the lower coil 721. In particular, in the case of the low-voltage pad 749 and the low-voltage layer wiring 754 having a rectangular shape, located in the same layer as the upper coil 722 (high-voltage coil) and neighboring layers, the electric field is prone to concentrate on a corner portion, thus causing surge breakdown. However, the presence of the capacitor 783 effectively suppresses such surge breakdown. In this embodiment, in addition, since the capacitor 783 is surrounding the high-voltage region 734, the electric field emitted from the upper coil 722 is mitigated, regardless of the direction. Consequently, the withstand voltage between the high-voltage region 734 and the outer low-voltage region 745 can be improved.

Further, since the electrode plates 784 constituting the capacitor 783 are buried in the same insulation layer 725 in which the elements of the shield layer 772 are buried, the capacitor 783 and the shield layer 772 can be fabricated at a time, through the same process.

<Primary-Side Circuit Chip 4J>

The primary-side circuit chip 4J transmits command signals to the control chip 4H, through the transmission circuit chip 4I. In this embodiment, as shown in FIG. 40 and FIG. 45, the primary-side circuit chip 4J is, for example, mounted on the third base portion 58 via the conductive bonding material 84. The primary-side circuit chip 4J is located on the side of the fifth face 35 in the y-direction, with respect to the transmission circuit chip 4I. As shown in FIG. 45, the primary-side circuit chip 4J overlaps with the first portion 51Q (wiring 50Q), as viewed in the x-direction. The primary-side circuit chip 4J overlaps with the control chip 4H and the transmission circuit chip 4I, as viewed in the y-direction. Further, the transmission circuit chip 4I overlaps with the first portions 51I to 51I (wirings 50I to 50O), as viewed in the y-direction.

As shown in FIG. 40, the control chip 4H, the transmission circuit chip 4I, and the primary-side circuit chip 4J are located on the side of the substrate 3, in other words on the lower side, with respect to the upper end of the fourth portion 24I in the z-direction. Further, the control chip 4H, the transmission circuit chip 4I, and the primary-side circuit chip 4J are located on the side of the substrate 3, in other words on the lower side, with respect to the upper end of the first portion 21I in the z-direction. Such positional relation also applies to the control chip 4G.

<Diodes 49U, 49V, 49W>

The configuration of the diodes 49U, 49V, and 49W is not specifically limited and may be, for example, similar to that of the diodes 49U, 49V, and 49W of the semiconductor device A1.

<First Wires 91A to 91F>

Regarding the first wires 91A to 91F according to this embodiment, although any of the elements is apparently given, for the sake of convenience of description, the same numeral as that of the first wires 91A to 91F according to the first embodiment, it does not necessarily mean that the mentioned element has the same or similar configuration. The configuration of an element with a numeral is defined by the description relevant to this embodiment.

The first wires 91A to 91F are each connected to one of the semiconductor chips 4A to 4F and one of the plurality of leads 1. The material of the first wires 91A to 91F is not specifically limited and, for example, aluminum (Al) or copper (Cu) may be employed. The wire diameter of the first wires 91A to 91F is not specifically limited and, for example, may be approximately 250 to 500 μm. The first wires 91A to 91F correspond to the first conductive material in the present disclosure. Here, for example leads formed of copper may be employed, in place of the first wires 91A to 91F.

The collector electrode CP of the semiconductor chip 4A and the cathode electrode of the diode 41A are connected to each other, via the first portion 11A and the conductive bonding material 83. The collector electrode CP of the semiconductor chip 4B and the cathode electrode of the diode 41B are connected to each other, via the first portion 11A and the conductive bonding material 83. The collector electrode CP of the semiconductor chip C and the cathode electrode of the diode 41C are connected to each other, via the first portion 11A and the conductive bonding material 83.

In this embodiment, as shown in FIG. 42, the first wire 91A includes a first portion 911A and a second portion 912A, each of which will be described hereunder. An end of the first portion 911A is connected to the emitter electrode EP of the semiconductor chip 4A, and the other end is connected to the anode electrode of the diode 41A. In the illustrated example, the first portion 911A extends along the y-direction. An end of the second portion 912A is connected to the anode electrode of the diode 41A, and the other end is connected to the fourth portion 14B of the lead 1B. In the illustrated example, the second portion 912A is inclined with respect to the x-direction and the y-direction. The number of first wires 91A is not specifically limited. In the illustrated example, three first wires 91A are provided.

In this embodiment, the first wire 91B includes a first portion 911B and a second portion 912B, each of which will be described hereunder. An end of the first portion 911B is connected to the emitter electrode EP of the semiconductor chip 4B, and the other end is connected to the anode electrode of the diode 41B. In the illustrated example, the first portion 911B extends along the y-direction. An end of the second portion 912B is connected to the anode electrode of the diode 41B, and the other end is connected to the fourth portion 14C of the lead 1C. In the illustrated example, the second portion 912B is inclined with respect to the x-direction and the y-direction. The number of first wires 91B is not specifically limited. In the illustrated example, three first wires 91B are provided.

In this embodiment, the first wire 91C includes a first portion 911C and a second portion 912C, each of which will be described hereunder. An end of the first portion 911C is connected to the emitter electrode EP of the semiconductor chip 4C, and the other end is connected to the anode electrode of the diode 41C. In the illustrated example, the first portion 911C extends along the y-direction. An end of the second portion 912C is connected to the anode electrode of the diode 41C, and the other end is connected to the fourth portion 14D of the lead 1D. In the illustrated example, the second portion 912C is inclined with respect to the x-direction and the y-direction. The number of first wires 91C is not specifically limited. In the illustrated example, three first wires 91C are provided.

The collector electrode CP of the semiconductor chip 4D and the cathode electrode of the diode 41D are connected to each other, via the first portion 11B and the conductive bonding material 83. The collector electrode CP of the semiconductor chip 4E and the cathode electrode of the diode 41E are connected to each other, via the first portion 11C and the conductive bonding material 83. The collector electrode CP of the semiconductor chip 4F and the cathode electrode of the diode 41F are connected to each other, via the first portion 11D and the conductive bonding material 83.

In this embodiment, as shown in FIG. 42, the first wire 91D includes a first portion 911D and a second portion 912D, each of which will be described hereunder. An end of the first portion 911D is connected to the emitter electrode EP of the semiconductor chip 4D, and the other end is connected to the anode electrode of the diode 41D. In the illustrated example, the first portion 911D extends along the y-direction. An end of the second portion 912D is connected to the anode electrode of the diode 41D, and the other end is connected to the fourth portion 14E of the lead 1E. In the illustrated example, the second portion 912D is inclined with respect to the x-direction and the y-direction. The number of first wires 91D is not specifically limited. In the illustrated example, three first wires 91A are provided.

In this embodiment, the first wire 91E includes a first portion 911E and a second portion 912E, each of which will be described hereunder. An end of the first portion 911E is connected to the emitter electrode EP of the semiconductor chip 4E, and the other end is connected to the anode electrode of the diode 41E. In the illustrated example, the first portion 911E extends along the y-direction. An end of the second portion 912E is connected to the anode electrode of the diode 41E, and the other end is connected to the fourth portion 14F of the lead 1F. In the illustrated example, the second portion 912E is inclined with respect to the x-direction and the y-direction. The number of first wires 91E is not specifically limited. In the illustrated example, three first wires 91E are provided.

In this embodiment, the first wire 91F includes a first portion 911F and a second portion 912F, each of which will be described hereunder. An end of the first portion 911F is connected to the emitter electrode EP of the semiconductor chip 4F, and the other end is connected to the anode electrode of the diode 41F. In the illustrated example, the first portion 911F extends along the y-direction. An end of the second portion 912F is connected to the anode electrode of the diode 41F, and the other end is connected to the fourth portion 14G of the lead 1G. In the illustrated example, the second portion 912F is inclined with respect to the x-direction and the y-direction. The number of first wires 91F is not specifically limited. In the illustrated example, three first wires 91F are provided.

<Second Wires 92>

Regarding the second wire 92 according to this embodiment, although any of the elements is apparently given, for the sake of convenience of description, the same numeral as that of the second wire 92 according to the first embodiment, it does not necessarily mean that the mentioned element has the same or similar configuration. The configuration of an element with a numeral is defined by the description relevant to this embodiment.

The plurality of second wires 92 are each connected to one of the control chips 4G and 4H, as shown in FIG. 39, FIG. 44, and FIG. 45. The material of the second wires 92 is not specifically limited and, for example, gold (Au) may be employed. The wire diameter of the second wires 92 is not specifically limited and, in this embodiment, finer than the first wires 91A to 91F. The wire diameter of the second wires 92 is, for example, approximately 10 μm to 50 μm. The second wires 92 correspond to the second conductive material in the present disclosure. In the subsequent description, the second wires 92 connected to the control chip 4G will be referred to as second wires 92G, and the second wires 92 connected to the control chip 4H will be referred to as second wires 92H.

The second wire 92G is connected to the gate electrode GP of the semiconductor chip 4A, and the second portion 52*a* of the wiring 50*a*. Another second wire 92G is connected to the emitter electrode EP of the semiconductor chip 4A, and the second portion 52*b*. The latter second wire 92G is connected to a position on the emitter electrode EP of the semiconductor chip 4A on the opposite side of the semiconductor chip 48 in the x-direction, with respect to the gate electrode GP.

The second wire 92G is connected to the gate electrode GP of the semiconductor chip 48, and to a position on the control chip 4G on the side of the first portion 11A, with respect to the center of the control chip 4G in the y-direction. Another second wire 92G is connected to the emitter electrode EP of the semiconductor chip 48, and to a position on the control chip 4G on the side of the first portion 11A, with respect to the center of the control chip 4G in the y-direction. The latter second wire 92G is connected to a position on the emitter electrode EP of the semiconductor chip 48 closer to the semiconductor chip 4C in the x-direction, with respect to the gate electrode GP.

The second wire 92G is connected to the gate electrode GP of the semiconductor chip 4C, and to a position on the control chip 4G on the side of the first portion 11A, with respect to the center of the control chip 4G in the y-direction. Another second wire 92G is connected to the emitter electrode EP of the semiconductor chip 4C, and to a position on the control chip 4G on the side of the first portion 11A, with respect to the center of the control chip 4G in the y-direction. The latter second wire 92G is connected to a position on the emitter electrode EP of the semiconductor chip 48 closer to the semiconductor chip 48 in the x-direction, with respect to the gate electrode GP.

The second wire 92H is connected to the gate electrode GP of the semiconductor chip 4D, and to a position on the control chip 4H on the side of the first portion 11A, with respect to the center of the control chip 4H in the y-direction. Another second wire 92H is connected to the gate electrode GP of the semiconductor chip 4E, and to a position on the control chip 4H on the side of the first portion 11A, with respect to the center of the control chip 4H in the y-direction. Further, still another second wire 92H is connected to the gate electrode GP of the semiconductor chip 4F, and the second portion 52F of the wiring 50*f*.

<Third Wires 93>

As shown in FIG. 39, FIG. 44, and FIG. 45, the plurality of third wires 93 are connected to one of the control chips 4G and 4H. The material of the third wire 93 is not specifically limited and, for example, a similar material to that of the second wire 92 may be employed.

As shown in FIG. 44, a third wire 93 is connected to the first portion 51A, and a position on the control chip 4G close to the center in the y-direction. Two third wires 93 are connected to the first portion 51B, and a position on the control chip 4G close to the center in the y-direction. Another third wire 93 is connected to the diode 49U, and a position on the control chip 4G on the side of the fifth face 35 in the y-direction. Another third wire 93 is connected to the first portion 51C, and a position on the control chip 4G close to the center in the y-direction. Two third wires 93 are connected to the first portion 51D, and a position on the control chip 4G close to the center in the y-direction. Another third wire 93 is connected to the diode 49V, and a position on the control chip 4G on the side of the fifth face 35 in the y-direction. Another third wire 93 is connected to the first portion 51E, and a position on the control chip 4G close to the center in the y-direction. Two third wires 93 is connected to the first portion 51F, and a position on the control chip 4G close to the center in the y-direction. Another third wire 93 is connected to the diode 49W, and a position on the control chip 4G on the side of the fifth face 35 in the y-direction. Another third wire 93 is connected to the third portion 53H, and a position on the control chip 4G on the side of the fifth face 35 in the y-direction.

As shown in FIG. 45, two third wires 93 are connected to the third portion 573 of the connecting portion 57, and a position on the control chip 4H on the side of the third face 33 in the x-direction. Another third wire 93 is connected to the second portion 52*c*, and a position on the control chip 4H on the side of the third face 33 in the x-direction. Another third wire 93 is connected to the second portion 52*d*, and a position on the control chip 4H on the side of the third face 33 in the x-direction. Another third wire 93 is connected to the second portion 52*e*, and a position on the control chip 4H on the side of the third face 33 in the x-direction. Two third wires 93 are each connected to a position on the first portion 51H on the side of the fourth face 34 in the x-direction, and a position on the control chip 4H on the side of the third face 33 in the x-direction. A plurality of third wires 93 are each connected to a position on the control chip 4H on the side of the fifth face in the y-direction, and a position on the transmission circuit chip 4I close to the center in the y-direction. The number of third wires 93 extending from the control chip 4G toward the transmission circuit chip 4I in the y-direction is larger than the number of second wires 92 extending from the control chip 4H toward the semiconductor chips 4D and 4E (leads 1B and 1C) in the y-direction.

<Fourth Wires 94>

As shown in FIG. 39 and FIG. 45, the plurality of fourth wires 94 are connected to the transmission circuit chip 4I and the primary-side circuit chip 4J. The material of the fourth wires 94 is not specifically limited and, for example, a similar material to that of the second wire 92 may be employed.

As shown in FIG. 45, in the illustrated example, the plurality of fourth wires 94 are each connected to a position on the transmission circuit chip 4I on the side of the fifth face in the y-direction, and a position on the primary-side circuit chip 4J on the side of the sixth face 36 in the y-direction.

<Fifth Wires 95>

As shown in FIG. 39 and FIG. 44, the plurality of fifth wires 95 are connected to the transmission circuit chip 4I and the primary-side circuit chip 4J. The material of the fifth wires 95 is not specifically limited and, for example, a similar material to that of the second wire 92 may be employed.

As shown in FIG. 45, a fifth wire 95 is connected to the first portion 51I, and a position on the primary-side circuit chip 4J on the side of the fifth face 35 in the y-direction. Another fifth wire 95 is connected to the first portion 51J, and a position on the primary-side circuit chip 4J on the side of the fifth face 35 in the y-direction. Another fifth wire 95 is connected to the first portion 51K, and a position on the primary-side circuit chip 4J on the side of the fifth face 35 in the y-direction. Another fifth wire 95 is connected to the first portion 51L, and a position on the primary-side circuit chip 4J on the side of the fifth face 35 in the y-direction. Another fifth wire 95 is connected to the first portion 51M, and a position on the primary-side circuit chip 4J on the side of the fifth face 35 in the y-direction. Another fifth wire 95 is connected to the first portion 51N, and a position on the primary-side circuit chip 4J on the side of the fifth face 35 in the y-direction. Another fifth wire 95 is connected to the first portion 51O, and a position on the primary-side circuit chip 4J on the side of the fifth face 35 in the y-direction. Another fifth wire 95 is connected to the first portion 51P, and a position on the primary-side circuit chip 4J on the side of the fifth face 35 in the y-direction. Another fifth wire 95 is connected to the first portion 51Q, and a position on the primary-side circuit chip 4J on the side of the fifth face 35 in the y-direction. Two fifth wires 95 are connected to the third base portion 58, and a position on the primary-side circuit chip 4J on the side of the fourth face 34 in the x-direction.

<Sixth Wires 96>

As shown in FIG. 39 and FIG. 44, the plurality of sixth wires 96 are connected to the control chip 4G and the conductive section 5. The material of the sixth wire 96 is not specifically limited and, for example, a similar material to that of the second wire 92 may be employed.

As shown in FIG. 45, a sixth wire 96 is connected to the first portion 51*a*, and a position on the control chip 4G on the side of the sixth face 36 in the y-direction. Another sixth wire 96 is connected to the first portion 51*b*, and a position on the control chip 4G on the side of the sixth face 36 in the y-direction. Two sixth wires 96 are connected to the second portion 572, and a position on the control chip 4G on the side of the fourth face 34 in the x-direction. Another sixth wire 96 is connected to the first portion 51*c*, and a position on the control chip 40 on the side of the fourth face 34 in the x-direction. Another sixth wire 96 is connected to the first portion 51*d*, and a position on the control chip 4G on the side of the fourth face 34 in the x-direction. Another sixth wire 96 is connected to the first portion 51*e*, and a position on the control chip 4G on the side of the fourth face 34 in the x-direction.

<Seventh Wires 97>

As shown in FIG. 39 and FIG. 45, the plurality of seventh wires 97 are connected to the control chip 4G and the conductive section 5. The material of the seventh wires 97 is not specifically limited and, for example, a similar material to that of the second wire 92 may be employed.

As shown in FIG. 45, a seventh wire 97 is connected to the first portion 51*f*, and a position on the control chip 4H on the side of the fourth face 34 in the x-direction. Three seventh wires 97 are connected to the first portion 51T, and a position on the control chip 4H on the side of the fourth face 34 in the x-direction. Another seventh wire 97 is connected to the first portion 51S, and a position on the control chip 4H on the side of the fourth face 34 in the x-direction.

<Resin 7>

Regarding the resin 7 according to this embodiment, although any of the elements is apparently given, for the sake of convenience of description, the same numeral as that of the resin 7 according to the first embodiment, it does not necessarily mean that the mentioned element has the same or similar configuration. The configuration of an element with a numeral is defined by the description relevant to this embodiment.

The resin 7 covers at least the semiconductor chips 4A to 4F, the control chips 4G and 4H, the transmission circuit chip 4I, the primary-side circuit chip 4J, a part of each of the plurality of leads 1, and a part of each of the plurality of leads 2. In this embodiment, in addition, the resin 7 covers the diodes 41A to 41F, the diodes 49U, 49V, and 49W, the plurality of first wires 91A to 91F, the plurality of second wires 92, the plurality of third wires 93, the plurality of fourth wires 94, the plurality of fifth wires 95, the plurality of sixth wires 96, and the plurality of seventh wires 97. The material of the resin 7 is not specifically limited. Though not specifically limited, for example an insulative material such as an epoxy resin or silicone gel may be employed to form the resin 7.

In this embodiment, the resin 7 includes a first face 71, a second face 72, a third face 73, a fourth face 74, a fifth face 75, a sixth face 76, a recess 731, a recess 732, a recess 733, a hole 741, and a hole 742.

The first face 71 intersects with the z-direction and, in the illustrated example, is perpendicular to the z-direction. The first face 71 is oriented in the same direction as the first face 31 of the substrate 3. The second face 72 intersects with the z-direction and, in the illustrated example, is perpendicular to the z-direction. The second face 72 is oriented in the opposite direction to the first face 71, and in the same direction as the second face 32 of the substrate 3.

The third face 73 is located between the first face 71 and the second face 72 in the z-direction, and connected to the first face 71 and the second face 72, in the illustrated example. The third face 73 intersects with the x-direction, and is oriented in the same direction as the third face 33 of the substrate 3. The fourth face 74 is located between the first face 71 and the second face 72 in the z-direction, and connected to the first face 71 and the second face 72, in the illustrated example. The fourth face 74 intersects with the x-direction, and is oriented in the opposite direction to the third face 73, and in the same direction as the fourth face 34 of the substrate 3.

The fifth face 75 is located between the first face 71 and the second face 72 in the z-direction, and connected to the first face 71 and the second face 72, in the illustrated example. The fifth face 75 intersects with the y-direction, and is oriented in the same direction as the fifth face 35 of the substrate 3. The sixth face 76 is located between the first face 71 and the second face 72 in the z-direction, and connected to the first face 71 and the second face 72, in the illustrated example. The sixth face 76 intersects with the y-direction, and is oriented in the opposite direction to the fifth face 75, and in the same direction as the sixth face 36.

The hole 741 is formed so as to penetrate through the resin 7, in the z-direction. The shape of the hole 741 is not specifically limited and, in the illustrated example, a circular shape as viewed in the z-direction. The hole 741 is located between the third face 33 of the substrate 3 and the third face 73, as viewed in the z-direction.

The hole 742 is formed so as to penetrate through the resin 7, in the z-direction. The shape of the hole 742 is not specifically limited and, in the illustrated example, a circular shape as viewed in the z-direction. The hole 742 is located between the fourth face 34 of the substrate 3 and the fourth face 74, as viewed in the z-direction.

As shown in FIG. 36 and FIG. 39, the recess 731, the recess 732, and the recess 733 are portions receding from the fifth face 75 in the y-direction. The recess 731 is located between the second portion 22B of the lead 2B and the second portion 22C of the lead 2C, as viewed in the y-direction. The recess 732 is located between the second portion 22D of the lead 2D and the second portion 22E of the lead 2E, as viewed in the y-direction. The recess 733 is located between the second portion 22F of the lead 2F and the second portion 22G of the lead 2G, as viewed in the y-direction.

<Circuit Configuration of Semiconductor Device A2>

Hereunder, a circuit configuration of the semiconductor device A2 will be described.

FIG. 49 illustrates an example of a control circuit 600Y for driving a switching arm 40U of the semiconductor device A2. The semiconductor device A2 includes a control circuit similar to the control circuit 600Y, also for each of the switching arms 40V and 40W. The control circuit 600Y of the semiconductor device A2 may be modified in various manners, without limitation to the configuration shown in FIG. 49.

A voltage level applied to the U terminal (lead 1B), the V terminal (lead 1C), and the W terminal (lead 1D) is, for example, approximately 0 V to 650 V. A voltage level applied to the NU terminal (lead 1E), the NV terminal (lead 1F), and the NW terminal (lead 1G) is, for example, approximately 0V, and lower than the voltage level applied to the terminal (lead 1B), the V terminal (lead 1C), and the W terminal (lead 1D). The semiconductor chips 4A to 4C each constitute a high-potential side transistor of a three-phase inverter circuit, and the semiconductor chips 4D to 4F each constitute a low-potential side transistor of the three-phase inverter circuit.

As shown in FIG. 49, the control circuit 600Y includes a primary-side circuit 660, a secondary-side circuit 670, and a transformer 690. The control circuit 600Y utilizes the transformer 690 to insulate between the primary-side circuit 660 and the secondary-side circuit 670, transmit signals from the primary-side circuit 660 to the secondary-side circuit 670, and transmit signals from the secondary-side circuit 670 to the primary-side circuit 660.

In this embodiment, the primary-side circuit 660 is included in the primary-side circuit chip 4J. At least a part of the secondary-side circuit 670 is included in the control chip 4H and the control chip 4G. The transformer 690 is included in the transmission circuit chip 4I.

The primary-side circuit 660 includes an under voltage lock out circuit 661, an oscillation (CSC) circuit 662, a signal transmission circuit 660U connected to the HINU terminal (lead 2I), a signal transmission circuit 660L connected to the LINU terminal (lead 2L), and a fault protection circuit 660F connected to the FO terminal (lead 2P).

The signal transmission circuit 660U serves to supply a gate signal voltage to the gate electrode GP of the semiconductor chip 4A, and includes a resistance 663U, a Schmitt trigger 664U, a pulse generator 665U, and output buffers 667UA and 667UB, in this order from the HINU terminal toward the transformer 690. The resistance 663U and the Schmitt trigger 664U correspond to the resistance 461 and the Schmitt trigger 462 of the semiconductor device A1. The output terminal of the Schmitt trigger 664U is connected to the pulse generator 665U. The first output terminal of the pulse generator 665U is connected to the output buffer 667UA, and the second output terminal of the pulse generator 665U is connected to the output buffer 667UB.

The signal transmission circuit 660L serves to supply a gate signal voltage to the gate of the semiconductor chip 4D, and includes a resistance 663L, a Schmitt trigger 664L, a pulse generator 665L, and output buffers 667LA and 667LB, in this order from the LINU terminal toward the transformer 690. The resistance 663L and the Schmitt trigger 664L correspond to the resistance 471 and the Schmitt trigger 472 of the semiconductor device A1. The output terminal of the Schmitt trigger 664L is connected to the pulse generator 665L. The first output terminal of the pulse generator 665L is connected to the output buffer 667LA, and the second output terminal of the pulse generator 665L is connected to the output buffer 667LB.

The fault protection circuit 660F serves to output, when a fault occurs in the semiconductor device A2, information regarding the fault in the semiconductor device A2 to outside of the semiconductor device A2, and includes an RS flip-flop circuit 666, input buffers 667FA and 667FB, a driver 668, and a transistor 669.

The output terminal of the input buffer 667FA is connected to the S terminal of the RS flip-flop circuit 666, and the output terminal of the input buffer 667FB is connected to the R terminal of the RS flip-flop circuit 666. The Q terminal of the RS flip-flop circuit 666 is connected to the driver 668. The output terminal of the driver 668 is connected to the gate of the transistor 669. The source of the transistor 669 is grounded, and the drain of the transistor 669 is connected to the FO terminal.

The under voltage lock out circuit 661 monitors the source voltage VCC of the primary-side circuit 660. The under voltage lock out circuit 661 is connected to the set terminal (S terminal) of the RS flip-flop circuit 666. The under voltage lock out circuit 661 switches the lock out signal from the logic level in the normal condition (e.g., low level) to the logic level in an abnormal condition (e.g., high level), when the source voltage VCC of the primary-side circuit 660 falls below a predetermined threshold voltage. The oscillation circuit 662 outputs a clock signal to each of the pulse generators 665U and 665L, the RS flip-flop circuit 666, and the driver 668.

The secondary-side circuit 670 includes an oscillation circuit 671, a signal transmission circuit 670U, a signal transmission circuit 670L, and a fault protection circuit 670F.

The signal transmission circuit 670U serves to supply a gate signal voltage of the signal transmission circuit 660U in the primary-side circuit 660 to the gate of the semiconductor chip 4A. The signal transmission circuit 670U includes input buffers 672UA and 672UB, an RS flip-flop circuit 673U, a pulse generator 674U, a level shifter circuit 675U, an RS flip-flop circuit 676, and a driver 677U, in this order from the transformer 690 to the semiconductor chip 4A. The signal transmission circuit 670U also includes the diode 49U and a current controller 49X that controls the current to the diode 49U. The current controller 49X may be a current limiting resistor.

The output terminal of the input buffer 672UA is connected to the S terminal of the RS flip-flop circuit 673U, and the output terminal of the input buffer 672UB is connected to the R terminal of the RS flip-flop circuit 673U. The Q terminal and the QB terminal of the RS flip-flop circuit 673U is connected to the pulse generator 674U. The pulse generator 674U is connected to the level shifter circuit 675U. The level shifter circuit 675U is configured to input a signal from the Q terminal of the RS flip-flop circuit 673U to the S terminal of the RS flip-flop circuit 673U, and input a signal from the QB terminal of the RS flip-flop circuit 673U to the R terminal of the RS flip-flop circuit 673U. The Q terminal of the RS flip-flop circuit 676U is connected to the driver 677U. The output terminal of the driver 677U is connected to the gate of the semiconductor chip 4A. To the R terminal of the RS flip-flop circuit 676U, the under voltage lock out circuit 678 is connected. The pulse generator 674U, the level shifter circuit 675U, the RS flip-flop circuit 676U, and the driver 677U respectively correspond to the pulse generator 465, the level shifter 466, the RS flip-flop circuit 468, and the driver 469 of the semiconductor device A1.

The signal transmission circuit 670L serves to supply a gate signal voltage of the signal transmission circuit 660L of the primary-side circuit 660, to the gate of the semiconductor chip 4D. The signal transmission circuit 670L includes input buffers 672LA and 672LB, an RS flip-flop circuit 673L, and a driver 677L, in this order from the transformer 690 toward the semiconductor chip 4D.

The output terminal of the input buffer 672LA is connected to the S terminal of the RS flip-flop circuit 673L, and the output terminal of the input buffer 672LB is connected to the R terminal of the RS flip-flop circuit 673L. The Q terminal and the QB terminal of the RS flip-flop circuit 673L are connected to the driver 677L. The driver 677L is connected to the gate of the semiconductor chip 4D.

The fault protection circuit 670F serves to output, when a fault occurs in the semiconductor device A2, information regarding the fault in the semiconductor device A2 to the primary-side circuit 660. The fault protection circuit 670F includes output buffers 672FA and 672FB, a fault signal generation circuit 679, a thermal shut down circuit 680, an under voltage lock out circuit 681, and a current limiting circuit 682. To the fault protection circuit 670F, the VCC terminal (lead 2Q) and the CIN terminal (lead 2S, detection terminal CIN) of the secondary-side circuit 670 are connected.

To the fault signal generation circuit 679, the thermal shut down circuit 680, the under voltage lock out circuit 681, and the current limiting circuit 682 are connected. The first output terminal of the fault signal generation circuit 679 is connected to the output buffer 671FA, and the second output terminal is connected to the output buffer 671FB. To the output buffer 671FB, the R terminals of the RS flip-flop circuits 673U and 673L are connected.

The oscillation circuit 671 outputs the clock signal to each of the RS flip-flop circuits 673U and 673L, and the fault signal generation circuit 679.

The transformer 690 includes transformers 691 to 696. The transformers 691 to 696 each include a primary-side coil and a secondary-side coil.

The first terminal of the primary-side coil of the transformer 691 is connected to the output terminal of the output buffer 667UA, and the second terminal of the primary-side coil of the transformer 691 is grounded. The first terminal of the secondary-side coil of the transformer 691 is connected to the input buffer 672UA, and the second terminal of the secondary-side coil of the transformer 691 is grounded.

The first terminal of the primary-side coil of the transformer 692 is connected to the output terminal of the output buffer 667UB, and the second terminal of the primary-side coil of the transformer 692 is grounded. The first terminal of the secondary-side coil of the transformer 692 is connected to the input buffer 672UB, and the second terminal of the secondary-side coil of the transformer 692 is grounded.

The first terminal of the primary-side coil of the transformer 693 is connected to the output terminal of the output buffer 667LA, and the second terminal of the primary-side coil of the transformer 693 is grounded. The first terminal of the secondary-side coil of the transformer 693 is connected to the input buffer 672LA, and the second terminal of the secondary-side coil of the transformer 693 is grounded.

The first terminal of the primary-side coil of the transformer 694 is connected to the output terminal of the output buffer 667LB, and the second terminal of the primary-side coil of the transformer 694 is grounded. The first terminal of the secondary-side coil of the transformer 694 is connected to the input buffer 672LB, and the second terminal of the secondary-side coil of the transformer 694 is grounded.

The first terminal of the primary-side coil of the transformer 695 is connected to the input buffer 667FA, and the second terminal of the primary-side coil of the transformer 695 is grounded. The first terminal of the secondary-side coil of the transformer 695 is connected to the output terminal of the output buffer 672FA, and the second terminal of the secondary-side coil of the transformer 695 is grounded.

The first terminal of the primary-side coil of the transformer 696 is connected to the input buffer 667FB, and the second terminal of the primary-side coil of the transformer 696 is grounded. The first terminal of the secondary-side coil of the transformer 696 is connected to the output terminal of the output buffer 672FB, and the second terminal of the secondary-side coil of the transformer 696 is grounded.

In this embodiment, the lead 2A may be referred to as a VSU terminal. The lead 2B corresponds to the VBU terminal in the semiconductor device A1. The lead 2C may be referred to as a VSV terminal. The lead 2D corresponds to the VBV terminal in the semiconductor device A1. The lead 2B may be referred to as a VSW terminal. The lead 2F corresponds to the VBW terminal in the semiconductor device A1. The lead 2G corresponds to the first GND terminal in the semiconductor device A1. The lead 2H corresponds to the first VCC terminal in the semiconductor device A1. The lead 2I corresponds to the HINU terminal in the semiconductor device A1. The lead 2J corresponds to the HINV terminal in the semiconductor device A1. The lead 2K corresponds to the HINW terminal in the semiconductor device A1. The lead 2L corresponds to the LINU terminal. The lead 2M corresponds to the LINV terminal in the semiconductor device A1. The lead 2N corresponds to the LINW terminal in the semiconductor device A1. The lead 2O corresponds to the FO terminal. The lead 2P corresponds to the VOT terminal. The lead 2Q may be referred to as a third VCC terminal. The lead 2R may be referred to as a third GND. The lead 2S corresponds to the CIN terminal.

The lead 2T corresponds to the second VCC terminal in the semiconductor device A1. The lead 2U corresponds to the second GND terminal.

As shown in FIG. 50, the semiconductor device A2 is mounted, for example, on the circuit board 91. On the circuit board 91, a control chip 92 is provided. The control chip 92 controls the chips in the semiconductor device A2. The semiconductor device A2 and the control chip 92 are connected to each other, via the wiring pattern formed on the circuit board 91. In the illustrated example, the leads 2I to 2R of the semiconductor device A2 and the control chip 92 are connected to each other.

This embodiment provides the following advantageous effects, in addition to those provided by the semiconductor device A1.

The semiconductor device A2 includes the transformer 690 (transmission circuit chip 4I). Accordingly, in case that the power circuit on the secondary-side, such as the switching arms 40U, 40V, and 40W breaks down, the transformer 690 (transmission circuit chip 4I) prevents the impact of the breaking down from reaching the primary-side circuit 660 (primary-side circuit chip 4J). Therefore, a microcomputer or the like, connected from outside to the primary-side circuit 660 (primary-side circuit chip 4J) or primary-side circuit 660 (primary-side circuit chip 4J), can be protected.

As shown in FIG. 39, the transmission circuit chip 4I is located on the opposite side of the semiconductor chips 4A to 4F in the y-direction, across the control chip 4H. In addition, the primary-side circuit chip 4J is located on the opposite side of the control chip 4H in the y-direction, across the transmission circuit chip 4I. Therefore, the leads 2I to 2R electrically connected to the primary-side circuit 660 (primary-side circuit chip 4J) can be located more distant from the portion electrically connected to the control chip 4H, 4G, in the y-direction.

The leads 2A to 2H and the leads 2S to 2U, electrically connected to the secondary-side circuit 670, are separately located on the respective sides of the leads 2I to 2R electrically connected to the primary-side circuit 660 (primary-side circuit chip 4J), in the x-direction. Such a configuration prevents complication of the wiring paths of the conductive section 5 electrically connected to the leads 2A to 2H and the leads 2S to 2U, unlike the case where the leads 2A to 2H and the leads 2S to 2U are unevenly located only on either side in the x-direction.

As shown in FIG. 44 and FIG. 45, the clearance G28 between the second portion 22H and the second portion 22I is wider than the clearances G21 to G27 and the clearance G29. In addition, the clearance G**2*a* between the second portion 22R and the second portion 22S is wider than the clearance G29 and the clearance G2*b*. Therefore, the primary-side circuit 660 and the secondary-side circuit 670** can be effectively insulated from each other.

As shown in FIG. 39 and FIG. 44, the second portion **52*a* of the wiring 50*a* overlaps with the semiconductor chip 4A, as viewed in the y-direction. Therefore, the second wire 92, connected to the gate electrode GP of the semiconductor chip 4A and the second portion 52*a*, can be shortened. In addition, the second portion 52*b* of the wiring 50*b* overlaps with the semiconductor chip 4A, as viewed in the y-direction. Therefore, the second wire 92, connected to the emitter electrode EP of the semiconductor chip 4A and the second portion 52*b*, can be shortened. Locating thus the second portion 52*b* and the second portion 52*a* so as to overlap as viewed in the x-direction is desirable from the viewpoint of shortening the second wire 92 connected to the emitter electrode EP of the semiconductor chip 4A and the second portion 52*b***.

As shown in FIG. 36, the projection length y21 of the second portions 22I to 22R from the fifth face 75 is longer than the projection length y22 of the second portions 22A to 22H and the second portions 22S to 22U from the fifth face 75, as viewed in the z-direction. Therefore, the leads 2I to 2R electrically connected to the primary-side circuit chip 4J can be insulated from the leads 2A to 2H electrically connected to the control chip 4G, and the leads 2S to 2U electrically connected to the control chip 4H, when the semiconductor device A2 is mounted on the circuit board.

As shown in FIG. 39, the control chip 4G and the semiconductor chip 4B overlap, as viewed in the y-direction. Such a configuration shortens the length of the second wire 92G connected to the semiconductor chip 4B and the control chip 4G, thereby contributing to improving the integration level of the semiconductor device.

As shown in FIG. 39, the control chip 4H overlaps with the semiconductor chip 4E, the transmission circuit chip 4I, and the primary-side circuit chip 4J, as viewed in the y-direction. Such a configuration shortens the length of the wires for connection among the semiconductor chip 4E, the transmission circuit chip 4I, and the primary-side circuit chip 4J, thereby contributing to improving the integration level of the semiconductor device.

As shown in FIG. 39, the control chips 4G and 4H overlap with each other, as viewed in the x-direction. Such a configuration facilitates the semiconductor chips 4A to 4F and the plurality of leads 2 to be arranged along the x-direction, thereby contributing to improving the integration level of the semiconductor device.

As shown in FIG. 39, the number of second wires 92H extending from the control chip 4H toward the semiconductor chips 4D and 4E (leads 1B and 1C) in the y-direction is fewer than the number of third wires 93 extending from the control chip 4H toward the transmission circuit chip 4I. When temperature changes during the manufacturing process, or during the use of the semiconductor device A2, the leads 1A to 1D and the substrate 3 incur thermal expansion. The thermal expansion of the leads 1A to 1D, which are made of a metal, is larger than the thermal expansion of the substrate 3 made of a ceramic. In this embodiment, the control chip 4H and the transmission circuit chip 4I are both located on the substrate 3. In contrast, the semiconductor chips 4D and 4E are located on the lead 1B and the lead 1C. Accordingly, a change in positional relation between the control chip 4H and the semiconductor chips 4D and 4E, caused by the temperature change, is larger than a change in positional relation between the control chip 4H and the transmission circuit chip 4I. Providing a fewer number of second wires 92H, susceptible to stress from the resin 7 originating from the change in positional relation, than the third wires 93 suppresses the impact of the stress to which the second wire 92H may be subjected.

Further, the second wire 92H is connected, as shown in FIG. 40, to the semiconductor chip 4D located on the first portion 11B of the lead 1B, the semiconductor chip 4E located on the first portion 11C of the lead 1C, and the control chip 4H. The third wire 93 is connected to the control chip 4H and the transmission circuit chip 4I, both located on the substrate 3. Accordingly, the third wire 93 is shorter than the second wire 92H. Conversely, the second wire 92H is longer than the third wire 93. Making thus the second wire 92H longer than the third wire 93 prevents disconnection of the second wire 92H, susceptible to the impact of the change in positional relation, even when the change in positional relation takes place owing to a temperature change.

As shown in FIG. 42 and FIG. 43, the third face 123A, the third face 123B, the third face 123C, and the third face 123D are rougher than the second face 122A, the first face 121B, the second face 1223, the first face 121C, the second face 122C, and the first face 121D. With such a configuration, the third face 123A, the third face 123B, the third face 123C, and the third face 123D contributes to improving the adhesion strength between the leads 1A to 1D and the resin 7, and also insulation can be secured between the second face 122A and the first face 121B, the second face 122B and the first face 121C, the second face 122C and the first face 121D, which are opposed to each other.

As shown in FIG. 44, the portion of the first base portion 55 extending from the control chip 4G toward the lead 2 in the y-direction is longer than the portion of the first base portion 55 extending from the control chip 4G toward the lead 1A in the y-direction. As shown in FIG. 45, the portion of the second base portion 56 extending from the control chip 4H toward the lead 2 in the y-direction is longer than the portion of the second base portion 56 extending from the control chip 4H toward the lead 1C in the y-direction. Such a configuration prevents the first base portion 55 and the second base portion 56 from accidentally making an electrical contact with the leads 1A to 1D.

The transmission circuit chip 4I includes the first transmission circuit according to the present disclosure, and is covered with the resin 7. As shown in FIG. 50, the semiconductor device A2 is mounted, for example, on the circuit board 91. In this case, the control chip 92 is located on the circuit board 91, at a position outside the semiconductor device A2. When attempting to secure a physical spacing of the conduction path connecting between the control chip 92 and the semiconductor chips incorporated in the semiconductor device A2, at least a photocoupler can be excluded. Therefore, the size of the circuit board 91 can be reduced.

Third Embodiment

Figure 58:
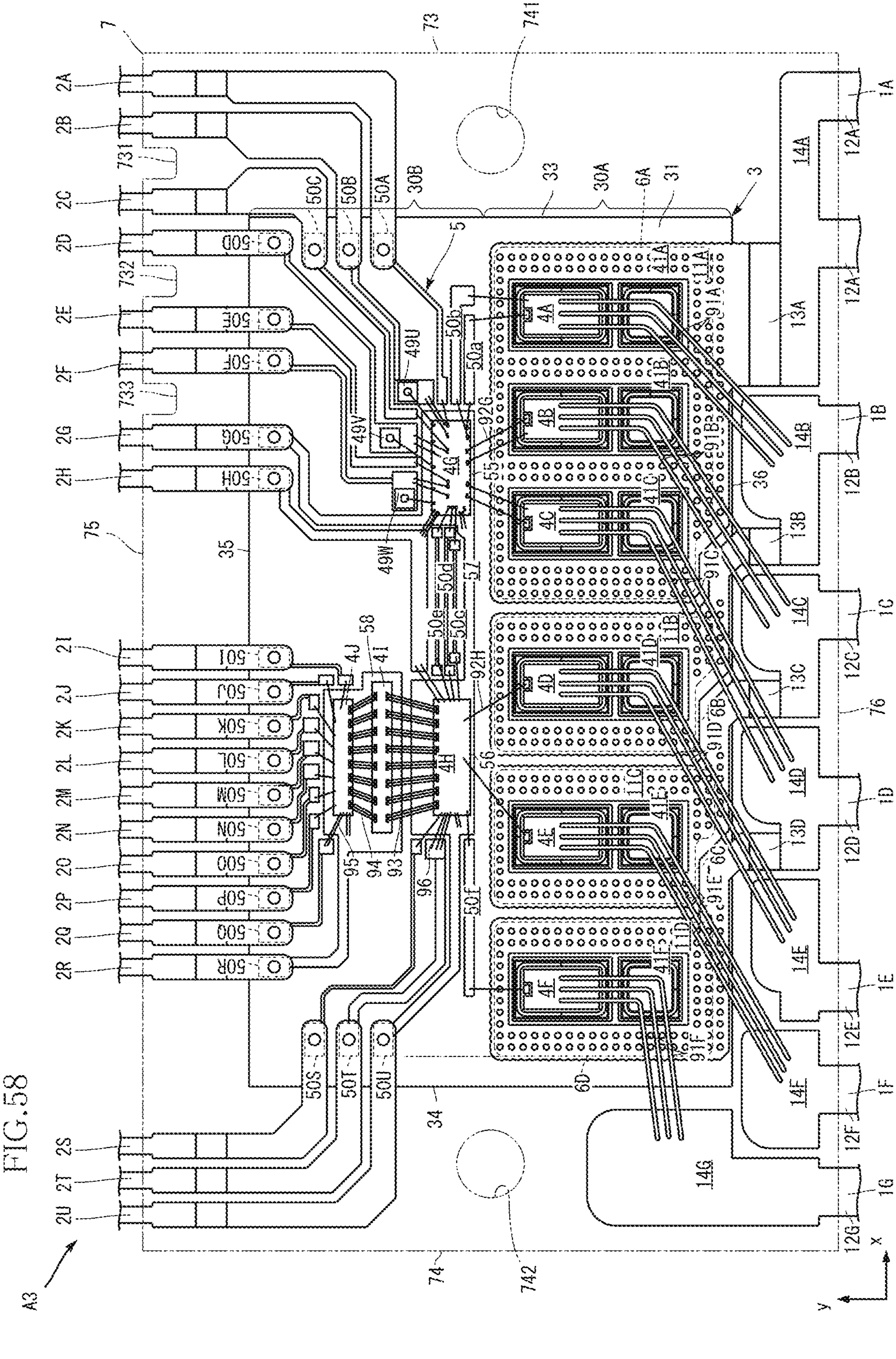
FIG. 58 is a plan view showing a semiconductor device according to a third embodiment of the present disclosure.
Figure 59:
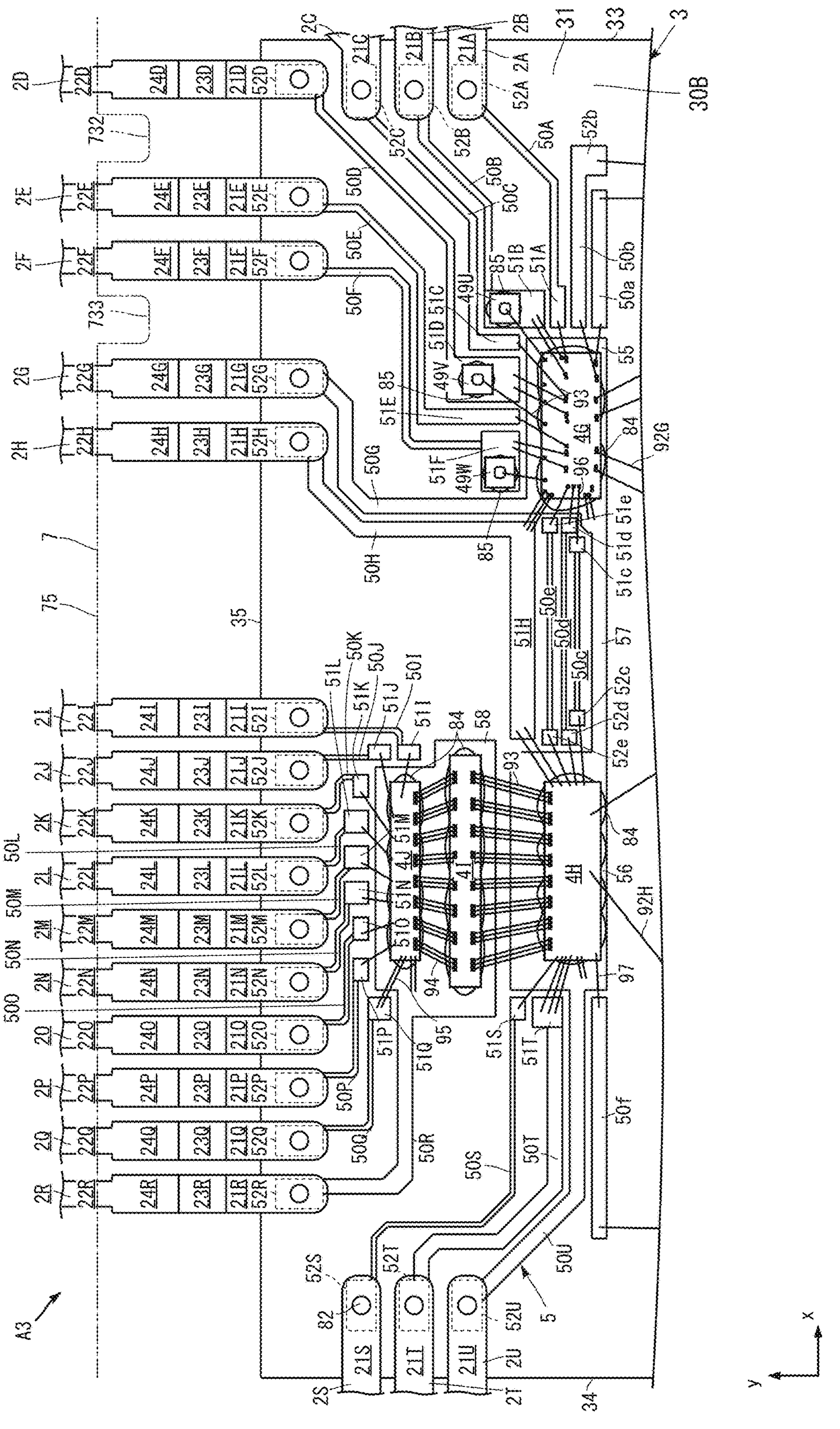
FIG. 59 is an enlarged partial plan view of the semiconductor device according to the third embodiment of the present disclosure.

Referring to FIG. 58 and FIG. 59, a semiconductor device according to a third embodiment of the present disclosure will be described. The semiconductor device A3 according to this embodiment includes a plurality of lead 1, plurality of leads 2, a substrate 3, a plurality of semiconductor chips 4, a diode 41, a plurality of control chips 4, a transmission circuit chip 4I, a primary-side circuit chip 4J, a plurality of diodes 49, a conductive section 5, a plurality of bonding sections 6, a plurality of first wires 91, a plurality of second wires 92, a plurality of third wires 93, a plurality of fourth wires 94, a plurality of fifth wires 95, a plurality of sixth wires 96, plurality of seventh wires 97, and an encapsulating resin 7.

The semiconductor device A3 according to this embodiment includes similar elements to those of the semiconductor device A2 according to the second embodiment. Such elements will be given the same numeral, and a part or the whole of the description thereof may be omitted. Regarding an element on which no specific description is given, a similar configuration to that of the corresponding element of the semiconductor device A2 may be adopted, as appropriate.

FIG. 58 is a plan view showing the semiconductor device A3. FIG. 59 is an enlarged partial plan view of the semiconductor device A3.

<Substrate 3>

The shape, size, and material of the substrate 3 are not specifically limited. The substrate 3 may be configured, for example, similarly to the substrate 3 of the semiconductor device A2.

<Conductive Section 5>

Regarding the conductive section 5 according to this embodiment, although any of the elements is apparently given, for the sake of convenience of description, the same numeral as that of the conductive section 5 according to the first embodiment, it does not necessarily mean that the mentioned element has the same or similar configuration. The configuration of an element with a numeral is defined by the description relevant to this embodiment.

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 58 and FIG. 59, the conductive section 5 includes wirings 50A to 50U, wirings 50*a* to 50*f*, a first base portion 55, a second base portion 56, a connecting portion 57, and a third base portion 58, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The shape of the second base portion 56 is not specifically limited, and a desired shape may be selected from a rectangular shape, a polygonal shape, a circular shape, an elliptical shape, and so forth. In the illustrated example, the second base portion 56 has a rectangular shape. In the illustrated example, the second base portion 56 has an elongate rectangular shape, having the long sides extending along the x-direction.

The second base portion 56 is located on the side of the fourth face 34 with respect to the first base portion 55, in the x-direction. In the illustrated example, the edge of the second base portion 56 on the side of the sixth face 36 in the y-direction is located generally at the same position as the edge of the first base portion 55 on the side of the sixth face 36, in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The connecting portion 57 is interposed between the first base portion 55 and the second base portion 56 and, in the illustrated example, connecting the first base portion 55 and the second base portion 56. In the illustrated example, the connecting portion 57 is located between the first base portion 55 and the second base portion 56, as viewed in the y-direction. The shape of the connecting portion 57 is not specifically limited.

In the illustrated example, the respective edges of the first base portion 55, the second base portion 56, and the connecting portion 57 on the side of the sixth face 36 in the y-direction are located generally at the same position in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The shape of the third base portion 58 is not specifically limited, and a desired shape may be selected from a rectangular shape, a polygonal shape, a circular shape, an elliptical shape, and so forth. The third base portion 58 is located on the side of the fifth face 35 in the y-direction, with respect to the second base portion 56. The third base portion 58 overlaps with the second base portion 56, as viewed in the y-direction.

The wiring 50A includes a first portion 51A and a second portion 52A.

The first portion 51A is located on the side of the third face 33 in the x-direction with respect to the first base portion 55, and spaced therefrom. The shape of the first portion 51A is not specifically limited, and a desired shape may be selected from a rectangular shape, a polygonal shape, a circular shape, an elliptical shape, and so forth. In the illustrated example, the first portion 51A has an elongate strip shape extending along the x-direction. In the illustrated example, in addition, the first portion 51A overlaps with the first base portion 55, as viewed in the x-direction.

The second portion 52A is located on the side of the fifth face 35 in the y-direction, and on the side of the third face 33 in the x-direction, with respect to the first portion 51A. The shape of the second portion 52A is not specifically limited, and a desired shape may be selected from a rectangular shape, a polygonal shape, a circular shape, an elliptical shape, and so forth. In the illustrated example, the first portion 51A has a rectangular shape.

The wiring 50A includes a strip-shaped portion connecting the first portion 51A and the second portion 52A. The strip-shaped portion includes a portion extending from the first portion 51A along the x-direction, and a portion extending obliquely toward the second portion 52A.

The wiring 508 includes a first portion 518 and a second portion 528.

The shape of the first portion 518 is not specifically limited, and a desired shape may be selected from a rectangular shape, a polygonal shape, a circular shape, an elliptical shape, and so forth. The first portion 51B is located on the side of the third face 33 in the x-direction with respect to the first base portion 55, and on the side of the fifth face 35 in the y-direction, with respect to the first portion 51A, and spaced therefrom. In the illustrated example, a part of the first portion 518 overlaps with the first base portion 55 as viewed in the x-direction, and with the first portion 51A, as viewed in the y-direction.

The second portion 52B is located on the side of the fifth face 35 with respect to the first portion 51B, in the y-direction. The second portion 528 overlaps with the second portion 52A, as viewed in the y-direction. The shape of the second portion 528 is not specifically limited, and a desired shape may be selected from a rectangular shape, a polygonal shape, a circular shape, an elliptical shape, and so forth. In the illustrated example, the second portion 52B has a rectangular shape.

The wiring 50B includes a strip-shaped portion connecting the first portion 513 and the second portion 52B. The strip-shaped portion includes a portion extending from the first portion 51B along the x-direction, a portion extending obliquely, and a portion extending along the x-direction toward the second portion 52B.

The wiring 50C includes a first portion 51C and a second portion 52C.

The first portion 51C is located on the side of the fifth face 35 in the y-direction, with respect to the first base portion 55 with a spacing therefrom, and on the side of the fourth face 34 in the x-direction, with respect to the first portion 51B with a spacing therefrom. In the illustrated example, the first portion 51C overlaps with the first base portion 55, as viewed in the y-direction. The shape of the first portion 51C is not specifically limited. In the illustrated example, the first portion 51C has a strip shape extending along the y-direction.

The second portion 52C is located on the side of the fifth face 35 with respect to the first portion 51C, in the y-direction. The second portion 52C overlaps with the second portion 52A and the second portion 52B, as viewed in the y-direction. The shape of the second portion 52C is not specifically limited, and a desired shape may be selected from a rectangular shape, a polygonal shape, a circular shape, an elliptical shape, and so forth. In the illustrated example, the second portion 52C has a rectangular shape.

The wiring 50C includes a strip-shaped portion connecting the first portion 51C and the second portion 52C. The strip-shaped portion includes a portion extending from the first portion 51C along the x-direction, and a portion extending obliquely toward the second portion 52C.

The wiring 50D includes a first portion 51D and a second portion 52D.

The shape of the first portion 51D is not specifically limited, and a desired shape may be selected from a rectangular shape, a polygonal shape, a circular shape, an elliptical shape, and so forth. In the illustrated example, the first portion 51D has a rectangular shape. The first portion 51D is located on the side of the fifth face 35 in the y-direction, with respect to the first base portion 55, and spaced therefrom. The first portion 51D is located on the side of the fourth face 34 in the x-direction with respect to the first portion 51C, and spaced therefrom. In addition, in the illustrated example, the first portion 51D overlaps with the first portion 51C as viewed in the x-direction, and with the first base portion 55 as viewed in the y-direction.

The second portion 52D is located on the side of the fifth face 35 with respect to the first portion 51D, in the y-direction. The second portion 52D is located on the side of the fifth face 35 in the y-direction with respect to the second portion 52C, and spaced therefrom. The second portion 52D overlaps with the second portion 52A, the second portion 52B, and the second portion 52C, as viewed in the y-direction. The shape of the second portion 52D is not specifically limited, and a desired shape may be selected from a rectangular shape, a polygonal shape, a circular shape, an elliptical shape, and so forth. In the illustrated example, the second portion 52E has a rectangular shape.

The wiring 50D includes a strip-shaped portion connecting the first portion 51D and the second portion 52D. The strip-shaped portion includes a portion extending from the first portion 51D along the x-direction, a portion extending obliquely, and a portion extending along the x-direction toward the second portion 52D.

The wiring 50E includes a first portion 51E and a second portion 52E.

The first portion 51E is located on the side of the fifth face 35 in the y-direction, with respect to the first base portion 55 with a spacing therefrom, and on the side of the fourth face 34 in the x-direction, with respect to the first portion 51D with a spacing therefrom. In the illustrated example, the first portion 51E overlaps with the first base portion 55, as viewed in the y-direction. The shape of the first portion 51E is not specifically limited. In the illustrated example, the first portion 51E has a strip shape extending along the y-direction.

The second portion 52E is located on the side of the fifth face 35 with respect to the first portion 51E, in the y-direction. The second portion 52E is located on the side of the fourth face 34 with respect to the second portion 52D, in the x-direction. The shape of the second portion 52E is not specifically limited, and a desired shape may be selected from a rectangular shape, a polygonal shape, a circular shape, an elliptical shape, and so forth. In the illustrated example, the second portion 52B has a rectangular shape.

The wiring 50E includes a strip-shaped portion connecting the first portion 51E and the second portion 52E. The strip-shaped portion includes a portion extending from the first portion 51E along the x-direction, a portion extending obliquely, and a portion extending along the y-direction toward the second portion 52E.

The wiring 50F includes a first portion 51F and a second portion 52F.

The shape of the first portion 51F is not specifically limited, and a desired shape may be selected from a rectangular shape, a polygonal shape, a circular shape, an elliptical shape, and so forth. The first portion 51F is located on the side of the fifth face 35 in the y-direction, with respect to the first base portion 55, and spaced therefrom. The first portion 51F is located on the side of the fourth face 34 in the x-direction with respect to the first portion 51E, and spaced therefrom. In the illustrated example, the first portion 51F overlaps with the first portion 51E as viewed in the x-direction, and with the first base portion 55 as viewed in the y-direction.

The second portion 52F is located on the side of the fifth face 35 with respect to the first portion 51F, in the y-direction. The second portion 52F is located on the side of the fourth face 34 in the x-direction with respect to the second portion 52E, and spaced therefrom. The second portion 52F overlaps with the second portion 52E, as viewed in the x-direction. The shape of the second portion 52F is not specifically limited, and a desired shape may be selected from a rectangular shape, a polygonal shape, a circular shape, an elliptical shape, and so forth. In the illustrated example, the second portion 52F has a rectangular shape.

The wiring 50F includes a strip-shaped portion connecting the first portion 51F and the second portion 52F. The strip-shaped portion includes a portion extending from the first portion 51F along the y-direction, a portion extending along the x-direction, and a portion extending along the y-direction toward the second portion 52F.

The wiring 50G includes a second portion 52G.

The second portion 52G is located on the side of the fifth face 35 with respect to the first base portion 55, in the y-direction. The second portion 52G is located on the side of the fourth face 34 in the x-direction with respect to the second portion 52F, and spaced therefrom. The second portion 52G overlaps with the second portion 52F, as viewed in the x-direction. The second portion 52G overlaps with the first base portion 55, as viewed in the y-direction. The shape of the second portion 52G is not specifically limited, and a desired shape may be selected from a rectangular shape, a polygonal shape, a circular shape, an elliptical shape, and so forth. In the illustrated example, the second portion 52G has a rectangular shape.

The wiring 50G includes a strip-shaped portion connecting the second portion 52G and the first base portion 55. The strip-shaped portion includes a portion extending from the first base portion 55 along the y-direction, a portion extending obliquely, a portion extending along the x-direction, and a portion extending obliquely toward the second portion 52G.

The wiring 50H includes a first portion 51H and a second portion 52H.

The first portion 51H is located between the first base portion 55 and the second base portion 56, as viewed in the y-direction. In the illustrated example, a part of the first portion 51H overlaps with the first base portion 55 and the second base portion 56, as viewed in the x-direction. The shape of the first portion 51H is not specifically limited. In the illustrated example, the first portion 51H has a strip shape extending in the x-direction.

The second portion 52H is located on the side of the fifth face 35 in the y-direction, and on the side of the third face 33 in the x-direction, with respect to the first portion 51H. The second portion 52H is located on the side of the fourth face 34 in the x-direction with respect to the second portion 52G. The second portion 52H overlaps with the second portion 52G, as viewed in the x-direction. The shape of the second portion 52H is not specifically limited, and a desired shape may be selected from a rectangular shape, a polygonal shape, a circular shape, an elliptical shape, and so forth. In the illustrated example, the second portion 52H has a rectangular shape.

The wiring 50H includes a strip-shaped portion connecting the first portion 51H and the second portion 52H. The strip-shaped portion includes a portion extending from the first portion 51H along the y-direction, a portion extending obliquely, and a portion extending along the x-direction toward the second portion 52H.

The wiring 50I includes a first portion 51I and a second portion 52I.

The first portion 51I is located on the side of the third face 33 in the x-direction with respect to the third base portion 58, and spaced therefrom. In the illustrated example, the first portion 51I overlaps with the third base portion 58, as viewed in the x-direction. The shape of the first portion 51I is not specifically limited. In the illustrated example, the first portion 51I has a rectangular shape.

The second portion 52I is located on the side of the fifth face 35 with respect to the first portion 51I, in the y-direction. The second portion 52I is located on the side of the fourth face 34 in the x-direction with respect to the second portion 52H, and spaced therefrom. The second portion 52I is spaced apart from the third base portion 58, as viewed in the y-direction. The second portion 52I overlaps with the second portion 52H, as viewed in the x-direction. The shape of the second portion 52I is not specifically limited, and a desired shape may be selected from a rectangular shape, a polygonal shape, a circular shape, an elliptical shape, and so forth. In the illustrated example, the second portion 52I has a rectangular shape.

The wiring 50I includes a strip-shaped portion connecting the first portion 51I and the second portion 52I. The strip-shaped portion includes a portion extending from the first portion 51I along the x-direction, a portion extending obliquely, and a portion extending along the y-direction toward the second portion 52I.

The wiring 50J includes a first portion 51J and a second portion 52J.

The first portion 51J is located on the side of the third face 33 in the x-direction with respect to the third base portion 58, and spaced therefrom. In the illustrated example, the first portion 51J overlaps with the third base portion 58, as viewed in the x-direction. The first portion 51J is located on the side of the fourth face 34 in the x-direction with respect to the first portion 51I, and spaced therefrom. The first portion 51J overlaps with the first portion 51I, as viewed in the y-direction. The shape of the first portion 51J is not specifically limited. In the illustrated example, the first portion 51J has a rectangular shape.

The second portion 52J is located on the side of the fifth face 35 with respect to the first portion 51J, in the y-direction. The second portion 52J is located on the side of the fourth face 34 in the x-direction with respect to the second portion 52I, and spaced therefrom. The second portion 52J overlaps with the second portion 52I, as viewed in the x-direction. The shape of the second portion 52J is not specifically limited, and a desired shape may be selected from a rectangular shape, a polygonal shape, a circular shape, an elliptical shape, and so forth. In the illustrated example, the second portion 52J has a rectangular shape.

The wiring 50J includes a strip-shaped portion connecting the first portion 51J and the second portion 52J. The strip-shaped portion includes a portion extending from the first portion 51J along the y-direction, toward the second portion 52J.

The wiring 50K includes a first portion 51K and a second portion 52K.

The first portion 51K is located on the side of the fifth face 35 in the y-direction with respect to the third base portion 58, and spaced therefrom. In the illustrated example, the first portion 51K overlaps with the third base portion 58, as viewed in the y-direction. The first portion 51K is located on the side of the fourth face 34 in the x-direction with respect to the first portion 51J, and spaced therefrom. The shape of the first portion 51K is not specifically limited. In the illustrated example, the first portion 51K has a rectangular shape.

The second portion 52K is located on the side of the fifth face 35 with respect to the first portion 51K, in the y-direction. The second portion 52K is located on the side of the fourth face 34 in the x-direction with respect to the second portion 52J, and spaced therefrom. The second portion 52K overlaps with the third base portion 58, as viewed in the y-direction. The second portion 52K overlaps with the second portion 52J, as viewed in the x-direction. The shape of the second portion 52K is not specifically limited, and a desired shape may be selected from a rectangular shape, a polygonal shape, a circular shape, an elliptical shape, and so forth. In the illustrated example, the second portion 52K has a rectangular shape.

The wiring 50K includes a strip-shaped portion connecting the first portion 51K and the second portion 52K. The strip-shaped portion includes a portion extending from the first portion 51K along the y-direction, a portion extending along the x-direction, and a portion extending along the y-direction toward the second portion 52K.

The wiring 50L includes a first portion 51L and a second portion 52L.

The first portion 51L is located on the side of the fifth face 35 in the y-direction with respect to the third base portion 58, and spaced therefrom. In the illustrated example, the first portion 51L overlaps with the third base portion 58, as viewed in the y-direction. The first portion 51L is located on the side of the fourth face 34 in the x-direction with respect to the first portion 51K, and spaced therefrom. The first portion 51L overlaps with the first portion 51K, as viewed in the x-direction. The shape of the first portion 51L is not specifically limited. In the illustrated example, the first portion 51L has a rectangular shape.

The second portion 52L is located on the side of the fifth face 35 with respect to the first portion 51L, in the y-direction. The second portion 52L is located on the side of the fourth face 34 in the x-direction with respect to the second portion 52K, and spaced therefrom. The second portion 52L overlaps with the third base portion 58, as viewed in the y-direction. The second portion 52L overlaps with the second portion 52K, as viewed in the x-direction. The shape of the second portion 52L is not specifically limited, and a desired shape may be selected from a rectangular shape, a polygonal shape, a circular shape, an elliptical shape, and so forth. In the illustrated example, the second portion 52L has a rectangular shape.

The wiring 50L includes a strip-shaped portion connecting the first portion 51L and the second portion 52L. The strip-shaped portion includes a portion extending obliquely from the first portion 51L, a portion extending along the x-direction, and a portion extending along the y-direction toward the second portion 52L.

The wiring 50M includes a first portion 51M and a second portion 52M.

The first portion 51M is located on the side of the fifth face 35 in the y-direction with respect to the third base portion 58, and spaced therefrom. In the illustrated example, the first portion 51M overlaps with the third base portion 58, as viewed in the y-direction. The first portion 51M is located on the side of the fourth face 34 in the x-direction with respect to the first portion 51L, and spaced therefrom. The first portion 51M overlaps with the first portion 51L, as viewed in the x-direction. The shape of the first portion 51M is not specifically limited. In the illustrated example, the first portion 51M has a rectangular shape.

The second portion 52M is located on the side of the fifth face 35 with respect to the first portion 51M, in the y-direction. The second portion 52M is located on the side of the fourth face 34 in the x-direction with respect to the second portion 52L, and spaced therefrom. The second portion 52M overlaps with the third base portion 58, as viewed in the y-direction. The second portion 52M overlaps with the second portion 52L, as viewed in the x-direction. The shape of the second portion 52M is not specifically limited, and a desired shape may be selected from a rectangular shape, a polygonal shape, a circular shape, an elliptical shape, and so forth. In the illustrated example, the second portion 52M has a rectangular shape.

The wiring 50M includes a strip-shaped portion connecting the first portion 51M and the second portion 52M. The strip-shaped portion includes a portion extending obliquely from the first portion 51M, a portion extending along the x-direction, and a portion extending along the y-direction toward the second portion 52M.

The wiring 50N includes a first portion 51N and a second portion 52N.

The first portion 51N is located on the side of the fifth face 35 in the y-direction with respect to the third base portion 58, and spaced therefrom. In the illustrated example, the first portion 51N overlaps with the third base portion 58, as viewed in the y-direction. The first portion 51N is located on the side of the fourth face 34 in the x-direction with respect to the first portion 51M, and spaced therefrom. The first portion 51N overlaps with the first portion 51M, as viewed in the x-direction. The shape of the first portion 51N is not specifically limited. In the illustrated example, the first portion 51N has a rectangular shape.

The second portion 52N is located on the side of the fifth face 35 with respect to the first portion 51N, in the y-direction. The second portion 52N is located on the side of the fourth face 34 in the x-direction with respect to the second portion 52M, and spaced therefrom. The second portion 52N overlaps with the third base portion 58, as viewed in the y-direction. The second portion 52N overlaps with the second portion 52M, as viewed in the x-direction. The shape of the second portion 52N is not specifically limited, and a desired shape may be selected from a rectangular shape, a polygonal shape, a circular shape, an elliptical shape, and so forth. In the illustrated example, the second portion 52N has a rectangular shape.

The wiring 50N includes a strip-shaped portion connecting the first portion 51N and the second portion 52N. The strip-shaped portion includes a portion extending from the first portion 51N along the x-direction, a portion extending obliquely, and a portion extending along the y-direction toward the second portion 52N.

The wiring 50O includes a first portion 51O and a second portion 52O.

The first portion 51O is located on the side of the fifth face 35 in the y-direction with respect to the third base portion 58, and spaced therefrom. In the illustrated example, the first portion 51O overlaps with the third base portion 58, as viewed in the y-direction. The first portion 51O is located on the side of the fourth face 34 in the x-direction with respect to the first portion 51N, and spaced therefrom. The first portion 51O overlaps with the first portion 51N, as viewed in the x-direction. The shape of the first portion 51O is not specifically limited. In the illustrated example, the first portion 51O has a rectangular shape.

The second portion 52O is located on the side of the fifth face 35 with respect to the first portion 51O, in the y-direction. The second portion 52O is located on the side of the fourth face 34 in the x-direction with respect to the second portion 52N, and spaced therefrom. The second portion 52O overlaps with the second portion 52N, as viewed in the x-direction. The shape of the second portion 52O is not specifically limited, and a desired shape may be selected from a rectangular shape, a polygonal shape, a circular shape, an elliptical shape, and so forth. In the illustrated example, the second portion 52O has a rectangular shape.

The wiring 50O includes a strip-shaped portion connecting the first portion 51O and the second portion 52O. The strip-shaped portion includes a portion extending obliquely from the first portion 51O, a portion extending along the x-direction, and a portion extending along the y-direction toward the second portion 52O.

The wiring 50P includes a first portion 51P and a second portion 52P.

The first portion 51P is located on the side of the fifth face 35 in the y-direction with respect to the third base portion 58, and spaced therefrom. In the illustrated example, the first portion 51P overlaps with the third base portion 58, as viewed in the y-direction. The first portion 51P is located on the side of the fourth face 34 in the x-direction with respect to the first portion 51O, and spaced therefrom. The first portion 51P overlaps with the first portion 51O, as viewed in the x-direction. The shape of the first portion 51P is not specifically limited. In the illustrated example, the first portion 51P has a rectangular shape.

The second portion 52P is located on the side of the fifth face 35 with respect to the first portion 51P, in the y-direction. The second portion 52P is located on the side of the fourth face 34 in the x-direction with respect to the second portion 52O, and spaced therefrom. The second portion 52P is spaced apart from the third base portion 58, as viewed in the y-direction. The second portion 52P overlaps with the second portion 52O, as viewed in the x-direction. The shape of the second portion 52P is not specifically limited, and a desired shape may be selected from a rectangular shape, a polygonal shape, a circular shape, an elliptical shape, and so forth. In the illustrated example, the second portion 52P has a rectangular shape.

The wiring 50P includes a strip-shaped portion connecting the first portion 51P and the second portion 52P. The strip-shaped portion includes a portion extending from the first portion 51P along the x-direction, and a portion extending along the y-direction toward the second portion 52P.

The wiring 50Q includes a first portion 51Q and a second portion 52Q.

The first portion 51Q is located on the side of the fourth face 34 in the x-direction, with respect to the third base portion 58. The first portion 51Q overlaps with a part of the third base portion 58, as viewed in the x-direction. The first portion 51Q overlaps with a part of the third base portion 58, as viewed in the y-direction. The shape of the first portion 51Q is not specifically limited. In the illustrated example, the first portion 51Q has a rectangular shape.

The second portion 52Q is located on the side of the fifth face 35 with respect to the first portion 51Q, in the y-direction. The second portion 52Q is located on the side of the fourth face 34 in the x-direction with respect to the second portion 52P, and spaced therefrom. The second portion 52Q is spaced apart from the third base portion 58, as viewed in the y-direction. The second portion 52Q overlaps with the second portion 52P, as viewed in the x-direction. The shape of the second portion 52Q is not specifically limited, and a desired shape may be selected from a rectangular shape, a polygonal shape, a circular shape, an elliptical shape, and so forth. In the illustrated example, the second portion 52Q has a rectangular shape.

The wiring 50Q includes a strip-shaped portion connecting the first portion 51Q and the second portion 52Q. The strip-shaped portion includes a portion extending from the first portion 51Q along the x-direction, and a portion extending along the y-direction toward the second portion 52Q.

The wiring 50R includes a first portion 51R and a second portion 52R.

The second portion 52R is located on the side of the fifth face 35 with respect to the third base portion 58, in the y-direction. The second portion 52R is located on the side of the fourth face 34 in the x-direction with respect to the second portion 52Q, and spaced therefrom. The second portion 52R is spaced apart from the third base portion 58, as viewed in the y-direction. The second portion 52R overlaps with the second portion 52Q, as viewed in the x-direction. The shape of the second portion 52R is not specifically limited, and a desired shape may be selected from a rectangular shape, a polygonal shape, a circular shape, an elliptical shape, and so forth. In the illustrated example, the second portion 52R has a rectangular shape.

The wiring 50R includes a strip-shaped portion connecting the third base portion 58 and the second portion 52R. The strip-shaped portion includes a portion extending from the third base portion 58 along the x-direction, and a portion extending along the y-direction toward the second portion 52R.

The wiring 50S includes a first portion 51S and a second portion 52S.

The first portion 51S is located on the side of the sixth face 36 in the y-direction, with respect to the third base portion 58, and spaced therefrom. The first portion 51S overlaps with the third base portion 58, as viewed in the y-direction. The first portion 51S is located on the side of the fourth face 34 in the x-direction, with respect to the second base portion 56. The first portion 51S overlaps with the second base portion 56, as viewed in the x-direction. The shape of the first portion 51S is not specifically limited. In the illustrated example, the first portion 51S has a rectangular shape.

The second portion 52S is located on the side of the fifth face 35 with respect to the first portion 51S, in the y-direction. The second portion 52S is located on the side of the fourth face 34 in the x-direction with respect to the second portion 52R, and spaced therefrom. The second portion 52S is spaced apart from the second base portion 56 and the third base portion 58, as viewed in the y-direction. The second portion 52S is spaced apart from the second portion 52R, as viewed in the x-direction. The shape of the second portion 52S is not specifically limited, and a desired shape may be selected from a rectangular shape, a polygonal shape, a circular shape, an elliptical shape, and so forth. In the illustrated example, the second portion 52S has a rectangular shape.

The wiring 50S includes a strip-shaped portion connecting the first portion 51S and the second portion 52S. The strip-shaped portion includes a portion extending from the first portion 51S along the x-direction, a portion extending obliquely, a portion extending along the y-direction, a portion extending obliquely, and a portion extending along the x-direction toward the second portion 52S.

The wiring 50T includes a first portion 51T and a second portion 52T.

The first portion 51T is located on the side of the fourth face 34 in the x-direction, with respect to the second base portion 56, and spaced therefrom. The first portion 51T is located on the side of the sixth face 36 in the y-direction, with respect to the first portion 51S, and spaced therefrom. In the illustrated example, the first portion 51T overlaps with the first portion 51S, as viewed in the y-direction. The first portion 51T overlaps with the second base portion 56, as viewed in the x-direction. The shape of the first portion 51T is not specifically limited. In the illustrated example, the first portion 51T has a rectangular shape.

The second portion 52T is located on the side of the fifth face 35 with respect to the first portion 51T, in the y-direction. The second portion 52T is located on the side of the sixth face 36 in the y-direction with respect to the second portion 52S, and spaced therefrom. The second portion 52T is spaced apart from the third base portion 58, as viewed in the y-direction. The second portion 52T overlaps with the second portion 52S, as viewed in the y-direction. The shape of the second portion 52T is not specifically limited, and a desired shape may be selected from a rectangular shape, a polygonal shape, a circular shape, an elliptical shape, and so forth. In the illustrated example, the second portion 52T has a rectangular shape.

The wiring 50T includes a strip-shaped portion connecting the first portion 51T and the second portion 52T. The strip-shaped portion includes a portion extending from the first portion 51T along the x-direction, a portion extending obliquely, a portion extending along the y-direction, a portion extending obliquely, and a portion extending along the x-direction toward the second portion 52T.

The wiring 50U includes a first portion 51U and a second portion 52U.

The second portion 52U is located on the side of the fifth face 35 with respect to the second base portion 56, in the y-direction. The second portion 52U is located on the side of the sixth face 36 in the y-direction with respect to the second portion 52T, and spaced therefrom. The second portion 52U is spaced apart from the third base portion 58, as viewed in the y-direction. The second portion 52U overlaps with the second portion 52T, as viewed in the y-direction. The shape of the second portion 52U is not specifically limited, and a desired shape may be selected from a rectangular shape, a polygonal shape, a circular shape, an elliptical shape, and so forth. In the illustrated example, the second portion 52U has a rectangular shape.

The wiring 50U includes a strip-shaped portion connecting the second base portion 56 and the second portion 52U. The strip-shaped portion includes a portion extending from the second base portion 56 along the x-direction, and a portion extending obliquely toward the second portion 52U.

The wiring 50*a* is located on the side of the third face 33 in the x-direction with respect to the first base portion 55, and spaced therefrom. The wiring 50*a* is located on the side of the sixth face 36 in the y-direction with respect to the first portion 51A, and spaced therefrom. In the illustrated example, the wiring 50*a* overlaps with the first portion 51A and the first portion 51B, as viewed in the y-direction. The wiring 50*a* overlaps with the first base portion 55, as viewed in the x-direction. The shape of the wiring 50*a* is not specifically limited. In the illustrated example, the wiring 50*a* has a strip shape extending along the x-direction.

The wiring 50*b* includes a second portion 52*b*.

The second portion 52*b* is located on the side of the third face 33 in the x-direction with respect to the first base portion 55 and the wiring 50*a*, and spaced apart from the first base portion 55 and the wiring 50*a*. The second portion 52*b* overlaps with the wiring 50*a*, as viewed in the x-direction. The shape of the second portion 52*b* is not specifically limited, and a desired shape may be selected from a rectangular shape, a polygonal shape, a circular shape, an elliptical shape, and so forth. In the illustrated example, the second portion 52*b* has a rectangular shape.

The wiring 50*b* includes a strip-shaped portion extending from the second portion 52*b* along the x-direction, toward the first base portion 55.

The wiring 50*c* includes a first portion 51*c* and a second portion 52*c*.

The first portion 51*c* is located on the side of the fourth face 34 in the x-direction with respect to the first base portion 55, and spaced therefrom. The first portion 51*c* is located between the connecting portion 57 and the first portion 51H, in the y-direction. The first portion 51*c* overlaps with the first base portion 55, as viewed in the x-direction. The shape of the first portion 51*c* is not specifically limited. In the illustrated example, the first portion 51*c* has a rectangular shape.

The second portion 52*c* is located on the side of the fourth face 34 in the x-direction with respect to the first portion 51*c*, with a spacing therefrom, and on the side of the third face 33 in the x-direction with respect to the second base portion 56, with a spacing therefrom. The second portion 52*c* overlaps with the second base portion 56, as viewed in the x-direction. The shape of the second portion 52*c* is not specifically limited, and a desired shape may be selected from a rectangular shape, a polygonal shape, a circular shape, an elliptical shape, and so forth. In the illustrated example, the second portion 52*c* has a rectangular shape.

The wiring 50*c* includes a strip-shaped portion connecting the first portion 51*c* and the second portion 52*c*. The strip-shaped portion extends along the x-direction.

The wiring 50*d* includes a first portion 51*d* and a second portion 52*d*.

The first portion 51*d* is located on the side of the fourth face 34 in the x-direction with respect to the first base portion 55, with a spacing therefrom, and on the side of the fourth face 34 with respect to the first portion 51*c*, with a spacing therefrom. The first portion 51*d* is located between the connecting portion 57 and the first portion 51H in the y-direction, at a position shifted toward the fifth face 35 from the first portion 51*c*. In the illustrated example, the first portion 51*d* overlaps with the connecting portion 57, as viewed in the y-direction. The first portion 51*d* overlaps with the first base portion 55 and the first portion 51*c*, as viewed in the x-direction. The shape of the first portion 51*d* is not specifically limited. In the illustrated example, the first portion 51*d* has a rectangular shape.

The second portion 52*d* is located on the side of the fourth face 34 in the x-direction with respect to the first portion 51*d*, with a spacing therefrom, and on the side of the third face 33 in the x-direction with respect to the second base portion 56, with a spacing therefrom. The second portion 52*d* is located at a position shifted toward the fourth face 34 in the x-direction, from the second portion 52*c*. The second portion 52*d* overlaps with the second base portion 56, as viewed in the x-direction. The second portion 52*d* overlaps with the connecting portion 57, as viewed in the y-direction. The shape of the second portion 52*d* is not specifically limited, and a desired shape may be selected from a rectangular shape, a polygonal shape, a circular shape, an elliptical shape, and so forth. In the illustrated example, the second portion 52*d* has a rectangular shape.

The wiring 50*d* includes a strip-shaped portion connecting the first portion 51*d* and the second portion 52*d*. The strip-shaped portion extends along the x-direction.

The wiring 50*e* includes a first portion 51*e* and a second portion 52*e*.

The first portion 51*e* is located on the side of the fourth face 34 in the x-direction with respect to the first base portion 55, and spaced therefrom. The first portion 51*e* is located between the connecting portion 57 and the first portion 51H in the y-direction, at a position shifted toward the fifth face 35 from the first portion 51*d*. In the illustrated example, the first portion 51*e* overlaps with the connecting portion 57, as viewed in the y-direction. The first portion 51*e* overlaps with the first base portion 55 and the first portion 51*d*, as viewed in the x-direction. The shape of the first portion 51*e* is not specifically limited. In the illustrated example, the first portion 51*e* has a rectangular shape.

The second portion 52*e* is located on the side of the fourth face 34 in the x-direction with respect to the first portion 51*e*, with a spacing therefrom, and on the side of the third face 33 in the x-direction with respect to the second base portion 56, with a spacing therefrom. The second portion 52*e* is located at a position shifted toward the fourth face 34 in the x-direction, from the second portion 52*d*. The second portion 52*e* overlaps with the second base portion 56, as viewed in the x-direction. The second portion 52*e* overlaps with the second portion 52*d* and the connecting portion 57, as viewed in the y-direction. The shape of the second portion 52*e* is not specifically limited, and a desired shape may be selected from a rectangular shape, a polygonal shape, a circular shape, an elliptical shape, and so forth. In the illustrated example, the second portion 52*e* has a rectangular shape.

The wiring 50*e* includes a strip-shaped portion connecting the first portion 51*e* and the second portion 52*e*. The strip-shaped portion extends along the x-direction.

The wiring 50*f* is located on the side of the fourth face 34 in the x-direction with respect to the second base portion 56, and spaced therefrom. The first portion 51*f* is located at a position shifted toward the sixth face 36 in the y-direction from the wiring 50U, and spaced therefrom. In the illustrated example, the wiring 50*f* overlaps with the second base portion 56, as viewed in the x-direction. In addition, the wiring 50*f* overlaps with the wiring 50U, the first portion 51T, and the first portion 51S, as viewed in the y-direction. The shape of the wiring 50*f* is not specifically limited. In the illustrated example, the wiring 50*f* has a strip shape extending along the x-direction.

<Bonding Section 6>

Regarding the bonding section 6 according to this embodiment, although any of the elements is apparently given, for the sake of convenience of description, the same numeral as that of the bonding section 6 according to the first embodiment, it does not necessarily mean that the mentioned element has the same or similar configuration. The configuration of an element with a numeral is defined by the description relevant to this embodiment.

The plurality of bonding sections 6 are formed on the substrate 3. In this embodiment, the plurality of bonding sections 6 are formed on the first face 31 of the substrate 3. The bonding section 6 is formed of, for example, a conductive material. The conductive material to form the bonding section 6 is not specifically limited. Examples of the conductive material to form the bonding section 6 include materials containing silver (Ag), copper (Cu), or gold (Au). In the subsequent description, it will be assumed that the bonding section 6 contains silver. The bonding section 6 according to this embodiment contains the same conductive material as that employed to form the conductive section 5. However, the bonding section 6 may contain copper instead of silver, or gold instead of silver or copper. Alternatively, the conductive section 5 may contain Ag—Pt or Ag—Pd. The forming method of the bonding section 6 is not limited. For example, the bonding section 6 may be formed, like the conductive section 5, by sintering a paste containing the mentioned metal. The thickness of the bonding section 6 is not specifically limited, but may be, for example, approximately 5 μm to 30 μm.

In this embodiment, as shown in FIG. 58, the plurality of bonding sections 6 include a bonding section 6A to a bonding section 6D.

The bonding section 6A is located on the side of the sixth face 36 with respect to the conductive section 5, in the y-direction. The bonding section 6A overlaps with the entirety of the first base portion 55, as viewed in the y-direction. The shape of the bonding section 6A is not specifically limited.

The bonding section 6B is located on the side of the sixth face 36 with respect to the conductive section 5, in the y-direction. The bonding section 6B is located on the side of the fourth face 34 with respect to the bonding section 6A, in the x-direction. In the illustrated example, the bonding section 6B overlaps with the connecting portion 57, the wirings 50*c* to 50*e*, and the second base portion 56, as viewed in the y-direction. The shape of the bonding section 6B is not specifically limited.

The bonding section 6C is located on the side of the sixth face 36 with respect to the conductive section 5, in the y-direction. The bonding section 6C is located on the side of the fourth face 34 with respect to the bonding section 6B, in the x-direction. In the illustrated example, the bonding section 6C overlaps with the wirings 50S to 50U, the wiring 50*f*, and the second base portion 56, as viewed in the y-direction. The shape of the bonding section 6C is not specifically limited.

The bonding section 6D is located on the side of the sixth face 36 with respect to the conductive section 5, in the y-direction. The bonding section 6D is located on the side of the fourth face 34 with respect to the bonding section 6C, in the x-direction. In the illustrated example, the bonding section 6D overlaps with the wirings 50S to 50U and the wiring 50*f*, and is spaced apart from the second base portion 56, as viewed in the y-direction. The shape of the bonding section 6D is not specifically limited.

<Leads 1>

Regarding the lead 1 according to this embodiment, although any of the elements is apparently given, for the sake of convenience of description, the same numeral as that of the lead 1 according to the first embodiment, it does not necessarily mean that the mentioned element has the same or similar configuration. The configuration of an element with a numeral is defined by the description relevant to this embodiment. The plurality of leads 1 contain a metal, and have higher heat dissipation characteristics, for example than the substrate 3. The metal to form the lead 1 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 1 may be plated with nickel (Ni). Examples of the forming method of the plurality of leads 1 include pressing a metal plate with a die, and patterning a metal plate by etching, without limitation thereto. The thickness of the lead 1 is not specifically limited, but may be, for example, approximately 0.4 mm to 0.8 mm.

The plurality of leads 1 include a plurality of leads 1A to 1G, as shown in FIG. 58. The plurality of leads 1A to 1G constitute conduction paths to the semiconductor chips 4A to 4F.

The lead 1A is located on the substrate 3 and, in this embodiment, on the first face 31. The lead 1A exemplifies a first lead in the present disclosure. The lead 1A is bonded to the bonding section 6A, via a bonding material 81. It is preferable to employ a material having high thermal conductivity as the bonding material 81, such as silver paste, copper paste, or solder. However, the bonding material 81 may be an insulative material such as an epoxy-based resin or a silicone-based resin. In the case where the bonding section 6A is not provided on the substrate 3, the lead 1A may be bonded to the substrate 3.

The configuration of the lead 1A is not specifically limited and, in this embodiment, the lead 1A includes a first portion 11A, a second portion 12A, a third portion 13A, and a fourth portion 14A, each of which will be described hereunder.

The first portion 11A overlaps with the substrate 3 as viewed in the z-direction, and is bonded to the bonding section 6A via the bonding material 81.

The third portion 13A and the fourth portion 14A are covered with the encapsulating resin 7. The third portion 13A is connected to the first portion 11A and the fourth portion 14A. In the illustrated example, the third portion 13A is connected to the first portion 11A. In addition, the third portion 13A is spaced apart from the sixth face 36, as viewed in the z-direction. The fourth portion 14A is shifted from the first portion 11A in the z-direction. The end portion of the fourth portion 14A is flush with a sixth face 76 of the resin 7.

The second portion 12A is connected to the end portion of the fourth portion 14A, and corresponds to a portion of the lead 1A sticking out from the encapsulating resin 7. The second portion 12A sticks out to the opposite side of the first portion 11A, in the y-direction. The second portion 12A is used, for example, to electrically connect the semiconductor device A3 to an external circuit. The second portion 12A is bent, for example, in the z-direction. In this embodiment, the lead 1A includes a pair of second portions 12A, which are spaced apart from each other in the x-direction.

The lead 1B is located on the substrate 3 and, in this embodiment, on the first face 31. The lead 1B exemplifies a first lead in the present disclosure. The lead 1B is bonded to the bonding section 6B, via the bonding material 81. In the case where the bonding section 6B is not provided on the substrate 3, the lead 1B may be bonded to the substrate 3.

The configuration of the lead 1B is not specifically limited. In this embodiment, the lead 1B includes a first portion 11B, a second portion 12B, a third portion 13B, and a fourth portion 14B, each of which will be described hereunder.

The first portion 11B overlaps with the substrate 3 as viewed in the z-direction, and is bonded to the bonding section 6B via the bonding material 81.

The third portion 13B and the fourth portion 14B are covered with the encapsulating resin 7. The third portion 13B is connected to the first portion 11B and the fourth portion 14B. In the illustrated example, the third portion 13B is connected to the first portion 11B. In addition, the third portion 13B is spaced apart from the sixth face 36, as viewed in the z-direction. The fourth portion 14B is shifted from the first portion 11B in the z-direction. The end portion of the fourth portion 14B is flush with the sixth face 76 of the resin 7.

The second portion 12B is connected to the fourth portion 14B, and corresponds to a portion of the lead 1B sticking out from the encapsulating resin 7. The second portion 12B sticks out to the opposite side of the first portion 11B, in the y-direction. The second portion 12B is used, for example, to electrically connect the semiconductor device A3 to an external circuit. In the illustrated example, the second portion 12B is bent, for example, in the z-direction.

The lead 1C is located on the substrate 3 and, in this embodiment, on the first face 31. The lead 1C exemplifies a first lead in the present disclosure. The lead 1C is bonded to the bonding section 6C, via the bonding material 81. In the case where the bonding section 6C is not provided on the substrate 3, the lead 1C may be bonded to the substrate 3.

The configuration of the lead 1C is not specifically limited. In this embodiment, the lead 1C includes a first portion 11C, a second portion 12C, a third portion 13C, and a fourth portion 14C, each of which will be described hereunder.

The first portion 11C overlaps with the substrate 3 as viewed in the z-direction, and is bonded to the bonding section 6C via the bonding material 81.

The third portion 13C and the fourth portion 14C are covered with the encapsulating resin 7. The third portion 13C is connected to the first portion 11C and the fourth portion 14C. In the illustrated example, the third portion 13C is connected to the first portion 11C. The fourth portion 14C is, like the fourth portion 14B of the lead 1B, shifted from the first portion 11C in the z-direction. The end portion of the fourth portion 14C is flush with the sixth face 76 of the resin 7.

The second portion 12C is connected to the end portion of the fourth portion 14C, and corresponds to a portion of the lead 1C sticking out from the encapsulating resin 7. The second portion 12C sticks out to the opposite side of the first portion 11C, in the y-direction. The second portion 12C is used, for example, to electrically connect the semiconductor device A3 to an external circuit. In the illustrated example, the second portion 12C is bent, for example, in the z-direction.

The lead 1D is located on the substrate 3 and, in this embodiment, on the first face 31. The lead 1D exemplifies a first lead in the present disclosure. The lead 1D is bonded to the bonding section 6D, via the bonding material 81. In the case where the bonding section 6D is not provided on the substrate 3, the lead 1D may be bonded to the substrate 3.

The configuration of the lead 1D is not specifically limited. In this embodiment the lead 1D includes, as shown in FIG. 4 and FIG. 14, a first portion 11D, a second portion 12D, a third portion 13D, and a fourth portion 14D, each of which will be described hereunder.

The first portion 11D overlaps with the substrate 3 as viewed in the z-direction, and is bonded to the bonding section 6D via the bonding material 81.

The third portion 13D and the fourth portion 14D are covered with the encapsulating resin 7. The third portion 13D is connected to the first portion 11D and the fourth portion 14D. In the illustrated example, the third portion 13D is connected to the first portion 1ID. The fourth portion 14D is, like the fourth portion 14B of the lead 1B, shifted from the first portion 11D in the z-direction. The end portion of the fourth portion 14D is flush with the sixth face 76 of the resin 7.

The second portion 12D is connected to the end portion of the fourth portion 14D, and corresponds to a portion of the lead 1D sticking out from the encapsulating resin 7. The second portion 12D sticks out to the opposite side of the first portion 11D, in the y-direction. The second portion 12D is used, for example, to electrically connect the semiconductor device A3 to an external circuit. In the illustrated example, the second portion 12D is bent, for example, in the z-direction.

The lead 1E is spaced apart from the substrate 3, as viewed in the z-direction. In this embodiment, the lead 1E located on the side to which the sixth face 36 is oriented, with respect to the substrate 3 in the y-direction.

The configuration of the lead 1E is not specifically limited. In this embodiment the lead 1E includes a second portion 12E and a fourth portion 14E, each of which will be described hereunder.

The fourth portion 14E is covered with the encapsulating resin 7. The fourth portion 14E is, like the fourth portion 14D of the lead 1D, shifted from the first portion 11E in the z-direction. The fourth portion 14E overlaps with the first portion 11C and the first portion 11D, as viewed in the y-direction. The end portion of the fourth portion 14E is flush with the sixth face 76 of the resin 7.

The second portion 12E is connected to the end portion of the fourth portion 14E, and corresponds to a portion of the lead 1E sticking out from the encapsulating resin 7. The second portion 12E sticks out to the opposite side of the fourth portion 14E, in the y-direction. The second portion 12E is used, for example, to electrically connect the semiconductor device A3 to an external circuit. In the illustrated example, the second portion 12E is bent, for example, in the z-direction.

The lead 1F is spaced apart from the substrate 3, as viewed in the z-direction. In this embodiment, the lead 1F is located on the side to which the sixth face 36 is oriented, with respect to the substrate 3 in the y-direction. The lead 1F is located on the opposite side of the fourth portion 14D, across the lead 1E.

The configuration of the lead 1F is not specifically limited. In this embodiment the lead 1F includes a second portion 12F and a fourth portion 14F, each of which will be described hereunder.

The fourth portion 14F is covered with the encapsulating resin 7. The fourth portion 14F is, like the fourth portion 14D of the lead 1D, shifted from the first portion 11F in the z-direction. The fourth portion 14F overlaps with the first portion 11D, as viewed in the y-direction. The end portion of the fourth portion 14F is flush with the sixth face 76 of the resin 7.

The second portion 12F is connected to the end portion of the fourth portion 14F, and corresponds to a portion of the lead 1F sticking out from the encapsulating resin 7. The second portion 12F sticks out to the opposite side of the fourth portion 14F, in the y-direction. The second portion 12F is used, for example, to electrically connect the semiconductor device A3 to an external circuit. In the illustrated example, the second portion 12F is bent, for example, in the z-direction.

The lead 1G is spaced apart from the substrate 3, as viewed in the z-direction. In this embodiment, the lead 1G is located on the side to which the fourth face 34 is oriented, with respect to the substrate 3 in the x-direction. The lead 1G is located on the opposite side of the fourth portion 14E, across the lead 1F.

The configuration of the lead 1G is not specifically limited. In this embodiment the lead 1G includes a second portion 12G and a fourth portion 14G, each of which will be described hereunder.

The fourth portion 14G is covered with the encapsulating resin 7. The fourth portion 14G is, like the fourth portion 14D of the lead 1D, shifted from the first portion 11G in the z-direction, to the side to which the main surface 111D is oriented. The fourth portion 14G overlaps with the fourth portion 14F, as viewed in the y-direction. In addition, the fourth portion 14G overlaps with the first portion 11D, as viewed in the x-direction. The end portion of the fourth portion 14G is flush with the sixth face 76 of the resin 7.

The second portion 12G is connected to the fourth portion 14G, and corresponds to a portion of the lead 1G sticking out from the encapsulating resin 7. The second portion 12G sticks out to the opposite side of the fourth portion 14G, in the y-direction. The second portion 12G is used, for example, to electrically connect the semiconductor device A3 to an external circuit. In the illustrated example, the second portion 12G is bent, for example, in the z-direction.

<Leads 2>

Regarding the lead 2 according to this embodiment, although any of the elements is apparently given, for the sake of convenience of description, the same numeral as that of the lead 2 according to the first embodiment, it does not necessarily mean that the mentioned element has the same or similar configuration. The configuration of an element with a numeral is defined by the description relevant to this embodiment. Regarding an element on which no specific description is given, a similar configuration to that of the corresponding element of the semiconductor device A2 may be adopted, as appropriate.

The plurality of leads 2 contain a metal, and have higher heat dissipation characteristics, for example than the substrate 3. The metal to form the lead 2 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 2 may be plated with nickel (Ni). Examples of the forming method of the plurality of leads 2 include pressing a metal plate with a die, and patterning a metal plate by etching, without limitation thereto. The thickness of the lead 2 is not specifically limited, but may be, for example, approximately 0.4 mm to 0.8 mm. The plurality of leads 2 are located so as to overlap with the second region 303 of the substrate 3, as viewed in the z-direction.

In this embodiment, the plurality of leads 2 include a plurality of leads 2A to 2U, as shown in FIG. 57 and FIG. 58. The plurality of leads 2A to 2H, and 2S to 2U respectively constitute conduction paths to the control chips 4G and 4H. The plurality of leads 2I to 2R constitute conduction paths to the primary-side circuit chip 4J.

The lead 2A is spaced apart from the plurality of leads 1. The lead 2A is located on the conductive section 5. The lead 2A is electrically connected to the conductive section 5. The lead 2A exemplifies a second lead in the present disclosure. The lead 2A is bonded to the second portion 52A of the wiring 50A in the conductive section 5, via a conductive bonding material 82. The conductive bonding material 82 may be any material that is capable of bonding, and electrically connecting, the lead 2A to the second portion 52A. For example, silver paste, copper paste, or solder may be employed as the conductive bonding material 82. The conductive bonding material 82 corresponds to the first conductive bonding material in the present disclosure.

The configuration of the lead 2A is not specifically limited. In this embodiment the lead 2A includes, like that of the semiconductor device A2, a first portion 21A, a second portion 22A, a third portion 23A, and a fourth portion 24A, each of which will be described hereunder.

The first portion 21A is bonded to the second portion 52A of the wiring 50A. The shape of the first portion 21A is not specifically limited, and a desired shape may be selected from a rectangular shape, a polygonal shape, a circular shape, an elliptical shape, and so forth. In the illustrated example, the first portion 21A has a bent shape including a portion extending along the x-direction, and a portion extending along the y-direction. The first portion 21A overlaps with the third face 33 of the substrate 3 as viewed in the z-direction, and sticks out in the x-direction, toward the side to which the third face 33 is oriented.

The third portion 23A and the fourth portion 24A are covered with the encapsulating resin 7. The third portion 23A is connected to the first portion 21A and the fourth portion 24A. The fourth portion 24A is shifted in the z-direction with respect to the first portion 21A. The end portion of the fourth portion 24A is flush with a fifth face 75 of the resin 7. In the illustrated example, the third portion 23A and the fourth portion 24A generally coincide with each other, as viewed in the y-direction. Here, the expression "generally coincide" as viewed in the y-direction refers to, for example, exactly coinciding with each other, or being deviated by within ±5% of the characteristic size (size of the third portion 23A, or fourth portion 24A in the x-direction).

The second portion 22A is connected to the end portion of the fourth portion 24A, and corresponds to a portion of the lead 2A sticking out from the encapsulating resin 7 to the opposite side of the plurality of leads 1, as viewed in the y-direction. The second portion 22A sticks out to the opposite side of the first portion 21A, in the y-direction. The second portion 22A is used, for example, to electrically connect the semiconductor device A3 to an external circuit. In the illustrated example, the second portion 22A is bent, for example, in the z-direction. The second portion 22A, the third portion 23A, and the fourth portion 24A each include, on the respective sides thereof in the x-direction, edges extending along the y-direction.

The lead 2B is spaced apart from the plurality of leads 1. The lead 2B is located on the conductive section 5. The lead 2B is electrically connected to the conductive section 5. The lead 2B exemplifies a second lead in the present disclosure. The lead 2B is bonded to the second portion 52B of the wiring 50B in the conductive section 5, via the conductive bonding material 82.

The configuration of the lead 2B is not specifically limited. In this embodiment, the lead 2B includes a first portion 21B, a second portion 22B, a third portion 23B, and a fourth portion 24B, each of which will be described hereunder.

The first portion 21B is bonded to the second portion 52B of the wiring 50B. The shape of the first portion 21B is not specifically limited, and a desired shape may be selected from a rectangular shape, a polygonal shape, a circular shape, an elliptical shape, and so forth. In the illustrated example, the first portion 21B has a bent shape including a portion inclined with respect to the x-direction and the y-direction, and a portion extending along the y-direction. The first portion 21B overlaps with the third face 33 of the substrate 3 as viewed in the z-direction, and sticks out in the x-direction, toward the side to which the third face 33 is oriented. In the illustrated example, the first portion 21B overlaps with the second portion 52B, as viewed in the z-direction.

The third portion 23B and the fourth portion 24B are covered with the encapsulating resin 7. The third portion 23B is connected to the first portion 21B and the fourth portion 24B. The fourth portion 24B is shifted in the z-direction with respect to the first portion 21B. The end portion of the fourth portion 24B is flush with the fifth face 75 of the resin 7. In the illustrated example, the third portion 23B and the fourth portion 24B generally coincide with each other, as viewed in the y-direction. Here, the expression "generally coincide" as viewed in the y-direction refers to, for example, exactly coinciding with each other, or being deviated by within ±5% of the characteristic size (size of the third portion 23B or fourth portion 24B in the x-direction).

The second portion 22B is connected to the end portion of the fourth portion 24B, and corresponds to a portion of the lead 2B sticking out from the encapsulating resin 7 to the opposite side of the plurality of leads 1, as viewed in the y-direction. The second portion 22B sticks out to the opposite side of the first portion 21B, in the y-direction. The second portion 22B is used, for example, to electrically connect the semiconductor device A3 to an external circuit. In the illustrated example, the second portion 22B is bent, for example, in the z-direction. The second portion 22B, the third portion 23B, and the fourth portion 24B each include, on the respective sides thereof in the x-direction, edges extending along the y-direction. The edges of the second portion 22B, the third portion 23B, and the fourth portion 24B, on the side of the third face 33 in the x-direction, are respectively opposed to the edges of the second portion 22A, the third portion 23A, and the fourth portion 24A, on the side of the fourth face 34 in the x-direction.

The lead 2C is spaced apart from the plurality of leads 1. The lead 2C is located on the conductive section 5. The lead 2C is electrically connected to the conductive section 5. The lead 2C exemplifies a second lead in the present disclosure. The lead 2C is bonded to the second portion 52C of the wiring 50C in the conductive section 5, via the conductive bonding material 82.

The configuration of the lead 2C is not specifically limited. In this embodiment, the lead 2C includes a first portion 21C, a second portion 22C, a third portion 23C, and a fourth portion 24C, each of which will be described hereunder.

The first portion 21C is bonded to the second portion 52C of the wiring 50C. The shape of the first portion 21C is not specifically limited, and a desired shape may be selected from a rectangular shape, a polygonal shape, a circular shape, an elliptical shape, and so forth. In the illustrated example, the first portion 21C has a bent shape including portions extending along the x-direction and the y-direction, and a portion interposed therebetween and inclined with respect to the x-direction and the y-direction. The first portion 21C overlaps with the third face 33 of the substrate 3 as viewed in the z-direction, and sticks out in the y-direction toward the side to which the fifth face 35 is oriented. In the illustrated example, the first portion 21C overlaps with the second portion 52C, as viewed in the z-direction.

The third portion 23C and the fourth portion 24C are covered with the encapsulating resin 7. The third portion 23C is connected to the first portion 21C and the fourth portion 24C. The fourth portion 24C is shifted in the z-direction with respect to the first portion 21C. The end portion of the fourth portion 24C is flush with the fifth face 75 of the resin 7. In the illustrated example, the third portion 23C and the fourth portion 24C generally coincide with each other, as viewed in the y-direction. Here, the expression "generally coincide" as viewed in the y-direction refers to, for example, exactly coinciding with each other, or being deviated by within ±5% of the characteristic size (size of the third portion 23C or fourth portion 24C in the x-direction).

The second portion 22C is connected to the end portion of the fourth portion 24C, and corresponds to a portion of the lead 2C sticking out from the encapsulating resin 7 to the opposite side of the plurality of leads 1, as viewed in the y-direction. The second portion 22C sticks out to the opposite side of the first portion 21C, in the y-direction. The second portion 22C is used, for example, to electrically connect the semiconductor device A3 to an external circuit. In the illustrated example, the second portion 22C is bent, for example, in the z-direction. The second portion 22C, the third portion 23C, and the fourth portion 24C each include, on the respective sides thereof in the x-direction, edges extending along the y-direction. The edges of the second portion 22C, the third portion 23C, and the fourth portion 24C, on the side of the third face 33 in the x-direction, are respectively opposed to the edges of the second portion 22B, the third portion 23B, and the fourth portion 24B, on the side of the fourth face 34 in the x-direction.

The lead 2D is spaced apart from the plurality of leads 1. The lead 2D is located on the conductive section 5. The lead 2D is electrically connected to the conductive section 5. The lead 2D exemplifies a second lead in the present disclosure. The lead 2D is bonded to the second portion 52D of the wiring 50D in the conductive section 5, via the conductive bonding material 82.

The configuration of the lead 2D is not specifically limited. In this embodiment, as shown in FIG. 59, the lead 2D includes a first portion 21D, a second portion 22D, a third portion 23D, and a fourth portion 24D, each of which will be described hereunder.

The first portion 21D is bonded to the second portion 52D of the wiring 50D. The shape of the first portion 21D is not specifically limited, and a desired shape may be selected from a rectangular shape, a polygonal shape, a circular shape, an elliptical shape, and so forth. In the illustrated example, the first portion 21D has a strip shape extending along the y-direction. The first portion 21D overlaps with the fifth face 35 of the substrate 3 as viewed in the z-direction, and sticks out in the y-direction toward the side to which the fifth face 35 is oriented. In the illustrated example, the first portion 21D overlaps with the second portion 52D, as viewed in the z-direction.

The third portion 23D and the fourth portion 24D are covered with the encapsulating resin 7. The third portion 23D is connected to the first portion 21D and the fourth portion 24D. The fourth portion 24D is shifted in the z-direction with respect to the first portion 21D. The end portion of the fourth portion 24D is flush with the fifth face 75 of the resin 7. In the illustrated example, the third portion 23D and the fourth portion 24D generally coincide with each other, as viewed in the y-direction. Here, the expression "generally coincide" as viewed in the y-direction refers to, for example, exactly coinciding with each other, or being deviated by within ±5% of the characteristic size (size of the third portion 23D or fourth portion 24D in the x-direction).

The second portion 22D is connected to the end portion of the fourth portion 24D, and corresponds to a portion of the lead 2D sticking out from the encapsulating resin 7 to the opposite side of the plurality of leads 1, as viewed in the y-direction. The second portion 22D sticks out to the opposite side of the first portion 21D, in the y-direction. The second portion 22D is used, for example, to electrically connect the semiconductor device A3 to an external circuit. In the illustrated example, the second portion 22D is bent in the z-direction. The second portion 22D, the third portion 23D, and the fourth portion 24D each include, on the respective sides thereof in the x-direction, edges extending along the y-direction. The edges of the second portion 22D, the third portion 23D, and the fourth portion 24D, on the side of the third face 33 in the x-direction, are respectively opposed to the edges of the second portion 22C, the third portion 23C, and the fourth portion 24C, on the side of the fourth face 34 in the x-direction.

The lead 2E is spaced apart from the plurality of leads 1. The lead 2E is located on the conductive section 5. The lead 2E is electrically connected to the conductive section 5. The lead 2E exemplifies a second lead in the present disclosure. The lead 2E is bonded to the second portion 52E of the wiring 50E in the conductive section 5, via the conductive bonding material 82.

The configuration of the lead 2E is not specifically limited. In this embodiment, as shown in FIG. 59, the lead 2E includes a first portion 21E, a second portion 22E, a third portion 23E, and a fourth portion 24E, each of which will be described hereunder.

The first portion 21E is bonded to the second portion 52E of the wiring 50E. The shape of the first portion 21E is not specifically limited, and a desired shape may be selected from a rectangular shape, a polygonal shape, a circular shape, an elliptical shape, and so forth. In the illustrated example, the first portion 21E has a strip shape extending along the y-direction. The first portion 21E overlaps with the fifth face 35 of the substrate 3 as viewed in the z-direction, and sticks out in the y-direction toward the side to which the fifth face 35 is oriented. In the illustrated example, the first portion 21E overlaps with the second portion 52E, as viewed in the z-direction.

The third portion 23E and the fourth portion 24E are covered with the encapsulating resin 7. The third portion 23E is connected to the first portion 21E and the fourth portion 24E. The fourth portion 24E is shifted in the z-direction with respect to the first portion 21E. The end portion of the fourth portion 24E is flush with the fifth face 75 of the resin 7. In the illustrated example, the third portion 23E and the fourth portion 24E generally coincide with each other, as viewed in the y-direction. Here, the expression "generally coincide" as viewed in the y-direction refers to, for example, exactly coinciding with each other, or being deviated by within ±5% of the characteristic size (size of the third portion 23E or fourth portion 24E in the x-direction).

The second portion 22E is connected to the end portion of the fourth portion 24E, and corresponds to a portion of the lead 2E sticking out from the encapsulating resin 7 to the opposite side of the plurality of leads 1, as viewed in the y-direction. The second portion 22E sticks out to the opposite side of the first portion 21E, in the y-direction. The second portion 22E is used, for example, to electrically connect the semiconductor device A3 to an external circuit. In the illustrated example, the second portion 22E is bent in the z-direction. The second portion 22E, the third portion 23E, and the fourth portion 24E each include, on the respective sides thereof in the x-direction, edges extending along the y-direction. The edges of the second portion 22E, the third portion 23E, and the fourth portion 24E, on the side of the third face 33 in the x-direction, are respectively opposed to the edges of the second portion 22D, the third portion 23D, and the fourth portion 24D, on the side of the fourth face 34 in the x-direction.

The lead 2F is spaced apart from the plurality of leads 1. The lead 2F is located on the conductive section 5. The lead 2F is electrically connected to the conductive section 5. The lead 2F exemplifies a second lead in the present disclosure. The lead 2F is bonded to the second portion 52F of the wiring 50F in the conductive section 5, via the conductive bonding material 82.

The configuration of the lead 2F is not specifically limited. In this embodiment, the lead 2F includes a first portion 21F, a second portion 22F, a third portion 23F, and a fourth portion 24F, each of which will be described hereunder.

The first portion 21F is bonded to the second portion 52F of the wiring 50F. The shape of the first portion 21F is not specifically limited, and a desired shape may be selected from a rectangular shape, a polygonal shape, a circular shape, an elliptical shape, and so forth. In the illustrated example, the first portion 21F has a strip shape extending along the y-direction. The first portion 21F overlaps with the fifth face 35 of the substrate 3 as viewed in the z-direction, and sticks out in the y-direction toward the side to which the fifth face 35 is oriented. In the illustrated example, the first portion 21F overlaps with the second portion 52F, as viewed in the z-direction.

The third portion 23F and the fourth portion 24F are covered with the encapsulating resin 7. The third portion 23F is connected to the first portion 21F and the fourth portion 24F. The fourth portion 24F is shifted in the z-direction with respect to the first portion 21F. The end portion of the fourth portion 24F is flush with the fifth face 75 of the resin 7. In the illustrated example, the third portion 23F and the fourth portion 24F generally coincide with each other, as viewed in the y-direction. Here, the expression "generally coincide" as viewed in the y-direction refers to, for example, exactly coinciding with each other, or being deviated by within ±5% of the characteristic size (size of the third portion 23F or fourth portion 24F in the x-direction).

The second portion 22F is connected to the end portion of the fourth portion 24F, and corresponds to a portion of the lead 2F sticking out from the encapsulating resin 7 to the opposite side of the plurality of leads 1, as viewed in the y-direction. The second portion 22F sticks out to the opposite side of the first portion 21F, in the y-direction. The second portion 22F is used, for example, to electrically connect the semiconductor device A3 to an external circuit. In the illustrated example, the second portion 22F is bent in the z-direction. The second portion 22F, the third portion 23F, and the fourth portion 24F each include, on the respective sides thereof in the x-direction, edges extending along the y-direction. The edges of the second portion 22F, the third portion 23F, and the fourth portion 24F, on the side of the third face 33 in the x-direction, are respectively opposed to the edges of the second portion 22E, the third portion 23E, and the fourth portion 24E, on the side of the fourth face 34 in the x-direction.

The lead 2G is spaced apart from the plurality of leads 1. The lead 2G is located on the conductive section 5. The lead 2G is electrically connected to the conductive section 5. The lead 2G exemplifies a second lead in the present disclosure. The lead 2G is bonded to the second portion 52G of the wiring 50G in the conductive section 5, via the conductive bonding material 82.

The configuration of the lead 2G is not specifically limited. In this embodiment, the lead 2G includes a first portion 21G, a second portion 22G, a third portion 23G, and a fourth portion 24G, each of which will be described hereunder.

The first portion 21G is bonded to the second portion 52G of the wiring 50G. The shape of the first portion 21G is not specifically limited, and a desired shape may be selected from a rectangular shape, a polygonal shape, a circular shape, an elliptical shape, and so forth. In the illustrated example, the first portion 21G has a strip shape extending along the y-direction. The first portion 21G overlaps with the fifth face 35 of the substrate 3 as viewed in the z-direction, and sticks out in the y-direction toward the side to which the fifth face 35 is oriented. In the illustrated example, the first portion 21G overlaps with the second portion 52G, as viewed in the z-direction.

The third portion 23G and the fourth portion 24G are covered with the encapsulating resin 7. The third portion 23G is connected to the first portion 21G and the fourth portion 24G. The fourth portion 24G is shifted in the z-direction with respect to the first portion 21G. The end portion of the fourth portion 24G is flush with the fifth face 75 of the resin 7. In the illustrated example, the third portion 23G and the fourth portion 24G generally coincide with each other, as viewed in the y-direction. Here, the expression "generally coincide" as viewed in the y-direction refers to, for example, exactly coinciding with each other, or being deviated by within ±5% of the characteristic size (size of the third portion 23G or fourth portion 24G in the x-direction).

The second portion 22G is connected to the end portion of the fourth portion 24G, and corresponds to a portion of the lead 2G sticking out from the encapsulating resin 7 to the opposite side of the plurality of leads 1, as viewed in the y-direction. The second portion 22G sticks out to the opposite side of the first portion 21G, in the y-direction. The second portion 22G is used, for example, to electrically connect the semiconductor device A3 to an external circuit. In the illustrated example, the second portion 22G is bent, for example, in the z-direction. The second portion 22G, the third portion 23G, and the fourth portion 24G each include, on the respective sides thereof in the x-direction, edges extending along the y-direction. The edges of the second portion 22G, the third portion 23G, and the fourth portion 24G, on the side of the third face 33 in the x-direction, are respectively opposed to the edges of the second portion 22F, the third portion 23F, and the fourth portion 24F, on the side of the fourth face 34 in the x-direction.

The lead 2H is spaced apart from the plurality of leads 1. The lead 2H is located on the conductive section 5. The lead 2H is electrically connected to the conductive section 5. The lead 2H exemplifies a second lead in the present disclosure. The lead 2H is bonded to the second portion 52H of the wiring 50H in the conductive section 5, via the conductive bonding material 82.

The configuration of the lead 2H is not specifically limited. In this embodiment, the lead 2H includes a first portion 21H, a second portion 22H, a third portion 23H, and a fourth portion 24H, each of which will be described hereunder.

The first portion 21H is bonded to the second portion 52H of the wiring 50H. The shape of the first portion 21H is not specifically limited, and a desired shape may be selected from a rectangular shape, a polygonal shape, a circular shape, an elliptical shape, and so forth. In the illustrated example, the first portion 21H has a strip shape extending along the y-direction. The first portion 21H overlaps with the fifth face 35 of the substrate 3 as viewed in the z-direction, and sticks out in the y-direction toward the side to which the fifth face 35 is oriented. In the illustrated example, the first portion 21H overlaps with the second portion 52H, as viewed in the z-direction.

The third portion 23H and the fourth portion 24H are covered with the encapsulating resin 7. The third portion 23H is connected to the first portion 21H and the fourth portion 24H. The fourth portion 24H is shifted in the z-direction with respect to the first portion 21H. The end portion of the fourth portion 24H is flush with the fifth face 75 of the resin 7. In the illustrated example, the third portion 23H and the fourth portion 24H generally coincide with each other, as viewed in the y-direction. Here, the expression "generally coincide" as viewed in the y-direction refers to, for example, exactly coinciding with each other, or being deviated by within ±5% of the characteristic size (size of the third portion 23H or fourth portion 24H in the x-direction).

The second portion 22H is connected to the end portion of the fourth portion 24H, and corresponds to a portion of the lead 2H sticking out from the encapsulating resin 7 to the opposite side of the plurality of leads 1, as viewed in the y-direction. The second portion 22H sticks out to the opposite side of the first portion 21H, in the y-direction. The second portion 22H is used, for example, to electrically connect the semiconductor device A3 to an external circuit. In the illustrated example, the second portion 22H is bent, for example, in the z-direction. The second portion 22H, the third portion 23H, and the fourth portion 24H each include, on the respective sides thereof in the x-direction, edges extending along the y-direction. The edges of the second portion 22H, the third portion 23H, and the fourth portion 24H, on the side of the third face 33 in the x-direction, are respectively opposed to the edges of the second portion 22G, the third portion 23G, and the fourth portion 24G, on the side of the fourth face 34 in the x-direction.

The lead 2I is spaced apart from the plurality of leads 1. The lead 2I is located on the conductive section 5. The lead 2I is electrically connected to the conductive section 5. The lead 2I exemplifies a second lead in the present disclosure. The lead 2I is bonded to the second portion 52I of the wiring 50I in the conductive section 5, via the conductive bonding material 82.

The configuration of the lead 2I is not specifically limited. In this embodiment, as shown in FIG. 59, the lead 2I includes a first portion 21I, a second portion 22I, a third portion 23I, and a fourth portion 24I, each of which will be described hereunder.

The first portion 21I is bonded to the second portion 52I of the wiring 50I. The shape of the first portion 21I is not specifically limited, and a desired shape may be selected from a rectangular shape, a polygonal shape, a circular shape, an elliptical shape, and so forth. In the illustrated example, the first portion 21I has a strip shape extending along the y-direction. The first portion 21I overlaps with the fifth face 35 as viewed in the z-direction, and includes a portion extending from the fifth face 35 in the y-direction, toward the side to which the fifth face 35 is oriented. In the illustrated example, the first portion 21I overlaps with the second portion 52I, as viewed in the z-direction.

The third portion 23I and the fourth portion 24I are covered with the encapsulating resin 7. The third portion 23I is connected to the first portion 21I and the fourth portion 24I. The fourth portion 24I is shifted in the z-direction with respect to the first portion 21I. The end portion of the fourth portion 24I is flush with the fifth face 75 of the resin 7. In the illustrated example, the third portion 23I and the fourth portion 24I generally coincide with each other, as viewed in the y-direction. Here, the expression "generally coincide" as viewed in the y-direction refers to, for example, exactly coinciding with each other, or being deviated by within ±5% of the characteristic size (size of the third portion 23I or fourth portion 24I in the x-direction). The third portion 23I overlaps with the fifth face 35 of the substrate 3, as viewed in the z-direction.

The second portion 22I is connected to the end portion of the fourth portion 24I, and corresponds to a portion of the lead 2I sticking out from the encapsulating resin 7 to the opposite side of the plurality of leads 1, as viewed in the y-direction. The second portion 22I sticks out to the opposite side of the first portion 21I, in the y-direction. The second portion 22I is used, for example, to electrically connect the semiconductor device A3 to an external circuit. In the illustrated example, the second portion 22I is bent, for example, in the z-direction. The second portion 22I, the third portion 23I, and the fourth portion 24I each include, on the respective sides thereof in the x-direction, edges extending along the y-direction. The edges of the second portion 22I, the third portion 23I, and the fourth portion 24I, on the side of the third face 33 in the x-direction, are respectively opposed to the edges of the second portion 22H, the third portion 23H, and the fourth portion 24H, on the side of the fourth face 34 in the x-direction.

The lead 2J is spaced apart from the plurality of leads 1. The lead 2J is located on the conductive section 5. The lead 2J is electrically connected to the conductive section 5. The lead 2J exemplifies a second lead in the present disclosure. The lead 2J is bonded to the second portion 52J of the wiring 50J in the conductive section 5, via the conductive bonding material 82.

The configuration of the lead 2J is not specifically limited. In this embodiment, as shown in FIG. 59, the lead 2J includes a first portion 21J, a second portion 22J, a third portion 23J, and a fourth portion 24J, each of which will be described hereunder.

The first portion 21J is bonded to the second portion 52J of the wiring 50J. The shape of the first portion 21J is not specifically limited, and a desired shape may be selected from a rectangular shape, a polygonal shape, a circular shape, an elliptical shape, and so forth. In the illustrated example, the first portion 21J has a strip shape extending along the y-direction. The first portion 21J overlaps with the fifth face 35 as viewed in the z-direction, and includes a portion extending from the fifth face 35 in the y-direction, toward the side to which the fifth face 35 is oriented. In the illustrated example, the first portion 21J overlaps with the second portion 52J, as viewed in the z-direction.

The third portion 23J and the fourth portion 24J are covered with the encapsulating resin 7. The third portion 23J is connected to the first portion 21J and the fourth portion 24J. The fourth portion 24J is shifted in the z-direction with respect to the first portion 21J. The end portion of the fourth portion 24J is flush with the fifth face 75 of the resin 7. In the illustrated example, the third portion 23J and the fourth portion 24J generally coincide with each other, as viewed in the y-direction. Here, the expression "generally coincide" as viewed in the y-direction refers to, for example, exactly coinciding with each other, or being deviated by within ±5% of the characteristic size (size of the third portion 23J or fourth portion 24J in the x-direction). The third portion 23J overlaps with the fifth face 35 of the substrate 3, as viewed in the z-direction.

The second portion 22J is connected to the end portion of the fourth portion 24J, and corresponds to a portion of the lead 2J sticking out from the encapsulating resin 7 to the opposite side of the plurality of leads 1, as viewed in the y-direction. The second portion 22J sticks out to the opposite side of the first portion 21J, in the y-direction. The second portion 22J is used, for example, to electrically connect the semiconductor device A3 to an external circuit. In the illustrated example, the second portion 22J is bent, for example, in the z-direction. The second portion 22J, the third portion 23J, and the fourth portion 24J each include, on the respective sides thereof in the x-direction, edges extending along the y-direction. The edges of the second portion 22J, the third portion 23J, and the fourth portion 24J, on the side of the third face 33 in the x-direction, are respectively opposed to the edges of the second portion 22I, the third portion 23I, and the fourth portion 24I, on the side of the fourth face 34 in the x-direction.

The lead 2K is spaced apart from the plurality of leads 1. The lead 2K is located on the conductive section 5. The lead 2K is electrically connected to the conductive section 5. The lead 2K exemplifies a second lead in the present disclosure. The lead 2K is bonded to the second portion 52K of the wiring 50K in the conductive section 5, via the conductive bonding material 82.

The configuration of the lead 2K is not specifically limited. In this embodiment, as shown in FIG. 59, the lead 2K includes a first portion 21K, a second portion 22K, a third portion 23K, and a fourth portion 24K, each of which will be described hereunder.

The first portion 21K is bonded to the second portion 52K of the wiring 50K. The shape of the first portion 21K is not specifically limited, and a desired shape may be selected from a rectangular shape, a polygonal shape, a circular shape, an elliptical shape, and so forth. In the illustrated example, the first portion 21K has a strip shape extending along the y-direction. The first portion 21K overlaps with the fifth face as viewed in the z-direction, and includes a portion extending from the fifth face 35 in the y-direction, toward the side to which the fifth face 35 is oriented. In the illustrated example, the first portion 21K overlaps with the second portion 52K, as viewed in the z-direction.

The third portion 23K and the fourth portion 24K are covered with the encapsulating resin 7. The third portion 23K is connected to the first portion 21K and the fourth portion 24K. The fourth portion 24K is shifted in the z-direction with respect to the first portion 21K. The end portion of the fourth portion 24K is flush with the fifth face 75 of the resin 7. In the illustrated example, the third portion 23K and the fourth portion 24K generally coincide with each other, as viewed in the y-direction. Here, the expression "generally coincide" as viewed in the y-direction refers to, for example, exactly coinciding with each other, or being deviated by within ±5% of the characteristic size (size of the third portion 23K or fourth portion 24K in the x-direction). The third portion 23K overlaps with the fifth face 35 of the substrate 3, as viewed in the z-direction.

The second portion 22K is connected to the end portion of the fourth portion 24K, and corresponds to a portion of the lead 2K sticking out from the encapsulating resin 7 to the opposite side of the plurality of leads 1, as viewed in the y-direction. The second portion 22K sticks out to the opposite side of the first portion 21K, in the y-direction. The second portion 22K is used, for example, to electrically connect the semiconductor device A3 to an external circuit. In the illustrated example, the second portion 22K is bent, for example, in the z-direction. The second portion 22K, the third portion 23K, and the fourth portion 24K each include, on the respective sides thereof in the x-direction, edges extending along the y-direction. The edges of the second portion 22K, the third portion 23K, and the fourth portion 24K, on the side of the third face 33 in the x-direction, are respectively opposed to the edges of the second portion 22J, the third portion 23J, and the fourth portion 24J, on the side of the fourth face 34 in the x-direction.

The lead 2L is spaced apart from the plurality of leads 1. The lead 2L is located on the conductive section 5. The lead 2L is electrically connected to the conductive section 5. The lead 2L exemplifies a second lead in the present disclosure. The lead 2L is bonded to the second portion 52L of the wiring 50L in the conductive section 5, via the conductive bonding material 82.

The configuration of the lead 2L is not specifically limited. In this embodiment, as shown in FIG. 59, the lead 2L includes a first portion 21L, a second portion 22L, a third portion 23L, and a fourth portion 24L, each of which will be described hereunder.

The first portion 21L is bonded to the second portion 52L of the wiring 50L. The shape of the first portion 21L is not specifically limited, and a desired shape may be selected from a rectangular shape, a polygonal shape, a circular shape, an elliptical shape, and so forth. In the illustrated example, the first portion 21L has a strip shape extending along the y-direction. The first portion 21L overlaps with the fifth face as viewed in the z-direction, and includes a portion extending from the fifth face 35 in the y-direction, toward the side to which the fifth face 35 is oriented. In the illustrated example, the first portion 21L overlaps with the second portion 52L, as viewed in the z-direction.

The third portion 23L and the fourth portion 24L are covered with the encapsulating resin 7. The third portion 23L is connected to the first portion 21L and the fourth portion 24L. The fourth portion 24L is shifted in the z-direction with respect to the first portion 21L. The end portion of the fourth portion 24L is flush with the fifth face 75 of the resin 7. In the illustrated example, the third portion 23L and the fourth portion 24L generally coincide with each other, as viewed in the y-direction. Here, the expression "generally coincide" as viewed in the y-direction refers to, for example, exactly coinciding with each other, or being deviated by within ±5% of the characteristic size (size of the third portion 23L or fourth portion 24L in the x-direction). The third portion 23L overlaps with the fifth face 35 of the substrate 3, as viewed in the z-direction.

The second portion 22L is connected to the end portion of the fourth portion 24L, and corresponds to a portion of the lead 2L sticking out from the encapsulating resin 7 to the opposite side of the plurality of leads 1, as viewed in the y-direction. The second portion 22L sticks out to the opposite side of the first portion 21L, in the y-direction. The second portion 22L is used, for example, to electrically connect the semiconductor device A3 to an external circuit. In the illustrated example, the second portion 22L is bent, for example, in the z-direction. The second portion 22L, the third portion 23L, and the fourth portion 24L each include, on the respective sides thereof in the x-direction, edges extending along the y-direction. The edges of the second portion 22L, the third portion 23L, and the fourth portion 24L, on the side of the third face 33 in the x-direction, are respectively opposed to the edges of the second portion 22K, the third portion 23K, and the fourth portion 24K, on the side of the fourth face 34 in the x-direction.

The lead 2M is spaced apart from the plurality of leads 1. The lead 2M is located on the conductive section 5. The lead 2M is electrically connected to the conductive section 5. The lead 2M exemplifies a second lead in the present disclosure. The lead 2M is bonded to the second portion 52M of the wiring 50M in the conductive section 5, via the conductive bonding material 82.

The configuration of the lead 2M is not specifically limited. In this embodiment, as shown in FIG. 59, the lead 2M includes a first portion 21M, a second portion 22M, a third portion 23M, and a fourth portion 24M, each of which will be described hereunder.

The first portion 21M is bonded to the second portion 52M of the wiring 50M. The shape of the first portion 21M is not specifically limited, and a desired shape may be selected from a rectangular shape, a polygonal shape, a circular shape, an elliptical shape, and so forth. In the illustrated example, the first portion 21M has a strip shape extending along the y-direction. The first portion 21M overlaps with the fifth face as viewed in the z-direction, and includes a portion extending from the fifth face 35 in the y-direction, toward the side to which the fifth face 35 is oriented. In the illustrated example, the first portion 21M overlaps with the second portion 52M, as viewed in the z-direction.

The third portion 23M and the fourth portion 24M are covered with the encapsulating resin 7. The third portion 23M is connected to the first portion 21M and the fourth portion 24M. The fourth portion 24M is shifted in the z-direction with respect to the first portion 21M. The end portion of the fourth portion 24M is flush with the fifth face 75 of the resin 7. In the illustrated example, the third portion 23M and the fourth portion 24M generally coincide with each other, as viewed in the y-direction. Here, the expression "generally coincide" as viewed in the y-direction refers to, for example, exactly coinciding with each other, or being deviated by within ±5% of the characteristic size (size of the third portion 23M or fourth portion 24M in the x-direction). The third portion 23M overlaps with the fifth face 35 of the substrate 3, as viewed in the z-direction.

The second portion 22M is connected to the end portion of the fourth portion 24M, and corresponds to a portion of the lead 2M sticking out from the encapsulating resin 7 to the opposite side of the plurality of leads 1, as viewed in the y-direction. The second portion 22M sticks out to the opposite side of the first portion 21M, in the y-direction. The second portion 22M is used, for example, to electrically connect the semiconductor device A3 to an external circuit. In the illustrated example, the second portion 22M is bent, for example, in the z-direction. The second portion 22M, the third portion 23M, and the fourth portion 24M each include, on the respective sides thereof in the x-direction, edges extending along the y-direction. The edges of the second portion 22M, the third portion 23M, and the fourth portion 24M, on the side of the third face 33 in the x-direction, are respectively opposed to the edges of the second portion 22L, the third portion 23L, and the fourth portion 24L, on the side of the fourth face 34 in the x-direction.

The lead 2N is spaced apart from the plurality of leads 1. The lead 2N is located on the conductive section 5. The lead 2N is electrically connected to the conductive section 5. The lead 2N exemplifies a second lead in the present disclosure. The lead 2N is bonded to the second portion 52N of the wiring 50N in the conductive section 5, via the conductive bonding material 82.

The configuration of the lead 2N is not specifically limited. In this embodiment, as shown in FIG. 59, the lead 2N includes a first portion 21N, a second portion 22N, a third portion 23N, and a fourth portion 24N, each of which will be described hereunder.

The first portion 21N is bonded to the second portion 52N of the wiring 50N. The shape of the first portion 21N is not specifically limited, and a desired shape may be selected from a rectangular shape, a polygonal shape, a circular shape, an elliptical shape, and so forth. In the illustrated example, the first portion 21N has a strip shape extending along the y-direction. The first portion 21N overlaps with the fifth face as viewed in the z-direction, and includes a portion extending from the fifth face 35 in the y-direction, toward the side to which the fifth face 35 is oriented. In the illustrated example, the first portion 21N overlaps with the second portion 52N, as viewed in the z-direction.

The third portion 23N and the fourth portion 24N are covered with the encapsulating resin 7. The third portion 23N is connected to the first portion 21N and the fourth portion 24N. The fourth portion 24N is shifted in the z-direction with respect to the first portion 21N. The end portion of the fourth portion 24N is flush with the fifth face 75 of the resin 7. In the illustrated example, the third portion 23N and the fourth portion 24N generally coincide with each other, as viewed in the y-direction. Here, the expression "generally coincide" as viewed in the y-direction refers to, for example, exactly coinciding with each other, or being deviated by within ±5% of the characteristic size (size of the third portion 23N or fourth portion 24N in the x-direction). The third portion 23N overlaps with the fifth face 35 of the substrate 3, as viewed in the z-direction.

The second portion 22N is connected to the end portion of the fourth portion 24N, and corresponds to a portion of the lead 2N sticking out from the encapsulating resin 7 to the opposite side of the plurality of leads 1, as viewed in the y-direction. The second portion 22N sticks out to the opposite side of the first portion 21N, in the y-direction. The second portion 22N is used, for example, to electrically connect the semiconductor device A3 to an external circuit.

In the illustrated example, the second portion 22N is bent, for example, in the z-direction. The second portion 22N, the third portion 23N, and the fourth portion 24N each include, on the respective sides thereof in the x-direction, edges extending along the y-direction. The edges of the second portion 22N, the third portion 23N, and the fourth portion 24N, on the side of the third face 33 in the x-direction, are respectively opposed to the edges of the second portion 22M, the third portion 23M, and the fourth portion 24M, on the side of the fourth face 34 in the x-direction.

The lead 2O is spaced apart from the plurality of leads 1. The lead 2O is located on the conductive section 5. The lead 2O is electrically connected to the conductive section 5. The lead 2O exemplifies a second lead in the present disclosure. The lead 2O is bonded to the second portion 52O of the wiring 50O in the conductive section 5, via the conductive bonding material 82.

The configuration of the lead 2O is not specifically limited. In this embodiment, as shown in FIG. 59, the lead 2O includes a first portion 21O, a second portion 22O, a third portion 23O, and a fourth portion 24O, each of which will be described hereunder.

The first portion 21O is bonded to the second portion 52O of the wiring 50O. The shape of the first portion 21O is not specifically limited, and a desired shape may be selected from a rectangular shape, a polygonal shape, a circular shape, an elliptical shape, and so forth. In the illustrated example, the first portion 21O has a strip shape extending along the y-direction. The first portion 21O overlaps with the fifth face as viewed in the z-direction, and includes a portion extending from the fifth face 35 in the y-direction, toward the side to which the fifth face 35 is oriented. In the illustrated example, the first portion 21O overlaps with the second portion 52O, as viewed in the z-direction.

The third portion 23O and the fourth portion 24O are covered with the encapsulating resin 7. The third portion 23O is connected to the first portion 21O and the fourth portion 24O. The fourth portion 24O is shifted in the z-direction with respect to the first portion 21O. The end portion of the fourth portion 24O is flush with the fifth face 75 of the resin 7. In the illustrated example, the third portion 23O and the fourth portion 24O generally coincide with each other, as viewed in the y-direction. Here, the expression "generally coincide" as viewed in the y-direction refers to, for example, exactly coinciding with each other, or being deviated by within ±5% of the characteristic size (size of the third portion 23O or fourth portion 24O in the x-direction). The third portion 23O overlaps with the fifth face 35 of the substrate 3, as viewed in the z-direction.

The second portion 22O is connected to the end portion of the fourth portion 24O, and corresponds to a portion of the lead 2O sticking out from the encapsulating resin 7 to the opposite side of the plurality of leads 1, as viewed in the y-direction. The second portion 22O sticks out to the opposite side of the first portion 21O, in the y-direction. The second portion 22O is used, for example, to electrically connect the semiconductor device A3 to an external circuit. In the illustrated example, the second portion 22O is bent, for example, in the z-direction. The second portion 22O, the third portion 23O, and the fourth portion 24O each include, on the respective sides thereof in the x-direction, edges extending along the y-direction. The edges of the second portion 22O, the third portion 23O, and the fourth portion 24O, on the side of the third face 33 in the x-direction, are respectively opposed to the edges of the second portion 22N, the third portion 23N, and the fourth portion 24N, on the side of the fourth face 34 in the x-direction.

The lead 2P is spaced apart from the plurality of leads 1. The lead 2P is located on the conductive section 5. The lead 2P is electrically connected to the conductive section 5. The lead 2P exemplifies a second lead in the present disclosure. The lead 2P is bonded to the second portion 52P of the wiring 50P in the conductive section 5, via the conductive bonding material 82.

The configuration of the lead 2P is not specifically limited. In this embodiment, as shown in FIG. 59, the lead 2P includes a first portion 21P, a second portion 22P, a third portion 23P, and a fourth portion 24P, each of which will be described hereunder.

The first portion 21P is bonded to the second portion 52P of the wiring 50P. The shape of the first portion 21P is not specifically limited, and a desired shape may be selected from a rectangular shape, a polygonal shape, a circular shape, an elliptical shape, and so forth. In the illustrated example, the first portion 21P has a strip shape extending along the y-direction. The first portion 21P overlaps with the fifth face as viewed in the z-direction, and includes a portion extending from the fifth face 35 in the y-direction, toward the side to which the fifth face 35 is oriented. In the illustrated example, the first portion 21P overlaps with the second portion 52P, as viewed in the z-direction.

The third portion 23P and the fourth portion 24P are covered with the encapsulating resin 7. The third portion 23P is connected to the first portion 21P and the fourth portion 24P. The fourth portion 24P is shifted in the z-direction with respect to the first portion 21P. The end portion of the fourth portion 24P is flush with the fifth face 75 of the resin 7. In the illustrated example, the third portion 23P and the fourth portion 24P generally coincide with each other, as viewed in the y-direction. Here, the expression "generally coincide" as viewed in the y-direction refers to, for example, exactly coinciding with each other, or being deviated by within ±5% of the characteristic size (size of the third portion 23P or fourth portion 24P in the x-direction). The third portion 23P overlaps with the fifth face 35 of the substrate 3, as viewed in the z-direction.

The second portion 22P is connected to the end portion of the fourth portion 24P, and corresponds to a portion of the lead 2P sticking out from the encapsulating resin 7 to the opposite side of the plurality of leads 1, as viewed in the y-direction. The second portion 22P sticks out to the opposite side of the first portion 21P, in the y-direction. The second portion 22P is used, for example, to electrically connect the semiconductor device A3 to an external circuit. In the illustrated example, the second portion 22P is bent, for example, in the z-direction. The second portion 22P, the third portion 23P, and the fourth portion 24P each include, on the respective sides thereof in the x-direction, edges extending along the y-direction. The edges of the second portion 22P, the third portion 23P, and the fourth portion 24P, on the side of the third face 33 in the x-direction, are respectively opposed to the edges of the second portion 22O, the third portion 23O, and the fourth portion 24O, on the side of the fourth face 34 in the x-direction.

The lead 2Q is spaced apart from the plurality of leads 1. The lead 2Q is located on the conductive section 5. The lead 2Q is electrically connected to the conductive section 5. The lead 2Q exemplifies a second lead in the present disclosure. The lead 2Q is bonded to the second portion 52Q of the wiring 50Q in the conductive section 5, via the conductive bonding material 82.

The configuration of the lead 2Q is not specifically limited. In this embodiment, as shown in FIG. 59, the lead 2Q includes a first portion 21Q, a second portion 22Q, a third portion 23Q, and a fourth portion 24Q, each of which will be described hereunder.

The first portion 21Q is bonded to the second portion 52Q of the wiring 50Q. The shape of the first portion 21Q is not specifically limited, and a desired shape may be selected from a rectangular shape, a polygonal shape, a circular shape, an elliptical shape, and so forth. In the illustrated example, the first portion 21Q has a strip shape extending along the y-direction. The first portion 21Q overlaps with the fifth face as viewed in the z-direction, and includes a portion extending from the fifth face 35 in the y-direction, toward the side to which the fifth face 35 is oriented. In the illustrated example, the first portion 21Q overlaps with the second portion 52Q, as viewed in the z-direction.

The third portion 23Q and the fourth portion 24Q are covered with the encapsulating resin 7. The third portion 23Q is connected to the first portion 21Q and the fourth portion 24Q. The fourth portion 24Q is shifted in the z-direction with respect to the first portion 21Q. The end portion of the fourth portion 24Q is flush with the fifth face 75 of the resin 7. In the illustrated example, the third portion 23Q and the fourth portion 24Q generally coincide with each other, as viewed in the y-direction. Here, the expression "generally coincide" as viewed in the y-direction refers to, for example, exactly coinciding with each other, or being deviated by within ±5% of the characteristic size (size of the third portion 23Q or fourth portion 24Q in the x-direction). The third portion 23Q overlaps with the fifth face 35 of the substrate 3, as viewed in the z-direction.

The second portion 22Q is connected to the end portion of the fourth portion 24Q, and corresponds to a portion of the lead 2Q sticking out from the encapsulating resin 7 to the opposite side of the plurality of leads 1, as viewed in the y-direction. The second portion 22Q sticks out to the opposite side of the first portion 21Q, in the y-direction. The second portion 22Q is used, for example, to electrically connect the semiconductor device A3 to an external circuit. In the illustrated example, the second portion 22Q is bent, for example, in the z-direction. The second portion 22Q, the third portion 23Q, and the fourth portion 24Q each include, on the respective sides thereof in the x-direction, edges extending along the y-direction. The edges of the second portion 22Q, the third portion 23Q, and the fourth portion 24Q, on the side of the third face 33 in the x-direction, are respectively opposed to the edges of the second portion 22P, the third portion 23P, and the fourth portion 24P, on the side of the fourth face 34 in the x-direction.

The lead 2R is spaced apart from the plurality of leads 1. The lead 2R is located on the conductive section 5. The lead 2R is electrically connected to the conductive section 5. The lead 2R exemplifies a second lead in the present disclosure. The lead 2R is bonded to the second portion 52R of the wiring 50R in the conductive section 5, via the conductive bonding material 82.

The configuration of the lead 2R is not specifically limited. In this embodiment, as shown in FIG. 59, the lead 2R includes a first portion 21R, a second portion 22R, a third portion 23R, and a fourth portion 24R, each of which will be described hereunder.

The first portion 21R is bonded to the second portion 52R of the wiring 50R. The shape of the first portion 21R is not specifically limited, and a desired shape may be selected from a rectangular shape, a polygonal shape, a circular shape, an elliptical shape, and so forth. In the illustrated example, the first portion 21R has a strip shape extending along the y-direction. The first portion 21R overlaps with the fifth face as viewed in the z-direction, and includes a portion extending from the fifth face 35 in the y-direction, toward the side to which the fifth face 35 is oriented. In the illustrated example, the first portion 21R overlaps with the second portion 52R, as viewed in the z-direction.

The third portion 23R and the fourth portion 24R are covered with the encapsulating resin 7. The third portion 23R is connected to the first portion 21R and the fourth portion 24R. The fourth portion 24R is shifted in the z-direction with respect to the first portion 21R. The end portion of the fourth portion 24R is flush with the fifth face 75 of the resin 7. In the illustrated example, the third portion 23R and the fourth portion 24R generally coincide with each other, as viewed in the y-direction. Here, the expression "generally coincide" as viewed in the y-direction refers to, for example, exactly coinciding with each other, or being deviated by within ±5% of the characteristic size (size of the third portion 23R or fourth portion 24R in the x-direction). The third portion 23R overlaps with the fifth face 35 of the substrate 3, as viewed in the z-direction.

The second portion 22R is connected to the end portion of the fourth portion 24R, and corresponds to a portion of the lead 2R sticking out from the encapsulating resin 7 to the opposite side of the plurality of leads 1, as viewed in the y-direction. The second portion 22R sticks out to the opposite side of the first portion 21R, in the y-direction. The second portion 22R is used, for example, to electrically connect the semiconductor device A3 to an external circuit. In the illustrated example, the second portion 22R is bent, for example, in the z-direction. The second portion 22R, the third portion 23R, and the fourth portion 24R each include, on the respective sides thereof in the x-direction, edges extending along the y-direction. The edges of the second portion 22R, the third portion 23R, and the fourth portion 24R, on the side of the third face 33 in the x-direction, are respectively opposed to the edges of the second portion 22Q, the third portion 23Q, and the fourth portion 24Q, on the side of the fourth face 34 in the x-direction.

The lead 2S is spaced apart from the plurality of leads 1. The lead 2S is located on the conductive section 5. The lead 2S is electrically connected to the conductive section 5. The lead 2S exemplifies a second lead in the present disclosure. The lead 2S is bonded to the second portion 52S of the wiring 50S in the conductive section 5, via the conductive bonding material 82.

The configuration of the lead 2S is not specifically limited. In this embodiment, as shown in FIG. 59, the lead 2S includes a first portion 21S, a second portion 22S, a third portion 23S, and a fourth portion 24S, each of which will be described hereunder.

The first portion 21S is bonded to the second portion 52S of the wiring 50S. The shape of the first portion 21S is not specifically limited, and a desired shape may be selected from a rectangular shape, a polygonal shape, a circular shape, an elliptical shape, and so forth. In the illustrated example, the first portion 21S has a bent shape including a portion extending along the x-direction, a portion inclined with respect to the x-direction and the y-direction, and a portion extending along the y-direction. The first portion 21S overlaps with the fourth face 34 of the substrate 3 as viewed in the z-direction, and sticks out in the x-direction, toward the side to which the fourth face 34 is oriented. In the illustrated example, the first portion 21S overlaps with the second portion 52S, as viewed in the z-direction.

The third portion 23S and the fourth portion 24S are covered with the encapsulating resin 7. The third portion 23S is connected to the first portion 21S and the fourth portion 24S. The fourth portion 24S is shifted in the z-direction with respect to the first portion 21S. The end portion of the fourth portion 24S is flush with the fifth face 75 of the resin 7. In the illustrated example, the third portion 23S and the fourth portion 24S generally coincide with each other, as viewed in the y-direction. Here, the expression "generally coincide" as viewed in the y-direction refers to, for example, exactly coinciding with each other, or being deviated by within ±5% of the characteristic size (size of the third portion 23S or fourth portion 24S in the x-direction).

The second portion 22S is connected to the end portion of the fourth portion 24S, and corresponds to a portion of the lead 2S sticking out from the encapsulating resin 7 to the opposite side of the plurality of leads 1, as viewed in the y-direction. The second portion 22S sticks out to the opposite side of the first portion 21S, in the y-direction. The second portion 22S is used, for example, to electrically connect the semiconductor device A3 to an external circuit. In the illustrated example, the second portion 22S is bent, for example, in the z-direction. The second portion 22S, the third portion 23S, and the fourth portion 24S each include, on the respective sides thereof in the x-direction, edges extending along the y-direction. The edges of the second portion 22S, the third portion 23S, and the fourth portion 24S, on the side of the third face 33 in the x-direction, are respectively opposed to the edges of the second portion 22R, the third portion 23R, and the fourth portion 24R, on the side of the fourth face 34 in the x-direction.

The lead 2T is spaced apart from the plurality of leads 1. The lead 2T is located on the conductive section 5. The lead 2T is electrically connected to the conductive section 5. The lead 2T exemplifies a second lead in the present disclosure. The lead 2T is bonded to the second portion 52T of the wiring 50T in the conductive section 5, via the conductive bonding material 82.

The configuration of the lead 2T is not specifically limited. In this embodiment, as shown in FIG. 58 and FIG. 59, the lead 2T includes a first portion 21T, a second portion 22T, a third portion 23T, and a fourth portion 24T, each of which will be described hereunder.

The first portion 21T is bonded to the second portion 52T of the wiring 50T. The shape of the first portion 21T is not specifically limited, and a desired shape may be selected from a rectangular shape, a polygonal shape, a circular shape, an elliptical shape, and so forth. In the illustrated example, the first portion 21T has a bent shape including a portion extending along the x-direction, a portion inclined with respect to the x-direction and the y-direction, and a portion extending along the y-direction. The first portion 21T overlaps with the fourth face 34 of the substrate 3 as viewed in the z-direction, and sticks out in the x-direction, toward the side to which the fourth face 34 is oriented. In the illustrated example, the first portion 21T overlaps with the second portion 52T, as viewed in the z-direction.

The third portion 23T and the fourth portion 24T are covered with the encapsulating resin 7. The third portion 23T is connected to the first portion 21T and the fourth portion 24T. The fourth portion 24T is shifted in the z-direction with respect to the first portion 21T, to the side to which the first face 31 is oriented, like the third portion 23I and the fourth portion 24I of the lead 2I shown in FIG. 40. The end portion of the fourth portion 24T is flush with the fifth face 75 of the resin 7. In the illustrated example, the third portion 23T and the fourth portion 24T generally coincide with each other, as viewed in the y-direction. Here, the expression "generally coincide" as viewed in the y-direction refers to, for example, exactly coinciding with each other, or being deviated by within ±5% of the characteristic size (size of the third portion 23T or fourth portion 24T in the x-direction).

The second portion 22T is connected to the end portion of the fourth portion 24T, and corresponds to a portion of the lead 2T sticking out from the encapsulating resin 7 to the opposite side of the plurality of leads 1, as viewed in the y-direction. The second portion 22T sticks out to the opposite side of the first portion 21T, in the y-direction. The second portion 22T is used, for example, to electrically connect the semiconductor device A3 to an external circuit. In the illustrated example, the second portion 22T is bent, for example, in the z-direction. The second portion 22T, the third portion 23T, and the fourth portion 24T each include, on the respective sides thereof in the x-direction, edges extending along the y-direction. The edges of the second portion 22T, the third portion 23T, and the fourth portion 24T, on the side of the third face 33 in the x-direction, are respectively opposed to the edges of the second portion 22S, the third portion 23S, and the fourth portion 24S, on the side of the fourth face 34 in the x-direction.

The lead 2U is spaced apart from the plurality of leads 1. The lead 2U is located on the conductive section 5. The lead 2U is electrically connected to the conductive section 5. The lead 2U exemplifies a second lead in the present disclosure. The lead 2U is bonded to the second portion 52U of the wiring 50U in the conductive section 5, via the conductive bonding material 82.

The configuration of the lead 2U is not specifically limited. In this embodiment, as shown in FIG. 58 and FIG. 59, the lead 2U includes a first portion 21U, a second portion 22U, a third portion 23U, and a fourth portion 24U, each of which will be described hereunder.

The first portion 21U is bonded to the second portion 52U of the wiring 50U. The shape of the first portion 21U is not specifically limited, and a desired shape may be selected from a rectangular shape, a polygonal shape, a circular shape, an elliptical shape, and so forth. In the illustrated example, the first portion 21U has a bent shape including a portion extending along the x-direction, a portion inclined with respect to the x-direction and the y-direction, and a portion extending along the y-direction. The first portion 21U overlaps with the fourth face 34 of the substrate 3 as viewed in the z-direction, and sticks out in the x-direction, toward the side to which the fourth face 34 is oriented. In the illustrated example, the first portion 21U overlaps with the second portion 52U, as viewed in the z-direction.

The third portion 23U and the fourth portion 24U are covered with the encapsulating resin 7. The third portion 23U is connected to the first portion 21U and the fourth portion 24U. The fourth portion 24U is shifted in the z-direction with respect to the first portion 21U. The end portion of the fourth portion 24U is flush with the fifth face 75 of the resin 7. In the illustrated example, the third portion 23U and the fourth portion 24U generally coincide with each other, as viewed in the y-direction. Here, the expression "generally coincide" as viewed in the y-direction refers to, for example, exactly coinciding with each other, or being deviated by within ±5% of the characteristic size (size of the third portion 23U or fourth portion 24U in the x-direction).

The second portion 22U is connected to the end portion of the fourth portion 24U, and corresponds to a portion of the lead 2U sticking out from the encapsulating resin 7 to the opposite side of the plurality of leads 1, as viewed in the y-direction. The second portion 22U sticks out to the opposite side of the first portion 21U, in the y-direction. The second portion 22U is used, for example, to electrically connect the semiconductor device A3 to an external circuit. In the illustrated example, the second portion 22U is bent, for example, in the z-direction. The second portion 22U, the third portion 23U, and the fourth portion 24U each include, on the respective sides thereof in the x-direction, edges extending along the y-direction. The edges of the second portion 22U, the third portion 23U, and the fourth portion 24U, on the side of the third face 33 in the x-direction, are respectively opposed to the edges of the second portion 22T, the third portion 23T, and the fourth portion 24T, on the side of the fourth face 34 in the x-direction.

<Semiconductor Chips 4A to 4F>

The semiconductor chips 4A to 4F, located on the plurality of leads 1, each exemplify a semiconductor chip in the present disclosure. The type and the function of the semiconductor chips 4A to 4F are not specifically limited. In this embodiment, the semiconductor chips 4A to 4F are a transistor. Although six semiconductor chips 4A to 4F are provided in the illustrated example, the number of semiconductor chips is by no means limited.

The semiconductor chips 4A to 4F in the illustrated example are, for example, a transistor configured as an IGBT, like those of the semiconductor device A2.

In this embodiment, as shown in FIG. 58, three semiconductor chips 4A, 4B, and 4C are provided on the first portion 11A of the lead 1A. The three semiconductor chips 4A, 4B, and 4C are spaced apart from each other in the x-direction, and overlap with each other as viewed in the x-direction. Here, the number of semiconductor chips to be mounted on the lead 1A is by no means limited. In the illustrated example, the respective collector electrodes of the semiconductor chips 4A, 4B, and 4C are bonded to the first portion 11A, via the conductive bonding material 83.

The conductive bonding material 83 may be any material that is capable of bonding, and electrically connecting, the collector electrode CP of the semiconductor chips 4A, 4B, and 4C, to the first portion 11A. For example, silver paste, copper paste, or solder may be employed as the conductive bonding material 83. The conductive bonding material 83 corresponds to the second conductive bonding material in the present disclosure.

In this embodiment, the semiconductor chip 4D is provided on the first portion 11B of the lead 1B. Here, the number of semiconductor chips to be mounted on the lead 1B is by no means limited. In the illustrated example, the collector electrode of the semiconductor chip 4D is bonded to the first portion 11B, via the conductive bonding material 83.

In this embodiment, the semiconductor chip 48 is provided on the first portion 11C of the lead 1C. Here, the number of semiconductor chips to be mounted on the lead 1C is by no means limited. In the illustrated example, the collector electrode of the semiconductor chip 48 is bonded to the first portion 11C, via the conductive bonding material 83.

In this embodiment, the semiconductor chip 4F is provided on the first portion 11D of the lead 1D, Here, the number of semiconductor chips to be mounted on the lead 1D is by no means limited. In the illustrated example, the collector electrode of the semiconductor chip 4F is bonded to the first portion 11D, via the conductive bonding material 83.

<Diodes 41A to 41F>

The configuration of the diodes 41A to 41F is not specifically limited and may be, for example, similar to that of the diodes 41A to 41F of the semiconductor device A2.

As in the semiconductor device A2, the diode 41A, the diode 4B, and the diode 41C are mounted on the first portion 11A. The diode 41D is mounted on the first portion 1B. The diode 41E is mounted on the first portion 11C. The diode 41F is mounted on the first portion 11D.

The diode 41A overlaps with the semiconductor chip 4A, as viewed in the y-direction. The diode 41B overlaps with the semiconductor chip 4B, as viewed in the y-direction. The diode 41C overlaps with the semiconductor chip 4C, as viewed in the y-direction. The diodes 41A, 41B, and 41C overlap with each other, as viewed in the x-direction.

The diode 41D overlaps with the semiconductor chip 4D, as viewed in the y-direction. The diode 41E overlaps with the semiconductor chip 4E, as viewed in the y-direction. The diode 41F overlaps with the semiconductor chip 4F, as viewed in the y-direction. The diodes 41D, 41E, and 41F overlap with each other, as viewed in the x-direction.

<Control Chips 4G, 4H>

The configuration of the control chips 4G and 4H is not specifically limited and may be, for example, similar to that of the control chips 4G and 4H of the semiconductor device A1.

In this embodiment, as shown in FIG. 59, the control chip 4G is mounted on the first base portion 55 of the conductive section 5. The control chip 4H is mounted on the second base portion 56 of the conductive section 5. In this embodiment, the control chip 4G is bonded to the first base portion 55, via the conductive bonding material 84. The control chip 4H is bonded to the second base portion 56, via the conductive bonding material 84.

The conductive bonding material 84 may be any material that is capable of bonding, and electrically connecting, the control chip 4G to the first base portion 55, and the control chip 4H to the second base portion 56. For example, silver paste, copper paste, or solder may be employed as the conductive bonding material 84. The conductive bonding material 84 corresponds to the third conductive material in the present disclosure. In this embodiment, the conductive bonding material 84 extends outwardly from the outer periphery of the control chips 4G and 4H, in a plan view. A reason of such a configuration is that, for example, when the conductive bonding material 84 performs the bonding function by curing after the fused state, the conductive bonding material 84 in the fused state spreads around the control chip 4G (control chip 4H) as viewed in the z-direction. Therefore, in the illustrated example, the conductive bonding material 84 protrudes from the respective outer edges of the control chips 4G and 4H, as viewed in the z-direction. However, the specific shape of the conductive bonding material 84 is by no means limited. Here, the control chips 4G and 4H may be bonded to the first base portion 55 via an insulative bonding material, instead of the conductive bonding material 84. In the illustrated example, the conductive bonding material 84 has an uneven outer edge, as viewed in the z-direction. Such formation of the conductive bonding material 84 allows the control chips 4G and 4H to be bonded to a region of the conductive section 5 more distant from the control chips 4G and 4H, thereby further stabilizing the adhesion of the control chips 4G and 4H.

The control chip 4G is located between the leads 2A to 2U and the leads 1A to 1G, as viewed in the x-direction. The control chip 4H is located between the leads 2A to 2U and the leads 1A to 1G, as viewed in the x-direction. The control chips 4G and the control chips 4H overlap with each other, as viewed in the x-direction. The control chip 4G overlaps with the semiconductor chips 43 and 4C, as viewed in the y-direction. The control chip 4H overlaps with the semiconductor chips 4D and 4E, as viewed in the y-direction. The control chip 4H overlaps with the transmission circuit chip 4I and the primary-side circuit chip 4J, as viewed in the y-direction. The control chip 4C may overlap with the semiconductor chip 4A, as viewed in the y-direction. The control chip 4H may overlap with the semiconductor chip 4F, as viewed in the y-direction.

<Transmission Circuit Chip 4I>

The transmission circuit chip 4I includes the first transmission circuit in the present disclosure. Like the transmission circuit chip 4I in the semiconductor device A2, the transmission circuit chip 4I has a transformer structure including at least two coils opposed to each other with a gap therebetween, to transmit electrical signals. In this embodiment, as shown in FIG. 59, the transmission circuit chip 4I is, for example, mounted on the third base portion 58 via the conductive bonding material 84. The transmission circuit chip 4I is located between the control chip 4H and the primary-side circuit chip 4J, as viewed in the x-direction. The transmission circuit chip 4I overlaps with the control chip 4H, as viewed in the y-direction. Further, the transmission circuit chip 4I overlaps with the first portions 51I to 51N (wirings 50I to 50N), as viewed in the y-direction. In the illustrated example, the conductive bonding material 84 protrudes from the outer edge of the transmission circuit chip 4I, as viewed in the z-direction.

<Primary-Side Circuit Chip 4J>

The primary-side circuit chip 4J transmits command signals to the control chip 4H, through the transmission circuit chip 4I. In this embodiment, as shown in FIG. 59, the primary-side circuit chip 4J is, for example, mounted on the third base portion 58 via the conductive bonding material 84. The primary-side circuit chip 4J is located on the side of the fifth face 35 in the y-direction, with respect to the transmission circuit chip 4I.

<Diodes 49U, 49V, 49W>

The configuration of the diodes 49U, 49V, and 49W is not specifically limited and may be, for example, similar to that of the diodes 49U, 49V, and 49W of the semiconductor device A2.

<First Wires 91A to 91F>

Regarding the first wires 91A to 91F according to this embodiment, although any of the elements is apparently given, for the sake of convenience of description, the same numeral as that of the first wires 91A to 91F according to the second embodiment, it does not necessarily mean that the mentioned element has the same or similar configuration. The configuration of an element with a numeral is defined by the description relevant to this embodiment.

The first wires 91A to 91F are each connected to one of the semiconductor chips 4A to 4F and one of the plurality of leads 1. The material of the first wires 91A to 91F is not specifically limited and, for example, aluminum (Al) or copper (Cu) may be employed. The wire diameter of the first wires 91A to 91F is not specifically limited and, for example, may be approximately 250 to 500 μm. The first wires 91A to 91F correspond to the first conductive material in the present disclosure. Here, for example leads formed of copper may be employed, in place of the first wires 91A to 91F.

The collector electrode of the semiconductor chip 4A and the cathode electrode of the diode 41A are connected to each other, via the first portion 11A and the conductive bonding material 83. The collector electrode CP of the semiconductor chip 4B and the cathode electrode of the diode 41B are connected to each other, via the first portion 11A and the conductive bonding material 83. The collector electrode CP of the semiconductor chip C and the cathode electrode of the diode 41C are connected to each other, via the first portion 11A and the conductive bonding material 83.

The first wire 91A has one end connected to the emitter electrode of the semiconductor chip 4A, an intermediate portion connected to the anode electrode of the diode 41A, and the other end connected to the fourth portion 14B of the lead 1B. In the illustrated example, the number of first wires 91A is not specifically limited. In the illustrated example, three first wires 91A are provided.

The first wire 91B has one end connected to the emitter electrode of the semiconductor chip 4B, an intermediate portion connected to the anode electrode of the diode 41B, and the other end connected to the fourth portion 14C of the lead 1C. In the illustrated example, the number of first wires 91B is not specifically limited. In the illustrated example, three first wires 91B are provided.

The first wire 91C has one end connected to the emitter electrode of the semiconductor chip 4C, an intermediate portion connected to the anode electrode of the diode 41C, and the other end connected to the fourth portion 14D of the lead 1D. In the illustrated example, the number of first wires 91C is not specifically limited. In the illustrated example, three first wires 91C are provided.

The first wire 91D has one end connected to the emitter electrode of the semiconductor chip 4D, an intermediate portion connected to the anode electrode of the diode 41D, and the other end connected to the fourth portion 14E of the lead 1E. In the illustrated example, the number of first wires 91D is not specifically limited. In the illustrated example, three first wires 91D are provided.

The first wire 91E has one end connected to the emitter electrode of the semiconductor chip 4E, an intermediate portion connected to the anode electrode of the diode 41E, and the other end connected to the fourth portion 14F of the lead 1F. In the illustrated example, the number of first wires 91E is not specifically limited. In the illustrated example, three first wires 91E are provided.

The first wire 91F has one end connected to the emitter electrode of the semiconductor chip 4F, an intermediate portion connected to the anode electrode of the diode 41F, and the other end connected to the fourth portion 14G of the lead 1G. In the illustrated example, the number of first wires 91F is not specifically limited. In the illustrated example, three first wires 91F are provided.

<Second Wires 92>

Regarding the second wire 92 according to this embodiment, although any of the elements is apparently given, for the sake of convenience of description, the same numeral as that of the second wire 92 according to the second embodiment, it does not necessarily mean that the mentioned element has the same or similar configuration. The configuration of an element with a numeral is defined by the description relevant to this embodiment.

The plurality of second wires 92 are each connected to one of the control chips 4G and 4H, as shown in FIG. 58 and FIG. 59. The material of the second wires 92 is not specifically limited and, for example, gold (Au) may be employed. The wire diameter of the second wires 92 is not specifically limited and, in this embodiment, finer than the first wires 91A to 91F. The wire diameter of the second wires 92 is, for example, approximately 10 μm to 50 μm. The second wires 92 correspond to the second conductive material in the present disclosure. In the subsequent description, the second wires 92 connected to the control chip 4G will be referred to as second wires 92G, and the second wires 92 connected to the control chip 4H will be referred to as second wires 92H.

The second wire 92G is connected to the gate electrode of the semiconductor chip 4A, and the second portion 52*a* of the wiring 50*a*. Another second wire 92G is connected to the emitter electrode of the semiconductor chip 4A, and the second portion 52*b*.

The second wire 92G is connected to the gate electrode of the semiconductor chip 4B, and the control chip 4G. Another second wire 92G is connected to the emitter electrode of the semiconductor chip 4E, and the control chip 4G.

The second wire 92G is connected to the gate electrode of the semiconductor chip 4C, and the control chip 4G. Another second wire 92G is connected to the emitter electrode of the semiconductor chip 4C, and the control chip 4G.

The second wire 92H is connected to the gate electrode of the semiconductor chip 4D, and the control chip 4H. Another second wire 92H is connected to the gate electrode of the semiconductor chip 4E, and the control chip 4H. Another second wire 92H is connected to the gate electrode of the semiconductor chip 4F, and the second portion 52*f* of the wiring 50*f*.

<Third Wires 93>

As shown in FIG. 58 and FIG. 59, the plurality of third wires 93 are connected to one of the control chips 4G and 4H, as in the semiconductor device A2. The material of the third wire is not specifically limited and, for example, a similar material to that of the second wire 92 may be employed.

<Fourth Wires 94>

As shown in FIG. 58 and FIG. 59, the plurality of fourth wires 94 are connected to the transmission circuit chip 4I and the primary-side circuit chip 4J, as in the semiconductor device A2. The material of the fourth wire 94 is not specifically limited and, for example, a similar material to that of the second wire 92 may be employed.

<Fifth Wires 95>

As shown in FIG. 58 and FIG. 59, the plurality of fifth wires 95 are connected to the primary-side circuit chip 4J and the conductive section 5, as in the semiconductor device A2. The material of the fifth wire 95 is not specifically limited and, for example, a similar material to that of the second wire 92 may be employed.

<Sixth Wires 96>

As shown in FIG. 58 and FIG. 59, the plurality of sixth wires 96 are connected to the control chips 4G and the conductive section 5, as in the semiconductor device A2. The material of the sixth wire 96 is not specifically limited and, for example, a similar material to that of the second wire 92 may be employed.

<Seventh Wires 97>

As shown in FIG. 58 and FIG. 59, the plurality of seventh wires 97 are connected to the control chips 4H and the conductive section 5, as in the semiconductor device A2. The material of the seventh wires 97 is not specifically limited and, for example, a similar material to that of the second wire 92 may be employed.

<Resin 7>

Regarding the resin 7 according to this embodiment, although any of the elements is apparently given, for the sake of convenience of description, the same numeral as that of the resin 7 according to the second embodiment, it does not necessarily mean that the mentioned element has the same or similar configuration. The configuration of an element with a numeral is defined by the description relevant to this embodiment.

The resin 7 covers at least the semiconductor chips 4A to 4F, the control chips 4G and 4H, the transmission circuit chip 4I, the primary-side circuit chip 4J, a part of each of the plurality of leads 1, and a part of each of the plurality of leads 2. In this embodiment, in addition, the resin 7 covers the diodes 41A to 41F, the diodes 49U, 49V, and 49W, the plurality of first wires 91A to 91F, the plurality of second wires 92, the plurality of third wires 93, the plurality of fourth wires 94, the plurality of fifth wires 95, the plurality of sixth wires 96, and the plurality of seventh wires 97. The material of the resin 7 is not specifically limited. Though not specifically limited, for example an insulative material such as an epoxy resin or silicone gel may be employed to form the resin 7.

In this embodiment, the resin 7 includes a first face 71, a second face 72, a third face 73, a fourth face 74, a fifth face 75, a sixth face 76, a recess 731, a recess 732, a recess 733, a hole 741, and a hole 742, which are similar to those of the semiconductor device A2.

The circuit configuration of the semiconductor device A3 may be, for example, similar to that of the diodes 41A to 41F of the semiconductor device A2.

In this embodiment, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 2A is the VSU terminal. The lead 2B is the VBU terminal. The lead 2C is the VSV terminal. The lead 2D is the VBV terminal. The lead 2E is the VSW terminal. The lead 2F is the VBW terminal. The lead 2G is the first GND terminal. The lead 2H is the first VCC terminal. The lead 2I is the HINU terminal. The lead 2J is the HINV terminal. The lead 2K is the HINW terminal. The lead 2L is the LINU terminal. The lead 2M is the LINV terminal. The lead 2N is the LINW terminal. The lead 2O is the FO terminal. The lead 2P is the VOT terminal. The lead 2Q is the third VCC terminal. The lead 2R is the third GND. The lead 2S is the CIN terminal. The lead 2T is the second VCC terminal. The lead 2U is the second GND terminal.

This embodiment provides similar advantageous effects to those provided by the semiconductor device A2.

First Variation of Third Embodiment

Figure 60:
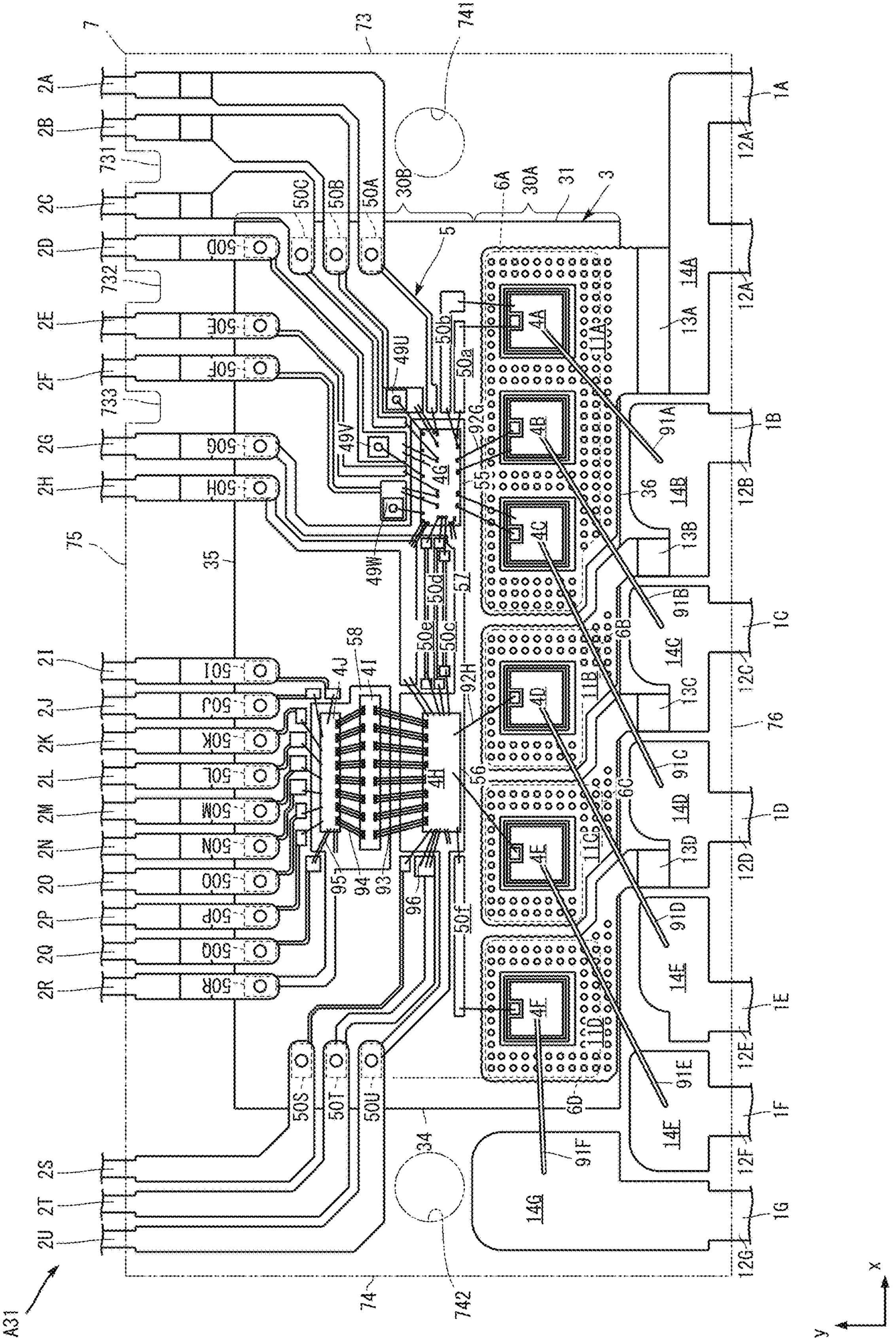
FIG. 60 is a plan view showing a first variation of the semiconductor device according to the third embodiment of the present disclosure.

Referring to FIG. 60, a first variation of the semiconductor device A3 will be described. In the semiconductor device A31 according to this variation, the semiconductor chips 4A to 4F are, for example like the semiconductor device A1, the metal-oxide-semiconductor field-effect transistor (MOSFET) formed on a silicon carbide (SiC) substrate, in other words SiC MOSFET. Here, the semiconductor chips 4A to 4F may be a MOSFET formed on a silicon (Si) substrate instead of the SiC substrate, and may be configured as, for example, an IGBT element. Alternatively, the semiconductor chips 4A to 4F may be a MOSFET containing GaN. In this variation, each of the semiconductor chips 4A to 4F is an N-type MOSFET. The semiconductor chips 4A to 4F according to this embodiment are the same MOSFET as each other.

In accordance with the configuration of the semiconductor chips 4A to 4F, the configuration of the plurality of leads 1 of the semiconductor device A31 is similar to that of the semiconductor device A1. In addition, the semiconductor device A31 is without the plurality of diodes 41. The configuration of the remaining components is similar to that of the semiconductor device A3.

In this variation, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 2A is the VSU terminal. The lead 2B is the VEU terminal. The lead 2C is the VSV terminal. The lead 2D is the VBV terminal. The lead 2E is the VSW terminal. The lead 2F is the VBW terminal. The lead 2G is the first GND terminal. The lead 2H is the first VCC terminal. The lead 2I is the HINU terminal. The lead 2J is the HINV terminal. The lead 2K is the HINW terminal. The lead 2L is the LINU terminal. The lead 2M is the LINV terminal. The lead 2N is the LINW terminal. The lead 2O is the FO terminal. The lead 2P is the VOT terminal. The lead 2Q is the third VCC terminal. The lead 2R is the third GND. The lead 2S is the CIN terminal. The lead 2T is the second VCC terminal. The lead 2U is the second GND terminal.

This variation also provides similar advantageous effects to those provided by the semiconductor device A2 and the semiconductor device A3. In addition, the semiconductor device A31 can be manufactured in a smaller size, for example compared with the semiconductor device A3.

Fourth Embodiment

Figure 61:
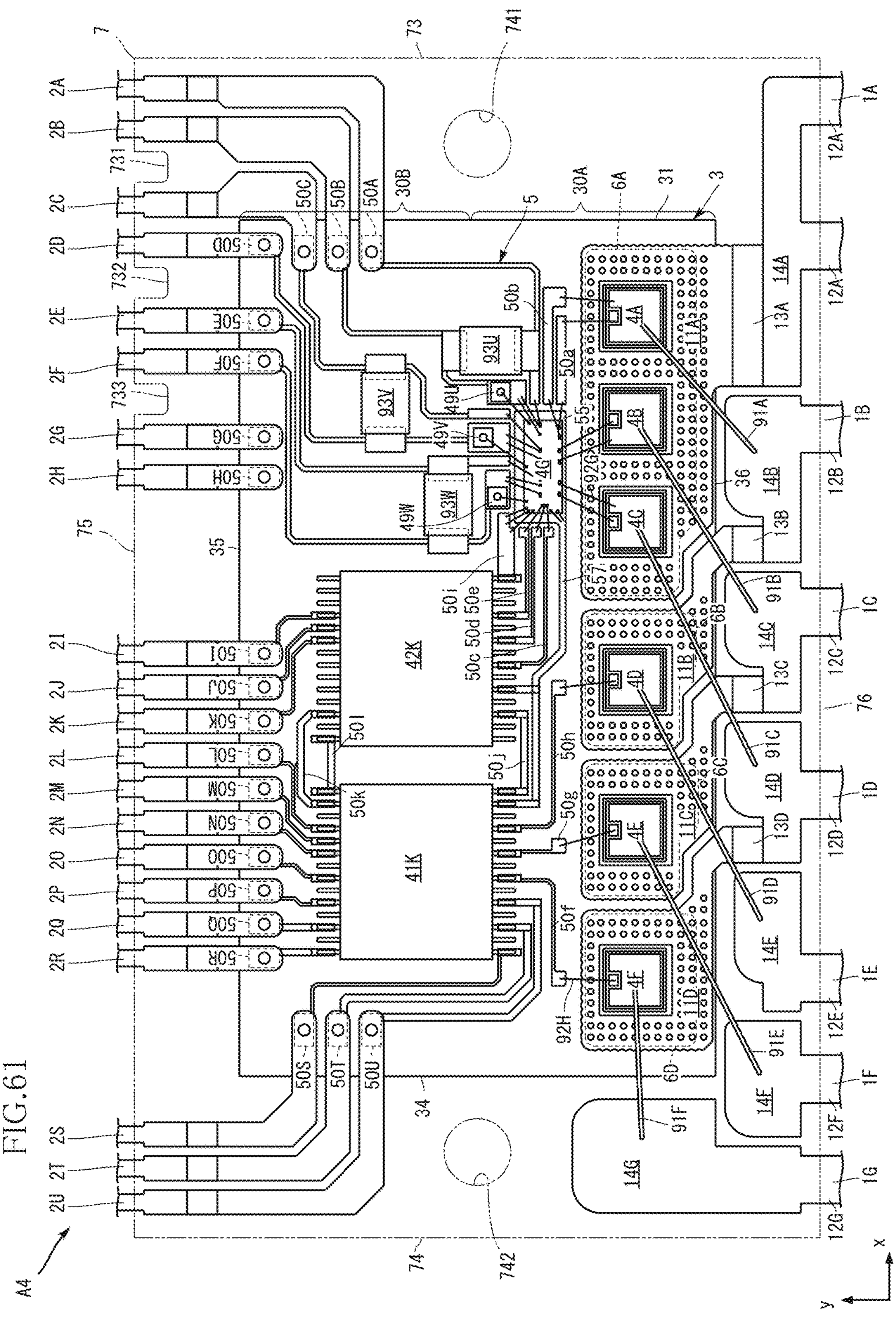
FIG. 61 is a plan view showing a semiconductor device according to a fourth embodiment of the present disclosure.
Figure 62:
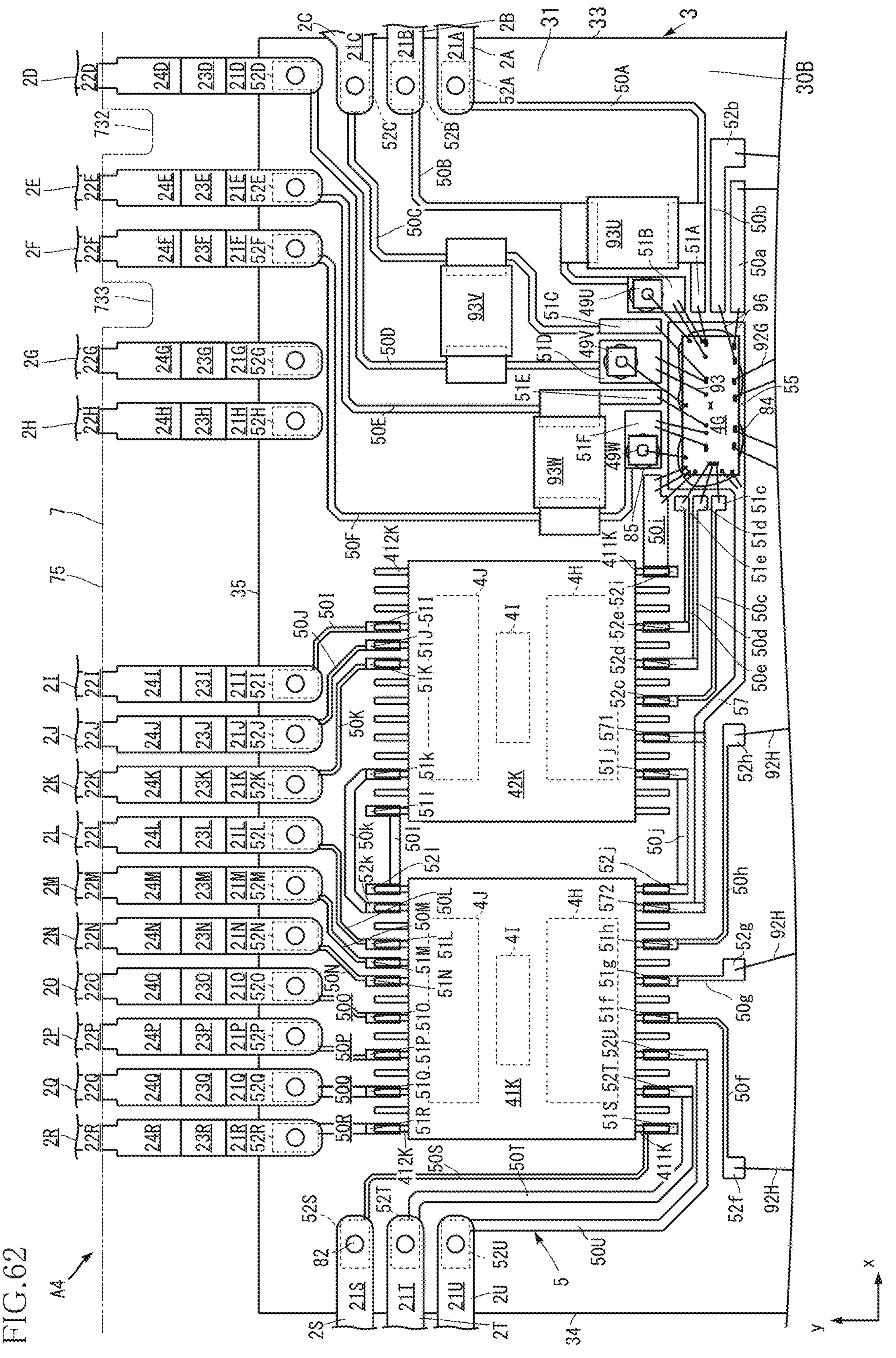
FIG. 62 is an enlarged partial plan view of the semiconductor device according to the fourth embodiment of the present disclosure.
Figure 63:
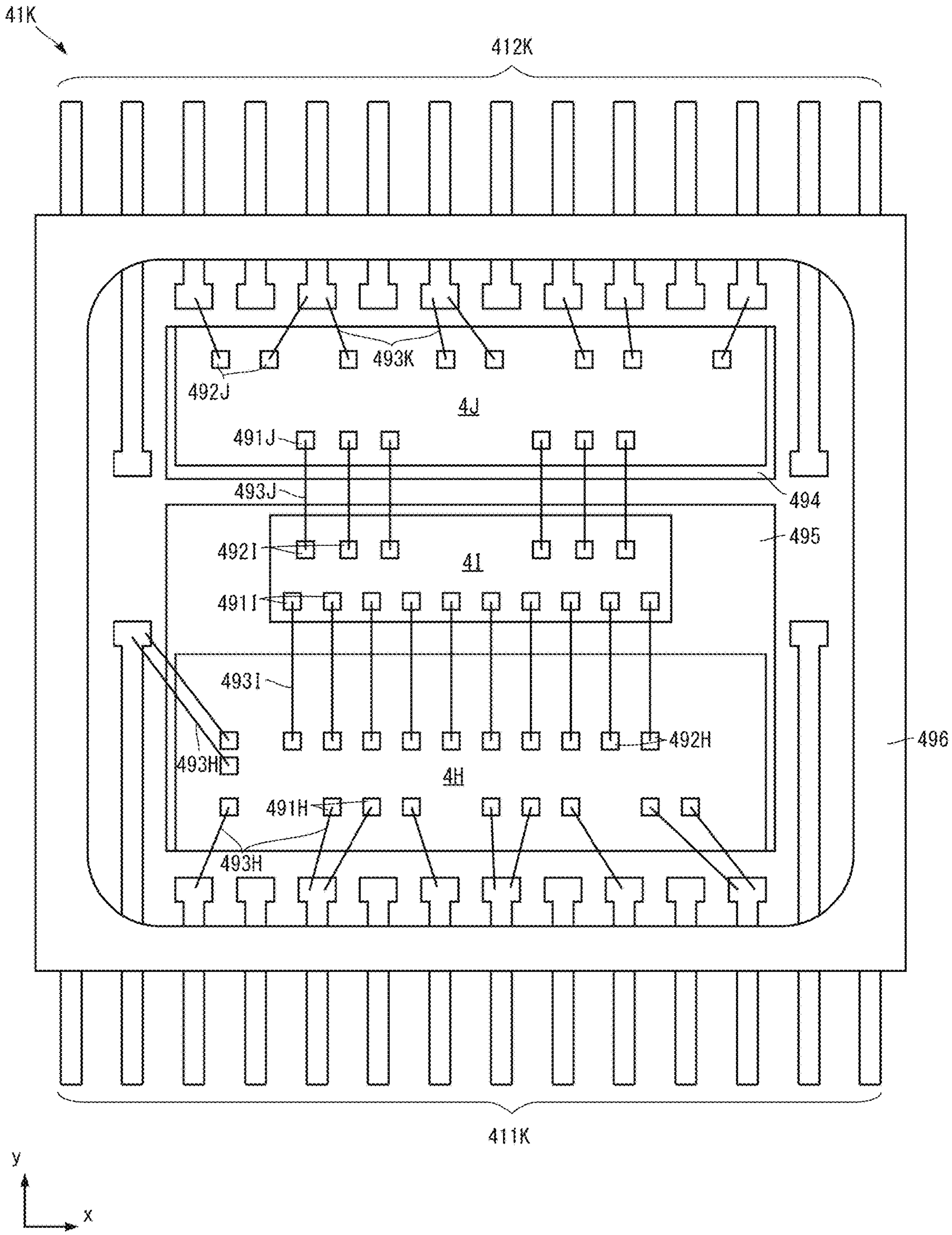
FIG. 63 is a plan view of a signal transmission element of the semiconductor device according to the fourth embodiment of the present disclosure.

Referring to FIG. 61 to FIG. 63, a semiconductor device according to a fourth embodiment of the present disclosure will be described. The semiconductor device A4 according to this embodiment includes a plurality of leads 1, a plurality of leads 2, a substrate 3, a plurality of semiconductor chips 4, a diode 41, a signal transmission element 41K, a signal transmission element 42K, a plurality of diodes 49, bootstrap capacitors 93U, 93V, and 93W, a conductive section 5, a plurality of bonding sections 6, a plurality of first wires 91, a plurality of second wires 92, a plurality of third wires 93, and an encapsulating resin 7.

The semiconductor device A4 according to this embodiment includes similar elements to those of the semiconductor device A2, A3, or A31. Such elements will be given the same numeral, and a part or the whole of the description thereof may be omitted. Regarding an element on which no specific description is given, a similar configuration to that of the corresponding element of the semiconductor device A2, A3, or A31 may be adopted, as appropriate.

FIG. 61 is a plan view showing the semiconductor device A4. FIG. 62 is an enlarged partial plan view of the semiconductor device A4. FIG. 63 is a plan view showing the signal transmission element 41K of the semiconductor device A4.

<Substrate 3>

The shape, size, and material of the substrate 3 are not specifically limited. The substrate 3 may be configured, for example, similarly to the substrate 3 of the semiconductor device A31.

<Conductive Section 5>

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 61 and FIG. 62, the conductive section 5 includes wirings 50A to 50U, wirings 50*a* to 50*l*, a first base portion 55, and a connecting portion 57, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape having the long sides extending along the x-direction.

The connecting portion 57 extends from the first base portion 55 in the x-direction, toward the fourth face 34. The connecting portion 57 includes a first portion 571 and a second portion 572.

The first portion 571 is located on the side of the fourth face 34 in the x-direction, with respect to the first base portion 55. The first portion 571 has a strip shape extending along the y-direction. The second portion 572 is located on the side of the fourth face 34 in the x-direction, with respect to the first portion 571. The second portion 572 has a strip shape extending along the y-direction.

The wirings 50A to 50U, 50*a*, and 50*b* are similar to the wirings 50A to 50U, 50*a*, and 50*b* of the semiconductor device A2, A3, or A31, except for differences in minor details of positional arrangement.

The wiring 50*c* includes a first portion 51*c* and a second portion 52*c*.

The first portion 51*c* is located on the side of the fourth face 34 in the x-direction with respect to the first base portion 55, and spaced therefrom. The first portion 51*c* is located between the connecting portion 57 and the first portion 51H, in the y-direction. The first portion 51*c* overlaps with the first base portion 55, as viewed in the x-direction. The shape of the first portion 51*c* is not specifically limited. In the illustrated example, the first portion 51*c* has a rectangular shape.

The second portion 52*c* is located on the side of the fourth face 34 in the x-direction with respect to the first portion 51*c*, and spaced therefrom. The second portion 52*c* is located on the side of the fifth face 35 in the y-direction with respect to the first portion 51*c*, and spaced therefrom. The shape of the second portion 52*c* is not specifically limited, and a desired shape may be selected from a rectangular shape, a polygonal shape, a circular shape, an elliptical shape, and so forth. In the illustrated example, the second portion 52*c* has a strip shape extending along the y-direction.

The wiring 50*c* includes a strip-shaped portion connecting the first portion 51*c* and the second portion 52*c*. The strip-shaped portion includes a portion extending along the x-direction and a portion extending along the y-direction.

The wiring 50*d* includes a first portion 51*d* and a second portion 52*d*.

The first portion 51*d* is located on the side of the fourth face 34 in the x-direction with respect to the first base portion 55, and spaced therefrom. The first portion 51*d* is located between the first portion 51*c* and the first portion 51H, in the y-direction. The shape of the first portion 51*d* is not specifically limited. In the illustrated example, the first portion 51*d* has a rectangular shape.

The second portion 52*d* is located on the side of the fourth face 34 in the x-direction with respect to the first portion 51*d*, with a spacing therefrom, and on the side of the fifth face 35 in the y-direction, with respect to the first portion

51*d*. The second portion 52*d* is located on the side of the third face 33 in the x-direction, with respect to the second portion 52*c*. The shape of the second portion 52*d* is not specifically limited, and a desired shape may be selected from a rectangular shape, a polygonal shape, a circular shape, an elliptical shape, and so forth. In the illustrated example, the second portion 52*d* has a strip shape extending along the y-direction.

The wiring 50*d* includes a strip-shaped portion connecting the first portion 51*d* and the second portion 52*d*. The strip-shaped portion extends along the y-direction.

The wiring 50*e* includes a first portion 51*e* and a second portion 52*e*.

The first portion 51*e* is located on the side of the fourth face 34 in the x-direction with respect to the first base portion 55, and spaced therefrom. The first portion 51*e* is located between the first portion 51*d* and the first portion 51H, in the y-direction. The shape of the first portion 51*e* is not specifically limited. In the illustrated example, the first portion 51*e* has a rectangular shape.

The second portion 52*e* is located on the side of the fourth face 34 in the x-direction with respect to the first portion 51*e*, with a spacing therefrom, and on the side of the fourth face 34 in the x-direction, with respect to the second portion 52*d*. The second portion 52*e* is located on the side of the third face 33 in the x-direction, with respect to the second portion 52*c*. The shape of the second portion 52*e* is not specifically limited, and a desired shape may be selected from a rectangular shape, a polygonal shape, a circular shape, an elliptical shape, and so forth. In the illustrated example, the second portion 52*e* has a strip shape extending along the y-direction.

The wiring 50*e* includes a strip-shaped portion connecting the first portion 51*e* and the second portion 52*e*. The strip-shaped portion extends along the x-direction.

The wiring 50*f* includes a first portion 51*f* and a second portion 52*f*. The first portion 51*f* is located on the side of the third face 33 in the x-direction, with respect to the second portion 52U. The second portion 52*f* is located on the side of the fourth face 34 in the x-direction, and on the side of the sixth face 36 in the y-direction, with respect to the first portion 51*f*.

The wiring 50*f* includes a strip-shaped portion connecting the first portion 51*f* and the second portion 52*f*. The strip-shaped portion includes a portion extending along the x-direction and a portion extending along the y-direction.

The wiring 50*g* includes a first portion 51*g* and a second portion 52*g*.

The first portion 51*g* is located on the side of the third face 33 in the x-direction, with respect to the first portion 51*f*. The second portion 52*g* is located on the side of the sixth face 36 in the y-direction, with respect to the first portion 51*g*.

The wiring 50*g* includes a strip-shaped portion connecting the first portion 51*g* and the second portion 52*g*. The strip-shaped portion extends along the y-direction.

The wiring 50*h* includes a first portion 51*h* and a second portion 52*h*.

The first portion 51*h* is located between the first portion 51*g* and the second portion 572, in the x-direction. The second portion 52*h* is located on the side of the sixth face 36 in the y-direction, and on the side of the third face 33 in the x-direction, with respect to the first portion 51*h*.

The wiring 50*h* includes a strip-shaped portion connecting the first portion 51*h* and the second portion 52*h*. The strip-shaped portion includes a portion extending along the x-direction and a portion extending along the y-direction.

The wiring 50*i* includes a second portion 52*i*. The second portion 52*i* is located on the side of the third face 33 in the x-direction, with respect to the second portion 52*e*. The second portion 52*i* has a strip shape extending along the y-direction. The wiring 50*i* includes a portion extending from the second portion 52*i* along the x-direction, toward the third face 33.

The wiring 50*j* includes a first portion 51*j* and a second portion 52*j*.

The first portion 51*j* is located on the side of the fourth face 34 in the x-direction, with respect to the first portion 571. The second portion 52*j* is located on the side of the third face 33 in the x-direction, with respect to the second portion 572.

The wiring 50*j* includes a strip-shaped portion connecting the first portion 51*j* and the second portion 52*j*. The strip-shaped portion includes two portions extending along the y-direction and a portion extending along the x-direction.

The wiring 50*k* includes a first portion 51*k* and a second portion 52*k*.

The first portion 51*k* is located on the side of the fourth face 34 in the x-direction, with respect to the first portion 51K. The second portion 52*k* is located on the side of the third face 33 in the x-direction, with respect to the first portion 51L.

The wiring 50*k* includes a strip-shaped portion connecting the first portion 51*k* and the second portion 52*k*. The strip-shaped portion includes two portions extending obliquely and a portion extending along the x-direction.

The wiring 50*l* includes a first portion 51*l* and a second portion 52*l*.

The first portion 51*l* is located on the side of the fourth face 34 in the x-direction, with respect to the first portion 51*k*. The second portion 52*l* is located on the side of the third face 33 in the x-direction, with respect to the second portion 52*k*.

The wiring 50*l* includes a strip-shaped portion connecting the first portion 51*l* and the second portion 52*l*. The strip-shaped portion extends along the x-direction.

<Bonding Section 6>

The configuration of the bonding section 6 according to this embodiment may be, for example, similar to that of the semiconductor device A3.

<Lead 1>

The configuration of the lead 1 according to this embodiment may be, for example, similar to that of the semiconductor device A31.

<Lead 2>

The configuration of the plurality of leads 2 according to this embodiment may be, for example, similar to that of the semiconductor device A3. It should be noted that the lead 2G and the lead 2H are not utilized as electrical terminals, in this embodiment.

<Semiconductor Chips 4A to 4F>

The configuration of the semiconductor chips 4A to 4F may be, for example, similar to that of the semiconductor device A31.

<Signal Transmission Elements 41K and 42K>

As shown in FIG. 61 and FIG. 62, the signal transmission elements 41K and 42K are located on the first face 31 of the substrate 3. The signal transmission elements 41K and 42K are aligned in the x-direction.

The signal transmission elements 41K and 42K have the same configuration. FIG. 63 illustrates a part of the internal configuration of the signal transmission element 41K.

The signal transmission element 41K includes a first die pad 494 on which a plurality of leads 411K and 412K and the primary-side circuit chip 4J are mounted, a second die pad 495 on which the transmission circuit chip 4I and the control chip 4H are mounted, and an encapsulating resin 496 that encapsulates a part or the whole of the cited die pads.

The encapsulating resin 496 is, for example, formed of an epoxy resin, in a quadrate (square) plate shape. The plurality of leads 411K and 412K are aligned in the x-direction with a clearance between each other, along the end portions of the encapsulating resin 496 in the y-direction. The plurality of leads 411K and 412K each extend along the y-direction, and stick out from the respective side faces of the encapsulating resin 496 in the y-direction. Accordingly, the signal transmission element 41K is configured as a small outline package (SOP). However, the signal transmission element 41K may be configured as various other types of package, such as a quad flat package (QFP) or a small outline j-lead package (SOJ), without limitation to the SOP.

The first die pad 494 and the second die pad 495 are aligned in the y-direction, with a spacing therebetween. The transmission circuit chip 4I is located between the primary-side circuit chip 4J and the control chip 4H, in the y-direction.

A plurality of pads 492J and 491J are provided on the surface of the primary-side circuit chip 4J. The plurality of pads 492J are aligned along the long side of the primary-side circuit chip 4J closer to the leads 412K, and connected thereto via a wire 493K. The plurality of pads 491J are aligned along the long side of the primary-side circuit chip 4J on the opposite side of the leads 412K (on the side of the transmission circuit chip 4I).

A plurality of low-voltage pads 492I and a plurality of high-voltage pads 491I are provided on the surface of the transmission circuit chip 4I. The plurality of low-voltage pads 492I are aligned along the long side of the transmission circuit chip 4I on the side of the primary-side circuit chip 4J, and connected to the plurality of pads 491J of the primary-side circuit chip 4J, via a wire 493J. The plurality of high-voltage pads 491I are aligned along the long sides of the transmission circuit chip 4I, in a central region thereof in the y-direction.

A plurality of pads 492H, 491H are provided on the surface of the control chip 4H. The plurality of pads 492H are aligned along the long side of the control chip 4H closer to the transmission circuit chip 4I, and connected to the high-voltage pad 491I via a wire 493I. The plurality of pads 491H are aligned along the long side of the control chip 4H on the opposite side of the transmission circuit chip 4I (closer to the lead 411K), and connected to the leads 411K via a wire 493H. Here, the configuration of the signal transmission elements 41K and 42K may be modified as desired, without limitation to the configuration shown in FIG. 63.

In the illustrated example, as shown in FIG. 62, the plurality of leads 411K of the signal transmission element 41K are conductively bonded to the second portion 52*j*, the second portion 572, the first portion 51*h*, the first portion 51*g*, the first portion 51*f*, the second portion 52U, the second portion 52T, and the first portion 51S. The plurality of leads 412K of the signal transmission element 41K are conductively bonded to the second portion 52*l*, the second portion 52*k*, the first portion 51L, the first portion 51M, the first portion 51N, the first portion 51O, the first portion 51P, the first portion 51Q, and the first portion 51R.

In the illustrated example, as shown in FIG. 62, the plurality of leads 411K of the signal transmission element 42K are conductively bonded to the second portion 52*i*, the second portion 52*e*, the second portion 52*d*, the second portion 52*c*, the first portion 57*l*, and the first portion 51*j*. The plurality of leads 412K of the signal transmission element 42K are conductively bonded to the first portion 51I, the first portion 51J, the first portion 51K, the first portion 51*k*, and the first portion 51*l*.

<Diodes 49U, 49V, 49W>

The configuration of the diodes 49U, 49V, and 49W is not specifically limited. The diodes 49U, 49V, and 49W may be configured, for example, similarly to those of the semiconductor device A2.

<Bootstrap Capacitors 93U, 93V, and 93W>

As shown in FIG. 61 and FIG. 62, the bootstrap capacitor 93U is conductively bonded to the wiring 50A and the wiring 50B. Accordingly, the bootstrap capacitor 93U is connected to the lead 2A, which is the VSU terminal, and the lead 2B, which is the VBU terminal.

The bootstrap capacitor 93V is conductively bonded to the wiring 50C and the wiring 50D. Accordingly, the bootstrap capacitor 93V is connected to the lead 2C, which is the VSV terminal, and the lead 2D, which is the VBV terminal.

The bootstrap capacitor 93W is conductively bonded to the wiring 50E and the wiring 50F. Accordingly, the bootstrap capacitor 93W is connected to the lead 2E, which is the VSW terminal, and the lead 2F, which is the VBW terminal.

<First Wires 91A to 91F>

The configuration of the first wires 91A to 91 according to this embodiment is not specifically limited. The first wires 91A to 91 may be configured, for example, similarly to those of the semiconductor device A31.

<Second Wires 92>

The plurality of second wires 92 include second wires 92G connected to the control chip 4G, and second wires 92H connected to the control chip 4H.

The second wire 92G is connected to the gate electrode of the semiconductor chip 4A, and the second portion 52*a* of the wiring 50*a*. Another second wire 92G is connected to the emitter electrode of the semiconductor chip 4A, and the second portion 52*b*.

The second wire 92G is connected to the gate electrode of the semiconductor chip 4B, and the control chip 4G. Another second wire 92G is connected to the emitter electrode of the semiconductor chip 4B, and the control chip 4G.

The second wire 92G is connected to the gate electrode of the semiconductor chip 4C, and the control chip 4G. Another second wire 92G is connected to the emitter electrode of the semiconductor chip 4C, and the control chip 4G.

The second wire 92H is connected to the gate electrode of the semiconductor chip 4D, and the second portion 52*h* of the wiring 50*h*. Another second wire 92H is connected to the gate electrode of the semiconductor chip 4E, and the second portion 52*g* of the wiring 50*g*. Another second wire 92H is connected to the gate electrode of the semiconductor chip 4F, and the second portion 52*f* of the wiring 50*f*.

<Third Wires 93>

The plurality of third wires 93 are connected to the control chip 4G. The material of the third wire 93 is not specifically limited and, for example, a material similar to that of the second wire 92 may be adopted.

<Resin 7>

The resin 7 according to this embodiment may be configured, for example, similarly to the resin 7 of the semiconductor device A31.

In this embodiment, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 2A is the VSU terminal. The lead 2B is the VBU terminal. The lead 2C is the VSV terminal. The lead 2D is the VBV terminal. The lead 2E is the VSW terminal. The lead 2F is the VBW terminal. The lead 2I is the HINU terminal. The lead 2J is the HINU terminal. The lead 2K is the HINW terminal. The lead 2L is the LINU terminal. The lead 2M is the LINV terminal. The lead 2N is the LINW terminal. The lead 2O is the FO terminal. The lead 2P is the VOT terminal. The lead 2Q is the third VCC terminal. The lead 2R is the third GND. The lead 2S is the CIN terminal. The lead 2T is the second VCC terminal. The lead 2U is the second GND terminal.

This embodiment provides similar advantageous effects to those provided by the semiconductor devices A2, A3, and A31. In addition, the presence of the signal transmission element 41K and the signal transmission element 42K, each including the control chip 4H, the transmission circuit chip 4I, and the primary-side circuit chip 4J, further ensures the protection of the control chip 4H, the transmission circuit chip 4I, and the primary-side circuit chip 4J.

First Variation of Fourth Embodiment

Figure 64:
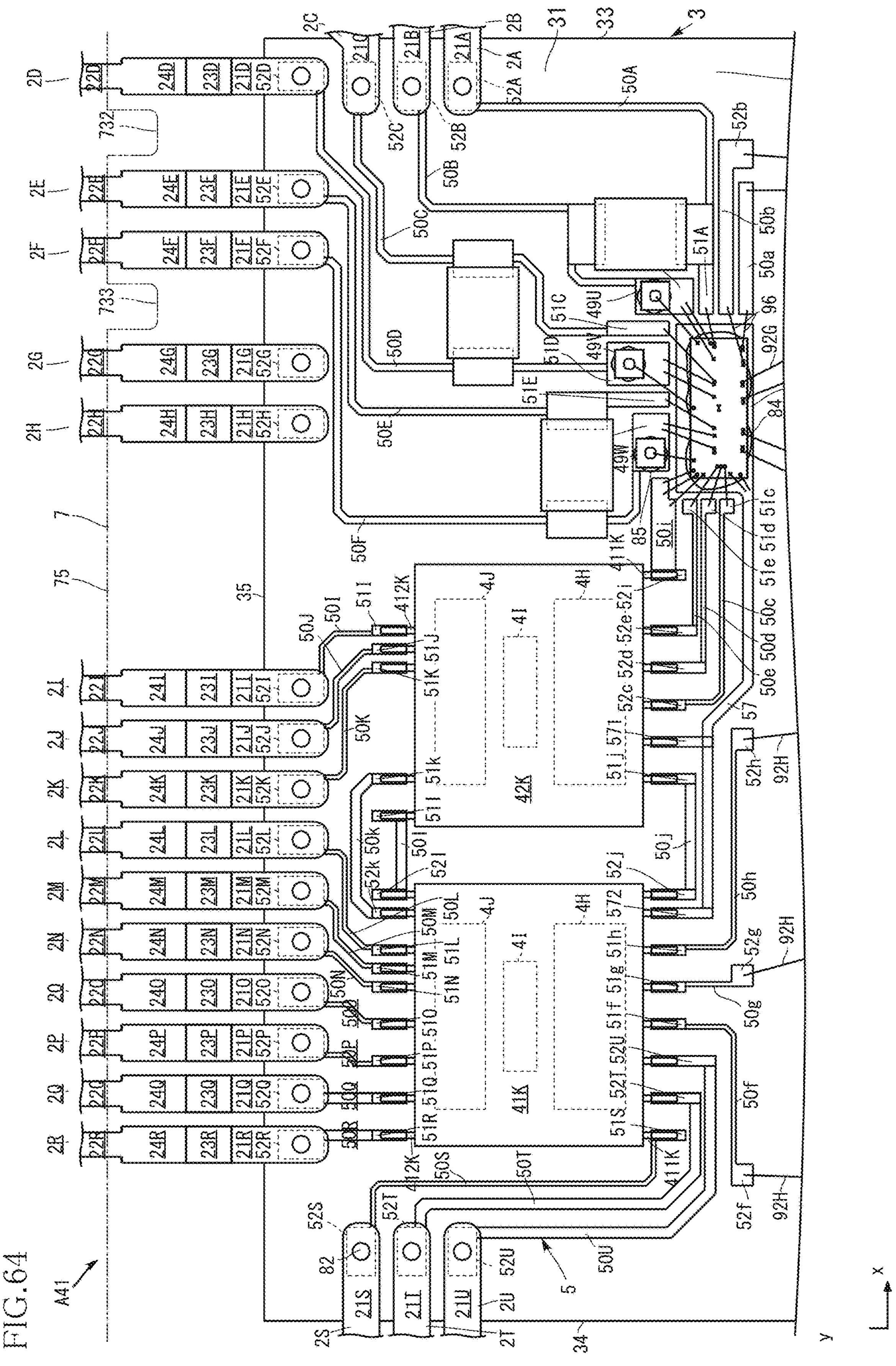
FIG. 64 is an enlarged partial plan view showing a first variation of the semiconductor device according to the fourth embodiment of the present disclosure.

FIG. 64 illustrates a first variation of the semiconductor device A4. The semiconductor device A41 according to this variation is different from the semiconductor device A4 in the configuration of the signal transmission element 41K and the signal transmission element 42K.

The number of leads 412K on the primary side and the number of leads 411K on the secondary side, of the signal transmission elements 41K and 42K may each be changed as desired. In an example, as shown in FIG. 64, the number of leads 412K on the primary side and the number of leads 411K on the secondary side, of the signal transmission elements 41K and 42K, may each be fewer than the number of leads 412K on the primary side and the number of leads 411K on the secondary side, of the signal transmission elements 41K and 42K according to the fourth embodiment. In FIG. 64, the number of leads 412K of the signal transmission elements 41K and 42K is equal to the number of wirings connected to the leads 412K. Likewise, the number of leads 411K on the secondary side of the signal transmission elements 41K and 42K is equal to the number of wirings connected to the leads 411K.

Figure 65:
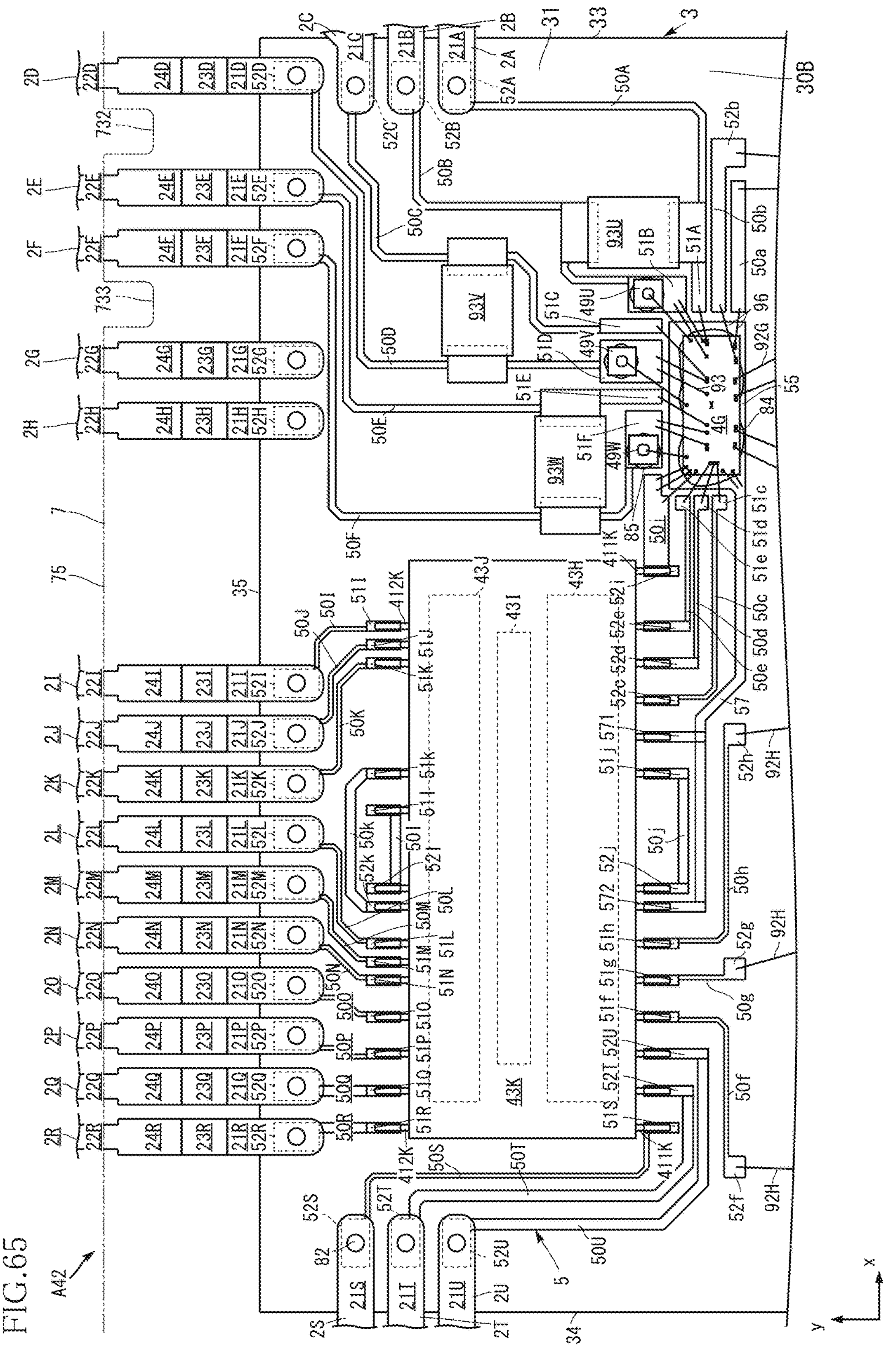
FIG. 65 is an enlarged partial plan view showing a second variation of the semiconductor device according to the fourth embodiment of the present disclosure.

Although the signal transmission elements 41K and 42K are independently provided in the fourth embodiment, the signal transmission elements 41K and 42K may be integrated in a single chip. In an example, as shown in FIG. 65, a signal transmission element 43K includes a primary-side circuit chip 43J, a transmission circuit chip 43I, and a control chip 43H. The primary-side circuit chip 43J includes the primary-side circuit chip 4J of the signal transmission elements 41K and 42K according to the fourth embodiment. The transmission circuit chip 43I includes the transmission circuit chip 4I of the signal transmission elements 41K and 42K according to the fourth embodiment. The control chip 43H includes the control chip 4H of the signal transmission elements 41K and 42K according to the fourth embodiment.

In the signal transmission element 43K, the primary-side circuit chip 4J of the signal transmission elements 41K and 42K may be provided in separate chips, or the transmission circuit chip 4I of the signal transmission elements 41K and 42K may be provided in separate chips. Further, the wirings 50*k*, 50*l*, and 50*j* may be excluded from the signal transmission element 43K shown in FIG. 65. In the connecting portion 57, the part connected to one of the two secondary-side leads 411K may be excluded.

Fifth Embodiment

Figure 66:
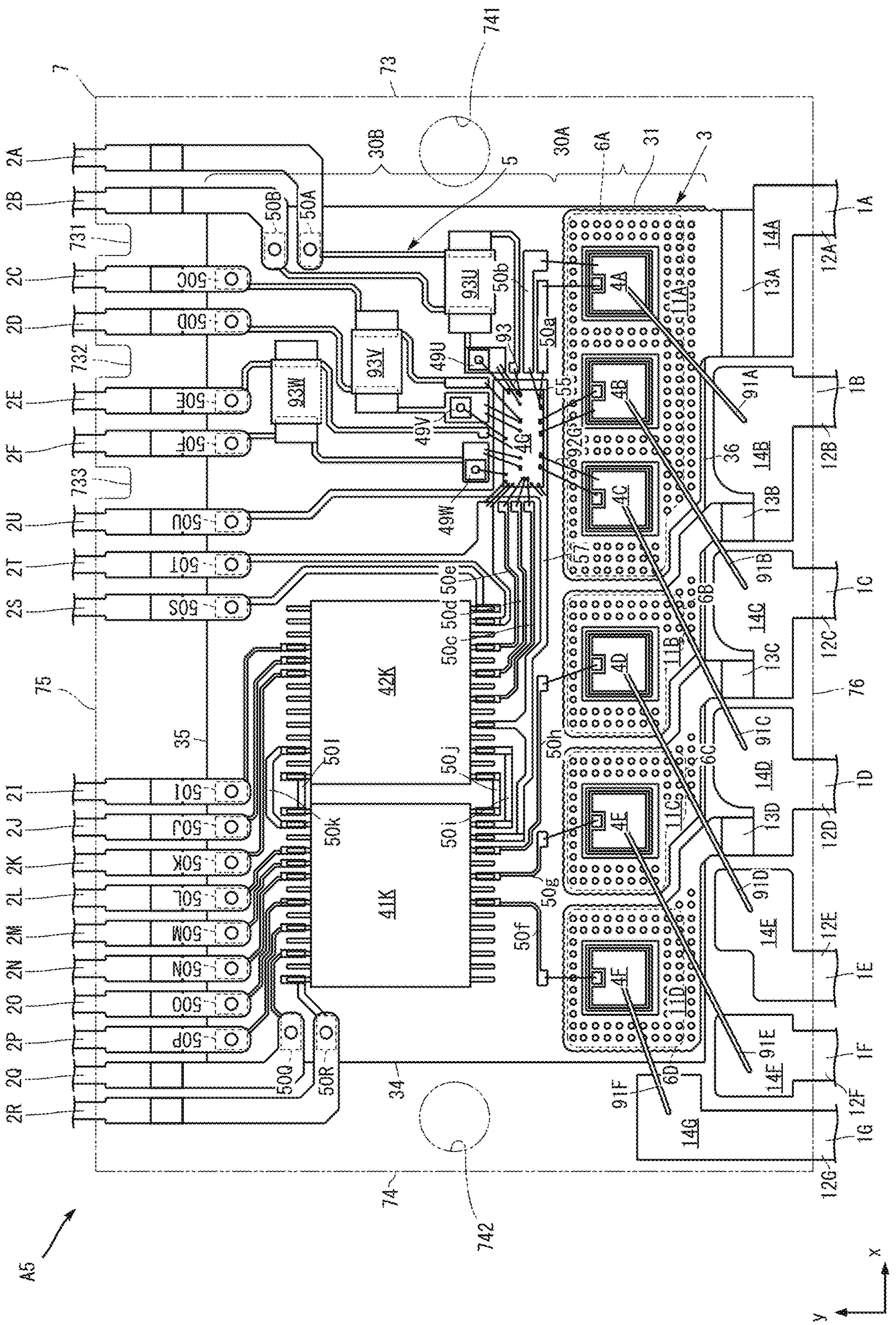
FIG. 66 is a plan view showing a semiconductor device according to a fifth embodiment of the present disclosure.
Figure 67:
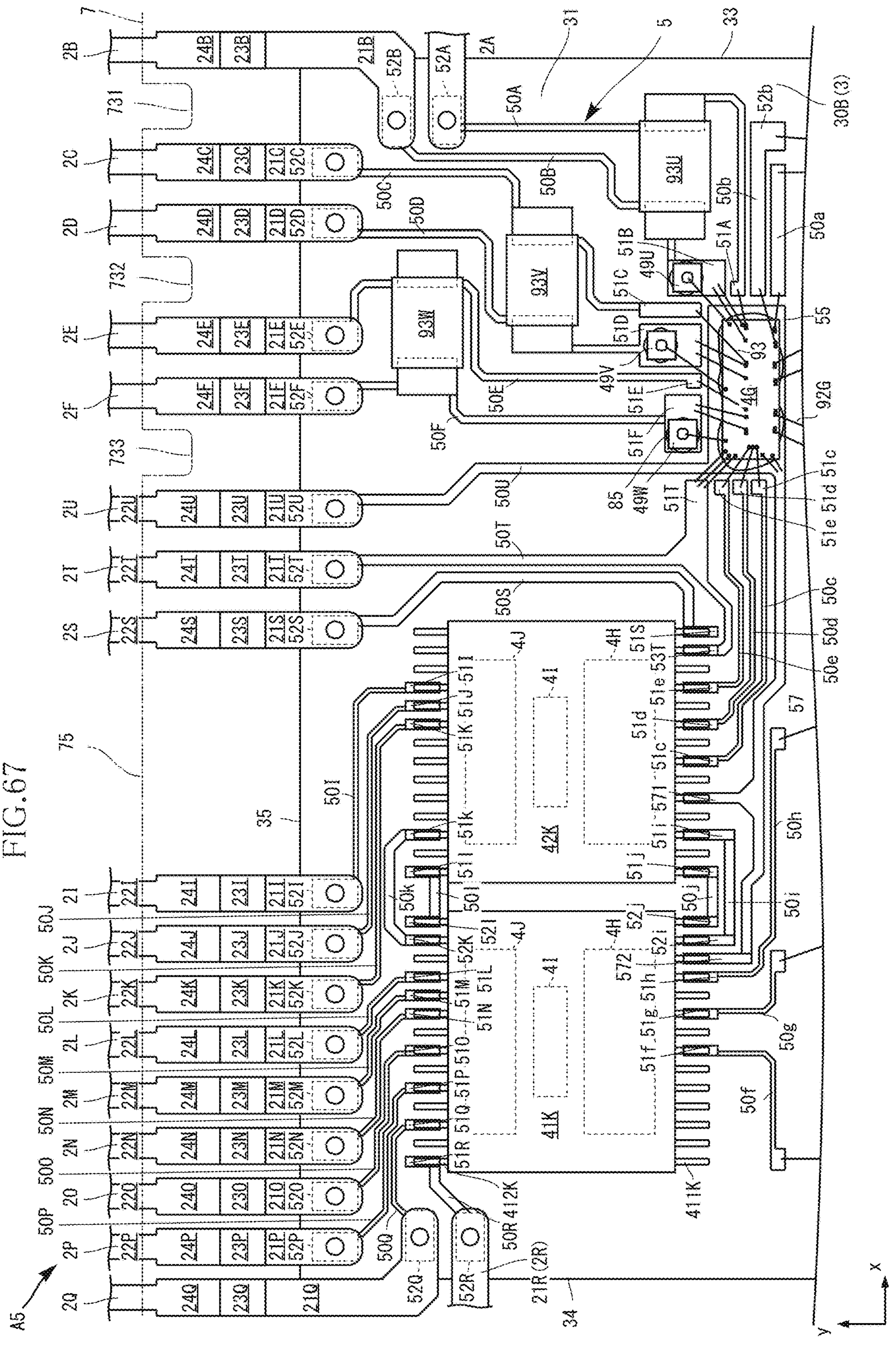
FIG. 67 is an enlarged partial plan view of the semiconductor device according to the fifth embodiment of the present disclosure.

Referring to FIG. 66 and FIG. 67, a semiconductor device according to a fifth embodiment of the present disclosure will be described. The semiconductor device A5 according to this embodiment includes a plurality of leads 1, a plurality of leads 2, a substrate 3, a plurality of semiconductor chips 4, a diode 41, a signal transmission element 41K, a signal transmission element 42K, a plurality of diodes 49, bootstrap capacitors 93U, 93V, and 93W, a conductive section 5, a plurality of bonding sections 6, a plurality of first wires 91, a plurality of second wires 92, a plurality of third wires 93, and an encapsulating resin 7.

The semiconductor device A5 according to this embodiment includes similar elements to those of the semiconductor device A4 according to the fourth embodiment. Such elements will be given the same numeral, and a part or the whole of the description thereof may be omitted. Regarding an element on which no specific description is given, a similar configuration to that of the corresponding element of the semiconductor device A4 may be adopted, as appropriate.

FIG. 66 is a plan view showing the semiconductor device A5. FIG. 67 is an enlarged partial plan view of the semiconductor device A5.

<Substrate 3>

The shape, size, and material of the substrate 3 are not specifically limited. The substrate 3 may be configured, for example, similarly to that of the semiconductor device A31.

<Conductive Section 5>

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 66 and FIG. 67, the conductive section 5 includes wirings 50A to 50U, wirings 50*a* to 50*l*, a first base portion 55, and a connecting portion 57, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The connecting portion 57 extends from the first base portion 55 in the x-direction, toward the fourth face 34. The connecting portion 57 includes a first portion 571 and a second portion 572.

The first portion 571 is located on the side of the fourth face 34 in the x-direction, with respect to the first base portion 55. The first portion 571 has a strip shape extending along the y-direction. The second portion 572 is located on the side of the fourth face 34 in the x-direction, with respect to the first portion 571. The second portion 572 has a strip shape extending along the y-direction.

Regarding the wirings 50A to 50U and 50*a* to 50*l*, mainly the location of the wiring 50S, the wiring 50T, and the wiring 50U is different from the semiconductor device A4.

In this embodiment, as shown in FIG. 67, a second portion 52A and a second portion 523 are aligned along the third face 33, in the y-direction. A second portion 52C, a second portion 52D, a second portion 52E, and a second portion 52F are aligned along the fifth face 35, in the x-direction. A second portion 52I, a second portion 52J, a second portion 52K, a second portion 52L, a second portion 52M, a second portion 52N, a second portion 52O, and a second portion 52P are aligned along the fifth face 35, in the x-direction. In addition, a second portion 52Q and a second portion 52R are aligned along the fourth face 34, in the y-direction.

A second portion 52S, a second portion 52T, and a second portion 52U are located between the second portion 52F and the second portion 52I in the x-direction, and aligned along the fifth face 35, in the x-direction. The second portion 52S is located on the side of the fourth face 34 in the x-direction, with respect to the second portion 52T. The second portion 52T is located on the side of the fourth face 34 in the x-direction, with respect to the second portion 52U.

The first portion 51S is located on the side of the sixth face 36 in the y-direction, with respect to the second portion 52S. In the illustrated example, a part of the first portion 51S overlaps with the first base portion 55, as viewed in the x-direction.

The wiring 50T according to this embodiment further includes a third portion 53T. The third portion 53T is located on the side of the fourth face 34 in the x-direction, with respect to the first portion 51T. The third portion 53T is located between the first portion 51S and the first portion 51*e*, in the x-direction. The third portion 53T has, for example, a strip shape extending along the y-direction. The third wire 93 is connected to the first portion 51T.

The wiring 50U is connected to the first base portion 55.

The wiring 50*i* includes a first portion 51*i* and a second portion 52*i*. The first portion 51*i* is located on the side of the fourth face 34 in the x-direction, with respect to the first portion 571. The first portion 51I has, for example, a strip shape extending along the y-direction. The second portion 52*i* is located on the side of the third face 33 in the x-direction, with respect to the second portion 572. The second portion 52*i* has, for example, a strip shape extending along the y-direction.

The wiring 50*j* includes a first portion 51*j* and a second portion 52*j*. The first portion 51*j* is located on the side of the fourth face 34 in the x-direction, with respect to the first portion 51*i*. The second portion 52*j* is located on the side of the third face 33 in the x-direction, with respect to the second portion 52*i*.

<Bonding Section 6>

The configuration of the bonding section 6 according to this embodiment may be, for example, similar to that of the semiconductor device A4.

<Leads 1>

The configuration of the leads 1 according to this embodiment may be, for example, similar to that of the semiconductor device A4.

<Leads 2>

Regarding the plurality of leads 2, mainly the location of the leads 2S, 2T, and 2U is different from the semiconductor device A4. In this embodiment, the leads 2S, 2T, and 2U are located between the lead 2F and the lead 2I, in the x-direction. The lead 2S is located on the side of the fourth face 34 in the x-direction, with respect to the lead 2T. The lead 2T is located on the side of the fourth face 34 in the x-direction, with respect to the lead 2U. A recess 733 of the resin 7 is located between the lead 2F and the lead 2U in the x-direction. In this embodiment, the lead 2G and the lead 2H are not provided.

<Semiconductor Chips 4A to 4F>

The configuration of the semiconductor chips 4A to 4F is not specifically limited, and may be, for example, similar to that of the semiconductor chips 4A to 4F of the semiconductor device A4.

<Signal Transmission Elements 41K and 42K>

The configuration of the signal transmission elements 41K and 42K is not specifically limited, and may be, for example, similar to that of the signal transmission elements 41K and 42K of the semiconductor device A4.

<Diodes 49U, 49V, 49W>

The configuration of the diodes 49U, 49V, and 49W is not specifically limited, and may be, for example, similar to that of the diodes 49U, 49V, and 49W of the semiconductor device A4.

<Bootstrap Capacitors 93U, 93V, 93W>

The configuration of the bootstrap capacitors 93U, 93V, and 93W is not specifically limited, and may be, for example, similar to that of the bootstrap capacitors 93U, 93V, and 93W of the semiconductor device A4.

The bootstrap capacitor 93V is conductively bonded to the wiring 50C and the wiring 50D. Accordingly, the bootstrap capacitor 93V is connected to the lead 2C which is the VSV terminal, and the lead 2D which is the VBV terminal.

The bootstrap capacitor 93W is conductively bonded to the wiring 50E and the wiring 50F. Accordingly, the bootstrap capacitor 93W is connected to the lead 2E which is the VSW terminal, and the lead 2F which is the VBW terminal.

<First Wires 91A to 91F>

The configuration of the first wires 91A to 91F is not specifically limited, and may be, for example, similar to that of the first wires 91A to 91F of the semiconductor device A4.

<Second Wires 92>

The configuration of the plurality of second wires 92 is not specifically limited and may be, for example, similar to that of the second wires 92 of the semiconductor device A4.

<Third Wires 93>

The configuration of the plurality of third wires 93 is not specifically limited and may be, for example, similar to that of the third wires 93 of the semiconductor device A4.

<Resin 7>

The resin 7 according to this embodiment may be configured, for example, similarly to the resin 7 of the semiconductor device A4.

In this embodiment, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 2A is the VSU terminal. The lead 2B is the VBU terminal. The lead 2C is the VSV terminal. The lead 2D is the VBV terminal. The lead 2E is the VSW terminal. The lead 2F is the VBW terminal. The lead 2I is the HINU terminal. The lead 2J is the HINV terminal. The lead 2K is the HINW terminal. The lead 2L is the LINU terminal. The lead 2M is the LINV terminal. The lead 2N is the LINW terminal. The lead 2O is the FO terminal. The lead 2P is the VOT terminal. The lead 2Q is the third VCC terminal. The lead 2R is the third GND. The lead 2S is the CIN terminal. The lead 2T is the second VCC terminal. The lead 2U is the second GND terminal.

This embodiment provides similar advantageous effects to those provided by the semiconductor device A4. In the semiconductor device A5, the leads 2A to 2F and 2S to 2U connected to the control chip 4G, and the leads 2I to 2R connected to the signal transmission elements 41K and 42K are separately located on the respective sides in the x-direction. Therefore, increasing the distance between the lead 2S and the lead 2I further ensures the insulation between the side associated with the control chip 4G and the side associated with the signal transmission elements 41K and 42K. Such a configuration is advantageous for suppressing an increase in size of the semiconductor device A5, while securing an improved insulation effect.

Sixth Embodiment

Figure 68:
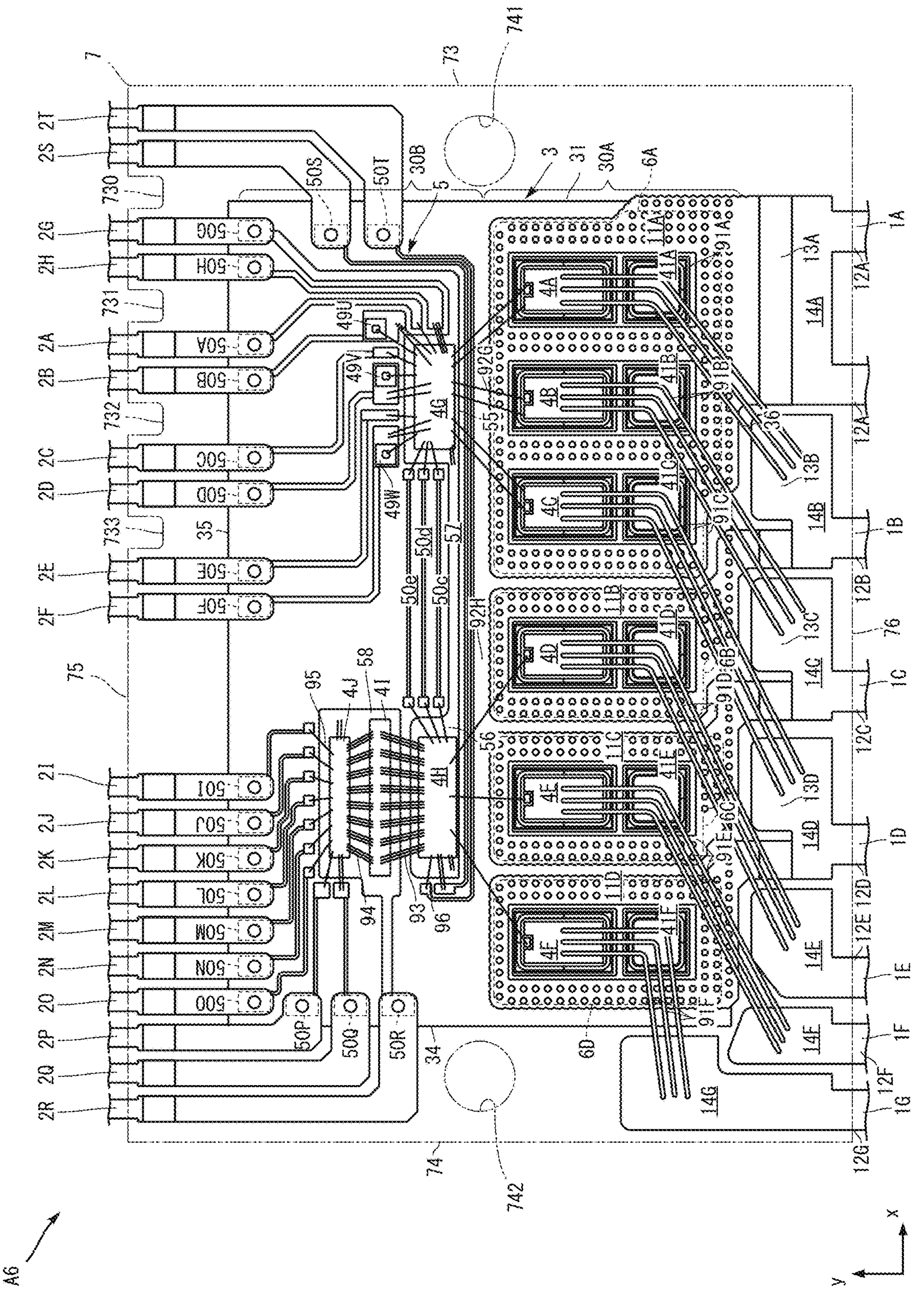
FIG. 68 is a plan view showing a semiconductor device according to a sixth embodiment of the present disclosure.
Figure 69:
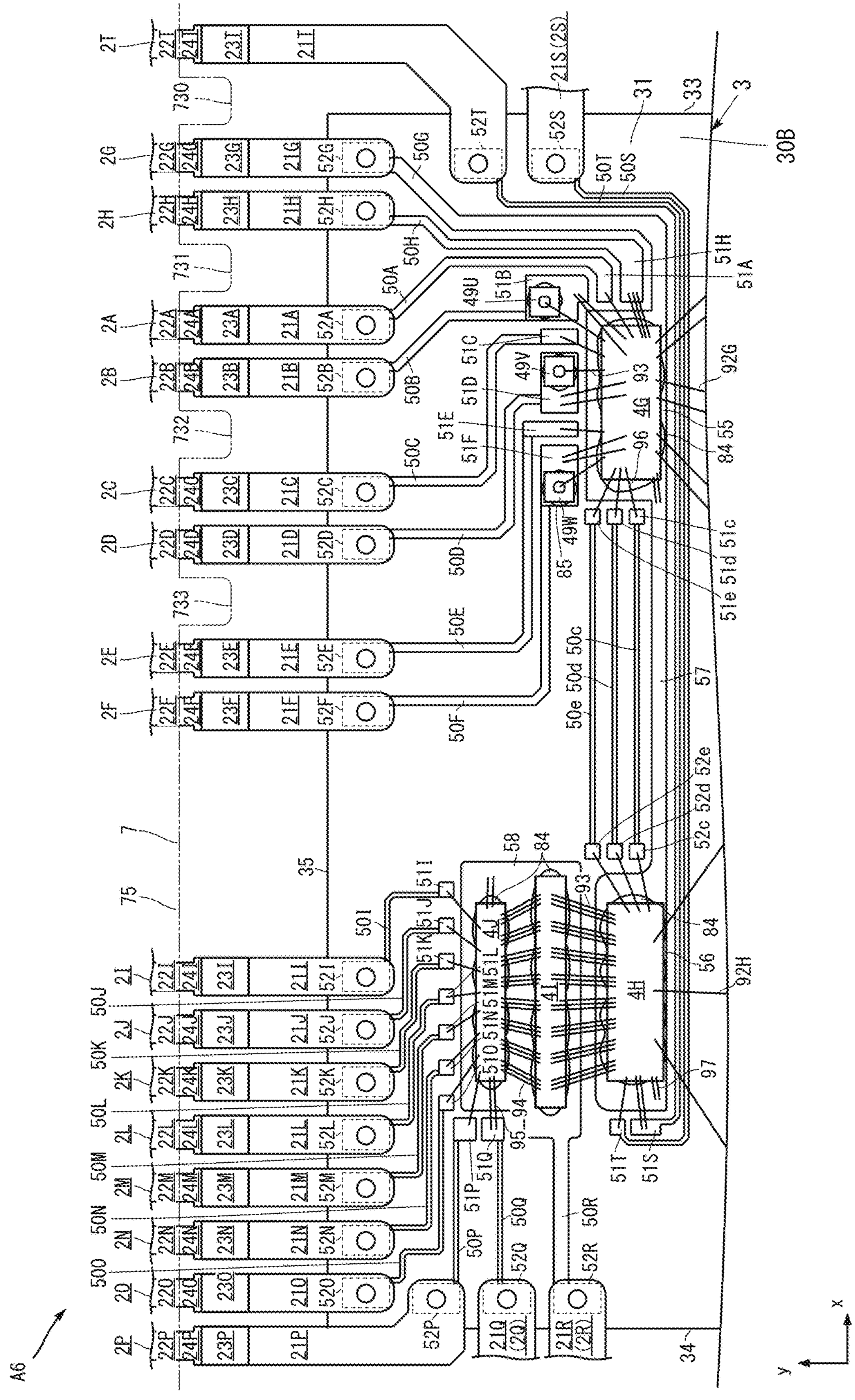
FIG. 69 is an enlarged partial plan view of the semiconductor device according to the sixth embodiment of the present disclosure.

Referring to FIG. 68 and FIG. 69, a semiconductor device according to a fifth embodiment of the present disclosure will be described. The semiconductor device A6 according to this embodiment includes a plurality of leads 1, a plurality of leads 2, a substrate 3, a plurality of semiconductor chips 4, a diode 41, a plurality of control chips 4, a transmission circuit chip 4I, a primary-side circuit chip 4J, a plurality of diodes 49, a conductive section 5, a plurality of bonding sections 6, a plurality of first wires 91, a plurality of second wires 92, a plurality of third wires 93, a plurality of fourth wires 94, a plurality of fifth wires 95, a plurality of sixth wires 96, a plurality of seventh wires 97, and an encapsulating resin 7.

The semiconductor device A6 according to this embodiment includes similar elements to those of the semiconductor device A3 according to the third embodiment. Such elements will be given the same numeral, and a part or the whole of the description thereof may be omitted. Regarding an element on which no specific description is given, a similar configuration to that of the corresponding element of the semiconductor device A3 may be adopted, as appropriate.

FIG. 68 is a plan view showing the semiconductor device A6. FIG. 69 is an enlarged partial plan view of the semiconductor device A6.

<Substrate 3>

The shape, size, and material of the substrate 3 are not specifically limited. The substrate 3 may be configured, for example, similarly to the substrate 3 of the semiconductor device A3.

<Conductive Section 5>

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 68 and FIG. 69, the conductive section 5 includes wirings 50A to 50U, wirings 50*a* to 50*f*, a first base portion 55, a second base portion 56, and a third base portion 58, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The shape of the second base portion 56 is not specifically limited, and a desired shape may be selected from a rectangular shape, a polygonal shape, a circular shape, an elliptical shape, and so forth. In the illustrated example, the second base portion 56 has a rectangular shape. In the illustrated example, the second base portion 56 has an elongate rectangular shape, having the long sides extending along the x-direction.

The second base portion 56 is located on the side of the fourth face 34 in the x-direction, with respect to the first base portion 55.

The connecting portion 57 is interposed between the first base portion 55 and the second base portion 56 and, in the illustrated example, connecting the first base portion 55 and the second base portion 56. In the illustrated example, the connecting portion 57 is located between the first base portion 55 and the second base portion 56, as viewed in the y-direction. The shape of the connecting portion 57 is not specifically limited.

In the illustrated example, the respective edges of the first base portion 55, the second base portion 56, and the connecting portion 57 on the side of the sixth face 36 in the y-direction are located generally at the same position in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The shape of the third base portion 58 is not specifically limited, and a desired shape may be selected from a rectangular shape, a polygonal shape, a circular shape, an elliptical shape, and so forth. The third base portion 58 is located on the side of the fifth face 35 in the y-direction, with respect to the second base portion 56. The third base portion 58 overlaps with the second base portion 56, as viewed in the y-direction.

In this embodiment, the second portion 52S and the second portion 52T are aligned along the third face 33, in the y-direction. The second portion 52S is located on the side of the sixth face 36 in the y-direction, with respect to the second portion 52T.

The second portion 52G and the second portion 52H are aligned along the fifth face 35, in the x-direction. The second portion 52G is located on the side of the third face 33 in the x-direction, with respect to the second portion 52H.

The second portion 52A and the second portion 523 are aligned along the fifth face 35, in the x-direction. The second portion 52A is located on the side of the fourth face 34 in the x-direction, with respect to the second portion 52H. The second portion 523 is located on the side of the fourth face 34 in the x-direction, with respect to the second portion 52A.

The second portion 52C and the second portion 52D are aligned along the fifth face 35, in the x-direction. The second portion 52C is located on the side of the fourth face 34 in the x-direction, with respect to the second portion 523. The second portion 52D is located on the side of the fourth face 34 in the x-direction, with respect to the second portion 52C.

The second portion 52E and the second portion 52F are aligned along the fifth face 35, in the x-direction. The second portion 52E is located on the side of the fourth face 34 in the x-direction, with respect to the second portion 52D. The second portion 52F is located on the side of the fourth face 34 in the x-direction, with respect to the second portion 52E.

The second portion 52I to second portion 52O are aligned along the fifth face 35, in the x-direction. The second portion 52I to second portion 52O are located on the side of the fourth face 34 in the x-direction, with respect to the first portion 51F. The second portion 52I to second portion 52O are aligned in this order in the x-direction, from the side of the third face 33 toward the fourth face 34.

The second portion 52P, the second portion 52Q, and the second portion 52R are aligned along the fourth face 34, in the y-direction. The second portion 52P, the second portion 52Q, and the second portion 52R are located on the side of the sixth face 36 in the y-direction, with respect to the second portion 52O. The second portion 52P, the second portion 52Q, and the second portion 52R are aligned in this order in the y-direction, from the side of the fifth face 35 toward the sixth face 36.

The wiring 50G is connected to the first base portion 55.

The first portion 51H and the first portion 51A are aligned in the y-direction, and located on the side of the third face 33 in the x-direction, with respect to the first base portion 55.

The first portion 51B to first portion 51F are aligned in the x-direction, and located on the side of the fifth face 35 in the y-direction, with respect to the first base portion 55.

The first portion 51*c*, the first portion 51*d*, and the first portion 51*e* are aligned in the y-direction, and located on the side of the fourth face 34 in the x-direction, with respect to the first base portion 55.

The first portion 51I to first portion 51O are aligned in the x-direction, and located on the side of the fifth face 35 in the y-direction, with respect to the third base portion 58.

The first portion 51P and the first portion 51Q are aligned in the y-direction, and located on the side of the fourth face 34 in the x-direction, with respect to the third base portion 58.

The wiring 50R is connected to the third base portion 58.

The second portion 52*c*, the second portion 52*d*, and the second portion 52*e* are aligned in the y-direction, and located on the side of the third face 33 in the x-direction, with respect to the second base portion 56.

The first portion 51S and the first portion 51T are aligned in the y-direction, and located on the side of the fourth face 34 in the x-direction, with respect to the second base portion 56. The wiring 50S includes a strip-shaped portion connecting the first portion 51S and the second portion 52S. The strip-shaped portion is routed across a region on the side of the sixth face 36 in the y-direction, with respect to the first base portion 55, the second base portion 56, and the connecting portion 57. The wiring 50T includes a strip-shaped portion connecting the first portion 51T and the second portion 52T. The strip-shaped portion is routed across the region on the side of the sixth face 36 in the y-direction, with respect to the first base portion 55, the second base portion 56, and the connecting portion 57.

<Bonding Section 6>

The plurality of bonding sections 6 are formed on the substrate 3. In this embodiment, the plurality of bonding sections 6 are formed on the first face 31 of the substrate 3. The bonding section 6 is formed of, for example, a conductive material. The conductive material to form the bonding section 6 is not specifically limited. Examples of the conductive material to form the bonding section 6 include materials containing silver (Ag), copper (Cu), or gold (Au). In the subsequent description, it will be assumed that the bonding section 6 contains silver. The bonding section 6 according to this embodiment contains the same conductive material as that employed to form the conductive section 5. However, the bonding section 6 may contain copper instead of silver, or gold instead of silver or copper. Alternatively, the conductive section 5 may contain Ag—Pt or Ag—Pd. The forming method of the bonding section 6 is not limited. For example, the bonding section 6 may be formed, like the conductive section 5, by sintering a paste containing the mentioned metal. The thickness of the bonding section 6 is not specifically limited, but may be, for example, approximately 5 μm to 30 μm.

In this embodiment, as shown in FIG. 68, the plurality of bonding sections 6 include bonding sections 6A to 6D. The configuration of the bonding sections 6A to 6D is, for example, similar to that of the bonding sections 6A to 6D of the semiconductor device A3.

<Leads 1>

The plurality of leads 1 contain a metal, and have higher heat dissipation characteristics, for example than the substrate 3. The metal to form the lead 1 is not specifically limited, and may be, for example, copper (Cu), aluminum, iron (Fe), oxygen-free copper, or an alloy of the cited metals (e.g., Cu—Sn alloy, Cu—Zr alloy, and Cu—Fe alloy). The plurality of leads 1 may be plated with nickel (Ni). Examples of the forming method of the plurality of leads 1 include pressing a metal plate with a die, and patterning a metal plate by etching, without limitation thereto. The thickness of the lead 1 is not specifically limited, but may be, for example, approximately 0.4 mm to 0.8 mm.

The plurality of leads 1 include a plurality of leads 1A to 1G, as shown in FIG. 68. The plurality of leads 1A to 1G constitute conduction paths to the semiconductor chips 4A to 4F. The configuration of the plurality of leads 1A to 1G is, for example, similar to that of the leads 1A to 1G of the semiconductor device A3.

<Leads 2>

When no specific description is given on an element of the lead 2 according to this embodiment, such element may be configured similarly to the corresponding element of the semiconductor device A3, as appropriate.

The plurality of leads 2 contain a metal, and have higher heat dissipation characteristics, for example than the substrate 3. The metal to form the lead 2 is not specifically limited, and may be, for example, copper (Cu), aluminum, iron (Fe), oxygen-free copper, or an alloy of the cited metals (e.g., Cu—Sn alloy, Cu—Zr alloy, and Cu—Fe alloy). The plurality of leads 2 may be plated with nickel (Ni). Examples of the forming method of the plurality of leads 2 include pressing a metal plate with a die, and patterning a metal plate by etching, without limitation thereto. The thickness of the lead 2 is not specifically limited, but may be, for example, approximately 0.4 mm to 0.8 mm. The plurality of leads 2 are located so as to overlap with the second region 30B of the substrate 3, as viewed in the z-direction.

In this embodiment, the plurality of leads 2 include a plurality of leads 2A to 2U, as shown in FIG. 68 and FIG. 69. The plurality of leads 2A to 2H, and 2S to 2U respectively constitute conduction paths to the control chips 4G and 4H. The plurality of leads 2I to 2R constitute conduction paths to the primary-side circuit chip 4J.

The first portion 21S is conductively bonded to the second portion 52S. The first portion 21T is conductively bonded to the second portion 52T. The lead 2S and the lead 2T overlap with the third face 33, as viewed in the z-direction.

The first portion 21G is conductively bonded to the second portion 52G. The first portion 21H is conductively bonded to the second portion 52H. The first portion 21A is conductively bonded to the second portion 52A. The first portion 21B is conductively bonded to the second portion 52B. The first portion 21C is conductively bonded to the second portion 52C. The first portion 21D is conductively bonded to the second portion 52D. The first portion 21E is conductively bonded to the second portion 52E. The first portion 21F is conductively bonded to the second portion 52F. The leads 2G, 2H, 2A, 2B, 2C, 2D, 2E, and 2F overlap with the fifth face 35, as viewed in the z-direction. The leads 2G, 2H, 2A, 2B, 2C, 2D, 2E, and 2F are aligned in this order in the x-direction, from the side of the third face 33 toward the fourth face 34.

The first portion 21I is conductively bonded to the second portion 52I. The first portion 21J is conductively bonded to the second portion 52J. The first portion 21K is conductively bonded to the second portion 52K. The first portion 21L is conductively bonded to the second portion 52L. The first portion 21M is conductively bonded to the second portion 52M. The first portion 21N is conductively bonded to the second portion 52N. The first portion 21O is conductively bonded to the second portion 52O. The leads 2I, 2J, 2K, 2L, 2M, 2N, and 2O overlap with the fifth face 35, as viewed in the z-direction. The leads 2I, 2J, 2K, 2L, 2M, 2N, and 2O are aligned in this order in the x-direction, from the side of the third face 33 toward the fourth face 34.

The first portion 21P is conductively bonded to the second portion 52P. The first portion 21Q is conductively bonded to the second portion 52Q. The first portion 21R is conductively bonded to the second portion 52R. The leads 2P, 2Q, and 2R overlap with the fourth face 34, as viewed in the z-direction. The leads 2P, 2Q, and 2R are aligned in this order in the y-direction, from the side of the fifth face 35 toward the sixth face 36.

<Semiconductor Chips 4A to 4F>

The configuration of the semiconductor chips 4A to 4F is not specifically limited, and may be, for example, similar to that of the semiconductor chips 4A to 4F of the semiconductor device A3.

<Diodes 41A to 41F>

The configuration of the diodes 41A to 41F is not specifically limited, and may be, for example, similar to that of the diodes 41A to 41F of the semiconductor device A3.

<Control Chips 4G, 4H>

The configuration of the control chips 4G and 4H is not specifically limited, and may be, for example, similar to that of the control chips 4G and 4H of the semiconductor device A3.

<Transmission Circuit Chip 4I>

The configuration of the transmission circuit chip 4I is not specifically limited, and may be, for example, similar to that of the transmission circuit chip 4I of the semiconductor device A3.

<Primary-Side Circuit Chip 4J>

The configuration of the primary-side circuit chip 4J is not specifically limited, and may be, for example, similar to that of the primary-side circuit chip 4J of the semiconductor device A3.

<Diodes 49U, 49V, 49W>

The configuration of the diodes 49U, 49V, and 49W is not specifically limited, and may be, for example, similar to that of the diodes 49U, 49V, and 49W of the semiconductor device A3.

<First Wires 91A to 91F>

The configuration of the first wires 91A to 91F is not specifically limited, and may be, for example, similar to that of the first wires 91A to 91F of the semiconductor device A3.

<Second Wires 92>

The configuration of the plurality of second wires 92 is not specifically limited and may be, for example, similar to that of the plurality of second wires 92 of the semiconductor device A3.

<Third Wires 93>

The configuration of the plurality of third wires 93 is not specifically limited and may be, for example, similar to that of the third wires 93 of the semiconductor device A3.

<Fourth Wires 94>

The configuration of the plurality of fourth wires 94 is not specifically limited and may be, for example, similar to that of the fourth wires 94 of the semiconductor device A3.

<Fifth Wires 95>

The configuration of the plurality of fifth wires 95 is not specifically limited and may be, for example, similar to that of the fifth wires 95 of the semiconductor device A3.

<Sixth Wires 96>

The configuration of the plurality of sixth wires 96 is not specifically limited and may be, for example, similar to that of the sixth wires 96 of the semiconductor device A3.

<Seventh Wires 97>

The configuration of the plurality of seventh wires 97 is not specifically limited and may be, for example, similar to that of the seventh wires 97 of the semiconductor device A3.

<Resin 7>

The configuration of the resin 7 is not specifically limited and may be, for example, similar to that of the resin 7 of the semiconductor device A3.

The circuit configuration of the semiconductor device A6 may be, for example, similar to that of the semiconductor device A3.

In this embodiment, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 2A is the VSU terminal. The lead 2B is the VBU terminal. The lead 2C is the VSV terminal. The lead 2D is the VBV terminal. The lead 2E is the VSW terminal. The lead 2F is the VBW terminal. The lead 2G is the first GND terminal. The lead 2H is the first VCC terminal. The lead 2I is the HINU terminal. The lead 2J is the HINV terminal. The lead 2K is the HINW terminal. The lead 2L is the LINU terminal. The lead 2M is the LINV terminal. The lead 2N is the LINW terminal. The lead 2O is the FO terminal. The lead 2P is the VOT terminal. The lead 2Q is the third VCC terminal. The lead 2R is the third GND. The lead 2S is the CIN terminal. The lead 2T is the second VCC terminal. The lead 2U is the second GND terminal.

This embodiment provides similar advantageous effects to those provided by the semiconductor device A3. In the semiconductor device A6, in addition, the plurality of leads 2A to 2H, 2S, and 2T connected to the control chips 4G and 4H, and the leads 2I to 2R connected to the primary-side circuit chip 4J are separately located on the respective sides in the x-direction. Therefore, increasing the distance between the lead 2F and the lead 2I further ensures the insulation between the side associated with the control chips 4G and 4H, and the side associated with the primary-side circuit chip 4J. Such a configuration is advantageous for suppressing an increase in size of the semiconductor device A6, while securing an improved insulation effect.

Seventh Embodiment

Figure 70:
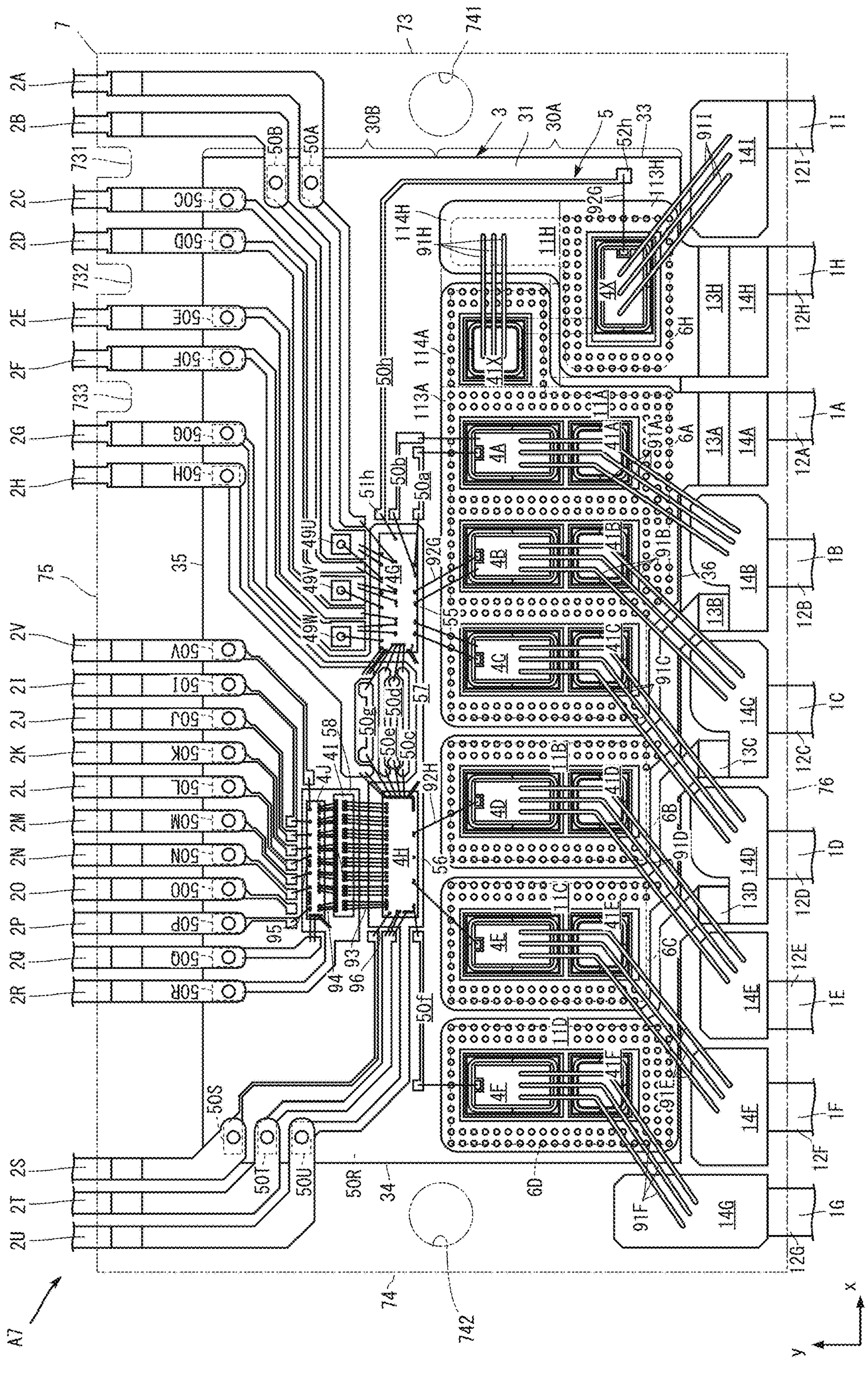
FIG. 70 is a plan view showing a semiconductor device according to a seventh embodiment of the present disclosure.
Figure 71:
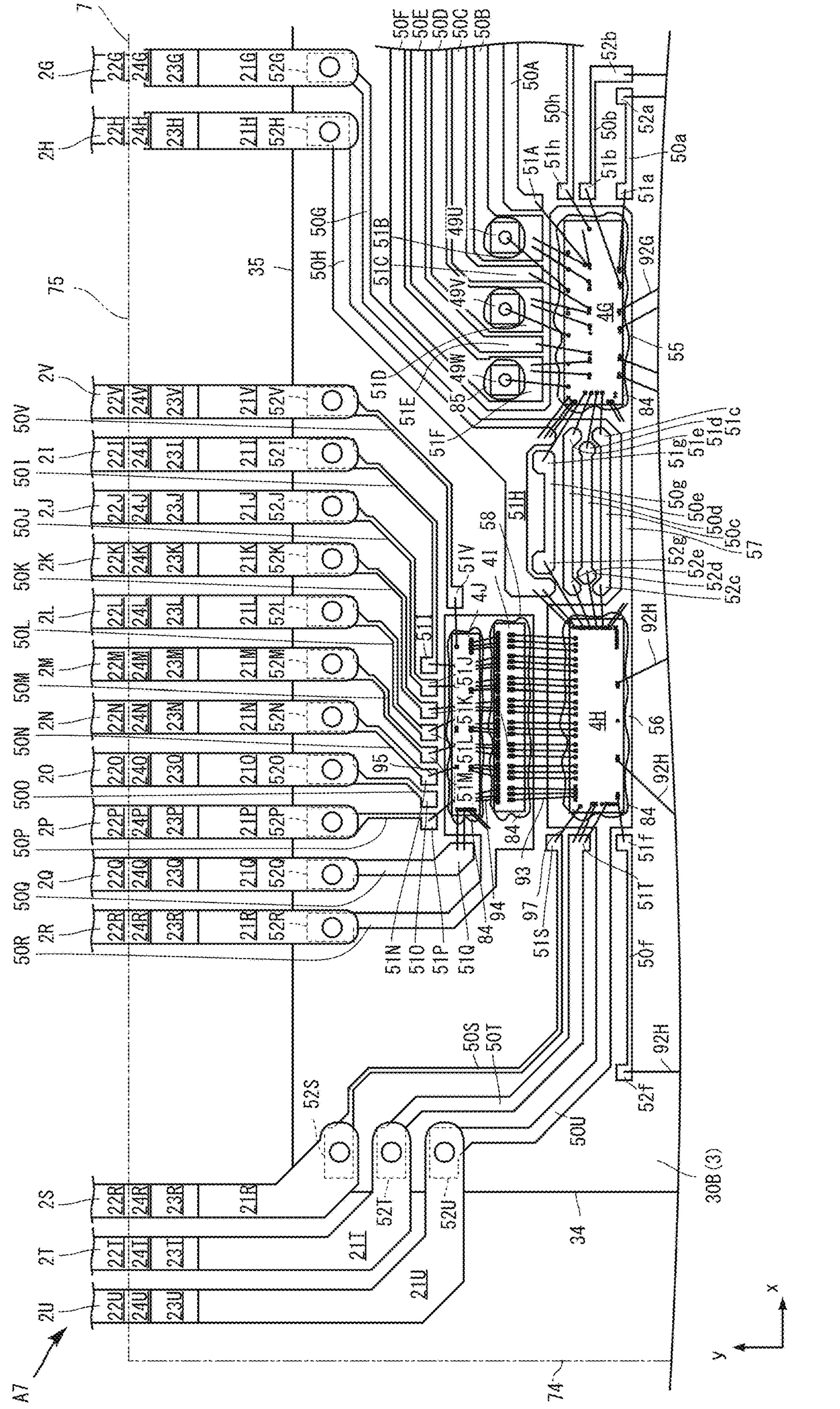
FIG. 71 is an enlarged partial plan view of the semiconductor device according to the seventh embodiment of the present disclosure.
Figure 72:
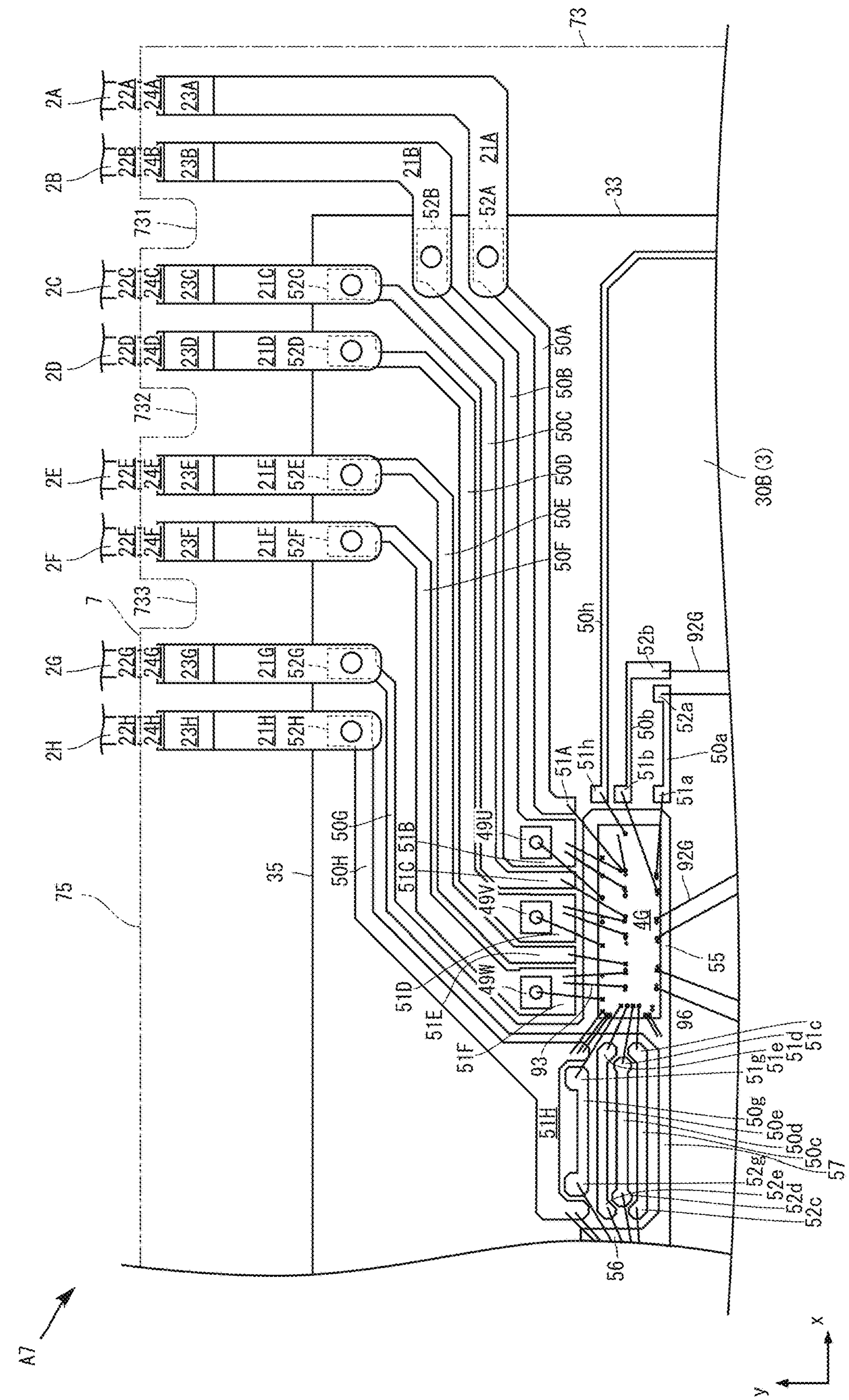
FIG. 72 is an enlarged partial plan view of the semiconductor device according to the seventh embodiment of the present disclosure.

Referring to FIG. 70 to FIG. 72, a semiconductor device according to a seventh embodiment of the present disclosure will be described. The semiconductor device A7 according to this embodiment includes a plurality of leads 1, a plurality of leads 2, a substrate 3, a plurality of semiconductor chips 4, a diode 41, a plurality of control chips 4, a transmission circuit chip 4I, a primary-side circuit chip 4J, a plurality of diodes 49, a conductive section 5, a plurality of bonding sections 6, a plurality of first wires 91, a plurality of second wires 92, a plurality of third wires 93, a plurality of fourth wires 94, a plurality of fifth wires 95, a plurality of sixth wires 96, a plurality of seventh wires 97, and an encapsulating resin 7.

The semiconductor device A7 according to this embodiment includes similar elements to those of the semiconductor device A3 according to the third embodiment. Such elements will be given the same numeral, and a part or the whole of the description thereof may be omitted. Regarding an element on which no specific description is given, a similar configuration to that of the corresponding element of the semiconductor device A3 may be adopted, as appropriate.

FIG. 70 is a plan view showing the semiconductor device A7. FIG. 71 and FIG. 72 are enlarged partial plan views of the semiconductor device A7.

<Substrate 3>

The shape, size, and material of the substrate 3 are not specifically limited. The substrate 3 may be configured, for example, similarly to the substrate 3 of the semiconductor device A3.

<Conductive Section 5>

Regarding the conductive section 5 according to this embodiment, although any of the elements is apparently given, for the sake of convenience of description, the same numeral as that of the conductive section 5 according to the third embodiment, it does not necessarily mean that the mentioned element has the same or similar configuration. The configuration of an element with a numeral is defined by the description relevant to this embodiment. Regarding a portion or structure on which no specific description is given, a similar configuration to that of the conductive section 5 of the semiconductor device A3 may be adopted, as appropriate.

The conductive section 5 is formed on the substrate 3. In this embodiment, the conductive section 5 is formed on the first face 31 of the substrate 3. The conductive section 5 is formed of a conductive material. The conductive material to form the conductive section 5 is not specifically limited. Examples of the conductive material to form the conductive section 5 include materials containing silver (Ag), copper (Cu), or gold (Au). In the subsequent description, it will be assumed that the conductive section 5 contains silver. However, the conductive section 5 may contain copper instead of silver, or gold instead of silver or copper. Alternatively, the conductive section 5 may contain Ag—Pt or Ag—Pd. The forming method of the conductive section 5 is not limited. For example, the conductive section 5 may be formed by sintering a paste containing the mentioned metal. The thickness of the conductive section 5 is not specifically limited, but may be, for example, approximately 5 μm to 30 μm.

In this embodiment, as shown in FIG. 71 and FIG. 72, the conductive section 5 includes wirings 50A to 50V, wirings 50*a* to 50*h*, a first base portion 55, a second base portion 56, a connecting portion 57, and a third base portion 58, each of which will be described hereunder.

The shape of the first base portion 55 is not specifically limited, and a desired shape may be selected from a rectangular shape, a polygonal shape, a circular shape, an elliptical shape, and so forth. In the illustrated example, the first base portion 55 has a rectangular shape. In the illustrated example, the first base portion 55 has an elongate rectangular shape, having the long sides extending along the x-direction.

The shape of the second base portion 56 is not specifically limited, and a desired shape may be selected from a rectangular shape, a polygonal shape, a circular shape, an elliptical shape, and so forth. In the illustrated example, the second base portion 56 has a rectangular shape. In the illustrated example, the second base portion 56 has an elongate rectangular shape, having the long sides extending along the x-direction.

The connecting portion 57 is interposed between the first base portion 55 and the second base portion 56 and, in the illustrated example, connecting the first base portion 55 and the second base portion 56. In the illustrated example, the connecting portion 57 is located between the first base portion 55 and the second base portion 56, as viewed in the y-direction. The shape of the connecting portion 57 is not specifically limited.

In the illustrated example, the respective edges of the first base portion 55, the second base portion 56, and the connecting portion 57 on the side of the sixth face 36 in the y-direction, are located generally at the same position in the y-direction. Here, the expression "located generally at the same position" in the y-direction refers to, for example, being located exactly at the same position, or being deviated by within ±5% of the characteristic size (size of the first base portion 55 or second base portion 56 in the y-direction).

The shape of the third base portion 58 is not specifically limited, and a desired shape may be selected from a rectangular shape, a polygonal shape, a circular shape, an elliptical shape, and so forth. The third base portion 58 is located on the side of the fifth face 35 in the y-direction, with respect to the second base portion 56. The third base portion 58 overlaps with the second base portion 56, as viewed in the y-direction.

The wiring 50A includes a first portion 51A and a second portion 52A.

The first portion 51A is located on the side of the third face 33 in the x-direction, and on the side of the fifth face 35 in the y-direction, with respect to the first base portion 55. The shape of the first portion 51A is not specifically limited, and a desired shape may be selected from a rectangular shape, a polygonal shape, a circular shape, an elliptical shape, and so forth. In the illustrated example, the first portion 51A has a strip shape extending along the y-direction. In the illustrated example, in addition, the first portion 51A is spaced apart from the first base portion 55, as viewed in the x-direction.

The second portion 52A is located on the side of the fifth face 35 in the y-direction, and on the side of the third face 33 in the x-direction, with respect to the first portion 51A. The shape of the second portion 52A is not specifically limited, and a desired shape may be selected from a rectangular shape, a polygonal shape, a circular shape, an elliptical shape, and so forth. In the illustrated example, the first portion 51A has a rectangular shape.

The wiring 50A includes a strip-shaped portion connecting the first portion 51A and the second portion 52A. The strip-shaped portion includes a portion extending from the first portion 51A along the x-direction, and a portion extending obliquely toward the second portion 52A.

The wiring 50B includes a first portion 51B and a second portion 52B.

The shape of the first portion 51B is not specifically limited, and a desired shape may be selected from a rectangular shape, a polygonal shape, a circular shape, an elliptical shape, and so forth. The first portion 513 is located on the side of the fourth face 34 in the x-direction with respect to the first portion 51A, and on the side of the fifth face 35 in the y-direction, with respect to the first base portion 55. In the illustrated example, a part of the first portion 51B overlaps with the first base portion 55 as viewed in the y-direction, and with the first portion 51A, as viewed in the x-direction.

The second portion 52B is located on the side of the fifth face 35 in the y-direction, and on the side of the third face 33 in the x-direction, with respect to the first portion 51B. The second portion 52B overlaps with the second portion 52A, as viewed in the y-direction. The shape of the second portion 52B is not specifically limited, and a desired shape may be selected from a rectangular shape, a polygonal shape, a circular shape, an elliptical shape, and so forth. In the illustrated example, the second portion 52B has a rectangular shape.

The wiring 50B includes a strip-shaped portion connecting the first portion 51B and the second portion 52B. The strip-shaped portion includes a portion extending from the first portion 51B along the x-direction, a portion extending obliquely toward the second portion 52B.

The wiring 50C includes a first portion 51C and a second portion 52C.

The first portion 51C is located on the side of the fifth face 35 in the y-direction, with respect to the first base portion 55 with a spacing therefrom, and on the side of the fourth face 34 in the x-direction, with respect to the first portion 51B with a spacing therefrom. In the illustrated example, the first portion 51C overlaps with the first base portion 55, as viewed in the y-direction. The shape of the first portion 51C is not specifically limited. In the illustrated example, the first portion 51C has a strip shape extending along the y-direction.

The second portion 52C is located on the side of the fifth face 35 with respect to the first portion 51C, in the y-direction. The second portion 52C is located on the side of the fifth face 35 in the y-direction, with respect to the second portion 52A and the second portion 52B. The shape of the second portion 52C is not specifically limited, and a desired shape may be selected from a rectangular shape, a polygonal shape, a circular shape, an elliptical shape, and so forth. In the illustrated example, the second portion 52C has a rectangular shape.

The wiring 50C includes a strip-shaped portion connecting the first portion 51C and the second portion 52C. The strip-shaped portion includes a portion extending obliquely from the first portion 51C, a portion extending along the x-direction, a portion extending obliquely, and a portion extending along the y-direction toward the second portion 52C.

The wiring 50D includes a first portion 51D and a second portion 52D.

The shape of the first portion 51D is not specifically limited, and a desired shape may be selected from a rectangular shape, a polygonal shape, a circular shape, an elliptical shape, and so forth. In the illustrated example, the first portion 51D has a trapezoidal shape. The first portion 51D is located on the side of the fifth face 35 in the y-direction, with respect to the first base portion 55, and spaced therefrom. The first portion 51D is located on the side of the fourth face 34 in the x-direction with respect to the first portion 51C, and spaced therefrom. In addition, in the illustrated example, the first portion 51D overlaps with the first portion 51C as viewed in the x-direction, and with the first base portion 55 as viewed in the y-direction.

The second portion 52D is located on the side of the fifth face 35 with respect to the first portion 51D, in the y-direction. The second portion 52D is located on the side of the fourth face 34 in the x-direction, with respect to the second portion 52C. The second portion 52D overlaps with the second portion 52C, as viewed in the x-direction. The shape of the second portion 52D is not specifically limited, and a desired shape may be selected from a rectangular shape, a polygonal shape, a circular shape, an elliptical shape, and so forth. In the illustrated example, the second portion 52E has a rectangular shape.

The wiring 50D includes a strip-shaped portion connecting the first portion 51D and the second portion 52D. The strip-shaped portion includes a portion extending obliquely from the first portion 51D, a portion extending along the x-direction, a portion extending obliquely, and a portion extending along the y-direction toward the second portion 52D.

The wiring 50E includes a first portion 51E and a second portion 52E.

The first portion 51E is located on the side of the fifth face 35 in the y-direction, with respect to the first base portion 55 with a spacing therefrom, and on the side of the fourth face 34 in the x-direction, with respect to the first portion 51D with a spacing therefrom. In the illustrated example, the first portion 51E overlaps with the first base portion 55, as viewed in the y-direction. The shape of the first portion 51E is not specifically limited. In the illustrated example, the first portion 51E has a strip shape extending along the y-direction.

The second portion 52E is located on the side of the fifth face 35 with respect to the first portion 51E, in the y-direction. The second portion 52E is located on the side of the fourth face 34 with respect to the second portion 52D, in the x-direction. The second portion 52E overlaps with the second portion 52D, as viewed in the x-direction. The shape of the second portion 52E is not specifically limited, and a desired shape may be selected from a rectangular shape, a polygonal shape, a circular shape, an elliptical shape, and so forth. In the illustrated example, the second portion 52B has a rectangular shape.

The wiring 50E includes a strip-shaped portion connecting the first portion 51E and the second portion 52E. The strip-shaped portion includes a portion extending obliquely from the first portion 51E, a portion extending along the x-direction, a portion extending obliquely, and a portion extending along the y-direction toward the second portion 52E.

The wiring 50F includes a first portion 51F and a second portion 52F.

The shape of the first portion 51F is not specifically limited, and a desired shape may be selected from a rectangular shape, a polygonal shape, a circular shape, an elliptical shape, and so forth. In the illustrated example, the first portion 51F has a rectangular shape. The first portion 51F is located on the side of the fifth face 35 in the y-direction, with respect to the first base portion 55, and spaced therefrom. The first portion 51F is located on the side of the fourth face 34 in the x-direction with respect to the first portion 51E, and spaced therefrom. In the illustrated example, the first portion 51F overlaps with the first portion 51E as viewed in the x-direction, and with the first base portion 55 as viewed in the y-direction.

The second portion 52F is located on the side of the fifth face 35 with respect to the first portion 51F, in the y-direction. The second portion 52F is located on the side of the fourth face 34 in the x-direction with respect to the second portion 52E, and spaced therefrom. The second portion 52F overlaps with the second portion 52E, as viewed in the x-direction. The shape of the second portion 52F is not specifically limited, and a desired shape may be selected from a rectangular shape, a polygonal shape, a circular shape, an elliptical shape, and so forth. In the illustrated example, the second portion 52F has a rectangular shape.

The wiring 50F includes a strip-shaped portion connecting the first portion 51F and the second portion 52F. The strip-shaped portion includes a portion extending obliquely from the first portion 51F, a portion extending along the x-direction, a portion extending obliquely, and a portion extending along the y-direction toward the second portion 52F.

The wiring 50G includes a second portion 52G.

The second portion 52G is located on the side of the fifth face 35 with respect to the first base portion 55, in the y-direction. The second portion 52G is located on the side of the fourth face 34 in the x-direction with respect to the second portion 52F, and spaced therefrom. The second portion 52G overlaps with the second portion 52F, as viewed in the x-direction. The second portion 52G is spaced apart from the first base portion 55, as viewed in the y-direction. The shape of the second portion 52G is not specifically limited, and a desired shape may be selected from a rectangular shape, a polygonal shape, a circular shape, an elliptical shape, and so forth. In the illustrated example, the second portion 52G has a rectangular shape.

The wiring 50G includes a strip-shaped portion connecting the second portion 52G and the first base portion 55. The strip-shaped portion includes a portion extending from the first base portion 55 along the y-direction, a portion extending obliquely, a portion extending along the x-direction, and a portion extending obliquely toward the second portion 52G.

The wiring 50H includes a first portion 51H and a second portion 52H.

The first portion 51H is located between the first base portion 55 and the second base portion 56, as viewed in the y-direction. In the illustrated example, a part of the first portion 51H overlaps with the first base portion 55 and the second base portion 56, as viewed in the x-direction. The first portion 51H overlaps with the first portion 51F, as viewed in the x-direction. The shape of the first portion 51H is not specifically limited. In the illustrated example, the first portion 51H includes a portion extending along the x-direction, and a pair of portions extending along the y-direction toward the sixth face 36, from the respective end portions of the portion extending along the x-direction.

The second portion 52H is located on the side of the fifth face 35 in the y-direction, and on the side of the third face 33 in the x-direction, with respect to the first portion 51H. The second portion 52H is located on the side of the fourth face 34 in the x-direction with respect to the second portion 52G. The second portion 52H overlaps with the second portion 52G, as viewed in the x-direction. The shape of the second portion 52H is not specifically limited, and a desired shape may be selected from a rectangular shape, a polygonal shape, a circular shape, an elliptical shape, and so forth. In the illustrated example, the second portion 52H has a rectangular shape.

The wiring 50H includes a strip-shaped portion connecting the first portion 51H and the second portion 52H. The strip-shaped portion includes a portion extending obliquely from the first portion 51H, and a portion extending along the x-direction toward the second portion 52H.

The wiring 50V includes a first portion 51V and a second portion 52V.

The first portion 51V is located on the side of the third face 33 in the x-direction with respect to the third base portion 58, and spaced therefrom. In the illustrated example, the first portion 51V overlaps with the third base portion 58, as viewed in the x-direction. The shape of the first portion 51V is not specifically limited. In the illustrated example, the first portion 51V has a rectangular shape.

The second portion 52V is located on the side of the fifth face 35 with respect to the first portion 51V, in the y-direction. The second portion 52V is located on the side of the fourth face 34 in the x-direction with respect to the second portion 52H, and spaced therefrom. The second portion 52V is spaced apart from the third base portion 58, as viewed in the x-direction. The second portion 52V overlaps with the second portion 52H, as viewed in the x-direction. The shape of the second portion 52V is not specifically limited, and a desired shape may be selected from a rectangular shape, a polygonal shape, a circular shape, an elliptical shape, and so forth. In the illustrated example, the second portion 52V has a rectangular shape.

The wiring 50V includes a strip-shaped portion connecting the first portion 51V and the second portion 52V. The strip-shaped portion includes a portion extending from the first portion 51V along the x-direction, a portion extending obliquely, and a portion extending along the y-direction toward the second portion 52V.

The wiring 50I includes a first portion 51I and a second portion 52I.

The first portion 51I is located on the side of the fifth face 35 in the y-direction with respect to the third base portion 58, and spaced therefrom. In the illustrated example, the first portion 51I overlaps with the third base portion 58, as viewed in the y-direction. The shape of the first portion 51I is not specifically limited. In the illustrated example, the first portion 51I has a rectangular shape.

The second portion 52I is located on the side of the fifth face 35 with respect to the first portion 51I, in the y-direction. The second portion 52I is located on the side of the fourth face 34 in the x-direction with respect to the second portion 52V, and spaced therefrom. The second portion 52I is spaced apart from the third base portion 58, as viewed in the y-direction. The second portion 52I overlaps with the second portion 52V, as viewed in the x-direction. The shape of the second portion 52I is not specifically limited, and a desired shape may be selected from a rectangular shape, a polygonal shape, a circular shape, an elliptical shape, and so forth. In the illustrated example, the second portion 52I has a rectangular shape.

The wiring 50I includes a strip-shaped portion connecting the first portion 51I and the second portion 52I. The strip-shaped portion includes a portion extending from the first portion 51I along the x-direction, a portion extending obliquely, and a portion extending along the y-direction toward the second portion 52I.

The wiring 50J includes a first portion 51J and a second portion 52J.

The first portion 51J is located on the side of the fifth face 35 in the y-direction with respect to the third base portion 58, and spaced therefrom. The first portion 51J is located on the side of the fourth face 34 in the x-direction with respect to the first portion 51I, and spaced therefrom. In the illustrated example, the first portion 51J overlaps with the first portion 51I as viewed in the x-direction, and with the third base portion 58 as viewed in the y-direction. The shape of the first portion 51J is not specifically limited. In the illustrated example, the first portion 51J has a rectangular shape.

The second portion 52J is located on the side of the fifth face 35 with respect to the first portion 51J, in the y-direction. The second portion 52J is located on the side of the fourth face 34 in the x-direction with respect to the second portion 52I, and spaced therefrom. The second portion 52J overlaps with the second portion 52I, as viewed in the x-direction. The shape of the second portion 52J is not specifically limited, and a desired shape may be selected from a rectangular shape, a polygonal shape, a circular shape, an elliptical shape, and so forth. In the illustrated example, the second portion 52J has a rectangular shape.

The wiring 50J includes a strip-shaped portion connecting the first portion 51J and the second portion 52J. The strip-shaped portion includes a portion extending obliquely from the first portion 51J, a portion extending along the x-direction, a portion extending obliquely, and a portion extending along the y-direction toward the second portion 52J.

The wiring 50K includes a first portion 51K and a second portion 52K.

The first portion 51K is located on the side of the fifth face 35 in the y-direction with respect to the third base portion 58, and spaced therefrom. In the illustrated example, the first portion 51K overlaps with the third base portion 58, as viewed in the y-direction. The first portion 51K is located on the side of the fourth face 34 in the x-direction with respect to the first portion 51J, and spaced therefrom. The first portion 51K overlaps with the first portion 51J, as viewed in the x-direction. The shape of the first portion 51K is not specifically limited. In the illustrated example, the first portion 51K has a rectangular shape.

The second portion 52K is located on the side of the fifth face 35 with respect to the first portion 51K, in the y-direction. The second portion 52K is located on the side of the fourth face 34 in the x-direction with respect to the second portion 52J, and spaced therefrom. The second portion 52K is spaced apart from the third base portion 58, as viewed in the y-direction. The second portion 52K overlaps with the second portion 52J, as viewed in the x-direction. The shape of the second portion 52K is not specifically limited, and a desired shape may be selected from a rectangular shape, a polygonal shape, a circular shape, an elliptical shape, and so forth. In the illustrated example, the second portion 52K has a rectangular shape.

The wiring 50K includes a strip-shaped portion connecting the first portion 51K and the second portion 52K. The strip-shaped portion includes a portion extending obliquely from the first portion 51K, a portion extending along the x-direction, a portion extending obliquely, and a portion extending along the y-direction toward the second portion 52K.

The wiring 50L includes a first portion 51L and a second portion 52L.

The first portion 51L is located on the side of the fifth face 35 in the y-direction with respect to the third base portion 58, and spaced therefrom. In the illustrated example, the first portion 51L overlaps with the third base portion 58, as viewed in the y-direction. The first portion 51L is located on the side of the fourth face 34 in the x-direction with respect to the first portion 51K, and spaced therefrom. The first portion 51L overlaps with the first portion 51K, as viewed in the x-direction. The shape of the first portion 51L is not specifically limited. In the illustrated example, the first portion 51L has a rectangular shape.

The second portion 52L is located on the side of the fifth face 35 with respect to the first portion 51L, in the y-direction. The second portion 52L is located on the side of the fourth face 34 in the x-direction with respect to the second portion 52K, and spaced therefrom. The second portion 52L overlaps with the third base portion 58, as viewed in the y-direction. The second portion 52L overlaps with the second portion 52K, as viewed in the x-direction. The shape of the second portion 52L is not specifically limited, and a desired shape may be selected from a rectangular shape, a polygonal shape, a circular shape, an elliptical shape, and so forth. In the illustrated example, the second portion 52L has a rectangular shape.

The wiring 50L includes a strip-shaped portion connecting the first portion 51L and the second portion 52L. The strip-shaped portion includes a portion extending obliquely from the first portion 51L, a portion extending along the x-direction, a portion extending obliquely, and a portion extending along the y-direction toward the second portion 52L.

The wiring 50M includes a first portion 51M and a second portion 52M.

The first portion 51M is located on the side of the fifth face 35 in the y-direction with respect to the third base portion 58, and spaced therefrom. In the illustrated example, the first portion 51M overlaps with the third base portion 58, as viewed in the y-direction. The first portion 51M is located on the side of the fourth face 34 in the x-direction with respect to the first portion 51L, and spaced therefrom. The first portion 51M overlaps with the first portion 51L, as viewed in the x-direction. The shape of the first portion 51M is not specifically limited. In the illustrated example, the first portion 51M has a rectangular shape.

The second portion 52M is located on the side of the fifth face 35 with respect to the first portion 51M, in the y-direction. The second portion 52M is located on the side of the fourth face 34 in the x-direction with respect to the second portion 52L, and spaced therefrom. The second portion 52M overlaps with the third base portion 58, as viewed in the y-direction. The second portion 52M overlaps with the second portion 52L, as viewed in the x-direction. The shape of the second portion 52M is not specifically limited, and a desired shape may be selected from a rectangular shape, a polygonal shape, a circular shape, an elliptical shape, and so forth. In the illustrated example, the second portion 52M has a rectangular shape.

The wiring 50M includes a strip-shaped portion connecting the first portion 51M and the second portion 52M. The strip-shaped portion includes a portion extending obliquely from the first portion 51M, a portion extending along the x-direction, a portion extending obliquely, and a portion extending along the y-direction toward the second portion 52M.

The wiring 50N includes a first portion 51N and a second portion 52N.

The first portion 51N is located on the side of the fifth face 35 in the y-direction with respect to the third base portion 58, and spaced therefrom. In the illustrated example, the first portion 51N overlaps with the third base portion 58, as viewed in the y-direction. The first portion 51N is located on the side of the fourth face 34 in the x-direction with respect to the first portion 51M, and spaced therefrom. The first portion 51N overlaps with the first portion 51M, as viewed in the x-direction. The shape of the first portion 51N is not specifically limited. In the illustrated example, the first portion 51N has a rectangular shape.

The second portion 52N is located on the side of the fifth face 35 with respect to the first portion 51N, in the y-direction. The second portion 52N is located on the side of the fourth face 34 in the x-direction with respect to the second portion 52M, and spaced therefrom. The second portion 52N overlaps with the third base portion 58, as viewed in the y-direction. The second portion 52N overlaps with the second portion 52M, as viewed in the x-direction. The shape of the second portion 52N is not specifically limited, and a desired shape may be selected from a rectangular shape, a polygonal shape, a circular shape, an elliptical shape, and so forth. In the illustrated example, the second portion 52N has a rectangular shape.

The wiring 50N includes a strip-shaped portion connecting the first portion 51N and the second portion 52N. The strip-shaped portion includes a portion extending obliquely from the first portion 51N, and a portion extending obliquely toward the second portion 52N.

The wiring 50O includes a first portion 51O and a second portion 52O.

The first portion 51O is located on the side of the fifth face 35 in the y-direction with respect to the third base portion 58, and spaced therefrom. In the illustrated example, the first portion 51O overlaps with the third base portion 58, as viewed in the y-direction. The first portion 51O is located on the side of the fourth face 34 in the x-direction with respect to the first portion 51N, and spaced therefrom. The first portion 51O overlaps with the first portion 51N, as viewed in the x-direction. The shape of the first portion 51O is not specifically limited. In the illustrated example, the first portion 51O has a rectangular shape.

The second portion 52O is located on the side of the fifth face 35 with respect to the first portion 51O, in the y-direction. The second portion 52O is located on the side of the fourth face 34 in the x-direction with respect to the second portion 52N, and spaced therefrom. The second portion 52O overlaps with the third base portion 58, as viewed in the y-direction. The second portion 52O overlaps with the second portion 52N, as viewed in the x-direction. The shape of the second portion 52O is not specifically limited, and a desired shape may be selected from a rectangular shape, a polygonal shape, a circular shape, an elliptical shape, and so forth. In the illustrated example, the second portion 52O has a rectangular shape.

The wiring 50O includes a strip-shaped portion connecting the first portion 51O and the second portion 52O. The strip-shaped portion includes a portion extending obliquely from the first portion 51O, and a portion extending along the y-direction toward the second portion 52O.

The wiring 50P includes a first portion 51P and a second portion 52P.

The first portion 51P is located on the side of the fifth face 35 in the y-direction with respect to the third base portion 58, and spaced therefrom. In the illustrated example, the first portion 51P overlaps with the third base portion 58, as viewed in the y-direction. The first portion 51P is located on the side of the fourth face 34 in the x-direction with respect to the first portion 51O, and spaced therefrom. The first portion 51P overlaps with the first portion 51O, as viewed in the x-direction. The shape of the first portion 51P is not specifically limited. In the illustrated example, the first portion 51P has a rectangular shape.

The second portion 52P is located on the side of the fifth face 35 with respect to the first portion 51P, in the y-direction. The second portion 52P is located on the side of the fourth face 34 in the x-direction with respect to the second portion 52O, and spaced therefrom. The second portion 52P overlaps with the third base portion 58, as viewed in the y-direction. The second portion 52P overlaps with the second portion 52O, as viewed in the x-direction. The shape of the second portion 52P is not specifically limited, and a desired shape may be selected from a rectangular shape, a polygonal shape, a circular shape, an elliptical shape, and so forth. In the illustrated example, the second portion 52P has a rectangular shape.

The wiring 50P includes a strip-shaped portion connecting the first portion 51P and the second portion 52P. The strip-shaped portion includes a portion extending along the y-direction, from the first portion 51P toward the second portion 52P.

The wiring 50Q includes a first portion 51Q and a second portion 52Q.

The first portion 51Q is located on the side of the fourth face 34 in the x-direction, with respect to the third base portion 58. The first portion 51Q overlaps with a part of the third base portion 58, as viewed in the x-direction. The first portion 51Q overlaps with a part of the third base portion 58, as viewed in the y-direction. The shape of the first portion 51Q is not specifically limited. In the illustrated example, the first portion 51Q has a polygonal shape.

The second portion 52Q is located on the side of the fifth face 35 with respect to the first portion 51Q, in the y-direction. The second portion 52Q is located on the side of the fourth face 34 in the x-direction with respect to the second portion 52P, and spaced therefrom. The second portion 52Q is spaced apart from the third base portion 58, as viewed in the y-direction. The second portion 52Q overlaps with the second portion 52P, as viewed in the x-direction. The shape of the second portion 52Q is not specifically limited, and a desired shape may be selected from a rectangular shape, a polygonal shape, a circular shape, an elliptical shape, and so forth. In the illustrated example, the second portion 52Q has a rectangular shape.

The wiring 50Q includes a strip-shaped portion connecting the first portion 51Q and the second portion 52Q. The strip-shaped portion includes a portion extending along the y-direction, from the first portion 51Q toward the second portion 52Q.

The wiring 50R includes a first portion 51R and a second portion 52R.

The second portion 52R is located on the side of the fifth face 35 with respect to the third base portion 58, in the y-direction. The second portion 52R is located on the side of the fourth face 34 in the x-direction with respect to the second portion 52Q, and spaced therefrom. The second portion 52R is spaced apart from the third base portion 58, as viewed in the y-direction. The second portion 52R overlaps with the second portion 52Q, as viewed in the x-direction. The shape of the second portion 52R is not specifically limited, and a desired shape may be selected from a rectangular shape, a polygonal shape, a circular shape, an elliptical shape, and so forth. In the illustrated example, the second portion 52R has a rectangular shape.

The wiring 50R includes a strip-shaped portion connecting the third base portion 58 and the second portion 52R. The strip-shaped portion includes a portion extending from the third base portion 58 along the x-direction, a portion extending obliquely, and a portion extending along the y-direction toward the second portion 52R.

The wiring 50S includes a first portion 51S and a second portion 52S.

The first portion 51S is located on the side of the fourth face 34 in the x-direction, with respect to the second base portion 56. The first portion 51S overlaps with the second base portion 56, as viewed in the x-direction. The shape of the first portion 51S is not specifically limited. In the illustrated example, the first portion 51S has a rectangular shape.

The second portion 52S is located on the side of the fifth face 35 with respect to the first portion 51S, in the y-direction. The second portion 52S is located on the side of the fourth face 34 in the x-direction with respect to the second portion 52R, and spaced therefrom. The second portion 52S is spaced apart from the second base portion 56 and the third base portion 58, as viewed in the y-direction. The second portion 52S overlaps with the second portion 52R, as viewed in the x-direction. The shape of the second portion 52S is not specifically limited, and a desired shape may be selected from a rectangular shape, a polygonal shape, a circular shape, an elliptical shape, and so forth. In the illustrated example, the second portion 52S has a rectangular shape.

The wiring 50S includes a strip-shaped portion connecting the first portion 51S and the second portion 52S. The strip-shaped portion includes a portion extending from the first portion 51S along the x-direction, a portion extending obliquely, a portion extending along the y-direction, a portion extending obliquely, and a portion extending along the x-direction toward the second portion 52S.

The wiring 50T includes a first portion 51T and a second portion 52T.

The first portion 51T is located on the side of the fourth face 34 in the x-direction, with respect to the second base portion 56, and spaced therefrom. The first portion 51T is located on the side of the sixth face 36 in the y-direction, with respect to the first portion 51S, and spaced therefrom. In the illustrated example, the first portion 51T overlaps with the first portion 51S, as viewed in the y-direction. The first portion 51T overlaps with the second base portion 56, as viewed in the x-direction. The shape of the first portion 51T is not specifically limited. In the illustrated example, the first portion 51T has a rectangular shape.

The second portion 52T is located on the side of the fifth face 35 with respect to the first portion 51T, in the y-direction. The second portion 52T is located on the side of the sixth face 36 in the y-direction with respect to the second portion 52S, and spaced therefrom. The second portion 52T is spaced apart from the third base portion 58, as viewed in the y-direction. The second portion 52T overlaps with the second portion 52S, as viewed in the y-direction. The shape of the second portion 52T is not specifically limited, and a desired shape may be selected from a rectangular shape, a polygonal shape, a circular shape, an elliptical shape, and so forth. In the illustrated example, the second portion 52T has a rectangular shape.

The wiring 50T includes a strip-shaped portion connecting the first portion 51T and the second portion 52T. The strip-shaped portion includes a portion extending from the first portion 51T along the x-direction, a portion extending obliquely, a portion extending along the y-direction, and a portion extending obliquely toward the second portion 52T.

The wiring 50U includes a first portion 51U and a second portion 52U.

The second portion 52U is located on the side of the fifth face 35 with respect to the second base portion 56, in the y-direction. The second portion 52U is located on the side of the sixth face 36 in the y-direction with respect to the second portion 52T, and spaced therefrom. The second portion 52U is spaced apart from the third base portion 58, as viewed in the y-direction. The second portion 52U overlaps with the second portion 52T, as viewed in the y-direction. The shape of the second portion 52U is not specifically limited, and a desired shape may be selected from a rectangular shape, a polygonal shape, a circular shape, an elliptical shape, and so forth. In the illustrated example, the second portion 52U has a rectangular shape.

The wiring 50U includes a strip-shaped portion connecting the second base portion 56 and the second portion 52U. The strip-shaped portion includes a portion extending from the second base portion 56 along the x-direction, a portion extending obliquely, and a portion extending along the y-direction toward the second portion 52U.

The wiring 50*a* includes a first portion 51*a* and a first portion 51*b*.

The first portion 51*a* is located on the side of the third face 33 in the x-direction, with respect to the first base portion 55, and spaced therefrom. The first portion 51*a* overlaps with the first base portion 55, as viewed in the x-direction. The shape of the second portion 51*a* is not specifically limited, and a desired shape may be selected from a rectangular shape, a polygonal shape, a circular shape, an elliptical shape, and so forth. In the illustrated example, the second portion 51*a* has a rectangular shape.

The second portion 52*a* is located on the side of the third face 33 in the x-direction, with respect to the first portion 51*a*. The second portion 52*a* overlaps with the first portion 51*a*, as viewed in the x-direction. The shape of the second portion 52*a* is not specifically limited, and a desired shape may be selected from a rectangular shape, a polygonal shape, a circular shape, an elliptical shape, and so forth. In the illustrated example, the second portion 52*a* has a rectangular shape.

The wiring 50*a* includes a strip-shaped portion connecting the first portion 51*a* and the second portion 52*a*. The strip-shaped portion includes a portion extending along the x-direction.

The wiring 50*b* includes a first portion 51*b* and a second portion 52*b*.

The first portion 51*b* is located on the side of the third face 33 in the x-direction, with respect to the first base portion 55, and spaced therefrom. The first portion 51*b* overlaps with the first base portion 55, as viewed in the x-direction. The first portion 51*b* overlaps with the first portion 51*a*, as viewed in the y-direction. The shape of the second portion 51*b* is not specifically limited, and a desired shape may be selected from a rectangular shape, a polygonal shape, a circular shape, an elliptical shape, and so forth. In the illustrated example, the second portion 51*b* has a rectangular shape.

The second portion 52*b* is located on the side of the third face 33 in the x-direction, with respect to the first portion 51*b*, and spaced therefrom. The second portion 52*b* is located on the side of the third face 33 in the x-direction, with respect to the second portion 52*a*, and spaced therefrom. The second portion 52*b* overlaps with the first base portion 55 and the second portion 52*a*, as viewed in the x-direction. The shape of the second portion 52*b* is not specifically limited, and a desired shape may be selected from a rectangular shape, a polygonal shape, a circular shape, an elliptical shape, and so forth. In the illustrated example, the second portion 52*b* has a rectangular shape having the long sides extending along the y-direction.

The wiring 50*b* includes a strip-shaped portion connecting the first portion 51*b* and the second portion 52*b*. The strip-shaped portion includes a portion extending along the x-direction.

The wiring 50*h* includes a first portion 51*h* and a second portion 52*h*.

The first portion 51*h* is located on the side of the third face 33 in the x-direction, with respect to the first base portion 55, and spaced therefrom. The first portion 51*h* overlaps with the first base portion 55, as viewed in the x-direction. The first portion 51*h* overlaps with the first portion 51*b*, as viewed in the y-direction. The shape of the second portion 51*h* is not specifically limited, and a desired shape may be selected from a rectangular shape, a polygonal shape, a circular shape, an elliptical shape, and so forth. In the illustrated example, the second portion 51*h* has a rectangular shape.

As shown in FIG. 70, the second portion 52*h* is located on the side of the third face 33 in the x-direction, with respect to the first portion 51*h*, and spaced therefrom. The second portion 52*h* is located on the side of the sixth face 36 in the y-direction, with respect to the first portion 51*h*, and spaced therefrom. The second portion 52*h* is spaced apart from the first base portion 55, as viewed in the x-direction. The second portion 52*h* overlaps with the wiring 50A, as viewed in the y-direction. The shape of the second portion 52*h* is not specifically limited, and a desired shape may be selected from a rectangular shape, a polygonal shape, a circular shape, an elliptical shape, and so forth. In the illustrated example, the second portion 52*h* has a rectangular shape.

The wiring 50*h* includes a strip-shaped portion connecting the first portion 51*h* and the second portion 52*h*. The strip-shaped portion includes a portion extending from the first portion 51*h* along the x-direction, a portion extending obliquely, and a portion extending along the y-direction toward the second portion 52*h*.

The wiring 50*c* includes a first portion 51*c* and a second portion 52*c*.

The first portion 51*c* is located on the side of the fourth face 34 in the x-direction with respect to the first base portion 55, and spaced therefrom. The first portion 51*c* is located between the connecting portion 57 and the first portion 51H, in the y-direction. The first portion 51*c* overlaps with the first base portion 55, as viewed in the x-direction. The shape of the first portion 51*c* is not specifically limited. In the illustrated example, the first portion 51*c* has a rectangular shape.

The second portion 52*c* is located on the side of the fourth face 34 in the x-direction with respect to the first portion 51*c*, with a spacing therefrom, and on the side of the third face 33 in the x-direction with respect to the second base portion 56, with a spacing therefrom. The second portion 52*c* overlaps with the second base portion 56, as viewed in the x-direction. The shape of the second portion 52*c* is not specifically limited, and a desired shape may be selected from a rectangular shape, a polygonal shape, a circular shape, an elliptical shape, and so forth. In the illustrated example, the second portion 52*c* has a rectangular shape.

The wiring 50*c* includes a strip-shaped portion connecting the first portion 51*c* and the second portion 52*c*. The strip-shaped portion extends along the x-direction.

The wiring 50*d* includes a first portion 51*d* and a second portion 52*d*.

The first portion 51*d* is located on the side of the fourth face 34 in the x-direction with respect to the first base portion 55, with a spacing therefrom, and shifted toward the fourth face 34 from the first portion 51*c*. The first portion 51*d* is located between the connecting portion 57 and the first portion 51H in the y-direction, at a position shifted toward the fifth face 35 from the first portion 51*c*. In the illustrated example, the first portion 51*d* overlaps with the connecting portion 57, as viewed in the y-direction. The first portion 51*d* overlaps with the first base portion 55 and the first portion 51*c*, as viewed in the x-direction. The shape of the first portion 51*d* is not specifically limited. In the illustrated example, the first portion 51*d* has a polygonal shape.

The second portion 52*d* is located on the side of the fourth face 34 in the x-direction with respect to the first portion 51*d*, with a spacing therefrom, and on the side of the third face 33 in the x-direction with respect to the second base portion 56, with a spacing therefrom. The second portion 52*d* is located at a position shifted toward the fourth face 34 in the x-direction, from the second portion 52*c*. The second portion 52*d* overlaps with the second base portion 56, as viewed in the x-direction. The second portion 52*d* overlaps with the connecting portion 57, as viewed in the y-direction. The shape of the second portion 52*d* is not specifically limited, and a desired shape may be selected from a rectangular shape, a polygonal shape, a circular shape, an elliptical shape, and so forth. In the illustrated example, the second portion 52*d* has a polygonal shape.

The wiring 50*d* includes a strip-shaped portion connecting the first portion 51*d* and the second portion 52*d*. The strip-shaped portion extends along the x-direction.

The wiring 50*e* includes a first portion 51*e* and a second portion 52*e*.

The first portion 51*e* is located on the side of the fourth face 34 in the x-direction with respect to the first base portion 55, and spaced therefrom. The first portion 51*e* is located between the connecting portion 57 and the first portion 51H in the y-direction, at a position shifted toward the fifth face 35 from the first portion 51*d*. In the illustrated example, the first portion 51*e* overlaps with the connecting portion 57, as viewed in the y-direction. The first portion 51*e* overlaps with the first base portion 55 and the first portion 51*d*, as viewed in the x-direction. The shape of the first portion 51*e* is not specifically limited. In the illustrated example, the first portion 51*e* has a polygonal shape.

The second portion 52*e* is located on the side of the fourth face 34 in the x-direction with respect to the first portion 51*e*, with a spacing therefrom, and on the side of the third face 33 in the x-direction with respect to the second base portion 56, with a spacing therefrom. The second portion 52*e* is located at a position shifted toward the fourth face 34 in the x-direction, from the second portion 52*d*. The second portion 52*e* overlaps with the second base portion 56 and the second portion 52*d*, as viewed in the x-direction. The second portion 52*e* overlaps with the second portion 52*d* and the connecting portion 57, as viewed in the y-direction. The shape of the second portion 52*e* is not specifically limited, and a desired shape may be selected from a rectangular shape, a polygonal shape, a circular shape, an elliptical shape, and so forth. In the illustrated example, the second portion 52*e* has a polygonal shape.

The wiring 50*e* includes a strip-shaped portion connecting the first portion 51*e* and the second portion 52*e*. The strip-shaped portion extends along the x-direction.

The wiring 50*g* includes a first portion 51*g* and a second portion 52*g*.

The first portion 51*g* is located on the side of the fourth face 34 in the x-direction with respect to the first base portion 55, and spaced therefrom. The first portion 51*g* is located between the connecting portion 57 and the first portion 51H in the y-direction, at a position shifted toward the fifth face 35 from the first portion 51*e*. In the illustrated example, the first portion 51*g* overlaps with the connecting portion 57 and the first portion 51H, as viewed in the y-direction. The first portion 51*g* overlaps with the first portion 51H, as viewed in the x-direction. The shape of the first portion 51*g* is not specifically limited. In the illustrated example, the first portion 51*g* has a polygonal shape.

The second portion 52*g* is located on the side of the fourth face 34 in the x-direction with respect to the first portion 51*g*, with a spacing therefrom, and on the side of the third face 33 in the x-direction with respect to the second base portion 56, with a spacing therefrom. The second portion 52*g* overlaps with the first portion 51H, as viewed in the x-direction. The second portion 52*g* overlaps with the first portion 51H and the connecting portion 57, as viewed in the y-direction. The shape of the second portion 52*g* is not specifically limited, and a desired shape may be selected from a rectangular shape, a polygonal shape, a circular shape, an elliptical shape, and so forth. In the illustrated example, the second portion 52*g* has a polygonal shape.

The wiring 50*g* includes a strip-shaped portion connecting the first portion 51*g* and the second portion 52*g*. The strip-shaped portion extends along the x-direction.

The wiring 50*f* includes a first portion 51*f* and a second portion 52*f*.

The first portion 51*f* is located on the side of the fourth face 34 in the x-direction with respect to the second base portion 56, and spaced therefrom. The first portion 51*f* is located on the side of the sixth face 36 in the y-direction with respect to the wiring 50U, and spaced therefrom. In the illustrated example, the wiring 50*f* overlaps with the second base portion 56, as viewed in the x-direction. The wiring 50*f* overlaps with the wiring 50U, the first portion 51T, and the first portion 51S, as viewed in the y-direction. The shape of the first portion 51*f* is not specifically limited. In the illustrated example, the first portion 51*f* has a rectangular shape.

The second portion 52*f* is located on the side of the fourth face 34 in the x-direction with respect to the first portion 51*f*, and spaced therefrom. The second portion 52*f* overlaps with the second base portion 56 and the first portion 51*f*, as viewed in the x-direction. The second portion 52*f* overlaps with the wiring 50S, the wiring 50T, and the wiring 50U, as viewed in the y-direction. The shape of the second portion 52*f* is not specifically limited, and a desired shape may be selected from a rectangular shape, a polygonal shape, a circular shape, an elliptical shape, and so forth. In the illustrated example, the second portion 52*f* has a rectangular shape.

The wiring 50*f* includes a strip-shaped portion connecting the first portion 51*f* and the second portion 52*f*. The strip-shaped portion extends along the x-direction.

<Bonding Section 6>

Regarding the bonding section 6 according to this embodiment, although any of the elements is apparently given, for the sake of convenience of description, the same numeral as that of the bonding section 6 according to the third embodiment, it does not necessarily mean that the mentioned element has the same or similar configuration. The configuration of an element with a numeral is defined by the description relevant to this embodiment. Regarding a portion or structure on which no specific description is given, a similar configuration to that of the bonding section 6 of the semiconductor device A3 may be adopted, as appropriate.

The plurality of bonding sections 6 are formed on the substrate 3. In this embodiment, the plurality of bonding sections 6 are formed on the first face 31 of the substrate 3. The bonding section 6 is formed of, for example, a conductive material. The conductive material to form the bonding section 6 is not specifically limited. Examples of the conductive material to form the bonding section 6 include materials containing silver (Ag), copper (Cu), or gold (Au). In the subsequent description, it will be assumed that the bonding section 6 contains silver. The bonding section 6 according to this embodiment contains the same conductive material as that employed to form the conductive section 5. However, the bonding section 6 may contain copper instead of silver, or gold instead of silver or copper. Alternatively, the conductive section 5 may contain Ag—Pt or Ag—Pd. The forming method of the bonding section 6 is not limited. For example, the bonding section 6 may be formed, like the conductive section 5, by sintering a paste containing the mentioned metal. The thickness of the bonding section 6 is not specifically limited, but may be, for example, approximately 5 μm to 30 μm.

In this embodiment, as shown in FIG. 70, the plurality of bonding sections 6 include a bonding sections 6A to 6D, and 6H.

The bonding section 6A is located on the side of the sixth face 36 with respect to the conductive section 5, in the y-direction. The bonding section 6A overlaps with the entirety of the first base portion 55, as viewed in the y-direction. The shape of the bonding section 6A is not specifically limited.

The bonding section 6B is located on the side of the sixth face 36 with respect to the conductive section 5, in the y-direction. The bonding section 6B is located on the side of the fourth face 34 with respect to the bonding section 6A, in the x-direction. In the illustrated example, the bonding section 6B overlaps with the connecting portion 57, the wirings 50*c* to 50*g*, and the second base portion 56, as viewed in the y-direction. The shape of the bonding section 6B is not specifically limited.

The bonding section 6C is located on the side of the sixth face 36 with respect to the conductive section 5, in the y-direction. The bonding section 6C is located on the side of the fourth face 34 with respect to the bonding section 6B, in the x-direction. In the illustrated example, the bonding section 6C overlaps with the wirings 50S to 50U, the wiring 50*f*, and the second base portion 56, as viewed in the y-direction. The shape of the bonding section 6C is not specifically limited.

The bonding section 6D is located on the side of the sixth face 36 with respect to the conductive section 5, in the y-direction. The bonding section 6D is located on the side of the fourth face 34 with respect to the bonding section 6C, in the x-direction. In the illustrated example, the bonding section 6D overlaps with the wirings 50S to 50U and the wiring 50*f*, and is spaced apart from the second base portion 56, as viewed in the y-direction. The shape of the bonding section 6D is not specifically limited.

The bonding section 6H is located on the side of the sixth face 36 with respect to the conductive section 5, in the y-direction. The bonding section 6D is shifted toward the third face 33 in the x-direction, from the bonding section 6A. In the illustrated example, the bonding section 6D overlaps with the bonding section 6A, as viewed in the x-direction and the y-direction. The shape of the bonding section 6H is not specifically limited.

<Leads 1>

Regarding the lead 1 according to this embodiment, although any of the elements is apparently given, for the sake of convenience of description, the same numeral as that of the lead 1 according to the first embodiment, it does not necessarily mean that the mentioned element has the same or similar configuration. The configuration of an element with a numeral is defined by the description relevant to this embodiment. However, the configuration of the lead 1 of the semiconductor device A3 may be adopted, as appropriate. The plurality of leads 1 contain a metal, and have higher heat dissipation characteristics, for example than the substrate 3. The metal to form the lead 1 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 1 may be plated with nickel (Ni). Examples of the forming method of the plurality of leads 1 include pressing a metal plate with a die, and patterning a metal plate by etching, without limitation thereto. The thickness of the lead 1 is not specifically limited, but may be, for example, approximately 0.4 mm to 0.8 mm.

The plurality of leads 1 include a plurality of leads 1A to 1I, as shown in FIG. 70. The plurality of leads 1A to 1I constitute conduction paths to the semiconductor chips 4A to 4F, and 4X.

The lead 1A is located on the substrate 3 and, in this embodiment, on the first face 31. The lead 1A exemplifies a first lead in the present disclosure. The lead 1A is bonded to the bonding section 6A, via a bonding material 81. It is preferable to employ a material having high thermal conductivity as the bonding material 81, such as silver paste, copper paste, or solder. However, the bonding material 81 may be an insulative material such as an epoxy-based resin or a silicone-based resin. In the case where the bonding section 6A is not provided on the substrate 3, the lead 1A may be bonded to the substrate 3.

The configuration of the lead 1A is not specifically limited and, in this embodiment, the lead 1A includes a first portion 11A, a second portion 12A, a third portion 13A, and a fourth portion 14A, each of which will be described hereunder.

The first portion 11A overlaps with the substrate 3 as viewed in the z-direction, and is bonded to the bonding section 6A via the bonding material 81.

In the illustrated example, the first portion 11A includes a first portion 113A and a second portion 114A.

The first portion 113A occupies a majority of the first portion 11A. The first portion 113A overlaps with the second base portion 56, and the wirings 50*a*, 50*b*, and 50*h*, as viewed in the y-direction.

The second portion 114A is connected to the first portion 113A on the side of the third face 33, in the x-direction. The center of the second portion 114A in the y-direction is shifted toward the fifth face 35, from the center of the first portion 113A in the y-direction. In the illustrated example, the edge of the first portion 113A on the side of the fifth face 35 in the y-direction, and the edge of the second portion 114A on the side of the fifth face 35 in the y-direction generally coincide with each other, as viewed in the x-direction. Here, the expression "generally coincide" as viewed in the x-direction refers to, for example, exactly coinciding with each other, or being deviated by within ±5% of the characteristic size (size of the first portion 113A or second portion 114A in the y-direction).

The third portion 13A and the fourth portion 14A are covered with the encapsulating resin 7. The third portion 13A is connected to the first portion 11A and the fourth portion 14A. In the illustrated example, the third portion 13A is connected to the first portion 11A. In addition, the third portion 13A is spaced apart from the sixth face 36, as viewed in the z-direction. The fourth portion 14A is shifted from the first portion 11A in the z-direction. The end portion of the fourth portion 14A is flush with a sixth face 76 of the resin 7.

The second portion 12A is connected to the end portion of the fourth portion 14A, and corresponds to a portion of the lead 1A sticking out from the encapsulating resin 7. The second portion 12A sticks out to the opposite side of the first portion 11A, in the y-direction. The second portion 12A is used, for example, to electrically connect the semiconductor device A7 to an external circuit. The second portion 12A is bent, for example, in the z-direction.

The lead 1B is located on the substrate 3 and, in this embodiment, on the first face 31. The lead 1B exemplifies a first lead in the present disclosure. The lead 1B is bonded to the bonding section 6B, via the bonding material 81. In the case where the bonding section 6B is not provided on the substrate 3, the lead 1B may be bonded to the substrate 3.

The configuration of the lead 1B is not specifically limited. In this embodiment, the lead 1B includes a first portion 11B, a second portion 12B, a third portion 13B, and a fourth portion 14B, each of which will be described hereunder.

The first portion 11B overlaps with the substrate 3 as viewed in the z-direction, and is bonded to the bonding section 6B via the bonding material 81. The first portion 11B overlaps with the second base portion 56, as viewed in the y-direction The third portion 13B and the fourth portion 14B are covered with the encapsulating resin 7. The third portion 13B is connected to the first portion 11B and the fourth portion 14B. In the illustrated example, the third portion 13B is connected to the first portion 11B. In addition, the third portion 13B overlaps with the sixth face 36, as viewed in the z-direction. The fourth portion 14B is shifted from the first portion 11B in the z-direction. The end portion of the fourth portion 14B is flush with the sixth face 76 of the resin 7.

The second portion 12B is connected to the fourth portion 14B, and corresponds to a portion of the lead 1B sticking out from the encapsulating resin 7. The second portion 12B sticks out to the opposite side of the first portion 11B, in the y-direction. The second portion 12B is used, for example, to electrically connect the semiconductor device A7 to an external circuit. In the illustrated example, the second portion 12B is bent, for example, in the z-direction.

The lead 1C is located on the substrate 3 and, in this embodiment, on the first face 31. The lead 1C exemplifies a first lead in the present disclosure. The lead 1C is bonded to the bonding section 6C, via the bonding material 81. In the case where the bonding section 6C is not provided on the substrate 3, the lead 1C may be bonded to the substrate 3.

The configuration of the lead 1C is not specifically limited. In this embodiment, the lead 1C includes a first portion 11C, a second portion 12C, a third portion 13C, and a fourth portion 14C, each of which will be described hereunder.

The first portion 11C overlaps with the substrate 3 as viewed in the z-direction, and is bonded to the bonding section 6C via the bonding material 81. The first portion 11C overlaps with the second base portion 56, as viewed in the y-direction The third portion 13C and the fourth portion 14C are covered with the encapsulating resin 7. The third portion 13C is connected to the first portion 11C and the fourth portion 14C. In the illustrated example, the third portion 13C is connected to the first portion 11C. The fourth portion 14C is, like the fourth portion 14B of the lead 1B, shifted from the first portion 11C in the z-direction. The end portion of the fourth portion 14C is flush with the sixth face 76 of the resin 7.

The second portion 12C is connected to the end portion of the fourth portion 14C, and corresponds to a portion of the lead 1C sticking out from the encapsulating resin 7. The second portion 12C sticks out to the opposite side of the first portion 11C, in the y-direction. The second portion 12C is used, for example, to electrically connect the semiconductor device A7 to an external circuit. In the illustrated example, the second portion 12C is bent, for example, in the z-direction.

The lead 1D is located on the substrate 3 and, in this embodiment, on the first face 31. The lead 1D exemplifies a first lead in the present disclosure. The lead 1D is bonded to the bonding section 6D, via the bonding material 81. In the case where the bonding section 6D is not provided on the substrate 3, the lead 1D may be bonded to the substrate 3.

The configuration of the lead 1D is not specifically limited. In this embodiment the lead 1D includes, as shown in FIG. 4 and FIG. 14, a first portion 11D, a second portion 12D, a third portion 13D, and a fourth portion 14D, each of which will be described hereunder.

The first portion 11D overlaps with the substrate 3 as viewed in the z-direction, and is bonded to the bonding section 6D via the bonding material 81. The first portion 11D overlaps with the second base portion 56, as viewed in the y-direction The third portion 13D and the fourth portion 14D are covered with the encapsulating resin 7. The third portion 13D is connected to the first portion 11D and the fourth portion 14D. In the illustrated example, the third portion 13D is connected to the first portion 11D. The fourth portion 14D is, like the fourth portion 14B of the lead 1B, shifted from the first portion 11D in the z-direction. The end portion of the fourth portion 14D is flush with the sixth face 76 of the resin 7.

The second portion 12D is connected to the end portion of the fourth portion 14D, and corresponds to a portion of the lead 1D sticking out from the encapsulating resin 7. The second portion 12D sticks out to the opposite side of the first portion 11D, in the y-direction. The second portion 12D is used, for example, to electrically connect the semiconductor device A7 to an external circuit. In the illustrated example, the second portion 12D is bent, for example, in the z-direction.

The lead 1E is spaced apart from the substrate 3, as viewed in the z-direction. In this embodiment, the lead 1E located on the side to which the sixth face 36 is oriented, with respect to the substrate 3 in the y-direction.

The configuration of the lead 1E is not specifically limited. In this embodiment the lead 1E includes a second portion 12E and a fourth portion 14E, each of which will be described hereunder.

The fourth portion 14E is covered with the encapsulating resin 7. The fourth portion 14E is, like the fourth portion 14D of the lead 1D, shifted from the first portion 11E in the z-direction. The fourth portion 14E overlaps with the first portion 11C and the first portion 11D, as viewed in the y-direction. The end portion of the fourth portion 14E is flush with the sixth face 76 of the resin 7.

The second portion 12E is connected to the end portion of the fourth portion 14E, and corresponds to a portion of the lead 1E sticking out from the encapsulating resin 7. The second portion 12E sticks out to the opposite side of the fourth portion 14E, in the y-direction. The second portion 12E is used, for example, to electrically connect the semiconductor device A7 to an external circuit. In the illustrated example, the second portion 12E is bent, for example, in the z-direction.

The lead 1F is spaced apart from the substrate 3, as viewed in the z-direction. In this embodiment, the lead 1F is located on the side to which the sixth face 36 is oriented, with respect to the substrate 3 in the y-direction. The lead 1F is located on the opposite side of the fourth portion 14D, across the lead 1E.

The configuration of the lead 1F is not specifically limited. In this embodiment the lead 1F includes a second portion 12F and a fourth portion 14F, each of which will be described hereunder.

The fourth portion 14F is covered with the encapsulating resin 7. The fourth portion 14F is, like the fourth portion 14D of the lead 1D, shifted from the first portion 11F in the z-direction. The fourth portion 14F overlaps with the first portion 11D, as viewed in the y-direction. The end portion of the fourth portion 14F is flush with the sixth face 76 of the resin 7.

The second portion 12F is connected to the end portion of the fourth portion 14F, and corresponds to a portion of the lead 1F sticking out from the encapsulating resin 7. The second portion 12F sticks out to the opposite side of the fourth portion 14F, in the y-direction. The second portion 12F is used, for example, to electrically connect the semiconductor device A7 to an external circuit. In the illustrated example, the second portion 12F is bent, for example, in the z-direction.

The lead 1G is spaced apart from the substrate 3, as viewed in the z-direction. In this embodiment, the lead 1G is located on the side to which the fourth face 34 is oriented, with respect to the substrate 3 in the x-direction. The lead 1G is located on the opposite side of the fourth portion 14E, across the lead 1F.

The configuration of the lead 1G is not specifically limited. In this embodiment the lead 1G includes a second portion 12G and a fourth portion 14G, each of which will be described hereunder.

The fourth portion 14G is covered with the encapsulating resin 7. The fourth portion 14G is, like the fourth portion 14D of the lead 1D, shifted from the first portion 11G in the z-direction. The fourth portion 14G overlaps with the fourth portion 14F, as viewed in the y-direction. In addition, the fourth portion 14G overlaps with the first portion 11D, as viewed in the x-direction. The end portion of the fourth portion 14G is flush with the sixth face 76 of the resin 7.

The second portion 12G is connected to the fourth portion 14G, and corresponds to a portion of the lead 1G sticking out from the encapsulating resin 7. The second portion 12G sticks out to the opposite side of the fourth portion 14G, in the y-direction. The second portion 12G is used, for example, to electrically connect the semiconductor device A7 to an external circuit. In the illustrated example, the second portion 12G is bent, for example, in the z-direction.

The lead 1H is located on the substrate 3 and, in this embodiment, on the first face 31. The lead 1H exemplifies a first lead in the present disclosure. The lead 1H is bonded to the bonding section 6H, via the bonding material 81. In the case where the bonding section 6H is not provided on the substrate 3, the lead 1H may be bonded to the substrate 3.

The configuration of the lead 1H is not specifically limited. In this embodiment the lead 1H includes, as shown in FIG. 4 and FIG. 14, a first portion 11H, a second portion 12H, a third portion 13H, and a fourth portion 14H, each of which will be described hereunder.

The first portion 11H overlaps with the substrate 3 as viewed in the z-direction, and is bonded to the bonding section 6H via the bonding material 81.

In the illustrated example, the first portion 11H includes a first portion 113H and a second portion 114H.

The first portion 113H occupies a majority of the first portion 11H. The first portion 113H is located on the side of the third face 33 with respect to the first portion 113A, as viewed in the x-direction. The first portion 113H overlaps with the first portion 113A, as viewed in the x-direction. The first portion 113H is located on the side of the sixth face 36 in the y-direction, with respect to the second portion 114A. The first portion 113H overlaps with the second portion 114A, as viewed in the y-direction.

The second portion 114H is connected to the first portion 113H on the side of the fifth face 35, in the y-direction. The center of the second portion 114H in the x-direction is shifted toward the third face 33, from the center of the first portion 113H in the x-direction. The second portion 114H overlaps with the second portion 114A, as viewed in the x-direction. The second portion 114H is spaced apart from the second portion 114A, as viewed in the y-direction. In the illustrated example, the edge of the first portion 113H on the side of the third face 33 in the x-direction, and the edge of the second portion 114H on the side of the third face 33 in the x-direction generally coincide with each other, as viewed in the y-direction. Here, the expression "generally coincide" as viewed in the y-direction refers to, for example, exactly coinciding with each other, or being deviated by within ±5% of the characteristic size (size of the first portion 113H or second portion 114H in the x-direction).

The third portion 13H and the fourth portion 14H are covered with the encapsulating resin 7. The third portion 13H is connected to the first portion 11H and the fourth portion 14H. In the illustrated example, the third portion 13H is connected to the first portion 11H. In addition, the third portion 13H is spaced apart from the sixth face 36, as viewed in the z-direction. The fourth portion 14H is shifted from the first portion 11H in the z-direction. The end portion of the fourth portion 14H is flush with a sixth face 76 of the resin 7.

The second portion 12H is connected to the end portion of the fourth portion 14H, and corresponds to a portion of the lead 1H sticking out from the encapsulating resin 7. The second portion 12H sticks out to the opposite side of the first portion 11H, in the y-direction. The second portion 12H is used, for example, to electrically connect the semiconductor device A7 to an external circuit. The second portion 12H is bent, for example, in the z-direction.

The lead 1I is spaced apart from the substrate 3, as viewed in the z-direction. In this embodiment, the lead 1I located on the side to which the sixth face 36 is oriented, with respect to the substrate 3 in the y-direction. In addition, the lead 1I is located on the opposite side of the fourth portion 14A across the lead 1H, in the x-direction.

The configuration of the lead 1I is not specifically limited. In this embodiment the lead 1I includes a second portion 12I and a fourth portion 14I, each of which will be described hereunder.

The fourth portion 14I is covered with the encapsulating resin 7. The fourth portion 14I is, like the fourth portion 14D of the lead 1D, shifted from the first portion 11I in the z-direction. The fourth portion 14I overlaps with the first portion 11H, as viewed in the y-direction. In addition, the fourth portion 14I overlaps with the fourth portion 14H, as viewed in the x-direction. The end portion of the fourth portion 14I is flush with the sixth face 76 of the resin 7.

The second portion 12I is connected to the fourth portion 14I, and corresponds to a portion of the lead 1I sticking out from the encapsulating resin 7. The second portion 12I sticks out to the opposite side of the fourth portion 14I, in the y-direction. The second portion 12I is used, for example, to electrically connect the semiconductor device A33 to an external circuit. In the illustrated example, the second portion 12I is bent, for example, in the z-direction.

<Leads 2>

Regarding the lead 2 according to this embodiment, although any of the elements is apparently given, for the sake of convenience of description, the same numeral as that of the lead 2 according to the third embodiment, it does not necessarily mean that the mentioned element has the same or similar configuration. The configuration of an element with a numeral is defined by the description relevant to this embodiment. Regarding an element on which no specific description is given, a similar configuration to that of the corresponding element of the lead 2 of the semiconductor device A3 may be adopted, as appropriate.

The plurality of leads 2 contain a metal, and have higher heat dissipation characteristics, for example than the substrate 3. The metal to form the lead 2 is not specifically limited, and may be, for example, copper (Cu), aluminum, iron (Fe), oxygen-free copper, or an alloy of the cited metals, such as a Cu—Sn alloy, a Cu—Zr alloy, or a Cu—Fe alloy. The plurality of leads 2 may be plated with nickel (Ni). Examples of the forming method of the plurality of leads 2 include pressing a metal plate with a die, and patterning a metal plate by etching, without limitation thereto. The thickness of the lead 2 is not specifically limited, but may be, for example, approximately 0.4 mm to 0.8 mm. The plurality of leads 2 are located so as to overlap with the second region 303 of the substrate 3, as viewed in the z-direction.

In this embodiment, the plurality of leads 2 include a plurality of leads 2A to 2V, as shown in FIG. 70 and FIG. 71. The plurality of leads 2A to 2H, and 2S to 2U respectively constitute conduction paths to the control chips 4G and 4H. The plurality of leads 2I to 2R, and 2V constitute conduction paths to the primary-side circuit chip 4J.

The lead 2A is spaced apart from the plurality of leads 1. The lead 2A is located on the conductive section 5. The lead 2A is electrically connected to the conductive section 5. The lead 2A exemplifies a second lead in the present disclosure. The lead 2A is bonded to the second portion 52A of the wiring 50A in the conductive section 5, via a conductive bonding material 82. The conductive bonding material 82 may be any material that is capable of bonding, and electrically connecting, the lead 2A to the second portion 52A. For example, silver paste, copper paste, or solder may be employed as the conductive bonding material 82. The conductive bonding material 82 corresponds to the first conductive bonding material in the present disclosure.

The configuration of the lead 2A is not specifically limited. In this embodiment the lead 2A includes, like that of the semiconductor device A3, a first portion 21A, a second portion 22A, a third portion 23A, and a fourth portion 24A, each of which will be described hereunder.

The first portion 21A is bonded to the second portion 52A of the wiring 50A. The shape of the first portion 21A is not specifically limited, and a desired shape may be selected from a rectangular shape, a polygonal shape, a circular shape, an elliptical shape, and so forth. In the illustrated example, the first portion 21A has a bent shape including a portion extending along the x-direction, and a portion extending along the y-direction. The first portion 21A overlaps with the third face 33 of the substrate 3 as viewed in the z-direction, and sticks out in the x-direction, toward the side to which the third face 33 is oriented.

The third portion 23A and the fourth portion 24A are covered with the encapsulating resin 7. The third portion 23A is connected to the first portion 21A and the fourth portion 24A. The fourth portion 24A is shifted in the z-direction with respect to the first portion 21A. The end portion of the fourth portion 24A is flush with a fifth face 75 of the resin 7. In the illustrated example, the third portion 23A and the fourth portion 24A generally coincide with each other, as viewed in the y-direction. Here, the expression "generally coincide" as viewed in the y-direction refers to, for example, exactly coinciding with each other, or being deviated by within ±5% of the characteristic size (size of the third portion 23A, or fourth portion 24A in the x-direction).

The second portion 22A is connected to the end portion of the fourth portion 24A, and corresponds to a portion of the lead 2A sticking out from the encapsulating resin 7 to the opposite side of the plurality of leads 1, as viewed in the y-direction. The second portion 22A sticks out to the opposite side of the first portion 21A, in the y-direction. The second portion 22A is used, for example, to electrically connect the semiconductor device A7 to an external circuit. In the illustrated example, the second portion 22A is bent, for example, in the z-direction. The second portion 22A, the third portion 23A, and the fourth portion 24A each include, on the respective sides thereof in the x-direction, edges extending along the y-direction.

The lead 2B is spaced apart from the plurality of leads 1. The lead 2B is located on the conductive section 5. The lead 2B is electrically connected to the conductive section 5. The lead 2B exemplifies a second lead in the present disclosure. The lead 2B is bonded to the second portion 52B of the wiring 50B in the conductive section 5, via the conductive bonding material 82.

The configuration of the lead 2B is not specifically limited. In this embodiment, the lead 2B includes a first portion 21B, a second portion 22B, a third portion 23B, and a fourth portion 24B, each of which will be described hereunder.

The first portion 21B is bonded to the second portion 52B of the wiring 503. The shape of the first portion 21B is not specifically limited, and a desired shape may be selected from a rectangular shape, a polygonal shape, a circular shape, an elliptical shape, and so forth. In the illustrated example, the first portion 21B has a bent shape including a portion extending along the x-direction, and a portion extending along the y-direction. The first portion 21B overlaps with the third face 33 of the substrate 3 as viewed in the z-direction, and sticks out in the x-direction, toward the side to which the third face 33 is oriented. In the illustrated example, the first portion 21B overlaps with the second portion 52B, as viewed in the z-direction.

The third portion 23B and the fourth portion 24B are covered with the encapsulating resin 7. The third portion 23B is connected to the first portion 21B and the fourth portion 24B. The fourth portion 24B is shifted in the z-direction with respect to the first portion 21B. The end portion of the fourth portion 24B is flush with the fifth face 75 of the resin 7. In the illustrated example, the third portion 23B and the fourth portion 24B generally coincide with each other, as viewed in the y-direction. Here, the expression "generally coincide" as viewed in the y-direction refers to, for example, exactly coinciding with each other, or being deviated by within ±5% of the characteristic size (size of the third portion 23B or fourth portion 24B in the x-direction).

The second portion 22B is connected to the end portion of the fourth portion 24B, and corresponds to a portion of the lead 2B sticking out from the encapsulating resin 7 to the opposite side of the plurality of leads 1, as viewed in the y-direction. The second portion 22B sticks out to the opposite side of the first portion 21B, in the y-direction. The second portion 22B is used, for example, to electrically connect the semiconductor device A7 to an external circuit. In the illustrated example, the second portion 22B is bent, for example, in the z-direction. The second portion 22B, the third portion 23B, and the fourth portion 24B each include, on the respective sides thereof in the x-direction, edges extending along the y-direction. The edges of the second portion 22B, the third portion 23B, and the fourth portion 24B, on the side of the third face 33 in the x-direction, are respectively opposed to the edges of the second portion 22A, the third portion 23A, and the fourth portion 24A, on the side of the fourth face 34 in the x-direction.

The lead 2C is spaced apart from the plurality of leads 1. The lead 2C is located on the conductive section 5. The lead 2C is electrically connected to the conductive section 5. The lead 2C exemplifies a second lead in the present disclosure. The lead 2C is bonded to the second portion 52C of the wiring 50C in the conductive section 5, via the conductive bonding material 82.

The configuration of the lead 2C is not specifically limited. In this embodiment, the lead 2C includes a first portion 21C, a second portion 22C, a third portion 23C, and a fourth portion 24C, each of which will be described hereunder.

The first portion 21C is bonded to the second portion 52C of the wiring 50C. The shape of the first portion 21C is not specifically limited, and a desired shape may be selected from a rectangular shape, a polygonal shape, a circular shape, an elliptical shape, and so forth. In the illustrated example, the first portion 21C has a strip shape extending along the y-direction. The first portion 21C overlaps with the fifth face 35 of the substrate 3 as viewed in the z-direction, and sticks out in the y-direction toward the side to which the fifth face 35 is oriented. In the illustrated example, the first portion 21C overlaps with the second portion 52C, as viewed in the z-direction.

The third portion 23C and the fourth portion 24C are covered with the encapsulating resin 7. The third portion 23C is connected to the first portion 21C and the fourth portion 24C. The fourth portion 24C is shifted in the z-direction with respect to the first portion 21C. The end portion of the fourth portion 24C is flush with the fifth face 75 of the resin 7. In the illustrated example, the third portion 23C and the fourth portion 24C generally coincide with each other, as viewed in the y-direction. Here, the expression "generally coincide" as viewed in the y-direction refers to, for example, exactly coinciding with each other, or being deviated by within ±5% of the characteristic size (size of the third portion 23C or fourth portion 24C in the x-direction).

The second portion 22C is connected to the end portion of the fourth portion 24C, and corresponds to a portion of the lead 2C sticking out from the encapsulating resin 7 to the opposite side of the plurality of leads 1, as viewed in the y-direction. The second portion 22C sticks out to the opposite side of the first portion 21C, in the y-direction. The second portion 22C is used, for example, to electrically connect the semiconductor device A7 to an external circuit. In the illustrated example, the second portion 22C is bent, for example, in the z-direction. The second portion 22C, the third portion 23C, and the fourth portion 24C each include, on the respective sides thereof in the x-direction, edges extending along the y-direction. The edges of the second portion 22C, the third portion 23C, and the fourth portion 24C, on the side of the third face 33 in the x-direction, are respectively opposed to the edges of the second portion 22B, the third portion 23B, and the fourth portion 24B, on the side of the fourth face 34 in the x-direction.

The lead 2D is spaced apart from the plurality of leads 1. The lead 2D is located on the conductive section 5. The lead 2D is electrically connected to the conductive section 5. The lead 2D exemplifies a second lead in the present disclosure. The lead 2D is bonded to the second portion 52D of the wiring 50D in the conductive section 5, via the conductive bonding material 82.

The configuration of the lead 2D is not specifically limited. In this embodiment, as shown in FIG. 59, the lead 2D includes a first portion 21D, a second portion 22D, a third portion 23D, and a fourth portion 24D, each of which will be described hereunder.

The first portion 21D is bonded to the second portion 52D of the wiring 50D. The shape of the first portion 21D is not specifically limited, and a desired shape may be selected from a rectangular shape, a polygonal shape, a circular shape, an elliptical shape, and so forth. In the illustrated example, the first portion 21D has a strip shape extending along the y-direction. The first portion 21D overlaps with the fifth face 35 of the substrate 3 as viewed in the z-direction, and sticks out in the v-direction toward the side to which the fifth face 35 is oriented. In the illustrated example, the first portion 21D overlaps with the second portion 52D, as viewed in the z-direction.

The third portion 23D and the fourth portion 24D are covered with the encapsulating resin 7. The third portion 23D is connected to the first portion 21D and the fourth portion 24D. The fourth portion 24D is shifted in the z-direction with respect to the first portion 21D. The end portion of the fourth portion 24D is flush with the fifth face 75 of the resin 7. In the illustrated example, the third portion 23D and the fourth portion 24D generally coincide with each other, as viewed in the y-direction. Here, the expression "generally coincide" as viewed in the y-direction refers to, for example, exactly coinciding with each other, or being deviated by within ±5% of the characteristic size (size of the third portion 23D or fourth portion 24D in the x-direction).

The second portion 22D is connected to the end portion of the fourth portion 24D, and corresponds to a portion of the lead 2D sticking out from the encapsulating resin 7 to the opposite side of the plurality of leads 1, as viewed in the y-direction. The second portion 22D sticks out to the opposite side of the first portion 21D, in the y-direction. The second portion 22D is used, for example, to electrically connect the semiconductor device A7 to an external circuit. In the illustrated example, the second portion 22D is bent in the z-direction. The second portion 22D, the third portion 23D, and the fourth portion 24D each include, on the respective sides thereof in the x-direction, edges extending along the y-direction. The edges of the second portion 22D, the third portion 23D, and the fourth portion 24D, on the side of the third face 33 in the x-direction, are respectively opposed to the edges of the second portion 22C, the third portion 23C, and the fourth portion 24C, on the side of the fourth face 34 in the x-direction.

The lead 2E is spaced apart from the plurality of leads 1. The lead 2E is located on the conductive section 5. The lead 2E is electrically connected to the conductive section 5. The lead 2E exemplifies a second lead in the present disclosure. The lead 2E is bonded to the second portion 52E of the wiring 50E in the conductive section 5, via the conductive bonding material 82.

The configuration of the lead 2E is not specifically limited. In this embodiment, as shown in FIG. 59, the lead 2E includes a first portion 21E, a second portion 22E, a third portion 23E, and a fourth portion 24E, each of which will be described hereunder.

The first portion 21E is bonded to the second portion 52E of the wiring 50E. The shape of the first portion 21E is not specifically limited, and a desired shape may be selected from a rectangular shape, a polygonal shape, a circular shape, an elliptical shape, and so forth. In the illustrated example, the first portion 21E has a strip shape extending along the y-direction. The first portion 21E overlaps with the fifth face 35 of the substrate 3 as viewed in the z-direction, and sticks out in the y-direction toward the side to which the fifth face 35 is oriented. In the illustrated example, the first portion 21E overlaps with the second portion 52E, as viewed in the z-direction.

The third portion 23E and the fourth portion 24E are covered with the encapsulating resin 7. The third portion 23E is connected to the first portion 21E and the fourth portion 24E. The fourth portion 24E is shifted in the z-direction with respect to the first portion 21E. The end portion of the fourth portion 24E is flush with the fifth face 75 of the resin 7. In the illustrated example, the third portion 23E and the fourth portion 24E generally coincide with each other, as viewed in the y-direction. Here, the expression "generally coincide" as viewed in the y-direction refers to, for example, exactly coinciding with each other, or being deviated by within ±5% of the characteristic size (size of the third portion 23E or fourth portion 24E in the x-direction).

The second portion 22E is connected to the end portion of the fourth portion 24E, and corresponds to a portion of the lead 2E sticking out from the encapsulating resin 7 to the opposite side of the plurality of leads 1, as viewed in the y-direction. The second portion 22E sticks out to the opposite side of the first portion 21E, in the y-direction. The second portion 22E is used, for example, to electrically connect the semiconductor device A7 to an external circuit. In the illustrated example, the second portion 22E is bent in the z-direction. The second portion 22E, the third portion 23E, and the fourth portion 24E each include, on the respective sides thereof in the x-direction, edges extending along the y-direction. The edges of the second portion 22E, the third portion 23E, and the fourth portion 24E, on the side of the third face 33 in the x-direction, are respectively opposed to the edges of the second portion 22D, the third portion 23D, and the fourth portion 24D, on the side of the fourth face 34 in the x-direction.

The lead 2F is spaced apart from the plurality of leads 1. The lead 2F is located on the conductive section 5. The lead 2F is electrically connected to the conductive section 5. The lead 2F exemplifies a second lead in the present disclosure. The lead 2F is bonded to the second portion 52F of the wiring 50F in the conductive section 5, via the conductive bonding material 82.

The configuration of the lead 2F is not specifically limited. In this embodiment, the lead 2F includes a first portion 21F, a second portion 22F, a third portion 23F, and a fourth portion 24F, each of which will be described hereunder.

The first portion 21F is bonded to the second portion 52F of the wiring 50F. The shape of the first portion 21F is not specifically limited, and a desired shape may be selected from a rectangular shape, a polygonal shape, a circular shape, an elliptical shape, and so forth. In the illustrated example, the first portion 21F has a strip shape extending along the y-direction. The first portion 21F overlaps with the fifth face 35 of the substrate 3 as viewed in the z-direction, and sticks out in the y-direction toward the side to which the fifth face 35 is oriented. In the illustrated example, the first portion 21F overlaps with the second portion 52F, as viewed in the z-direction.

The third portion 23F and the fourth portion 24F are covered with the encapsulating resin 7. The third portion 23F is connected to the first portion 21F and the fourth portion 24F. The fourth portion 24F is shifted in the z-direction with respect to the first portion 21F. The end portion of the fourth portion 24F is flush with the fifth face 75 of the resin 7. In the illustrated example, the third portion 23F and the fourth portion 24F generally coincide with each other, as viewed in the y-direction. Here, the expression "generally coincide" as viewed in the y-direction refers to, for example, exactly coinciding with each other, or being deviated by within ±5% of the characteristic size (size of the third portion 23F or fourth portion 24F in the x-direction).

The second portion 22F is connected to the end portion of the fourth portion 24F, and corresponds to a portion of the lead 2F sticking out from the encapsulating resin 7 to the opposite side of the plurality of leads 1, as viewed in the y-direction. The second portion 22F sticks out to the opposite side of the first portion 21F, in the y-direction. The second portion 22F is used, for example, to electrically connect the semiconductor device A7 to an external circuit. In the illustrated example, the second portion 22F is bent, for example, in the z-direction. The second portion 22F, the third portion 23F, and the fourth portion 24F each include, on the respective sides thereof in the x-direction, edges extending along the y-direction. The edges of the second portion 22F, the third portion 23F, and the fourth portion 24F, on the side of the third face 33 in the x-direction, are respectively opposed to the edges of the second portion 22E, the third portion 23E, and the fourth portion 24E, on the side of the fourth face 34 in the x-direction.

The lead 2G is spaced apart from the plurality of leads 1. The lead 2G is located on the conductive section 5. The lead 2G is electrically connected to the conductive section 5. The lead 2G exemplifies a second lead in the present disclosure. The lead 2G is bonded to the second portion 52G of the wiring 50G in the conductive section 5, via the conductive bonding material 82.

The configuration of the lead 2G is not specifically limited. In this embodiment, the lead 2G includes a first portion 21G, a second portion 22G, a third portion 23G, and a fourth portion 24G, each of which will be described hereunder.

The first portion 21G is bonded to the second portion 52G of the wiring 50G. The shape of the first portion 21G is not specifically limited, and a desired shape may be selected from a rectangular shape, a polygonal shape, a circular shape, an elliptical shape, and so forth. In the illustrated example, the first portion 21G has a strip shape extending along the y-direction. The first portion 21G overlaps with the fifth face 35 of the substrate 3 as viewed in the z-direction, and sticks out in the y-direction toward the side to which the fifth face 35 is oriented. In the illustrated example, the first portion 21G overlaps with the second portion 52G, as viewed in the z-direction.

The third portion 23G and the fourth portion 24G are covered with the encapsulating resin 7. The third portion 23G is connected to the first portion 21G and the fourth portion 24G. The fourth portion 24G is shifted in the z-direction with respect to the first portion 21G. The end portion of the fourth portion 24G is flush with the fifth face 75 of the resin 7. In the illustrated example, the third portion 23G and the fourth portion 24G generally coincide with each other, as viewed in the y-direction. Here, the expression "generally coincide" as viewed in the y-direction refers to, for example, exactly coinciding with each other, or being deviated by within ±5% of the characteristic size (size of the third portion 23G or fourth portion 24G in the x-direction).

The second portion 22G is connected to the end portion of the fourth portion 24G, and corresponds to a portion of the lead 2G sticking out from the encapsulating resin 7 to the opposite side of the plurality of leads 1, as viewed in the y-direction. The second portion 22G sticks out to the opposite side of the first portion 21G, in the y-direction. The second portion 22G is used, for example, to electrically connect the semiconductor device A7 to an external circuit. In the illustrated example, the second portion 22G is bent, for example, in the z-direction. The second portion 22G, the third portion 23G, and the fourth portion 24G each include, on the respective sides thereof in the x-direction, edges extending along the y-direction. The edges of the second portion 22G, the third portion 23G, and the fourth portion 24G, on the side of the third face 33 in the x-direction, are respectively opposed to the edges of the second portion 22F, the third portion 23F, and the fourth portion 24F, on the side of the fourth face 34 in the x-direction.

The lead 2H is spaced apart from the plurality of leads 1. The lead 2H is located on the conductive section 5. The lead 2H is electrically connected to the conductive section 5. The lead 2H exemplifies a second lead in the present disclosure. The lead 2H is bonded to the second portion 52H of the wiring 50H in the conductive section 5, via the conductive bonding material 82.

The configuration of the lead 2H is not specifically limited. In this embodiment, the lead 2H includes a first portion 21H, a second portion 22H, a third portion 23H, and a fourth portion 24H, each of which will be described hereunder.

The first portion 21H is bonded to the second portion 52H of the wiring 50H. The shape of the first portion 21H is not specifically limited, and a desired shape may be selected from a rectangular shape, a polygonal shape, a circular shape, an elliptical shape, and so forth. In the illustrated example, the first portion 21H has a strip shape extending along the y-direction. The first portion 21H overlaps with the fifth face 35 of the substrate 3 as viewed in the z-direction, and sticks out in the y-direction toward the side to which the fifth face 35 is oriented. In the illustrated example, the first portion 21H overlaps with the second portion 52H, as viewed in the z-direction.

The third portion 23H and the fourth portion 24H are covered with the encapsulating resin 7. The third portion 23H is connected to the first portion 21H and the fourth portion 24H. The fourth portion 24H is shifted in the z-direction with respect to the first portion 21H. The end portion of the fourth portion 24H is flush with the fifth face 75 of the resin 7. In the illustrated example, the third portion 23H and the fourth portion 24H generally coincide with each other, as viewed in the y-direction. Here, the expression "generally coincide" as viewed in the y-direction refers to, for example, exactly coinciding with each other, or being deviated by within ±5% of the characteristic size (size of the third portion 23H or fourth portion 24H in the x-direction).

The second portion 22H is connected to the end portion of the fourth portion 24H, and corresponds to a portion of the lead 2H sticking out from the encapsulating resin 7 to the opposite side of the plurality of leads 1, as viewed in the y-direction. The second portion 22H sticks out to the opposite side of the first portion 21H, in the y-direction. The second portion 22H is used, for example, to electrically connect the semiconductor device A7 to an external circuit. In the illustrated example, the second portion 22H is bent, for example, in the z-direction. The second portion 22H, the third portion 23H, and the fourth portion 24H each include, on the respective sides thereof in the x-direction, edges extending along the y-direction. The edges of the second portion 22H, the third portion 23H, and the fourth portion 24H, on the side of the third face 33 in the x-direction, are respectively opposed to the edges of the second portion 22G, the third portion 23G, and the fourth portion 24G, on the side of the fourth face 34 in the x-direction.

The lead 2V is spaced apart from the plurality of leads 1. The lead 2V is located on the conductive section 5. The lead 2V is electrically connected to the conductive section 5. The lead 2V exemplifies a second lead in the present disclosure. The lead 2V is bonded to the second portion 52V of the wiring 50V in the conductive section 5, via the conductive bonding material 82.

The configuration of the lead 2V is not specifically limited. In this embodiment, as shown in FIG. 71, the lead 2V includes a first portion 21V, a second portion 22V, a third portion 23V, and a fourth portion 24V, each of which will be described hereunder.

The first portion 21V is bonded to the second portion 52V of the wiring 50V. The shape of the first portion 21V is not specifically limited, and a desired shape may be selected from a rectangular shape, a polygonal shape, a circular shape, an elliptical shape, and so forth. In the illustrated example, the first portion 21V has a strip shape extending along the y-direction. The first portion 21V overlaps with the fifth face as viewed in the z-direction, and includes a portion extending from the fifth face 35 along the y-direction, toward the side to which the fifth face 35 is oriented. In the illustrated example, the first portion 21V overlaps with the second portion 52V, as viewed in the z-direction.

The third portion 23V and the fourth portion 24V are covered with the encapsulating resin 7. The third portion 23V is connected to the first portion 21V and the fourth portion 24V. The fourth portion 24V is shifted in the z-direction with respect to the first portion 21V. The end portion of the fourth portion 24V is flush with the fifth face 75 of the resin 7. In the illustrated example, the first portion 21V, the third portion 23V, and the fourth portion 24V generally coincide with each other, as viewed in the y-direction. Here, the expression "generally coincide" as viewed in the y-direction refers to, for example, exactly coinciding with each other, or being deviated by within ±5% of the characteristic size (size of the first portion 21V, third portion 23V, or fourth portion 24V in the x-direction). The third portion 23V overlaps with the fifth face 35 of the substrate 3, as viewed in the z-direction.

The second portion 22V is connected to the end portion of the fourth portion 24V, and corresponds to a portion of the lead 2V sticking out from the encapsulating resin 7 to the opposite side of the plurality of leads 1, as viewed in the y-direction. The second portion 22V sticks out to the opposite side of the first portion 21V, in the y-direction. The second portion 22V is used, for example, to electrically connect the semiconductor device A7 to an external circuit. In the illustrated example, the second portion 22V is bent, for example, in the z-direction. The second portion 22V, the third portion 23V, and the fourth portion 24V each include, on the respective sides thereof in the x-direction, edges extending along the y-direction. The edges of the second portion 22V, the third portion 23V, and the fourth portion 24V, on the side of the third face 33 in the x-direction, are respectively opposed to the edges of the second portion 22H, the third portion 23H, and the fourth portion 24H, on the side of the fourth face 34 in the x-direction.

The lead 2I is spaced apart from the plurality of leads 1. The lead 2I is located on the conductive section 5. The lead 2I is electrically connected to the conductive section 5. The lead 2I exemplifies a second lead in the present disclosure. The lead 2I is bonded to the second portion 52I of the wiring 50I in the conductive section 5, via the conductive bonding material 82.

The configuration of the lead 2I is not specifically limited. In this embodiment, as shown in FIG. 71, the lead 2I includes a first portion 21I, a second portion 22I, a third portion 23I, and a fourth portion 24I, each of which will be described hereunder.

The first portion 21I is bonded to the second portion 52I of the wiring 50I. The shape of the first portion 21I is not specifically limited, and a desired shape may be selected from a rectangular shape, a polygonal shape, a circular shape, an elliptical shape, and so forth. In the illustrated example, the first portion 21I has a strip shape extending along the y-direction. The first portion 21I overlaps with the fifth face as viewed in the z-direction, and includes a portion extending from the fifth face 35 along the y-direction, toward the side to which the fifth face 35 is oriented. In the illustrated example, the first portion 21I overlaps with the second portion 52I, as viewed in the z-direction.

The third portion 23I and the fourth portion 24I are covered with the encapsulating resin 7. The third portion 23I is connected to the first portion 21I and the fourth portion 24I. The fourth portion 24I is shifted in the z-direction with respect to the first portion 21I. The end portion of the fourth portion 24I is flush with the fifth face 75 of the resin 7. In the illustrated example, the first portion 21I, the third portion 23I, and the fourth portion 24I generally coincide with each other, as viewed in the y-direction. Here, the expression "generally coincide" as viewed in the y-direction refers to, for example, exactly coinciding with each other, or being deviated by within ±5% of the characteristic size (size of the first portion 21I, third portion 23I, or fourth portion 24I in the x-direction). The third portion 23I overlaps with the fifth face 35 of the substrate 3, as viewed in the z-direction.

The second portion 22I is connected to the end portion of the fourth portion 24I, and corresponds to a portion of the lead 2I sticking out from the encapsulating resin 7 to the opposite side of the plurality of leads 1, as viewed in the y-direction. The second portion 22I sticks out to the opposite side of the first portion 21I, in the y-direction. The second portion 22I is used, for example, to electrically connect the semiconductor device A7 to an external circuit. In the illustrated example, the second portion 22I is bent, for example, in the z-direction. The second portion 22I, the third portion 23I, and the fourth portion 24I each include, on the respective sides thereof in the x-direction, edges extending along the y-direction. The edges of the second portion 22I, the third portion 23I, and the fourth portion 24I, on the side of the third face 33 in the x-direction, are respectively opposed to the edges of the second portion 22V, the third portion 23V, and the fourth portion 24V, on the side of the fourth face 34 in the x-direction.

The lead 2J is spaced apart from the plurality of leads 1. The lead 2J is located on the conductive section 5. The lead 2J is electrically connected to the conductive section 5. The lead 2J exemplifies a second lead in the present disclosure.

The lead 2J is bonded to the second portion 52J of the wiring 50J in the conductive section 5, via the conductive bonding material 82.

The configuration of the lead 2J is not specifically limited. In this embodiment, as shown in FIG. 59, the lead 2J includes a first portion 21J, a second portion 22J, a third portion 23J, and a fourth portion 24J, each of which will be described hereunder.

The first portion 21J is bonded to the second portion 52J of the wiring 50J. The shape of the first portion 21J is not specifically limited, and a desired shape may be selected from a rectangular shape, a polygonal shape, a circular shape, an elliptical shape, and so forth. In the illustrated example, the first portion 21J has a strip shape extending along the y-direction. The first portion 21J overlaps with the fifth face as viewed in the z-direction, and includes a portion extending from the fifth face 35 along the y-direction, toward the side to which the fifth face 35 is oriented. In the illustrated example, the first portion 21J overlaps with the second portion 52J, as viewed in the z-direction.

The third portion 23J and the fourth portion 24J are covered with the encapsulating resin 7. The third portion 23J is connected to the first portion 21J and the fourth portion 24J. The fourth portion 24J is shifted in the z-direction with respect to the first portion 21J. The end portion of the fourth portion 24J is flush with the fifth face 75 of the resin 7. In the illustrated example, the first portion 21J, the third portion 23J, and the fourth portion 24J generally coincide with each other, as viewed in the y-direction. Here, the expression "generally coincide" as viewed in the y-direction refers to, for example, exactly coinciding with each other, or being deviated by within ±5% of the characteristic size (size of the first portion 21J, third portion 23J, or fourth portion 24J in the x-direction). The third portion 23J overlaps with the fifth face 35 of the substrate 3, as viewed in the z-direction.

The second portion 22J is connected to the end portion of the fourth portion 24J, and corresponds to a portion of the lead 2J sticking out from the encapsulating resin 7 to the opposite side of the plurality of leads 1, as viewed in the y-direction. The second portion 22J sticks out to the opposite side of the first portion 21J, in the y-direction. The second portion 22J is used, for example, to electrically connect the semiconductor device A7 to an external circuit. In the illustrated example, the second portion 22J is bent, for example, in the z-direction. The second portion 22J, the third portion 23J, and the fourth portion 24J each include, on the respective sides thereof in the x-direction, edges extending along the y-direction. The edges of the second portion 22J, the third portion 23J, and the fourth portion 24J, on the side of the third face 33 in the x-direction, are respectively opposed to the edges of the second portion 22I, the third portion 23I, and the fourth portion 24I, on the side of the fourth face 34 in the x-direction.

The lead 2K is spaced apart from the plurality of leads 1. The lead 2K is located on the conductive section 5. The lead 2K is electrically connected to the conductive section 5. The lead 2K exemplifies a second lead in the present disclosure. The lead 2K is bonded to the second portion 52K of the wiring 50K in the conductive section 5, via the conductive bonding material 82.

The configuration of the lead 2K is not specifically limited. In this embodiment, as shown in FIG. 59, the lead 2K includes a first portion 21K, a second portion 22K, a third portion 23K, and a fourth portion 24K, each of which will be described hereunder.

The first portion 21K is bonded to the second portion 52K of the wiring 50K. The shape of the first portion 21K is not specifically limited, and a desired shape may be selected from a rectangular shape, a polygonal shape, a circular shape, an elliptical shape, and so forth. In the illustrated example, the first portion 21K has a strip shape extending along the y-direction. The first portion 21K overlaps with the fifth face as viewed in the z-direction, and includes a portion extending from the fifth face 35 along the y-direction, toward the side to which the fifth face 35 is oriented. In the illustrated example, the first portion 21K overlaps with the second portion 52K, as viewed in the z-direction.

The third portion 23K and the fourth portion 24K are covered with the encapsulating resin 7. The third portion 23K is connected to the first portion 21K and the fourth portion 24K. The fourth portion 24K is shifted in the z-direction with respect to the first portion 21K. The end portion of the fourth portion 24K is flush with the fifth face 75 of the resin 7. In the illustrated example, the first portion 21K, the third portion 23K, and the fourth portion 24K generally coincide with each other, as viewed in the y-direction. Here, the expression "generally coincide" as viewed in the y-direction refers to, for example, exactly coinciding with each other, or being deviated by within ±5% of the characteristic size (size of the first portion 21K, third portion 23K, or fourth portion 24K in the x-direction). The third portion 23K overlaps with the fifth face 35 of the substrate 3, as viewed in the z-direction.

The second portion 22K is connected to the end portion of the fourth portion 24K, and corresponds to a portion of the lead 2K sticking out from the encapsulating resin 7 to the opposite side of the plurality of leads 1, as viewed in the y-direction. The second portion 22K sticks out to the opposite side of the first portion 21K, in the y-direction. The second portion 22K is used, for example, to electrically connect the semiconductor device A7 to an external circuit. In the illustrated example, the second portion 22K is bent, for example, in the z-direction. The second portion 22K, the third portion 23K, and the fourth portion 24K each include, on the respective sides thereof in the x-direction, edges extending along the y-direction. The edges of the second portion 22K, the third portion 23K, and the fourth portion 24K, on the side of the third face 33 in the x-direction, are respectively opposed to the edges of the second portion 22J, the third portion 23J, and the fourth portion 24J, on the side of the fourth face 34 in the x-direction.

The lead 2L is spaced apart from the plurality of leads 1. The lead 2L is located on the conductive section 5. The lead 2L is electrically connected to the conductive section 5. The lead 2L exemplifies a second lead in the present disclosure. The lead 2L is bonded to the second portion 52L of the wiring 50L in the conductive section 5, via the conductive bonding material 82.

The configuration of the lead 2L is not specifically limited. In this embodiment, as shown in FIG. 59, the lead 2L includes a first portion 21L, a second portion 22L, a third portion 23L, and a fourth portion 24L, each of which will be described hereunder.

The first portion 21L is bonded to the second portion 52L of the wiring 50L. The shape of the first portion 21L is not specifically limited, and a desired shape may be selected from a rectangular shape, a polygonal shape, a circular shape, an elliptical shape, and so forth. In the illustrated example, the first portion 21L has a strip shape extending along the y-direction. The first portion 21L overlaps with the fifth face as viewed in the z-direction, and includes a portion extending from the fifth face 35 along the y-direction, toward the side to which the fifth face 35 is oriented. In the illustrated example, the first portion 21L overlaps with the second portion 52L, as viewed in the z-direction.

The third portion 23L and the fourth portion 24L are covered with the encapsulating resin 7. The third portion 23L is connected to the first portion 21L and the fourth portion 24L. The fourth portion 24L is shifted in the z-direction with respect to the first portion 21L. The end portion of the fourth portion 24L is flush with the fifth face 75 of the resin 7. In the illustrated example, the first portion 21L, the third portion 23L, and the fourth portion 24L generally coincide with each other, as viewed in the y-direction. Here, the expression "generally coincide" as viewed in the y-direction refers to, for example, exactly coinciding with each other, or being deviated by within ±5% of the characteristic size (size of the first portion 21L, third portion 23L, or fourth portion 24L in the x-direction). The third portion 23L overlaps with the fifth face 35 of the substrate 3, as viewed in the z-direction.

The second portion 22L is connected to the end portion of the fourth portion 24L, and corresponds to a portion of the lead 2L sticking out from the encapsulating resin 7 to the opposite side of the plurality of leads 1, as viewed in the y-direction. The second portion 22L sticks out to the opposite side of the first portion 21L, in the y-direction. The second portion 22L is used, for example, to electrically connect the semiconductor device A7 to an external circuit. In the illustrated example, the second portion 22L is bent, for example, in the z-direction. The second portion 22L, the third portion 23L, and the fourth portion 24L each include, on the respective sides thereof in the x-direction, edges extending along the y-direction. The edges of the second portion 22L, the third portion 23L, and the fourth portion 24L, on the side of the third face 33 in the x-direction, are respectively opposed to the edges of the second portion 22K, the third portion 23K, and the fourth portion 24K, on the side of the fourth face 34 in the x-direction.

The lead 2M is spaced apart from the plurality of leads 1. The lead 2M is located on the conductive section 5. The lead 2M is electrically connected to the conductive section 5. The lead 2M exemplifies a second lead in the present disclosure. The lead 2M is bonded to the second portion 52M of the wiring 50M in the conductive section 5, via the conductive bonding material 82.

The configuration of the lead 2M is not specifically limited. In this embodiment, as shown in FIG. 59, the lead 2M includes a first portion 21M, a second portion 22M, a third portion 23M, and a fourth portion 24M, each of which will be described hereunder.

The first portion 21M is bonded to the second portion 52M of the wiring 50M. The shape of the first portion 21M is not specifically limited, and a desired shape may be selected from a rectangular shape, a polygonal shape, a circular shape, an elliptical shape, and so forth. In the illustrated example, the first portion 21M has a strip shape extending along the y-direction. The first portion 21M overlaps with the fifth face as viewed in the z-direction, and includes a portion extending from the fifth face 35 along the y-direction, toward the side to which the fifth face 35 is oriented. In the illustrated example, the first portion 21M overlaps with the second portion 52M, as viewed in the z-direction.

The third portion 23M and the fourth portion 24M are covered with the encapsulating resin 7. The third portion 23M is connected to the first portion 21M and the fourth portion 24M. The fourth portion 24M is shifted in the z-direction with respect to the first portion 21M. The end portion of the fourth portion 24M is flush with the fifth face 75 of the resin 7. In the illustrated example, the first portion 21M, the third portion 23M, and the fourth portion 24M generally coincide with each other, as viewed in the y-direction. Here, the expression "generally coincide" as viewed in the y-direction refers to, for example, exactly coinciding with each other, or being deviated by within ±5% of the characteristic size (size of the first portion 21M, third portion 23M, or fourth portion 24M in the x-direction). The third portion 23M overlaps with the fifth face 35 of the substrate 3, as viewed in the z-direction.

The second portion 22M is connected to the end portion of the fourth portion 24M, and corresponds to a portion of the lead 2M sticking out from the encapsulating resin 7 to the opposite side of the plurality of leads 1, as viewed in the y-direction. The second portion 22M sticks out to the opposite side of the first portion 21M, in the y-direction. The second portion 22M is used, for example, to electrically connect the semiconductor device A7 to an external circuit. In the illustrated example, the second portion 22M is bent, for example, in the z-direction. The second portion 22M, the third portion 23M, and the fourth portion 24M each include, on the respective sides thereof in the x-direction, edges extending along the y-direction. The edges of the second portion 22M, the third portion 23M, and the fourth portion 24M, on the side of the third face 33 in the x-direction, are respectively opposed to the edges of the second portion 22L, the third portion 23L, and the fourth portion 24L, on the side of the fourth face 34 in the x-direction.

The lead 2N is spaced apart from the plurality of leads 1. The lead 2N is located on the conductive section 5. The lead 2N is electrically connected to the conductive section 5. The lead 2N exemplifies a second lead in the present disclosure. The lead 2N is bonded to the second portion 52N of the wiring 50N in the conductive section 5, via the conductive bonding material 82.

The configuration of the lead 2N is not specifically limited. In this embodiment, as shown in FIG. 59, the lead 2N includes a first portion 21N, a second portion 22N, a third portion 23N, and a fourth portion 24N, each of which will be described hereunder.

The first portion 21N is bonded to the second portion 52N of the wiring 50N. The shape of the first portion 21N is not specifically limited, and a desired shape may be selected from a rectangular shape, a polygonal shape, a circular shape, an elliptical shape, and so forth. In the illustrated example, the first portion 21N has a strip shape extending along the y-direction. The first portion 21N overlaps with the fifth face as viewed in the z-direction, and includes a portion extending from the fifth face 35 along the y-direction, toward the side to which the fifth face 35 is oriented. In the illustrated example, the first portion 21N overlaps with the second portion 52N, as viewed in the z-direction.

The third portion 23N and the fourth portion 24N are covered with the encapsulating resin 7. The third portion 23N is connected to the first portion 21N and the fourth portion 24N. The fourth portion 24N is shifted in the z-direction with respect to the first portion 21N. The end portion of the fourth portion 24N is flush with the fifth face 75 of the resin 7. In the illustrated example, the first portion 21N, the third portion 23N, and the fourth portion 24N generally coincide with each other, as viewed in the y-direction. Here, the expression "generally coincide" as viewed in the y-direction refers to, for example, exactly coinciding with each other, or being deviated by within ±5% of the characteristic size (size of the first portion 21N, third portion 23N, or fourth portion 24N in the x-direction). The third portion 23N overlaps with the fifth face 35 of the substrate 3, as viewed in the z-direction.

The second portion 22N is connected to the end portion of the fourth portion 24N, and corresponds to a portion of the lead 2N sticking out from the encapsulating resin 7 to the opposite side of the plurality of leads 1, as viewed in the y-direction. The second portion 22N sticks out to the opposite side of the first portion 21N, in the y-direction. The second portion 22N is used, for example, to electrically connect the semiconductor device A7 to an external circuit. In the illustrated example, the second portion 22N is bent, for example, in the z-direction. The second portion 22N, the third portion 23N, and the fourth portion 24N each include, on the respective sides thereof in the x-direction, edges extending along the y-direction. The edges of the second portion 22N, the third portion 23N, and the fourth portion 24N, on the side of the third face 33 in the x-direction, are respectively opposed to the edges of the second portion 22M, the third portion 23M, and the fourth portion 24M, on the side of the fourth face 34 in the x-direction.

The lead 2O is spaced apart from the plurality of leads 1. The lead 2O is located on the conductive section 5. The lead 2O is electrically connected to the conductive section 5. The lead 2O exemplifies a second lead in the present disclosure. The lead 2O is bonded to the second portion 52O of the wiring 50O in the conductive section 5, via the conductive bonding material 82.

The configuration of the lead 2O is not specifically limited. In this embodiment, as shown in FIG. 59, the lead 2O includes a first portion 21O, a second portion 22O, a third portion 23O, and a fourth portion 24O, each of which will be described hereunder.

The first portion 21O is bonded to the second portion 52O of the wiring 50O. The shape of the first portion 21O is not specifically limited, and a desired shape may be selected from a rectangular shape, a polygonal shape, a circular shape, an elliptical shape, and so forth. In the illustrated example, the first portion 21O has a strip shape extending along the y-direction. The first portion 21O overlaps with the fifth face as viewed in the z-direction, and includes a portion extending from the fifth face 35 along the y-direction, toward the side to which the fifth face 35 is oriented. In the illustrated example, the first portion 21O overlaps with the second portion 52O, as viewed in the z-direction.

The third portion 23O and the fourth portion 24O are covered with the encapsulating resin 7. The third portion 23O is connected to the first portion 21O and the fourth portion 24O. The fourth portion 24O is shifted in the z-direction with respect to the first portion 21O. The end portion of the fourth portion 24O is flush with the fifth face 75 of the resin 7. In the illustrated example, the first portion 21O, the third portion 23O, and the fourth portion 24O generally coincide with each other, as viewed in the y-direction. Here, the expression "generally coincide" as viewed in the y-direction refers to, for example, exactly coinciding with each other, or being deviated by within ±5% of the characteristic size (size of the first portion 21O, third portion 23O, or fourth portion 24O in the x-direction). The third portion 23O overlaps with the fifth face 35 of the substrate 3, as viewed in the z-direction.

The second portion 22O is connected to the end portion of the fourth portion 24O, and corresponds to a portion of the lead 2O sticking out from the encapsulating resin 7 to the opposite side of the plurality of leads 1, as viewed in the y-direction. The second portion 22O sticks out to the opposite side of the first portion 21O, in the y-direction. The second portion 22O is used, for example, to electrically connect the semiconductor device A7 to an external circuit. In the illustrated example, the second portion 22O is bent, for example, in the z-direction. The second portion 22O, the third portion 23O, and the fourth portion 24O each include, on the respective sides thereof in the x-direction, edges extending along the y-direction. The edges of the second portion 22O, the third portion 23O, and the fourth portion 24O, on the side of the third face 33 in the x-direction, are respectively opposed to the edges of the second portion 22N, the third portion 23N, and the fourth portion 24N, on the side of the fourth face 34 in the x-direction.

The lead 2P is spaced apart from the plurality of leads 1. The lead 2P is located on the conductive section 5. The lead 2P is electrically connected to the conductive section 5. The lead 2P exemplifies a second lead in the present disclosure. The lead 2P is bonded to the second portion 52P of the wiring 50P in the conductive section 5, via the conductive bonding material 82.

The configuration of the lead 2P is not specifically limited. In this embodiment, as shown in FIG. 59, the lead 2P includes a first portion 21P, a second portion 22P, a third portion 23P, and a fourth portion 24P, each of which will be described hereunder.

The first portion 21P is bonded to the second portion 52P of the wiring 50P. The shape of the first portion 21P is not specifically limited, and a desired shape may be selected from a rectangular shape, a polygonal shape, a circular shape, an elliptical shape, and so forth. In the illustrated example, the first portion 21P has a strip shape extending along the y-direction. The first portion 21P overlaps with the fifth face as viewed in the z-direction, and includes a portion extending from the fifth face 35 along the y-direction, toward the side to which the fifth face 35 is oriented. In the illustrated example, the first portion 21P overlaps with the second portion 52P, as viewed in the z-direction.

The third portion 23P and the fourth portion 24P are covered with the encapsulating resin 7. The third portion 23P is connected to the first portion 21P and the fourth portion 24P. The fourth portion 24P is shifted in the z-direction with respect to the first portion 21P. The end portion of the fourth portion 24P is flush with the fifth face 75 of the resin 7. In the illustrated example, the first portion 21P, the third portion 23P, and the fourth portion 24P generally coincide with each other, as viewed in the y-direction. Here, the expression "generally coincide" as viewed in the y-direction refers to, for example, exactly coinciding with each other, or being deviated by within ±5% of the characteristic size (size of the first portion 21P, third portion 23P, or fourth portion 24P in the x-direction). The third portion 23P overlaps with the fifth face 35 of the substrate 3, as viewed in the z-direction.

The second portion 22P is connected to the end portion of the fourth portion 24P, and corresponds to a portion of the lead 2P sticking out from the encapsulating resin 7 to the opposite side of the plurality of leads 1, as viewed in the y-direction. The second portion 22P sticks out to the opposite side of the first portion 21P, in the y-direction. The second portion 22P is used, for example, to electrically connect the semiconductor device A7 to an external circuit. In the illustrated example, the second portion 22P is bent, for example, in the z-direction. The second portion 22P, the third portion 23P, and the fourth portion 24P each include, on the respective sides thereof in the x-direction, edges extending along the y-direction. The edges of the second portion 22P, the third portion 23P, and the fourth portion 24P, on the side of the third face 33 in the x-direction, are respectively opposed to the edges of the second portion 22O, the third portion 23O, and the fourth portion 24O, on the side of the fourth face 34 in the x-direction.

The lead 2Q is spaced apart from the plurality of leads 1. The lead 2Q is located on the conductive section 5. The lead 2Q is electrically connected to the conductive section 5. The lead 2Q exemplifies a second lead in the present disclosure. The lead 2Q is bonded to the second portion 52Q of the wiring 50Q in the conductive section 5, via the conductive bonding material 82.

The configuration of the lead 2Q is not specifically limited. In this embodiment, as shown in FIG. 59, the lead 2Q includes a first portion 21Q, a second portion 22Q, a third portion 23Q, and a fourth portion 24Q, each of which will be described hereunder.

The first portion 21Q is bonded to the second portion 52Q of the wiring 50Q. The shape of the first portion 21Q is not specifically limited, and a desired shape may be selected from a rectangular shape, a polygonal shape, a circular shape, an elliptical shape, and so forth. In the illustrated example, the first portion 21Q has a strip shape extending along the y-direction. The first portion 21Q overlaps with the fifth face as viewed in the z-direction, and includes a portion extending from the fifth face 35 along the y-direction, toward the side to which the fifth face 35 is oriented. In the illustrated example, the first portion 21Q overlaps with the second portion 52Q, as viewed in the z-direction.

The third portion 23Q and the fourth portion 24Q are covered with the encapsulating resin 7. The third portion 23Q is connected to the first portion 21Q and the fourth portion 24Q. The fourth portion 24Q is shifted in the z-direction with respect to the first portion 21Q. The end portion of the fourth portion 24Q is flush with the fifth face 75 of the resin 7. In the illustrated example, the first portion 21Q, the third portion 23Q, and the fourth portion 24Q generally coincide with each other, as viewed in the y-direction. Here, the expression "generally coincide" as viewed in the y-direction refers to, for example, exactly coinciding with each other, or being deviated by within ±5% of the characteristic size (size of the first portion 21Q, third portion 23Q, or fourth portion 24Q in the x-direction). The third portion 23Q overlaps with the fifth face 35 of the substrate 3, as viewed in the z-direction.

The second portion 22Q is connected to the end portion of the fourth portion 24Q, and corresponds to a portion of the lead 2Q sticking out from the encapsulating resin 7 to the opposite side of the plurality of leads 1, as viewed in the y-direction. The second portion 22Q sticks out to the opposite side of the first portion 21Q, in the y-direction. The second portion 22Q is used, for example, to electrically connect the semiconductor device A7 to an external circuit. In the illustrated example, the second portion 22Q is bent, for example, in the z-direction. The second portion 22Q, the third portion 23Q, and the fourth portion 24Q each include, on the respective sides thereof in the x-direction, edges extending along the y-direction. The edges of the second portion 22Q, the third portion 23Q, and the fourth portion 24Q, on the side of the third face 33 in the x-direction, are respectively opposed to the edges of the second portion 22P, the third portion 23P, and the fourth portion 24P, on the side of the fourth face 34 in the x-direction.

The lead 2R is spaced apart from the plurality of leads 1. The lead 2R is located on the conductive section 5. The lead 2R is electrically connected to the conductive section 5. The lead 2R exemplifies a second lead in the present disclosure. The lead 2R is bonded to the second portion 52R of the wiring 50R in the conductive section 5, via the conductive bonding material 82.

The configuration of the lead 2R is not specifically limited. In this embodiment, as shown in FIG. 59, the lead 2R includes a first portion 21R, a second portion 22R, a third portion 23R, and a fourth portion 24R, each of which will be described hereunder.

The first portion 21R is bonded to the second portion 52R of the wiring 50R. The shape of the first portion 21R is not specifically limited, and a desired shape may be selected from a rectangular shape, a polygonal shape, a circular shape, an elliptical shape, and so forth. In the illustrated example, the first portion 21R has a strip shape extending along the y-direction. The first portion 21R overlaps with the fifth face as viewed in the z-direction, and includes a portion extending from the fifth face 35 along the y-direction, toward the side to which the fifth face 35 is oriented. In the illustrated example, the first portion 21R overlaps with the second portion 52R, as viewed in the z-direction.

The third portion 23R and the fourth portion 24R are covered with the encapsulating resin 7. The third portion 23R is connected to the first portion 21R and the fourth portion 24R. The fourth portion 24R is shifted in the z-direction with respect to the first portion 21R. The end portion of the fourth portion 24R is flush with the fifth face 75 of the resin 7. In the illustrated example, the first portion 21R, the third portion 23R, and the fourth portion 24R generally coincide with each other, as viewed in the y-direction. Here, the expression "generally coincide" as viewed in the y-direction refers to, for example, exactly coinciding with each other, or being deviated by within ±5% of the characteristic size (size of the first portion 21R, third portion 23R, or fourth portion 24R in the x-direction). The third portion 23R overlaps with the fifth face 35 of the substrate 3, as viewed in the z-direction.

The second portion 22R is connected to the end portion of the fourth portion 24R, and corresponds to a portion of the lead 2R sticking out from the encapsulating resin 7 to the opposite side of the plurality of leads 1, as viewed in the y-direction. The second portion 22R sticks out to the opposite side of the first portion 21R, in the y-direction. The second portion 22R is used, for example, to electrically connect the semiconductor device A7 to an external circuit. In the illustrated example, the second portion 22R is bent, for example, in the z-direction. The second portion 22R, the third portion 23R, and the fourth portion 24R each include, on the respective sides thereof in the x-direction, edges extending along the y-direction. The edges of the second portion 22R, the third portion 23R, and the fourth portion 24R, on the side of the third face 33 in the x-direction, are respectively opposed to the edges of the second portion 22Q, the third portion 23Q, and the fourth portion 24Q, on the side of the fourth face 34 in the x-direction.

The lead 2S is spaced apart from the plurality of leads 1. The lead 2S is located on the conductive section 5. The lead 2S is electrically connected to the conductive section 5. The lead 2S exemplifies a second lead in the present disclosure. The lead 2S is bonded to the second portion 52S of the wiring 50S in the conductive section 5, via the conductive bonding material 82.

The configuration of the lead 2S is not specifically limited. In this embodiment, as shown in FIG. 59, the lead 2S includes a first portion 21S, a second portion 22S, a third portion 23S, and a fourth portion 24S, each of which will be described hereunder.

The first portion 21S is bonded to the second portion 52S of the wiring 50S. The shape of the first portion 21S is not specifically limited, and a desired shape may be selected from a rectangular shape, a polygonal shape, a circular shape, an elliptical shape, and so forth. In the illustrated example, the first portion 21S has a bent shape including a portion extending along the x-direction, a portion inclined with respect to the x-direction and the y-direction, and a portion extending along the y-direction. The first portion 21S overlaps with the fourth face 34 of the substrate 3 as viewed in the z-direction, and sticks out in the x-direction, toward the side to which the fourth face 34 is oriented. In the illustrated example, the first portion 21S overlaps with the second portion 52S, as viewed in the z-direction.

The third portion 23S and the fourth portion 24S are covered with the encapsulating resin 7. The third portion 23S is connected to the first portion 21S and the fourth portion 24S. The fourth portion 24S is shifted in the z-direction with respect to the first portion 21S. The end portion of the fourth portion 24S is flush with the fifth face 75 of the resin 7. In the illustrated example, the third portion 23S and the fourth portion 24S generally coincide with each other, as viewed in the y-direction. Here, the expression "generally coincide" as viewed in the y-direction refers to, for example, exactly coinciding with each other, or being deviated by within ±5% of the characteristic size (size of the third portion 23S or fourth portion 24S in the x-direction).

The second portion 22S is connected to the end portion of the fourth portion 24S, and corresponds to a portion of the lead 2S sticking out from the encapsulating resin 7 to the opposite side of the plurality of leads 1, as viewed in the y-direction. The second portion 22S sticks out to the opposite side of the first portion 21S, in the y-direction. The second portion 22S is used, for example, to electrically connect the semiconductor device A7 to an external circuit. In the illustrated example, the second portion 22S is bent, for example, in the z-direction. The second portion 22S, the third portion 23S, and the fourth portion 24S each include, on the respective sides thereof in the x-direction, edges extending along the y-direction. The edges of the second portion 22S, the third portion 23S, and the fourth portion 24S, on the side of the third face 33 in the x-direction, are respectively opposed to the edges of the second portion 22R, the third portion 23R, and the fourth portion 24R, on the side of the fourth face 34 in the x-direction.

The lead 2T is spaced apart from the plurality of leads 1. The lead 2T is located on the conductive section 5. The lead 2T is electrically connected to the conductive section 5. The lead 2T exemplifies a second lead in the present disclosure. The lead 2T is bonded to the second portion 52T of the wiring 50T in the conductive section 5, via the conductive bonding material 82.

The configuration of the lead 2T is not specifically limited. In this embodiment, as shown in FIG. 58 and FIG. 59, the lead 2T includes a first portion 21T, a second portion 22T, a third portion 23T, and a fourth portion 24T, each of which will be described hereunder.

The first portion 21T is bonded to the second portion 52T of the wiring 50T. The shape of the first portion 21T is not specifically limited, and a desired shape may be selected from a rectangular shape, a polygonal shape, a circular shape, an elliptical shape, and so forth. In the illustrated example, the first portion 21T has a bent shape including a portion extending along the x-direction, a portion inclined with respect to the x-direction and the y-direction, and a portion extending along the y-direction. The first portion 21T overlaps with the fourth face 34 of the substrate 3 as viewed in the z-direction, and sticks out in the x-direction, toward the side to which the fourth face 34 is oriented. In the illustrated example, the first portion 21T overlaps with the second portion 52T, as viewed in the z-direction.

The third portion 23T and the fourth portion 24T are covered with the encapsulating resin 7. The third portion 23T is connected to the first portion 21T and the fourth portion 24T. The fourth portion 24T is shifted in the z-direction with respect to the first portion 21T, to the side to which the first face 31 is oriented, like the third portion 23I and the fourth portion 24I of the lead 2I shown in FIG. 40. The end portion of the fourth portion 24T is flush with the fifth face 75 of the resin 7. In the illustrated example, the third portion 23T and the fourth portion 24T generally coincide with each other, as viewed in the y-direction. Here, the expression "generally coincide" as viewed in the y-direction refers to, for example, exactly coinciding with each other, or being deviated by within ±5% of the characteristic size (size of the third portion 23T or fourth portion 24T in the x-direction).

The second portion 22T is connected to the end portion of the fourth portion 24T, and corresponds to a portion of the lead 2T sticking out from the encapsulating resin 7 to the opposite side of the plurality of leads 1, as viewed in the y-direction. The second portion 22T sticks out to the opposite side of the first portion 21T, in the y-direction. The second portion 22T is used, for example, to electrically connect the semiconductor device A7 to an external circuit. In the illustrated example, the second portion 22T is bent, for example, in the z-direction. The second portion 22T, the third portion 23T, and the fourth portion 24T each include, on the respective sides thereof in the x-direction, edges extending along the y-direction. The edges of the second portion 22T, the third portion 23T, and the fourth portion 24T, on the side of the third face 33 in the x-direction, are respectively opposed to the edges of the second portion 22S, the third portion 23S, and the fourth portion 24S, on the side of the fourth face 34 in the x-direction.

The lead 2U is spaced apart from the plurality of leads 1. The lead 2U is located on the conductive section 5. The lead 2U is electrically connected to the conductive section 5. The lead 2U exemplifies a second lead in the present disclosure. The lead 2U is bonded to the second portion 52U of the wiring 50U in the conductive section 5, via the conductive bonding material 82.

The configuration of the lead 2U is not specifically limited. In this embodiment, as shown in FIG. 58 and FIG. 59, the lead 2U includes a first portion 21U, a second portion 22U, a third portion 23U, and a fourth portion 24U, each of which will be described hereunder.

The first portion 21U is bonded to the second portion 52U of the wiring 50U. The shape of the first portion 21U is not specifically limited, and a desired shape may be selected from a rectangular shape, a polygonal shape, a circular shape, an elliptical shape, and so forth. In the illustrated example, the first portion 21U has a bent shape including a portion extending along the x-direction, a portion inclined with respect to the x-direction and the y-direction, and a portion extending along the y-direction. The first portion 21U overlaps with the fourth face 34 of the substrate 3 as viewed in the z-direction, and sticks out in the x-direction, toward the side to which the fourth face 34 is oriented. In the illustrated example, the first portion 21U overlaps with the second portion 52U, as viewed in the z-direction.

The third portion 23U and the fourth portion 24U are covered with the encapsulating resin 7. The third portion 23U is connected to the first portion 21U and the fourth portion 24U. The fourth portion 24U is shifted in the z-direction with respect to the first portion 21U. The end portion of the fourth portion 24U is flush with the fifth face 75 of the resin 7. In the illustrated example, the third portion 23U and the fourth portion 24U generally coincide with each other, as viewed in the y-direction. Here, the expression "generally coincide" as viewed in the y-direction refers to, for example, exactly coinciding with each other, or being deviated by within ±5% of the characteristic size (size of the third portion 23U or fourth portion 24U in the x-direction).

The second portion 22U is connected to the end portion of the fourth portion 24U, and corresponds to a portion of the lead 2U sticking out from the encapsulating resin 7 to the opposite side of the plurality of leads 1, as viewed in the y-direction. The second portion 22U sticks out to the opposite side of the first portion 21U, in the y-direction. The second portion 22U is used, for example, to electrically connect the semiconductor device A7 to an external circuit. In the illustrated example, the second portion 22U is bent, for example, in the z-direction. The second portion 22U, the third portion 23U, and the fourth portion 24U each include, on the respective sides thereof in the x-direction, edges extending along the y-direction. The edges of the second portion 22U, the third portion 23U, and the fourth portion 24U, on the side of the third face 33 in the x-direction, are respectively opposed to the edges of the second portion 22T, the third portion 23T, and the fourth portion 24T, on the side of the fourth face 34 in the x-direction.

<Semiconductor Chips 4A to 4F, 4X>

The semiconductor chips 4A to 4F and 4X, located on the plurality of leads 1, each exemplify a semiconductor chip in the present disclosure. The type and the function of the semiconductor chips 4A to 4F and 4X are not specifically limited. In this embodiment, the semiconductor chips 4A to 4F, and 4X are a transistor. Although seven semiconductor chips 4A to 4F and 4X are provided in the illustrated example, the number of semiconductor chips is by no means limited.

The semiconductor chips 4A to 4F and 4X in the illustrated example are, for example, a transistor configured as an IGBT, like those of the semiconductor device A3.

In this embodiment, as shown in FIG. 70, three semiconductor chips 4A, 4B, and 4C are provided on the first portion 113A in the first portion 11A of the lead 1A. The three semiconductor chips 4A, 4B, and 4C are spaced apart from each other in the x-direction, and overlap with each other as viewed in the x-direction. Here, the number of semiconductor chips to be mounted on the lead 1A is by no means limited. In the illustrated example, the respective collector electrodes of the semiconductor chips 4A, 4B, and 4C are bonded to the first portion 11A, via the conductive bonding material 83.

The conductive bonding material 83 may be any material that is capable of bonding, and electrically connecting, the collector electrode CP of the semiconductor chips 4A, 4B, and 4C, to the first portion 11A. For example, silver paste, copper paste, or solder may be employed as the conductive bonding material 83. The conductive bonding material 83 corresponds to the second conductive bonding material in the present disclosure.

In this embodiment, the semiconductor chip 4D is provided on the first portion 1B of the lead 13. Here, the number of semiconductor chips to be mounted on the lead 13 is by no means limited. In the illustrated example, the collector electrode of the semiconductor chip 4D is bonded to the first portion 1B, via the conductive bonding material 83.

In this embodiment, the semiconductor chip 4E is provided on the first portion 11C of the lead 1C. Here, the number of semiconductor chips to be mounted on the lead 1C is by no means limited. In the illustrated example, the collector electrode of the semiconductor chip 4E is bonded to the first portion 11C, via the conductive bonding material 83.

In this embodiment, the semiconductor chip 4F is provided on the first portion 11D of the lead 1D. Here, the number of semiconductor chips to be mounted on the lead 1D is by no means limited. In the illustrated example, the collector electrode of the semiconductor chip 4F is bonded to the first portion 11D, via the conductive bonding material 83.

In this embodiment, the semiconductor chip 4X is provided on the first portion 113H in the first portion 11H of the lead 1H. Here, the number of semiconductor chips to be mounted on the lead 1H is by no means limited. In the illustrated example, the collector electrode of the semiconductor chip 4X is bonded to the first portion 11H, via the conductive bonding material 83.

<Diodes 41A to 41F, 41X>

The configuration of the diodes 41A to 41F, and 41X is not specifically limited and may be, for example, similar to that of the diodes 41A to 41F of the semiconductor device A3.

As in the semiconductor device A3, the diode 41A, the diode 41B, and the diode 41C are mounted on the first portion 113A in the first portion 11A. The diode 41D is mounted on the first portion 11B. The diode 41E is mounted on the first portion 11C. The diode 41F is mounted on the first portion 11D. The diode 41X is mounted on the second portion 114A in the first portion 11A.

The diode 41A overlaps with the semiconductor chip 4A, as viewed in the y-direction. The diode 41B overlaps with the semiconductor chip 4B, as viewed in the y-direction. The diode 41C overlaps with the semiconductor chip 4C, as viewed in the y-direction. The diodes 41A, 41B, and 41C overlap with each other, as viewed in the x-direction. The diodes 41A, 41B, and 41C overlap with the semiconductor chip 4X, as viewed in the x-direction.

The diode 41D overlaps with the semiconductor chip 4D, as viewed in the y-direction. The diode 41E overlaps with the semiconductor chip 4E, as viewed in the y-direction. The diode 41F overlaps with the semiconductor chip 4F, as viewed in the y-direction. The diodes 41D, 41E, and 41F overlap with each other, as viewed in the x-direction.

The diode 41X overlaps with the semiconductor chip 4X, as viewed in the y-direction. The diode 41X overlaps with the semiconductor chips 4A, 4B, and 4C, as viewed in the x-direction. In addition, the diode 41X overlaps with the second portion 114H, as viewed in the x-direction.

[Control Chips 4G and 4H]

The configuration of the control chips 4G and 4H is not specifically limited and may be, for example, similar to that of the control chips 4G and 4H of the semiconductor device A3.

In this embodiment, as shown in FIG. 71, the control chip 4G is mounted on the first base portion 55 of the conductive section 5. The control chip 4H is mounted on the second base portion 56 of the conductive section 5. In this embodiment, the control chip 4G is bonded to the first base portion 55, via the conductive bonding material 84. The control chip 4H is bonded to the second base portion 56, via the conductive bonding material 84.

The conductive bonding material 84 may be any material that is capable of bonding, and electrically connecting, the control chip 4G to the first base portion 55, and the control chip 4H to the second base portion 56. For example, silver paste, copper paste, or solder may be employed as the conductive bonding material 84. The conductive bonding material 84 corresponds to the third conductive material in the present disclosure. In this embodiment, the conductive bonding material 84 extends outwardly from the outer periphery of the control chips 4G and 4H, in a plan view. A reason of such a configuration is that, for example, when the conductive bonding material 84 performs the bonding function by curing after the fused state, the conductive bonding material 84 in the fused state spreads around the control chip 4G (control chip 4H) as viewed in the z-direction. Therefore, in the illustrated example, the conductive bonding material 84 protrudes from the respective outer edges of the control chips 4G and 4H, as viewed in the z-direction. However, the specific shape of the conductive bonding material 84 is by no means limited. Here, the control chips 4G and 4H may be bonded to the first base portion 55 via an insulative bonding material, instead of the conductive bonding material 84. In the illustrated example, the conductive bonding material 84 has an uneven outer edge, as viewed in the z-direction. Such formation of the conductive bonding material 84 allows the control chips 4G and 4H to be bonded to a region of the conductive section 5 more distant from the control chips 4G and 4H, thereby further stabilizing the adhesion of the control chips 4G and 4H.

The control chip 4G is located between the leads 2A to 2U and the leads 1A to 1G, as viewed in the x-direction. The control chip 4H is located between the leads 2A to 2U and the leads 1A to 1G, as viewed in the x-direction. The control chips 4G and the control chips 4H overlap with each other, as viewed in the x-direction. The control chip 4G overlaps with the semiconductor chips 4B and 4C, as viewed in the y-direction. The control chip 4H overlaps with the semiconductor chips 4D and 4E, as viewed in the y-direction. The control chip 4H overlaps with the transmission circuit chip 4I and the primary-side circuit chip 4J, as viewed in the y-direction. The control chip 4G may overlap with the semiconductor chip 4A, as viewed in the y-direction. The control chip 4H may overlap with the semiconductor chip 4F, as viewed in the y-direction.

<Transmission Circuit Chip 4I>

The transmission circuit chip 4I includes the first transmission circuit in the present disclosure. Like the transmission circuit chip 4I in the semiconductor device A3, the transmission circuit chip 4I has a transformer structure including at least two coils opposed to each other with a gap therebetween, to transmit electrical signals. In this embodiment, as shown in FIG. 71, the transmission circuit chip 4I is, for example, mounted on the third base portion 58 via the conductive bonding material 84. The transmission circuit chip 4I is located between the control chip 4H and the primary-side circuit chip 4J, as viewed in the x-direction. The transmission circuit chip 4I overlaps with the control chip 4H, as viewed in the y-direction. Further, the transmission circuit chip 4I overlaps with the first portions 51I to 51N (wirings 50I to 50N), as viewed in the y-direction. In the illustrated example, the conductive bonding material 84 protrudes from the outer edge of the transmission circuit chip 4I, as viewed in the z-direction.

<Primary-Side Circuit Chip 4J>

The primary-side circuit chip 4J transmits command signals to the control chip 4H, through the transmission circuit chip 4I. In this embodiment, as shown in FIG. 71, the primary-side circuit chip 4J is, for example, mounted on the third base portion 58 via the conductive bonding material 84. The primary-side circuit chip 4J is located on the side of the fifth face 35 in the y-direction, with respect to the transmission circuit chip 4I.

<Diodes 49U, 49V, 49W>

The configuration of the diodes 49U, 49V, and 49W is not specifically limited and may be, for example, similar to that of the diodes 49U, 49V, and 49W of the semiconductor device A3.

<First Wires 91A to 91F, 91H, 91I>

Regarding the first wires 91A to 91F, 91H, and 91I according to this embodiment, although any of the elements is apparently given, for the sake of convenience of description, the same numeral as that of the first wires 91A to 91F according to the third embodiment, it does not necessarily mean that the mentioned element has the same or similar configuration. The configuration of an element with a numeral is defined by the description relevant to this embodiment. Regarding an element on which no specific description is given, a similar configuration to that of the plurality of first wires 91 according to the third embodiment may be adopted, as appropriate.

The first wires 91A to 91F, 91H, and 91I are each connected to one of the semiconductor chips 4A to 4F and 4X, and the diode 41X, and one of the plurality of leads 1. The material of the first wires 91A to 91F, 91H, and 91I is not specifically limited and, for example, aluminum (Al) or copper (Cu) may be employed. The wire diameter of the first wires 91A to 91F is not specifically limited and, for example, may be approximately 250 to 500 μm. The first wires 91A to 91F, 91H, and 91I correspond to the first conductive material in the present disclosure. Here, for example leads formed of copper may be employed, in place of the first wires 91A to 91F, 91H, and 91I.

The collector electrode of the semiconductor chip 4A and the cathode electrode of the diode 41A are connected to each other, via the first portion 11A and the conductive bonding material 83. The collector electrode CP of the semiconductor chip 4B and the cathode electrode of the diode 41B are connected to each other, via the first portion 11A and the conductive bonding material 83. The collector electrode CP of the semiconductor chip C and the cathode electrode of the diode 41C are connected to each other, via the first portion 11A and the conductive bonding material 83.

The first wire 91A has one end connected to the emitter electrode of the semiconductor chip 4A, an intermediate portion connected to the anode electrode of the diode 41A, and the other end connected to the fourth portion 14B of the lead 1B. The number of first wires 91A is not specifically limited. In the illustrated example, three first wires 91A are provided.

The first wire 91B has one end connected to the emitter electrode of the semiconductor chip 4B, an intermediate portion connected to the anode electrode of the diode 41B, and the other end connected to the fourth portion 14C of the lead 1C. The number of first wires 91B is not specifically limited. In the illustrated example, three first wires 91B are provided.

The first wire 91C has one end connected to the emitter electrode of the semiconductor chip 4C, an intermediate portion connected to the anode electrode of the diode 41C, and the other end connected to the fourth portion 14D of the lead 1D. The number of first wires 91C is not specifically limited. In the illustrated example, three first wires 91C are provided.

The first wire 91D has one end connected to the emitter electrode of the semiconductor chip 4D, an intermediate portion connected to the anode electrode of the diode 41D, and the other end connected to the fourth portion 14E of the lead 1E. The number of first wires 91D is not specifically limited. In the illustrated example, three first wires 91D are provided.

The first wire 91E has one end connected to the emitter electrode of the semiconductor chip 4E, an intermediate portion connected to the anode electrode of the diode 41E, and the other end connected to the fourth portion 14F of the lead 1F. The number of first wires 91E is not specifically limited. In the illustrated example, three first wires 91E are provided.

The first wire 91F has one end connected to the emitter electrode of the semiconductor chip 4F, an intermediate portion connected to the anode electrode of the diode 41F, and the other end connected to the fourth portion 14G of the lead 1G. The number of first wires 91F is not specifically limited. In the illustrated example, three first wires 91F are provided.

The first wire 91H has one end connected to the anode electrode of the diode 41X, and the other end connected to the second portion 114H in the first portion 11H of the lead 1H. The number of first wires 91H is not specifically limited. In the illustrated example, three first wires 91H are provided.

The first wire 91I has one end connected to the anode electrode of the semiconductor chip 4X, and the other end connected to the fourth portion 14I of the lead 1I. The number of first wires 91I is not specifically limited. In the illustrated example, three first wires 91H are provided.

<Second Wires 92>

Regarding the second wire 92 according to this embodiment, although any of the elements is apparently given, for the sake of convenience of description, the same numeral as that of the second wire 92 according to the third embodiment, it does not necessarily mean that the mentioned element has the same or similar configuration. The configuration of an element with a numeral is defined by the description relevant to this embodiment. Regarding a portion or structure on which no specific description is given, a similar configuration to that of the second wire 92 of the semiconductor device A3 may be adopted, as appropriate.

As shown in FIG. 71 and FIG. 72, second wires 92 may be electrically connected to the control chip 4G or 4H. The material of the second wires 92 is not specifically limited and, for example, gold (Au) may be employed. The wire diameter of the second wires 92 is not specifically limited and, in this embodiment, finer than the first wires 91A to 91F. The wire diameter of the second wires 92 is, for example, approximately 10 μm to 50 μm. The second wires 92 correspond to the second conductive material in the present disclosure. In the subsequent description, the second wires 92 connected to the control chip 4G will be referred to as second wires 92G, and the second wires 92 connected to the control chip 4H will be referred to as second wires 92H.

A second wire 92G is connected at one end to the gate electrode of the semiconductor chip 4A, and at the other end to the second portion 52*a* of the wiring 50*a*. Likewise, another second wire 92G is connected to the emitter electrode of the semiconductor chip 4A and to the second portion 52*b* of the wiring 50*b*.

A second wire 92G is connected to the gate electrode of the semiconductor chip 4B and to the control chip 4G. Another second wire 92G is connected to the emitter electrode of the semiconductor chip 4B and to the control chip 4G.

A second wire 92G is connected to the gate electrode of the semiconductor chip 4C and to the control chip 4G. Another second wire 92G is connected to the emitter electrode of the semiconductor chip 4C and to the control chip 4G.

A second wire 92H is connected to the gate electrode of the semiconductor chip 4D and to the control chip 4H. Another second wire 92H is connected to the gate electrode of the semiconductor chip 4E and to the control chip 4H. Another second wire 92H is connected to the gate electrode of the semiconductor chip 4F and to the second portion 52*f* of the wiring 50*f*.

The second wires 92 according to this embodiment may include a second wire 92G which is connected to the gate electrode of the semiconductor chip 4X and to the second portion 52*h* of the wiring 50*h*, as shown in FIG. 70.

<Third Wire 93>

As shown in FIG. 71 and FIG. 72, the plurality of third wires 93 are connected to one of the control chips 4G and 4H, as in the semiconductor device A3. The material of the third wire is not specifically limited and, for example, a similar material to that of the second wire 92 may be employed.

<Fourth Wires 94>

As shown in FIG. 71 and FIG. 72, the plurality of fourth wires 94 are connected to the transmission circuit chip 4I and the primary-side circuit chip 4J, as in the semiconductor device A3. The material of the fourth wire 94 is not specifically limited and, for example, a similar material to that of the second wire 92 may be employed.

<Fifth Wires 95>

As shown in FIG. 71 and FIG. 72, the plurality of fifth wires 95 are connected to the primary-side circuit chip 4J and the conductive section 5, as in the semiconductor device A3. The material of the fifth wire 95 is not specifically limited and, for example, a similar material to that of the second wire 92 may be employed.

<Sixth Wires 96>

As shown in FIG. 71 and FIG. 72, the plurality of sixth wires 96 are connected to the control chips 4G and the conductive section 5, as in the semiconductor device A3. The material of the sixth wire 96 is not specifically limited and, for example, a similar material to that of the second wire 92 may be employed.

<Seventh Wires 97>

As shown in FIG. 71 and FIG. 72, the plurality of seventh wires 97 are connected to the control chips 4H and the conductive section 5, as in the semiconductor device A3. The material of the seventh wires 97 is not specifically limited and, for example, a similar material to that of the second wire 92 may be employed.

<Resin 7>

Regarding the resin 7 according to this embodiment, although any of the elements is apparently given, for the sake of convenience of description, the same numeral as that of the resin 7 according to the second embodiment, it does not necessarily mean that the mentioned element has the same or similar configuration. The configuration of an element with a numeral is defined by the description relevant to this embodiment. Regarding a portion or structure on which no specific description is given, a similar configuration to that of the resin 7 of the semiconductor device A3 may be adopted, as appropriate.

The resin 7 covers at least the semiconductor chips 4A to 4F and 4X, the control chips 4G and 4H, the transmission circuit chip 4I, the primary-side circuit chip 4J, a part of each of the plurality of leads 1, and a part of each of the plurality of leads 2. In this embodiment, in addition, the resin 7 covers the diodes 41A to 41F and 41X, the diodes 49U, 49V, and 49W, the plurality of first wires 91A to 91F, the plurality of second wires 92, the plurality of third wires 93, the plurality of fourth wires 94, the plurality of fifth wires 95, the plurality of sixth wires 96, and the plurality of seventh wires 97. The material of the resin 7 is not specifically limited.

Though not specifically limited, for example an insulative material such as an epoxy resin or silicone gel may be employed to form the resin 7.

In this embodiment, the resin 7 includes a first face 71, a second face 72, a third face 73, a fourth face 74, a fifth face 75, a sixth face 76, a recess 731, a recess 732, a recess 733, a hole 741, and a hole 742, which are similar to those of the semiconductor device A3.

Figure 73:
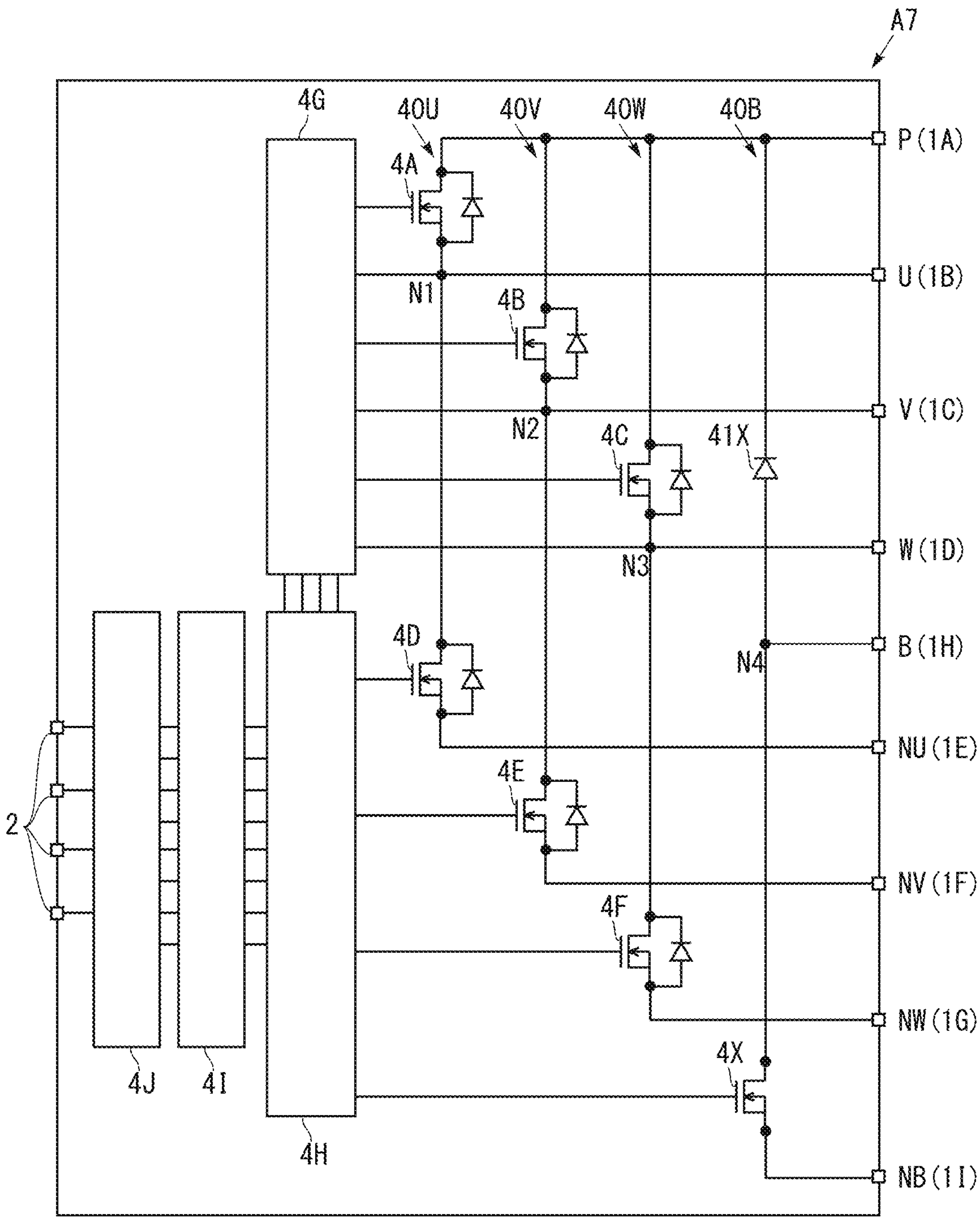
FIG. 73 is a schematic circuit diagram showing an electrical configuration of the semiconductor device according to the seventh embodiment of the present disclosure.

FIG. 73 is a schematic circuit diagram showing an electrical configuration of the semiconductor device A7. The circuit constituted of the semiconductor device A7 includes the switching arms 40U, 40V, and 40W, like the semiconductor device A1. Further, the circuit of the semiconductor device A7 includes a switching circuit 40B. The switching circuit 40B is constituted of the semiconductor chip 4X and the diode 41X. To a node N4, the lead 1H serving as the B terminal is connected.

In this embodiment, the lead 1A is the P terminal. The lead 1B is the U terminal. The lead 1C is the V terminal. The lead 1D is the W terminal. The lead 1E is the NU terminal. The lead 1F is the NV terminal. The lead 1G is the NW terminal. The lead 1H is the B terminal. The lead 1I is the NB terminal. The lead 2A is the VSU terminal. The lead 2B is the VBU terminal. The lead 2C is the VSV terminal. The lead 2D is the VBV terminal. The lead 2E is the VSW terminal. The lead 2F is the VBW terminal. The lead 2G is the first GND terminal. The lead 2H is the first VCC terminal. The lead 2I is the HIND terminal. The lead 2J is the HINV terminal. The lead 2K is the HINW terminal. The lead 2L is the LINU terminal. The lead 2M is the LINV terminal. The lead 2N is the LINW terminal. The lead 2P is the FO terminal. The lead 2Q is the third VCC terminal. The lead 2R is the third GND terminal. The lead 2S is the CIN terminal. The lead 2T is the second VCC terminal. The lead 2U is the second GND terminal. The lead 2V is the Bin terminal.

This embodiment provides similar advantageous effects to those provided by the semiconductor device A3. Further, the switching circuit 40B constituted of the semiconductor chip 4X and the diode 41X enables, for example, control of a braking operation, in addition to operation control of a three-phase AC motor using the switching arms 40U, 40V, and 40W.

Arranging the semiconductor chip 4X and the diode 41X so as to overlap as viewed in the y-direction suppresses an increase in size of the semiconductor device A7 in the x-direction. Arranging the second portion 114A of the first portion 11A and the second portion 114H of the first portion 11H so as to overlap as viewed in the y-direction suppresses an increase in size of the semiconductor device A7 in the x-direction. Arranging the second portion 114H so as to overlap with the diode 41X as viewed in the x-direction allows the length of the first wire 91H to be shortened.

Locating the second portion 52*h* on the side of the third face 33 in the x-direction with respect to the first portion 113H, and so as to overlap with the semiconductor chip 4X as viewed in the x-direction, allows the length of the second wire 92G, connected to the gate electrode of the semiconductor chip 4X and the second portion 52*h*, to be shortened.

First Variation of Seventh Embodiment

Figure 74:
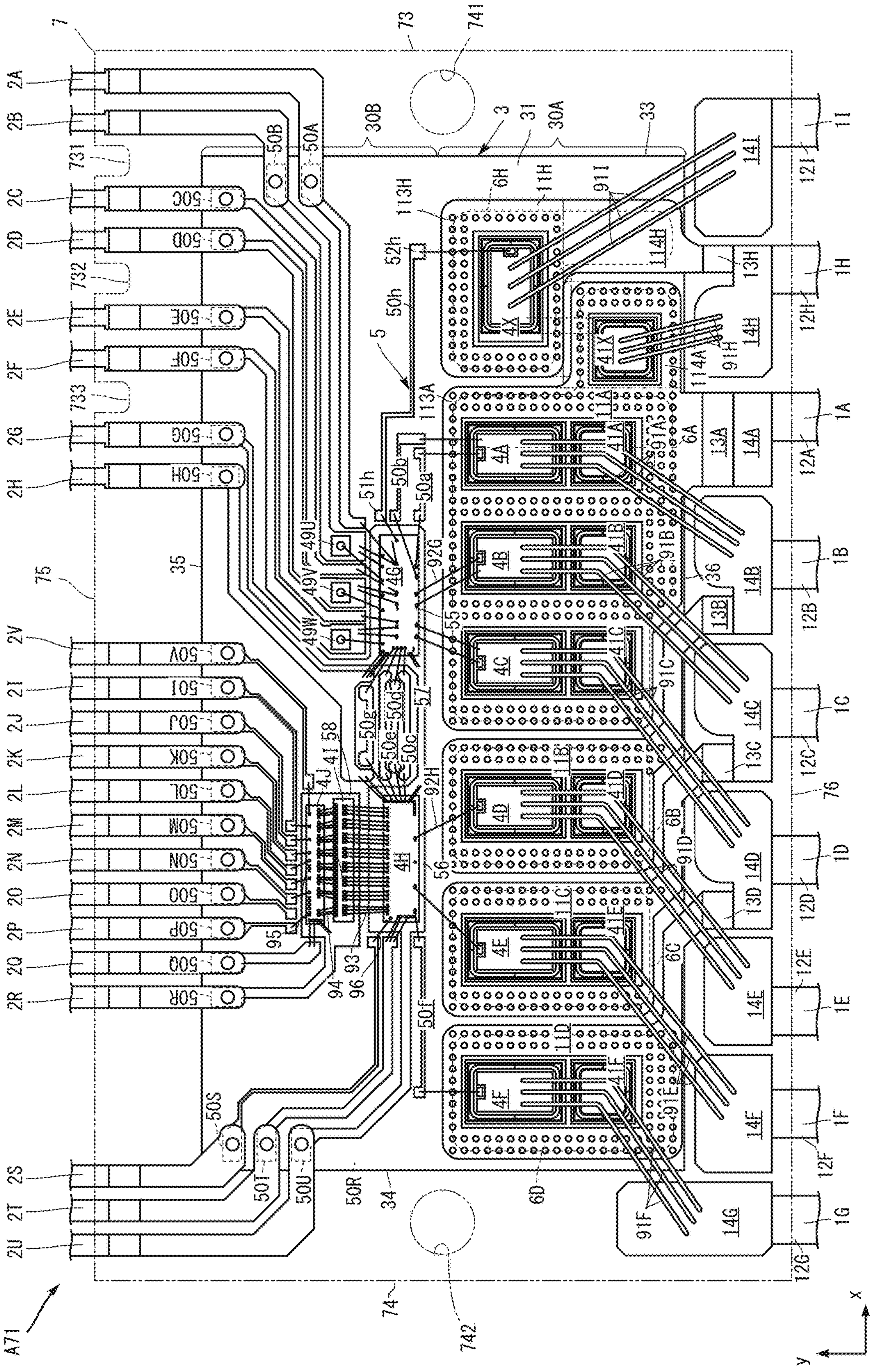
FIG. 74 is a plan view showing a first variation of the semiconductor device according to the seventh embodiment of the present disclosure.

FIG. 74 illustrates a first variation of the semiconductor device A7. The semiconductor device A71 according to this variation may be configured in the same way as the semiconductor device A7, except for the configuration described hereunder.

<Conductive Section 5>

The second portion 52*h* according to this variation is located on the side of the third face 33 in the x-direction with respect to the first portion 51*h*, and spaced therefrom. The second portion 52*h* is located on the side of the sixth face 36 in the y-direction with respect to the first portion 51*h*, and spaced therefrom. The second portion 52*h* overlaps with the first base portion 55, as viewed in the x-direction. The second portion 52*h* is located on the side of the fifth face 35 in the y-direction, with respect to the bonding section 6H. The second portion 52*h* overlaps with the bonding section 6H, as viewed in the y-direction. The shape of the second portion 52*h* is not specifically limited, and a desired shape may be selected from a rectangular shape, a polygonal shape, a circular shape, an elliptical shape, and so forth. In the illustrated example, the second portion 52*h* has a rectangular shape.

<Leads 1>

The first portion 11A of the lead 1A according to this variation includes a first portion 113A and a second portion 114A.

The first portion 113A occupies a majority of the first portion 11A. The first portion 113A overlaps with the second base portion 56 and the wirings 50*a*, 50*b*, and 50*h*, as viewed in the y-direction.

The second portion 114A is connected to the first portion 113A on the side of the third face 33, in the x-direction. The center of the second portion 114A in the y-direction is located on the side of the sixth face 36, with respect to the center of the first portion 113A in the y-direction. In the illustrated example, the edge of the first portion 113A on the side of the sixth face 36 in the y-direction, and the edge of the second portion 114A on the side of the fifth face 35 in the y-direction generally coincide with each other, as viewed in the x-direction. Here, the expression "generally coincide" as viewed in the x-direction refers to, for example, exactly coinciding with each other, or being deviated by within ±5% of the characteristic size (size of the first portion 113A or second portion 114A in the y-direction).

The first portion 11H of the lead 1H according to this variation includes a first portion 113H and a second portion 114H.

The first portion 113H occupies a majority of the first portion 11H. The first portion 113H is located on the side of the third face 33 with respect to the first portion 113A, as viewed in the x-direction. The first portion 113H overlaps with the first portion 113A, as viewed in the x-direction. The first portion 113H is located on the side of the fifth face 35 in the y-direction, with respect to the second portion 114A. The first portion 113H overlaps with the second portion 114A, as viewed in the y-direction.

The second portion 114H is connected to the first portion 113H on the side of the sixth face 36, in the y-direction. The center of the second portion 114H in the x-direction is located on the side of the third face 33, with respect to the center of the first portion 113H in the x-direction. The second portion 114H overlaps with the second portion 114A, as viewed in the x-direction. The second portion 114H is spaced apart from the second portion 114A, as viewed in the y-direction. In the illustrated example, the edge of the first portion 113H on the side of the third face 33 in the x-direction, and the edge of the second portion 114H on the side of the third face 33 in the x-direction generally coincide with each other, as viewed in the y-direction. Here, the expression "generally coincide" as viewed in the y-direction refers to, for example, exactly coinciding with each other, or being deviated by within ±5% of the characteristic size (size of the first portion 113H or second portion 114H in the x-direction).

<Semiconductor Chip 4X, Diode 41X>

In this variation, the semiconductor chip 4X is located on the first portion 113H in the first portion 11H of the lead 1H. Here, the number of semiconductor chips to be mounted on the lead 1H is by no means limited. In the illustrated example, the collector electrode of the semiconductor chip 4X is bonded to the first portion 11H, via the conductive bonding material 83. The semiconductor chip 4X overlaps with the semiconductor chips 4A, 4B, and 4C, as viewed in the x-direction.

The diode 41X is mounted on the second portion 114A of the first portion 11A. The diode 41X overlaps with the semiconductor chip 4X, as viewed in the y-direction. The diode 41X overlaps with the diodes 41A, 41E, and 41C, as viewed in the x-direction. In addition, the diode 41X overlaps with the second portion 114H, as viewed in the x-direction.

<First Wire 91H>

In this variation, the first wire 91H is connected to the anode electrode of the diode 41X, and the fourth portion 14H of the lead 1H.

This variation also provides similar advantageous effects to those provided by the semiconductor device A7. As is apparent from this variation, the location of the semiconductor chip 4X and the diode 41X is not specifically limited, but may be modified in various manners.

Second Variation of Seventh Embodiment

Figure 75:
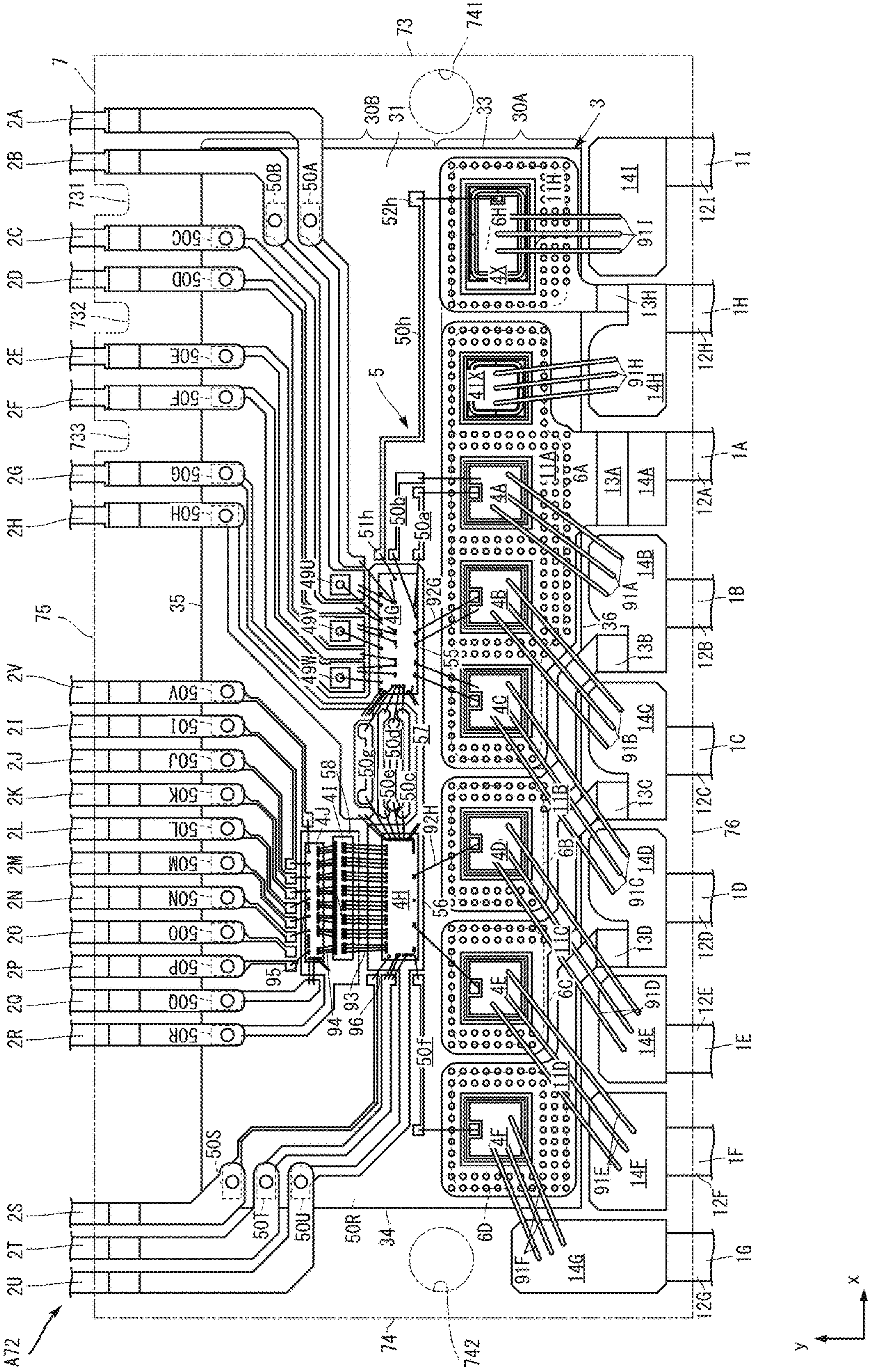
FIG. 75 is a plan view showing a second variation of the semiconductor device according to the seventh embodiment of the present disclosure.

FIG. 75 illustrates a second variation of the semiconductor device A7. The semiconductor device A72 according to this variation may be configured in the same way as the semiconductor devices A7 and A71, except for the configuration described hereunder.

<Conductive Section 5>

The second portion 52*h* according to this variation is located on the side of the third face 33 in the x-direction with respect to the first portion 51*h*, and spaced therefrom. The second portion 52*h* is located on the side of the sixth face 36 in the y-direction with respect to the first portion 51*h*, and spaced therefrom. The second portion 52*h* overlaps with the first base portion 55, as viewed in the x-direction. The second portion 52*h* is located on the side of the fifth face 35 in the y-direction with respect to the bonding section 6H. The second portion 52*h* overlaps with the bonding section 6H, as viewed in the y-direction. The shape of the second portion 52*h* is not specifically limited, and a desired shape may be selected from a rectangular shape, a polygonal shape, a circular shape, an elliptical shape, and so forth. In the illustrated example, the second portion 52*h* has a rectangular shape.

<Leads 1>

The first portion 11H of the lead 1H according to this variation is located on the side of the third face 33 in the x-direction, with respect to the first portion 11A. The first portion 11H overlaps with the first portion 11A, as viewed in the x-direction.

<Semiconductor Chips 4A to 4F, 4X>

In this variation, the semiconductor chips 4A to 4F are a metal-oxide-semiconductor field-effect transistor (MOSFET) formed on a silicon carbide (SiC) substrate, in other words SiC MOSFET. The semiconductor chip 4X is a transistor configured as an IGBT.

<Diode 41X>

The semiconductor device A72 according to this variation includes the diode 41X. The diode 41X is mounted on the first portion 11A of the lead 1A, together with the semiconductor chips 4A to 4C. The diode 41X overlaps with the semiconductor chips 4A to 4C and the semiconductor chip 4X, as viewed in the x-direction.

This variation also provides similar advantageous effects to those provided by the semiconductor devices A7 and A71. In addition, as is apparent from this variation, the specific configuration of the semiconductor chips 4A to 4F is not specifically limited, but may be modified in various manners.

The semiconductor device and the manufacturing method thereof according to the present disclosure are not limited to the foregoing embodiments. The specific arrangement of the semiconductor device and the manufacturing method thereof according to the present disclosure may be modified in various manners.

Terms and numerals in eighth and subsequent embodiments will be independently defined, from those of the first to seventh embodiments, unless otherwise specifically noted. However, two or more elements or arrangements according to the embodiments and variations of the present disclosure may be combined as desired, unless contradiction is incurred.

Eighth Embodiment

Referring to FIG. 76 to FIG. 83, a semiconductor package 1 according to the eighth embodiment will be described.

The semiconductor package 1 according to this embodiment includes a circuit similar to that of the semiconductor device A2 shown in FIG. 49.

<Structure of Transistors>

Semiconductor chips 41X to 46X have the same structure as the semiconductor chip 4A shown in FIG. 32. However, the structure of the semiconductor chips 41X to 46X may be modified in various manners, without limitation to the structure shown in FIG. 32.

<Structure of Diodes>

Diodes 41Y to 46Y have the same structure as the diode 41A shown in FIG. 33 and FIG. 34. However, the structure of the diodes 41Y to 46Y may be modified in various manners, without limitation to the structure shown in FIG. 33 and FIG. 34.

<Configuration of Semiconductor Package>

Figure 76:
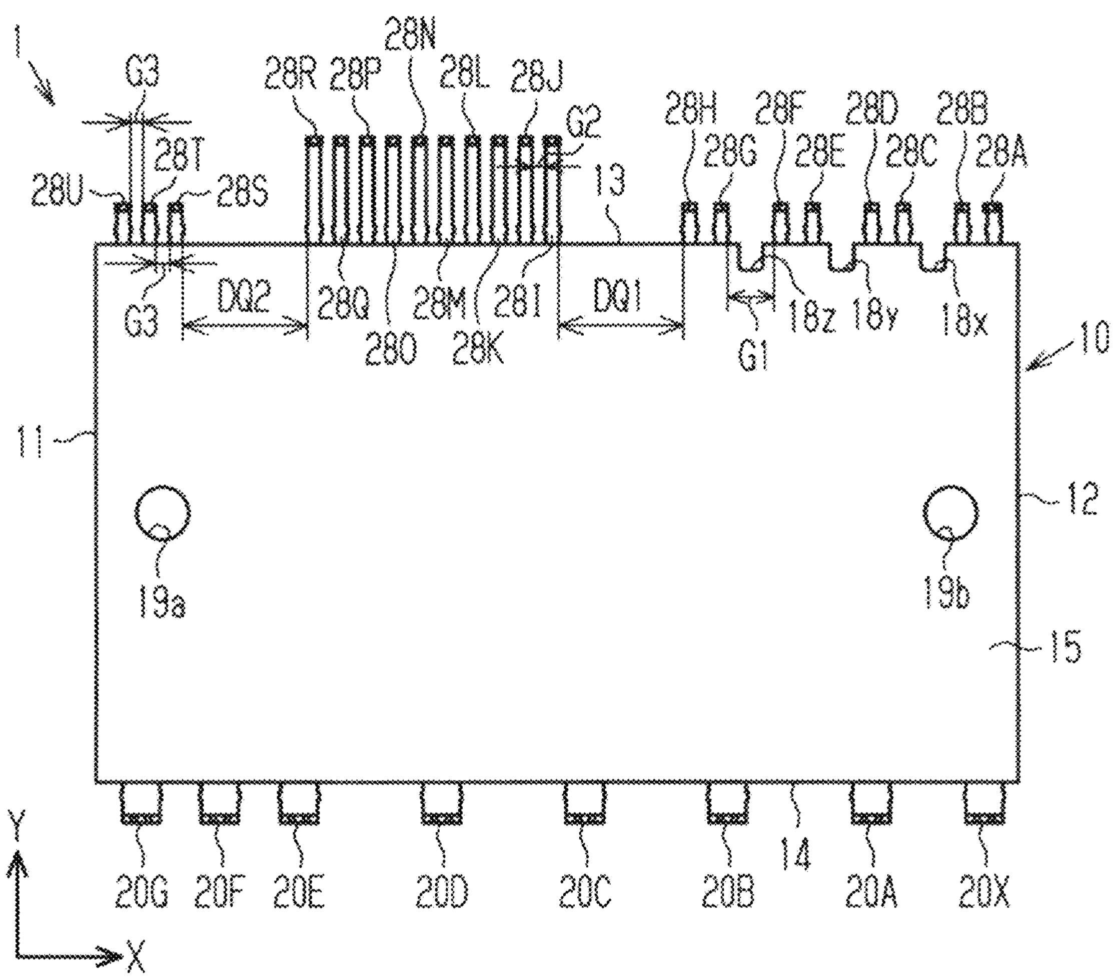
FIG. 76 is a plan view showing a semiconductor package according to an eighth embodiment.
Figure 77:
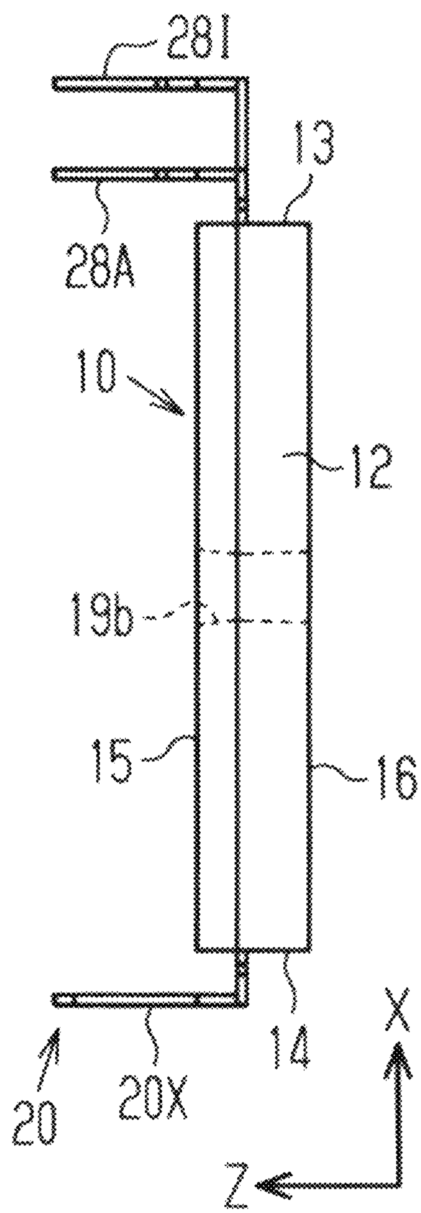
FIG. 77 is a side view showing the semiconductor package according to the eighth embodiment.

As shown in FIG. 76, the semiconductor package 1 according to this embodiment includes lead frames 20. The lead frames 20 have an L-shape, as viewed in a first direction X. The lead frames 20 according to this embodiment include lead frames 20A to 20G, 20X, and lead frames 28A to 28U. The lead frames 20A to 20D exemplify a first lead frame, and the lead frames 203 to 20G exemplify a third lead frame. The lead frames 28A to 28U exemplify a second lead frame.

The lead frames 20A to 20D are located on a first main surface 31 of a substrate 30, in a second region 30A of the substrate 30. The lead frames 20A to 20D are each partially covered with a first resin 10, and partially exposed from the first resin 10. The lead frames 20E to 20G are spaced apart from the substrate 30. The lead frames 20E to 20G are each partially covered with the first resin 10, and partially exposed from the first resin 10. The lead frames 20H to 20W are located on the first main surface 31 of the substrate 30, in a first region 30B of the substrate 30. The lead frames 20H to 20W are each partially covered with the first resin 10, and partially exposed from the first resin 10. In one direction along the planar direction of the substrate 30 (second direction Y), the lead frames 20A to 20D are formed so as to extend beyond a third edge 35 of the substrate 30 from the position overlapping therewith, in a plan view. The lead frames 20H to 20W are formed so as to extend beyond a fourth edge 36 of the substrate 30 from the position overlapping therewith, in a plan view. In addition, in one direction along the planar direction of the substrate 30 (second direction Y), the lead frames 20E to 20G are formed so as to extend beyond the third edge 35 of the substrate 30 from the position overlapping therewith, in a plan view.

The lead frames 20A to 20G constitute conduction paths for electrically connecting, for example, the semiconductor chips 41X to 46X and the diodes 41Y to 46Y. The lead frames 20A to 20D are spaced apart from each other in the first direction X. The lead frames 20A to 20D are aligned in the order of the lead frame 20A, the lead frame 20B, the lead frame 20C, and the lead frame 20D in the first direction X, from the side of the second edge 34 toward the first edge 33 of the substrate 30. The lead frames 20E to 20G are located on the opposite side of the lead frame 20C across the lead frame 20D, in the first direction X. The lead frames 20E to 20G are located on the outer side of the substrate 30, in the first direction X. The lead frame 20X and the lead frame 20Y each constitute, for example, an auxiliary terminal. The lead frame 20X and the lead frame 20Y are each located on the side of a first face 11 of the first resin 10 in the first direction X, with respect to the substrate 30. The lead frame 20X is spaced apart from the substrate 30, in the first direction X.

The lead frame 20A serves to electrically connect, for example, a third electrode DP (e.g., drain electrode pad of the transistor) of the semiconductor chips 41X to 43X and an external power source.

The semiconductor chips 41X to 43X each have the third electrode DP bonded to an island portion 21*a*, via a bonding material SD1. More specifically, the semiconductor chip 4I is bonded to a region Ra1 of the island portion 21*a*, via the bonding material SD1. The semiconductor chip 42 is bonded to a region Ra2 of the island portion 21*a*, via the bonding material SD1. The semiconductor chip 4B is bonded to a region Ra3 of the island portion 21*a*, via the bonding material SD1. An example of the bonding material SD1 is solder. Here, the bonding material may be any material that can physically bond and electrically connect the third electrode DP of the semiconductor chips 41 to 43 and the island portion 21*a*. A metal paste may be employed as the bonding material SD1, instead of solder. An example of the metal paste is silver paste. Here, even though the bonding material SD1 used for bonding the island portion 21*a* and the semiconductor chips 41 to 43 protrudes from the regions Ra1 to Ra3, the bonding material SD1 flows into grooves 21*d* and 21*e* of the island portion 21*a*. Therefore, the bonding material SD1 can be prevented from protruding into a region other than an element mounting region Rse of the island portion 21*a*.

A bonding section 31A and a bonding material SD2, for example having a plate shape, are interposed between the island portion 21*a* of the lead frame 20A and the substrate 30. In a plan view, the bonding section 31A and the bonding material SD2 overlap with each other. The bonding section 31A is formed on the first main surface 31 of the substrate 30, so as to oppose generally the entirety of the island portion 21*a*. For example, the bonding section 31A is opposed to a portion of the island portion 21*a* corresponding to 95% to 100% of its entirety. Accordingly, the entirety of the face of the island portion 21*a* opposed to the substrate 30, and the first main surface 31 of the substrate 30, are in contact with each other via the bonding section 31A and the bonding material SD2. The bonding section 31A is formed by sintering a metal material (second conductive material). For example, a metal paste (second metal paste) may be employed to form the second conductive material. Examples of the second metal paste (second conductive material) include metal paste such as silver (Ag) paste, copper (Cu) paste, or gold (Au) paste. In this embodiment, the bonding section 31A is formed, for example, by sintering the silver paste. The bonding material SD2 is applied over the bonding section 31A. The bonding material SD2 is applied over the entire surface of the bonding section 31A. The island portion 21*a* is bonded to the substrate 30, via the bonding material SD2.

The lead frame 20B is, for example, electrically connected to the third electrode DP of the semiconductor chip 44X. The lead frame 20B is electrically connected, for example, to an electrical apparatus (e.g., a motor) driven by the semiconductor package 1. The lead frame 20C is, for example, electrically connected to the third electrode DP of the semiconductor chip 45X. The lead frame 20C is electrically connected, for example, to the electrical apparatus. The lead frame 20D is, for example, electrically connected to the third electrode DP of the semiconductor chip 46X. The lead frame 20C is electrically connected, for example, to the electrical apparatus. In an example, a motor is employed as the electrical apparatus, in which case the lead frame 20B is electrically connected to a first coil (not shown) of the motor, the lead frame 20C is electrically connected to a second coil (not shown) of the motor, and the lead frame 20D is electrically connected to a third coil (not shown) of the motor. However, the connection arrangement between the first coil, the second coil, and the third coil of the motor and the lead frames 20B to 20D is not limited to the above, but may be modified as desired.

The portion of the lead frames 20B to 20D where the semiconductor chips 44X to 46X are respectively located will be referred to as an island portion 22*a*. The size of the island portion 22*a* in the second direction Y is larger than the size thereof in the first direction X.

The third electrode DP of the semiconductor chip 44X is bonded to the element mounting region Rse of the island portion 22*a* of the lead frame 20B, via a bonding material SD3, the third electrode DP of the semiconductor chip 45X is bonded to the element mounting region Rse of the island portion 22*a* of the lead frame 20C, via a bonding material SD4, and the third electrode DP of the semiconductor chip 46X is bonded to the element mounting region Rse of the island portion 22*a* of the lead frame 20D, via a bonding material SD5. The bonding materials SD3 to SD5 may each be solder. Thus, the semiconductor chip 44X and the lead frame 20B are electrically connected, the semiconductor chip 45X and the lead frame 20C are electrically connected, and the semiconductor chip 46X and the lead frame 20D are electrically connected.

A bonding section 31B and a bonding material SD6, for example having a plate shape, are interposed between the island portion 22*a* of the lead frame 20B and the substrate 30. In a plan view, the bonding section 31B and the bonding material SD6 overlap with each other. A bonding section 31C and a bonding material SD7, for example having a plate shape, are interposed between the island portion 22*a* of the lead frame 20C and the substrate 30. In a plan view, the bonding section 31C and the bonding material SD7 overlap with each other. A bonding section 31D and a bonding material SD8, for example having a plate shape, are interposed between the island portion 22*a* of the lead frame 20D and the substrate 30. In a plan view, the bonding section 31D and the bonding material SD8 overlap with each other. The bonding materials SD6 to SD8 may each be solder. The bonding sections 31B to 31D are formed on the first main surface 31 of the substrate 30, so as to respectively oppose generally the entirety of the island portions 22*a*. For example, the bonding section 31B is opposed to a portion of the island portion 22*a* of the lead frame 20B, corresponding to 95% to 100% of the entirety of the island portion 22*a*. For example, the bonding section 31C is opposed to a portion of the island portion 22*a* of the lead frame 20C, corresponding to 95% to 100% of the entirety of the island portion 22*a*. For example, the bonding section 31D is opposed to a portion of the island portion 22*a* of the lead frame 20D, corresponding to 95% to 100% of the entirety of the island portion 22*a*. Accordingly, the entirety of the face of the island portions 22*a* opposed to the substrate 30, and the first main surface 31 of the substrate 30, are in contact with each other, via the bonding sections 31B to 31D and the bonding materials SD6 to SD8. The bonding sections 31B to 31D are each formed by sintering a metal material (first conductive material). For example, a metal paste may be employed to form the first conductive material. Examples of the metal paste include silver (Ag) paste, copper (Cu) paste, and gold (Au) paste. In this embodiment, the bonding sections 31B to 31D are formed, for example, by sintering the silver paste. The bonding materials SD6 to SD8 are respectively applied over the bonding sections 31B to 31D. The bonding materials SD6 to SD8 are respectively applied over the entire surface of the bonding sections 31B to 31D. The island portions 22*a* are bonded to the substrate 30, via the bonding materials SD6 to SD8.

The lead frames 20E to 20G are, for example, electrically connected to a first electrode SP of the semiconductor chips 44X to 46X and the diodes 44Y to 46Y, respectively. The lead frames 20E to 20G are spaced apart from the substrate 30. The portion of the lead frames 20E to 20G where wires 24D, 24E, and 24F are connected will be referred to as an island portion 23*a*.

The semiconductor chips 41X to 46X and the diodes 41Y to 46Y are respectively connected to the lead frames 20B to 20G, via a second connection material (fourth conductive material). In this embodiment, the wires 24A to 24F are employed, as examples of the second connection material (fourth conductive material). The wires 24A to 24F are, for example, formed of aluminum (Al). Alternatively, the wires 24A to 24F may be formed of copper (Cu). The wires 24A to 24F are respectively connected to the semiconductor chips 41 to 46 and the lead frames 20A to 20G, for example by ball bonding or wedge bonding. The wire diameters of the wires 24A to 24F are equal to each other. In an example, it is preferable that the wires 24A to 24F have a wire diameter of 300 to 400 μm. In this embodiment, the wire diameter of the wires 24A to 24F is approximately 300 μm.

In this embodiment, each of the wires 24A to 24F is a single-line wire. The wires 24A to 24F are arranged generally parallel to each other. Here, the term "generally parallel" refers to a state where one or more of the wires 24A to 24F are inclined by within ±5° from a perfectly parallel state. At least one of the wires 24A to 24F may be composed of a plurality of wires. In this case, the wire composed of a plurality of wires among the wires 24A to 24F may have a finer diameter than that of a wire among the wires 24A to 24F formed of a single-line wire.

Figure 79:
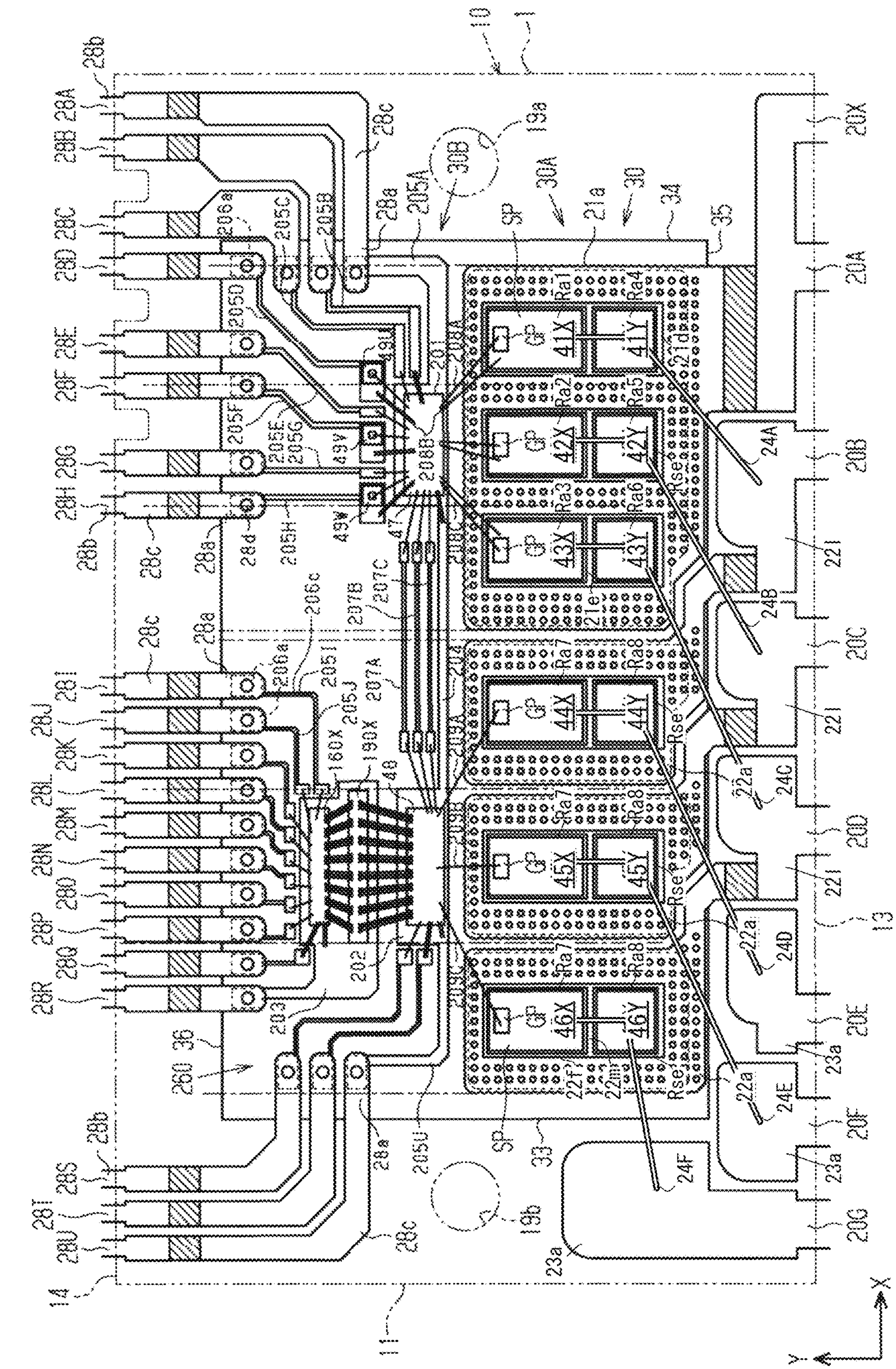
FIG. 79 is a plan view showing an internal configuration of the semiconductor package shown in FIG. 76.

The semiconductor package 1 includes, as shown in FIG. 79, the semiconductor chips 41X to 46X, which are transistors configured as IGBT. The semiconductor chips 41X to 43X constitute a first transistor. The semiconductor chip 44X to 46X constitute a second transistor. The semiconductor package 1 also includes the diodes 41Y to 46Y. The semiconductor chips 41X to 46X each include, on the surface thereof, a first electrode (e.g., emitter electrode) and a second electrode (e.g., gate electrode exemplifying the control terminal). The semiconductor chips 41X to 46X each include the third electrode (e.g., collector electrode) on the back surface thereof. The diodes 41Y to 46Y each include a first electrode (e.g., anode) on the surface thereof. The diodes 41Y to 46Y each include a second electrode (e.g., cathode) on the surface thereof.

The diode 41Y is reversely connected to the semiconductor chip 41X. More specifically, the first electrode (e.g., anode) of the diode 41Y is connected to the first electrode (e.g., emitter) of the semiconductor chip 41X, and the second electrode (e.g., cathode) of the diode 41Y is connected to the third electrode (e.g., collector) of the semiconductor chip 41X.

The diode 42Y is reversely connected to the semiconductor chip 42X. The diode 43Y is reversely connected to the semiconductor chip 43X. The diode 44Y is reversely connected to the semiconductor chip 44X. The diode 45Y is reversely connected to the semiconductor chip 45X. The diode 46Y is reversely connected to the semiconductor chip 46X. The connection arrangement between the diodes 42Y to 46Y and the semiconductor chips 42X to 46X is the same as that between the diode 41Y and the semiconductor chip 41X.

The semiconductor chips 41X to 43X and the diodes 41Y to 43Y are mounted on the island portion 21*a* of the lead frame 20A shown in FIG. 79. The element mounting region Rse of the lead frame 20A shown in FIG. 79 has, for example, a rectangular shape in a plan view. In an example, the element mounting region Rse of the lead frame 20A has the long sides extending along the first direction X. On the lead frame 20A, the element mounting region Rse and the remaining region of the island portion 21*a* are isolated from each other by the groove 21*d*. The element mounting region Rse is located in a region of the island portion 21*a* on the side of the fourth edge 36, in the second direction Y.

The element mounting region Rse is partitioned into six regions, namely regions Ra1 to Ra6, by the groove 21*e*. The six regions Ra1 to Ra6 are defined by dividing the element mounting region Rse into three regions in the first direction X and into two regions in the second direction Y. The three regions Ra1 to Ra3 are formed on the side of the fourth edge 36 in the element mounting region Rse, in the second direction Y. The three regions Ra4 to Ra6 are formed on the side of the third edge 35 in the element mounting region Rse, in the second direction Y. The region Ra1 and the region Ra4 are aligned along the second direction Y. The region Ra2 and the region Ra5 are aligned along the second direction Y. The region Ra3 and the region Ra6 are aligned along the second direction Y. The region Ra2 is located between the region Ra1 and the region Ra3, in the first direction X.

The region Ra1 is located on the side of the second edge 34, with respect to the region Ra2. The region Ra3 is located on the side of the first edge 33, with respect to the region Ra2. The regions Ra1 to Ra3 each have, for example, a rectangular shape in a plan view. In an example, the regions Ra1 to Ra3 each have the long sides extending along the second direction Y. The sizes of the regions Ra1 to Ra3 in the first direction X are equal to each other. The sizes of the regions Ra1 to Ra3 in the second direction Y are equal to each other. Here, the sizes of the regions Ra1 to Ra3 in the first direction X may differ from each other by within ±5%.

The sizes of the regions Ra1 to Ra3 in the second direction Y may differ from each other by within ±5%.

The regions Ra4 to Ra6 each have, for example, a rectangular shape in a plan view. The regions Ra1 to Ra3 each have the long sides extending along the second direction Y. The sizes of the regions Ra4 to Ra6 in the first direction X are equal to each other. The sizes of the regions Ra4 to Ra6 in the second direction Y are equal to each other. The sizes of the regions Ra1 to Ra3 in the first direction X are equal to the sizes of the regions Ra4 to Ra6 in the first direction X. The sizes of the regions Ra1 to Ra3 in the second direction Y are larger than the sizes of the regions Ra4 to Ra6 in the second direction Y. Here, the sizes of the regions Ra4 to Ra6 in the first direction X may differ from each other by within ±5%. The sizes of the regions Ra4 to Ra6 in the first direction X may differ from the sizes of the regions Ra1 to Ra3 in the first direction X, by within ±5%. The sizes of the regions Ra4 to Ra6 in the second direction Y may differ from each other by within ±5%.

In the region Ra1, the semiconductor chip 41X is mounted. The semiconductor chip 41X is located on the side of the fourth edge 36 in the second direction Y, with respect to the center of the region Ra1 in the second direction Y. In the region Ra2, the semiconductor chip 42X is mounted. The semiconductor chip 42X is located on the side of the fourth edge 36 in the second direction Y, with respect to the center of the region Ra2 in the second direction Y. In the region Ra3, the semiconductor chip 43X is mounted. The semiconductor chip 43X is located on the side of the fourth edge 36 in the second direction Y, with respect to the center of the region Ra3 in the second direction Y. The semiconductor chips 41X to 43X are located so as to overlap with each other, as viewed in the first direction X.

In the region Ra4, the diode 41Y is mounted. In the region Ra5, the diode 42Y is mounted. In the region Ra6, the diode 43Y is mounted. In this embodiment, the diode 41Y is located on the side of the third edge 35 in the second direction Y, with respect to the center of the region Ra4 in the second direction Y. The diode 42Y is located on the side of the third edge 35 in the second direction Y, with respect to the center of the region Ra5 in the second direction Y. The diode 43Y is located on the side of the third edge 35 in the second direction Y, with respect to the center of the region Ra6 in the second direction Y. The diodes 41Y to 43Y are located so as to overlap with each other, as viewed in the first direction X.

The semiconductor chips 44X to 46X and the diodes 44Y to 46Y are respectively mounted on the island portions 22*a* of the lead frames 20B to 20D shown in FIG. 79. The respective element mounting regions Rse of the lead frames 20B to 20D have the same shape. The element mounting regions Rse of the lead frame 20B to 20D have, for example, a rectangular shape in a plan view. In an example, the element mounting regions Rse of the lead frames 20B to 20D have the long sides extending along the second direction Y. The sizes of the element mounting regions Rse of the lead frames 20B to 20D in the second direction Y are equal to the size of the element mounting region Rse of the lead frame 20A in the second direction Y. Here, the sizes of the element mounting regions Rse of the lead frames 20B to 20D in the second direction Y may differ from the size of the element mounting region Rse of the lead frame 20A in the second direction Y, by within ±5%.

In each of the lead frames 20B to 20D, the element mounting region Rse and the remaining region of the island portion 22*a* are separated by a groove 22*f*. The element mounting region Rse in each of the lead frames 20B to 20D is divided into two regions Ra7 and Ra8, by a groove 22*m*. The region Ra7 and the region Ra8 are aligned along the second direction Y. The region Ra7 is located on the side of the fourth edge 36 in the second direction Y, with respect to the center of the element mounting region Rse in the second direction Y. The region Ra7 has, for example, a rectangular shape in a plan view. In an example, the region Ra7 has the long sides extending along the second direction Y. The region Ra8 is located on the side of the third edge 35 in the second direction Y, with respect to the center of the element mounting region Rse in the second direction Y. The size of the region Ra7 in the first direction X is equal to the sizes in the first direction X of the regions Ra1 to Ra3 of the element mounting region Rse of the lead frame 20A. The size of the region Ra7 in the second direction Y is equal to the sizes in the second direction Y of the regions Ra1 to Ra3 of the element mounting region Rse of the lead frame 20A. The size of the region Ra8 in the first direction X is equal to the sizes in the first direction X of the regions Ra4 to Ra6 of the element mounting region Rse of the lead frame 20A. The size of the region Ra8 in the second direction Y is equal to the sizes in the second direction Y of the regions Ra4 to Ra6 of the element mounting region Rse of the lead frame 20A. Therefore, the region Ra7 is larger in area than the region Ra8, and the region Ra7 is larger in size in the second direction Y, than the region Ra8. Here, the size of the region Ra7 in the first direction X may differ from the respective sizes in the first direction X of the regions Ra1 to Ra3 of the lead frame 20A, by within ±5%. The size of the region Ra7 in the second direction Y may differ from the respective sizes in the second direction Y of the regions Ra1 to Ra3 of the lead frame 20A, by within ±5%. The size of the region Ra8 in the first direction X may differ from the respective sizes in the first direction X of the regions Ra4 to Ra6 of the lead frame 20A, by within ±5%. The size of the region Ra8 in the second direction Y may differ from the respective sizes in the second direction Y of the regions Ra4 to Ra6 of the lead frame 20A, by within ±5%.

In the region Ra7 of the lead frame 20B, the semiconductor chip 44X is mounted. The semiconductor chip 44X is located on the side of the fourth edge 36 in the second direction Y, with respect to the center of the region Ra7 of the lead frame 20B in the second direction Y. In the region Ra7 of the lead frame 20C, the semiconductor chip 45X is mounted. The semiconductor chip 45X is located on the side of the fourth edge 36 in the second direction Y, with respect to the center of the region Ra7 of the lead frame 20C in the second direction Y. In the region Ra7 of the lead frame 20D, the semiconductor chip 46X is mounted. The semiconductor chip 46X is located on the side of the fourth edge 36 in the second direction Y, with respect to the center of the region Ra7 of the lead frame 20D in the second direction Y. The semiconductor chips 44X to 46X are located so as to overlap with each other, as viewed in the first direction X. The semiconductor chips 41X to 43X are located so as to overlap with each other, as viewed in the first direction X. In addition, the semiconductor chips 41 to 46X are located so as to overlap with each other, as viewed in the first direction X.

In the region Ra8 of the lead frame 20B, the diode 44Y is mounted. In the region Ra8 of the lead frame 20C, the diode 45Y is mounted. In the region Ra8 of the lead frame 20D, the diode 46Y is mounted. In this embodiment, the diode 44Y is located on the side of the third edge 35 in the second direction Y, with respect to the center of the region Ra8 of the lead frame 20B in the second direction Y. The diode 45Y is located on the side of the third edge 35 in the second direction Y, with respect to the center of the region Ra8 of the lead frame 20C in the second direction Y. The diode 46Y is located on the side of the third edge 35 in the second direction Y, with respect to the center of the region Ra8 of the lead frame 20D in the second direction Y.

The semiconductor chip 41X, the diode 41Y, and the lead frame 20B are connected via the same wire 24A. The semiconductor chip 42X, the diode 42Y, and the lead frame 20C are connected via the same wire 24B. The semiconductor chip 43X, the diode 43Y, and the lead frame 20D are connected via the same wire 24C. More specifically, the wire 24A connected to the first electrode of the semiconductor chip 41X includes a first portion and a second portion, each of which will be described hereunder. The first portion extends along the second direction Y, for connection to the first electrode of the diode 41Y. The second portion extends obliquely, to connect the first electrode of the diode 41Y and a wire bonding section 22*l* of the lead frame 20B. In addition, the connection arrangement among the semiconductor chip 42X, the diode 42Y, and the lead frame 20C via the wire 24B, and the connection arrangement among the semiconductor chip 43X, the diode 43Y, and the lead frame 20D via the wire 24C are the same as the connection via the wire 24A.

The semiconductor chip 44X, the diode 44Y, and the lead frame 20E are connected via the same wire 24D. The semiconductor chip 45X, the diode 45Y, and the lead frame 20F are connected via the same wire 24E. The semiconductor chip 46X, the diode 46Y, and the lead frame 20G are connected via the same wire 24F. More specifically, the wire 24D connected to the source of the semiconductor chip 44X includes a first portion and a second portion, each of which will be described hereunder. The first portion extends along the second direction Y, for connection to the anode of the diode 44Y. The second portion extends obliquely, to connect the first electrode of the diode 44Y and the island portion 23*a* of the lead frame 20E. The connection arrangement among the semiconductor chip 45X, the diode 45Y, and the lead frame 20F via the wire 24E, and the connection arrangement among the semiconductor chip 46X, the diode 46Y, and the lead frame 20F via the wire 24F are the same as the connection via the wire 24D.

The lead frames 20 include the lead frames 28A to 28U, exemplifying the second lead frame. The lead frames 28A to 28H and the lead frames 28S to 28U constitute terminals of a secondary-side circuit. The lead frames 28I to 28R constitute terminals of a primary-side circuit. Thus, the lead frames 20 include a plurality of secondary-side lead frames including the lead frames 28A to 28H and 28S to 28U, and a plurality of primary-side lead frames including the lead frames 28I to 28R, as the second lead frames. As seen from FIG. 76, the terminals of the secondary-side circuit are arranged such that the lead frames 28A to 28H and the lead frames 28S to 28U are spaced apart from each other in the first direction X. More specifically, the lead frames 28A to 28H are located on the side of a second face 12 of the first resin 10 in the first direction X, with respect to the lead frames 28S to 28U. The lead frames 28S to 28U are located on the side of a first face 11 of the first resin 10, with respect to the lead frames 28I to 28R. Accordingly, the lead frames 28I to 28R are located between the lead frames 28A to 28H and the lead frames 28S to 28U, in the first direction X.

A distance between the lead frames 28A to 28H and the lead frames 28I to 28R in the first direction X, in other words a distance DQ1 between the lead frame 28H and the lead frame 28I in the first direction X, is longer than a first gap G1. A distance between the lead frames 28I to 28R and the lead frames 28S to 28U in the first direction X, in other words a distance DQ2 between the lead frame 28R and the lead frame 28S in the first direction X, is longer than the first gap G1. The distance DQ2 is equal to the distance DQ1. Thus, the distance DQ1 between the lead frames 28A to 28H, which are the secondary-side lead frames, and the lead frames 28I to 28R, which are the primary-side lead frames, is longer than the array pitch of the lead frames 28A to 28H, which are the secondary-side lead frames. In addition, the distance DQ2 between the lead frames 28S to 28U, which are the secondary-side lead frames, and the lead frames 28I to 28R, which are the primary-side lead frames, is longer than the array pitch of the lead frames 28A to 28H, which are the secondary-side lead frames. Here, the distance DQ2 may differ from the distance DQ1, by within ±5%.

The clearances between the lead frame 28A and the lead frame 283, between the lead frame 28C and the lead frame 28D, between the lead frame 283 and the lead frame 28F, and between the lead frame 28G and the lead frame 28H are equal to the first gap G1. The clearances between the lead frame 28S and the lead frame 28T, and between the lead frame 28T and the lead frame 28U correspond to a third gap G3 which is narrower than the first gap G1. In addition, the clearances between the lead frames adjacent to each other in the first direction X, among the lead frames 28I to 28R, correspond to a second gap G2 narrower than the first gap G1. Thus, the array pitch of the lead frames 28I to 28R which are the primary-side lead frames is narrower than the array pitch of the lead frames 28A to 28H which are the secondary-side lead frames. In an example, the second gap G2 and the third gap G3 may be equal to each other. In other words, the array pitch of the lead frames 28S to 28U may be equal to the array pitch of the lead frames 28I to 28R. Here, the first resin 10 includes a recess 18*x* formed between the lead frame 28B and the lead frame 28C. The first resin 10 also includes a recess 18*y* formed between the lead frame 28D and the lead frame 28E. Further, the first resin 10 includes a recess 18*z* formed between the lead frame 28F and the lead frame 28G.

In a plan view of the semiconductor package 1, the positions of the distal end of respective terminal portions 28*b* of the lead frames 28I to 28R, which are the primary-side lead frames, are different from the positions of the distal end of the respective terminal portions 28*b* of the lead frames 28A to 28H and 28S to 28U, which are the secondary-side lead frames. In this embodiment, in a plan view of the semiconductor package 1, the positions of the distal end of the terminal portions 28*b* of the lead frames 28I to 28R, which are the primary-side lead frames, are more distant from the first resin 10, than the positions of the distal end of the terminal portions 28*b* of the lead frames 28A to 28H and 28S to 28U, which are the secondary-side lead frames. In other words, the projection length of all the lead frames 28I to 28R, which are the primary-side lead frames, from the fourth edge 36 of the substrate 30 (see FIG. 79) is longer than the projection length of all the lead frames 28A to 28H and 28S to 28U, which are the secondary-side lead frames, from the fourth edge 36 of the substrate 30.

As shown in FIG. 76, the first resin 10 includes through holes 19*a* and 19*b*. The through holes 19*a* and 19*b* are used to attach the semiconductor package 1 to a heat dissipation device such as a heatsink (not shown), with a screw or the like.

Figure 78:
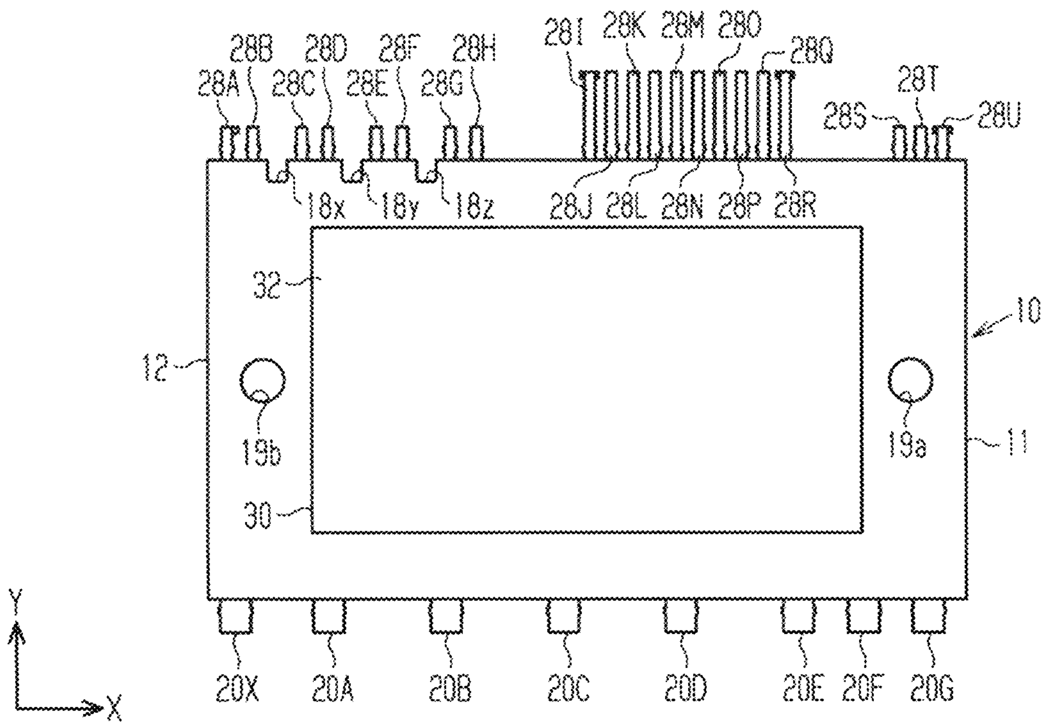
FIG. 78 is a bottom view of the semiconductor package shown in FIG. 76.

As understood from FIG. 78, the substrate 30 is provided such that the second main surface 32 is flush with a sixth face 16 of the first resin 10, and that the second main surface 32 of the substrate 30 is exposed from the first resin 10.

Referring now to FIG. 79, an example of the internal structure of the semiconductor package 1 according to this embodiment will be described hereunder. Hatched regions in FIG. 79 each indicate a portion of the lead frame 20 bent and extending toward a fifth face 15 of the first resin 10. Dash-dot lines in FIG. 79 are auxiliary lines for explaining the positional relation among the components.

As shown in FIG. 79, the semiconductor package 1 according to this embodiment includes the semiconductor chips 41X to 46X and the diodes 41Y to 46Y. The second electrode GP of each of the semiconductor chips 41X to 46X is located in a recess formed close to the end portion of the first electrode SP on the side of the fourth edge 36 of the substrate 30, and in the central position of the first electrode SP in the first direction X. Here, the size of the semiconductor chips 41X to 46X and the position of the second electrode GP in this embodiment may be modified as desired.

As shown in FIG. 79 and as mentioned above, the lead frames 28B and 28C are located on the respective sides of the recess 18*x* of the first resin 10, the lead frames 28D and 28E are located on the respective sides of the recess 18*y*, and the lead frames 28F and 28G are located on the respective sides of the recess 18*z*. Accordingly, the clearance between the lead frames 28A and 28B in the first direction X, the clearance between the lead frames 28C and 28D, the clearance between the lead frames 28E and 28F, and the clearance between the lead frames 28G and 28H are wider than the clearances between the frames adjacent to each other in the first direction X among the lead frames 28I to 28R, and the clearances between the frames adjacent to each other in the first direction X among the lead frames 28S to 28U. The lead frames 28A to 28U are connected to the first region 30B of the substrate 30. More specifically, the lead frames 28A to 28D are connected to the end portion of the first region 30B on the side of the second edge 34, in the first direction X. The lead frames 28D to 28R are connected to the end portion of the first region 30B on the side of the fourth edge 36, in the second direction Y. The lead frames 28S to 28U are connected to the end portion of the first region 30B on the side of the first edge 33, in the first direction X.

As shown in FIG. 79, the lead frames 28A to 28U constitute conduction paths for electrically connecting control chips 47 and 48, and the primary-side circuit chip 160X. The lead frames 28A to 28U each include a bonding portion 28*a*, the terminal portion 28*b*, and an intermediate portion 28*c*, each of which will be described hereunder. A portion of the lead frames 28A to 28U located on the substrate 30 will be referred to as the bonding portion 28*a*. The portion of the lead frames 28A to 28U sticking out from the fourth face 14 of the first resin 10 will be referred to as the terminal portion 28*b*. A portion of the lead frames 28A to 28U connecting the bonding portion 28*a* and the terminal portion 28*b* will be referred to as the intermediate portion 28*c*. The bonding portion 28*a* includes a through hole 28*d* formed so as to penetrate therethrough in the plate thickness direction. The lead frames 28A to 28U are connected to the substrate 30 via a bonding material SD9. The terminal portion 28*b* has an L-shape as viewed in the first direction X. In this embodiment, the lead frames 28A to 28U each include the bonding portion 28*a*, the terminal portion 28*b*, and the intermediate portion 28*c* that are integrally formed. However, at least one of the lead frames 28A to 28U may be formed by connecting the individual pieces of the bonding portion 28*a*, the terminal portion 28*b*, and the intermediate portion 28*c*. In addition, at least one of the lead frames 28A to 28U may be formed such that one of the bonding portion 28*a* and the terminal portion 28*b* is integrally formed with the intermediate portion 28*c*, and the other of the bonding portion 28*a* and the terminal portion 28*b* is connected to the intermediate portion 28*c*.

The respective bonding portions 28*a* of the lead frames 28A to 28H, which are the secondary-side lead frames, are located on the side of the second edge 34 of the substrate 30 in the first direction X, with respect to the center of the first region 30B in the first direction X. The lead frames 28A to 28H are each electrically connected to the control chip 47. The respective bonding portions 28*a* of the lead frames 28S to 28T, which are the secondary-side lead frames, are located close to the end portion of the first region 30B on the side of the first edge 33 of the substrate 30, in the first direction X. The lead frames 28S to 28T are each electrically connected to the control chip 48. The lead frames 28A to 28H are each electrically connected to the control chip 47. The respective bonding portions 28*a* of the lead frames 28I to 28R, which are the primary-side lead frames, are located in the first region 30B, at a position between the bonding portions 28*a* of the lead frames 28A to 28H, and the bonding portions 28*a* of the lead frames 28S to 28T, in the first direction X. The lead frames 28I to 28R are each electrically connected to the primary-side circuit chip 160X.

The lead frames 28A to 28H include, as examples of the terminal of the semiconductor package 1, the first GND terminal, the first VCC terminal, the VSU terminal, the VBU terminal, the VSV terminal, the VBV terminal, the VSW terminal, and the VBW terminal. In FIG. 79, the lead frame 28A constitutes the first GND terminal. The lead frame 28B constitutes the first VCC terminal. The lead frame 28C constitutes the VSU terminal. The lead frame 28D constitutes the VBU terminal. The lead frame 28E constitutes the VSV terminal. The lead frame 28F constitutes the VBV terminal. The lead frame 28G constitutes the VSW terminal. The lead frame 28H constitutes the VBW terminal. The first VCC terminal supplies a source voltage VCC to the control chip 47. The VSU terminal and the VBU terminal constitute a boot strap circuit including the diode 49U. The VSV terminal and the VBV terminal constitute a boot strap circuit including the diode 49V. The VSW terminal and the VBW terminal constitute a boot strap circuit including the diode 49W. Here, the correspondence between the lead frames 28A to 28H and the mentioned terminals is not limited to FIG. 79, but may be modified as desired.

The respective terminal portions 28*b* and the intermediate portions 28*c* of the lead frames 28A to 28C are located on the outer side of the second edge 34 of the substrate 30, in the second direction Y. A part of the intermediate portions 28*c*, and the terminal portions 28*b* are aligned along the first direction X. The respective intermediate portions 28*c* of the lead frames 28A, 28B are formed generally in an L-shape, in a plan view. The bonding portions 28*a* of the lead frames 28A to 28C are aligned along the second direction Y. The bonding portions 28*a* of the lead frames 28A to 28C each have a rectangular shape. The bonding portions 28*a* of the lead frames 28A to 28C each extend along the first direction X, with the longitudinal direction aligned with the first direction X. The bonding portions 28*a* of the lead frames 28D to 28H are aligned along the first direction X. The bonding portions 28*a* of the lead frames 28D to 28H each have a rectangular shape. The bonding portions 28*a* of the lead frames 28D to 28H each extend along the second direction Y, with the longitudinal direction aligned with the second direction Y.

As indicated by the auxiliary line drawn in the second direction Y from the island portion 21*a* of the lead frame 20A, the bonding portions 28*a* of the lead frames 28A to 28C overlap with the lead frame 28D, as viewed in the second direction Y. In addition, as indicated by the auxiliary line, the bonding portions 28*a* of the lead frames 28A to 28C overlap with the end portion of the island portion 21*a* of the lead frame 20A on the side of the second edge 34 of the substrate 30, as viewed in the second direction Y. The lead frames 28E to 28H are located within the island portion 21*a* of the lead frame 20A, in the first direction X. More specifically, the lead frame 28E is located on the side of the first edge 33, with respect to the end portion of the island portion 21*a* on the side of the second edge 34, as viewed in the second direction Y. The lead frame 28H is located on the side of the second edge 34, with respect to the end portion of the island portion 21*a* on the side of the first edge 33, as viewed in the second direction Y.

The lead frame 28I to 28R include, as examples of the terminal of the semiconductor package 1, the HINU terminal, the HINV terminal, the HINW terminal, the LINU terminal, the LINV terminal, the LINW terminal, the FO terminal, the VOT terminal, the third VCC terminal, and the third GND terminal. In FIG. 79, the lead frame 28I constitutes the HINU terminal. The lead frame 28I constitutes the HINV terminal. The lead frame 28K constitutes the HINW terminal. The lead frame 28I, constitutes the LINU terminal. The lead frame 28M constitutes the LINV terminal. The lead frame 28N constitutes the LINW terminal. The lead frame 28O constitutes the FO terminal. The lead frame 28P constitutes the VOT terminal. The lead frame 28Q constitutes the third VCC terminal. The lead frame 28R constitutes the third GND terminal. The third VCC terminal supplies a source voltage VCC to the primary-side circuit 160. The VOT terminal detects the temperature of the semiconductor chips 41X to 46X. Here, the correspondence between the lead frames 28I to 28R and the mentioned terminals is not limited to FIG. 79, but may be modified as desired.

As indicated by the auxiliary line drawn in the second direction Y from the island portion 22*a* of the lead frame 20B, and the auxiliary line drawn in the second direction Y from the island portion 22*a* of the lead frame 20D, the lead frames 28I to 28R are located so as to overlap with one of the island portions 22*a* of the lead frames 20B to 20D, as viewed in the second direction Y. The lead frame 28I is located on the side of the first edge 33 in the first direction X, with respect to the end portion of the island portion 22*a* of the lead frame 20B, on the side of the second edge 34 in the first direction X.

The lead frames 28I to 28L are located so as to overlap with the island portion 22*a* of the lead frame 20B, as viewed in the second direction Y. The lead frame 28I is located so as to overlap with the semiconductor chip 44X, as viewed in the second direction Y. The lead frame 28J is located so as to overlap with the semiconductor chip 44X, as viewed in the second direction Y. The lead frames 28K and 28L are located on the side of the first edge 33 with respect to the semiconductor chip 44X, as viewed in the second direction Y.

The lead frames 28L to 28P are located so as to overlap with the island portion 22*a* of the lead frame 20C, as viewed in the second direction Y. The lead frame 28L is located so as to overlap with both of the island portion 22*a* of the lead frame 20B and the island portion 22*a* of the lead frame 20C, as viewed in the second direction Y. The lead frames 28M to 28O are located so as to overlap with the semiconductor chip 45X, as viewed in the second direction Y. The lead frame 28P is located on the side of the first edge 33 with respect to the semiconductor chip 45X, as viewed in the second direction Y.

The lead frames 28Q and 28R are located so as to overlap with the island portion 22*a* of the lead frame 20D, as viewed in the second direction Y. The lead frame 28Q is located on the side of the second edge 34 with respect to the semiconductor chip 46X, as viewed in the second direction Y. The lead frame 28R is located on the side of the second edge 34 in the first direction X, with respect to the end portion of the island portion 22*a* of the lead frame 20D, on the side of the first edge 33 in the first direction X. The lead frame 28R is located so as to overlap with the semiconductor chip 46X, as viewed in the second direction Y.

The bonding portions 28*a* of the lead frames 28I to 28R are aligned along the first direction X with a clearance between each other, along the end portion of the first region 30B on the side of the first edge 33 of the substrate 30. A clearance between the bonding portions 28*a* of the lead frames 28I to 28R adjacent to each other in the first direction X is narrower than the clearance between the bonding portions 28*a* of the lead frames 28E and 28F in the first direction X, and the clearance between the bonding portions 28*a* of the lead frames 28G and 28H in the first direction X. As is apparent from FIG. 79, the lead frames 28I to 28R are located within a region between the end portion of the lead frame 20B on the side of the second edge 34 of the substrate 30, and the end portion of the lead frame 20D on the side of the first edge 33 of the substrate 30, in the first direction X. In this embodiment, the lead frame 28I overlaps with the end portion of the semiconductor chip 44X on the side of the second edge 34 of the substrate 30, as viewed in the second direction Y. The lead frame 28R overlaps with the end portion of the semiconductor chip 46X on the side of the second edge 34 of the substrate 30, as viewed in the second direction Y. The bonding portions 28*a* of the lead frames 28I to 28R each extend along the second direction Y, with the longitudinal direction aligned with the second direction Y.

The lead frames 28S to 28U include the CIN terminal (detection terminal CIN), the second VCC terminal, and the second GND terminal. In FIG. 79, the lead frame 28S constitutes the CIN terminal (detection terminal CIN). The lead frame 28T constitutes the second VCC terminal. The lead frame 28U constitutes the second GND terminal. The lead frames 28S to 28U are each formed generally in an L-shape, in a plan view. The bonding portions 28*a* of the lead frames 28S to 28U are aligned along the second direction Y with a clearance between each other, along the end portion of the substrate 30 on the side of the first edge 33, and in a region on the side of the fourth edge 36. The bonding portions 28*a* of the lead frames 28S to 28U each have, for example, a rectangular shape in a plan view. In an example, the bonding portions 28*a* of the lead frames 28S to 28U each extend along the first direction X, with the longitudinal direction aligned with the first direction X.

As indicated by the auxiliary line drawn in the second direction Y from the island portion 22*a* of the lead frame 20D, the bonding portions 28*a* of the lead frames 28S to 28U overlap with the end portion of the lead frame 20D on the side of the first edge 33 of the substrate 30, as viewed in the second direction Y. In addition, the bonding portions 28*a* of the lead frames 28S to 28U are located on the side of the first edge 33 of the substrate 30, with respect to the semiconductor chip 46X. Here, the respective end portions of these bonding portions 28*a* may overlap with the semiconductor chip 46X, as viewed in the second direction Y.

As shown in FIG. 79, a wiring pattern 200, for electrically connecting the control chips 47 and 48, the diodes 49U to 49W, the primary-side circuit chip 160X, the transformer chip 190X, and the lead frames 28A to 28U, is formed in the first region 303 of the substrate 30. The wiring pattern 200 is, for example, formed of a conductive material MP. The wiring pattern 200 is formed by sintering the conductive material MP. Examples of the conductive material MP include silver (Ag), copper (Cu), and gold (Au). In this embodiment, silver is employed as the conductive material MP. In this embodiment, the control chips 47 and 48 exemplify a signal reception unit. The transformer chip 190X exemplifies a first transmission circuit having a transformer structure including at least two coils opposed to each other with a gap therebetween, to transmit electrical signals.

Figure 80:
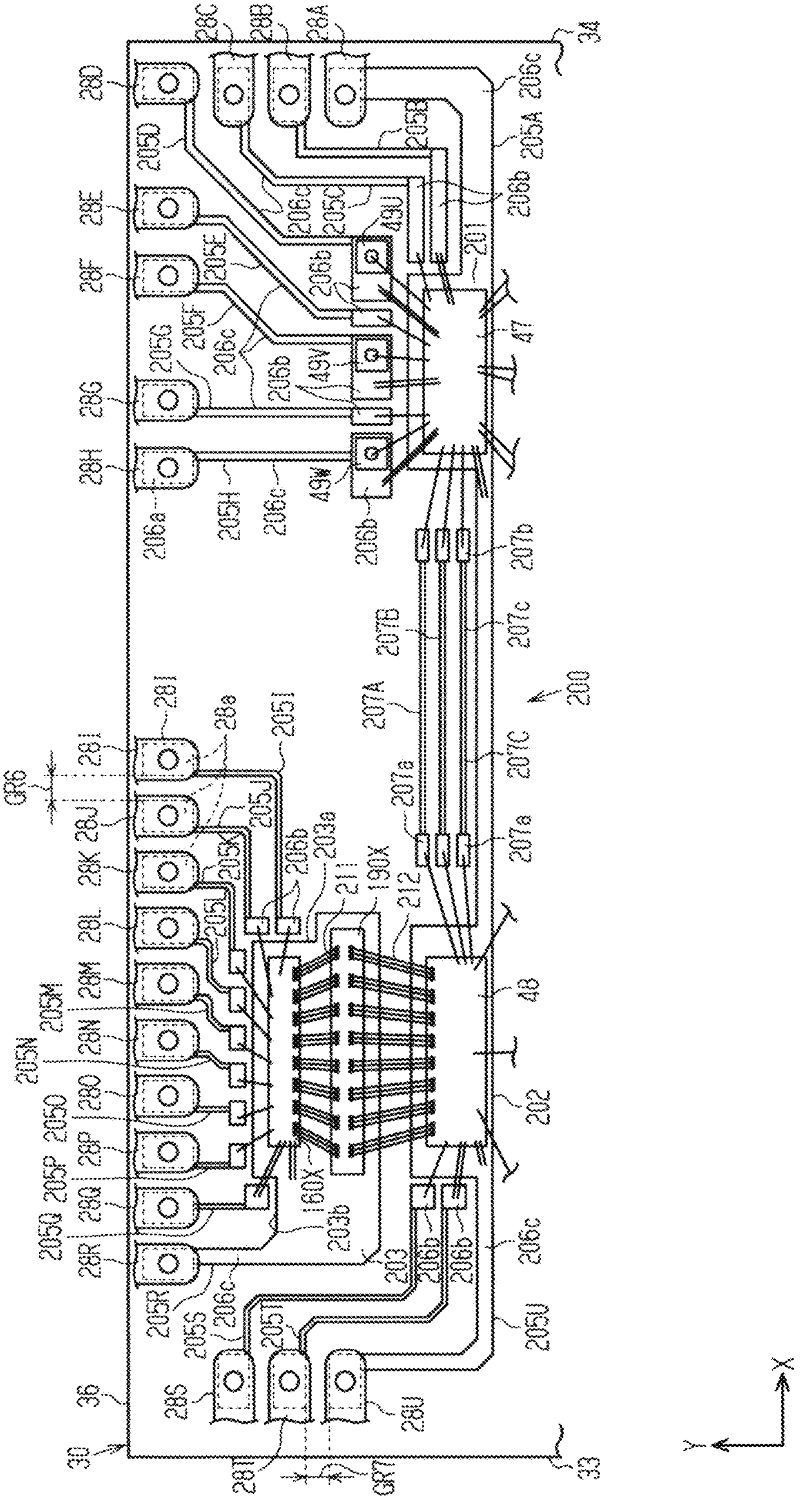
FIG. 80 is an enlarged view of a control wiring region in FIG. 79.

As shown in FIG. 79 and FIG. 80, the wiring pattern 200 includes an island portion 201 where the control chip 47 is mounted, an island portion 202 where the control chip 48 is mounted, and an island portion 203 where the primary-side circuit chip 160X and the transformer chip 190X are mounted. In the island portion 201, the control chip 47 is mounted via the conductive material MP. In the island portion 202, the control chip 48 is mounted via the conductive material MP. In the island portion 203, the primary-side circuit chip 160X and the transformer chip 190X are mounted via the conductive material MP. In this embodiment, silver is employed as the conductive material MP. However, another material such as solder may be employed as the conductive material MP, instead of silver. The primary-side circuit chip 160X is formed by sealing the primary-side circuit 660 shown in FIG. 49 with an encapsulating resin. The transformer chip 190X is formed by sealing the transformer 690 shown in FIG. 49, with the encapsulating resin. The primary-side circuit chip 160X and the transformer chip 190X each have a rectangular shape. In an example, the primary-side circuit chip 160X and the transformer chip 190X each have the long sides extending along the first direction X. In an example, the transformer chip 190X is longer in the first direction X than the primary-side circuit chip 160X, and also than the control chip 48. In an example, the length of the transformer chip 190X in the second direction Y is generally the same as that of the primary-side circuit chip 160X, and shorter than that of the control chip 48, Here, the length of the transformer chip 190X in the second direction Y, expressed as "generally the same as that of the primary-side circuit chip 160X", may differ by within ±5% of the length of the transformer chip 190X in the second direction Y.

The wiring pattern 200 includes twenty-one wirings 205A to 205U. The wirings 205A to 205U each include a first land portion 206*a*, for connection to the lead frames 28A to 28U. The respective first land portions 206*a* of the wirings 205A to 205C are formed between the island portion 201 and the second edge 34 of the substrate 30, in the first direction X. The first land portions 206*a* of the wirings 205A to 205C are aligned along the second direction Y, with a clearance between each other. The first land portions 206*a* of the wirings 205D to 205R are each formed between the first land portion 206*a* of the wiring 205C and the fourth edge 36 of the substrate 30, in the second direction Y. The first land portions 206*a* of the wirings 205D to 205R are aligned along the first direction X, with a clearance between each other. A clearance between the first land portions 206*a* adjacent to each other in the first direction X, among the first land portions 206*a* of the wirings 205D to 205R, is a sixth clearance GR6, for example narrower than the fourth clearance GR4 (see FIG. 9). The first land portions 206*a* of the wirings 205S to 205U are aligned along the second direction Y with a clearance between each other, along the end portion on the side of the first edge 33 of the substrate 30. A clearance between the first land portions 206*a* adjacent to each other in the second direction Y, among the first land portions 206*a* of the wirings 205S to 205U (seventh clearance GR7) is, for example, equal to the sixth clearance GR6. In an example, the seventh clearance GR7 and the sixth clearance GR6 may differ from each other by within ±5%. The first land portions 206*a* of the wirings 205A to 205C and 205S to 205U each have a rectangular shape, in a plan view. In an example, the first land portions 206*a* of the wirings 205A to 205C and 205S to 205U each have the long sides extending along the first direction X. The first land portions 206*a* of the wirings 205D to 205R each have a rectangular shape, in a plan view. In an example, the first land portions 206*a* of the wirings 205D to 205R each have the long sides extending along the second direction Y. Here, the clearance between the first land portions 206*a* adjacent to each other in the first direction X, among the first land portions 206*a* of the wirings 205D to 205R, and the clearance between the first land portions 206*a* adjacent to each other in the second direction Y, among the first land portions 206*a* of the wirings 205S to 205U, may be modified as desired. For example, the seventh clearance GR7 may be wider than the sixth clearance GR6. Further, the sixth clearance GR6 may be equal to or wider than the fourth clearance GR4.

The wirings 205B to 205Q and 205S, 205T each include a second land portion 206*b* and a connection wiring 206*c*. The connection wiring 206*c* is connecting the first land portion 206*a* and the second land portion 206*b*. The wirings 205A, 205R, and 205U each include a connection wiring 206*c*, connected to the first land portion 206*a*. In other words, the wirings 205A, 205R, and 205U do not have the second land portion 206*b*.

The lead frames 28A to 28U are each connected to the first land portion 206*a* of the corresponding one of the wirings 205A to 205U, via the bonding material SD9 (not shown).

Referring to FIG. 79 to FIG. 82, the island portions 201 to 203 and the wirings 205A to 205U will be described in further detail. The island portion 201 is located adjacent to the lead frame 20A, in the second direction Y. The island portion 201 is formed so as to overlap with the semiconductor chip 42X, as viewed in the second direction Y. The island portion 201 is located on the side of the first edge 33 with respect to the semiconductor chip 41X, as viewed in the second direction Y. The island portion 201 is located on the side of the second edge 34 with respect to the semiconductor chip 43X, as viewed in the second direction Y. The island portion 201 is located between the lead frames 28A to 28C and the lead frame 20A, in the second direction Y. The island portion 201 has, for example, a rectangular shape in a plan view. In an example, the island portion 201 has the long sides extending along the first direction X. The island portion 201 is larger in size in the first direction X, than the semiconductor chips 41X to 43X and the diodes 41Y to 43Y. The island portion 201 is smaller in size in the first direction X, than the island portion 21*a* of the lead frame 20A. Further, as indicated by the auxiliary line drawn in the second direction Y from the island portion 201, the end portion of the island portion 201 on the side of the second edge 34 overlaps with the lead frame 28F, as viewed in the second direction Y. In other words, the island portion 201 is formed on the side of the first edge 33 in the first direction X, with respect to the lead frame 28E. In addition, the island portion 201 is formed on the side of the first edge 33, with respect to the first land portion 206*a* of the wiring 205D. As indicated by the auxiliary line drawn in the second direction Y from the island portion 201, the end portion of the island portion 201 on the side of the first edge 33 of the substrate 30 overlaps with the first land portion 206*a* of the wiring 205H, as viewed in the second direction Y. Therefore, the lead frame 28G may be described as overlapping with the island portion 201, as viewed in the second direction Y.

To the island portion 201, the wiring 205A is connected. The wiring 205A constitutes a first ground pattern connected to the island portion 201, where the control chip 47 is mounted. The wiring 205A is connected to the end portion of the island portion 201 on the side of the second edge 34 in the first direction X, and on the side of the lead frame 20A in the second direction Y. The wiring 205A is formed generally in an L-shape in a plan view, to be connected to the bonding portion 28*a* of the lead frame 28A. The wiring 205A includes a first portion and a second portion, each of which will be described hereunder. The first portion extends along the first direction X from the island portion 201 toward the second edge 34 of the substrate 30. The second portion extends along the second direction Y, from the end portion of the first portion on the side of the second edge 34 in the first direction X, toward the fourth edge 36. The wiring 205A is larger than the other wirings, in a plan view.

The control chip 47 is located at the central position of the island portion 201, in the first direction X. The control chip 47 is located in a region of the island portion 201 on the side of the lead frame 20A, in the second direction Y. The control chip 47 is located so as to overlap with the semiconductor chip 42X, as viewed in the second direction Y. The control chip 47 is located on the side of the first edge 33 in the first direction X, with respect to the semiconductor chip 41X. Further, the control chip 47 is located on the side of the second edge 34 in the first direction X, with respect to the semiconductor chip 43X.

The island portion 202 is formed at a position adjacent to the island portion 22*a* of the lead frame 20C, in the second direction Y. The island portion 202 is located so as to overlap with the island portion 201, as viewed in the first direction X. The island portion 202 is located on the side of the first edge 33 in the first direction X, with respect to the island portion 22*a* of the lead frame 20C. The island portion 202 is located on the side of the second edge 34, with respect to the island portion 22*a* of the lead frame 20D. In this embodiment, the island portion 202 is formed such that the center thereof in the first direction X coincides with the center of the semiconductor chip 45X in the first direction X and the center of the diode 45Y in the first direction X. Here, the position of the island portion 202 in the first direction X, with respect to the island portions 22*a* of the lead frames 20B to 20D, may be modified as desired. For example, the island portion 202 may be formed so as to overlap with the island portion 22*a* of the lead frame 20C, or the island portion 22*a* of the lead frame 20D, as viewed in the second direction Y.

As indicated by the auxiliary line drawn in the second direction Y from the island portion 202, the island portion 202 is formed on the side of the first edge 33 of the substrate 30, with respect to the lead frames 28I to 28K. In addition, as indicated by the auxiliary line drawn in the second direction Y from the island portion 202, the island portion 202 is formed on the side of the second edge 34, with respect to the lead frames 28Q and 28R. The island portion 202 overlaps with the lead frames 28I, to 28P, as viewed in the second direction Y. Here, the position of the island portion 202 in the first direction X, with respect to the lead frames 28I to 28R, may be modified as desired.

The island portion 202 has, for example, a rectangular shape in a plan view. In an example, the island portion 202 has the long sides extending along the first direction X. The island portion 202 is slightly larger in size in the first direction X, than the island portion 22*a* of the lead frame 20C. The island portion 202 is generally the same in size in the second direction Y, as the island portion 201. In the second direction Y, the edge of the island portion 202 on the side of the third edge 35 accords with the edge of the island portion 201 on the side of the third edge 35. Here, the size of the island portion 202 in the second direction Y and the size of the island portion 201 in the second direction Y may differ by within ±5% of the size of the island portion 202 in the second direction Y.

To the island portion 202, the wiring 205U is connected. The wiring 205U is connected to the end portion of the island portion 202 on the side of the first edge 33, in the first direction X. The wiring 205U is also connected to the end portion of the island portion 202 on the side of the lead frame 20D, in the second direction Y. The wiring 205U constitutes a second ground pattern connected to the island portion 202 where the control chip 48 is mounted. The wiring 205U is connected to the bonding portion 28*a* of the lead frame 28U. The wiring 205U is, for example, generally L-shaped in a plan view. The wiring 205U includes a first portion and a second portion, each of which will be described hereunder. The first portion extends along the first direction X, from the island portion 202 toward the first edge 33. The second portion extends in the second direction Y, from the end portion of the first portion on the side of the first edge 33 toward the fourth edge 36. In a plan view, the wiring 205U is thicker than other wirings, but finer than the wiring 205A.

The control chip 48 is located at the central position of the island portion 202, in the first direction X. The control chip 48 is located in a region of the island portion 202 on the side of the lead frame 20C, in the second direction Y. The control chip 48 is located so as to overlap with the semiconductor chip 45X, as viewed in the second direction Y. The control chip 48 is located on the side of the first edge 33 with respect to the semiconductor chip 44X, as viewed in the second direction Y. Further, the control chip 48 is located on the side of the second edge 34 with respect to the semiconductor chip 46X, as viewed in the second direction Y.

A connection wiring 204 is formed between the island portion 201 and the island portion 202 in the first direction X, to connect these island portions. The connection wiring 204 extends along the first direction X. A first end portion of the connection wiring 204 is connected to the island portion 201. More specifically, the first end portion of the connection wiring 204 is connected to the end portion of the island portion 201 on the side of the first edge 33, in the first direction X. The first end portion of the connection wiring 204 is connected to the end portion of the island portion 201 on the side of the lead frame 20A, in the second direction Y. A second end portion of the connection wiring 204 is connected to the island portion 202. More specifically, the second end portion of the connection wiring 204 is connected to the end portion of the island portion 202 on the side of the second edge 34, in the first direction X. The second end portion of the connection wiring 204 is connected to the end portion of the island portion 202 on the side of the lead frame 20C, in the second direction Y. In a plan view, the connection wiring 204 has the same thickness as the wiring 205U. However, the thickness of the connection wiring 204 may be modified as desired. In an example, the connection wiring 204 may be different in thickness, from the wiring 205O.

The lead frame 28A and the lead frame 28U are electrically connected, via the wiring 205A, the island portion 201, the connection wiring 204, the island portion 202, and the wiring 205U. Accordingly, the lead frame 28A and the lead frame 28U are connected to each other, via the wiring pattern 200 on the substrate 30. In addition, the wiring pattern 200 includes a ground pattern, on which the control chip 47 and the control chip 48 are mounted.

Between the island portion 201 and the island portion 202 in the first direction X, three intermediary wirings 207A to 207C, each exemplifying the first intermediary wiring, are provided. The intermediary wirings 207A to 207C serve to transmit control signals of the semiconductor chips 41X to 43X, from the control chip 47 to the control chip 48. The intermediary wirings 207A to 207C are aligned in the order of intermediary wiring 207A, intermediary wiring 207B, and intermediary wiring 207C, from the side of the fourth edge 36 of the substrate 30, toward the third edge 35. The intermediary wirings 207A to 207C are formed in a region between the fourth edge 36 of the substrate 30 and the connection wiring 204, in the second direction Y. The intermediary wirings 207A to 207C are formed so as to overlap with the island portion 201, as viewed in the first direction X. The intermediary wirings 207A to 207C may be formed so as to overlap with the island portion 202, as viewed in the first direction X. The intermediary wiring 207C is formed adjacent to the connection wiring 204, in the second direction Y.

In this embodiment, the respective shapes of the intermediary wirings 207A to 207C are equal to each other. The intermediary wirings 207A to 207C each include a first land portion 207*a*, a second land portion 207*b*, and a connection wiring 207*c*. The connection wiring 207*c* is connecting the first land portion 207*a* and the second land portion 207*b*. The respective first land portions 207*a* of the intermediary wirings 207A to 207C are formed on the side of the island portion 202, in the first direction X. The respective second land portions 207*b* of the intermediary wirings 207A to 207C are formed on the side of the island portion 201. The respective connection wirings 207*c* of the intermediary wirings 207A to 207C extend along the first direction X.

In the first direction X, a distance between the island portion 202 and the first land portion 207*a*, and a distance between the island portion 201 and the second land portion 207*b* are equal to each other. These distances are longer than a distance between the island portion 201 and other land portions, and longer than a distance between the island portion 202 and other land portions or the island portion 203. However, the distance between the island portion 202 and the first land portion 207*a*, and the distance between the island portion 201 and the second land portion 207*b* may each be modified as desired. In an example, the distance between the island portion 202 and the first land portion 207*a*, and the distance between the island portion 201 and the second land portion 207*b* may be different from each other.

The wirings 205B and 205C are formed on the substrate 30, between the island portion 201 and the second edge 34 in the first direction X. The wirings 205B and 205C are located on the side of the first edge 33, and on the side of the fourth edge 36, with respect to the wiring 205A. The wirings 205D to 205H are formed on the substrate 30, between the island portion 201 and the fourth edge 36, in the second direction Y. The wirings 205D to 205H are located on the side of the first edge 33, and on the side of the fourth edge 36, with respect to the wiring 205C.

The wiring 205B constitutes a first power source pattern that supplies the source voltage VCC from the lead frame 28B, constituting the first VCC terminal, to the control chip 47. The wirings 205C and 205D are wiring patterns that constitute the boot strap circuit including the diode 49U. The wirings 205E and 205F are wiring patterns that constitute the boot strap circuit including the diode 49V. The wirings 205G and 205H are wiring patterns that constitute the boot strap circuit including the diode 49W.

The respective second land portions 206*b* of the wirings 205D to 205H are formed with a spacing from the edge of the island portion 201 on the side of the fourth edge 36, in the second direction Y. The second land portions 206*b* of the wirings 205D to 205H are aligned with a clearance between each other along the second direction Y, in the order of wiring 205D, wiring 205E, wiring 205F, wiring 205G, and wiring 205H, from the side of the second edge 34 toward the first edge 33 of the substrate 30. The second land portions 206*b* of the wirings 205D, 205F, and 205H have, for example, a rectangular shape in a plan view. In an example, the second land portions 206*b* of the wirings 205D, 205F, and 205H each have the long sides extending along the first direction X. The second land portions 206*b* of the wirings 205E and 205G have, for example, a rectangular shape in a plan view. In an example, the second land portions 206*b* of the wirings 205E and 205G each have the long sides extending along the second direction Y. The clearance between the second land portion 206*b* of the wiring 205E and the respective second land portions 206*b* of the wirings 205D and 205F in the first direction X, and the clearance between the second land portion 206*b* of the wiring 205G and the respective second land portions 206*b* of the wirings 205F and 205H in the first direction X, are equal to each other. These clearances are narrower than the clearance between the land portions 206*b* of the wirings 205D to 205H and the island portion 201, in the second direction Y. Here, the expression "clearance between the second land portion 206*b* of the wiring 205E and the respective second land portions 206*b* of the wirings 205D and 205F in the first direction X, and the clearance between the second land portion 206*b* of the wiring 205G and the respective second land portions 206*b* of the wirings 205F and 205H in the first direction X, are equal to each other" includes a difference within ±5% of the clearance.

The second land portion 206*b* of the wiring 205D is formed so as to overlap with the end portion of the island portion 201 on the side of the second edge 34, as viewed in the second direction Y. The second land portion 206*b* of the wiring 205D protrudes toward the second edge 34 of the substrate 30 in the first direction X, with respect to the island portion 201. The second land portion 206*b* of the wiring 205D is formed on the side of the first edge 33, and on the side of the third edge 35, with respect to the bonding portion 28*a* of the lead frame 28D.

The connection wiring 206*c* is connected to the end portion of the second land portion 206*b* of the wiring 205D, on the side of the second edge 34 and on the side of the fourth edge 36. This connection wiring 206*c* is formed so as to be connected to the bonding portion 28*a* of the lead frame 28D. The connection wiring 206*c* of the wiring 205D includes a first portion, a second portion, and a third portion, each of which will be described hereunder. The first portion extends along the first direction X, from the first land portion 206*a* of the wiring 205D toward the first edge 33. The second portion extends along the second direction Y, from the second land portion 206*b* of the wiring 205D toward the fourth edge 36. The third portion is connecting the first portion and the second portion. The third portion extends obliquely, so as to be closer to the second edge 34, toward the fourth edge 36 of the substrate 30.

The diode 49U is smaller in size than the second land portion 206*b* of the wiring 205D. The diode 49U is mounted on the second land portion 206*b* of the wiring 205D, via the conductive material MP. The diode 49U is located at the end portion of the second land portion 206*b* of the wiring 205D, on the side of the second edge 34. Here, the position of the diode 49U with respect to the second land portion 206*b* of the wiring 205D may be modified as desired.

The second land portion 206*b* of the wiring 205F is formed so as to overlap with the center of the island portion 201 in the first direction X, as viewed in the second direction Y. The wiring 205F is formed on the side of the first edge 33, and on the side of the third edge 35, with respect to the bonding portion 28*a* of the lead frame 28F.

The connection wiring 206*c* of the wiring 205F is connected to the end portion of the second land portion 206*b* of the wiring 205F on the side of the second edge 34, and on the side of the fourth edge 36. This connection wiring 206*c* is formed so as to be connected to the bonding portion 28*a* of the lead frame 28F. The connection wiring 206*c* of the wiring 205F includes a first portion, a second portion, and a third portion, each of which will be described hereunder. The first portion extends along the second direction Y, from the first land portion 206*a* toward the first edge 33. The second portion extends along the second direction Y, from the second land portion 206*b* of the wiring 205F toward the fourth edge 36. The third portion is connecting the first portion and the second portion. The third portion extends obliquely, so as to be closer to the second edge 34, toward the fourth edge 36 of the substrate 30. The third portion of the wiring 205F is shorter than the third portion of the wiring 205D.

The diode 49V is smaller in size than the second land portion 206*b* of the wiring 205F. The diode 49V is mounted on the second land portion 206*b*, via the conductive material MP. The diode 49V is located at the end portion of the second land portion 206*b* of the wiring 205F, on the side of the second edge 34 of the substrate 30. Here, the position of the diode 49V with respect to the second land portion 206*b* of the wiring 205F may be modified as desired.

The second land portion 206*b* of the wiring 205H is formed so as to overlap with the end portion of the island portion 201 on the side of the first edge 33, as viewed in the second direction Y. The second land portion 206*b* of the wiring 205H protrudes toward the first edge 33 in the first direction X, with respect to the island portion 201. The second land portion 206*b* of the wiring 205H is formed so as to overlap with the bonding portion 28*a* of the lead frame 28H, as viewed in the second direction Y. The second land portion 206*b* of the wiring 205H is formed so as to overlap with the second land portion 206*b* of the wiring 205D, and the second land portion 206*b* of the wiring 205F, as viewed in the first direction X.

The connection wiring 206*c* is connected to a portion of the second land portion 206*b* of the wiring 205H on the side of the second edge 34 of the substrate 30, and the end portion on the side of the fourth edge 36. This connection wiring 206*c* extends along the second direction Y, so as to connect the first land portion 207*a*, connected to the bonding portion 28*a* of the lead frame 28H, and the second land portion 206*b* of the wiring 205H.

The diode 49W is smaller in size than the second land portion 206*b* of the wiring 205H. The diode 49W is mounted on this second land portion 206*b*, via the conductive material MP. The diode 49W is located at the end portion of the second land portion 206*b* of the wiring 205H, on the side of the second edge 34 of the substrate 30. Here, the position of the diode 49W with respect to the second land portion 206*b* of the wiring 205H may be modified as desired. Here, the conductive material MP used to mount the diodes 49U to 49W may be formed, for example, silver (Ag), copper (Cu), or gold (Au). In this embodiment, silver is employed to form the conductive material MP for mounting the diodes 49U to 49W.

The wiring 205E is formed between the wirings 205D and 205F, in the first direction X. The first land portion 206*a* of the wiring 205E is formed on the side of the second edge 34 in the first direction X, and on the side of the fourth edge 36 in the second direction Y, with respect to the second land portion 206*b* of the wiring 205E. The connection wiring 206*c* of the wiring 205E includes a first portion, a second portion, and a third portion, each of which will be described hereunder. The first portion extends along the second direction Y, from the first land portion 206*a* toward the third edge 35. The second portion extends along the second direction Y, from the second land portion 206*b* of the wiring 205E toward the fourth edge 36. The third portion is connecting the first portion and the second portion. The third portion extends obliquely so as to be closer to the second edge 34, toward the fourth edge 36 of the substrate 30. The second portion of the wiring 205E is shorter than the second portion of the wiring 205D.

The wiring 205G is formed between the wirings 205F and 205H, in the first direction X. A part of the first land portion 206*a* of the wiring 205G is formed on the side of the second edge 34, with respect to the second land portion 206*b*. The connection wiring 206*c* of the wiring 205G extends along the second direction Y.

In the region around the island portion 201, the respective second land portions 206*b* of the wirings 2053 and 205C are formed with a clearance therebetween in the second direction Y, on the side of the fourth edge 36 with respect to the wiring 205A and the connection wiring 204. The mentioned clearance is narrower than the clearance between the second land portions 206*b* of the wirings 205D to 205H and the island portion 201, in the second direction Y. The second land portions 206*b* of the wirings 205B and 205C have, for example, a rectangular shape in a plan view. The second land portions 206*b* of the wirings 205B and 205C each have the long sides extending along the first direction X. The second land portion 206*b* of the wiring 205B is longer than the second land portion 206*b* of the wiring 205C, in the first direction X. The second land portion 206*b* of the wiring 205B has the same length as the second land portion 206*b* of the wiring 205C, in the second direction Y. Here, the length of the second land portion 206*b* of the wiring 205B in the second direction Y, expressed as "same as the second land portion 206*b* of the wiring 205C in the second direction Y", may differ by within ±5% of the length of the second land portion 206*b* of the wiring 2058 in the second direction Y.

The wiring 205B is formed between the wirings 205A and, 205C. The first land portion 206*a* of the wiring 2058 is formed on the side of the second edge 34 in the first direction X, and on the side of the fourth edge 36 in the second direction Y, with respect to the second land portion 206*b* of the wiring 205B. The connection wiring 206*c* of the wiring 205B includes a first portion and a second portion, each of which will be described hereunder. The first portion extends along the first direction X, from the first land portion 206*a* toward the second edge 34. The second portion extends along the second direction Y, from the end portion of the second land portion 206*b* on the side of the second edge 34, toward the fourth edge 36. The second portion is connected to the first portion.

The wiring 205C is formed between the wirings 205B and, 205D. The first land portion 206*a* of the wiring 205C is formed on the side of the second edge 34 in the first direction X, and on the side of the fourth edge 36 in the second direction Y, with respect to the second land portion 206*b* of the wiring 205C. The connection wiring 206*c* of the wiring 205C is located closer to the connection wiring 206*c* of the wiring 205B, than to the connection wiring 206*c* of the wiring 205D. The connection wiring 206*c* of the wiring 205C includes a first portion, a second portion, and a third portion, each of which will be described hereunder. The first portion extends along the first direction X, from the first land portion 206*a* of the wiring 205C toward the first edge 33. The second portion extends along the second direction Y, from the end portion of the second land portion 207*b* of the wiring 205C on the side of the second edge 34, toward the fourth edge 36. The third portion is connecting the first portion and the second portion. The third portion extends obliquely so as to be closer to the second edge 34, toward the fourth edge 36 of the substrate 30. The third portion of the wiring 205C is shorter than the third portion of the wiring 2053.

Figure 81:
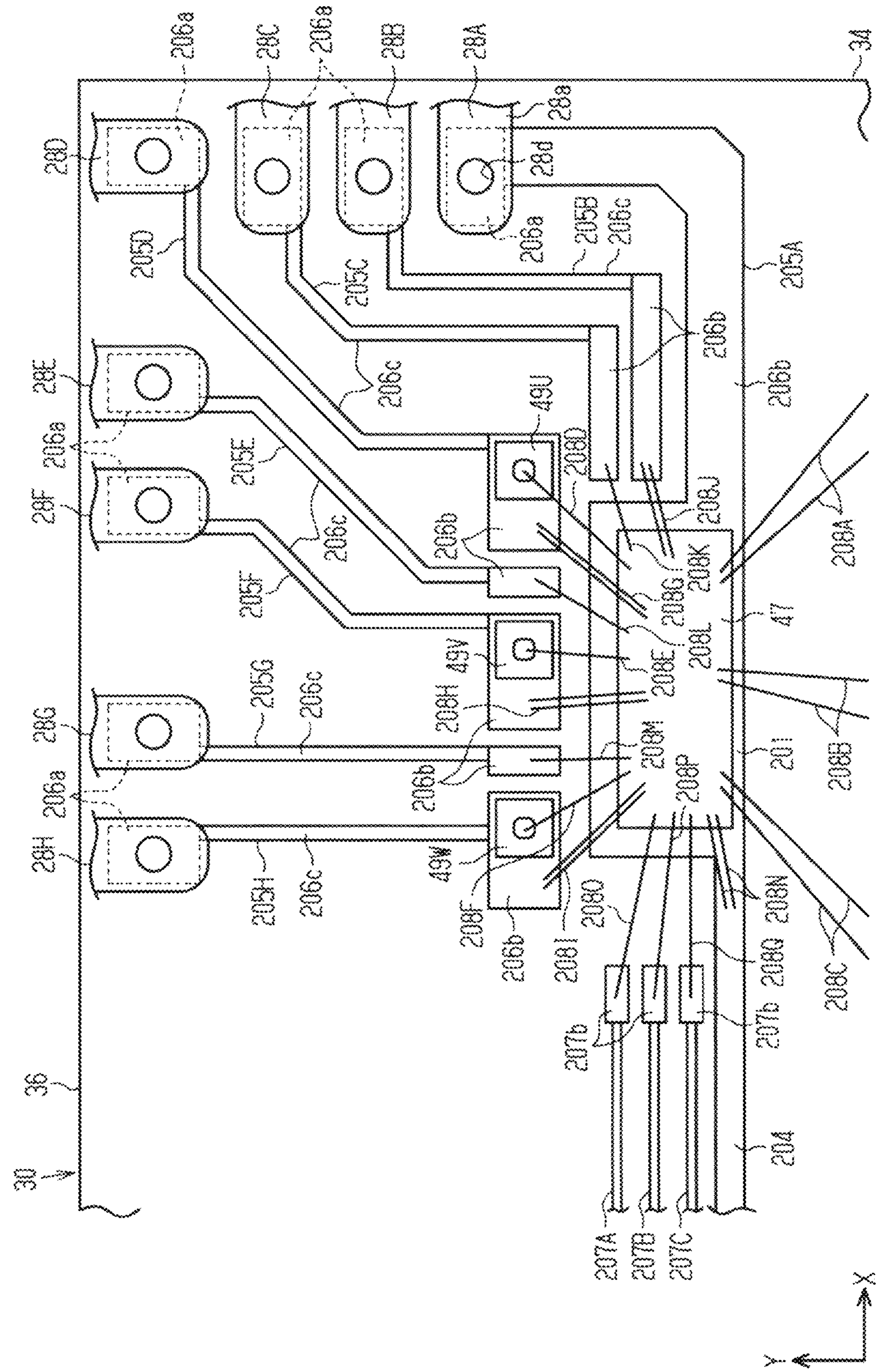
FIG. 81 is an enlarged view of a control circuit chip and a periphery thereof in FIG. 80.

As shown in FIG. 81, the control chip 47 is electrically connected to the semiconductor chips 41X to 43X (see FIG. 79), the diodes 49U to 49W, the wirings 205A to 205H, and the intermediary wirings 207A to 207C, via wires 208A to 208Q exemplifying the first connection material. The wires 208A to 208Q are connected to a face of the control chip 47 opposite to the face via which the control chip 47 is mounted on the island portion 201, in a third direction Z (perpendicular to both of the first direction X and the second direction Y). The wires 208A to 208Q are, for example, formed of gold (Au). The wires 208A to 208Q have the same wire diameter as each other. The wires 208A to 208Q are finer in wire diameter than the wires 24A to 24F. Here, the wire diameters of the wires 208A to 208Q may differ by within ±5% between each other.

The second electrodes GP of the semiconductor chips 41X to 43X are connected to the control chip 47, via the wires 208A to 208C, respectively. The first electrodes SP of the semiconductor chips 41X to 43X are connected to the control chip 47, via another line of the wires 208A to 208C. A first end portion of one wire 208A is connected to the end portion of the control chip 47 on the side of the third edge 35, in the second direction Y. The first end portion of the one wire 208A is connected to the end portion of the control chip 47 on the side of the second edge 34 in the first direction X. A second end portion of the one wire 208A is connected to second electrode GP of the semiconductor chip 41X. A first end portion of another wire 208A is connected to a position on the control chip 47 adjacent, on the side of the first edge 33 in the first direction X, to the first end portion of the wire 208A connected to the second electrode GP. The first end portion of the other wire 208A is connected to the end portion of the control chip 47 on the side of the third edge 35, in the second direction Y. A second end portion of the other wire 208A is connected to a position on the first electrode SP of the semiconductor chip 41X adjacent to the second electrode GP on the side of the first edge 33. A first end portion of one wire 208B is connected to the end portion of the control chip 47 on the side of the third edge 35, in the second direction Y. The first end portion of the one wire 208B is connected to the center of the control chip 47 in the first direction X. A second end portion of the one wire 208B is connected to the second electrode GP of the semiconductor chip 42X. A first end portion of another wire 208B is connected to a position on the control chip 47 adjacent, on the side of the first edge 33 of the substrate 30 in the first direction X, to the first end portion of the one wire 208B. A second end portion of the other wire 208B is connected to a position adjacent to the second electrode GP, on the first electrode SP of the semiconductor chip 42X. A first end portion of one wire 208C is connected to the end portion of the control chip 47 on the side of the third edge 35, in the second direction Y. The first end portion of the one wire 208C is connected to the end portion of the control chip 47 on the side of the first edge 33, in the first direction X. A second end portion of the one wire 208C is connected to the second electrode GP of the semiconductor chip 43X. A first end portion of another wire 208C is connected to a position on the control chip 47 adjacent, on the side of the second edge 34 of the substrate 30 in the first direction X, to the first end portion of the wire 208C connected to the second electrode GP. The first end portion of the other wire 208C is connected to the end portion of the control chip 47 on the side of the third edge 35, in the second direction Y. A second end portion of the other wire 208C is connected to a position on the first electrode SP of the semiconductor chip 43X, adjacent to the second electrode GP on the side of the second edge 34 of the substrate 30.

The diodes 49U to 49W have the first electrode (e.g., anode) connected to the control chip 47, via the wires 208D to 208F respectively. The second electrode (e.g., cathode) of the diode 49U is electrically connected to the lead frame 28D, via the wiring 205D. The second electrode (e.g., cathode) of the diode 49V is electrically connected to the lead frame 28F, via the wiring 205F. The second electrode (e.g., cathode) of the diode 49W is electrically connected to the lead frame 28H, via the wiring 205H. The wire 208D is connected to the end portion of the control chip 47 on the side of the fourth edge 36, in the second direction Y. The wire 208D is connected to the end portion of the control chip 47 on the side of the second edge 34, in the first direction X. The wire 208B is connected to the end portion of the control chip 47 on the side of the fourth edge 36, in the second direction Y. The wire 208E is connected to the center of the control chip 47 in the first direction X. The wire 208F is connected to the end portion of the control chip 47 on the side of the fourth edge 36, in the second direction Y. The wire 208F is connected to a position on the control chip 47 on the side of the first edge 33 in the first direction X, with respect to the center of the control chip 47 in the first direction X.

The control chip 47 is electrically connected to the second land portion 206*b* of the wiring 205D, via two wires 208G. The control chip 47 is also electrically connected to the second land portion 206*b* of the wiring 205F, via two wires 208H. Further, control chip 47 is electrically connected to the second land portion 206*b* of the wiring 205H, via two wires 208I. The two wires 208G are connected to positions on the second land portion 206*b* of the wiring 205D on the side of the third edge 35 in the second direction Y, with respect to the diode 49U. The two wires 208G are connected to the positions on the second land portion 206*b* of the wiring 205D on the side of the first edge 33 in the first direction X, with respect to the diode 49U. The two wires 208H are connected to positions on the second land portion 206*b* of the wiring 205F on the side of the first edge 33 in the first direction X, with respect to the diode 49V. The two wires 208H are connected to the positions on the second land portion 206*b* of the wiring 205F on the side of the third edge 35 in the second direction Y, with respect to the center of the second land portion 206*b* in the second direction Y. The two wires 208I are connected to positions on the second land portion 206*b* of the wiring 205H on the side of the second edge 34 in the first direction X, with respect to the diode 49W. The two wires 208I are connected to the positions on the second land portion 206*b* of the wiring 205H on the side of the third edge 35 in the second direction Y, with respect to the center of the second land portion 206*b* in the second direction Y.

Respective first end portions of two wires 208J, connecting the wiring 205B and the control chip 47, are connected to the end portion of the control chip 47 on the side of the second edge 34 of the substrate 30, in the first direction X. The respective first end portions of the two wires 208J are connected to central positions of the control chip 47 in the second direction Y. Respective second end portions of the two wires 208J are connected to the end portion of the second land portion 206*b* of the wiring 205B on the side of the island portion 201 in the first direction X.

A first end portion of a single-line wire 208K, connecting the wiring 205C and the control chip 47, is connected to the end portion of the control chip 47 on the side of the second edge 34 of the substrate 30, in the first direction X. The first end portion of the single-line wire 208K is connected to the end portion of the control chip 47 on the side of the fourth edge 36, in the second direction Y. A second end portion of the single-line wire 208K is connected to the end portion of the second land portion 206*b* of the wiring 205C on the side of the island portion 201, in the first direction X. A first end portion of a single-line wire 208L, connecting the wiring 205E and the control chip 47, is connected to the end portion of the control chip 47 on the side of the fourth edge 36 of the substrate 30, in the second direction Y. The first end portion of a single-line wire 208L is connected to a position on the control chip 47 between the first end portion of the wire 208E and the first end portion of the wire 208G in the first direction X. A second end portion of the wire 208L is connected to a position on the second land portion 206*b* of the wiring 205E, on the side of the island portion 201 in the second direction Y, with respect to the center of the second land portion 206*b* in the second direction Y. Respective first end portions of two wires 208M, connecting the wiring 205G and the control chip 47, are connected to the end portion of the control chip 47 on the side of the fourth edge 36 of the substrate 30, in the second direction Y. The respective first end portions of the two wires 208M are connected to positions on the control chip 47 between the first end portion of the wire 208F and the first end portion of the wire 208H in the first direction X. Respective second end portions of the two wires 208M are connected to the end portion of the second land portion 206*b* of the wiring 205G on the side of the island portion 201 in the first direction X, with respect to the center of the second land portion 206*b* in the second direction Y. The control chip 47 is electrically connected to the connection wiring 204, via two wires 208N. Respective first end portions of the two wires 208N are connected to the end portion of the control chip 47 on the side of the first edge 33, in the first direction X. The respective first end portions of the two wires 208N are connected to the end portion of the control chip 47 on the side of the third edge 35, in the second direction Y. Respective second end portions of the two wires 208N are connected to the end portion of the connection wiring 204 on the side of the island portion 201 in the first direction X.

A first end portion of a single-line wire 208O, connecting the intermediary wiring 207A and the control chip 47, is connected to the end portion of the control chip 47 on the side of the first edge 33 in the first direction X. The first end portion of the single-line wire 208O is connected to a position on the side of the fourth edge 36 in the second direction Y, with respect to the center of the control chip 47 in the second direction Y. A second end portion of the wire 208O is connected to the second land portion 207*b* of the intermediary wiring 207A. A first end portion of a single-line wire 208P, connecting the intermediary wiring 207B and the control chip 47, is connected to the end portion of the control chip 47 on the side of the first edge 33 in the first direction X. The first end portion of the single-line wire 208P is connected to the center of the control chip 47 in the second direction Y. A second end portion of the wire 208P is connected to the second land portion 207*b* of the intermediary wiring 207B. A first end portion of a single-line wire 208Q, connecting the intermediary wiring 207C and the control chip 47, is connected to the end portion of the control chip 47 on the side of the first edge 33 of the substrate 30 in the first direction X. The first end portion of the wire 208Q is connected to a position on the side of the third edge 35 in the second direction Y, with respect to the center of the control chip 47 in the second direction Y. A second end portion of the wire 208Q is connected to the second land portion 207*b* of the intermediary wiring 207C.

The respective second land portions 206*b* of the wirings 205S and 205T, and the island portion 203 are formed around the island portion 202. The wirings 205S and 205T are formed between the first edge 33 of the substrate 30 and the island portion 202, in the first direction X. The wiring 205S constitutes a signal pattern electrically connected to the control chip 48. The wiring 205S constitutes the signal pattern that supplies the detection voltage CIN to the control chip 48. The wiring 205T constitutes a second power source pattern that supplies the source voltage VCC to the control chip 48.

The respective land portions 206*b* of the wirings 205S and 205T are formed on the side of the first edge 33 with respect to the island portion 202, with a clearance therefrom. The island portion 203 is formed on the side of the fourth edge 36 with respect to the island portion 202, with a clearance therefrom. The second land portions 206*b* of the wirings 205S and 205T are, for example, formed in a quadrate (square) shape in a plan view. Here, the shape of the second land portions 206*b* of the wirings 205S and 205T may be modified as desired.

The respective land portions 206*b* of the wirings 205S and 205T are aligned in the second direction Y, with a clearance therebetween. The clearance between the second land portion 206*b* of the wiring 205S and the second land portion 206*b* of the wiring 205T in the second direction Y is narrower than the clearance between the second land portion 206*b* of the wiring 205T and the connection wiring 206*c* of the wiring 205U in the second direction Y. The first land portion 206*a* of the wiring 205T is formed on the side of the first edge 33, and on the side of the fourth edge 36 of the substrate 30, with respect to the second land portion 206*b* of the wiring 205T. The connection wiring 206*c* of the wiring 205S includes a first portion, a second portion, a third portion, a fourth portion, and a fifth portion, each of which will be described hereunder. The first portion extends along the first direction X, from the first land portion 206*a* toward the second edge 34, The second portion extends along the first direction X, from the second land portion 206*b* toward the first edge 33. The third portion extends along the second direction Y. The third portion is located between the first portion and the second portion, in the first direction X. The fourth portion is connecting the first portion and the third portion. The fifth portion is connecting the second portion and the third portion. The fourth portion is connected to the end portion of the third portion on the side of the fourth edge 36. The fifth portion is connected to the end portion of the third portion on the side of the third edge 35. The fourth portion and the fifth portion each extend obliquely, so as to be closer to the fourth edge 36, toward the first edge 33 of the substrate 30.

The second land portion 206*b* of the wiring 205S is opposed to the end portion of the island portion 201 on the side of the fourth edge 36, in the first direction X. The first land portion 206*a* of the wiring 205S is formed on the side of the first edge 33, and on the side of the fourth edge 36 of the substrate 30, with respect to the second land portion 206*b* of the wiring 205S. The connection wiring 206*c* of the wiring 205S includes a first portion, a second portion, a third portion, a fourth portion, and a fifth portion, each of which will be described hereunder. The first portion extends along the first direction X, from the first land portion 206*a* toward the second edge 34. The second portion extends along the first direction X, from the second land portion 206*b* toward the first edge 33. The third portion extends along the second direction Y. The third portion is located between the first portion and the second portion, in the first direction X. The fourth portion is connecting the first portion and an end portion of the third portion. The fifth portion is connecting the second portion and the other end portion of the third portion. The fourth portion is connected to the end portion of the third portion on the side of the fourth edge 36. The fifth portion is connected to the end portion of the third portion on the side of the third edge 35. The fourth portion and the fifth portion each extend obliquely, so as to be closer to the fourth edge 36, toward the first edge 33 of the substrate 30.

The island portion 203 is formed adjacent to the island portion 202 with a clearance therefrom, on the side of the fourth edge 36 of the substrate 30. The island portion 203 has, for example, a generally rectangular shape in a plan view. In an example, the island portion 203 has the long sides extending along the first direction X. The island portion 203 is larger in size in the first direction X, than the island portion 202. The island portion 203 is larger in size in the second direction Y, than the island portion 202. The island portion 203 includes a first cutaway portion 203*a* and a second cutaway portion 203*b*. The first cutaway portion 203*a* is formed in the end portion of the island portion 203 on the side of the second edge 34, in the first direction X. The first cutaway portion 203*a* is formed along the portion of the island portion 203 between the center thereof in the second direction Y, and the end portion thereof on the side of the fourth edge 36. The second cutaway portion 203*b* is formed in a portion of the island portion 203 on the side of the first edge 33 in the first direction X, with respect to the center of the island portion 203 in the first direction X. The second cutaway portion 203*b* is formed in the end portion of the island portion 203 on the side of the fourth edge 36, in the second direction Y. The first cutaway portion 203*a* extends along the second direction Y. The second cutaway portion 203*b* extends along the first direction X. A portion of the island portion 203 on the side of the third edge 35 protrudes toward the second edge 34 in the first direction X, with respect to the island portion 202. The island portion 203 extends further toward the first edge 33, with respect to the second land portions 206*b* of the wirings 205S and 205T. The end portion of the island portion 203 on the side of the first edge 33 overlaps with the semiconductor chip 46X, as viewed in the second direction Y (see FIG. 79). The island portion 203 is formed on the side of the first edge 33, with respect to the lead frames 28I to 28K. In other words, the island portion 203 is formed on the side of the first edge 33, with respect to the first land portions 206*a* of the wirings 205I to 205K.

On the island portion 203, the primary-side circuit chip 160X and the transformer chip 190X are mounted, via the conductive material MP. The primary-side circuit chip 160X and the transformer chip 190X are opposed to each other in the second direction Y, with a clearance therebetween. The primary-side circuit chip 160X is located in a region of the island portion 203 on the side of the fourth edge 36, with respect to the transformer chip 190X. In an example, the primary-side circuit chip 160X is located in a region of the island portion 203 on the side of the fourth edge 36 in the second direction Y, with respect to the center of the island portion 203 in the second direction Y. In an example, the transformer chip 190X is located in a region of the island portion 203 on the side of the third edge 35 in the second direction Y, with respect to the center of the island portion 203 in the second direction Y. The transformer chip 190X is opposed to the control chip 48 in the second direction Y, with a clearance therebetween. In the second direction Y, the distance between the transformer chip 190X and the control chip 48 is longer than the distance between the transformer chip 190X and the primary-side circuit chip 160X. The primary-side circuit chip 160X, the transformer chip 190X, and the control chip 48 overlap with each other, as viewed in the second direction Y.

Figure 82:
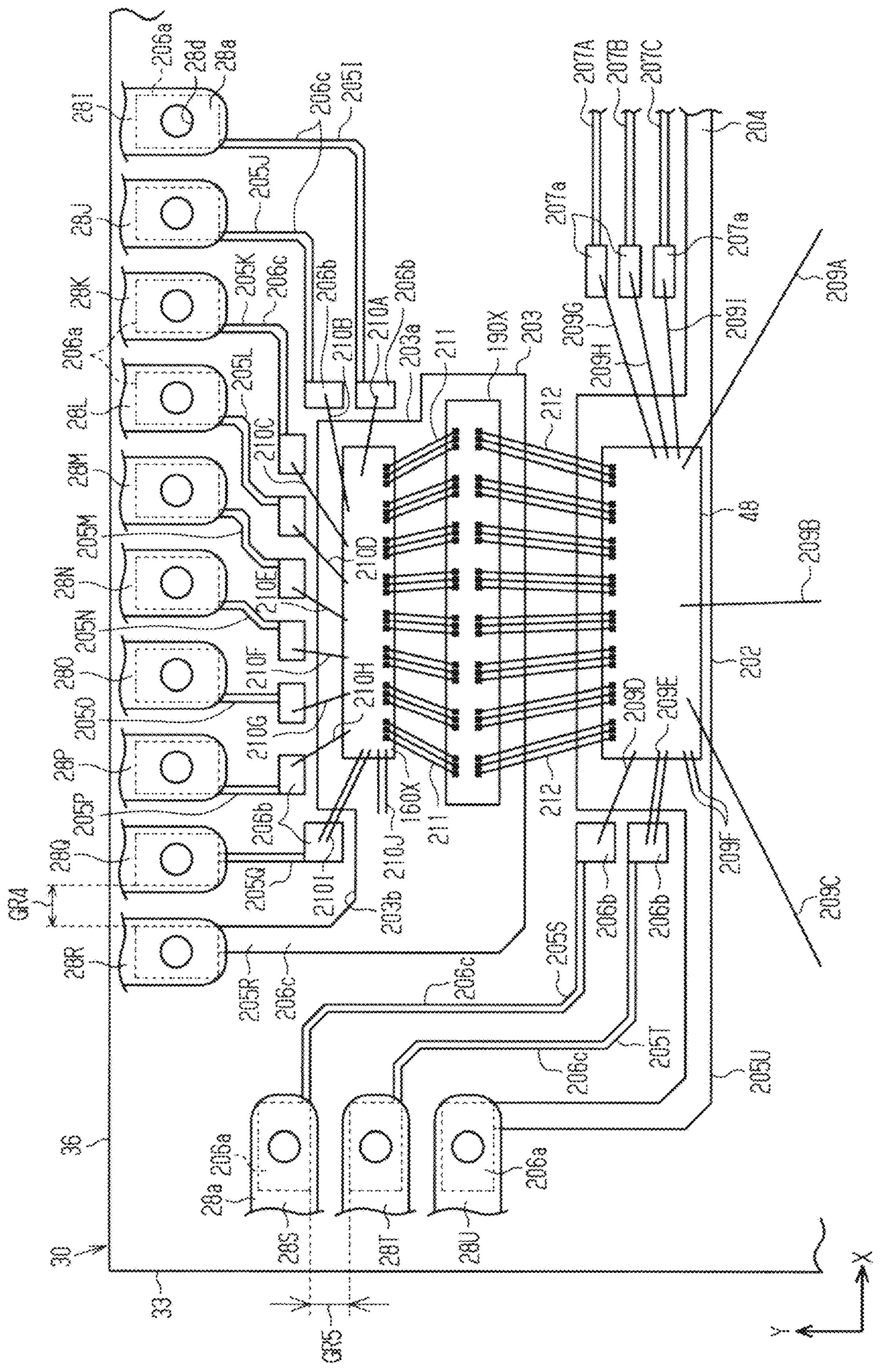
FIG. 82 is an enlarged view of another control circuit chip and a periphery thereof in FIG. 80.

As shown in FIG. 82, the primary-side circuit chip 160X and the transformer chip 190X are connected to each other, via a plurality of wires 211 exemplifying the third connection material. The plurality of wires 211 are connected to the respective faces of the primary-side circuit chip 160X and the transformer chip 190X, opposite to the face via which these chips are mounted on the island portion 203, in the third direction Z. Respective first end portions of the plurality of wires 211 are connected to the end portion of the primary-side circuit chip 160X on the side of the third edge 35, in the second direction Y. Respective second end portions of the plurality of wires 211 are connected to the end portion of the transformer chip 190X on the side of the fourth edge 36, in the second direction Y. In this embodiment, eight pieces of land units are aligned in the first direction X with a clearance between each other, each land unit including three land portions of the primary-side circuit chip 160X, to which three wires 211 are respectively connected. In addition, eight pieces of land units are aligned in the first direction X with a clearance between each other, each land unit including three land portions of the transformer chip 190X, to which three wires 211 are respectively connected. As shown in FIG. 82, the array pitch among the eight land units (distance between land units adjacent to each other in the first direction X) of the transformer chip 190X is wider than the array pitch among the eight land units of the primary-side circuit chip 160X.

The transformer chip 190X and the control chip 48 are connected to each other, via a plurality of wires 212 exemplifying the fourth connection material. Respective first end portions of the plurality of wires 212 are connected to the end portion of the transformer chip 190X on the side of the third edge 35, in the second direction Y. Respective second end portions of the plurality of wires 212 are connected to the end portion of the control chip 48 on the side of the fourth edge 36, in the second direction Y. In this embodiment, eight pieces of land units are aligned in the first direction X with a clearance between each other, each land unit including three land portions of the transformer chip 190X, to which three wires 212 are respectively connected. The array pitch among the eight land units of the transformer chip 190X is equal to the array pitch among the eight land units on the transformer chip 190X, to which the wires 211 are connected. In addition, eight pieces of land units are aligned in the first direction X with a clearance between each other, each land unit including three land portions of the control chip 48, to which three wires 212 are respectively connected. As shown in FIG. 82, the array pitch among the eight land units of the transformer chip 190X is wider than the array pitch among the eight land units of the control chip 48. In an example, further, the array pitch among the eight land units of the control chip 48 and the array pitch among the eight land units of the primary-side circuit chip 160X are equal to each other. In addition, as is apparent from FIG. 82 and FIG. 83, the wires 212 are longer than the wires 211. The wires 211 and 212 are, for example, formed of gold (Au). The wires 211 and 212 have the same wire diameter as each other. The wire diameter of the wires 211 and 212 is finer than that of the wires 24A to 24F and, for example, equal to that of the wires 208A to 208Q. Here, the respective wire diameters of the wires 211 and 212, expressed as "the same as each other", may differ by within ±5% from each other.

To the end portion of the island portion 203 on the side of the first edge 33 in the first direction X, and on the side of the fourth edge 36 in the second direction Y, the wiring 205R is connected. The wiring 205R constitutes a ground pattern connected to the island portion 203, on which the primary-side circuit chip 160X and the transformer chip 190X are mounted. The first land portion 206*a* of the wiring 205R overlaps with the end portion of the island portion 203 on the side of the first edge 33, as viewed in the second direction Y. The connection wiring 206*c* of the wiring 205R extends along the second direction Y.

The wirings 205I to 205Q are aligned in the order of wiring 205I, wiring 205J, wiring 205K, wiring 205L, wiring 205M, wiring 205N, wiring 205O, wiring 205P, and wiring 205Q, from the side of the second edge 34 of the substrate 30, toward the first edge 33. The wiring 205I constitutes a first signal pattern that transmits the control signal for the semiconductor chip 41X to the primary-side circuit chip 160X. The wiring 205J constitutes the first signal pattern that transmits the control signal for the semiconductor chip 42X to the primary-side circuit chip 160X. The wiring 205K constitutes the first signal pattern that transmits the control signal for the semiconductor chip 43X to the primary-side circuit chip 160X. The wiring 205I, constitutes a second signal pattern that transmits the control signal for the semiconductor chip 44X to the primary-side circuit chip 160X. The wiring 205M constitutes the second signal pattern that transmits the control signal for the semiconductor chip 45X to the primary-side circuit chip 160X. The wiring 205N constitutes the second signal pattern that transmits the control signal for the semiconductor chip 46X to the primary-side circuit chip 160X. The wiring 205O constitutes a signal pattern connected to the primary-side circuit chip 160X. The wiring 205O constitutes the signal pattern that transmits a fault detection signal FO to the primary-side circuit chip 160X. The wiring 205P constitutes a signal pattern connected to the primary-side circuit chip 160X. The wiring 205P constitutes the signal pattern that transmits a temperature detection signal VOT to the primary-side circuit chip 160X. The wiring 205Q constitutes the power source pattern that supplies the source voltage VCC to the primary-side circuit chip 160X.

As shown in FIG. 80 and FIG. 82, the respective second land portions 206*b* of the wirings 205I and 205J are formed in the first cutaway portion 203*a* of the island portion 203. The second land portions 206*b* of the wirings 205I and 205J are formed so as to overlap with each other, as viewed in the second direction Y. The second land portions 206*b* of the wirings 205I and 205J are spaced apart from each other, in the second direction Y. The second land portions 206*b* of the wirings 205I and 205J have, for example, a rectangular shape in a plan view. The second land portions 206*b* of the wirings 205I and 205J each have the long sides extending along the second direction Y. The second land portion 206*b* of the wiring 205I is formed at a position corresponding to a portion of the primary-side circuit chip 160X on the side of the third edge 35 in the second direction Y. The second land portion 206*b* of the wiring 205J is formed on the side of the fourth edge 36 in the second direction Y, with respect to the primary-side circuit chip 160X. The second land portion 206*b* of the wiring 205J protrudes toward the fourth edge 36, from the edge of the island portion 203 on the side of the fourth edge 36.

The first land portion 206*a* of the wiring 205I is formed on the side of the second edge 34, and on the side of the fourth edge 36 of the substrate 30, with respect to the second land portion 206*b* of the wiring 205I. This first land portion 206*a* overlaps with the end portion of the semiconductor chip 44X on the side of the second edge 34, as viewed in the second direction Y (see FIG. 79). In other words, the first land portion 206*a* of the wiring 205I is formed on the side of the first edge 33, with respect to the edge of the lead frame 20B on the side of the second edge 34. The connection wiring 206*c* of the wiring 205I is formed so as to secure a space for forming the respective connection wirings 206*c* of the wirings 205J and 205K. The connection wiring 206*c* of the wiring 205I includes a first portion and a second portion, each of which will be described hereunder. The first portion extends along the second direction Y, from the first land portion 206*a* toward the third edge 35. The second portion extends along the first direction X, from the second land portion 206*b* toward the second edge 34. The second portion is connected to the first portion.

The first land portion 206*a* of the wiring 205J is formed on the side of the second edge 34, and on the side of the fourth edge 36 of the substrate 30, with respect to the second land portion 206*b* of the wiring 205J. This first land portion 206*a* overlaps with the end portion of the semiconductor chip 44X on the side of the second edge 34, as viewed in the second direction Y (see FIG. 79). The connection wiring 206*c* of the wiring 205J is formed so as to secure a space for forming the connection wiring 206*c* of the wiring 205K. The connection wiring 206*c* of the wiring 205J includes a first portion and a second portion, each of which will be described hereunder. The first portion extends along the second direction Y, from the first land portion 206*a* toward the third edge 35. The second portion extends along the first direction X, from the second land portion 206*b* toward the second edge 34. The second portion is connected to the first portion. The first portion of the wiring 205J is longer than the first portion of the wiring 205I. The second portion of the wiring 205J is shorter than the second portion of the wiring 205I.

The respective second land portions 206*b* of the wirings 205K to 205P are formed in a region of the substrate 30 between the island portion 203 and the fourth edge 36 of the substrate 30. The second land portions 206*b* of the wirings 205K to 205P are aligned in the first direction X, with a clearance between each other. These second land portions 206*b* have, for example, a rectangular shape in a plan view. The second land portions 206*b* of the wirings 205K to 205P each have the long sides extending along the first direction X.

The second land portion 206*b* of the wiring 205K is located so as to overlap with the end portion of the island portion 203 on the side of the second edge 34, as viewed in the second direction Y. This second land portion 206*b* is located so as to overlap with the end portion of the primary-side circuit chip 160X on the side of the second edge 34, as viewed in the second direction Y. The first land portion 206*a* of the wiring 205K is formed on the side of the second edge 34, and on the side of the fourth edge 36 of the substrate 30, with respect to the second land portion 206*b* of the wiring 205K. The first land portion 206*a* of the wiring 205K is formed on the side of the second edge 34, and on the side of the fourth edge 36 of the substrate 30, with respect to the second land portions 206*b* of the wirings 205I and 205J. The connection wiring 206*c* of the wiring 205K includes a first portion and a second portion, each of which will be described hereunder. The first portion extends along the second direction Y, from the first land portion 206*a* toward the third edge 35. The second portion extends along the first direction X, from the second land portion 206*b* toward the second edge 34. The second portion is connected to the first portion. The first portion of the wiring 205K is shorter than the first portion of the wiring 205J.

The first land portion 206*a* of the wiring 205L is located on the side of the second edge 34, and on the side of the fourth edge 36 of the substrate 30, with respect to the second land portion 206*b* of the wiring 205L. The first land portion 206*a* of the wiring 205L is located on the side of the second edge 34, and on the side of the fourth edge 36 of the substrate 30, with respect to the second land portion 206*b* of the wiring 205K. The connection wiring 206*c* of the wiring 205L includes a first portion, a second portion, a third portion, and a fourth portion, each of which will be described hereunder. The first portion extends from the first land portion 206*a* toward the third edge 35. The second portion extends from the second land portion 206*b* toward the fourth edge 36. The third portion extends from the first portion along the first direction X. The fourth portion is connecting the second portion and the third portion. The fourth portion extends obliquely, so as to be closer to the first edge 33, toward the third edge 35 of the substrate 30.

The first land portion 206*a* of the wiring 205M is located on the side of the second edge 34, and on the side of the fourth edge 36 of the substrate 30, with respect to the second land portion 206*b* of the wiring 205M. The first land portion 206*a* of the wiring 205M is located so as to overlap with the respective second land portions 206*b* of the wirings 205K and 205L, as viewed in the second direction Y. The connection wiring 206*c* of the wiring 205M includes a first portion, a second portion, a third portion, and a fourth portion, each of which will be described hereunder. The first portion extends from the first land portion 206*a* toward the third edge 35. The second portion extends from the second land portion 206*b* toward the fourth edge 36. The third portion extends from the first portion along the first direction X. The fourth portion is connecting the second portion and the third portion. The fourth portion extends obliquely, so as to be closer to the first edge 33, toward the third edge 35 of the substrate 30.

The first land portion 206*a* of the wiring 205N is located on the side of the second edge 34, and on the side of the fourth edge 36 of the substrate 30, with respect to the second land portion 206*b* of the wiring 205N. The first land portion 206*a* of the wiring 205N is located so as to overlap with the second land portion 206*b* of the wiring 205M, as viewed in the second direction Y. The connection wiring 206*c* of the wiring 205N includes a first portion, a second portion, and a third portion, each of which will be described hereunder. The first portion extends along the second direction Y, from the first land portion 206*a* toward the third edge 35. The second portion extends along the second direction Y, from the second land portion 206*b* toward the fourth edge 36. The third portion is connecting the first portion and the second portion. The third portion extends obliquely, so as to be closer to the fourth edge 36, toward the second edge 34 of the substrate 30.

The first land portion 206*a* of the wiring 205O is formed so as to overlap with the respective second land portions 206*b* of the wirings 205O and 205N, as viewed in the second direction Y. The connection wiring 206*c* of the wiring 205O extends along the second direction Y.

The first land portion 206*a* of the wiring 205P is formed so as to overlap with the second land portion 206*b* of the wiring 205P, as viewed in the second direction Y. The connection wiring 206*c* of the wiring 205P extends along the second direction Y.

The second land portion 206*b* of the wiring 205Q is formed in the second cutaway portion 203*b* of the island portion 203. This second land portion 206*b* has, for example, a quadrate (square) shape in a plan view. The second land portion 206*b* of the wiring 205Q is larger in area than the respective second land portions 206*b* of the wirings 205I to 205P. The second land portion 206*b* of the wiring 205Q is formed on the side of the first edge 33, with respect to the transformer chip 190X.

The control chip 48 is electrically connected to the semiconductor chips 44X to 46X, the wirings 205S to 205U, and the intermediary wirings 207A to 207C, via wires 209A to 209I exemplifying the first connection material. The wires 209A to 209I are connected to a face of the control chip 48 opposite to the face via which the control chip 48 is mounted on the island portion 202, in the third direction Z. The wires 209A to 209I are, for example, formed of gold (Au). The wires 209A to 209I have the same wire diameter as each other. The wires 209A to 209I have the same wire diameter as the wires 208A to 208Q. Here, the wire diameter of the wires 209A to 209I, expressed as "the same as each other", may differ by within ±5% between each other. In addition, the wire diameter and the material of the wire 209A to 209I may be modified as desired.

The second electrodes GP of the semiconductor chips 41X to 43X are connected to the control chip 48, via the wires 209A to 209C, respectively. The wire 209A is connected to the end portion of the control chip 48 on the side of the second edge 34, in the first direction X. The wire 209A is connected to the end portion of the control chip 48 on the side of the third edge 35, in the second direction Y. The wire 209B is connected to the end portion of the control chip 48 on the side of the third edge 35, in the second direction Y. The wire 209B is connected to a position on the control chip 48 on the side of the second edge 34 in the first direction X, with respect to the center of the control chip 48 in the first direction X. The wire 209C is connected to the end portion of the control chip 48 on the side of the first edge 33 of the substrate 30, in the first direction X. The wire 209C is connected to the end portion of the control chip 48 on the side of the third edge 35, in the second direction Y.

A first end portion of the wire 209D is connected to the second land portion 206*b* of the wiring 205S. A second end portion of the wire 209D is connected to the end portion of the control chip 48 on the side of the first edge 33 in the first direction X. The second end portion of the wire 209D is connected to a position on the control chip 48 on the side of the fourth edge 36 in the second direction Y, with respect to the center of the control chip 48 in the second direction Y. Respective first end portions of two wires 209E are connected to the second land portion 206*b* of the wiring 205T. Respective second end portions of the two wires 209E are connected to the end portion of the control chip 48 on the side of the first edge 33, in the first direction X. The second end portions of the two wires 209E are each connected to a position on the control chip 48 between the second end portion of the wire 209D and second end portions of two wires 209F, in the second direction Y. Respective first end portions of the two wires 209F are connected to the end portion of the control chip 48 on the side of the first edge 33, in the first direction X. The first end portions of the two wires 209F are connected to the end portion of the island portion 202 on the side of the third edge 35, in the second direction Y. The second end portions of the two wires 209F are connected to the end portion of the control chip 48 on the side of the first edge 33, in the first direction X. Further, the second end portions of the two wires 209F are connected to the end portion of the control chip 48 on the side of the third edge 35, in the second direction Y.

The control chip 48 is connected to the intermediary wirings 207A to 207C, via the wires 209G to 209I. A first end portion of the wire 209G is connected to the first land portion 207*a* of the intermediary wiring 207A. A second end portion of the wire 209G is connected to the end portion of the control chip 48 on the side of the second edge 34, in the first direction X. The second end portion of the wire 209G is connected to a position on the control chip 48 on the side of the third edge 35 in the second direction Y, with respect to the center of the control chip 48 in the second direction Y. A first end portion of the wire 209H is connected to the first land portion 207*a* of the intermediary wiring 207E. A second end portion of the wire 209H is connected to a position on the control chip 48 adjacent to the second end portion of the wire 209G, in the second direction Y. A first end portion of the wire 209I is connected to the first land portion 207*a* of the intermediary wiring 207C. A second end portion of the wire 209I is connected to a position on the control chip 48 adjacent to the second end portion of the wire 209H, in the second direction Y.

As shown in FIG. 82, the primary-side circuit chip 160X is connected to the second land portions 206*b* of the wirings 205I to 205Q, and the island portion 203, respectively via wires 210A to 210J exemplifying the first connection material. The wires 210A to 210J are connected to a face of the primary-side circuit chip 160X opposite to the face via which the primary-side circuit chip 160X is mounted on the island portion 203 in the third direction Z.

A first end portion of the wire 210A is connected to the second land portion 206*b* of the wiring 205I. A second end portion of the wire 210A is connected to the end portion of the primary-side circuit chip 160X, on the side of the second edge 34 in the first direction X. The second end portion of the wire 210A is connected to a position on the side of the fourth edge 36 in the second direction Y, with respect to the center of the primary-side circuit chip 160X in the second direction Y. A first end portion of the wire 210B is connected to the second land portion 206*b* of the wiring 205J. A second end portion of the wire 210B is connected to the end portion of the primary-side circuit chip 160X, on the side of the fourth edge 36 in the second direction Y. The second end portion of the wire 210B is connected to a position on the primary-side circuit chip 160X on the side of the second edge 34 in the first direction X, with respect to the center of the primary-side circuit chip 160X in the first direction X. A first end portion of the wire 210C is connected to the second land portion 206*b* of the wiring 205K. A second end portion of the wire 210C is connected to the end portion of the primary-side circuit chip 160X, on the side of the fourth edge 36 in the second direction Y. The second end portion of the wire 210C is connected to a position on the primary-side circuit chip 160X on the side of the second edge 34 in the first direction X, with respect to the center of the primary-side circuit chip 160X in the first direction X. A first end portion of the wire 210D is connected to the second land portion 206*b* of the wiring 205L. A second end portion of the wire 210D is connected to the end portion of the primary-side circuit chip 160X, on the side of the fourth edge 36 in the second direction Y. The second end portion of the wire 210D is connected to a position on the primary-side circuit chip 160X between the second end portion of the wire 210C and the center of the primary-side circuit chip 160X in the first direction X. A first end portion of the wire 210E is connected to the second land portion 206*b* of the wiring 205M. A second end portion of the wire 210E is connected to the end portion of the primary-side circuit chip 160X, on the side of the fourth edge 36 in the second direction Y. The second end portion of the wire 210B is connected to a position on the primary-side circuit chip 160X on the side of the first edge 33, with respect to the center of the primary-side circuit chip 160X in the first direction X. A first end portion of the wire 210F is connected to the second land portion 206*b* of the wiring 205N. A second end portion of the wire 210F is connected to the end portion of the primary-side circuit chip 160X, on the side of the fourth edge 36 of the substrate 30 in the second direction Y. The second end portion of the wire 210F is connected to a position on the primary-side circuit chip 160X on the side of the first edge 33 in the first direction X, with respect to the second end portion of the wire 210E. A first end portion of the wire 210G is connected to the second land portion 206*b* of the wiring 205O. A second end portion of the wire 210G is connected to the end portion of the primary-side circuit chip 160X, on the side of the fourth edge 36 in the second direction Y. The second end portion of the wire 210G is connected to a position on the primary-side circuit chip 160X on the side of the first edge 33 in the first direction X, with respect to the second end portion of the wire 210F. A first end portion of the wire 210H is connected to the second land portion 206*b* of the wiring 205P. A second end portion of the wire 210H is connected to the end portion of the primary-side circuit chip 160X, on the side of the fourth edge 36 in the second direction Y. The second end portion of the wire 210G is connected to a position on the primary-side circuit chip 160X on the side of the first edge 33 in the first direction X, with respect to the second end portion of the wire 210G. Respective first end portions of the two wires 210I are connected to the second land portion 206*b* of the wiring 205Q. Respective second end portions of the two wires 210I are connected to the end portion of the primary-side circuit chip 160X, on the side of the first edge 33 in the first direction X. The second end portions of the two wires 210I are connected to the center of the primary-side circuit chip 160X in the second direction Y. Respective first end portions of the two wires 210J are connected to positions on the island portion 203 on the side of the third edge 35, with respect to the second cutaway portion 203*b*. Respective second end portions of the two wires 210J are connected to the end portion of the primary-side circuit chip 160X, on the side of the first edge 33 in the first direction X. The second end portions of the two wires 210J are connected to the end portion of the primary-side circuit chip 160X, on the side of the third edge 35 in the second direction Y. As described above, the primary-side circuit chip 160X, the transformer chip 190X, and the control chip 48 are electrically connected to each other via the wire s210A to 210F, the plurality of wires 211, and the plurality of wires 212. Therefore, the primary-side circuit chip 160X can output control signals for controlling the operation of the semiconductor chips 41X to 46X, to the control chip 48 through the transformer chip 190X.

Figure 83:
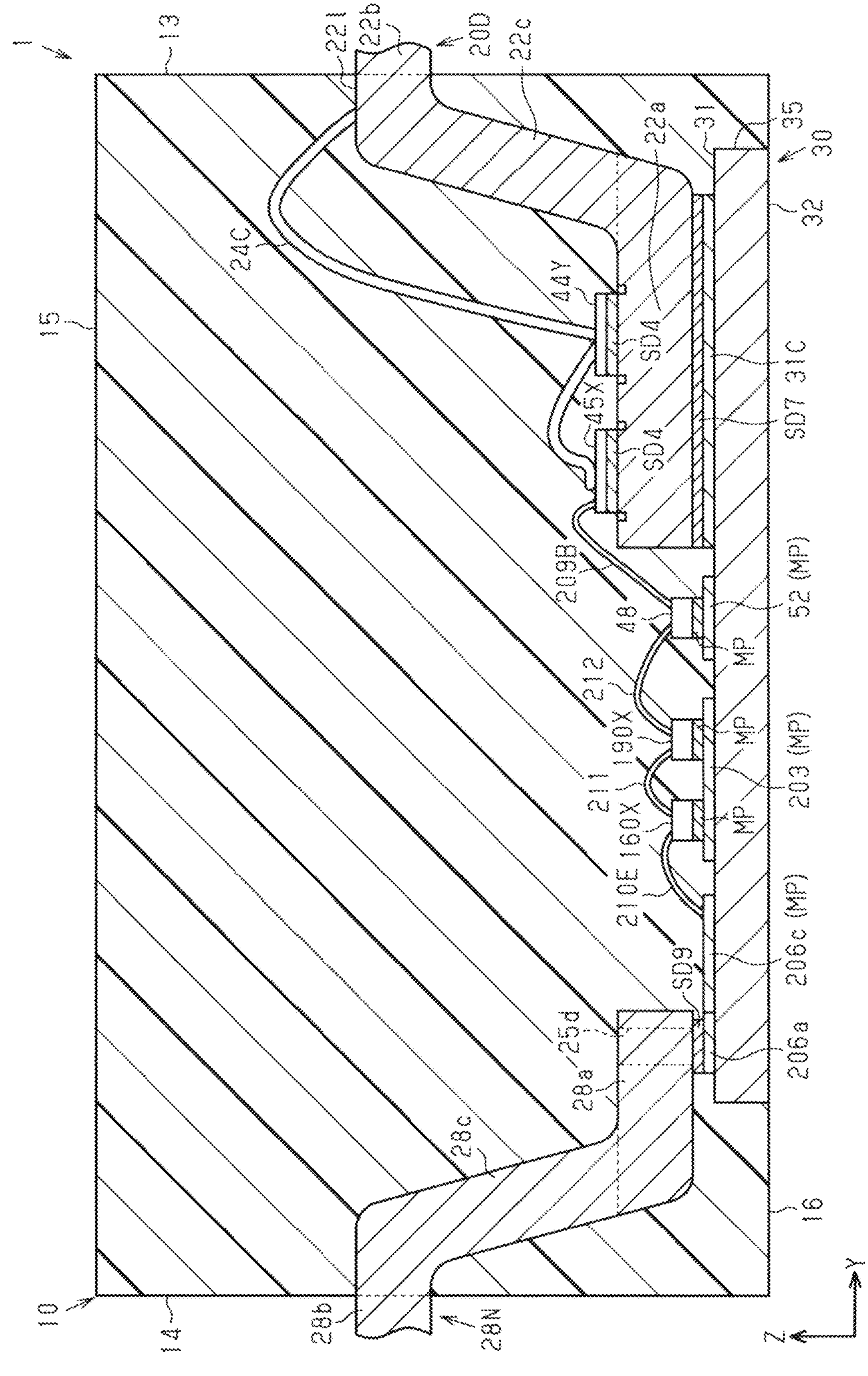
FIG. 83 is a schematic cross-sectional view of the semiconductor package.

FIG. 83 schematically illustrates an example of the cross-sectional structure of the semiconductor package 1. In FIG. 83, the sizes of the respective elements of the semiconductor package 1, and the positional relation among the elements, may not always accurately accord with those of the semiconductor package 1 shown in FIGS. 79 to 82.

As shown in FIG. 83, the control chip 48, the primary-side circuit chip 160X, and the transformer chip 190X are not mounted on the lead frame 20, but on the wiring pattern 200 formed on the substrate 30. Accordingly, the control chip 48, the primary-side circuit chip 160X, and the transformer chip 190X are located on the side of the first main surface 31 of the substrate 30 in the third direction Z, with respect to the semiconductor chips 41X to 46X (semiconductor chip 45X in FIG. 83) mounted on the lead frame 20. Therefore, out of the wires 209A to 209I connected to the control chip 48, the wires 209A to 209C respectively connected to the semiconductor chips 44X to 46X are longer than the other wires 209D to 209I. In addition, the wires 209A to 209C are longer than the wires 211 and 212, respectively connected to the primary-side circuit chip 160X and the transformer chip 190X.

Although not shown, the control chip 47 is also located on the side of the first main surface 31 of the substrate 30 in the third direction Z, with respect to the semiconductor chips 41X to 46X. Therefore, out of the wires 208A to 208Q connected to the control chip 47, the wires 208A to 208C respectively connected to the semiconductor chips 41X to 43X are longer than the other wires 208D to 208Q,

[Configuration of Transformer]

The configuration of the transformer chip 190X is, for example, similar to that of the transmission circuit chip 4I shown in FIG. 51 to FIG. 57.

Advantageous Effects

This embodiment provides the following advantageous effects, in addition to those provided by the first embodiment.

(8-1) The semiconductor package 1 includes the transformer 190. Therefore, a noise or a surge voltage of the primary-side circuit 160 can be prevented from being transmitted to the secondary-side circuit 170, when a signal of the primary-side circuit 160 is transmitted to the secondary-side circuit 170.

(8-2) The first cutaway portion 203*a* is formed in the island portion 203. Accordingly, the distance between the primary-side circuit chip 160X and the respective second land portions 206*b* of the wirings 205I and 205J is shortened. Therefore, the wires 210A and 210B connecting the primary-side circuit chip 160X and the wirings 205I and 205J can be shortened. In addition, the second cutaway portion 203*b* is formed in the island portion 203. Accordingly, the distance between the primary-side circuit chip 160X and the second land portion 206*b* of the wiring 205Q is shortened. Therefore, the wire 210I connecting the primary-side circuit chip 160X and the wiring 205Q can be shortened.

(8-3) The end portion of the wire 212, connecting the transformer chip 190X and the control chip 48, on the side of the control chip 48 is connected to the end portion of the control chip 48 on the side of the fourth edge 36. Therefore, the wire 212 can be shortened.

(8-4) The primary-side circuit chip 160X, the transformer chip 190X, and the control chip 48 are mounted on the island portion 203 and the island portion 202, formed of the conductive material MP. Accordingly, the respective positions of the primary-side circuit chip 160X, the transformer chip 190X, and the control chip 48 in the third direction Z are barely different from each other, which enables the wires 211 and 212 to be shortened.

(8-5) The respective second land portions 206*b* of the wirings 205E and 205G have the long sides extending along the second direction Y. Accordingly, the distance between the second land portion 206*b* of the wiring 205D and the second land portion 206*b* of the wiring 205F in the first direction X, and the distance between the second land portion 206*b* of the wiring 205F and the second land portion 206*b* of the wiring 205H are both shortened. Therefore, the distance between the diode 49U mounted on the second land portion 206*b* of the wiring 205D and the control chip 47 is shortened, and also the distance between the diode 49W mounted on the second land portion 206*b* of the wiring 205H and the control chip 47 is shortened. As result, the wire 208D connecting the control chip 47 and the diode 49U, and the wire 208F connecting the control chip 47 and the diode 49W can both be shortened.

(8-6) The respective second land portions 206*b* of the wirings 205B and 205C have the long sides extending along the first direction X. These second land portions 206*b* are aligned in the second direction Y, with a clearance therebetween. The mentioned configuration prevents the second land portions 206*b* of the wirings 205B and 205C from forcing the second land portion 206*b* of the wiring 205D to be formed away from the island portion 201 in the second direction Y. Therefore, the distance between the diode 49U mounted on the second land portion 206*b* of the wiring 205D and the control chip 47 is prevented from being extended, and consequently the wire 208D connecting the diode 49U and the control chip 47 can be prevented from being extended.

In this embodiment, in particular, the clearance between the second land portion 206*b* of the wiring 2053 and the second land portion 206*b* of the wiring 205C in the second direction Y is made narrow, so that the second land portion 206*b* of the wiring 205C is prevented from protruding toward the fourth edge 36, from the edge of the island portion 201 on the side of the fourth edge 36. Such a configuration further suppresses an increase in length of the wire 208D.

(8-7) The respective bonding portions 28*a* of the lead frames 28A to 28C are aligned in the second direction Y, with a clearance between each other. In addition, the bonding portions 28*a* of the lead frames 28A to 28C each overlap with the lead frame 20D, as viewed in the second direction Y. Such an arrangement enables the number of terminals sticking out from the fourth face 14 of the first resin 10 to be increased, without incurring an increase in size of the substrate 30 in the first direction X.

(8-8) The respective bonding portions 28*a* of the lead frames 28A to 28C have the long sides extending along the first direction X. Accordingly, the clearance between the lead frame 28B and the lead frame 28A, as well as the clearance between the lead frame 28B and the lead frame 28C, can be narrowed. Consequently, the lead frames 28A to 28C can be easily connected to the first region 30B of the substrate 30.

(8-9) The lead frames 28I to 28R constituting the terminals of the primary-side circuit 160 are located in the range between the end portion of the lead frame 20B on the side of the second edge 34 and the end portion of the lead frame 20D on the side of the first edge 33. The mentioned arrangement makes the space for locating the terminals of the primary-side circuit 160 smaller in the first direction X, thereby contributing to reducing the size of the substrate 30 in the first direction X. Consequently, the size of the semiconductor package 1 in the first direction X can be reduced.

In this embodiment, in particular, the lead framed 28I to 28R are located in the range between the end portion of the semiconductor chip 44X on the side of the second edge 34 and the end portion of the semiconductor chip 46X on the side of the first edge 33. Such an arrangement enables the space for locating the terminals of the primary-side circuit 160 to be further reduced in the first direction X, thereby enabling further reduction in size of the semiconductor package 1 in the first direction X.

(8-10) The wiring pattern 200 includes the intermediary wirings 207A to 207C. Accordingly, the control signal for the semiconductor chips 41X to 46X can be transmitted to the control chip 47, through the control chip 48 and the intermediary wirings 207A to 207C. The primary-side circuit chip 160X and the transformer chip 190X can thus be shared by the control chips 47 and 48, and therefore the number of parts of the semiconductor package 1 can be reduced.

Variations of Eighth Embodiment

Figure 84:
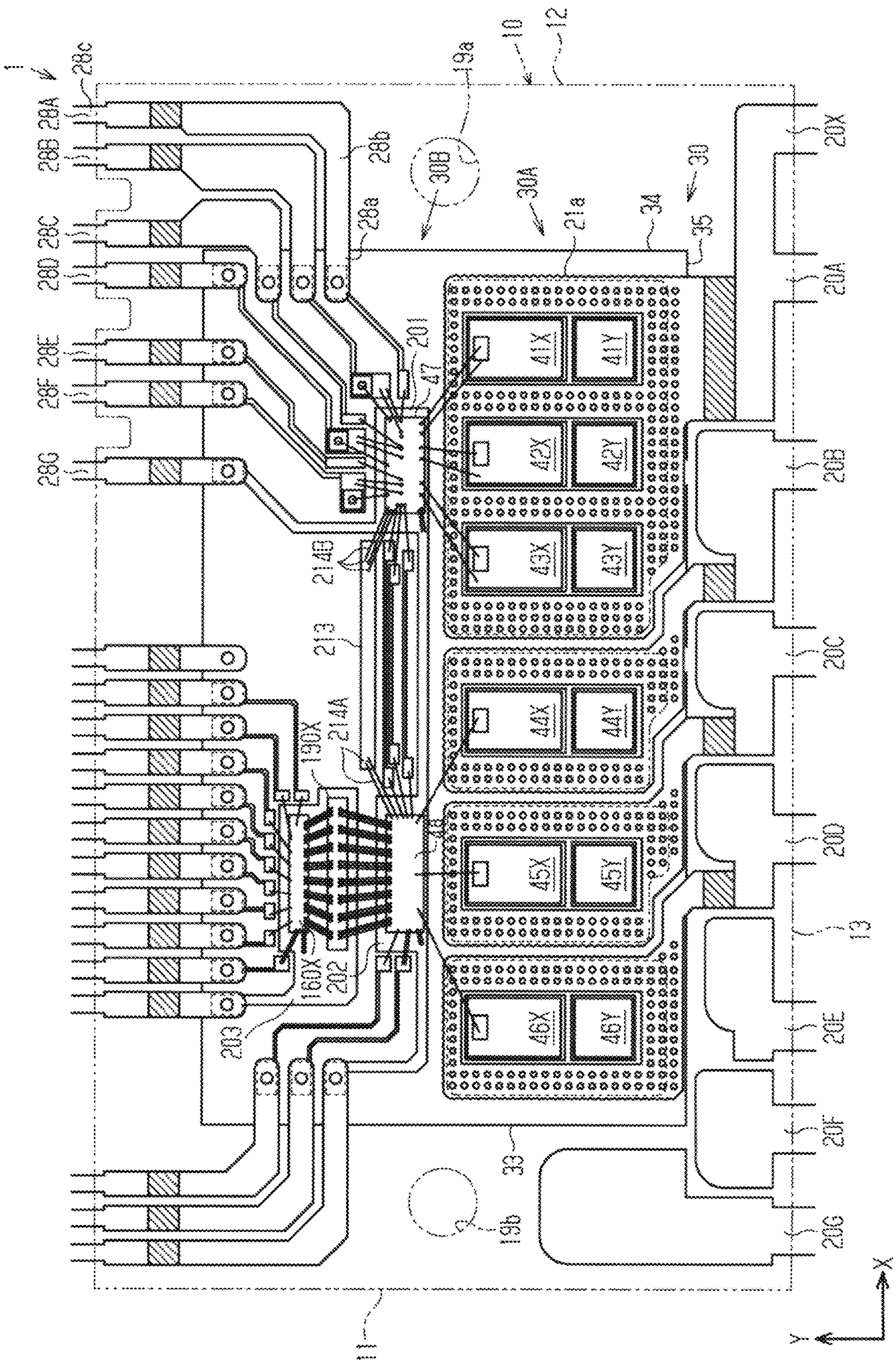
FIG. 84 is a plan view showing an internal configuration of a variation of the semiconductor package according to the eighth embodiment.

The semiconductor package 1 according to the eighth embodiment may be without the arrangement to supply the source voltage VCC to the control chip 47, and be configured to supply the source voltage VCC to the control chip 47 through the control chip 48. For example, as shown in FIG. 84, the wiring pattern 200 may include an intermediary wiring 213, which exemplifies a second intermediary wiring that relays the source voltage VCC between the control chip 48 and the control chip 47. Here, the wires 24A to 24F are not shown in FIG. 84, for the sake of clarity.

First Variation of Eighth Embodiment

Figure 85:
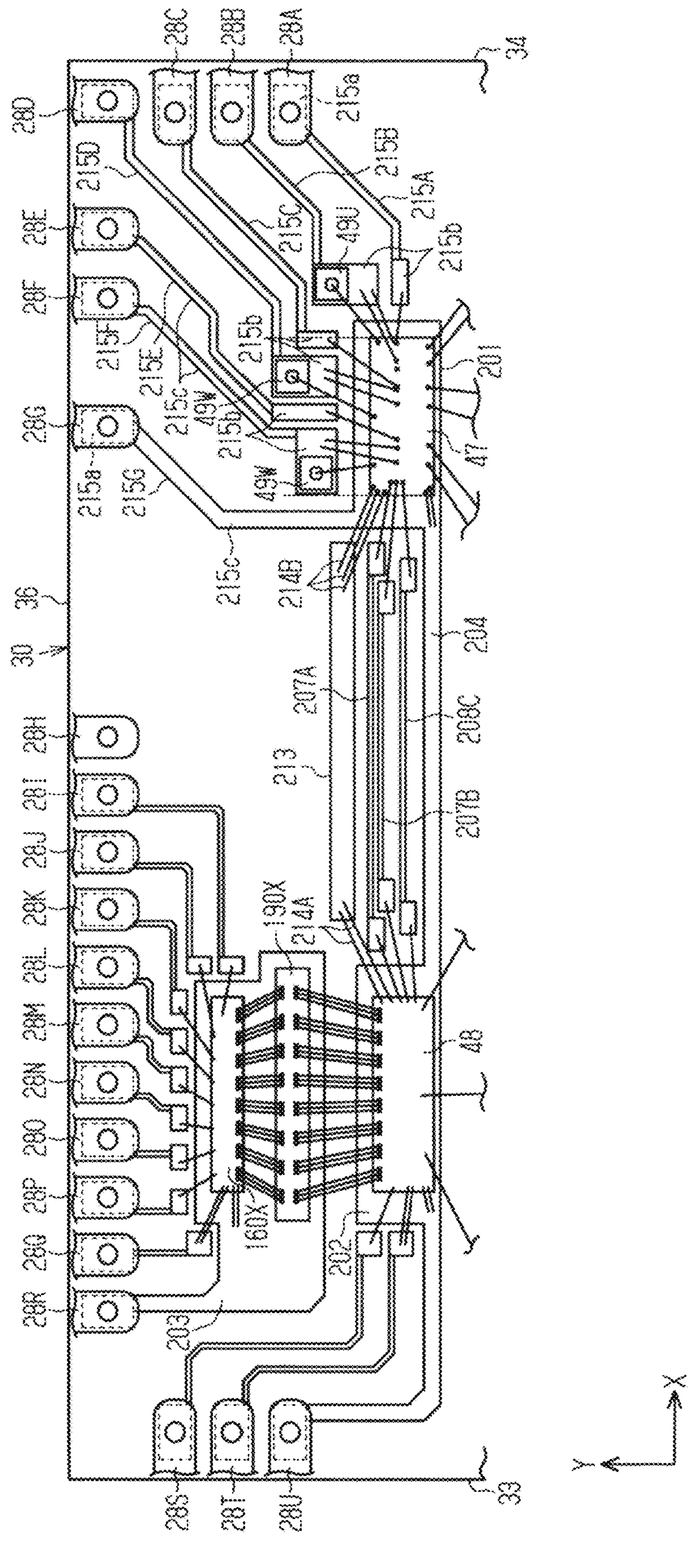
FIG. 85 is an enlarged view of a control wiring region in FIG. 84.

As shown in FIG. 85, the intermediary wiring 213 is formed so as to overlap with the intermediary wirings 207A to 207C, as viewed in the second direction Y. In other words, the intermediary wiring 213 is located adjacent to the intermediary wirings 207A to 207C, in the second direction Y. The intermediary wiring 213 is formed on the side of the fourth edge 36, with respect to the intermediary wirings 207A to 207C. The intermediary wiring 213 is located on the side of the fourth edge 36 in the second direction Y, with respect to the control chips 47 and 48. In an example, the intermediary wiring 213 is located on the side of the fourth edge 36 in the second direction Y, with respect to the island portions 201 and 202. In the case where, for example, the island portions 201 and 202 are given a larger size in the second direction Y, and therefore the control chips 47 and 48 are shifted toward the fourth edge 36 from the positions shown in FIG. 85, the intermediary wiring 213 may overlap with the control chips 47 and 48, as viewed in the second direction Y.

The intermediary wiring 213 is thicker than the intermediary wirings 207A to 207C, and the connection wiring 204. The intermediary wiring 213 is located closer to the island portion 201 in the first direction X, than to the island portion 202. In other words, the distance in the first direction X between the intermediary wiring 213 and the island portion 201 is shorter than the distance in the first direction X between the intermediary wiring 213 and the island portion 202.

The positional relation between the intermediary wiring 213 and the intermediary wirings 207A to 207C along the second direction Y may be modified as desired. In an example, the intermediary wiring 213 may be located on the side of the connection wiring 204 in the second direction Y, with respect to the intermediary wirings 207A to 207C. The intermediary wiring 213 may be located on the side of the third edge 35, with respect to the connection wiring 204. The position of the intermediary wiring 213 in the second direction Y may be modified as desired. In an example, the intermediary wiring 213 may be located so as to overlap with the island portion 203, as viewed in the second direction Y. Alternatively, the intermediary wiring 213 may be located so as to overlap with the diode 49W, as viewed in the second direction Y.

Referring further to FIG. 85, the respective shapes of the intermediary wirings 207A to 207C are different from those of the intermediary wirings 207A to 207C of the semiconductor package 1 according to the eighth embodiment. More specifically, the respective connection wirings 207*c* of the intermediary wirings 207A to 207C are connected to the end portions of the first land portion 207*a* and the second land portion 207*b* on the side of the fourth edge 36 in the second direction Y. In addition, the respective lengths of the intermediary wirings 207A to 207C in the first direction X are different from each other. The intermediary wiring 207A is the longest in the first direction X, and the intermediary wiring 207B is the shortest in the first direction X. As shown in FIG. 85, the intermediary wiring 207B is shorter than the distance in the first direction X between the first land portion 207*a* and the second land portion 207*b* of the intermediary wiring 207A. Accordingly, the intermediary wiring 207B is formed close to the intermediary wiring 207A. In other words, the intermediary wirings 207A and 207B are arranged such that the land portions 207*a* and 207*b* of the intermediary wiring 207B respectively overlap with the land portions 207*a* and 207*b* of the intermediary wiring 207A, as viewed in the first direction X (direction in which the control chips 47 and 48 are aligned). In the intermediary wirings 207A to 207C shown in FIG. 85, the edge of the intermediary wiring 207A on the side of the fourth edge 36 is located so as to overlap with the edge of the control chip 47 on the side of the fourth edge 36, as viewed in the first direction X.

The intermediary wiring 213 is connected to the control chip 48 via wires 214A. The intermediary wiring 213 is also connected to the control chip 47 via wires 2148. For example as shown in FIG. 85, the intermediary wiring 213 and the control chip 48 are connected via two wires 214A. Respective first end portions of the wires 214A are connected to the end portion of the control chip 48, on the side of the second edge 34 in the first direction X. The first end portions of the wires 214A are connected to the end portion of the control chip 48, on the side of the fourth edge 36 in the second direction Y. Respective second end portions of the wires 214A are connected to the end portion of the intermediary wiring 213, on the side of the first edge 33. The intermediary wiring 213 and the control chip 47 are connected via three wires 214B. Respective first end portions of the three wires 214B are connected to the end portion of the control chip 47, on the side of the first edge 33 in the first direction X. The first end portions of the three wires 214B are connected to the end portion of the control chip 47, on the side of the fourth edge 36 in the second direction Y. Respective second end portions of the three wires 214B are connected to the end portion of the intermediary wiring 213, on the side of the second edge 34. The wires 214A and 214B may be formed, for example, of the same material as the wires 208A to 208Q.

The mentioned configuration allows the frame for supplying the source voltage VCC to the control chip 47 to be omitted, thereby contributing to reducing the size of the semiconductor package 1. In addition, locating the intermediary wirings 207A and 207B close to each other enables the intermediary wiring 213 to be located close to the control chips 47 and 48, in the second direction Y. Therefore, the wires 214A and 214B can be shortened.

In the variation of the semiconductor package 1 shown in FIG. 84 and FIG. 85, the wiring pattern 200 around the island portion 201 (control chip 47) is modified. More specifically, while the lead frames 28A to 28H are provided for connection to the control chip 47 in the eighth embodiment, the lead frames 28A to 28G are used for connection to the control chip 47, in the variation. Thus, the number of lead frames in the variation is one fewer than that of the eighth embodiment.

In the variation, the lead frame 28A constitutes the VSU terminal. The lead frame 28B constitutes the VBU terminal. The lead frame 28C constitutes the VSV terminal. The lead frame 28D constitutes the VBV terminal. The lead frame 28E constitutes the VSW terminal. The lead frame 28F constitutes the VBW terminal. The lead frame 28G constitutes the first GND terminal. The positioning arrangement of the lead frames 28A to 28G is the same as that of the lead frame 28A to 28G according to the eighth embodiment. Because of the change in location of the terminals from that of the eighth embodiment, control the shape of the wiring pattern 200 connected to the chip 47 is changed.

In the variation, the wiring pattern 200 includes wirings 215A to 215G. The wirings 215A and 215B each constitute a boot strap circuit including the diode 49U. The wirings 215C and 215D each constitute a boot strap circuit including the diode 49V. The wirings 215E and 215F each constitute a boot strap circuit including the diode 49W. The wiring 215G is connected to the island portion 201. Accordingly, the wiring 215G constitutes a first ground pattern, in collaboration with the island portion 201. The wirings 215A to 215F each include a first land portion 215*a*, a second land portion 215*b*, and a connection wiring 215*c*. The connection wiring 215*c* is connecting the first land portion 215*a* and the second land portion 215*b*. The wiring 215G includes the first land portion 215*a* and the connection wiring 215*c*.

The first land portion 215*a* of the wiring 215A connected to the lead frame 28A, the first land portion 215*a* of the wiring 215B connected to the lead frame 28B, and the first land portion 215*a* of the wiring 215C connected to the lead frame 28C each have, for example, a rectangular shape in a plan view. In an example, these first land portions 215*a* each have the long sides extending along the first direction X. The first land portion 215*a* of the wiring 215D connected to the lead frame 28D, the first land portion 215*a* of the wiring 215E connected to the lead frame 28E, the first land portion 215*a* of the wiring 215F connected to the lead frame 28F, and the first land portion 215*a* of the wiring 215G connected to the lead frame 28G each have, for example, a rectangular shape in a plan view. In an example, these first land portions 215*a* each have the long sides extending along the second direction Y.

The wirings 215A and 215B are formed on a region of the substrate 30 between the second edge 34 and the island portion 201, in the first direction X. The wirings 215D to 215G are formed on a region of the substrate 30 between the fourth edge 36 and the island portion 201, in the second direction Y. The respective second land portions 215*b* of the wirings 215A and 215B are aligned in the second direction Y, with a clearance therebetween. The respective second land portions 215*b* of the wirings 215C to 2015F are aligned in the first direction X, with a clearance between each other.

The second land portion 215*b* of the wiring 215A is formed adjacent to the island portion 201 on the side of the second edge 34, with a clearance therefrom. The second land portion 215*b* of the wiring 215A has, for example, a rectangular shape in a plan view. In an example, the second land portion 215*b* of the wiring 215A has the long sides extending along the first direction X. The second land portion 215*b* of the wiring 215A is located at a position corresponding to the center of the island portion 201 in the second direction Y. The first land portion 215*a* of the wiring 215A is formed on the side of the second edge 34 of the substrate 30, and on the fourth edge 36, with respect to the second land portion 215*b* of the wiring 215A. The connection wiring 215*c* of the wiring 215A includes a first portion and a second portion, each of which will be described hereunder. The first portion extends along the first direction X, from the second land portion 215*b* toward the second edge 34. The second portion extends obliquely from the first portion toward the first land portion 215*a*. The second portion is connected to the first land portion 215*a*.

The second land portion 215*b* of the wiring 215B is formed adjacent to the island portion 201 on the side of the second edge 34, with a clearance therefrom. The second land portion 215*b* of the wiring 215B is located on the side of the fourth edge 36, with respect to the second land portion 215*b* of the wiring 215A. The second land portion 215*b* of the wiring 215B has, for example, a rectangular shape in a plan view. In an example, the second land portion 215*b* of the wiring 215B has the long sides extending along the second direction Y. The second land portion 215*b* of the wiring 215B extends beyond a position corresponding to the edge of the island portion 201 on the side of the fourth edge 36. In other words, the second land portion 215*b* of the wiring 215B extends further toward the fourth edge 36 in the second direction Y, with respect to the island portion 201. The first land portion 215*a* of the wiring 215B is formed on the side of the second edge 34 of the substrate 30, and on the fourth edge 36, with respect to the second land portion 215*b* of the wiring 215B. The connection wiring 215*c* of the wiring 215B includes a first portion and a second portion, each of which will be described hereunder. The first portion extends along the first direction X, from the end portion of the second land portion 215*b* on the side of the fourth edge 36, toward the second edge 34. The second portion extends obliquely from the first portion toward the first land portion 215*a*. The second portion is connected to the first land portion 215*a*.

On the second land portion 215*b* of the wiring 215B, the diode 49U is mounted via the conductive material MP. The diode 49U is mounted on a region of the second land portion 215*b* on the side of the fourth edge 36. Here, the position of the diode 49U with respect to the second land portion 215*b* may be modified as desired.

The second land portion 215*b* of the wiring 215C is formed adjacent to the island portion 201 on the side of the fourth edge 36 in the second direction Y, with a clearance therefrom. This second land portion 215*b* overlaps with the end portion of the control chip 47 on the side of the second edge 34, as viewed in the second direction Y. The second land portion 215*b* of the wiring 215C has, for example, a rectangular shape in a plan view. In an example, the second land portion 215*b* of the wiring 215C has the long sides extending along the second direction Y. The first land portion 215*a* of the wiring 215C is formed on the side of the second edge 34 of the substrate 30, and on the fourth edge 36, with respect to the second land portion 215*b* of the wiring 215C. The connection wiring 215*c* of the wiring 215C includes a first portion, a second portion, and a third portion, each of which will be described hereunder. The first portion extends along the first direction X, from the first land portion 215*a* toward the first edge 33. The second portion extends along the second direction Y, from the end portion of the second land portion 215*b* on the side of the fourth edge 36, toward the second edge 34. The third portion is connecting the first portion and the second portion. The third portion extends obliquely so as to be closer to the fourth edge 36, toward the second edge 34 of the substrate 30.

The second land portion 215*b* of the wiring 215D is formed adjacent to the second land portion 215*b* of the wiring 215C, on the side of the first edge 33. This second land portion 215*b* has, for example, a rectangular shape in a plan view. In an example, the second land portion 215*b* of the wiring 215D has the long sides extending along the second direction Y. The first land portion 215*a* of the wiring 215D is formed on the side of the second edge 34 of the substrate 30, and on the fourth edge 36, with respect to the second land portion 215*b* of the wiring 215D. The connection wiring 215*c* of the wiring 215D includes a first portion, a second portion, and a third portion, each of which will be described hereunder. The first portion extends along the first direction X, from the end portion of the second land portion 215*b* on the side of the fourth edge 36, toward the second edge 34. The second portion extends along the first direction X, from the first land portion 215*a* toward the first edge 33. The third portion is connecting the first portion and the second portion. The third portion extends obliquely so as to be closer to the fourth edge 36, toward the second edge 34 of the substrate 30.

On the second land portion 215*b* of the wiring 215D, the diode 49V is mounted via the conductive material MP. The diode 49V is mounted on a region of the second land portion 215*b* on the side of the fourth edge 36. Here, the position of the diode 49V with respect to the second land portion 215*b* may be modified as desired.

The second land portion 215*b* of the wiring 215E is formed adjacent to the second land portion 215*b* of the wiring 215D, on the side of the first edge 33. This second land portion 215*b* has, for example, a rectangular shape in a plan view. In an example, the second land portion 215*b* of the wiring 215E has the long sides extending along the second direction Y. The second land portion 215*b* of the wiring 215E is shorter in the first direction X, than the second land portion 215*b* of the wiring 215D. The first land portion 215*a* of the wiring 215E is formed on the side of the second edge 34 of the substrate 30, and on the fourth edge 36, with respect to the second land portion 215*b* of the wiring 215E. The connection wiring 215*c* of the wiring 215E includes a first portion, a second portion, a third portion, and a fourth portion, each of which will be described hereunder. The first portion extends along the second direction Y, from the first land portion 215*a* toward the third edge 35, The second portion extends obliquely so as to be closer to the third edge 35, toward the first edge 33 of the substrate 30. The third portion extends along the first direction X, from the end portion of the second portion on the side of the first edge 33, toward the first edge 33. The fourth portion extends obliquely from the end portion of the third portion on the side of the first edge 33, so as to be closer to the third edge 35, toward the first edge 33 of the substrate 30. The fourth portion is connected to the second land portion 215*b*.

The second land portion 215*b* of the wiring 215F is formed adjacent to the second land portion 215*b* of the wiring 215E, on the side of the first edge 33. This second land portion 215*b* has, for example, a rectangular shape in a plan view. In an example, the second land portion 215*b* of the wiring 215F has the long sides extending along the first direction X. As indicated by a dash-dot auxiliary line drawn in the second direction Y from the control chip 47 in FIG. 85, an edge of the second land portion 215*b* of the wiring 215F in the first direction X is located at the same position as the edge of the control chip 47 on the side of the first edge 33, in the second direction Y. The first land portion 215*a* of the wiring 215F is formed on the side of the second edge 34 of the substrate 30, and on the fourth edge 36, with respect to the second land portion 215*b* of the wiring 215F. This first land portion 215*a* is also formed on the side of the second edge 34, with respect to the second land portion 215*b* of the wiring 215C. The connection wiring 215*c* of the wiring 215F includes a first portion, a second portion, and a third portion, each of which will be described hereunder. The first portion extends along the second direction Y, from the end portion of the second land portion 215*b* on the side of the second edge 34 and on the side of the fourth edge 36, toward the fourth edge 36. The second portion extends along the second direction Y, from the first land portion 215*a* toward the third edge 35. The third portion is connecting the first portion and the second portion. The third portion extends obliquely so as to be closer to the fourth edge 36, toward the second edge 34 of the substrate 30.

On the second land portion 215*b* of the wiring 215B, the diode 49W is mounted via the conductive material MP. The diode 49W is mounted on a region of the second land portion 215*b* on the side of the first edge 33. The conductive material MP employed to mount the diodes 49U to 49W is formed of the same material as the conductive material MP employed in the eighth embodiment, to mount the diodes 49U to 49W. Here, the position of the diode 49W with respect to the second land portion 215*b* may be modified as desired.

The first land portion 215*a* of the wiring 215G is formed on the side of the second edge 34, with respect to the end portion of the island portion 201 on the side of the first edge 33. This first land portion 215*a* overlaps with the second land portion 215*b* of the wiring 215F, as viewed in the second direction Y. The first land portion 215*a* of the wiring 215G also overlaps with the control chip 47. as viewed in the second direction Y. The connection wiring 215*c* of the wiring 215B is connected to the end portion of the island portion 201 on the side of the first edge 33, and on the side of the fourth edge 36. The connection wiring 215*c* includes a first portion and a second portion, each of which will be described hereunder. The first portion extends along the second direction Y, from the island portion 201 toward the fourth edge 36. The second portion extends from the first portion toward the first land portion 215_a_ of the wiring 215G. The second portion extends obliquely so as to be closer to the fourth edge 36, toward the second edge 34 of the substrate 30. This connection wiring 215_c_ is thicker than the respective connection wirings 215_c_ of the wirings 215A to 215F.

Second Variation of Eighth Embodiment

Figure 86:
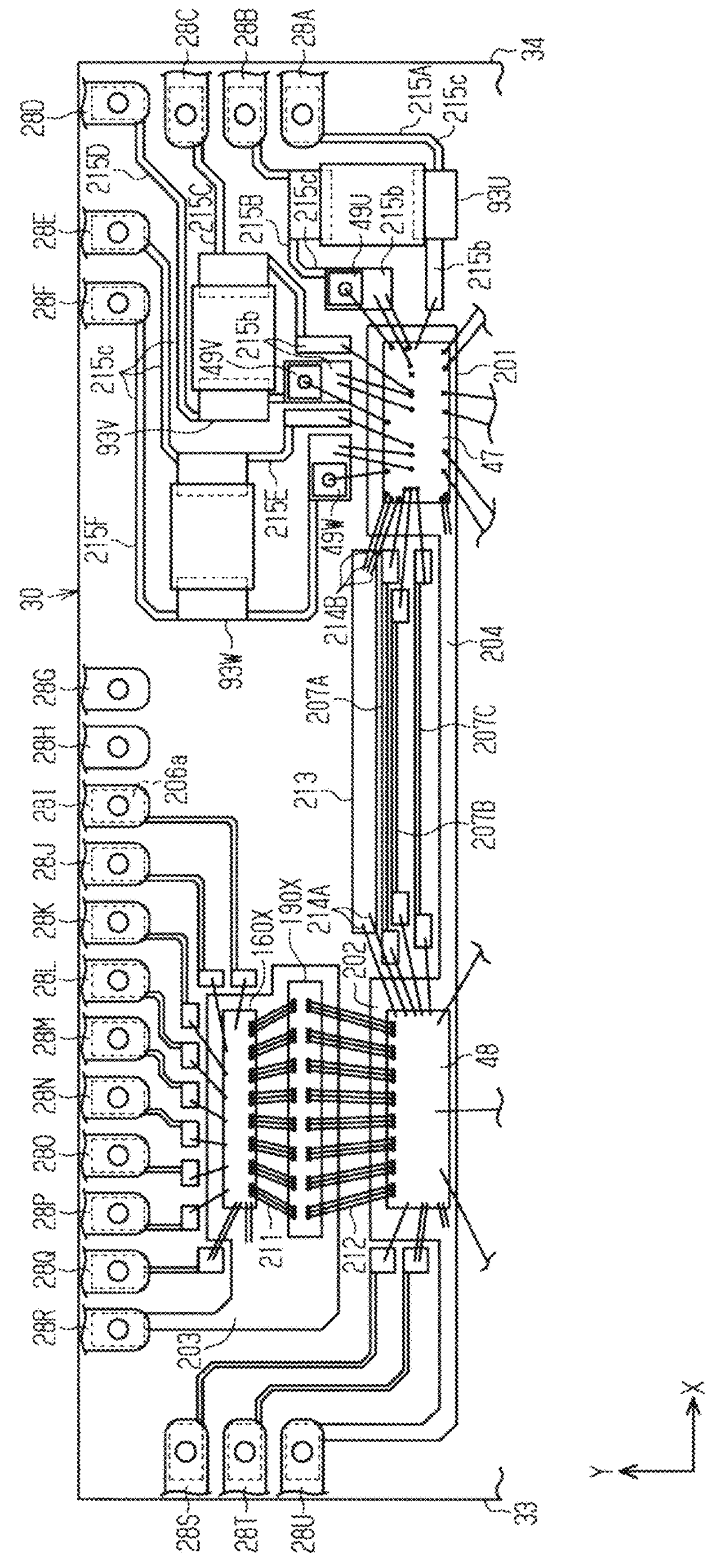
FIG. 86 is an enlarged view of a control wiring region in a variation of the semiconductor package shown in FIG. 33.

The foregoing variation of the semiconductor package 1 may also be modified so as to include built-in capacitors 93U, 93V, and 93W. For example as shown in FIG. 86, out of the lead frames connected to the control chip 47, the lead frame constituting the first GND terminal is omitted. FIG. 86 illustrates an example where the shapes and positions of the respective first land portions 215_a_ and second land portions 215_b_ of the wirings 215B to 215F remain unchanged, but only the second land portion 215_b_ and the connection wiring 215_c_ of the wiring 215A are changed, so as to allow the capacitors 93U, 93V, and 93W to be mounted.

The second land portion 215_b_ of the wiring 215A is located farther from the second land portion 215_b_ of the wiring 215B in the second direction Y, compared with the second land portion 215_b_ shown in FIG. 84. In other words, the second land portion 215_b_ of the wiring 215A is formed on the side of the third edge 35, with respect to the second land portion 215_b_ of the wiring 215A shown in FIG. 84. As viewed in the first direction X, the second land portion 215_b_ of the wiring 215A is formed so as to overlap with the control chip 47.

The capacitor 93U is mounted on the wirings 215A and 215B. More specifically, a first terminal of the capacitor 93U is connected to the connection wiring 215_c_ of the wiring 215A. A second terminal of the capacitor 93U is connected to the connection wiring 215_c_ of the wiring 215B. The capacitor 93U is mounted on the mentioned connection wirings 215_c_, such that the first terminal and the second terminal are aligned along the second direction Y. The capacitor 93U is located on the side of the second edge 34 of the substrate 30, with respect to the control chip 47, the diode 49U, and the capacitor 93V. The capacitor 93U is located so as to overlap with the lead frames 28E and 28F, as viewed in the second direction Y. The second terminal of the capacitor 93U is located so as to overlap with the lead frame 28A, the diodes 49U to 49W, and the control chip 47, as viewed in the first direction X.

The capacitor 93V is mounted on the wirings 215C and 215D. More specifically, a first terminal of the capacitor 93V is connected to the connection wiring 215_c_ of the wiring 215C. A second terminal of the capacitor 93V is connected to the connection wiring 215_c_ of the wiring 215D. The capacitor 93V is mounted on the mentioned connection wirings 215_c_, such that the first terminal and the second terminal are aligned along the first direction X. The capacitor 93V is located on the side of the fourth edge 36 of the substrate 30, with respect to the capacitor 93U. The capacitor 93V is located so as to overlap with the control chip 47, the lead frame 28F, and the diodes 49U and 49V, as viewed in the second direction Y. The capacitor 93V is located so as to overlap with the lead frames 283 and 28C, as viewed in the first direction X.

The capacitor 93W is mounted on the wirings 215E and 215F. More specifically, a first terminal of the capacitor 93W is connected to the connection wiring 215_e_ of the wiring 215E. A second terminal of the capacitor 93W is connected to the connection wiring 215_c_ of the wiring 215F. The capacitor 93W is mounted on the mentioned connection wirings 215_c_, such that the first terminal and the second terminal are aligned along the first direction X. The edge of the capacitor 93W on the side of the fourth edge 36 is located between the edge of the capacitor 93V on the side of the fourth edge 36 and the fourth edge 36 of the substrate 30, in the second direction Y. The edge of the capacitor 93W on the side of the third edge 35 is located so as to overlap with the capacitor 93V, as viewed in the first direction X. The capacitor 93W is located so as to overlap with the diode 49W and the control chip 47, as viewed in the second direction Y. The capacitor 93W is located so as to overlap with the lead frames 28B and 28C, as viewed in the first direction X.

Ninth Embodiment

Figure 87:
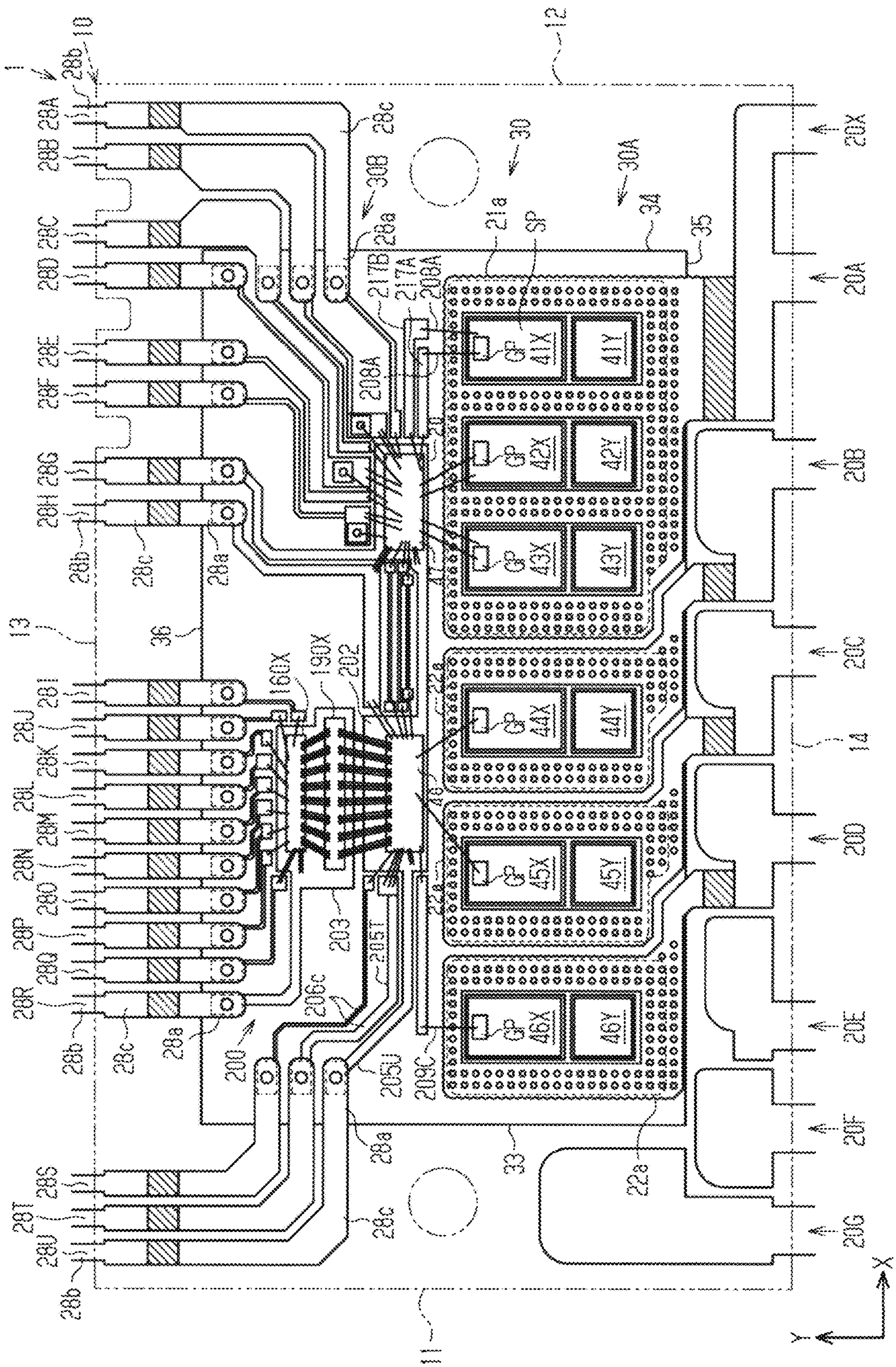
FIG. 87 is a plan view showing an internal configuration of a semiconductor package according to a ninth embodiment.
Figure 88:
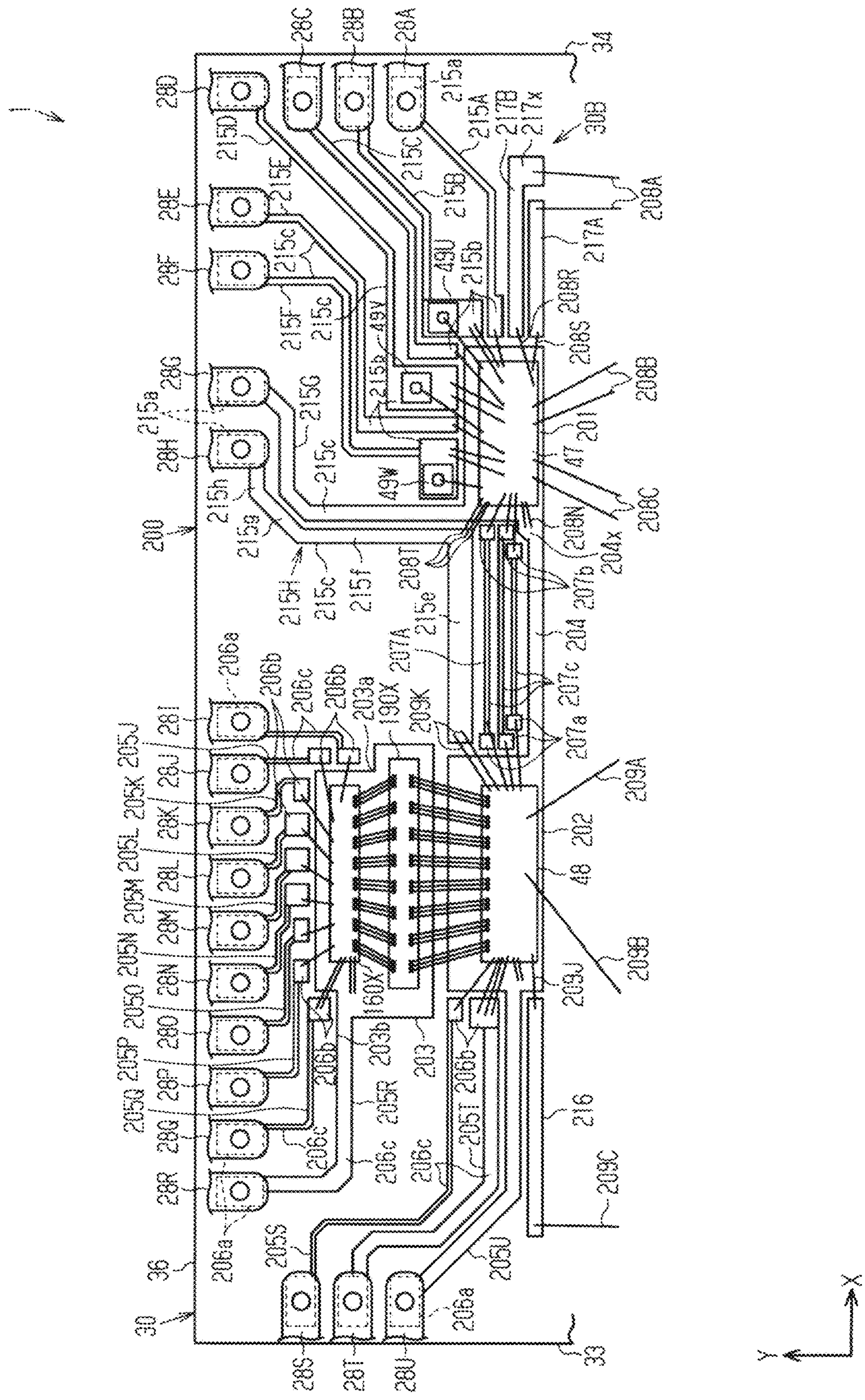
FIG. 88 is an enlarged view of a control wiring region in FIG. 87.

Referring to FIG. 87 and FIG. 88, a semiconductor package according to a ninth embodiment will be described. The semiconductor package 1 according to this embodiment is different from the variations of the semiconductor package 1 according to the eighth embodiment shown in FIG. 84 and FIG. 85, mainly in that the primary-side circuit chip 160X, the transformer chip 190X, and the control chip 48 are shifted toward the second edge 34 of the substrate 30, that the control chip 47 is shifted toward the first edge 33 of the substrate 30, and that an intermediary wiring 216 and intermediary wirings 217A and 217B are additionally provided. In the description given hereunder, similar elements to those of the variations of the eighth embodiment shown in FIG. 84 and FIG. 85 will be given the same numeral, and a part or the whole of the description thereof may be omitted. In FIG. 87, the wires 24A to 24F are omitted, for the sake of clarity.

As shown in FIG. 87, the control chip 48 is located so as to stride over in the first direction X, a position between the island portion 22_a_ of the lead frame 20B and the island portion 22_a_ of the lead frame 20C, in the first direction X. More specifically, the island portion 202 is formed so as to stride over the position between the island portion 22_a_ of the lead frame 20B and the island portion 22_a_ of the lead frame 20C, in the first direction X. The island portion 202 is formed so as to also stride over a position between the semiconductor chip 44X and the semiconductor chip 45X in the first direction X. The island portion 202 is formed in a range between the end portion of the semiconductor chip 44X on the side of the second edge 34 and the end portion of the semiconductor chip 45X on the side of the first edge 33. In an example, the edge of the island portion 202 on the side of the second edge 34 in the first direction X is located so as to overlap with the semiconductor chip 44X, as viewed in the second direction Y. The edge of the island portion 202 on the side of the first edge 33 in the first direction X is located so as to overlap with the semiconductor chip 45X, as viewed in the second direction Y. In FIG. 87, the center of the island portion 202 in the first direction X coincides with the center in the first direction X, of a region between the semiconductor chip 44X and the semiconductor chip 45X, in the first direction X. In other words, the center of the island portion 202 in the first direction X coincides with the center in the first direction X, of the region between the island portion 22_a_ of the lead frame 20B and the island portion 22_a_ of the lead frame 20C in the first direction X.

The primary-side circuit chip 160X and the transformer chip 190X are located so as to overlap with the control chip 47, as viewed in the second direction Y. The island portion 203 is spaced apart from the island portion 202, in the second direction Y. The island portion 203 is, like the island portion 202, also located on the side of the second edge 34 of the substrate 30, with respect to the island portion 203 shown in FIG. 84 and FIG. 85. The island portion 203 is formed between the lead frame 28I and the lead frame 28O, in the first direction X. In other words, the island portion 203 is formed so as to overlap with the lead frames 28J to 28N, as viewed in the second direction Y.

Because of the mentioned changes in position of the island portion 202 and the island portion 203, toward the second edge 34 of the substrate 30, the respective shapes of the wirings 205I to 205U (see FIG. 88) are different from the shapes of the wirings 205I to 205U shown in FIG. 84 and FIG. 85.

Since the island portion 203 has come closer to the lead frame 28I in the first direction X, the second land portion 206*b* of the wiring 205I is formed on the side of the second edge 34 of the substrate 30, with respect to the first land portion 206*a* of the wiring 205J. The second land portion 206*b* of the wiring 205J is formed on the side of the second edge 34 of the substrate 30, with respect to the first land portion 206*a* of the wiring 205J. In addition, in the wiring 205I, the second portion of the connection wiring 206*c* extending from the second land portion 206*b* along the second direction Y is shortened. In the wiring 205J, the connection wiring 206*c* is without the second portion. Therefore, the connection wiring 206*c* of the wiring 205J is connecting the second land portion 206*b* and the first land portion 206*a*, only via the first portion extending in the first direction X.

In the wiring 205K, the second land portion 206*b* is formed on the side of the second edge 34 of the substrate 30, with respect to the first land portion 206*a* of the wiring 205K. The second land portion 206*b* of the wiring 205K is formed so as to overlap with the first land portion 206*a* of the wiring 205J, as viewed in the second direction Y. In addition, the connection wiring 206*c* of the wiring 205K is formed so as to secure a space for forming the second land portion 206*b* and the connection wiring 206*c* of the wiring 205L, between the lead frame 28K and the island portion 203 in the second direction Y. The connection wiring 206*c* of the wiring 205K includes a first portion, a second portion, a third portion, a fourth portion, and a fifth portion, each of which will be described hereunder. The first portion extends along the second direction Y, from the first land portion 206*a* toward the third edge 35, The second portion extends along the second direction Y, from the second land portion 206*b* toward the fourth edge 36. The third portion extends along the first direction X. The third portion is located between the first portion and the second portion, in the second direction Y. The fourth portion is connecting an end portion of the third portion and the first portion. The fifth portion is connecting the other end portion of the third portion and the second portion. The fourth portion and the fifth portion each extend obliquely, so as to be closer to the fourth edge 36, toward the first edge 33 of the substrate 30 of the substrate 30.

In the wiring 205L, the second land portion 206*b* is formed on the side of the second edge 34 of the substrate 30, with respect to the first land portion 206*a* of the wiring 205L. The second land portion 206*b* of the wiring 205L is formed so as to overlap with the first land portion 206*a* of the wiring 205K, as viewed in the second direction Y. In addition, the connection wiring 206*c* of the wiring 205L is formed so as to secure a space for forming the second land portion 206*b* of the wiring 205M and the second land portion 206*b* of the wiring 205N, between the lead frame 28L and the island portion 203 in the second direction Y. The connection wiring 206*c* of the wiring 205L can be divided into a first portion, a second portion, a third portion, and a fourth portion. The first portion extends from the first land portion 206*a*, along the second direction Y. The second portion extends obliquely from the second land portion 206*b*, so as to be closer to the fourth edge 36, toward the first edge 33 of the substrate 30. The third portion extends along the first direction X, from the end portion of the second portion on the side of the first edge 33 toward the first edge 33. The fourth portion is connecting the third portion and the first portion. The fourth portion extends obliquely so as to be closer to the fourth edge 36, toward the first edge 33 of the substrate 30.

In the wiring 205M, the second land portion 206*b* is formed on the side of the second edge 34 of the substrate 30, with respect to the first land portion 206*a* of the wiring 205M. The second land portion 206*b* of the wiring 205M is formed so as to overlap with the first land portion 206*a* of the wiring 205L, as viewed in the second direction Y. The second land portion 206*b* of the wiring 205M protrudes toward the second edge 34, from the first land portion 206*a* of the wiring 205L. In addition, the connection wiring 206*c* of the wiring 205M is formed so as to secure a space for forming the connection wiring 206*c* of the wiring 205N and the second land portion 206*b* of the wiring 205O. The connection wiring 206*c* of the wiring 205M has a similar shape to that of the connection wiring 206*c* of the wiring 205L. The third portion of the connection wiring 206*c* of the wiring 205M is longer than the third portion of the connection wiring 206*c* of the wiring 205L. Here, the respective second land portions 206*b* of the wirings 205K to 205M according to this embodiment have a quadrate (square) shape in a plan view. The shape of the second land portions 206*b* of the wirings 205K to 205M may be modified as desired. In an example, at least one of the second land portions 206*b* of the wirings 205K to 205M has a rectangular shape in a plan view. At least one of the second land portions 206*b* of the wirings 205K to 205M may have the long sides extending along the first direction X.

In the wiring 205N, the second land portion 206*b* is formed on the side of the second edge 34 of the substrate 30, with respect to the first land portion 206*a* of the wiring 205N. The second land portion 206*b* of the wiring 205N is formed so as to overlap with the first land portion 206*a* of the wiring 205L, as viewed in the second direction Y. The second land portion 206*b* of the wiring 205N protrudes toward the first edge 33, from the first land portion 206*a* of the wiring 205L. The second land portion 206*b* of the wiring 205N is formed on the side of the second edge 34 of the substrate 30, with respect to the first land portion 206*a* of the wiring 205M. In addition, the connection wiring 206*c* of the wiring 205N is formed so as to secure a space for forming the connection wiring 206*c* of the wiring 205O and the second land portion 206*b* of the wiring 205P. The connection wiring 206*c* of the wiring 205N includes a first portion, a second portion, a third portion, a fourth portion, and a fifth portion, each of which will be described hereunder. The first portion extends along the second direction Y, from the first land portion 206*a* toward the third edge 35. The second portion extends along the first direction X, from the second land portion 206*b* toward the first edge 33. The third portion extends along the first direction X. The third portion is located between the first portion and the second portion, in the first direction X and the second direction Y. The fourth portion is connecting the second portion and an end portion of the third portion. The fifth portion is connecting the first portion and the other end portion of the third portion. The fourth portion and the fifth portion each extend obliquely, so as to be closer to the fourth edge 36, toward the first edge 33 of the substrate 30.

In the wiring 205O, the second land portion 206*b* is formed on the side of the second edge 34 of the substrate 30, with respect to the first land portion 206*a* of the wiring 205O. The second land portion 206*b* of the wiring 205O is formed so as to overlap with the first land portion 206*a* of the wiring 205M, as viewed in the second direction Y. In addition, the connection wiring 206*c* of the wiring 205O is formed so as to secure a space for forming the connection wiring 206*c* of the wiring 205P, and the second land portion 206*b* and the connection wiring 206*c* of the wiring 205P, between the lead frame 28O and the second cutaway portion 203*b* of the island portion 203, in the second direction Y. The connection wiring 206*c* of the wiring 205O includes a first portion, a second portion, a third portion, and a fourth portion, each of which will be described hereunder. The first portion extends along the first direction X, from the first land portion 206*a* toward the third edge 35. The second portion extends obliquely, so as to be closer to the fourth edge 36, toward the first edge 33 of the substrate 30. The third portion extends along the first direction X, from the end portion of the second portion on the side of the first edge 33. The fourth portion is connecting the end portion of the third portion on the side of the first edge 33, and the first portion. The fourth portion extends obliquely, so as to be closer to the fourth edge 36, toward the first edge 33 of the substrate 30.

In the wiring 205P, the second land portion 206*b* is formed on the side of the second edge 34 of the substrate 30, with respect to the first land portion 206*a* of the wiring 205P. The second land portion 206*b* of the wiring 205P is formed so as to overlap with the first land portion 206*a* of the wiring 205N, as viewed in the second direction Y. The second land portion 206*b* of the wiring 205P protrudes toward the second edge 34, from the first land portion 206*a* of the wiring 205N. The first land portion 206*a* of the wiring 205P is formed on the side of the first edge 33 of the substrate 30 in the first direction X, with respect to the island portion 203, The first land portion 206*a* of the wiring 205P is formed on the side of the fourth edge 36 of the substrate 30 in the second direction Y, with respect to the island portion 203. In addition, the connection wiring 206*c* of the wiring 205P includes a first portion, a second portion, and a third portion, each of which will be described hereunder. The first portion extends along the second direction Y, from the first land portion 206*a* toward the third edge 35. The second portion extends along the first direction X, from the second land portion 206*b* toward the first edge 33. The third portion is connecting the first portion and the second portion. The third portion extends obliquely, so as to be closer to the fourth edge 36, toward the first edge 33 of the substrate 30.

In the wiring 205Q, the second land portion 206*b* is formed on the side of the second edge 34 of the substrate 30, with respect to the first land portion 206*a* of the wiring 205Q. The second land portion 206*b* of the wiring 205Q is formed between the first land portion 206*a* of the wiring 205N and the first land portion 206*a* of the wiring 205O, in the first direction X. The second land portion 206*b* of the wiring 205Q is formed on the side of the first edge 33 of the substrate 30 in the first direction X, with respect to the island portion 203. The first land portion 206*a* of the wiring 205Q is formed on the side of the fourth edge 36 of the substrate 30 in the second direction Y, with respect to the island portion 203. In addition, the connection wiring 206*c* of the wiring 205Q is formed so as to surround the connection wiring 206*c* of the wiring 205P, from the side of the first edge 33 and the side of the third edge 35. In other words, the connection wiring 206*c* of the wiring 205P has a similar shape to that of the connection wiring 206*c* of the wiring 205Q. The first portion of the connection wiring 206*c* of the wiring 205Q is longer than the first portion of the connection wiring 206*c* of the wiring 205P.

In the wiring 205R, the first land portion 206*a* is formed on the side of the first edge 33 of the substrate 30, with respect to the island portion 203. The connection wiring 206*c* of the wiring 205R includes a first portion, a second portion, and a third portion, each of which will be described hereunder. The first portion extends along the second direction Y, from the first land portion 206*a* toward the third edge 35. The second portion extends along the first direction X, from the second cutaway portion 203*b* of the island portion 203 toward the first edge 33. The third portion is connecting the first portion and the second portion. The third portion extends obliquely, so as to be closer to the fourth edge 36, toward the first edge 33 of the substrate 30.

The wiring 205S is formed such that the second portion and the fifth portion of the connection wiring 206*c* become longer, than the second portion and the fifth portion of the connection wiring 206*c* of the wiring 205S shown in FIG. 84 and FIG. 85.

The wiring 205T is formed such that the second portion and the fifth portion of the connection wiring 206*c* become longer, than the second portion and the fifth portion of the connection wiring 206*c* of the wiring 205T shown in FIG. 84 and FIG. 85. In addition, the wiring 205T is thicker than the wiring 205T shown in FIG. 84 and FIG. 85. The wiring 205T is, for example, the same in thickness as the wiring 205U. The second portion of the connection wiring 206*c* of the wiring 205T is connected to a position in the island portion 202 on the side of the fourth edge 36, with respect to the edge of the island portion 202 on the side of the third edge 35.

An intermediary wiring 216, exemplifying the fourth intermediary wiring, is formed in a region on the side of the third edge 35 of the substrate 30, with respect to the second portion of the connection wiring 206*c* of the wiring 205U. The intermediary wiring 216 is spaced apart from the second portion of the connection wiring 206*c* of the wiring 205U, in the second direction Y. The intermediary wiring 216 extends along the first direction X. The intermediary wiring 216 is formed on the connection path between the control chip 48 and the semiconductor chip 46X, which is the transistor most distant from the control chip 48, among the semiconductor chips 44X to 46X. The intermediary wiring 216 is a wiring pattern connecting, for example, the control chip 48 and the second electrode GP of the semiconductor chip 46X. The intermediary wiring 216 is formed on the side of the first edge 33 of the substrate 30, with respect to the control chip 47 (island portion 202). The intermediary wiring 216 is located so as to overlap with the island portion 202, as viewed in the first direction X. The end portion of the intermediary wiring 216 on the side of the second edge 34 is opposed to the end portion of the island portion 202 on the side of the first edge 33 in the first direction X, with a clearance therebetween.

The intermediary wiring 216 extends along the first direction X, so as to stride over the semiconductor chip 45X and the semiconductor chip 46X. The intermediary wiring 216 is formed in a range between the end portion of the semiconductor chip 45X on the side of the second edge 34 and the end portion of the semiconductor chip 46 on the side of the first edge 33. In an example, the edge of the intermediary wiring 216 on the side of the first edge 33 is located so as to overlap with the second electrode GP of the semiconductor chip 46X, or on the side of the first edge 33 with respect to the second electrode GP of the semiconductor chip 46X, as viewed in the second direction Y. The edge of the intermediary wiring 216 on the side of the second edge 34 is located so as to overlap with the second electrode GP of the semiconductor chip 44X, or on the side of the second edge 34, with respect to the second electrode GP of the semiconductor chip 44X, as viewed in the second direction Y. In this embodiment, the intermediary wiring 216 is the same in thickness as the connection wiring 206*c* of the wiring 205U. Further, the intermediary wiring 216 is the same in thickness as the connection wiring 204.

The wire 209C, connected to the second electrode GP of the semiconductor chip 46X, is connected to the end portion of the intermediary wiring 216 on the side of the first edge 33. As shown in FIG. 88, the end portion of the intermediary wiring 216 on the side of the second edge 34 and the control chip 47 are connected via the wire 209J. The wire 209J is connected to the end portion of the control chip 47 on the side of the first edge 33, in the first direction X. In addition, the wire 209J is connected to the end portion of the control chip 47 on the side of the third edge 35, in the second direction Y.

The island portion 201 is smaller in size in the first direction X, than the island portion 201 shown in FIG. 84 and FIG. 85. The island portion 201 is formed on the side of the first edge 33 of the substrate 30, with respect to the lead frame 28F. In other words, the island portion 201 is formed on the side of the first edge 33 of the substrate 30, with respect to the first land portion 206*a* of the wiring 205F. The island portion 201 is formed so as to overlap the lead frames 28G and 28H, as viewed in the second direction Y. Thus, the island portion 201 is formed so as to overlap the respective first land portions 215*a* of the wirings 215E and 215H, as viewed in the second direction Y.

Since the island portion 201 is shifted toward the first edge 33 of the substrate 30, compared with the island portion 201 shown in FIG. 84 and FIG. 85, the positions of the respective second land portions 215*b*, as well as the shapes of the respective connection wirings 215*c*, of the wirings 215A to 215G are changed.

More specifically, the respective second land portions 215*b* of the wirings 215A and 215B are formed on the side of the first edge 33 of the substrate 30 in the first direction X, with respect to the first land portion 215*a* of the wiring 215F. The second land portions 215*b* of the wirings 215A and 215B are formed on the side of the second edge 34 of the substrate 30 in the first direction X, with respect to the first land portion 215*a* of the wiring 215G. The connection wiring 215*c* of the wiring 215A includes a first portion and a second portion, each of which will be described hereunder. The first portion extends obliquely from the first land portion 215*a*, so as to be closer to the third edge 35, toward the first edge 33 of the substrate 30. The second portion extends along the first direction X, from the end portion of the first portion on the side of the first edge 33, toward the second land portion 215*b*. The second portion is connected to the second land portion 215*b*. The connection wiring 215*c* of the wiring 215B includes a first portion, a second portion, and a third portion, each of which will be described hereunder. The first portion extends along the first direction X, from the first land portion 215*a* toward the first edge 33. The second portion extends along the first direction X, from the second land portion 215*b* toward the second edge 34. The third portion is connecting the first portion and the second portion. The third portion is located between the first portion and the second portion, in the first direction X. The third portion extends obliquely, so as to be closer to the fourth edge 36, toward the second edge 34 of the substrate 30.

The second land portion 215*b* of the wiring 215C is formed on the side of the first edge 33 of the substrate 30 in the first direction X, with respect to the first land portion 215*a* of the wiring 215F. The second land portion 215*b* of the wiring 215C is formed on the side of the second edge 34 of the substrate 30 in the first direction X, with respect to the first land portion 215*a* of the wiring 215G. The distance between the second land portion 215*b* of the wiring 215C and the second land portion 215*b* of the wiring 215B is shorter than the distance therebetween shown in FIG. 84 and FIG. 85. The second land portion 215*b* of the wiring 215C is formed so as to overlap with the end portion of the island portion 201 on the side of the second edge 34, as viewed in the second direction Y. The second land portion 215*b* of the wiring 215C is formed on the side of the second edge 34 of the substrate 30, with respect to the control chip 47. The connection wiring 215*c* of the wiring 215C includes a first portion and a second portion, each of which will be described hereunder. The first portion extends obliquely from the first land portion 215*a*, so as to be closer to the third edge 35, toward the first edge 33 of the substrate 30. The second portion extends along the first direction X, from the end portion of the first portion on the side of the first edge 33, toward the second land portion 215*b*. The second portion is connected to the second land portion 215*b*.

The second land portion 215*b* of the wiring 215D is formed so as to overlap with the first land portion 215*a* of the wiring 215G, as viewed in the second direction Y. The second land portion 215*b* of the wiring 215D protrudes toward the second edge 34, from the first land portion 215*a* of the wiring 215G. The second land portion 215*b* of the wiring 215D is larger in size in the second direction Y, than the second land portion 215*b* of the wiring 215D shown in FIG. 84 and FIG. 85. The connection wiring 215*c* of the wiring 215D includes a first portion, a second portion, and a third portion, like the connection wiring 215*c* of the wiring 215D shown in FIG. 84 and FIG. 85. In this embodiment, the second portion of the connection wiring 215*c* of the wiring 215D is longer than that shown in FIG. 84 and FIG. 85. In this embodiment, he first portion of the connection wiring 215*c* of the wiring 215D is shorter than that shown in FIG. 84 and FIG. 85.

The second land portion 215*b* of the wiring 215E is formed between the first land portion 215*a* of the wiring 215G and the first land portion 215*a* of the wiring 215H, in the first direction X. The size of this second land portion 215*b* in the first direction X is smaller than the clearance between the first land portion 215*a* wiring 215G and the first land portion 215*a* of the wiring 215H. The second land portion 215*b* of the wiring 215E is larger in size in the second direction Y, than the second land portion 215*b* of the wiring 215E shown in FIG. 84 and FIG. 85. In addition, the second land portion 215*b* of the wiring 215E is larger in size in the second direction Y, than the second land portion 215*b* of the wiring 215D shown in FIG. 84 and FIG. 85. The connection wiring 215*c* of the wiring 215E includes a first portion, a second portion, and a third portion, each of which will be described hereunder. The first portion extends along the second direction Y, from the first land portion 215*a* toward the third edge 35. The second portion extends along the first direction X, from the second land portion 215*b* toward the second edge 34. The third portion is connecting the first portion and the second portion. The third portion extends obliquely, so as to be closer to the fourth edge 36, toward the second edge 34 of the substrate 30.

The second land portion 215*b* of the wiring 215F is formed so as to overlap with the first land portion 215*a* of the wiring 215H, as viewed in the second direction Y. The second land portion 215*b* of the wiring 215F protrudes toward the first edge 33, from the first land portion 215*a* of the wiring 215H. The connection wiring 215*c* of the wiring 215F includes a first portion, a second portion, a third portion, a fourth portion, and a fifth portion, each of which will be described hereunder. The first portion extends along the second direction Y, from the first land portion 215*a* toward the third edge 35. The second portion extends along the second direction Y, from the second land portion 215*b* toward the fourth edge 36. The third portion extends along the first direction X. The fourth portion is connecting the first portion and an end of the third portion. The fifth portion is connecting the second portion and the other end of the third portion. The fourth portion and the fifth portion each extend obliquely, so as to be closer to the fourth edge 36, toward the second edge 34 of the substrate 30.

The connection wiring 215*c* of the wiring 215G includes a first portion, a second portion, a third portion, a fourth portion, and a fifth portion, each of which will be described hereunder. The first portion extends obliquely from the first land portion 215*a*, so as to be closer to the first edge 33, toward the third edge 35 of the substrate 30. The second portion extends along the second direction Y, from the end portion of the island portion 201 on the side of the first edge 33 and on the side of the fourth edge 36, toward the fourth edge 36. The third portion extends along the first direction X. The fourth portion is connecting the first portion and an end of the third portion. The fifth portion is connecting the second portion and the other end of the third portion. The fourth portion and the fifth portion each extend obliquely, so as to be closer to the fourth edge 36, toward the second edge 34 of the substrate 30.

In this embodiment, further, the lead frame 28H is located adjacent to the lead frame 28G. The lead frame 28H constitutes the first VCC terminal. The wiring pattern 200 includes the wiring 215H connected to the lead frame 28H. The wiring 215H is a power source pattern that supplies the source voltage VCC to the control chips 47 and 48. The connection wiring 215*c* of the wiring 215H includes first to fourth portions 215*e* to 215*h*. The first portion 215*e* is formed at the same position as the intermediary wirings 207A to 207C, in the first direction X. The first portion 215*e* is spaced apart from the intermediary wiring 207A, on the side of the fourth edge 36 of the substrate 30. The second portion 215*f* extends along the second direction Y, from the end portion of the first portion 215*e* on the side of the second edge 34, toward the fourth edge 36. The third portion 215*g* extends obliquely from the end portion of the second portion 215*f* toward the second edge 34 and the fourth edge 36. The fourth portion 215*h* extends along the first direction X, from the third portion 215*g* toward the second edge 34. The fourth portion 215*h* is connected to the first land portion 215*a*.

The wiring 215H and the control chip 47 are connected via the wires 208T. In this embodiment, the wiring 215H and the control chip 47 are connected via three wires 208T. Respective first end portions of the wires 208T are connected to the joint portion between the first portion 215*e* and the second portion 215*f*, of the wiring 215H. This joint portion is the position closest to the control chip 47, in the wiring 215H. Respective second end portions of the wires 208T are connected to the end portion of the control chip 47 on the side of the first edge 33, in the first direction X. The second end portions of the wires 208T are connected to the end portion of the control chip 47 on the side of the fourth edge 36, in the second direction Y.

The wiring 215H and the control chip 48 are connected via the wires 209K. In this embodiment, the wiring 215H and the control chip 48 are connected via two wires 209K. Respective first end portions of the wires 209K are connected to the distal end portion of the wiring 215H. This distal end portion is the position closest to the control chip 48, in the wiring 215H. Respective second end portions of the wires 209K are connected to the end portion of the control chip 48 on the side of the second edge 34, in the first direction X. The second end portions of the wires 209K are connected to the end portion of the control chip 48 on the side of the fourth edge 36, in the second direction Y.

In a region on the side of the second edge 34 of the substrate 30 with respect to the island portion 201, the intermediary wirings 217A and 217B, exemplifying the third intermediary wiring, are provided. The intermediary wiring 217A is formed on the connection path between the control chip 47 and the semiconductor chip 41X, which is the transistor most distant from the control chip 47, among the semiconductor chips 41X to 43X. The intermediary wiring 217A is a wiring pattern electrically connecting the control chip 47 and the second electrode GP of the semiconductor chip 41X. The intermediary wirings 217A and 217B are aligned in the second direction Y, with a clearance therebetween. The intermediary wirings 217A and 217B each extend along the first direction X. The intermediary wiring 217B is formed on the side of the fourth edge 36 of the substrate 30, with respect to the intermediary wiring 217A. The intermediary wiring 217A is located so as to overlap with the island portion 201, as viewed in the first direction X.

The intermediary wiring 217B has an L-shape in a plan view. The intermediary wiring 217B is longer in the first direction X than the intermediary wiring 217A. The intermediary wiring 217B is formed so as to surround the intermediary wiring 217A, from the side of the fourth edge 36 and the side of the second edge 34. The intermediary wiring 217B includes an extension 217*x* extending along the second direction Y, from a position on the side of the second edge 34 of the substrate 30, with respect to the intermediary wiring 217A. The extension 217*x* is formed so as to overlap with the intermediary wiring 217A, as viewed in the first direction X. The extension 217*x* is formed in a rectangular shape, having the long sides extending along the second direction Y, in a plan view. The extension 217*x* is larger in the first direction X, than the width of the remaining portion of the intermediary wiring 217B in the second direction Y.

The intermediary wiring 217B and the control chip 47 are connected via the wire 208R. A first end portion of the wire 208R is connected to the end portion of the intermediary wiring 217B on the side of the first edge 33. A second end portion of the wire 208R is connected to the end portion of the control chip 47 on the side of the second edge 34, in the first direction X. In addition, the second end portion of the wire 208R is connected to the end portion of the control chip 47 on the side of the third edge 35, in the second direction Y.

The extension 217*x* and the first electrode SP of the semiconductor chip 41X are connected via the wire 208A. An end portion of the wire 208A is connected to the end portion of the extension 217*x* on the side of the third edge 35 of the substrate 30, and the other end portion is connected to a position on the first electrode SP of the semiconductor chip 41X, on the side of the second edge 34 of the substrate 30 with respect to the second electrode GP. Thus, the first electrode SP of the semiconductor chip 44X and the control chip 47 are electrically connected, via the wire 208A, the intermediary wiring 217A, and the wire 208R.

The intermediary wiring 217A and the control chip 47 are connected via the wire 208S. A first end portion of the wire 208S is connected to the end portion of the intermediary wiring 217A on the side of the first edge 33. A second end portion of the wire 208S is connected to the end portion of the control chip 47 on the side of the second edge 34, in the first direction X. In addition, the second end portion of the wire 208S is connected to the end portion of the control chip 47 on the side of the third edge 35, in the second direction Y. The wire 208A, connected to the second electrode GP of the semiconductor chip 44X, is connected to the end portion of the intermediary wiring 217A on the side of the second edge 34. Thus, the second electrode GP of the semiconductor chip 44X and the control chip 47 are electrically connected, via the wire 208A, the intermediary wiring 217A, and the wire 208S.

Further, since the island portions 201 and 202 are brought closer to each other, the length of the connection wiring 204 in the second direction Y, and the length and shape of the intermediary wirings 207A to 207C are different from those of the connection wiring 204 and the intermediary wirings 207A to 207C shown in FIG. 84 and FIG. 85.

The connection wiring 204 includes a widened portion 204*x*, formed at the end portion connected to the island portion 201. The widened portion 204*x* is formed so as to overlap with the intermediary wiring 207C, as viewed in the first direction X. To the widened portion 204*x*, the wire 208N is connected.

In the intermediary wirings 207A and 207B, the plan-view shapes of the respective first land portions 207*a* and the second land portions 207*b* are modified to a quadrate (square) shape. In addition, the respective connection wirings 207*c* of the intermediary wirings 207A and 207B are shorter than the connection wirings 207*c* of the intermediary wirings 207A and 207B shown in FIG. 84 and FIG. 85. The length in the first direction X of the intermediary wiring 207A is equal to that of the intermediary wiring 207B.

The first end portion of the connection wiring 207*c* of the intermediary wiring 207A is connected to the center of the first land portion 207*a* of the intermediary wiring 207A, in the second direction Y. The second end portion of the connection wiring 207*c* of the intermediary wiring 207A is connected to the center of the second land portion 207*b* of the intermediary wiring 207A, in the second direction Y. The first end portion of the connection wiring 207*c* of the intermediary wiring 207B is connected to the end portion of the first land portion 207*a* of the intermediary wiring 207B, on the side of the fourth edge 36, in the second direction Y. The second end portion of the connection wiring 207*c* of the intermediary wiring 207B is connected to the end portion of the second land portion 207*b* of the intermediary wiring 207B, on the side of the fourth edge 36.

The intermediary wiring 207C is shorter in the first direction X, than the intermediary wirings 207A and 207B. The first land portion 207*a* and the second land portion 207*b* of the intermediary wiring 207C are formed so as to overlap with a part of the first land portion 207*a* and second land portion 207*b* of the intermediary wiring 207B, as viewed in the first direction X.

Advantageous Effects

This embodiment provides the following advantageous effects.

(3-1) The control chip 47 is located adjacent to the island portion 21*a* of the lead frame 20A, in the second direction Y. In addition, the control chip 47 is located so as to overlap with the semiconductor chips 42X and 43X, as viewed in the second direction Y. Such a configuration enables the wires 208B, connecting the control chip 47 and the second electrode GP and first electrode SP of the semiconductor chip 42X, and the wires 208C, connecting the control chip 47 and the second electrode GP and first electrode SP of the semiconductor chip 43X, to be shortened.

In addition, the wiring pattern 200 includes the intermediary wirings 217A and 217B. The respective first end portions of the intermediary wirings 217A and 217B are located close to the control chip 47. The respective second end portions of the intermediary wirings 217A and 217B are located so as to overlap with the semiconductor chip 41X, as viewed in the second direction Y. Therefore, the wire 208A connected to the second electrode GP can be shortened, because of being connected to the intermediary wiring 217A. Likewise, the wire 208A connected to the first electrode SP can be shortened, because of being connected to the intermediary wiring 217B. In this embodiment, in particular, the intermediary wiring 217B includes the extension 217*x*, extending toward the semiconductor chip 41X along the second direction Y. The wire 208A connected to the second electrode GP is connected to the extension 217*x*. Therefore, the wire 208A connected to the second electrode GP can be further shortened.

As described above, the wires 208A to 208C can each be shortened. Therefore, when the material for forming the first resin 10 flows into the cavity of a mold, in the forming process of the first resin 10, the wires 208A to 208C can be prevented from being deformed by the flow of the resin, thereby being electrically connected to other elements of the semiconductor package 1.

(3-2) The control chip 48 is located between the semiconductor chip 44X and the semiconductor chip 45X, in the first direction X. In other words, the control chip 48 is located closer to the semiconductor chips 44X and 45X, than to the semiconductor chip 46X. Therefore, the wire 209A connecting the control chip 48 and the second electrode GP of the semiconductor chip 44X, and the wire 209B connecting the control chip 48 and the second electrode GP of the semiconductor chip 45X, can both be shortened.

Further, the wiring pattern 200 includes the intermediary wiring 216. The first end portion of the intermediary wiring 216 is located close to the control chip 48. The second end portion of the intermediary wiring 216 is formed so as to overlap with the semiconductor chip 46X, as viewed in the second direction Y. Therefore, the wire 209C can be shortened, because the wire 209C, connected to the second electrode GP of the semiconductor chip 46X, is connected to the intermediary wiring 216. In particular, since the intermediary wiring 216 is formed so as to overlap with the second electrode GP of the semiconductor chip 46X, as viewed in the second direction Y, the wire 209C connecting the second electrode GP and the intermediary wiring 216 extends along the second direction Y, in a plan view. Consequently, the wire 209C can be further shortened.

As described above, the wires 209A to 209C can each be shortened. Therefore, when the material for forming the first resin 10 flows into the cavity of a mold, in the forming process of the first resin 10, the wires 208A to 208C can be prevented from being deformed by the flow of the resin, thereby being electrically connected to other elements of the semiconductor package 1.

(3-3) The first land portion 207$a$ and the second land portion 207$b$ of the intermediary wiring 207C are each formed so as to overlap with a part of the first land portion 207$a$ and second land portion 207$b$ of the intermediary wiring 207B, as viewed in the first direction X. Such a configuration enables reduction in size in the second direction Y, of the space for forming the intermediary wirings 207A to 207C, which are aligned in the second direction Y. Therefore, the connection wiring 204 can be made thicker. Further, the distance between the first portion 215$e$ and the control chips 47 and 48 can be shortened, because of forming the first portion 215$e$ of the wiring 215H on the side of the connection wiring 204 in the second direction Y. Consequently, the wire 208T connecting the first portion 215$e$ and the control chip 47, and the wire 209K connecting the first portion 215$e$ and the control chip 48, can both be shortened.

Tenth Embodiment

Figure 89:
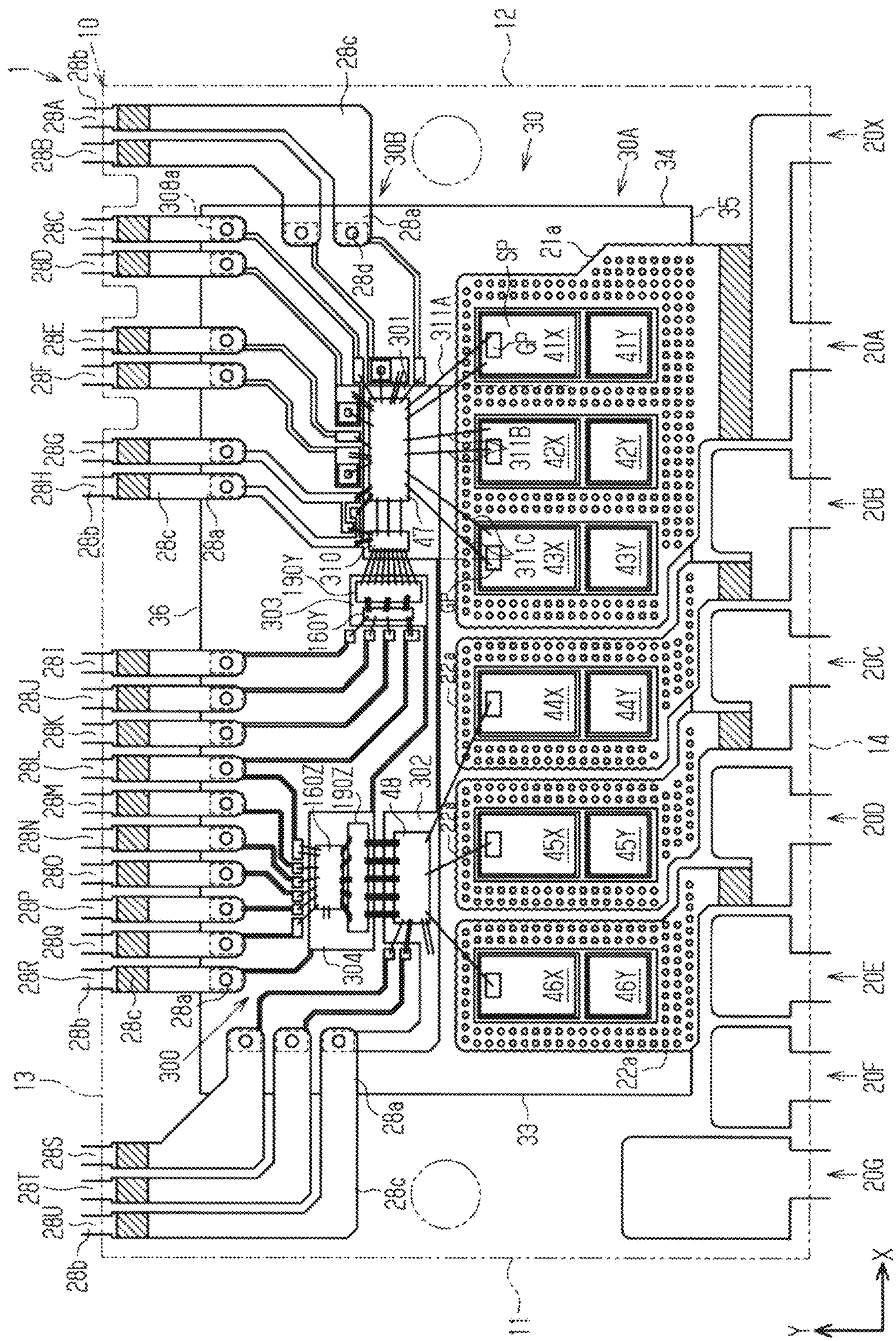
FIG. 89 is a plan view showing an internal configuration of a semiconductor package according to a tenth embodiment.

Referring to FIG. 89 to FIG. 92, a semiconductor package 1 according to a tenth embodiment will be described. The semiconductor package 1 according to this embodiment is different from the semiconductor package 1 according to the eighth embodiment, mainly in including primary-side circuit chips 160Y and 160Z, and transformer chips 190Y and 190Z, in place of the primary-side circuit chip 160X and the transformer chip 190X. In the description given hereunder, similar elements to those of the eighth embodiment will be given the same numeral, and a part or the whole of the description thereof may be omitted. In FIG. 89, the wires 24A to 24F are omitted, for the sake of clarity.

As shown in FIG. 89, the primary-side circuit chip 160Y exemplifying the first signal transmission unit, the transformer chip 190Y exemplifying the first transformer, and the control chip 47 are electrically connected to each other, via an intermediary chip 310 exemplifying the signal reception unit. Accordingly, the control signal for controlling the operation of the semiconductor chips 41X to 43X is inputted to the control chip 47, through the primary-side circuit chip 160Y, the transformer chip 190Y, and the intermediary chip 310. The control chip 47 controls the operation of the semiconductor chips 41X to 43X, according to the control signal.

The intermediary chip 310 includes one or a plurality of electrical elements, encapsulated in a resin material. The intermediary chip 310 is larger in size in the first direction X, than the primary-side circuit chip 160Y, The intermediary chip 310 is smaller in size in the first direction X, than the control chip 47. The intermediary chip 310 has the same size in the second direction Y, as the control chip 47. Here, the size of the intermediary chip 310 in the second direction Y, expressed as “the same as the control chip 47 in the second direction Y”, may differ by within ±5% of the size of the intermediary chip 310 in the second direction Y.

Likewise, the primary-side circuit chip 160Z exemplifying the second signal transmission unit, the transformer chip 190Z exemplifying the second transformer, and the control chip 48 are electrically connected to each other, via an intermediary chip 310 exemplifying the signal reception unit. Accordingly, the control signal for controlling the operation of the semiconductor chips 44X to 46X is inputted to the control chip 48, through the primary-side circuit chip 160Z and the transformer chip 190Z. The control chip 48 controls the operation of the semiconductor chips 44X to 46X, according to the control signal.

As shown in FIG. 89, the primary-side circuit chip 160Y and the primary-side circuit chip 160Z are provided independently from each other, in this embodiment. The primary-side circuit chip 160Y is located adjacent to the transformer chip 190Y. Likewise, the transformer chip 190Y and the transformer chip 190Z are provided independently from each other. The primary-side circuit chip 160Z is located adjacent to the transformer chip 190Z.

The lead frames 28A to 28U each exemplify a second lead frame. The lead frames 28A to 28H and 28S to 28U each exemplify a secondary-side lead frame constituting the terminal of the secondary-side circuit 170 (see FIG. 18). The lead frames 28I to 28R each exemplify a primary-side lead frame constituting the primary-side circuit 160 (see FIG. 18).

The lead frames 28A to 28U may constitute the terminals, for example as follows. The lead frame 28A constitutes the VSU terminal. The lead frame 28B constitutes the VBU terminal. The lead frame 28C constitutes the VSV terminal. The lead frame 28D constitutes the VBV terminal. The lead frame 283 constitutes the VSW terminal. The lead frame 28F constitutes the VBW terminal. The lead frame 28G constitutes the first VCC terminal. The lead frame 28H constitutes the first GND terminal. The lead frame 28I constitutes the HINU terminal. The lead frame 28J constitutes the HINV terminal. lead frame 28K constitutes the HINW terminal. The lead frame 28L constitutes the third VCC terminal. The lead frame 28M constitutes the LINU terminal. The lead frame 28N constitutes the LINV terminal. The lead frame 28O constitutes the LINW terminal. The lead frame 28P constitutes the FO terminal. The lead frame 28Q constitutes the VOT terminal. The lead frame 28R constitutes the third GND terminal. The lead frame 28S constitutes the CIN terminal (detection terminal CIN). The lead frame 28T constitutes the second VCC terminal. The lead frame 28U constitutes the second GND terminal.

Figure 90:
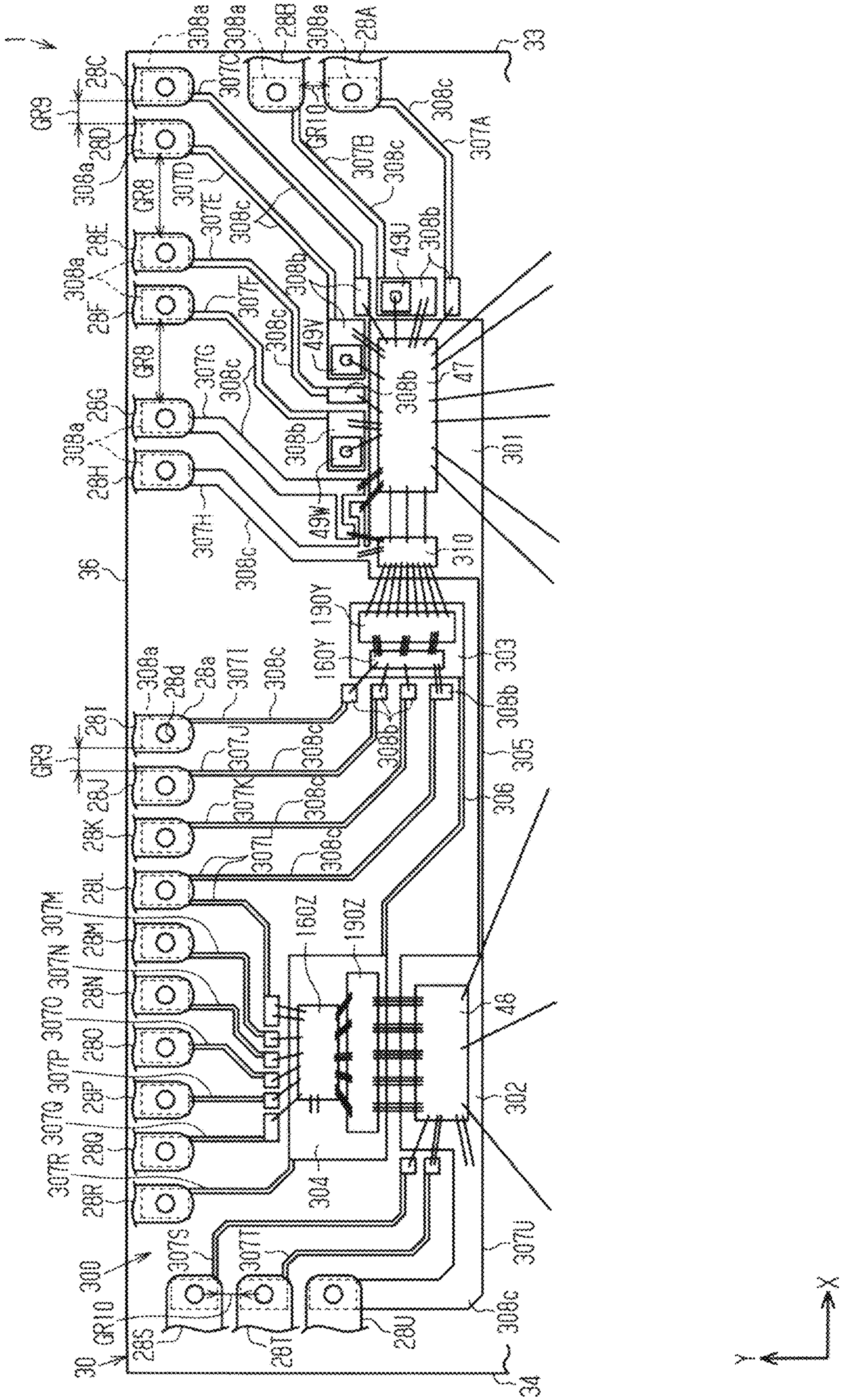
FIG. 90 is an enlarged view of a control wiring region in FIG. 89.

As shown in FIG. 90, the semiconductor package 1 according to this embodiment includes a wiring pattern 300, in place of the wiring pattern 200. The wiring pattern 300 is formed in the first region 30B of the substrate 30. The conductive material MP is employed to form the wiring pattern 300. The wiring pattern 300 is formed by sintering the conductive material MP. Examples of the material of the conductive material MP include silver (Ag), copper (Cu), and gold (Au). In this embodiment, the conductive material MP is formed of silver.

The wiring pattern 300 includes an island portion 301 exemplifying the first island portion, an island portion 302 exemplifying the second island portion, an island portion 303 exemplifying the third island portion, an island portion 304 exemplifying the fourth island portion, and wirings 307A to 307U. On the island portion 301, the control chip 47 exemplifying the first control circuit chip, and the intermediary chip 310 are mounted. On the island portion 302, the control chip 48 exemplifying the second control circuit chip is mounted. On the island portion 303, the primary-side circuit chip 160Y and the transformer chip 190Y are mounted. The island portion 303 is formed adjacent to the island portion 301. On the island portion 304, the primary-side circuit chip 160Z and the transformer chip 190Z are mounted. The island portion 304 is formed adjacent to the island portion 302. The wirings 307A to 307U are respectively connected to the lead frames 28A to 28U.

The wirings 307A to 307U each include a first land portion 308$a$, connected to a corresponding one of the lead frames 28A to 28U. The respective first land portions 308$a$ of the wirings 307A and 307B are formed between the island portion 301 and the second edge 34 of the substrate 30, in the first direction X. The first land portions 308*a* of the wirings 307A and 307B are formed on the side of the second edge 34 in the first direction X, with respect to the center of a region between the island portion 301 and the second edge 34 of the substrate 30 in the first direction X. The first land portions 308*a* of the wirings 307A and 307B are aligned in the second direction Y, with a clearance therebetween. The respective first land portions 308*a* of the wirings 307C to 307R are formed between the island portion 303 and the fourth edge 36 of the substrate 30, in the second direction Y. The first land portions 308*a* of the wirings 307C to 307R are formed on the side of the fourth edge 36 in the second direction Y, with respect to the center of a region between the island portion 303 and the fourth edge 36 of the substrate 30 in the second direction Y. The first land portions 308*a* of the wirings 307C to 307R are aligned in the first direction X, with a clearance between each other. The first land portions 308*a* of the wirings 307S to 307U are formed between the island portion 303 and the first edge 33 of the substrate 30, in the first direction X. The first land portions 308*a* of the wirings 307S to 307U are formed on the side of the first edge 33 in the first direction X, with respect to the center of a region between the island portion 303 and the first edge 33 of the substrate 30 in the first direction X. The first land portions 308*a* of the wirings 307S to 307U are aligned in the second direction Y, with a clearance between each other.

More specifically, the wirings 307D to 307G are formed such that the first land portion 308*a* of the wiring 307D and the first land portion 308*a* of the wiring 307E, and the first land portion 308*a* of the wiring 307F and the first land portion 308*a* of the wiring 307G, are spaced apart from each other in the first direction X by an eighth clearance GR8. The wirings 307D to 307H are formed such that the first land portion 308*a* of the wiring 307C and the first land portion 308*a* of the wiring 307D, the first land portion 308*a* of the wiring 307E and the first land portion 308*a* of the wiring 307F, and the first land portion 308*a* of the wiring 307G and the first land portion 308*a* of the wiring 307H, are spaced apart from each other in the first direction X, by a ninth clearance GR9 narrower than the eighth clearance GR8. The wirings 307I to 307R are formed such that two of the first land portions 308*a* of the wiring 307I to 307R, adjacent to each other in the first direction X, are spaced apart from each other by the ninth clearance GR9. The wirings 307A and 307B are formed such that the first land portion 308*a* of the wiring 307A and the first land portion 308*a* of the wiring 307B are spaced apart from each other by a tenth clearance GR10, wider than the ninth clearance GR9 but narrower than the eighth clearance GR8. The wirings 307S to 307U are formed such that two of the first land portions 308*a*, adjacent to each other in the second direction Y, are spaced apart from each other by the tenth clearance GR10. Here, the tenth clearance GR10 may be modified as desired. For example, the tenth clearance GR10 may have the same width as the ninth clearance GR9.

The wirings 307A to 307F, 307I to 307Q, and 307S, 307T each include a second land portion 308*b*, and a connection wiring 308*c* connecting the first land portion 308*a* and the second land portion 308*b*. The wirings 307G, 307H, 307R, and 307U each include the connection wiring 308*c* connected to the first land portion 308*a*. In other words, the wirings 307G, 307H, 307R, and 307U are without the second land portion 308*b*.

The lead frames 28A to 28U are each connected to the first land portion 308*a* of the corresponding one of the wirings 307A to 307U, via a bonding material SD9 (not shown in FIGS. 89 and 39). As shown in FIG. 90, the bonding material SD9 is exposed to the surface of the respective bonding portions 28*a* of the lead frames 28A to 28U opposite to the substrate 30, through the through hole 28*d* formed in the bonding portion 28*a*. Accordingly, the bonding area between the lead frames 28A to 28U and the bonding material SD9 is increased, and therefore the adhesion strength of the lead frames 28A to 28U to the substrate 30 can be enhanced. For example, the bonding material SD9 may be solder, as in the eighth embodiment.

Referring to FIG. 89 to FIG. 92, the configuration of the wiring pattern 300 will be described in further detail. The island portion 301 is formed adjacent to the lead frame 20A in the second direction Y. The island portion 301 has, for example, a rectangular shape in a plan view. In an example, the island portion 301 has the long sides extending along the first direction X. The island portion 301 is located so as to overlap with the island portion 21*a* of the lead frame 20A, as viewed in the second direction Y. In this embodiment, the center of the island portion 301 in the first direction X is on the side of the first edge 33 in the first direction X, with respect to the center of the island portion 21*a* of the lead frame 20A in the first direction X. The island portion 301 is larger in size in the first direction X, than the semiconductor chips 41X to 43X. The island portion 301 is smaller in size in the first direction X, than the island portion 21*a* of the lead frame 20A. As indicated by a dash-dot auxiliary line drawn from the island portion 301 along the second direction Y in FIG. 89, the end portion of the island portion 301 on the side of the first edge 33 in the first direction X overlaps with the semiconductor chip 43X, as viewed in the second direction Y. In this embodiment, the edge of the island portion 301 on the side of the first edge 33 overlaps with the second electrode GP of the semiconductor chip 43X. As indicated by another dash-dot auxiliary line drawn from the island portion 301 along the second direction Y in FIG. 89, the end portion of the island portion 301 on the side of the second edge 34 is located on the side of the first edge 33 in the first direction X, with respect to the semiconductor chip 41X, but on the side of the second edge 34 of the substrate 30, with respect to the semiconductor chip 42X. As shown in FIG. 90, in addition, as viewed in the second direction Y, the island portion 301 overlaps with each of the first land portions 308*a* of the wirings 307F to 307H. In contrast, the island portion 301 is not overlapping with any of the first land portions 308*a* of the wirings 307A to 307E. In other words, the island portion 301 overlaps with the lead frames 28F to 28H, as viewed in the second direction Y. However, the island portion 301 is not overlapping with the lead frames 28A to 28E.

The control chip 47 and the intermediary chip 310 are mounted on the island portion 301, via the conductive material MP. In this embodiment, silver is employed to form the conductive material MP. Though not shown, the conductive material MP protrudes from the periphery of the control chip 47 and the intermediary chip 310, but remains within the island portion 301, in a plan view. Thus, the size of the island portion 301, in relation to the size of the control chip 47 and the intermediary chip 310, is determined so as to suppress the conductive material MP from protruding outwardly. The control chip 47 is located in a region of the island portion 301 on the side of the second edge 34, in the first direction X. The intermediary chip 310 is located in a region of the island portion 301 on the side of the first edge 33, in the first direction X. The control chip 47 and the intermediary chip 310 are each located in a region of the island portion 301 on the side of the fourth edge 35, in the second direction Y.

As shown in FIG. 89, the island portion 302 is formed adjacent to the lead frames 20C and 20D, in the second direction Y. The island portion 302 is formed so as to overlap with the lead frames 20C and 20D, as viewed in the second direction Y. The island portion 302 and the island portion 301 are aligned along the first direction X. The island portion 302 has, for example, a rectangular shape in a plan view. In an example, the island portion 302 has the long sides extending along the first direction X. The island portion 302 is smaller in size in the second direction Y, than the island portion 301. The island portion 302 is smaller in size in the first direction X, than the island portion 301. As viewed in the second direction Y, the edge of the island portion 302 on the side of the second edge 34 overlaps with the lead frame 20C. The edge of the island portion 302 on the side of the first edge 33 overlaps with the lead frame 20D. In addition, as viewed in the second direction Y, the edge of the island portion 302 on the side of the second edge 34 overlaps with the end portion of the semiconductor chip 45X on the side of the second edge 34. The edge of the island portion 302 on the side of the first edge 33 is formed on the side of the second edge 34 of the substrate 30, with respect to the semiconductor chip 46X. The edge of the island portion 302 on the side of the first edge 33 is located on the side of the semiconductor chip 46X in the first direction X, with respect to the center in the first direction X, of a region between the semiconductor chip 45X and the semiconductor chip 46X in the first direction X.

As viewed in the second direction Y, the island portion 302 overlaps with the respective first land portions 308*a* of the wirings 307M to 307Q. However, the island portion 302 is not overlapping with any of the first land portions 308*a* of the wirings 307I to 307L, and 307R. Thus, the island portion 302 overlaps with the lead frames 28M to 28Q, as viewed in the second direction Y. However, the island portion 302 is not overlapping with the lead frames 28I to 28L, and 28R. In other words, the island portion 302 is formed on the side of the first edge 33 of the substrate 30 in the first direction X, with respect to the lead frame 28L. The island portion 302 is formed on the side of the second edge 34 of the substrate 30 in the first direction X, with respect to the lead frame 28R. As shown in FIG. 89 and FIG. 90, the lead frames 28I to 28L are located between the island portion 301 and the island portion 302 in the first direction X.

The control chip 48 is mounted on the island portion 302, via the conductive material MP. Though not shown, the conductive material MP protrudes, in a plan view, from the control chip 48 toward the fourth edge 36 of the substrate 30 and to both sides in the first direction X, but not toward the third edge 35 of the substrate 30. In addition, the conductive material MP remains within the island portion 302. Thus, the size of the island portion 302, in relation to the size of the control chip 48, is determined so as to suppress the conductive material MP from protruding outwardly. The control chip 48 is located at the center of the island portion 302, both in the first direction X and in the second direction Y.

The island portion 301 and the island portion 302 are connected via a connection wiring 305. More precisely, the island portion 301 and the island portion 302 are electrically connected, via the connection wiring 305. The connection wiring 305 extends along the first direction X. The respective edges of the connection wiring 305, the island portion 301, and the island portion 302 on the side of the second region 30A in the second direction Y are linearly aligned. The island portion 302 is connected to the wiring 307U.

The wirings 307A and 307B are formed on the side of the second edge 34 of the substrate 30 in the first direction X, with respect to the island portion 301. The wirings 307C to 307H are formed on the side of the fourth edge 36 of the substrate 30 in the second direction Y, with respect to the island portion 301. The respective first land portions 308*a* of the wirings 307A to 307H each have a rectangular shape in a plan view. In an example, the first land portions 308*a* of the wirings 307A to 307H each have the long sides extending along the first direction X.

The wirings 307A and 307B are the wiring pattern constituting a boot strap circuit including the diode 49U. The wirings 307C and 307D are the wiring pattern constituting a boot strap circuit including the diode 49V. The wirings 307E and 307F are the wiring pattern constituting a boot strap circuit including the diode 49W.

The respective second land portions 308*b* of the wirings 307A to 307C are aligned in the second direction Y, with a clearance between each other in the second direction Y. The second land portions 308*b* of the wiring 307A to 307C are spaced in the first direction X from the end portion of the island portion 301 on the side of the second edge 34. The second land portions 308*b* of the wirings 307A to 307C each have, for example, a rectangular shape in a plan view. In an example, the second land portions 308*b* of the wirings 307A and 307C have the long sides extending along the first direction X. The second land portion 308*b* of the wiring 307B has the long sides extending along the second direction Y.

The second land portion 308*b* of the wiring 307A is spaced in the first direction X from a portion of the island portion 301 on the side of the third edge 35 in the second direction Y. This second land portion 308*b* is formed on the side of the third edge 35 in the second direction Y, with respect to the control chip 47. The first land portion 308*a* of the wiring 307A is formed on the side of the second edge 34, and on the side of the fourth edge 36 of the substrate 30, with respect to the second land portion 308*b* of the wiring 307A. The connection wiring 308*c* of the wiring 307A includes a first portion, a second portion, and a third portion, each of which will be described hereunder. The first portion extends along the second direction Y, from the first land portion 308*a* toward the third edge 35. The second portion extends along the first direction X, from the second land portion 308*b* toward the second edge 34. The third portion is connecting the first portion and the second portion. The third portion extends obliquely, so as to be closer to the fourth edge 36, toward the second edge 34 of the substrate 30.

The second land portion 308*b* of the wiring 307B extends from the center of the island portion 301 in the second direction Y to the end portion on the side of the fourth edge 36 of the substrate 30. On this second land portion 308*b*, the diode 49U is mounted via the conductive material MP, The diode 49U is located in a region on the side of the fourth edge 36, in the second land portion 308*b* of the wiring 307B. Here, the position of the diode 49U in the second land portion 308*b* of the wiring 307B may be modified as desired. The first land portion 308*a* of the wiring 307B is formed on the side of the second edge 34, and on the side of the fourth edge 36 of the substrate 30, with respect to the second land portion 308*b* of the wiring 307B. The connection wiring 308*c* of the wiring 307B includes a first portion, a second portion, and a third portion, each of which will be described hereunder. The first portion extends along the first direction X, from the first land portion 308*a* toward the first edge 33.

The second portion extends along the first direction X, from the second land portion 308*b* toward the second edge 34. The third portion is connecting the first portion and the second portion. The third portion extends obliquely, so as to be closer to the fourth edge 36, toward the second edge 34 of the substrate 30.

The second land portion 308*b* of the wiring 307C is formed in a region on the side of the fourth edge 36 of the substrate 30, with respect to the island portion 301. The second land portion 308*b* of the wiring 307C is formed adjacent to the island portion 301, both in the first direction X and in the second direction Y. The first land portion 308*a* of the wiring 307C is formed on the side of the second edge 34, and on the side of the fourth edge 36 of the substrate 30, with respect to the second land portion 308*b* of the wiring 307C. The connection wiring 308*c* of the wiring 307C includes a first portion, a second portion, and a third portion, each of which will be described hereunder. The first portion extends along the second direction Y, from the first land portion 308*a* toward the third edge 35. The second portion extends along the first direction X, from the second land portion 308*b* toward the second edge 34. The third portion is connecting the first portion and the second portion. The third portion extends obliquely, so as to be closer to the fourth edge 36, toward the second edge 34 of the substrate 30.

The respective second land portions 308*b* of the wirings 307D to 307F are aligned in the first direction X, with a clearance between each other in the first direction X. The second land portions 308*b* of the wirings 307D to 307F are each spaced apart from the end portion of the island portion 301 on the side of the fourth edge 36, in the second direction Y. The second land portions 308*b* of the wirings 307D to 307F each have, for example, a rectangular shape in a plan view. In an example, the second land portions 308*b* of the wirings 307D and 307F have the long sides extending along the first direction X. In an example, the second land portion 308*b* of the wiring 307E has the long sides extending along the second direction Y.

The second land portion 308*b* of the wiring 307D is formed adjacent to the end portion of the island portion 301 on the side of the second edge 34, in the second direction Y. On this second land portion 308*b*, the diode 49V is mounted via the conductive material MP. The diode 49V is located in a region on the side of the first edge 33, in the second land portion 308*b* of the wiring 307D. Here, the position of the diode 49V in the second land portion 308*b* of the wiring 307D may be modified as desired. The first land portion 308*a* of the wiring 307D is formed on the side of the second edge 34, and on the side of the fourth edge 36 of the substrate 30, with respect to the second land portion 308*b* of the wiring 307D. This first land portion 308*a* is formed so as to overlap with the respective first land portions 308*a* of the wirings 307A and 307B, as viewed in the second direction Y. The connection wiring 308*c* of the wiring 307D is formed in a similar shape to that of the connection wiring 308*c* of the wiring 307C. The second portion of the connection wiring 308*c* of the wiring 307D is longer than the second portion of the connection wiring 308*c* of the wiring 307C, and the third portion of the connection wiring 308*c* of the wiring 307D is shorter than the third portion of the connection wiring 308*c* of the wiring 307C.

The second land portion 308*b* of the wiring 307E is formed between the second land portion 308*b* of the wiring 307D and the second land portion 308*b* of the wiring 307F, in the first direction X. The first land portion 308*a* of the wiring 307E is formed on the side of the second edge 34, and on the side of the fourth edge 36 of the substrate 30, with respect to the second land portion 308*b* of the wiring 307E. This first land portion 308*a* is formed on the side of the second edge 34 of the substrate 30, with respect to the second land portions 308*b* of the wirings 307A to 307C. The connection wiring 308*c* of the wiring 307C includes a first portion, a second portion, a third portion, a fourth portion, and a fifth portion, each of which will be described hereunder. The first portion extends along the second direction Y, from the first land portion 308*a* toward the third edge 35. The second portion extends along the second direction Y, from the second land portion 308*b* toward the fourth edge 36. The third portion extends along the first direction X. The third portion is located between the first portion and the second portion, both in the first direction X and in the second direction Y. The fourth portion is connecting the first portion and an end of the third portion. The fifth portion is connecting the second portion and the other end of the third portion. The fourth portion and the fifth portion each extend obliquely, so as to be closer to the fourth edge 36, toward the second edge 34 of the substrate 30.

On the second land portion 308*b* of the wiring 307F, the diode 49W is mounted via the conductive material MP. The diode 49W is located in a region on the side of the first edge 33, in the second land portion 308*b* of the wiring 307F. Here, the position of the diode 49W in the second land portion 308*b* of the wiring 307F may be modified as desired. The first land portion 308*a* of the wiring 307F is formed on the side of the second edge 34, and on the side of the fourth edge 36 of the substrate 30, with respect to the second land portion 308*b* of the wiring 307F. The first land portion 308*a* of the wiring 307F is formed so as to overlap with the respective second land portions 308*b* of the wirings 307A to 307C, as viewed in the second direction Y. The connection wiring 308*c* of the wiring 307F is formed in a similar shape to that of the connection wiring 308*c* of the wiring 307E. The respective lengths of the first to fifth portions of the connection wiring 308*c* of the wiring 307F are different from those of the corresponding portions of the connection wiring 308*c* of the wiring 307E.

The wiring 307G is a first power source pattern that supplies the source voltage VCC to each of the control chip 47 and the intermediary chip 310. The wiring 307H is a first ground pattern connected to the island portion 301, on which the control chip 47 and the intermediary chip 310 are mounted. The first land portion 308*a* of the wiring 307G is formed so as to overlap with the second land portion 308*b* of the wiring 307F, as viewed in the second direction Y. The first land portion 308*a* of the wiring 307H is formed so as to overlap with the end portion of the control chip 47 on the side of the first edge 33, as viewed in the second direction Y.

Figure 91:
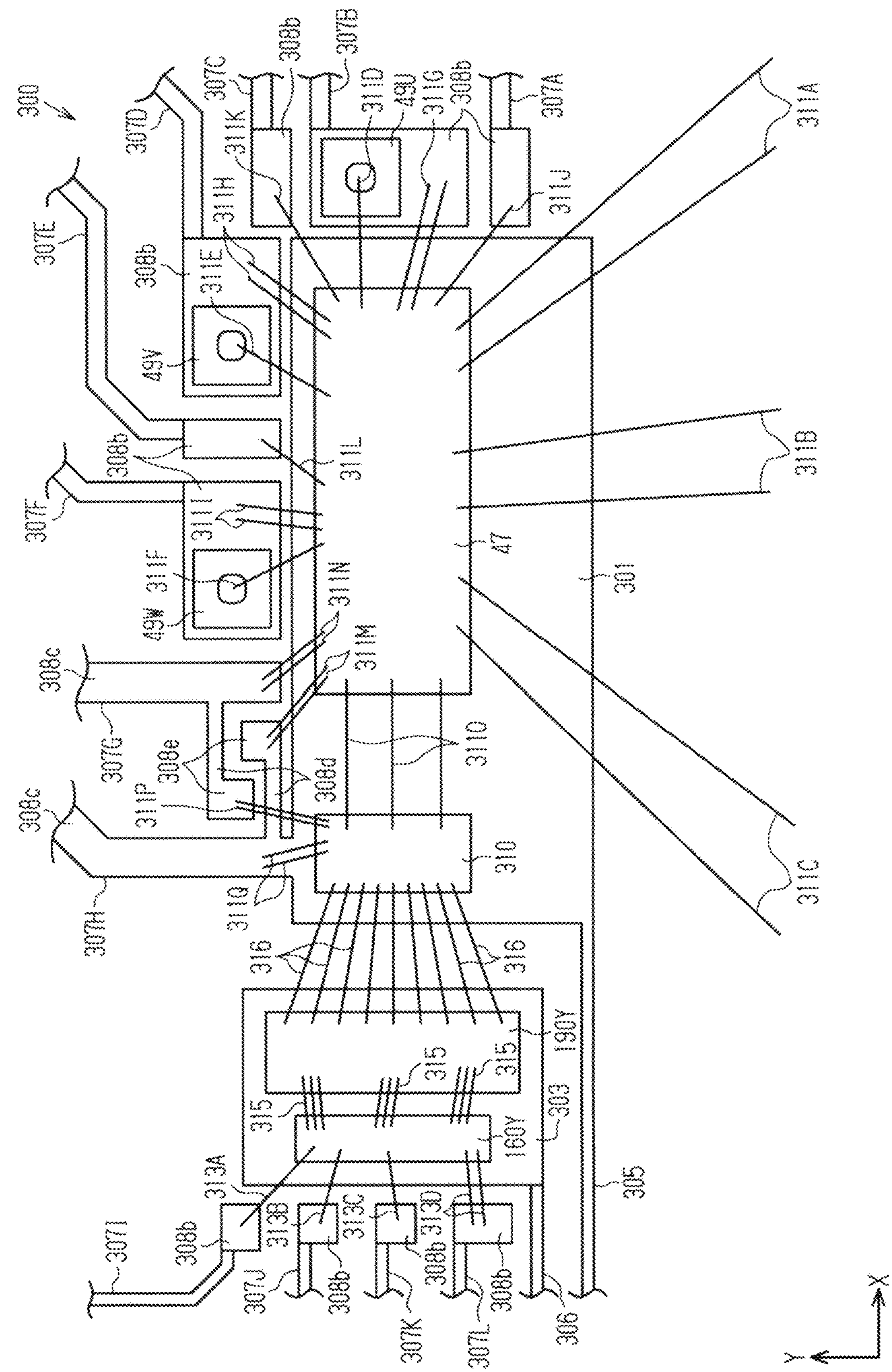
FIG. 91 is an enlarged view of a control circuit chip and a periphery thereof in FIG. 90.

The wirings 307G and 307H each include a branch wiring 308*d*, branched from the connection wiring 308*c* (see FIG. 91). The branch wiring 308*d* includes a land portion 308*e*. The respective connection wirings 308*c* of the wirings 307G and 307H are thicker than that of the wiring 307A to 307F. The connection wirings 308*c* of the wirings 307G and 307H have similar shapes to each other, except for the following difference. The connection wiring 308*c* of the wiring 307H is connected to the island portion 301. In contrast, the connection wiring 308*c* of the wiring 307H is not connected to the island portion 301. The connection wirings 308*c* of the wirings 307G and 307H each include a first portion, a second portion, and a third portion, each of which will be described hereunder. The first portion extends along the first direction, from the first land portion 308*a* toward the third edge 35. The second portion extends obliquely from the first portion, so as to be closer to the third edge 35, toward the first edge 33 of the substrate 30. The third portion extends along the second direction Y, from the end portion of the second portion on the side of the first edge 33 and on the side of the third edge 35, toward the island portion 301.

Since the wiring 307H is connected to the island portion 301, the lead frame 28U and the lead frame 28H are electrically connected, via the wiring 307H, the island portion 301, the connection wiring 305, the island portion 302, and the wiring 307U. Therefore, the lead frame 28A and the lead frame 28H are electrically connected to each other, via the wiring pattern 300 on the substrate 30. Thus, the wiring pattern 300 includes the ground pattern on which the control chip 47 and the control chip 48 are mounted.

The respective branch wirings 308*d* of the wirings 307G and 307H are aligned in the second direction Y, with a clearance therebetween in the second direction Y. The branch wiring 308*d* of the wiring 307H is formed between the island portion 301 and the branch wiring 308*d* of the wiring 307G, in the second direction Y. The branch wiring 308*d* of the wiring 307G extends along the first direction X, from the connection wiring 308*c* of the wiring 307G toward the first edge 33. The land portion 308*e* of this branch wiring 308*d* is formed at the distal end portion of the branch wiring 308*d*. This land portion 308*e* extends along the second direction Y, from the distal end portion of the branch wiring 308*d* toward the island portion 301. The branch wiring 308*d* of the wiring 307H extends along the first direction X, from the connection wiring 308*c* of the wiring 307H toward the second edge 34. The land portion 308*e* of this branch wiring 308*d* is formed at the distal end portion of the branch wiring 308*d*. This land portion 308*e* extends along the second direction Y, from the distal end portion of the branch wiring 308*d* toward the fourth edge 36. These land portions 308*e* each have, for example, a rectangular shape in a plan view. In an example, these land portions 308*e* each have the long sides extending along the second direction Y.

As shown in FIG. 91, the control chip 47 is electrically connected to the semiconductor chips 41X to 43X, the diodes 49U to 49W, the intermediary chip 310, and the wirings 307A to 307G, via wires 311A to 311O, exemplifying the first connection material. The intermediary chip 310 is electrically connected to the wirings 307G and 307H, via wires 311P and 311Q. The wires 311O to 311Q are connected to the face of the intermediary chip 310 opposite in the third direction Z to the face via which the intermediary chip 310 is mounted on the island portion 301. The wires 311A to 311Q are, for example, formed of gold (Au). The respective wire diameters of the wires 311A to 311Q connected to the control chip 47 are equal to each other, and finer than the wire diameter of the wires 24A to 24F. Here, the wire diameters of the wires 311A to 311Q, expressed as "equal to each other", may differ by within ±5% from the wire diameter of each other.

The second electrodes GP of the semiconductor chips 41X to 43X are connected to the control chip 47, via the wires 311A to 311C, respectively. The first electrodes SP of the semiconductor chips 41X to 43X are connected to the control chip 47, via another line of the wires 311A to 311C, respectively. The diodes 49U to 49W have the first electrode (e.g., anode) connected to the control chip 47, via the wires 311D to 311F, respectively. The second electrode (e.g., cathode) of the diode 49U is electrically connected to the lead frame 28B, via the wiring 307B. The second electrode (e.g., cathode) of the diode 49V is electrically connected to the lead frame 28D, via the wiring 307D. The second electrode (e.g., cathode) of the diode 49W is electrically connected to the lead frame 28F, via the wiring 307F.

The control chip 47 is also electrically connected to the second land portion 308*b* of the wiring 3073, via two wires 311G. The control chip 47 is also electrically connected to the second land portion 307*b* of the wiring 307D, via two wires 311H. Further, the control chip 47 is electrically connected to the second land portion 307*b* of the wiring 307F, via two wires 311I. Respective first end portions of the two wires 311G are connected to a position on the second land portion 308*b* of the wiring 307B, on the side of the third edge 35 with respect to the diode 49U. Respective second end portions of the two wires 311G are connected to the end portion of the control chip 47 on the side of the second edge 34, in the first direction X. The second end portions of the two wires 311G are each connected to a position on the control chip 47 on the side of the third edge 35 in the second direction Y, with respect to the center of the control chip 47 in the second direction Y. Respective first end portions of the two wires 311H are connected to a position on the second land portion 308*b* of the wiring 307D, on the side of the second edge 34. Respective second end portions of the two wires 311H are connected to the end portion of the control chip 47 on the side of the second edge 34, in the first direction X. The second end portions of the two wires 311H are connected to the end portion of the control chip 47 on the side of the fourth edge 36. Respective first end portions of the two wires 311I are connected to a position on the second land portion 308*b* of the wiring 307F, on the side of the second edge 34. Respective second end portions of the two wires 311I are connected to the end portion of the control chip 47 on the side of the fourth edge 36, in the second direction Y. The second end portions of the two wires 311I are each connected to a position on the control chip 47 on the side of the first edge 33 in the first direction X, with respect to the center of the control chip 47 in the first direction X. The second end portions of the two wires 311I are each connected to a position on the control chip 47 between the second end portion of the wire 311L and the second end portion of the wire 311F, in the first direction X.

A first end portion of the single-line wire 311J, connecting the wiring 307A and the control chip 47, is connected to the end portion of the second land portion 308*b* of the wiring 307A on the side of the first edge 33. A second end portion of the wire 311J is connected to the end portion of the control chip 47 on the side of the second edge 34, in the first direction X. The second end portion of the wire 311J is connected to the end portion of the control chip 47 on the side of the third edge 35, in the second direction Y. The second end portion of the wire 311J is connected to a position on the control chip 47 on the side of the third edge 35 in the second direction Y, with respect to the second end portion of the wire 311G.

A first end portion of the single-line wire 311K, connecting the wiring 307C and the control chip 47, is connected to the end portion of the second land portion 308*b* of the wiring 307C on the side of the first edge 33. A second end portion of the wire 311K is connected to the end portion of the control chip 47 on the side of the second edge 34, in the first direction X. The second end portion of the wire 311K is connected to the end portion of the control chip 47 on the side of the fourth edge 36, in the second direction Y. The second end portion of the wire 311K is connected to a position on the control chip 47 on the side of the fourth edge 36 in the second direction Y, with respect to the second end portion of the wire 311D.

A first end portion of the single-line wire 311L, connecting the wiring 307E and the control chip 47, is connected to the end portion of the second land portion 308*b* of the wiring 307C on the side of the third edge 35. A second end portion of the wire 311L is connected to the end portion of the control chip 47 on the side of the fourth edge 36, in the second direction Y. The second end portion of the wire 311L is connected to the center of the control chip 47 in the first direction X. The second end portion of the wire 311L is connected to a position on the control chip 47 between the second end portion of the wire 311E and the second end portion of the wire 311I, in the second end portion.

Respective first end portions of two wires 311M, connecting the wiring 307H and the control chip 47, are connected to the distal end portion of the connection wiring 308*c* of the wiring 307H. Respective second end portions of the two wires 311M are connected to the end portion of the control chip 47, on the side of the fourth edge 36 in the second direction Y. The second end portions of the two wires 311M are connected to the end portion of the control chip 47, on the side of the first edge 33 in the first direction X. The second end portions of the two wires 311M are each connected to a position on the control chip 47 on the side of the first edge 33 in the first direction X, with respect to the second end portion of the wire 311N.

Respective first end portions of two wires 311N, connecting the wiring 307G and the control chip 47, are connected to the land portion 308*e* of the connection wiring 308*c* of the wiring 307G. Respective second end portions of the two wires 311N are connected to the end portion of the control chip 47, on the side of the fourth edge 36 of the substrate 30 in the second direction Y. The second end portions of the two wires 311N are each connected to a position on the control chip 47 on the side of the second edge 34 in the first direction X, with respect to the wire 311M. The second end portions of the two wires 311N are each connected to a position on the control chip 47 on the side of the first edge 33 in the first direction X, with respect to the second end portion of the wire 311F.

The control chip 47 and the intermediary chip 310 are connected via three wires 311O. Respective first end portions of the three wires 311O are connected to the end portion of the intermediary chip 310 on the side of the second edge 34. Respective second end portions of the three wires 311O are connected to the end portion of the control chip 47 on the side of the first edge 33. The three wires 311O are aligned in the second direction Y, with a clearance between each other. In this embodiment, the three wires 311O are parallel to each other, in a plan view.

Respective first end portions of two wires 311P, connecting the intermediary chip 310 and the wiring 307G, are connected to the land portion 308*e* of the wiring 307G. Respective second end portions of the two wires 311P are connected to the end portion of the intermediary chip 310, on the side of the second edge 34 in the first direction X. The second end portions of the two wires 311P are connected to the end portion of the intermediary chip 310, on the side of the fourth edge 36. Accordingly, the intermediary chip 310 can receive the source voltage VCC, through the wiring 307G.

Respective first end portions of two wires 311Q, connecting the intermediary chip 310 and the wiring 307H, are connected to the end portion of the connection wiring 308*c* of the wiring 307H, on the side of the island portion 301. Respective second end portions of the two wires 311Q are connected to the end portion of the intermediary chip 310, on the side of the fourth edge 36 in the second direction Y. The second end portions of the two wires 311Q are connected to the center of the intermediary chip 310 in the first direction X, or a position on the side of the second edge 34, with respect to the center of the intermediary chip 310 in the first direction X.

The island portion 303 is formed in a region on the side of the first edge 33 of the substrate 30, with respect to the island portion 301. The island portion 303 is formed adjacent to the island portion 301, with a clearance therefrom in the first direction X. The island portion 303 is formed on the side of the first edge 33 with respect to the lead frame 28H, in other words with respect to the wiring 307H (see FIG. 90). The island portion 303 has, for example, a rectangular shape in a plan view. In an example, the island portion 303 has the long sides extending along the second direction Y. The edge of the island portion 303 on the side of the third edge 35 is located on the side of the fourth edge 36, with respect to the edge of the island portion 301 on the side of the third edge 35. The island portion 303 protrudes toward the fourth edge 36, with respect to the island portion 301.

On the island portion 303, the primary-side circuit chip 160Y and the transformer chip 190Y are mounted, via the conductive material MP. The primary-side circuit chip 160Y and the transformer chip 190Y are aligned in the first direction X, with a clearance therebetween. The primary-side circuit chip 160Y and the transformer chip 190Y each have, for example, a rectangular shape in a plan view. In an example, the primary-side circuit chip 160Y and the transformer chip 190Y each have the long sides extending along the second direction Y. In this embodiment, the primary-side circuit chip 160Y is smaller in size in the first direction X and the second direction Y, than the transformer chip 190Y. The transformer chip 190Y is larger in size in the second direction Y, than the intermediary chip 310. In addition, as shown in FIG. 90, the intermediary chip 310, the primary-side circuit chip 160Y, and the transformer chip 190Y are located such that the respective centers in the second direction Y coincide with each other.

The primary-side circuit chip 160Y is electrically connected to the lead frames 28I to 28L, via the wirings 307I to 307L respectively. The lead frames 28I to 28L are located on the side of the first edge 33 of the substrate 30, with respect to the island portion 303. In an example, the wiring 307I is the first signal pattern that transmits the control signal for the semiconductor chip 41X to the primary-side circuit chip 160Y. The wiring 307J is the first signal pattern that transmits the control signal for the semiconductor chip 42X to the primary-side circuit chip 160Y. The wiring 307K is the first signal pattern that transmits the control signal for the semiconductor chip 43X to the primary-side circuit chip 160Y. The wiring 307L is the power source pattern that supplies the source voltage VCC to the primary-side circuit chip 160Y.

The respective second land portions 308*b* of the wirings 307I to 307L are aligned along the second direction Y, with a clearance between each other in the second direction Y. These second land portions 308*b* are aligned in the order of second land portion 308*b* of the wiring 307I, that of the wiring 307J, that of the wiring 307K, and that of the wiring 307L, from the side of the fourth edge 36 of the substrate 30. These second land portions 308*b* are formed in a region on the side of the second edge 34 of the substrate 30, with respect to the first land portion 308*a* of the wiring 307I.

The connection wiring 308*c* of the wiring 307I includes a first portion, a second portion, and a third portion, each of which will be described hereunder. The first portion extends along the second direction Y, from the first land portion 308*a* toward the third edge 35. The second portion extends along the first direction X, from the second land portion 308*b* toward the first edge 33. The third portion is connecting the first portion and the second portion. The third portion extends obliquely so as to be closer to the fourth edge 36, toward the first edge 33 of the substrate 30. The respective connection wirings 308*c* of the wirings 307J to 307L each have a similar shape to that of the connection wiring 308*c* of the wiring 307I. The second portion and the third portion of the connection wiring 308*c* become longer, in the order of wiring 307J, wiring 307K, and wiring 307L.

As shown in FIG. 91, the primary-side circuit chip 160Y and the wirings 307I to 307L are connected via wires 313A to 313D, exemplifying the first connection material. The wires 313A to 313D are connected to the face of the primary-side circuit chip 160Y opposite in the third direction Z to the face via which the primary-side circuit chip 160Y is mounted on the island portion 303. The single-line wire 313A is connecting the primary-side circuit chip 160Y and the second land portion 308*b* of the wiring 307I. The wire 313A is connected to the end portion of the primary-side circuit chip 160Y, on the side of the first edge 33 in the first direction X. The wire 313A is connected to the end portion of the primary-side circuit chip 160Y, on the side of the fourth edge 36 in the second direction Y. The single-line wire 313B is connecting the primary-side circuit chip 160Y and the second land portion 308*b* of the wiring 307J. The wire 313B is connected to the end portion of the primary-side circuit chip 160Y, on the side of the first edge 33 in the first direction X. The wire 313B is connected to a position on the primary-side circuit chip 160Y on the side of the third edge 35, with respect to the wire 313A. The single-line wire 313C is connecting the primary-side circuit chip 160Y and the second land portion 308*b* of the wiring 307K. The wire 313C is connected to the end portion of the primary-side circuit chip 160Y, on the side of the first edge 33 in the first direction X. The wire 313C is connected to the center of the primary-side circuit chip 160Y in the first direction X, or a position on the side of the third edge 35, with respect to the center of the primary-side circuit chip 160Y in the first direction X. Two wires 313D are connecting the primary-side circuit chip 160Y and the second land portion 308*b* of the wiring 307L. The wires 313D are connected to the end portion of the primary-side circuit chip 160Y, on the side of the first edge 33 of the substrate 30 in the first direction X. The wires 313D are connected to the end portion of the primary-side circuit chip 160Y, on the side of the third edge 35 in the second direction Y. The wires 313D are each connected to a position on the primary-side circuit chip 160Y, on the side of the third edge 35 in the second direction Y with respect to the wire 313C.

The primary-side circuit chip 160Y and the transformer chip 190Y are connected via plurality of wires 315, exemplifying the third connection material. The transformer chip 190Y and the intermediary chip 310 are connected via plurality of wires 316, exemplifying the fourth connection material. The plurality of wires 315 are connected to the respective faces of the primary-side circuit chip 160Y and the transformer chip 190Y, opposite in the third direction Z to the faces via which the primary-side circuit chip 160Y and the transformer chip 190Y are mounted on the island portion 303. Respective first end portions of the plurality of wires 316 are connected to the face of the transformer chip 190Y, opposite in the third direction Z to the face via which the transformer chip 190Y is mounted on the island portion 303. Respective second end portions of the plurality of wires 316 are connected to the face of the intermediary chip 310, opposite in the third direction Z to the face via which the intermediary chip 310 is mounted on the island portion 301.

The wirings 307S to 307U and the island portion 304 are formed around the island portion 302. The wirings 307S to 307U are formed on the side of the first edge 33 of the substrate 30, with respect to the island portion 302. The island portion 304 is formed on the side of the fourth edge 36 of the substrate 30, with respect to the island portion 302. The wirings 307S to 307U each have a similar shape to that of the wirings 205S to 205U according to the eighth embodiment. The connection wiring 308*c* of the wiring 307U is thicker than the connection wiring 308*c* of the wirings 307A to 307T. The wiring 307S is the signal pattern that supplies the detection voltage CIN to the control chip 48. The wiring 307T is the power source pattern that supplies the source voltage VCC to the control chip 48.

The island portion 302 and the island portion 301 are connected via the connection wiring 305. Accordingly, the wiring 307U, the island portion 302, and the island portion 301 are electrically connected to the lead frame 28U constituting the second GND terminal. A first end portion of the connection wiring 305 is connected to the end portion of the island portion 302, on the side of the second edge 34 in the first direction X. The first end portion of the connection wiring 305 is connected to the end portion of the island portion 302, on the side of the third edge 35 in the second direction Y. A second end portion of the connection wiring 305 is connected to the end portion of the island portion 301, on the side of the first edge 33 in the first direction X. The second end portion of the connection wiring 305 is connected to the end portion of the island portion 301, on the side of the third edge 35 in the second direction Y. The connection wiring 305 extends along the first direction X. The edge of the connection wiring 305 on the side of the third edge 35 of the substrate 30 in the second direction Y coincides with the respective edges of the island portions 301 and 302 on the side of the third edge 35 of the substrate 30, in the second direction Y.

The control chip 47 is mounted on the island portion 302, via the conductive material MP. In this embodiment, the control chip 47 is located at the central position of the island portion 302, in the first direction X and in the second direction Y. Here, the position of the control chip 47 in the island portion 302 may be modified as desired.

The island portion 304 has, for example, a rectangular shape in a plan view. In an example, the island portion 304 has the long sides extending along the first direction X. The wirings 307L to 307R are formed in a region on the side of the fourth edge 35 of the substrate 30, with respect to the island portion 304. The wiring 307M is the second signal pattern that transmits the control signal for the semiconductor chip 44X to the primary-side circuit chip 160Y. The wiring 307N is the second signal pattern that transmits the control signal for the semiconductor chip 45X to the primary-side circuit chip 160Y. The wiring 307O is the second signal pattern that transmits the control signal for the semiconductor chip 46X to the primary-side circuit chip 160Y. The wiring 307P is the signal pattern that transmits the fault detection signal FO from the primary-side circuit chip 160Y to the lead frame 28P. The wiring 307Q is the signal pattern that transmits the temperature detection signal VOT to the primary-side circuit chip 160Y. The wiring 307R is the ground pattern, on which the primary-side circuit chip 160Y and the transformer chip 190Y are mounted, together with the island portion 304.

The island portion 302 and the island portion 304 are formed so as to overlap with the lead frames 28M to 28Q, as viewed in the second direction Y. In other words, the island portion 302 and the island portion 304 are formed so as to overlap with the respective first land portions 308*a* of the wirings 307M to 307Q, as viewed in the second direction Y. In a region on the side of the fourth edge 36 of the substrate 30 with respect to the island portion 304, the respective second land portions 308*b* of the wirings 307L to 307Q are formed. These second land portions 308*b* are aligned along the first direction X, with a clearance between each other in the first direction X. The wiring 307L connected to the lead frame 28L constituting the third VCC terminal includes a second land portion 308*x* independent from the second land portion 308*b*, and a connection wiring 308*y* independent from the connection wiring 308*c*. Thus, the wiring 307L supplies the source voltage VCC to each of the primary-side circuit chip 160Y and the primary-side circuit chip 160Z.

The respective second land portions 308*b* of the wiring 307L to 307P are formed so as to overlap with the control chip 48, the primary-side circuit chip 160Z, and the transformer chip 190Z, as viewed in the second direction Y. The second land portion 308*b* of the wiring 307Q is formed so as to overlap with the control chip 48 and the transformer chip 190Z, as viewed in the second direction Y. In addition, the second land portion 308*b* of the wiring 307Q is formed on the side of the first edge 33 of the substrate 30, with respect to the primary-side circuit chip 160Z.

The second land portion 308*x* of the wiring 307L has a rectangular shape, in a plan view. In an example, the second land portion 308*x* has the long sides extending along the first direction X. The second land portion 308*x* is formed so as to protrude toward the second edge 34 in the first direction X, from the primary-side circuit chip 160Z. The first land portion 308*a* of the wiring 307L is formed on the side of the second edge 34 of the substrate 30 in the first direction X, with respect to the second land portion 308*x*. The first land portion 308*a* of the wiring 307L is formed on the side of the fourth edge 36 in the second direction Y, with respect to the second land portion 308*x*. The connection wiring 308*y* includes a first portion, a second portion, and a third portion, each of which will be described hereunder. The first portion extends along the second direction Y, from the first land portion 308*a* toward the third edge 35. The second portion extends along the first direction X, from the second land portion 308*x* toward the second edge 34. The third portion is connecting the first portion and the second portion. The third portion extends obliquely, so as to be closer to the fourth edge 36, toward the second edge 34 of the substrate 30.

The first land portion 308*a* of the wiring 307M is formed on the side of the second edge 34 of the substrate 30 in the first direction X, with respect to the second land portion 308*b* of the wiring 307M. The first land portion 308*a* of the wiring 307M is formed on the side of the fourth edge 36 of the substrate 30 in the second direction Y, with respect to the second land portion 308*b* of the wiring 307M. This first land portion 308*a* is formed on the side of the second edge 34, and on the side of the fourth edge 36 of the substrate 30, with respect to the second land portion 308*b* of the wiring 307L. The connection wiring 308*c* of the wiring 307M can be divided into a first portion, a second portion, a third portion, a fourth portion, and a fifth portion. The first portion extends along the second direction Y, from the first land portion 308*a* toward the third edge 35. The second portion extends along the second direction Y, from the second land portion 308*b* toward the fourth edge 36. The third portion extends along the first direction X. The third portion is located between the first portion and the second portion, both in the first direction X and in the second direction Y. The fourth portion is connecting an end of the third portion and the second portion. The fifth portion is connecting the other end of the third portion and the first portion. The fourth portion and the fifth portion each extend obliquely, so as to be closer to the fourth edge 36, toward the second edge 34 of the substrate 30.

The first land portion 308*a* of the wiring 307N is formed on the side of the second edge 34 of the substrate 30 in the first direction X, with respect to the second land portion 308*b* of the wiring 307N. The first land portion 308*a* of the wiring 307N is formed on the side of the fourth edge 36 of the substrate 30 in the second direction Y, with respect to the second land portion 308*b* of the wiring 307N. This first land portion 308*a* is formed so as to overlap with the second land portion 308*x* of the wiring 307L, as viewed in the second direction Y. The connection wiring 308*c* of the wiring 307N has a similar shape to that of the connection wiring 308*c* of the wiring 307M. The first portion of the connection wiring 308*c* of the wiring 307N is shorter than the first portion of the connection wiring 308*c* of the wiring 307M, and the third portion and the fourth portion of the connection wiring 308*c* of the wiring 307N are shorter than the third portion and the fourth portion of the connection wiring 308*c* of the wiring 307M.

The first land portion 308*a* of the wiring 307O is formed on the side of the second edge 34 of the substrate 30 in the first direction X, with respect to the second land portion 308*b* of the wiring 307O, The first land portion 308*a* of the wiring 307O is formed on the side of the fourth edge 36 of the substrate 30 in the second direction Y, with respect to the second land portions 308*b* of the wiring 307O. The first land portion 308*a* of the wiring 307O is formed so as to overlap with the respective second land portions 308*b* of the wirings 307M and 307N, as viewed in the second direction Y. The connection wiring 308*c* of the wiring 307O includes a first portion, a second portion, and a third portion, each of which will be described hereunder. The first portion extends along the second direction Y, from the first land portion 308*a* toward the third edge 35. The second portion extends along the second direction Y, from the second land portion 308*b* toward the fourth edge 36. The third portion is connecting the first portion and the second portion. The third portion extends obliquely, so as to be closer to the fourth edge 36, toward the second edge 34 of the substrate 30.

The first land portion 308*a* of the wiring 307P is formed so as to overlap with the second land portion 308*b* of the wiring 307P, as viewed in the second direction Y. The connection wiring 308*c* of the wiring 307P extends along the second direction Y.

The first land portion 308*a* of the wiring 307Q is formed so as to overlap with the second land portion 308*b* of the wiring 307Q, as viewed in the second direction Y. The connection wiring 308*c* of the wiring 307Q extends along the second direction Y. The second land portion 308*b* of the wiring 307Q is formed in a rectangular shape, having the long sides extending along the first direction X.

The wiring 307R is connected to the island portion 304. The connection wiring 308*c* of the wiring 307R includes a first portion, a second portion, and a third portion, each of which will be described hereunder. The first portion extends along the second direction Y, from the first land portion 308*a* toward the third edge 35. The second portion extends from the island portion 304 toward the first edge 33. The third portion is connecting the first portion and the second portion.

The third portion extends obliquely, so as to be closer to the fourth edge 36, toward the first edge 33 of the substrate 30.

The island portion 304 and the island portion 303 are connected via a connection wiring 306. The wiring 307R, the island portion 304, the connection wiring 306, and the island portion 303 are electrically connected to the lead frame 28R constituting the third GND terminal.

Figure 92:
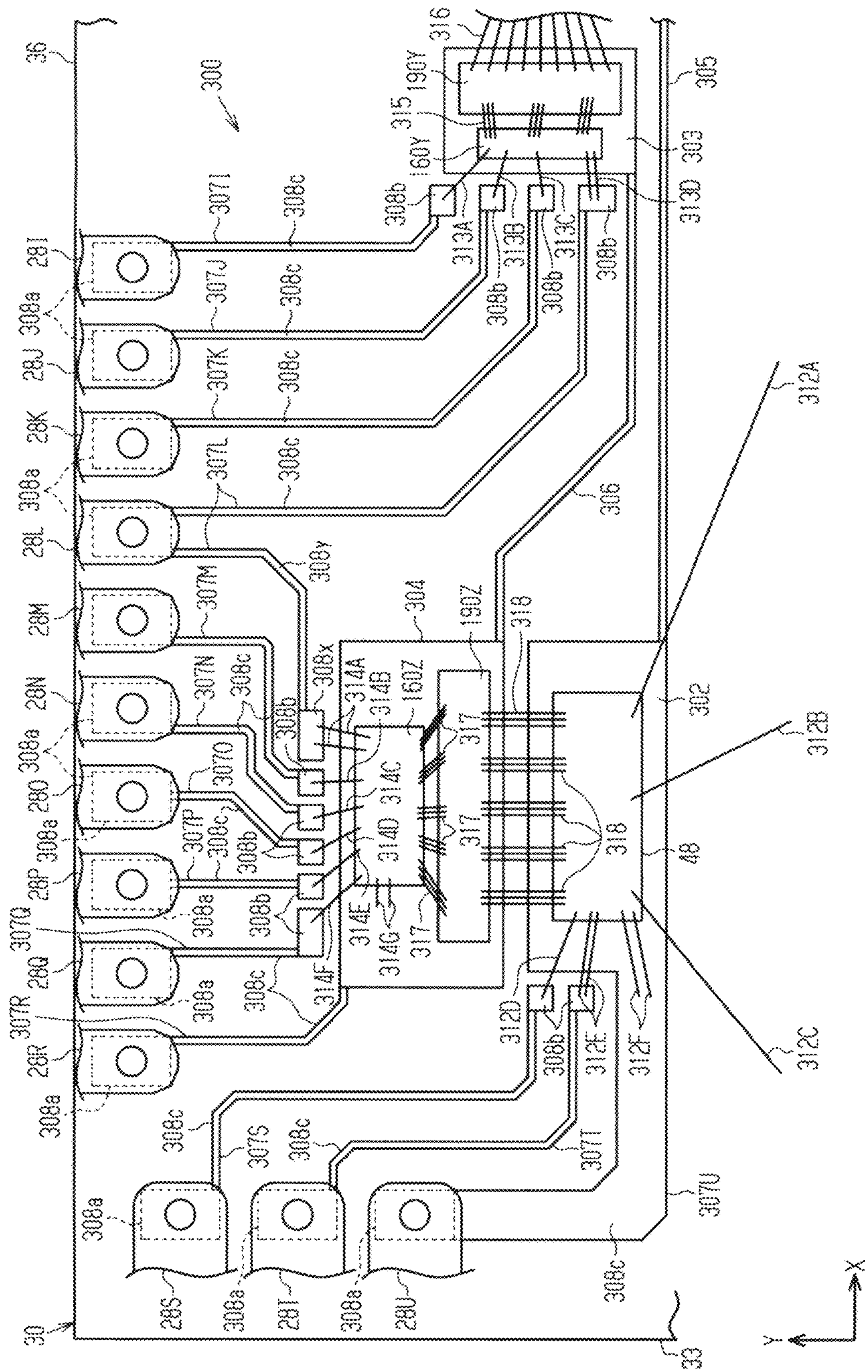
FIG. 92 is an enlarged view of the control circuit chip and the periphery thereof in FIG. 90.

As shown in FIG. 92, the control chip 48 is electrically connected to the semiconductor chips 44X to 46X and the wirings 307S to 307U, via the wires 312A to 312F exemplifying the first connection material. The primary-side circuit chip 160Z is electrically connected to the wirings 307L to 307Q, via the wires 314A to 314F exemplifying the first connection material. The primary-side circuit chip 160Z is also electrically connected to the island portion 304, via the wire 314G. The wires 314A to 314F are connected to the face of the primary-side circuit chip 160Z opposite in the third direction Z to the face via which the primary-side circuit chip 160Z is mounted on the island portion 304. The primary-side circuit chip 160Z and the transformer chip 190Z are connected via a plurality of wires 317, exemplifying the third connection material. The transformer chip 190Z and the control chip 48 are connected via a plurality of wires 318, exemplifying the fourth connection material. The plurality of wires 317 are connected to the faces of the primary-side circuit chip 160Z and the transformer chip 190Z, opposite in the third direction Z to the faces via which the primary-side circuit chip 160Z and the transformer chip 190Z are mounted on the island portion 304. Respective first end portions of the plurality of wires 318 are connected to the face of the transformer chip 190Z, opposite in the third direction Z to the face via which the transformer chip 190Z is mounted on the island portion 304. Respective second end portions of the plurality of wires 318 are connected to the face of the control chip 48, opposite in the third direction Z to the face via which the control chip 48 is mounted on the island portion 302. The wires 312A to 312F, 314A to 314G, 317, and 318 are, for example, formed of gold (Au). The respective wire diameters of the wires 312A to 312F, 314A to 314G, 317, and 318 are equal to each other, and also equal to the wire diameter of the wires 311A to 311Q. Here, the wire diameters of the wires 312A to 312F, 314A to 314G, 317, and 318, expressed as "equal to each other", may differ by within ±5% of the wire diameter. Likewise, the wire diameters of the wires 312A to 312F, 314A to 314G, 317, and 318, expressed as "equal to the wire diameter of the wires 311A to 311Q", may differ by within ±5% of the wire diameter.

The gates of the semiconductor chips 44X to 46X are connected to the control chip 48 via the wires 312A to 312C, respectively. The wire 312A is connected to the end portion of the control chip 48 on the side of the second edge 34 in the first direction X. The wire 312A is connected to the end portion of the control chip 48 on the side of the third edge 35 in the second direction Y. The wire 3123 is connected to the end portion of the control chip 48 on the side of the third edge 35 in the second direction Y. The wire 3123 is connected to a position on the control chip 48 on the side of the second edge 34 in the first direction X, with respect to the center of the control chip 48 in the first direction X. The wire 312C is connected to the end portion of the control chip 48 on the side of the first edge 33 in the first direction X. The wire 312C is connected to the end portion of the control chip 48 on the side of the third edge 35 in the second direction Y.

A first end portion of the wire 312D is connected to the second land portion 308*b* of the wiring 307S. A second end portion of the wire 312D is connected to the end portion of the control chip 48, on the side of the first edge 33 in the first direction X. The second end portion of the wire 312D is connected to a position on the control chip 48 on the side of the fourth edge 36 in the second direction Y, with respect to the center of the control chip 48 in the second direction Y. A first end portion of the wire 312E is connected to the second land portion 308*b* of the wiring 307T. A second end portion of the wire 312E is connected to the end portion of the control chip 48, on the side of the first edge 33 in the first direction X. The second end portion of the wire 312E is connected to the center of the control chip 48 in the second direction Y, or a position on the side of the fourth edge 36, with respect to the center of the control chip 48 in the second direction Y. The second end portion of the wire 312E is connected to a position on the control chip 48 on the side of the third edge 35 in the second direction Y, with respect to the second end portion of the wire 312D. A first end portion of the wire 312F is connected to the connection wiring 308*c* of the wiring 307U. A second end portion of the wire 312F is connected to the end portion of the control chip 48, on the side of the first edge 33 in the first direction X. The second end portion of the wire 312E is connected to the end portion of the control chip 48, on the side of the third edge 35 in the second direction Y.

Respective first end portions of two wires 314A, out of the wires 314A to 314F connecting the primary-side circuit chip 160Z and the wirings 307L to 307Q, are connected to the second land portion 308*x* of the wiring 307L. Respective second end portions of the two wires 314A are connected to the end portion of the primary-side circuit chip 160Z, on the side of the fourth edge 36 in the second direction Y. The second end portions of the two wires 314A are connected to the end portion of the primary-side circuit chip 160Z, on the side of the second edge in the second direction Y. A first end portion of the single-line wire 314B is connected to the second land portion 308*b* of the wiring 307M. A second end portion of the wire 314B is connected to the end portion of the primary-side circuit chip 160Z, on the side of the fourth edge 36 in the second direction Y. The second end portion of the wire 314B is connected to a position on the primary-side circuit chip 160Z on the side of the second edge 34 in the first direction X, with respect to the center of the primary-side circuit chip 160Z in the first direction X. A first end portion of the single-line wire 314C is connected to the second land portion 308*b* of the wiring 307N. A second end portion of the wire 314C is connected to the end portion of the primary-side circuit chip 160Z, on the side of the fourth edge 36 in the second direction Y. The second end portion of the wire 314C is connected to the center of the primary-side circuit chip 160Z in the first direction X. The second end portion of the wire 314C is connected to a position on the primary-side circuit chip 160Z between the second portion of the wire 314B and the second portion of the wire 314D, in the first direction X. A first end portion of the single-line wire 314D is connected to the second land portion 308*b* of the wiring 307O. A second end portion of the wire 314D is connected to the end portion of the primary-side circuit chip 160Z, on the side of the fourth edge 36 of the substrate 30 in the second direction Y. The second end portion of the wire 314D is connected to a position on the primary-side circuit chip 160Z on the side of the first edge 33 in the first direction X, with respect to the center of the primary-side circuit chip 160Z in the first direction X. A first end portion of the single-line wire 314E is connected to the second land portion 308*b* of the wiring 307P. A second end portion of the wire 314E is connected to the end portion of the primary-side circuit chip 160Z, on the side of the fourth edge 36 of the substrate 30 in the second direction Y. The second end portion of the wire 314E is connected to a position on the primary-side circuit chip 160Z on the side of the first edge 33 in the first direction X, with respect to the second end portion of the wire 314D in the first direction X. A first end portion of the single-line wire 314F is connected to the second land portion 308*b* of the wiring 307Q. A second end portion of the wire 314F is connected to the end portion of the primary-side circuit chip 160Z, on the side of the fourth edge 36 in the second direction Y. The second end portion of the wire 314F is connected to the end portion of the primary-side circuit chip 160Z, on the side of the first edge 33 in the first direction X.

Respective first end portions of the plurality of wires 317 are connected to the end portion of the primary-side circuit chip 1602, on the side of the third edge 35 in the second direction Y. The first end portions of the plurality of wires 317 are connected to the primary-side circuit chip 160Z, with a clearance between each other in the first direction X. Respective second end portions of the plurality of wires 317 are connected to the end portion of the transformer chip 190Z, on the side of the fourth edge 36 in the second direction Y. The second end portions of the plurality of wires 317 are connected to the transformer chip 190Z, with a clearance between each other in the first direction X. The clearances between the second end portions of the plurality of wires 317 in the first direction X are wider than the clearances between the first end portions of the plurality of wires 317 in the first direction X.

Respective first end portions of the plurality of wires 318 are connected to the end portion of the transformer chip 190Z, on the side of the third edge 35 of the substrate 30 in the second direction Y. The first end portions of the plurality of wires 318 are spaced apart from each other in the first direction X. Respective second end portions of the plurality of wires 318 are connected to the end portion of the control chip 48, on the side of the fourth edge 36 in the second direction Y. The second end portions of the plurality of wires 318 are spaced apart from each other in the first direction X. The clearances between the first end portions of the plurality of wires 318 in the first direction X are equal to the clearances between the second end portions of the plurality of wires 318 in the first direction X.

Advantageous Effects

This embodiment provides the following advantageous effects, in addition to those provided by the eighth embodiment.

(4-1) The semiconductor package 1 includes the primary-side circuit chip 160Y and the transformer chip 190Y, configured to transmit the control signal for the semiconductor chips 41X to 43X to the control chip 47, and the primary-side circuit chip 160Z and the transformer chip 190Z, configured to transmit the control signal for the semiconductor chips 44X to 46X to the control chip 48. Therefore, the structure of the control chip 48 can be simplified, compared with the case where the control signal for the semiconductor chips 41X to 43X is transmitted to the control chip 47 through the control chip 48. In addition, the lead frames 28I to 28R are separately distributed to the primary-side circuit chip 160Y and the primary-side circuit chip 160Z, in other words the concentration of the wirings to one of the primary-side circuit chips can be prevented. Therefore, the wirings between the primary-side circuit chip 160Y and the lead frames 28I to 28K (wiring 307I to 307K), as well as the wirings between the primary-side circuit chip 160Z and the lead frames 28L to 28R (wiring 307L to 307R), can be prevented from being congested.

(4-2) The lead frames 28A to 28H are located close to the second edge 34 of the substrate 30. Especially, the lead frame 28H, closest to the lead frame 28I among the lead frames 28A to 28H, is located on the side of the second edge 34, with respect to the end portion of the island portion 301 on the side of the first edge 33 of the substrate 30. Such an arrangement allows the lead frames 28I to 28K, electrically connected to the primary-side circuit chip 160Y, to be located on the side of the second edge 34 of the substrate 30. Thus, the lead frames 28I to 28K can be brought closer to the primary-side circuit chip 160Y. As result, the wirings 307I to 307K can be shortened. In addition, the size of the substrate 30 in the first direction X can be reduced, and consequently the size of the semiconductor package 1 in the first direction X can be reduced.

(4-3) The island portion 303 and the island portion 304 are connected via the connection wiring 306. Accordingly, the lead frame 28R constituting the second GND terminal and the island portion 304 are connected via the wiring 307R, and the island portion 304 and the island portion 303 are connected via the connection wiring 306. Therefore, the exclusive GND terminal connected to the island portion 303 can be excluded. Consequently, an increase in number of terminals of the semiconductor package 1 can be suppressed.

Eleventh Embodiment

Figure 93:
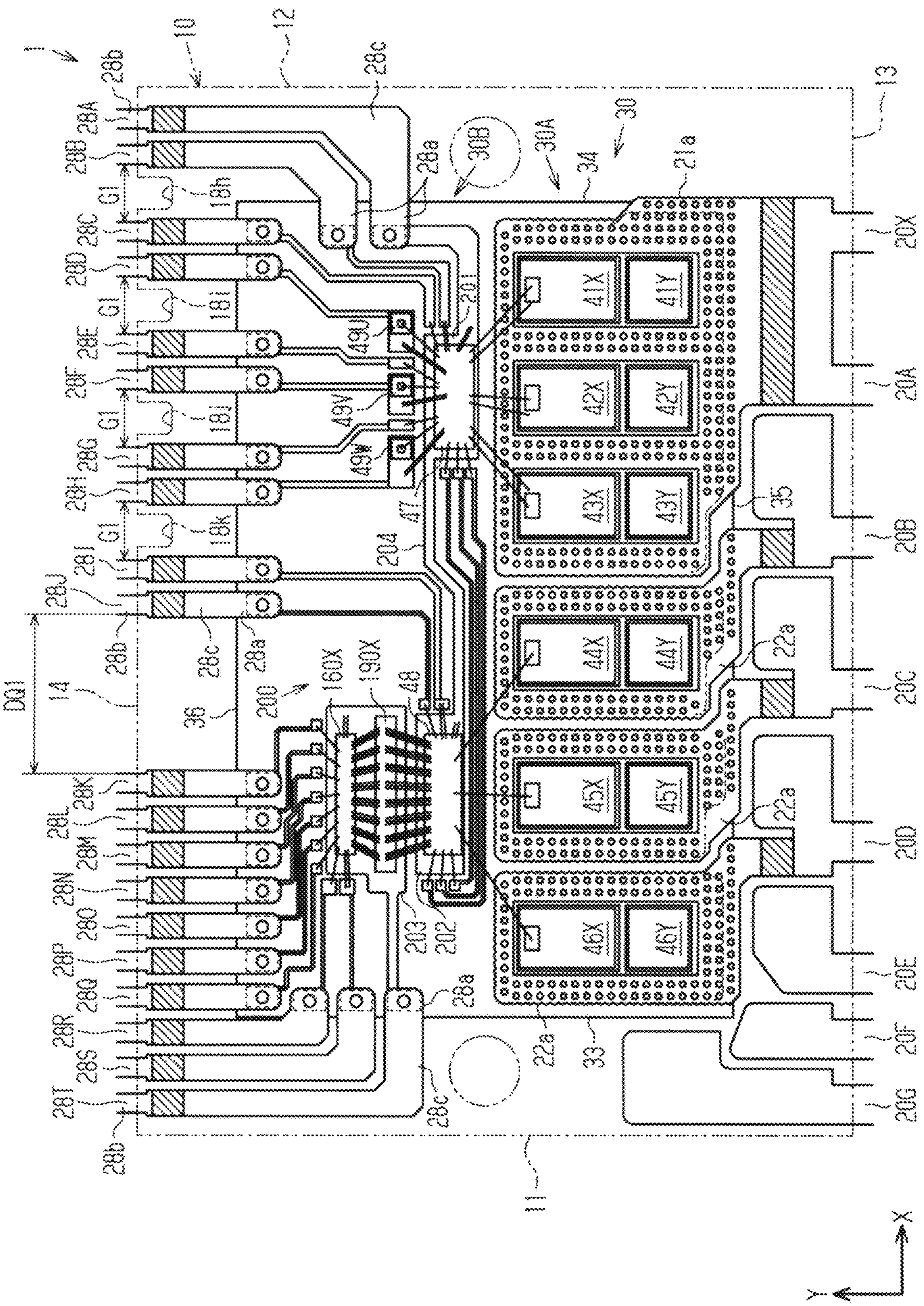
FIG. 93 is a plan view showing an internal configuration of a semiconductor package according to an eleventh embodiment.
Figure 94:
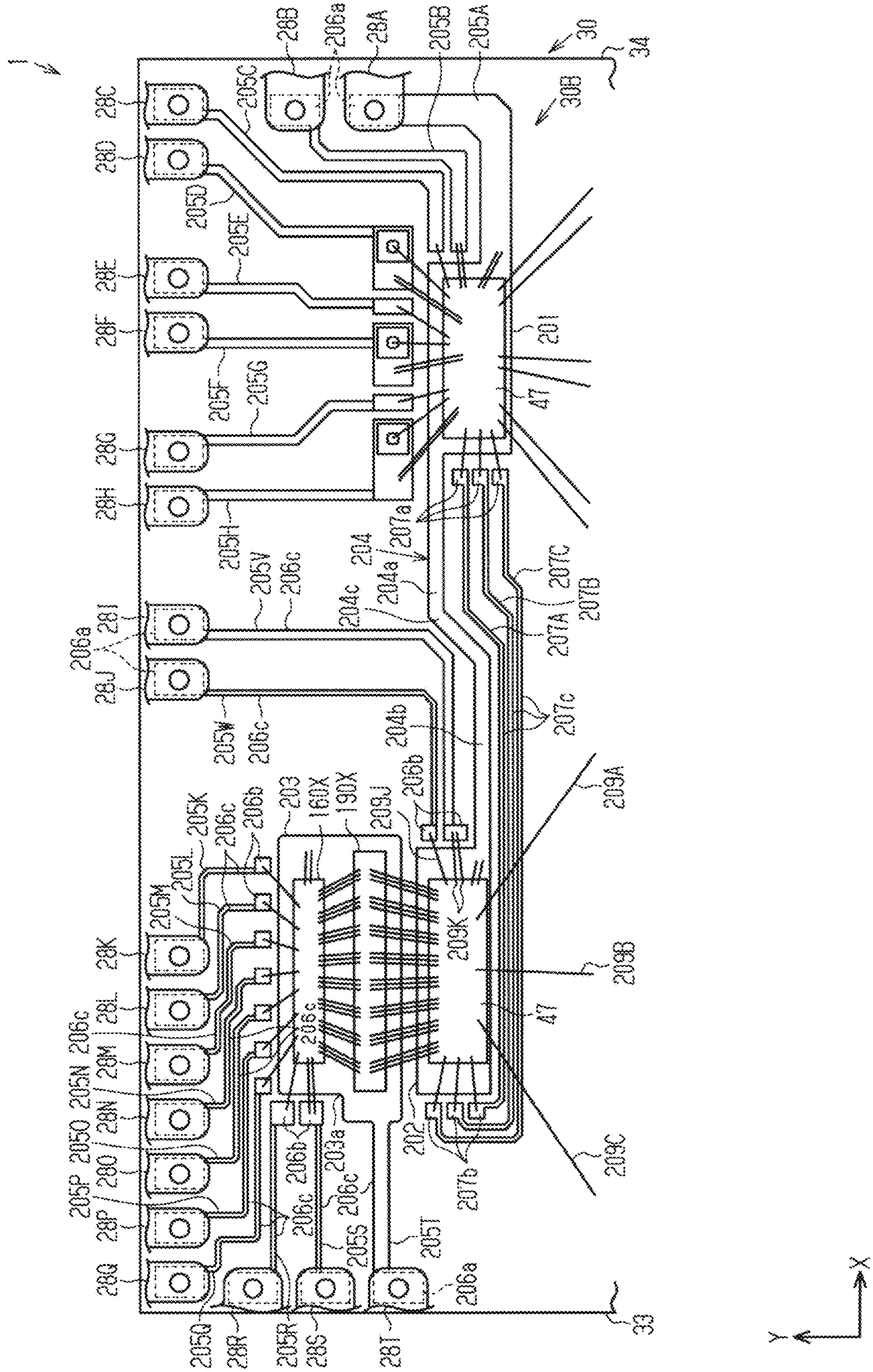
FIG. 94 is an enlarged view of a control wiring region in FIG. 93.

Referring to FIG. 93 and FIG. 94, a semiconductor package 1 according to an eleventh embodiment will be described. The semiconductor package 1 according to this embodiment is different from the semiconductor package 1 according to the eighth embodiment, mainly in the arrangement of the lead frames 28A to 28T. The difference in arrangement of the lead frames 28A to 28T leads to differences in shape of the wirings 205A to 205T corresponding to the lead frames 28A to 28T. In the description given hereunder, similar elements to those of the eighth embodiment will be given the same numeral, and a part or the whole of the description thereof may be omitted. In FIG. 93, the wires 24A to 24F are omitted, for the sake of clarity.

The semiconductor package 1 according to this embodiment includes the lead frames 28A to 28T. In this embodiment, the terminal arrangement of the lead frames 28A to 28T is as follows. The lead frames 28A to 28J are secondary-side lead frames each constituting the terminal of the secondary-side circuit 170 (secondary-side circuit 670 shown in FIG. 49) of the semiconductor package 1. The lead frames 28K to 28T are primary-side lead frames each constituting the terminal of the primary-side circuit 160 (primary-side circuit 660 shown in FIG. 49) of the semiconductor package 1. In an example, the lead frame 28A constitutes the first GND terminal. The lead frame 28B constitutes the first VCC terminal. The lead frame 28C constitutes the VSU terminal. The lead frame 28D constitutes the VBU terminal. The lead frame 28E constitutes the VSV terminal. The lead frame 28F constitutes the VBV terminal. The lead frame 28G constitutes the VSW terminal. The lead frame 28H constitutes the VBW terminal. The lead frame 28I constitutes the first VCC terminal. The lead frame 28J constitutes the CIN terminal (detection terminal CIN).

The lead frame 28K constitutes the HINU terminal. The lead frame 28L constitutes the HINV terminal. The lead frame 28M constitutes the HINW terminal. The lead frame 28N constitutes the LINU terminal. The lead frame 28O constitutes the LINV terminal. The lead frame 28P constitutes the LINW terminal. The lead frame 28Q constitutes the FO terminal. The lead frame 28R constitutes the VOT terminal. The lead frame 28S constitutes the third VCC terminal. The lead frame 28T constitutes the third GND terminal. Thus, the lead frames 28A to 28T according to this embodiment are set up by excluding the frame constituting the second GND terminal, from the lead frames 28A to 28U according to the eighth embodiment.

The lead frames 28A to 28J are located in the region on the side of the second edge 34 of the substrate 30 in the first direction X, with respect to the lead frames 28K to 28T. The lead frames 28C to 28J are aligned in the first direction X with a clearance between each other. More specifically, the lead frames 28C to 28J are aligned in the order of lead frame 28C, lead frame 28D, lead frame 28E, lead frame 28F, lead frame 28G, lead frame 28H, lead frame 28I, and lead frame 28J, from the side of the second edge 34, toward the first edge 33 of the substrate 30. The lead frame 28C is located at the end portion of the substrate 30, on the side of the second edge 34 in the first direction X. Between the lead frame 28B and the lead frame 28C, a recess 18*h* of the first resin 10 is provided. Between the lead frame 28O and the lead frame 28E, a recess 18*i* of the first resin 10 is provided. Between the lead frame 28F and the lead frame 28G, a recess 18*j* of the first resin 10 is provided. Between the lead frame 28H and the lead frame 28I, a recess 18*k* of the first resin 10 is provided. The recesses 18*h*, 18*i*, 18*j*, and 18*k* have the same shape as each other. The lead frame 28B and the lead frame 28C, the lead frame 28O and the lead frame 28E, the lead frame 28F and the lead frame 28G, and the lead frame 28H and the lead frame 28I, are spaced apart from each other by a first gap G1.

The respective bonding portions 28*a* of the lead frames 28A and 28B are located on the side of the third edge 35 in the second direction Y, with respect to the respective bonding portions 28*a* of the lead frames 28C to 28J. The bonding portions 28*a* of the lead frames 28A and 28B are spaced apart from each other in the second direction Y. The bonding portion 28*a* of the lead frame 28B is located on the side of the fourth edge 36 of the substrate 30 in the second direction Y, with respect to the bonding portion 28*a* of the lead frame 28A. The bonding portions 28*a* of the lead frames 28A and 28B are formed so as to overlap with the lead frame 28C, as viewed in the second direction Y. The lead frames 28A and 28B each have an L-shape, in a plan view.

The respective bonding portions 28*a* of the lead frames 28A to 28I are located so as to overlap with the island portion 21*a* of the lead frame 20A, as viewed in the second direction Y. The bonding portions 28*a* of the lead frames 28A to 28C are located on the side of the second edge 34 of the substrate 30 in the first direction X, with respect to the semiconductor chip 41X. The lead frame 28D is located so as to overlap with the semiconductor chip 41X, as viewed in the second direction Y. The lead frames 28A to 28D are located on the side of the second edge 34 of the substrate 30 in the first direction X, with respect to the control chip 47 and the diodes 49U to 49W.

The bonding portion 28*a* of the lead frame 28E is located on the side of the first edge 33 of the substrate 30 in the first direction X, with respect to the diode 49U. The bonding portion 28*a* of the lead frame 28E is located at a position corresponding to the region between the semiconductor chip 41X and the semiconductor chip 42X, in the first direction X. The bonding portion 28*a* of the lead frame 28E is located so as to overlap with the control chip 47, as viewed in the second direction Y. The bonding portion 28*a* of the lead frame 28F is located so as to overlap with the diode 49V, the control chip 47, and the semiconductor chip 42X, as viewed in the second direction Y. The bonding portion 28*a* of the lead frame 28G is located so as to overlap with the diode 49W and the end portion of the control chip 47 on the side of the first edge 33 of the substrate, as viewed in the second direction Y. The bonding portion 28*a* of the lead frame 28G is located at a position corresponding to the region between the semiconductor chip 42X and the semiconductor chip 43X, in the first direction X. The bonding portion 28*a* of the lead frame 28H is located on the side of the first edge 33 of the substrate 30 in the first direction X, with respect to the diode 49W and the control chip 47. The bonding portion 28*a* of the lead frame 28H is located so as to overlap with the semiconductor chip 43X, as viewed in the second direction Y.

The bonding portion 28*a* of the lead frame 28I is located so as to overlap with the end portion of the island portion 21*a* of the lead frame 20A on the side of the first edge 33, as viewed in the second direction Y. The bonding portion 28*a* of the lead frame 28J is located on the side of the first edge 33 of the substrate 30, with respect to the island portion 21*a*. The bonding portion 28*a* of the lead frame 28J is located so as to overlap with the island portion 22*a* of the lead frame 20B, as viewed in the second direction Y.

The respective bonding portions 28*a* of the lead frames 28K to 28R are located on the side of the first edge 33 of the substrate 30, compared with the respective bonding portions 28*a* of the lead frames 28K to 28R according to the eighth embodiment. The bonding portions 28*a* of the lead frames 28K to 28R are located on the side of the first edge 33 of the substrate 30 in the first direction X, with respect to the island portion 22*a* of the lead frame 20B. The bonding portions 28*a* of the lead frames 28K to 28R are spaced apart from each other in the first direction X. More specifically, the lead frames 28K to 28R are aligned in the order of lead frame 28K, lead frame 28L, lead frame 28M, lead frame 28N, lead frame 28O, lead frame 28P, lead frame 28Q, and lead frame 28R, from the side of the second edge 34, toward the first edge 33 of the substrate 30.

The respective bonding portions 28*a* of the lead frames 28K to 28M are located so as to overlap with the island portion 22*a* of the lead frame 20C, as viewed in the second direction Y. The respective bonding portions 28*a* of the lead frames 28K and 28L are located so as to overlap with the primary-side circuit chip 160X, the transformer chip 190X, the control chip 48, and the semiconductor chip 45X, as viewed in the second direction Y. The bonding portion 28*a* of the lead frame 28M is located on the side of the first edge 33 of the substrate 30 in the first direction X, with respect to the semiconductor chip 45X. The bonding portion 28*a* of the lead frame 28M is located so as to overlap with the primary-side circuit chip 160X, the transformer chip 190X, and the control chip 48, as viewed in the second direction Y.

The respective bonding portions 28*a* of the lead frames 28N to 28T are located on the side of the first edge 33 of the substrate 30 in the first direction X, with respect to the primary-side circuit chip 160X, the transformer chip 190X, and the control chip 48.

The respective bonding portions 28*a* of the lead frames 28N to 28Q are located so as to overlap with the island portion 22*a* of the lead frame 20D, as viewed in the second direction Y. The bonding portion 28*a* of the lead frame 28N is located on the side of the second edge 34 of the substrate 30 in the first direction X, with respect to the semiconductor chip 46X. The bonding portions 28*a* of the lead frames 28O, 28P are each located so as to overlap with the semiconductor chip 46X, as viewed in the second direction Y. The bonding portion 28*a* of the lead frame 28Q is located on the side of the first edge 33 of the substrate 30 in the first direction X, with respect to the semiconductor chip 46X.

The respective bonding portions 28*a* of the lead frames 28R to 28T are located so as to overlap with the lead frame 28R, as viewed in the second direction Y. The lead frames 28R to 28T each have an L-shape, in a plan view. The bonding portion 28*a* of the lead frame 28R is located on the side of the fourth edge 36 of the substrate 30 in the second direction Y, with respect to the primary-side circuit chip 160X. The bonding portion 28*a* of the lead frame 28S is located so as to overlap with the primary-side circuit chip 160X and the transformer chip 190X, as viewed in the first direction X. The bonding portion 28*a* of the lead frame 28T is located on the side of the fourth edge 36 of the substrate 30 in the second direction Y, with respect to the control chip 48. The bonding portion 28*a* of the lead frame 28T is located so as to overlap with the transformer chip 190X, as viewed in the first direction X.

A distance DQ1 between the lead frames 28A to 28J and the lead frames 28K to 28T in the first direction X, in other words the distance between the lead frame 28J and the lead frame 28K in the first direction X, is longer than the first gap 01. The distance DQ1 serves for insulation between the terminals constituting the primary-side circuit 160 and the terminals constituting the secondary-side circuit 170.

The wiring pattern 200 formed in the first region 303 of the substrate 30 is without the wiring 205U, but further includes wirings 205V and 205W, compared with the wiring pattern 200 according to the eighth embodiment. In this embodiment, the respective first land portions 206*a* of the wirings 205A to 205T, 205V, and 205W have, for example, a rectangular shape in a plan view. In an example, the first land portions 206*a* of the wirings 205A to 205T, 205V, and 205W have the long sides extending along the second direction Y.

The island portion 201 and the wirings 205A to 205H each have a similar shape to that of the island portion 201 and the wirings 205A to 205H according to the eighth embodiment. The island portion 202 is formed on the side of the fourth edge 36 of the substrate 30 in the second direction Y, compared with the island portion 202 according to the eighth embodiment. More specifically, the edge of the island portion 202 on the side of the third edge 35 is located on the side of the fourth edge 36 in the second direction Y, with respect to the edge of the island portion 201 on the side of the third edge 35.

The connection wiring 204 is connecting the end portion of the island portion 201 on the side of the first edge 33, and the end portion of the island portion 202 on the side of the second edge 34, in the first direction X. The connection wiring 204 is also connecting the end portion of the island portion 201 on the side of the fourth edge 36, and the end portion of the island portion 202 on the side of the third edge 35, in the second direction Y. The connection wiring 204 includes a first portion 204*a*, a second portion 204*b*, and a third portion 204*c*, each of which will be described hereunder. The first portion 204*a* extends along the first direction X from the island portion 201. The second portion 204*b* extends along the first direction X from the island portion 202. The second portion 204*b* is located on the side of the third edge 35 of the substrate 30 in the second direction Y, with respect to the first portion 204*a*. The third portion 204*c* is connecting the first portion 204*a* and the second portion 204*b*. The third portion 204*c* extends obliquely, so as to be closer to the fourth edge 36, toward the second edge 34 of the substrate 30.

The wiring 205V is connected to the lead frame 28I. The wiring 205W is connected to the lead frame 28J. The wiring 205V is the power source pattern that supplies, for example, the source voltage VCC to the control chip 48. The wiring 205W is the signal pattern that supplies, for example, the detection voltage CIN to the control chip 48.

The respective second land portions 206*b* of the wirings 205V and 205W are spaced in the first direction X from the end portion of the island portion 202 on the side of the second edge 34. These second land portions 206*b* are aligned in the second direction Y, with a clearance therebetween. The second land portion 206*b* of the wiring 205V is formed between the second land portion 206*b* of the wiring 205W and the second portion 204*b* of the connection wiring 204, in the second direction Y. The respective connection wirings 206*c* of the wirings 205V and 205W have the same shape as each other. These connection wirings 206*c* each include a first portion, a second portion, and a third portion, each of which will be described hereunder. The first portion extends along the second direction Y, from the first land portion 206*a* toward the third edge 35. The second portion extends along the first direction X, from the second land portion 206*b* toward the second edge 34. The third portion is connecting the first portion and the second portion. The third portion is parallel to the third portion 204*c* of the connection wiring 204. The connection wiring 206*c* of the wiring 205V is thicker than the connection wiring 206*c* of the wiring 205W.

The second land portion 206*b* of the wiring 205W and the control chip 48 are connected via the wire 209J. The second land portion 206*b* of the wiring 205V and the control chip 48 are connected via two wires 209K. The wire diameter of the wire 209J and that of the wire 209J are equal to each other. The wire diameter of the wires 209J and 209K is equal to that of the wires connected to the control chip 48, for example the wire 209A. In addition, the wires 209J and 209K are formed of the same material as the wires connected to the control chip 48, for example the wire 209A. The wire 209J is connected to the end portion of the control chip 48 on the side of the second edge 34, in the first direction X. The wire 209J is connected to a position on the control chip 48 on the side of the fourth edge 36 in the second direction Y, with respect to the center of the control chip 48 in the second direction Y. The wire 209K is connected to the end portion of the control chip 48 on the side of the second edge 34, in the first direction X. The wire 209K is connected to the center of the control chip 48 in the second direction Y. Here, the wire diameters of the wires 209J and 209K, expressed as "equal to each other", may differ by within ±5% from the wire diameter of each other. Likewise, the wire diameters of the wires 209J and 209K, expressed as "equal to that of the wires connected to the control chip 48, for example the wire 209A", may differ by within ±5% from the wire diameter of the wires 209J and 209K.

The intermediary wirings 207A to 207C are each formed so as to circumvent the island portion 202, in other words circumvent the control chip 48. More specifically, the respective second land portion 207*b* of the intermediary wirings 207A to 207C are located on the side of the first edge 33 of the substrate 30 in the first direction X, with respect to the island portion 202. The respective connection wirings 207*c* of the intermediary wirings 207A to 207C extend so as to surround the island portion 202 from the side of the first edge 33 and the side of the third edge 35. These connection wirings 207*c* extend so as to surround the connection wiring 204 from the side of the third edge 35. The connection wirings 207*c* of the intermediary wirings 207A to 207C each include a first portion, a second portion, a third portion, and a fourth portion, each of which will be described hereunder. The first portion extends from the first land portion 207*a*, in parallel to the first portion 204*a* of the connection wiring 204. The second portion extends in parallel to the second portion 204*b*. The third portion is connecting the first portion and the second portion. The third portion extends in parallel to the third portion 204*c*. The second portion of the connection wiring 207*c* of each of the intermediary wirings 207A to 207C extends toward the first edge 33 of the substrate 30 in the first direction X, beyond the island portion 202. The fourth portion extends toward the fourth edge 36, from the end portion of the second portion on the side of the first edge 33. The fourth portion is connected to the second land portion 207*b*. The clearance between the second portions of the connection wirings 207*c* of the intermediary wirings 207A to 207C, adjacent to each other in the second direction Y, is narrower than the clearance between the first portions of the connection wirings 207*c*, adjacent to each other in the second direction Y The wirings 205K to 205T are respectively connected to the lead frames 28K to 25T. The wirings 205K to 205T are located around the island portion 203. The island portion 203 only includes the first cutaway portion 203*a*, unlike the island portion 203 according to the eighth embodiment. The first cutaway portion 203*a* is formed in the end portion of the island portion 203, on the side of the first edge 33 in the first direction X. The first cutaway portion 203*a* is formed in a region between the center of the island portion 203 in the second direction Y and the edge thereof on the side of the fourth edge 36, in the second direction Y. The wiring 205K is the first signal pattern that transmits, for example, the control signal for the semiconductor chip 41X to the primary-side circuit chip 160X. The wiring 205L is the first signal pattern that transmits, for example, the control signal for the semiconductor chip 42X to the primary-side circuit chip 160X. The wiring 205M is the first signal pattern that transmits, for example, the control signal for the semiconductor chip 43X to the primary-side circuit chip 160X. The wiring 205N is the second signal pattern that transmits, for example, the control signal for the semiconductor chip 44X to the primary-side circuit chip 160X. The wiring 205O is the second signal pattern that transmits, for example, the control signal for the semiconductor chip 45X to the primary-side circuit chip 160X. The wiring 205P is the second signal pattern that transmits, for example, the control signal for the semiconductor chip 46X to the primary-side circuit chip 160X. The wiring 205Q is the signal pattern that transmits, for example, the detection voltage CIN to the primary-side circuit chip 160X. The wiring 205R is the signal pattern that transmits, for example, the temperature detection signal VOT to the primary-side circuit chip 160X. The wiring 205S is the power source pattern that supplies, for example, the source voltage VCC to the primary-side circuit chip 160X. The wiring 205U is the ground pattern, for example connected to the island portion 203, on which the primary-side circuit chip 160X and the transformer chip 190X are mounted.

The respective second land portions 206*b* of the wirings 205K to 205Q are located on the side of the fourth edge 36 of the substrate 30, with respect to the island portion 203. These second land portions 206*b* are aligned in the first direction X, with a clearance therebetween. The second land portion 206*b* of the wiring 205K is formed on the side of the second edge 34 of the substrate 30 in the first direction X, with respect to the primary-side circuit chip 160X. The second land portion 206*b* of the wiring 205K is formed so as to overlap with the transformer chip 190X, as viewed in the second direction Y. The respective second land portions 206*b* of the wirings 205L to 205P are formed so as to overlap with the primary-side circuit chip 160X, as viewed in the second direction Y. The second land portion 206*b* of the wiring 205Q is formed on the side of the first edge 33 of the substrate 30 in the first direction X, with respect to the primary-side circuit chip 160X. The second land portion 206*b* of the wiring 205Q is formed so as to overlap with the transformer chip 190X, as viewed in the second direction Y. The respective second land portions 206*b* of the wirings 205R and 205S are formed in the first cutaway portion 203*a* of the island portion 203. The second land portions 206*b* of the wirings 205R and 205S are spaced apart from each other in the second direction Y. The second land portion 206*b* of the wiring 205R is formed on the side of the fourth edge 36 of the substrate 30 in the second direction Y, with respect to the primary-side circuit chip 160X. The second land portion 206*b* of the wiring 205R is formed so as to protrude toward the fourth edge 36, from the island portion 203. The second land portion 206*b* of the wiring 205S is formed so as to overlap with the primary-side circuit chip 160X, as viewed in the first direction X.

The first land portion 206*a* of the wiring 205K is formed so as to overlap with the second land portions 206*b* of the wirings 205M and 205N, as viewed in the second direction Y. The first land portion 206*a* of the wiring 205L is located on the side of the first edge 33 of the substrate 30 in the first direction X, with respect to the second land portion 206*b* of the wiring 205N. The first land portion 206*a* of the wiring 205L is formed so as to overlap with the second land portion 206*b* of the wiring 205O, as viewed in the second direction Y. The first land portion 206*a* of the wiring 205M is formed so as to overlap with the second land portions 206*b* of the wirings 205P, 205Q, as viewed in the second direction Y. The first land portion 206*a* of the wiring 205N is formed so as to overlap with the second land portions 206*b* of the wirings 2058 and 2055, as viewed in the second direction Y. The first land portions 206*a* of the wirings 205O to 205Q are formed on the side of the first edge 33 of the substrate 30 in the first direction X, with respect to the second land portions 206*b* of the wirings 205R and 205S.

The connection wiring 206*c* of the wiring 205K is formed so as to secure a space for forming the respective connection wirings 206*c* of the wirings 205K and 205M, between the lead frame 28K and the island portion 203. The connection wiring 206*c* of the wiring 205K includes a first portion, a second portion, and a third portion, each of which will be described hereunder. The first portion extends along the first direction X, from the first land portion 206*a* toward the second edge 34. The second portion extends along the second direction Y, from the second land portion 206*b* toward the fourth edge 36. The third portion is connecting the first portion and the second portion. The connection wiring 206*c* of the wiring 205L is, like the connection wiring 206*c* of the wiring 205K, also formed so as to secure a space for forming the respective connection wirings 206*c* of the wirings 205M and 205N. The connection wiring 206*c* of the wiring 205L includes a first portion, a second portion, a third portion, a fourth portion, and a fifth portion, each of which will be described hereunder. The first portion extends along the second direction Y, from the first land portion 206*a* toward the third edge 35. The second portion extends along the second direction Y. The third portion is connecting the first portion and the second portion. The fourth portion extends along the second direction Y, from the second land portion 206*b* toward the fourth edge 36. The fifth portion is connecting the second portion and the fourth portion. The third portion and the fifth portion each extend obliquely, so as to be closer to the fourth edge 36, toward the first edge 33 of the substrate 30.

The portion of the connection wiring 206*c* of the wiring 205M, on the side of the first edge 33 of the substrate 30 with respect to the connection wiring 206*c* of the wiring 205L, is located at the same position in the second direction Y, as the portion of the connection wiring 206*c* of the wiring 205L extending along the first direction X. The portion of the connection wiring 206*c* of the wiring 205M, overlapping with the connection wiring 206*c* of the wiring 205L as viewed in the second direction Y, is located on the side of the third edge 35 of the substrate 30, with respect to the second portion of the connection wiring 206*c* of the wiring 205L. The clearance in the second direction Y between the portion of the connection wiring 206*c* of the wiring 205M overlapping with the connection wiring 206*c* of the wiring 205L as viewed in the second direction Y, and the second portion of the connection wiring 206*c* of the wiring 205L, is narrower than the clearance in the second direction Y between the second portion of the connection wiring 206*c* of the wiring 205L and the first portion of the connection wiring 206*c* of the wiring 205K. The mentioned configuration allows the space for routing the respective connection wirings 206*c* of the wirings 205N and 205O to be secured.

The connection wiring 206*c* of the wiring 205N has a similar shape to that of the connection wiring 206*c* of the wiring 205M. The clearance in the second direction Y between the portion of the connection wiring 206*c* of the wiring 205N overlapping with the connection wiring 206*c* of the wiring 205M as viewed in the second direction Y, and the second portion of the connection wiring 206*c* of the wiring 205M, is narrower than the clearance in the second direction Y between the second portion of the connection wiring 206*c* of the wiring 205L and the first portion of the connection wiring 206*c* of the wiring 205K. The mentioned configuration allows the space for routing the respective connection wirings 206*c* of the wirings 205O and 205P to be secured.

The connection wiring 206*c* of the wiring 205O is located on the side of the third edge 35 of the substrate 30, with respect to the connection wiring 206*c* of the wiring 205N, in a region of the substrate 30 overlapping with the first land portion 206*a* of the wiring 205M as viewed in the first direction X. The clearance in the second direction Y between the portion of the connection wiring 206*c* of the wiring 205O overlapping with the connection wiring 206*c* of the wiring 205N as viewed in the second direction Y, and the second portion of the connection wiring 206*c* of the wiring 205N, is narrower than the clearance in the second direction Y between the second portion of the connection wiring 206*c* of the wiring 205L and the first portion of the connection wiring 206*c* of the wiring 205K.

The connection wiring 206*c* of the wiring 205P is located on the side of the third edge 35 of the substrate 30, with respect to the connection wiring 206*c* of the wiring 205O, in a region of the substrate 30 overlapping with the first land portion 206*a* of the wiring 205M as viewed in the first direction X. The clearance in the second direction Y between the portion of the connection wiring 206*c* of the wiring 205P overlapping with the connection wiring 206*c* of the wiring 205O as viewed in the second direction Y, and the second portion of the connection wiring 206*c* of the wiring 205O, is narrower than the clearance in the second direction Y between the second portion of the connection wiring 206*c* of the wiring 205L and the first portion of the connection wiring 206*c* of the wiring 205K.

The connection wiring 206*c* of the wiring 205Q extends from the second land portion 206*b* along the first direction X, at the position flush with the edge of the second land portion 206*b* of the wiring 205Q on the side of the fourth edge 36 of the substrate 30. Among the respective connection wirings 206*c* of the wirings 205M to 205Q, as shown in FIG. 94, three of the connection wirings 206*c* are located so as to overlap with each other, as viewed in the second direction Y.

The connection wiring 206*c* of the wirings 205R to 205T each extend along the first direction X. The connection wiring 206*c* of the wiring 205T is connected to the end portion of the island portion 203, on the side of the first edge 33 in the first direction X. The connection wiring 206*c* of the wiring 205T is connected to a position on the island portion 203 on the side of the third edge 35 in the second direction Y, with respect to the center of the island portion 203 in the second direction Y. The connection wiring 206*c* of the wiring 205T is thicker than the respective connection wirings 206*c* of the wirings 205K to 205S.

Here, the wires connected to each of the control chips 47 and 48, the primary-side circuit chip 160X, and the transformer chip 190X are formed similarly to those of the eighth embodiment, and therefore the description of those wires will not be repeated. In addition, those wires are given the same numerals as those in FIG. 81 and FIG. 82, and therefore such numerals are omitted from FIG. 93 and FIG. 94, for the sake of clarity.

Advantageous Effects

This embodiment provides the following advantageous effects, in addition to those provided by the eighth embodiment.

(11-1) The clearance between the second portions of the intermediary wirings 207A to 207C, adjacent to each other in the second direction Y, is narrower than the clearance between the first portions of the intermediary wirings 207A to 207C, adjacent to each other in the second direction Y. Such a configuration allows the distance in the second direction Y between the island portion 202 and the lead frames 20B to 20D to be shortened. Accordingly, the distance between the semiconductor chips 44X to 46X and the control chip 47 can be shortened, and consequently the wires 209A to 209C, connecting the semiconductor chips 44X to 46X and the control chip 47, can be shortened.

Variation of Eleventh Embodiment

Figure 95:
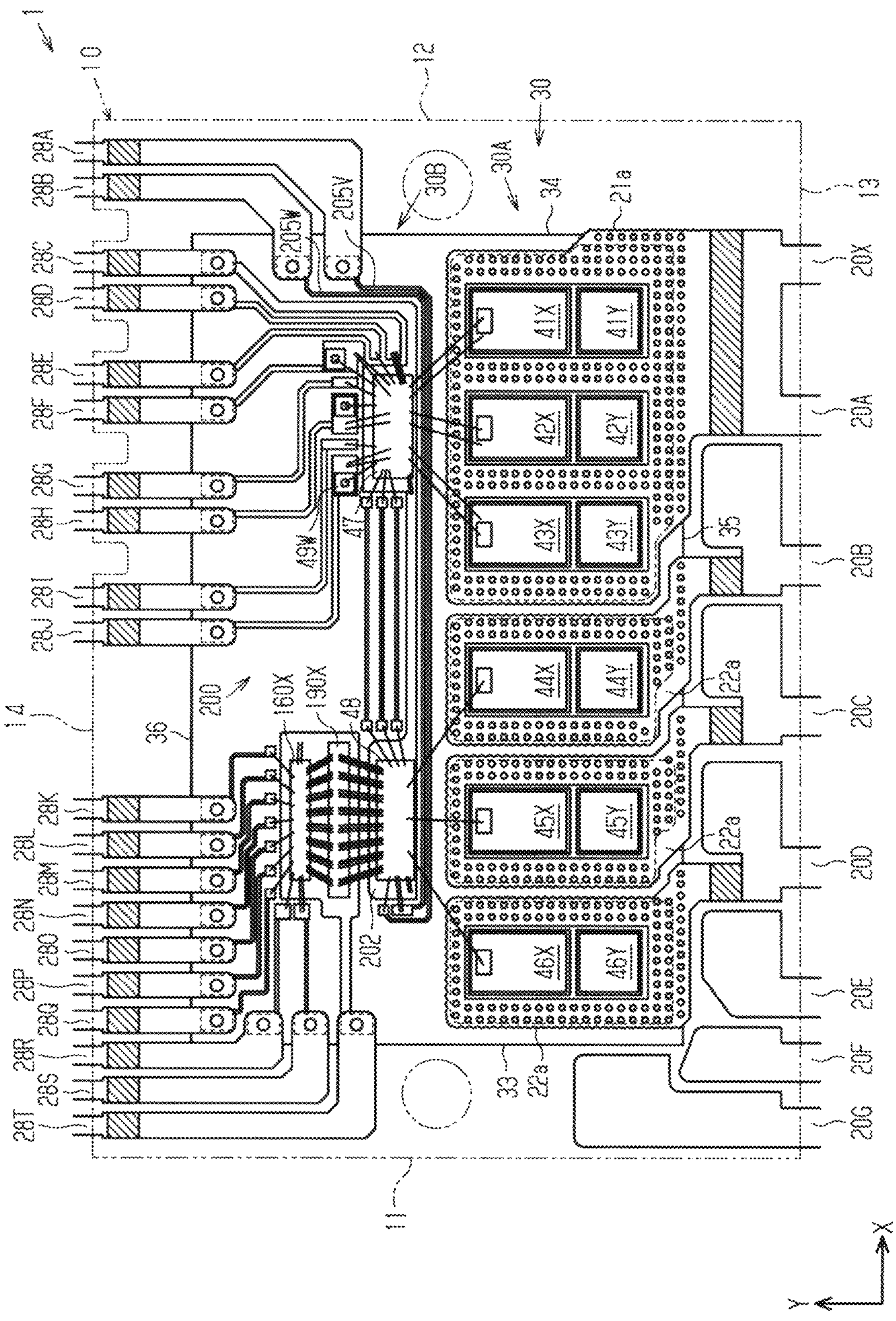
FIG. 95 is a plan view showing an internal configuration of a variation of the semiconductor package according to the eleventh embodiment.
Figure 96:
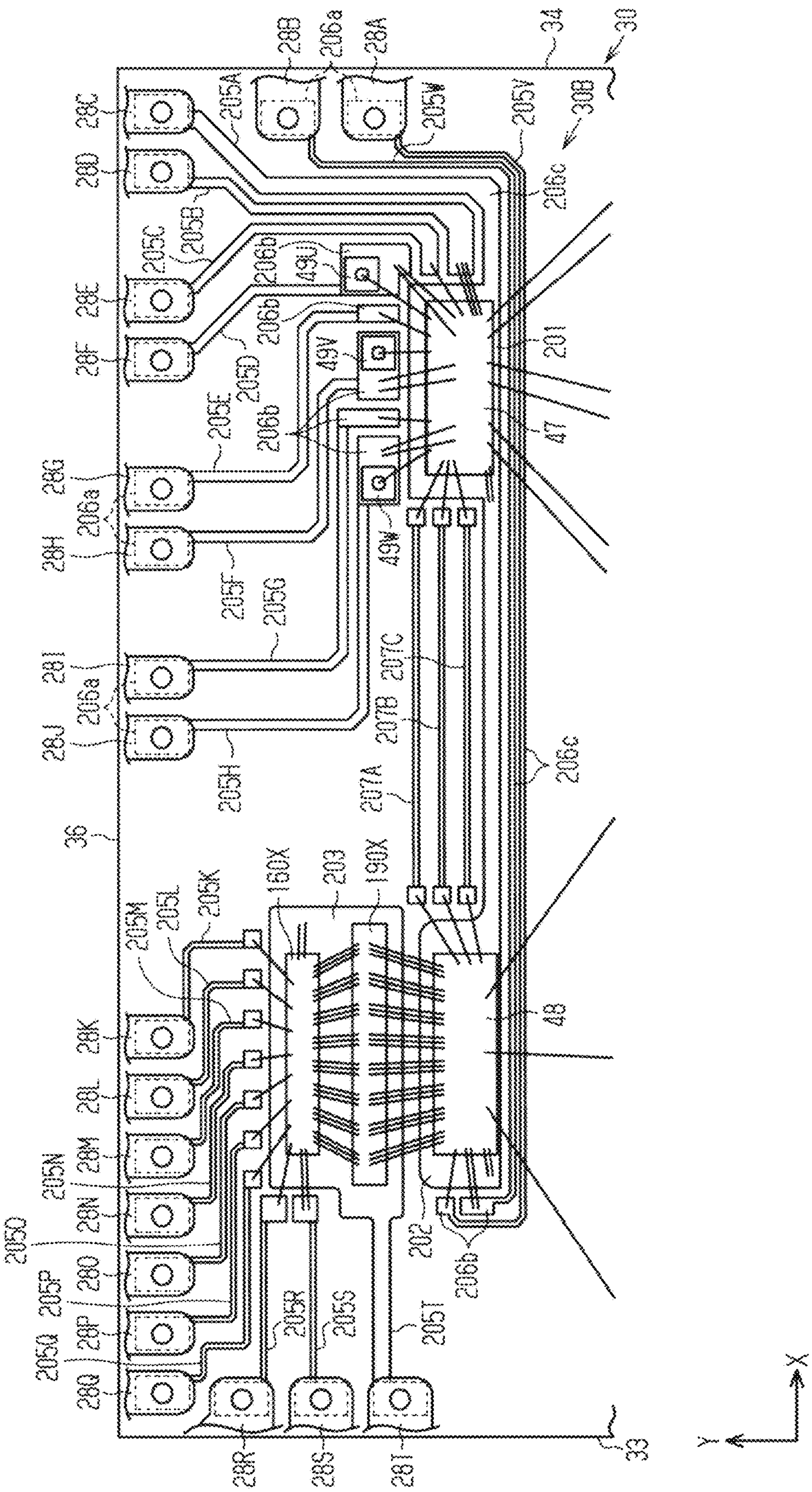
FIG. 96 is an enlarged view of a control wiring region in FIG. 95.

In the eleventh embodiment, the wirings 205V and 205W may be made to circumvent the control chips 47 and 48, so as to surround the same, as shown in FIG. 95 and FIG. 96, instead of utilizing the intermediary wirings 207A to 207C. In this case, the connection wiring 204 and the intermediary wirings 207A to 207C are formed in the same shape as the connection wiring 204 and the intermediary wirings 207A to 207C according to the eighth embodiment. In FIG. 95, the wires 24A to 24F are omitted for the sake of clarity.

As shown in FIG. 95 and FIG. 96, the lead frames 28A to 28J according to this variation constitute the terminals in a different way from the lead frames 28A to 28J according to the eleventh embodiment. In an example, the lead frame 28A constitutes the second VCC terminal. The lead frame 28B constitutes the CIN terminal (detection terminal CIN).

The lead frame 28C constitutes the first GND terminal. The lead frame 28D constitutes the first VCC terminal. The lead frame 28E constitutes the VSU terminal. The lead frame 28F constitutes the VBU terminal. The lead frame 28G constitutes the VSV terminal. The lead frame 28H constitutes the VBV terminal. The lead frame 28I constitutes the VSW terminal. The lead frame 28J constitutes the VBW terminal. Thus, in the semiconductor package 1 according to the variation shown in FIG. 95 and FIG. 96, the second CVV terminal and the CIN terminal (detection terminal CIN) are moved to the lead frames 28A and 28B, which are closest to the second face 12 in the first resin 10, and the remaining terminals, namely the first GND terminal, the first VCC terminal, the VSU terminal, the VBU terminal, the VSV terminal, the VBV terminal, the VSW terminal, and the VBW terminal are shifted to the lead frames subsequent to the lead frame 28C, from the setting of the lead frames 28A to 28J according to the eleventh embodiment.

To the wiring 205A, the lead frame 28C is connected. To the wiring 205B, the lead frame 28D is connected. To the wiring 205C, the lead frame 28E is connected. To the wiring 205D, the lead frame 28F is connected. To the wiring 205E, the lead frame 28G is connected. To the wiring 205F, the lead frame 28H is connected. To the wiring 205G, the lead frame 28I is connected. To the wiring 205H, the lead frame 28J is connected.

The wiring 205A is formed so as to surround the wirings 205B and 205C, from the side of the second edge 34 and the side of the third edge 35. The wiring 205A is connected to the island portion 201. The wiring 205B is formed so as to surround the wiring 205C, from the side of the second edge 34 and the side of the third edge 35.

The wiring 205C is formed so as to surround the wiring 205D, from the side of the second edge 34 and the side of the third edge 35. The wiring 205C includes a portion located on the side of the second edge 34 of the substrate 30, with respect to the bonding portion 28*a* of the lead frame 28E.

The second land portion 206*b* of the wiring 205D, on which the diode 49U is mounted, is located adjacent to the end portion of the island portion 201, on the side of the second edge 34 in the first direction X. The second land portion 206*b* of the wiring 205D is also located adjacent to the end portion of the island portion 201, on the side of the fourth edge 36 in the second direction Y. The diode 49U is located close to the end portion of the second land portion 206*b* on the side of the fourth edge 36. Here, the position of the diode 49U on the second land portion 206*b* of the wiring 205D may be modified as desired.

The respective second land portions 206*b* of the wirings 205E to 205J are located so as to overlap with the island portion 201, as viewed in the second direction Y. The second land portions 206*b* of the wirings 205E to 205J are located on the side of the fourth edge 36 in the second direction Y, with respect to the island portion 201 with a clearance therefrom. The respective second land portions 206*b* of the wirings 205E to 205H are located on the side of the third edge 35 of the substrate 30, with respect to the respective first land portions 206*a* of the wirings 205E to 205H. The respective second land portions 206*b* of the wirings 205E to 205G are located on the side of the second edge 34 of the substrate 30, with respect to the respective first land portions 206*a* of the wirings 2053 to 205H. The second land portion 206*b* of the wiring 205H is located on the side of the second edge 34 of the substrate 30, with respect to the first land portion 206*a* of the wiring 205F.

The connection wirings 206*c* of the wirings 205E and 205F each include a first portion, a second portion, a third portion, a fourth portion, and a fifth portion, each of which will be described hereunder. The first portion extends along the second direction Y, from the first land portion 206*a* toward the third edge 35. The second portion extends along the first direction X. The third portion is connecting the first portion and the second portion. The fourth portion extends along the second direction Y, from the second land portion 206*b* toward the fourth edge 36. The fifth portion is connecting the second portion and the fourth portion. The third portion and the fifth portion each extend obliquely, so as to be closer to the fourth edge 36, toward the first edge 33 of the substrate 30.

The connection wirings 206*c* of the wirings 205G and 205H each include a first portion, a second portion, and a third portion, each of which will be described hereunder. The first portion extends along the second direction Y, from the first land portion 206*a* toward the third edge 35. The second portion extends along the first direction X, from the second land portion 206*b* toward the first edge 33, The third portion is connecting the first portion and the second portion. The third portion extends obliquely, so as to be closer to the fourth edge 36, toward the first edge 33 of the substrate 30.

The wiring 205V is connected to the lead frame 28A. The wiring 205W is connected to the lead frame 283. The respective second land portions 206*b* of the wirings 205V and 205W are formed so as to overlap with the island portion 202, as viewed in the first direction X, in a region on the side of the first edge 33 of the substrate 30, with respect to the island portion 202. The second land portions 206*b* of the wirings 205V and 205W are aligned in the second direction Y, with a clearance therebetween. The second land portion 206*b* of the wiring 205V is formed on the side of the fourth edge 36 of the substrate 30 in the second direction Y, with respect to the second land portion 206*b* of the wiring 205W. The second land portion 206*b* of the wiring 205W has, for example, a rectangular shape in a plan view. In an example, the second land portion 206*b* of the wiring 205W has the long sides extending along the second direction Y.

The respective connection wirings 206*c* of the wirings 205V and 205W are formed so as to surround the wiring 205A, the island portion 201, the connection wiring 204, and the island portion 202. More specifically, the connection wirings 206*c* of the wirings 205V and 205W are formed on the side of the second edge 34 of the substrate 30 in the first direction X, with respect to the connection wiring 206*c* of the wiring 205A. The connection wirings 206*c* of the wirings 205V and 205W are formed on the side of the third edge 35 of the substrate 30 in the second direction Y, with respect to the island portion 201, the connection wiring 204, and the island portion 202. The portion of the connection wiring 206*c* of each of the wirings 205V and 205W connected to the second land portion 206*b* is formed on the side of the first edge 33 of the substrate 30 in the first direction X, with respect to the island portion 202.

Twelfth Embodiment

Referring to FIG. 97 to FIG. 100, a semiconductor package according to a twelfth embodiment will be described. The semiconductor package 1 according to this embodiment is different from the semiconductor package 1 according to the eighth embodiment, mainly in the arrangement of the lead frames 28A to 28J, the primary-side circuit chip 160X, the transformer chip 190X, and the control chip 48. In the description given hereunder, similar elements to those of the eighth embodiment will be given the same numeral, and a part or the whole of the description thereof may be omitted.

The semiconductor package 1 according to this embodiment includes the lead frames 28A to 28S. In this embodiment, the terminal arrangement of the lead frames 28A to 28S is as follows. The lead frames 28A to 28I each constitute the terminal of the secondary-side circuit 170 (secondary-side circuit 670 shown in FIG. 49) of the semiconductor package 1. The lead frames 28J to 28S each constitute the terminal of the primary-side circuit 160 (primary-side circuit 660 shown in FIG. 49) of the semiconductor package 1. More specifically, the lead frame 28A constitutes the VSU terminal. The lead frame 28B constitutes the VBU terminal. The lead frame 28C constitutes the VSV terminal. The lead frame 28D constitutes the VBV terminal. The lead frame 28E constitutes the VSW terminal. The lead frame 28F constitutes the VBW terminal. The lead frame 28G constitutes the first GND terminal. The lead frame 28H constitutes the first VCC terminal. The lead frame 28I constitutes the CIN terminal (detection terminal CIN).

The lead frame 28J constitutes the third GND terminal. The lead frame 28K constitutes the third VCC terminal. The lead frame 28L constitutes the HINU terminal. lead frame 28M constitutes the HINV terminal. The lead frame 28N constitutes the HINW terminal. The lead frame 28O constitutes the LINU terminal. The lead frame 28P constitutes the LINV terminal. The lead frame 28Q constitutes the LININ terminal. The lead frame 28R constitutes the FO terminal. The lead frame 28S constitutes the VOT terminal. Thus, the lead frames 28A to 28S according to this embodiment are set up by excluding the frame constituting the second VCC terminal from the lead frames 28A to 28T according to the eleventh embodiment.

The arrangement of the lead frames 28A to 28I is the same as that of the lead frames 28A to 28I according to the sixth embodiment (see FIG. 51). The lead frames 28J to 28S are located on the side of the first edge 33 of the substrate 30, with respect to the lead frames 28A to 28I. The lead frames 28J to 28P are aligned in the first direction X, with a clearance between each other. More specifically, the lead frames 28K to 28R are aligned in the order of lead frame 28J, lead frame 28K, lead frame 28L, lead frame 28M, lead frame 28N, lead frame 28O, and lead frame 28P, from the side of the second edge 34 of the substrate 30 toward the first edge 33.

The respective bonding portions 28*a* of the lead frames 28Q to 28S are aligned in the second direction Y with a clearance between each other. The bonding portions 28*a* of the lead frames 28Q to 28S are located on the side of the third edge 35 of the substrate 30, with respect to the bonding portions 28*a* of the lead frames 28J to 28S. The bonding portions 28*a* of the lead frames 28Q to 28S are located so as to overlap with the bonding portion 28*a* of the lead frame 28P, as viewed in the second direction Y. The lead frames 28Q to 28S each have an L-shape in a plan view. The lead frame 28R is located on the side of the fourth edge 36 of the substrate 30 in the second direction Y, with respect to the primary-side circuit chip 160X.

A distance DQ1 between the lead frames 28A to 28I and the lead frames 28J to 28S in the first direction X, in other words the distance between the lead frame 28I and the lead frame 28J in the first direction X, is longer than the first gap G1. The distance DQ1 serves for insulation between the terminals constituting the primary-side circuit 160 and the terminals constituting the secondary-side circuit 170.

In this embodiment, the positions and orientations of the control chip 48, the primary-side circuit 160, and the transformer chip 190X are different from those of the eighth embodiment. More specifically, the control chip 48, the primary-side circuit 160, and the transformer chip 190X are each located such that the long sides extend along the second direction Y. The control chip 48, the primary-side circuit chip 160X, and the transformer chip 190X are aligned in the first direction X, with a clearance between each other. In other words, the control chip 48, the primary-side circuit chip 160X, and the transformer chip 190X are aligned in the same direction in which the control chip 47 and the control chip 48 are aligned. In this embodiment, the control chip 48, the primary-side circuit chip 160X, and the transformer chip 190X are aligned such that the respective centers thereof in the second direction Y coincide with each other.

The control chip 48 located so as to overlap with the lead frame 20C and the semiconductor chip 44X, as viewed in the second direction Y. The control chip 48 is located so as to overlap with a portion of the island portion 22*a* of the lead frame 20C on the side of the first edge 33 in the first direction X, with respect to the center of the island portion 22*a* of the lead frame 20C in the first direction X. The control chip 48 also overlaps with a portion of the semiconductor chip 44X on the side of the first edge 33, with respect to the center of the semiconductor chip 44X in the first direction X, as viewed in the second direction Y. The control chip 48 is located so as to protrude from the semiconductor chip 44X toward the first edge 33. The control chip 48 may be located such that the edge thereof on the side of the second edge 34 overlaps with the second electrode GP of the semiconductor chip 44X, as seen along an imaginary line drawn from the control chip 48 in the second direction Y in FIG. 97. Alternatively, control chip 48 may be located such that the edge thereof on the side of the second edge 34 corresponds to a portion of the semiconductor chip 44X on the side of the first edge 33 of the substrate 30, with respect to the second electrode GP.

The transformer chip 190X is located on the side of the first edge 33 of the substrate, with respect to the control chip 48. The transformer chip 190X is located on the side of the first edge 33 of the substrate, with respect to the island portion 22*a* of the lead frame 20B. In addition, the transformer chip 190X is located so as to overlap with the end portion of the island portion 22*a* of the lead frame 20C on the side of the second edge 34, as viewed in the second direction Y. In this embodiment, the edge of the transformer chip 190X on the side of the second edge 34 corresponds to a region on the side of the second edge 34 of the substrate 30 in the first direction X, with the edge of the island portion 22*a* of the lead frame 20C on the side of the second edge 34.

The primary-side circuit chip 160X is located on the side of the first edge 33 of the substrate, with respect to the transformer chip 190X. The primary-side circuit chip 160X is located so as to overlap with the lead frame 20C and the semiconductor chip 45X, as viewed in the second direction Y. More specifically, the primary-side circuit chip 160X is located so as to overlap with the end portion of the semiconductor chip 45X on the side of the second edge 34, as viewed in the second direction Y.

The control chip 48 and the transformer chip 190X are located between the lead frame 28I and the lead frame 28J, in the first direction X. More specifically, The control chip 48 is located such that the center thereof in the first direction X is located on the side of the first edge 33, with respect to the center of the region between the lead frame 28I and the lead frame 28J in the first direction X. The transformer chip 190X is located closer to the lead frame 28J than to the lead frame 28I, in the first direction X.

The primary-side circuit chip 160X is located so as to overlap with the lead frames 28J and 28K, as viewed in the second direction Y. In this embodiment, the center of the primary-side circuit chip 160X in the first direction X is located between the center of the bonding portion 28*a* of the lead frame 28J in the first direction X, and the center of the bonding portion 28*a* of the lead frame 28K in the first direction X.

In this embodiment, further, the control chip 47 and the diodes 49U to 49W are located on the side of the first edge 33 of the substrate 30, compared with the control chip 47 and the diodes 49U to 49W according to the eleventh embodiment.

More specifically, the control chip 47 is located on the side of the first edge 33 of the substrate 30, with respect to the semiconductor chip 41X. The control chip 47 is located so as to overlap with the semiconductor chips 42X and 43X, as viewed in the second direction Y. In further detail, the control chip 47 overlaps with a portion of the semiconductor chip 42X on the side of the first edge 33 with respect to the center of the semiconductor chip 42X in the first direction X, as viewed in the second direction Y. The edge of the control chip 47 on the side of the second edge 34 is located so as to overlap with a portion of the semiconductor chip 42X on the side of the first edge 33 with respect to the second electrode GP, as viewed in the second direction Y. The control chip 47 is located so as to overlap with the second electrode GP of the semiconductor chip 43X, as viewed in the second direction Y.

The diodes 49U to 49W are located on the side of the first edge 33 of the substrate 30 in the first direction X, with respect to the semiconductor chip 41X. The diode 49U is located so as to overlap with a portion of the semiconductor chip 42X on the side of the second edge 34, with respect to the center of the semiconductor chip 42X in the first direction X, as viewed in the second direction Y. The diode 49V is located so as to overlap with a portion of the semiconductor chip 42X on the side of the first edge 33, with respect to the center of the semiconductor chip 42X in the first direction X, as viewed in the second direction Y. The diode 49W is located on the side of the first edge 33 of the substrate 30 in the first direction X, with respect to the semiconductor chip 42X. The diode 49W is located so as to overlap with a portion of the semiconductor chip 43X on the side of the second edge 34, with respect to the center of the semiconductor chip 43X in the first direction X, as viewed in the second direction Y.

The control chip 47 is located on the side of the first edge 33 of the substrate 30 in the first direction X, with respect to the bonding portion 28*a* of the lead frame 28D. In addition, the control chip 47 is located on the side of the second edge 34 of the substrate 30 in the first direction X, with respect to the bonding portion 28*a* of the lead frame 28H. The control chip 47 is located so as to overlap with the lead frames 28E to 28G, as viewed in the second direction Y.

The diode 49U is located between the lead frame 28D and the lead frame 28E in the first direction X, at a position closer to the lead frame 28E than to the lead frame 28D, in the first direction X. The diode 49V is located so as to overlap with the lead frame 28E, as viewed in the second direction Y. The diode 49W is located between the lead frame 28F and the lead frame 28G in the first direction X, at a position closer to the lead frame 28F than to the lead frame 28G, in the first direction X.

The semiconductor package 1 includes a wiring pattern 350, electrically connecting the control chips 47 and 48, the diodes 49U to 49W, and the primary-side circuit chip 160X. The wiring pattern 350 is formed in the first region 30B of the substrate 30. To the wiring pattern 350, the lead frames 28A to 28S are connected. The wiring pattern 350 is formed of a metal material (fifth conductive material). In an example, the wiring pattern 350 is formed by sintering the metal material. Examples of the metal material (fifth conductive material) include silver (Ag), copper (Cu), and gold (Au). In this embodiment, silver is employed as the metal material. In other words, the wiring pattern 350 contains silver.

Figure 98:
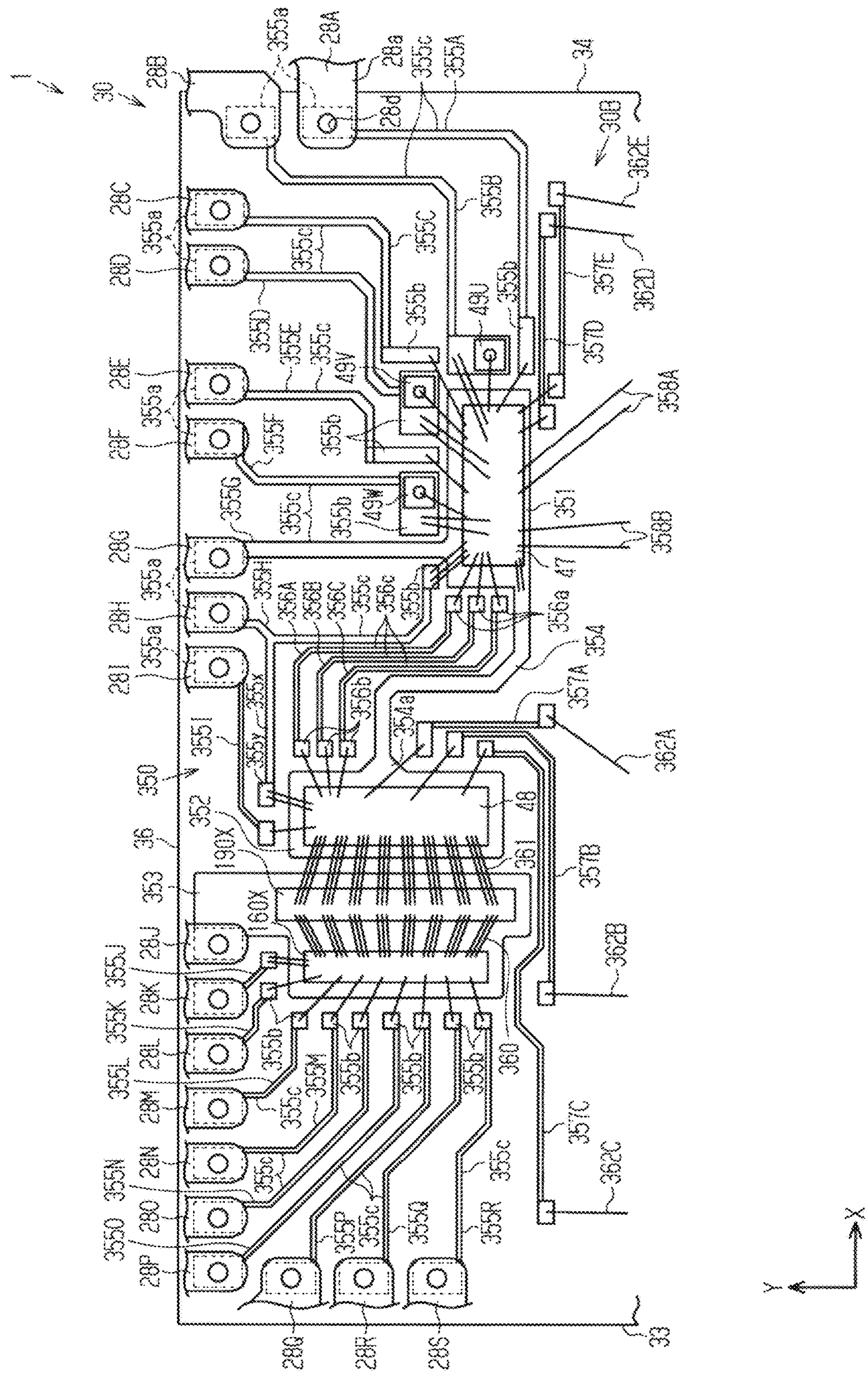
FIG. 98 is an enlarged view of a control wiring region in FIG. 97.
Figure 99:
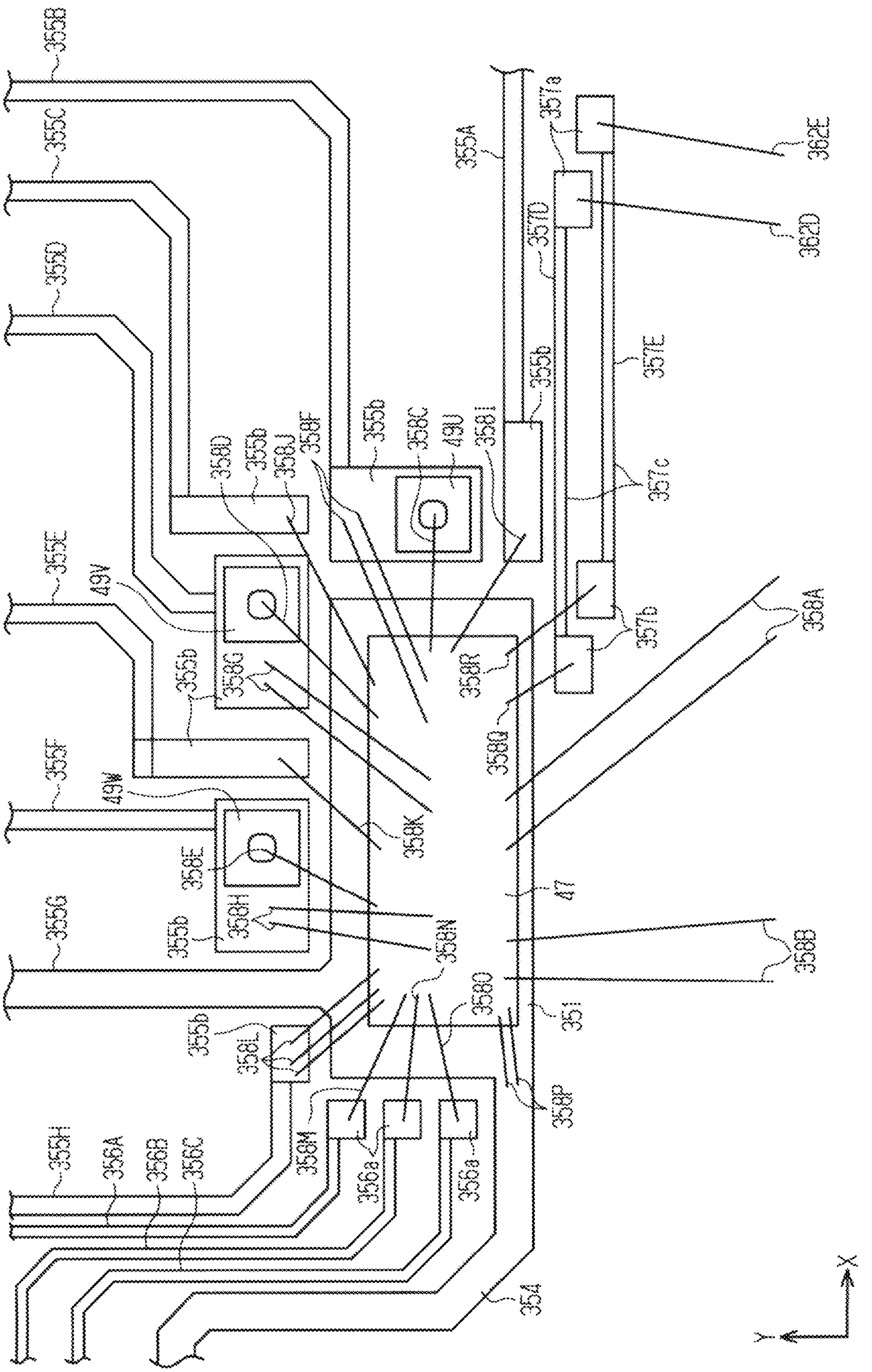
FIG. 99 is an enlarged view of a control circuit chip and a periphery thereof in FIG. 97.

As shown in FIG. 98, the wiring pattern 350 includes an island portion 351 on which the control chip 47 is mounted, an island portion 352 on which the control chip 48 is mounted, and an island portion 353 on which the primary-side circuit chip 160X and the transformer chip 190X are mounted. The wiring pattern 350 also includes a connection wiring 354 connecting the island portion 351 and the island portion 352, wirings 355A to 355R, intermediary wirings 356A to 356C, and intermediary wirings 357A to 357E.

The wirings 355A to 355R are connected to the lead frames 28A to 28I and 28K to 28S. The wirings 355A to 355F and 355H to 355S each include a first land portion 355*a*, a second land portion 355*b*, and a connection wiring 355*c*. The wiring 355G includes the first land portion 355*a* and the connection wiring 355*c*. The intermediary wirings 356A to 356C are first intermediary wirings that intermediate between the control chip 47 and the control chip 48. The intermediary wirings 357C and 357D are third intermediary wirings that intermediate for the electrical connection between the first electrode SP and second electrode GP of the semiconductor chip 41X and the control chip 47. The intermediary wirings 357A to 357C are fourth intermediary wirings that intermediate for the electrical connection between the respective second electrodes GP of the semiconductor chips 44X to 46X and the control chip 48.

The island portion 351 is formed so as to overlap with the island portion 21*a* of the lead frame 20A and the semiconductor chips 42X and 43X, as viewed in the second direction Y. The island portion 351 has, for example, a rectangular shape in a plan view. In an example, the island portion 351 has the long sides extending along the first direction X. The edge of the island portion 351 on the side of the first edge 33 overlaps with the end portion of the semiconductor chip 43X on the side of the first edge 33, as viewed in the second direction Y. The edge of the island portion 351 on the side of the second edge 34 overlaps with a portion of the semiconductor chip 42X on the side of the first edge 33, as viewed in the second direction Y. In addition, the island portion 351 is formed so as to overlap with the respective bonding portions 28*a* of the lead frames 28E to 28G, as viewed in the second direction Y. The control chip 47 mounted on the island portion 351 is located such that the center thereof in the second direction Y is located at a position on the island portion 351 on the side of the third edge 35, with respect to the center of the island portion 351 in the second direction Y. Here, the position of the control chip 47 on the island portion 351 may be modified as desired.

Around the island portion 351, the wirings 355A to 355H, the intermediary wirings 355A to 355C, and the intermediary wirings 357D and 357E are located. The wirings 355A and 355B are the wiring pattern constituting, for example, a boot strap circuit including the diode 49U. The wirings 355C and 355D are the wiring pattern constituting, for example, a boot strap circuit including the diode 49V. The wirings 355E and 355F are the wiring pattern constituting, for example, a boot strap circuit including the diode 49W. The wiring 355G is the ground pattern, for example connected to the island portion 351 on which the control chip 47 is mounted.

The respective first land portions 355*a* of the wirings 355A to 355H are each connected to the bonding portion 28*a* of the corresponding one of the lead frames 28A to 28H. The first land portions 355*a* of the wirings 355A to 355H each have, for example, a rectangular shape in a plan view. In an example, the first land portions 355*a* of the wirings 355A to 355H each have the long sides extending along the second direction Y.

The respective second land portions 355*b* of the wirings 355A to 355C are located on the side of the second edge 34 of the substrate 30, with respect to the island portion 351. The second land portions 355*b* of the wirings 355A to 355C are spaced apart from the island portion 351 in the first direction X. These second land portions 355*b* are aligned in the second direction Y, with a clearance between each other.

The second land portion 355*b* of the wiring 355A is formed so as to stride over, in the second direction Y, the edge of the island portion 351 on the side of the third edge 35. The second land portion 355*b* of the wiring 355A has, for example, a rectangular shape in a plan view. In an example, the second land portion 355*b* of the wiring 355A has the long sides extending along the first direction X. The second land portion 355*b* of the wiring 355B has, for example, a rectangular shape in a plan view. In an example, the second land portion 355*b* of the wiring 355B has the long sides extending along the first direction X.

The second land portion 355*b* of the wiring 355B is located on the side of the fourth edge 36 of the substrate 30, with respect to the second land portion 355*b* of the wiring 355A. On the second land portion 355*b* of the wiring 355B, the diode 49U is mounted via the conductive material MP. The diode 49U is located such that the center thereof in the second direction Y is located at a position on the second land portion 355*b* of the wiring 355B, on the side of the third edge 35 in the second direction Y with respect to the center of the second land portion 355*b* in the second direction Y. Here, the position of the diode 49U on the second land portion 355*b* of the wiring 355B may be modified as desired.

The second land portion 355*b* of the wiring 355C is located on the side of the fourth edge 36 of the substrate 30, with respect to the second land portion 355*b* of the wiring 355B. The second land portion 355*b* of the wiring 355C has, for example, a rectangular shape in a plan view. In an example, the second land portion 355*b* of the wiring 355C has the long sides extending along the second direction Y.

The respective second land portions 355*b* of the wirings 355C to 355F are located on the side of the fourth edge 36 of the substrate 30, with respect to the island portion 351. The second land portions 355*b* of the wirings 355C to 355F are spaced apart from the island portion 351, in the second direction Y. These second land portions 355*b* are aligned in the first direction X, with a clearance between each other.

The second land portion 355*b* of the wiring 355D is formed so as to overlap with the end portion of the island portion 351 on the side of the second edge 34 of the substrate 30, as viewed in the second direction Y. This second land portion 355*b* protrudes from the edge of the island portion 351 on the side of the second edge 34 of the substrate 30, toward the second edge 34. The second land portion 355*b* of the wiring 355D is formed in a rectangular shape, having the long sides extending along the first direction X. On this second land portion 355*b*, the diode 49V is mounted via the conductive material MP. The diode 49V is located such that the center thereof in the first direction X is located at a position on the second land portion 355*b* of the wiring 355D, on the side of the second edge 34 in the second direction Y, with respect to the center of the second land portion 355*b* in the first direction X. Here, the position of the diode 49U on the second land portion 355*b* of the wiring 355B may be modified as desired.

The second land portion 355*b* of the wiring 355E is located on the side of the first edge 33 of the substrate 30, with respect to the second land portion 355*b* of the wiring 355D. The second land portion 355*b* of the wiring 355E has, for example, a rectangular shape in a plan view. In an example, the second land portion 355*b* of the wiring 355E has the long sides extending along the second direction Y. This second land portion 355*b* is larger in size in the second direction Y, than the second land portion 355*b* of the wiring 355D.

The second land portion 355*b* of the wiring 355F is located on the side of the first edge 33 of the substrate 30, with respect to the second land portion 355*b* of the wiring 355E. The second land portion 355*b* of the wiring 355F has, for example, a rectangular shape in a plan view. In an example, the second land portion 355*b* of the wiring 355F has the long sides extending along the first direction X. This second land portion 355*b* is larger in size in the second direction Y, than the second land portion 355*b* of the wiring 355D. On the second land portion 355*b* of the wiring 355F, the diode 49W is mounted via the conductive material MP. The diode 49W is located such that the center thereof in the first direction X is located at a position on the second land portion 355*b* of the wiring 355F, on the side of the second edge 34 in the first direction X, with respect to the center of the second land portion 355*b* in the first direction X. Here, the position of the diode 49W on the second land portion 355*b* of the wiring 355F may be modified as desired.

The respective connection wirings 355*c* of the wirings 355A to 355E have a similar shape to each other. The connection wirings 355*c* of the wirings 355A to 355E each include a first portion, a second portion, and a third portion. The first portion extends along the second direction Y, toward the first land portion 355*a*. The second portion extends along the first direction X, toward the second land portion 355*b*. The third portion is connecting the first portion and the second portion. The third portion extends obliquely toward the second edge 34 and the fourth edge 36 of the substrate 30. The connection wiring 355*c* of the wiring 355B further includes a fourth portion extending along the first direction X from the first land portion 355*a* toward the first edge 33, so as to circumvent the bonding portion 28*a* of the lead frame 28A, and a fifth portion connecting the fourth portion and the first portion. The fifth portion extends in parallel to the third portion. The connection wiring 355*c* of the wiring 355D further includes a fourth portion extending obliquely so as to be closer to the third edge 35 toward the first edge 33 of the substrate 30, so as to circumvent the second land portion 355*b* of the wiring 355C, and a fifth portion extending along the second direction Y, from the fourth portion toward the third edge 35.

The connection wiring 355*c* of the wiring 355F includes a first portion, a second portion, and a third portion, each of which will be described hereunder. The first portion extends along the first direction X, from the first land portion 355*a* toward the first edge 33. The second portion extends obliquely from the first portion, so as to be closer to the third edge 35 toward the first edge 33 of the substrate 30. The third portion extends along the second direction Y, from the second portion toward the third edge 35. The third portion is connected to the second land portion 355*b*.

The connection wiring 355*c* of the wiring 355G extends along the second direction Y, from the first land portion 355*a* toward the third edge 35. This connection wiring 355*c* is connected to the end portion of the island portion 351 on the side of the fourth edge 36. This connection wiring 355*c* is also connected to a position on the island portion 351, on the side of the first edge 33 with respect to the center of the island portion 351 in the first direction X. The connection wiring 355*c* of the wiring 355G is located on the side of the first edge 33 of the substrate 30 in the first direction X, with respect to the second land portion 355*b* of the wiring 355F. The connection wiring 355*c* of the wiring 355G is thicker than the respective connection wirings 355*c* of the wirings 355A to 355F.

The island portion 352 is formed between the lead frame 28I and the lead frame 28J, in the first direction X. The island portion 352 is formed so as to overlap with a portion of the lead frame 20B on the side of the first edge 33, as viewed in the second direction Y. The island portion 352 has, for example, a rectangular shape in a plan view. In an example, the island portion 352 has the long sides extending along the second direction Y. The edge of the island portion 352 on the side of the third edge 35 is located on the side of the fourth edge 36 in the second direction Y, with respect to the edge of the island portion 351 on the side of the third edge 35. The edge of the island portion 352 on the side of the third edge 35 overlaps with the control chip 47, as viewed in the first direction X. The control chip 48 is located such that the center thereof in the first direction X coincides with the center of the island portion 352 in the second direction Y. The control chip 48 is located on the side of the first edge 33 in the first direction X, with respect to the center of the substrate 30 in the first direction X.

The connection wiring 354 has the same thickness as the connection wiring 355*c* of the wiring 355G. The end portion of the connection wiring 354 on the side of the first edge 33 is connected to the end portion of the island portion 352 on the side of the second edge 34, in the first direction X. The end portion of the connection wiring 354 on the side of the first edge 33 is connected to the center of the island portion 352 in the second direction Y. The end portion of the connection wiring 354 on the side of the second edge 34 is connected to the end portion of the island portion 351 on the side of the first edge 33, in the first direction X. The end portion of the connection wiring 354 on the side of the second edge 34 is connected to the end portion of the island portion 351 on the side of the third edge 35, in the second direction Y. A widened portion 354*a* is formed at the joint portion between the connection wiring 354 and the island portion 352. The widened portion 354*a* is formed in a tapered shape, so as to be wider in the second direction Y, from the connection wiring 354 toward the island portion 352. The connection wiring 354 includes a first portion, a second portion, a third portion, a fourth portion, and a fifth portion, each of which will be described hereunder. The first portion extends along the first direction X, from the island portion 351 toward the first edge 33. The second portion extends along the first direction X, from the island portion 352 toward the second edge 34. The third portion extends along the second direction Y. The fourth portion is connecting the first portion and an end of the third portion. The fifth portion is connecting the second portion and the other end of the third portion. The fourth portion and the fifth portion each extend obliquely, so as to be closer to the fourth edge 36, toward the first edge 33 of the substrate 30.

The intermediary wirings 356A to 356C are formed closer to the fourth edge 36 than is the connection wiring 354. The intermediary wiring 356C is located closest to the connection wiring 354, among the intermediary wirings 356A to 356C. The intermediary wiring 356B is formed between the intermediary wiring 356A and the intermediary wiring 356B. The intermediary wirings 356A to 356C each include a first land portion 356*a*, a second land portion 356*b*, and a connection wiring 356*c* connecting the first land portion 356*a* and the second land portion 356*b*. The connection wiring 356*c* has the same shape as the connection wiring 354.

The respective first land portions 356*a* of the intermediary wirings 356A to 356C are located on the side of the first edge 33 of the substrate 30, with respect to the island portion 351. The first land portions 356*a* of the intermediary wirings 356A to 356C are spaced apart from the island portion 351 in the first direction X. These first land portions 356*a* are aligned in the second direction Y, with a clearance between each other. The respective second land portions 356*b* of the intermediary wirings 356A to 356C are located on the side of the second edge 34 of the substrate 30, with respect to the island portion 352. The second land portions 356*b* of the intermediary wirings 356A to 356C are spaced apart from the island portion 352 in the first direction X. These second land portions 356*b* are aligned in the second direction Y, with a clearance between each other.

The clearance between the respective connection wirings 356*c* of the intermediary wirings 356A to 356C, adjacent to each other in the first direction X in the portion extending along the second direction Y, is narrower than the clearance between the connection wirings 356*c* adjacent to each other in the second direction Y, in the portion extending along the first direction X.

The wiring 355H is formed on the opposite side of the intermediary wiring 356B, across the intermediary wiring 356A. The wiring 355H is the power source pattern that supplies, for example, the source voltage VCC to both of the control chip 47 and the control chip 48. The wiring 355H includes a connection wiring 355*x* branched from the connection wiring 355*c*, and a second land portion 355*y* formed at the distal end portion of the connection wiring 355*x*.

The second land portion 355*b* of the wiring 355H is located close to the end portion of the island portion 351 on the side of the fourth edge 36, in the second direction Y. The second land portion 355*b* of the wiring 355H is opposed to the end portion of the island portion 351 on the side of the first edge in the second direction Y, with a clearance therebetween. The second land portion 355*b* of the wiring 355H is located on the side of the second edge 34 of the substrate 30 in the first direction X, with respect to the first land portion 355*a* of the wiring 355H. The second land portion 355*b* of the wiring 355H is also located on the side of the third edge 35 of the substrate 30 in the second direction Y, with respect to the first land portion 355*a* of the wiring 355H.

The connection wiring 355*c* of the wiring 355H includes a first portion, a second portion, a third portion, a fourth portion, and a fifth portion, each of which will be described hereunder. The first portion extends along the second direction Y, from the first land portion 355*a* toward the third edge 35. The second portion extends obliquely from the first portion, so as to be closer to the third edge 35 toward the first edge 33 of the substrate 30. The third portion extends from the second portion along the second direction Y. The fourth portion extends obliquely from the third portion, so as to be closer to the third edge 35 toward the second edge 34 of the substrate 30. The third portion is located closer to the intermediary wiring 356A, than to the connection wiring 355*c* of the wiring 355G. The fifth portion extends along the first direction X, from the fourth portion toward the second edge 34. The fifth portion is connected to the second land portion 355*b*. The connection wiring 355*x* extends along the first direction X, from the joint portion between the first portion and the second portion toward the first edge 33 of the substrate 30. The connection wiring 355*x* is located on the side of the fourth edge 36 of the substrate 30, with respect to the intermediary wiring 356A. The second land portion 355*y* is located on the side of the fourth edge 36 of the substrate 30, with respect to the island portion 352. The second land portion 355*y* is opposed to the island portion 352 in the second direction Y, with a clearance therebetween. The second land portion 355*y* is formed so as to overlap with the end portion of the control chip 48 on the side of the second edge 34, as viewed in the second direction Y.

The wiring 355I is formed in a region on the side of the fourth edge 36 of the substrate 30, with respect to the connection wiring 355*x* of the wiring 355H. The second land portion 355*b* of the wiring 355I is located on the side of the fourth edge 36, with respect to the island portion 352. The second land portion 355*b* of the wiring 355I is opposed to the island portion 352 in the second direction Y, with a clearance therebetween. This second land portion 355*b* is located at the same position in the second direction Y as the second land portion 355*y*, and on the side of the first edge 33 of the substrate 30 with respect to the second land portion 355*y*. The connection wiring 355*c* of the wiring 355I includes a first portion and a second portion, each of which will be described hereunder. The first portion extends along the first direction X, from the first land portion 355*a* of the wiring 355I toward the first edge 33. The second portion extends obliquely from the first portion, so as to be closer to the third edge 35 toward the first edge 33 of the substrate 30. The second portion is connected to the second land portion 355*b*.

The intermediary wirings 357D and 357E are located in a region on the side of the third edge 35 of the substrate 30, with respect to the island portion 351. The intermediary wiring 357D is a third intermediary wiring electrically connecting the control chip 47 and the first electrode SP of the semiconductor chip 41. The intermediary wiring 357E is another third intermediary wiring electrically connecting the control chip 47 and the second electrode GP of the semiconductor chip 41.

The intermediary wirings 357D and 357E each include a first land portion 357*a*, a second land portion 357*b*, and a connection wiring 357*c* connecting the first land portion 357*a* and the second land portion 357*b*.

The first land portion 357*a* of the intermediary wiring 357D is formed so as to overlap with the end portion of the control chip 47 on the side of the second edge 34, as viewed in the second direction Y. The first land portion 357*a* of the intermediary wiring 357E is located on the side of the second edge 34 of the substrate 30 in the first direction X, with respect to the first land portion 357*a* of the intermediary wiring 357D. The first land portion 357*a* of the intermediary wiring 357E is located so as to overlap with the end portion of the island portion 351 on the side of the second edge 34, as viewed in the second direction Y. Further, the first land portion 357*a* of the intermediary wiring 357D and the first land portion 357*a* of the intermediary wiring 357E are formed so as to overlap with each other, as viewed in the first direction X.

The respective second land portions 357*b* of the intermediary wirings 357D and 357E are formed so as to overlap with the bonding portion 28*a* of the lead frame 28C, as viewed in the second direction Y. The second land portions 357*b* of the intermediary wirings 357D and 357E are formed so as to overlap with each other, as viewed in the first direction X. The second land portions 357*b* of the intermediary wirings 357D and 357E are formed so as to overlap with the semiconductor chip 41X, as viewed in the second direction Y. More specifically, the second land portion 357*b* of the intermediary wiring 357D is located so as to overlap with a portion of the semiconductor chip 41X on the side of the first edge 33 with respect to the center of the semiconductor chip 41X in the first direction X, as viewed in the second direction Y. The second land portion 357*b* of the intermediary wiring 357E is located so as to overlap with a portion of the semiconductor chip 41X on the side of the second edge 34 with respect to the center of the semiconductor chip 41X in the first direction X, as viewed in the second direction Y. The second land portions 357*b* of the intermediary wirings 357D and 357E are each formed so as to overlap with the second electrode GP of the semiconductor chip 41X, as viewed in the second direction Y.

The respective connection wirings 357*c* of the intermediary wirings 357D and 357E each extend along the first direction X. A first end portion of the connection wiring 357*c* of the intermediary wiring 357E is connected to the end portion of the first land portion 357*a* of the intermediary wiring 357E on the side of the first edge 33, in the first direction X. The first end portion of the connection wiring 357*c* of the intermediary wiring 357E is connected to the end portion of the first land portion 357*a* of the intermediary wiring 357E on the side of the fourth edge 36, in the second direction Y. A second end portion of the connection wiring 357*c* of the intermediary wiring 357E is connected to the end portion of the second land portion 357*b* of the intermediary wiring 357E on the side of the second edge 34, in the first direction X. The second end portion of the connection wiring 357*c* of the intermediary wiring 357E is connected to the end portion of the second land portion 357*b* of the intermediary wiring 357E on the side of the fourth edge 36, in the second direction Y. A first end portion of the connection wiring 357*c* of the intermediary wiring 357D is connected to the end portion of the first land portion 357*a* of the intermediary wiring 357D on the side of the first edge 33, in the first direction X. The first end portion of the connection wiring 357*c* of the intermediary wiring 357D is connected to the end portion of the first land portion 357*a* of the intermediary wiring 357D on the side of the fourth edge 36, in the second direction Y. A second end portion of the connection wiring 357*c* of the intermediary wiring 357D is connected to the end portion of the second land portion 357*b* of the intermediary wiring 357D on the side of the second edge 34, in the first direction X. The second end portion of the connection wiring 357*c* of the intermediary wiring 357D is connected to the end portion of the second land portion 357*b* of the intermediary wiring 357D on the side of the third edge 35, in the second direction Y.

To the second land portion 357*b* of the intermediary wiring 357D, a wire 362D is connected. The wire 362D is connected to the first electrode SP of the semiconductor chip 41X. To the second land portion 357*b* of the intermediary wiring 357E, a wire 362E is connected. The wire 362E is connected to the second electrode GP of the semiconductor chip 41X.

The control chip 47, and the wirings 355A to 355F, 355H and the intermediary wirings 356A to 356C are connected via wires 358A to 358R. The wires 358A to 358R may be, for example, formed of the same material as the wire 208A according to the eighth embodiment.

Two wires 358A are connecting the control chip 47 and the first electrode SP and second electrode GP of the semiconductor chip 42X. Two wires 358B are connecting the control chip 47 and the first electrode SP and second electrode GP of the semiconductor chip 43X. First end portions of the respective wires 358A are connected to the end portion of the control chip 47 on the side of the third edge 35, in the second direction Y. The first end portions of the wires 358A are connected to the center of the control chip 47 in the first direction X. First end portions of the respective wires 358B are connected to the end portion of the control chip 47 on the side of the third edge 35 of the substrate 30, in the second direction Y. Further, the first end portions of the wires 358B are connected to a position on the control chip 47 on the side of the first edge 33 in the first direction X, with respect to the center of the control chip 47 in the first direction X.

The wire 358C is connecting the control chip 47 and the diode 49U. The wire 358D is connecting the control chip 47 and the diode 49V. The wire 358E is connecting the control chip 47 and the diode 49W. A first end portion of the wire 358C is connected to the end portion of the control chip 47 on the side of the second edge 34, in the first direction X. The first end portion of the wire 358C is connected to the center of the control chip 47 in the second direction Y. A first end portion of the wire 358D is connected to the end portion of the control chip 47 on the side of the fourth edge 36, in the second direction Y. The first end portion of the wire 358C is connected to a position on the control chip 47 on the side of the second edge 34 in the first direction X, with respect to the center of the control chip 47 in the first direction X. A first end portion of the wire 358E is connected to the end portion of the control chip 47 on the side of the fourth edge 36, in the second direction Y. The first end portion of the wire 358E is connected to a position on the control chip 47 on the side of the first edge 33 in the first direction X, with respect to the center of the control chip 47 in the first direction X.

The wire 358F is connecting the second land portion 355*b* of the wiring 355B and the control chip 47. The wire 358G is connecting the second land portion 355*b* of the wiring 355E and the control chip 47. The wire 358H is connecting the second land portion 355*b* of the wiring 355F and the control chip 47. A first end portion of the wire 358F is connected to a position on the control chip 47 on the side of the second edge 34 in the first direction X, with respect to the center of the control chip 47 in the first direction X. The first end portion of the wire 358F is connected to the center of the control chip 47 in the second direction Y. A second end portion of the wire 358F is connected to a position on the second land portion 355*b* of the wiring 355B, on the side of the fourth edge 36 in the second direction Y with respect to the diode 49U. A first end portion of the wire 358G is connected to the center of the control chip 47 in both of the first direction X and the second direction Y. A second end portion of the wire 358G is connected to a position on the second land portion 355*b* of the wiring 355D, on the side of the first edge 33 with respect to the diode 49V. A first end portion of the wire 358H is connected to a position on the control chip 47 on the side of the first edge 33 in the first direction X, with respect to the center of the control chip 47 in the first direction X. The first portion of the wire 358H is connected to the center of the control chip 47 in the second direction Y. A second end portion of the wire 358H is connected to a position on the second land portion 355*b* of the wiring 355F, on the side of the first edge 33 with respect to the diode 49W.

The wire 358I is connecting the control chip 47 and the second land portion 355*b* of the wiring 355A. The wire 358J is connecting the control chip 47 and the second land portion 355*b* of the wiring 355C. The wire 358K is connecting the control chip 47 and the second land portion 355*b* of the wiring 355E. A first end portion of the wire 358I is connected to the end portion of the control chip 47 on the side of the second edge 34 of the substrate 30 in the first direction X. The first end portion of the wire 358I is connected to a position on the control chip 47 on the side of the third edge 35 in the second direction Y, with respect to the first end portion of the wire 358C. A second end portion of the wire 358I is connected to the end portion of the second land portion 355*b* of the wiring 355B, on the side of the first edge 33 in the first direction X. A first end portion of the wire 358J is connected to the end portion of the control chip 47 on the side of the fourth edge 36 in the second direction Y. The first end portion of the wire 358J is connected to the end portion of the control chip 47 on the side of the second edge 34 in the first direction X. A second end portion of the wire 358J is connected to the end portion of the second land portion 355*b* of the wiring 355C, on the side of the third edge 35 in the first direction X. A first end portion of the wire 358K is connected to the end portion of the control chip 47 on the side of the fourth edge 36 in the second direction Y. The first end portion of the wire 358K is connected to the center of the control chip 47 in the first direction X. A second end portion of the wire 358K is connected to the end portion of the second land portion 355*b* of the wiring 355E, on the side of the third edge 35 in the second direction Y.

Three wires 358L are connecting the second land portion 355*b* of the wiring 355H and the control chip 47. A first end portion of the wire 358L is connected to the end portion of the control chip 47 on the side of the fourth edge 36, in the second direction Y. The first end portion of the wire 358L is connected to the end portion of the control chip 47 on the side of the first edge 33, in the first direction X. A second end portion of the wire 358L is connected to the second land portion 355*b* of the wiring 355H.

The wire 358M is connecting the first land portion 356*a* of the intermediary wiring 356A and the control chip 47. The wire 358N is connecting the first land portion 356*a* of the intermediary wiring 356B and the control chip 47. The wire 358O is connecting the first land portion 356*a* of the intermediary wiring 356C and the control chip 47. Respective first end portions of the wires 358M to 358O are connected to the end portion of the control chip 47 on the side of the first edge 33, in the first direction X. The first end portions of the wires 358M to 358O are each connected to a position on the control chip 47 on the side of the fourth edge 36 in the second direction Y, with respect to the center of the control chip 47 in the second direction Y. The first end portions of the wires 358M to 358O are aligned in the second direction Y, with a clearance between each other. The first end portion of the wire 358M is located on the side of a position on the control chip 47 on the side of the fourth edge 36, with respect to the first end portions of the wires 358N and 358O. The first end portion of the wire 358N is located between the first end portion of the wire 358M and the first end portion of the wire 358O, in the second direction Y. A second end portion of the wire 358M is connected to the first land portion 356*a* of the intermediary wiring 356A. A second end portion of the wire 358N is connected to the first land portion 356*a* of the intermediary wiring 356B. A second end portion of the wire 358N is connected to the first land portion 356*a* of the intermediary wiring 356C.

The wire 358P is connecting the control chip 47 and the connection wiring 354. A first end portion of the wire 358P is connected to the end portion of the control chip 47 on the side of the first edge 33 in the first direction X. The first end portion of the wire 358P is connected to the end portion of the control chip 47 on the side of the third edge 35, in the second direction Y. A second end portion of the wire 358P is connected to the end portion of the connection wiring 354 connected to the island portion 351.

The wire 358Q is connecting the control chip 47 and the intermediary wiring 357D. The wire 358R is connecting the control chip 47 and the intermediary wiring 357E. A first end portion of the wire 358Q is connected to the end portion of the control chip 47 on the side of the third edge 35, in the second direction Y. The first end portion of the wire 358Q is connected to a position on the control chip 47 on the side of the second edge 34 in the first direction X, with respect to the center of the control chip 47 in the first direction X. A second end portion of the wire 358Q is connected to the second land portion 357*b* of the intermediary wiring 357D. A first end portion of the wire 358R is connected to the end portion of the control chip 47 on the side of the third edge 35, in the second direction Y. The first end portion of the wire 358R is connected to the end portion of the control chip 47 on the side of the second edge 34, in the first direction X. A second end portion of the wire 358R is connected to the second land portion 357*b* of the intermediary wiring 357E.

The island portion 353 is located on the side of the first edge 33 of the substrate 30 in the first direction X, with respect to the island portion 352. The island portion 353 is located adjacent to the island portion 352, in the first direction X. The transformer chip 190X and the primary-side circuit chip 160X are mounted on the island portion 353. The size in the second direction Y of the region of the island portion 353 where the transformer chip 190X is mounted is larger than the size in the second direction Y of the island portion 352. The island portion 353 includes a land portion 353*a* formed at the end portion on the side of the fourth edge 36, in the second direction Y. To the land portion 353*a*, the bonding portion 28*a* of the lead frame 28J is connected, via the bonding material SD9. In addition, a first cutaway portion 353*b* and a second cutaway portion 353*c* are formed in the island portion 353. The first cutaway portion 353*b* is formed between a region of the island portion 353 where the primary-side circuit chip 160X is mounted, and the land portion 353*a*, in the second direction Y. The first cutaway portion 353*b* is formed so as to overlap with the land portion 353*a*, as viewed in the second direction Y. The first cutaway portion 353*b* is recessed toward the second edge 34, with respect to the and portion 353*a*. The second cutaway portion 353*c* is formed at the end portion of the island portion 353 on the side of the third edge 35, in the second direction Y. The second cutaway portion 353*c* is formed so as to overlap with the region where the primary-side circuit chip 160X is mounted, as viewed in the second direction Y. The edge of the transformer chip 190X on the side of the fourth edge 36 in the second direction Y overlaps with the first cutaway portion 353*b*, as viewed in the first direction X. The edge of the transformer chip 190X on the side of the third edge 35 in the second direction Y overlaps with the second cutaway portion 353*c*, as viewed in the first direction X. The edge of the primary-side circuit chip 160X on the side of the second edge 34 in the first direction X overlaps with the first cutaway portion 353*b* and the second cutaway portion 353*c*, as viewed in the second direction Y.

Figure 100:
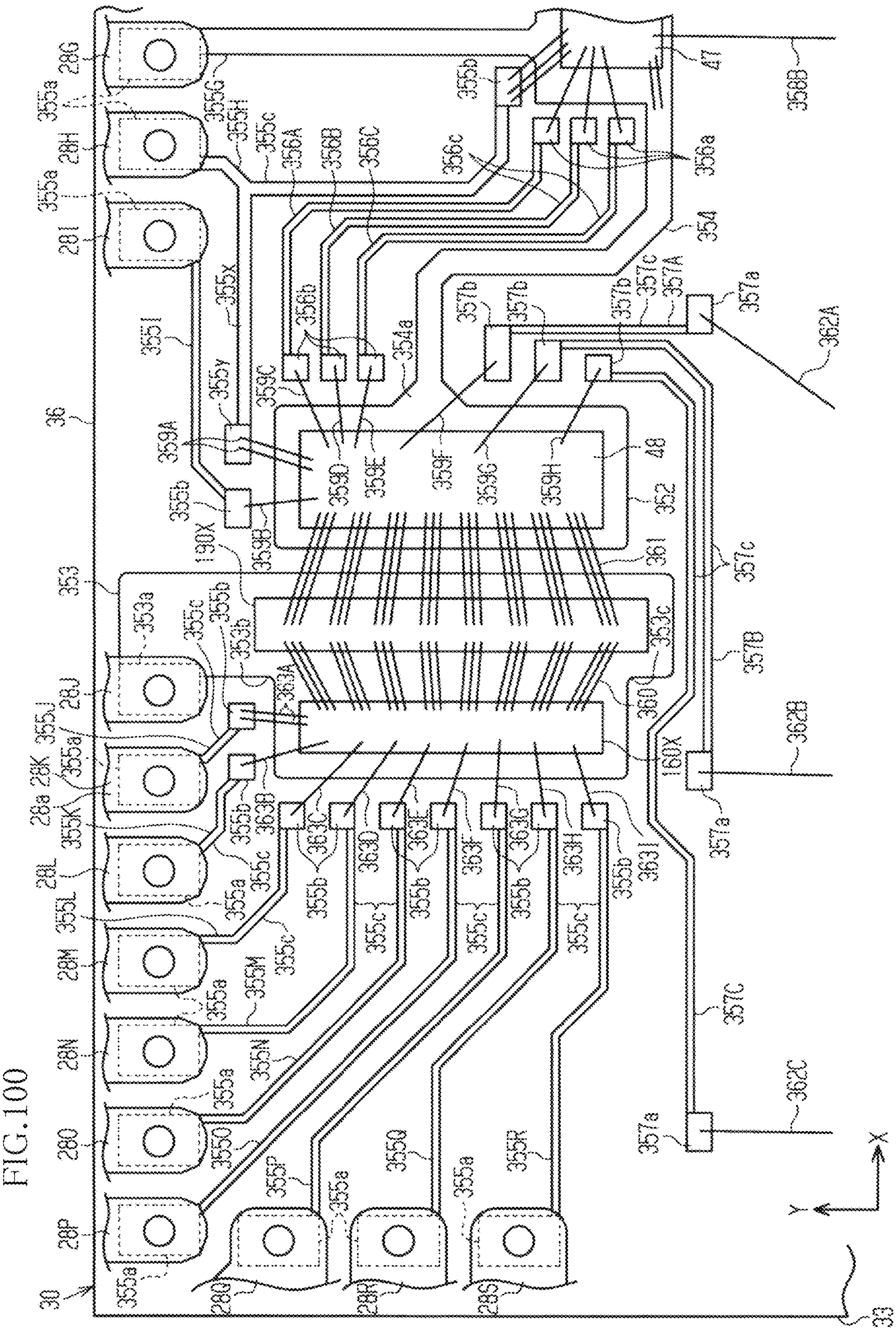
FIG. 100 is an enlarged view of another control circuit chip and a periphery thereof in FIG. 97.
Figure 101:
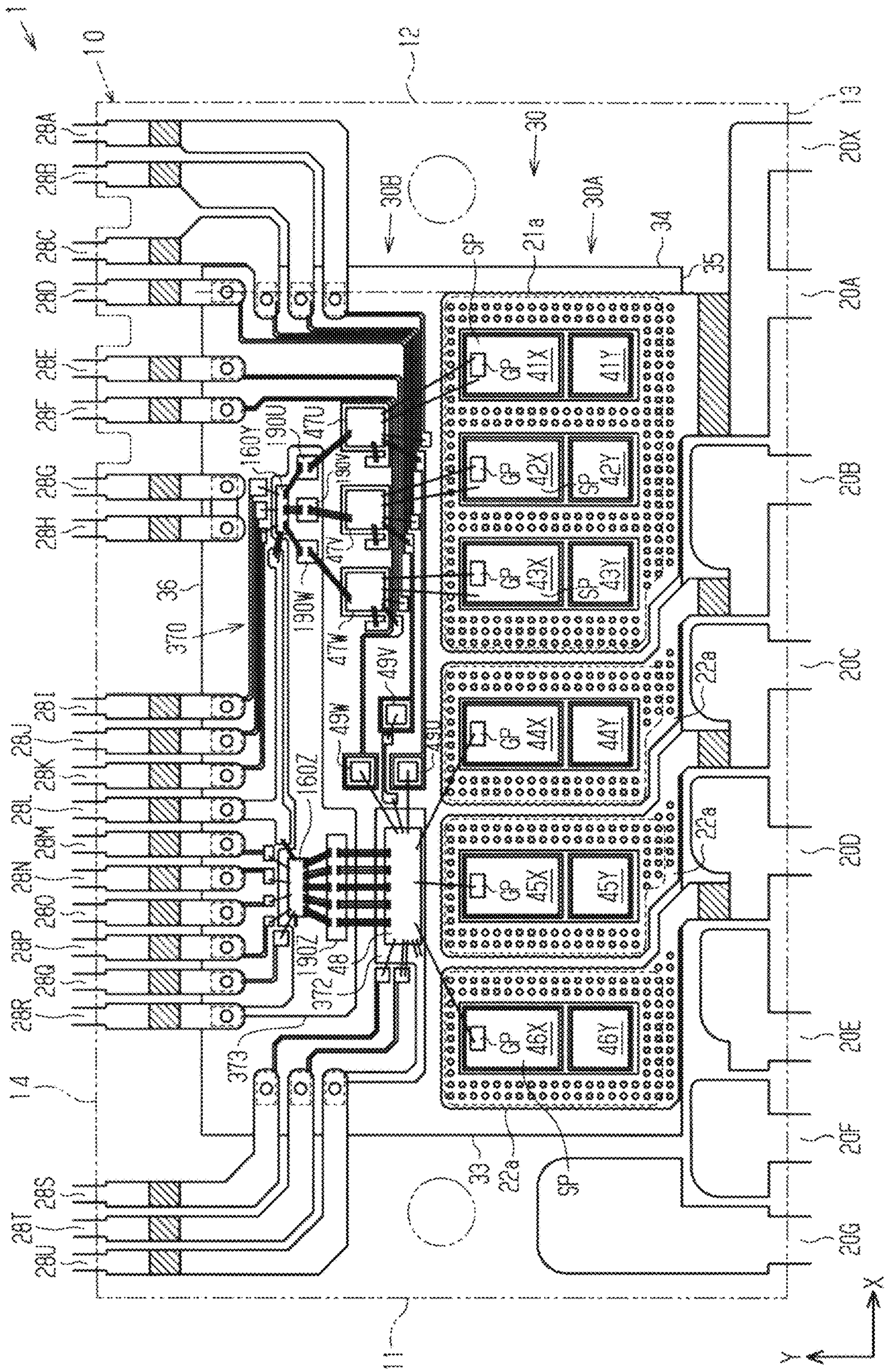
FIG. 101 is a plan view showing an internal configuration of a semiconductor package according to a thirteenth embodiment.
Figure 102:
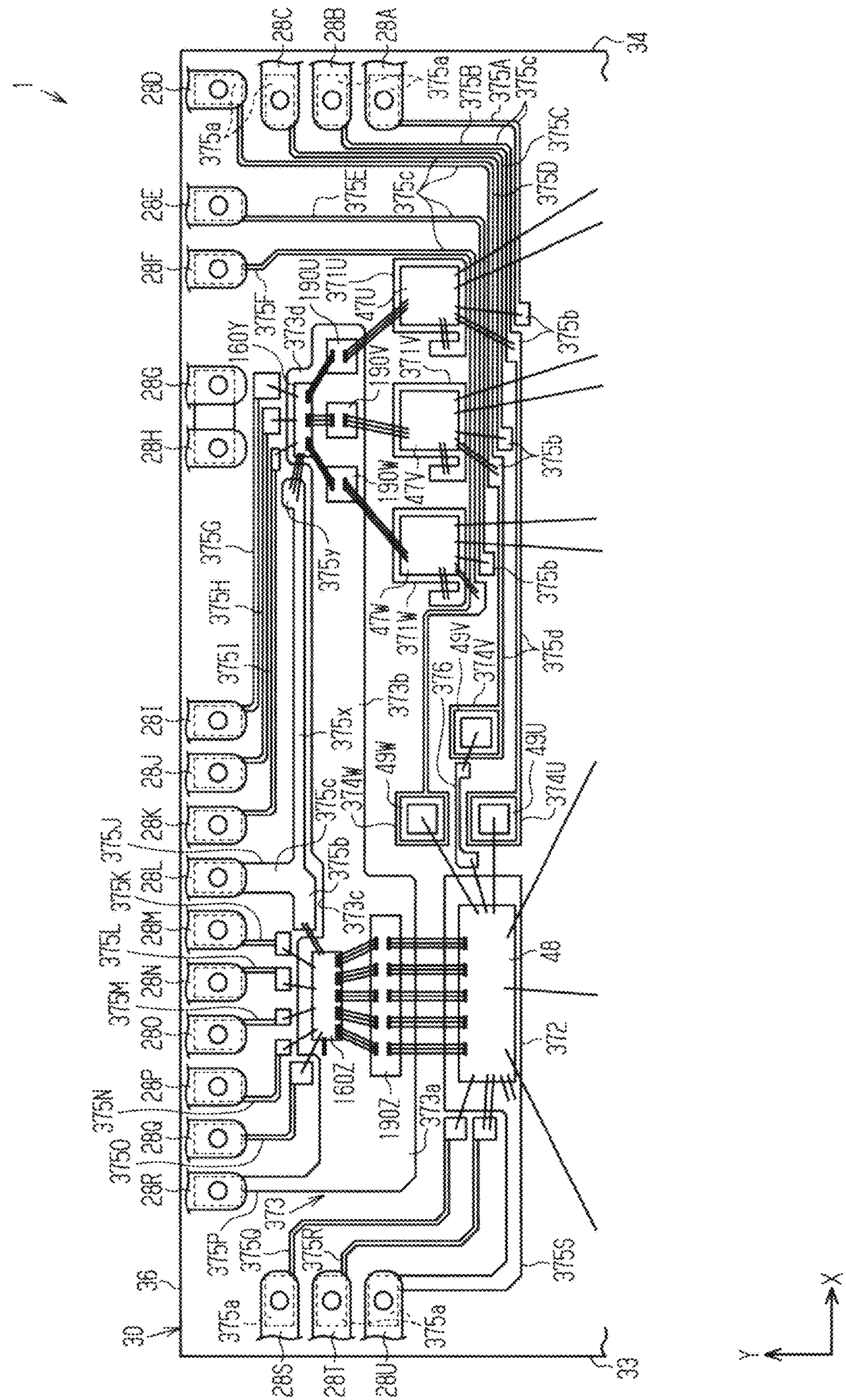
FIG. 102 is an enlarged view of a control wiring region in FIG. 101.

The primary-side circuit chip 160X and the transformer chip 190X are connected via a plurality of wires 360. Respective first end portions of the plurality of wires 360 are connected to the end portion of the primary-side circuit chip 160X on the side of the second edge 34, in the first direction X. The first end portions of the plurality of wires 360 are spaced apart from each other, in the second direction Y. Respective second end portions of the plurality of wires 360 are connected to the end portion of the transformer chip 190X on the side of the first edge 33 in the first direction X. The second end portions of the plurality of wires 360 are spaced apart from each other, in the second direction Y. In an example, the plurality of wires 360 include a plurality of sets, each composed of three wires, as shown in FIG. 100. Such sets, each including three wires 360, are arranged along the second direction Y, with a clearance between each other. The three wires 360 constituting one set are aligned along the second direction Y, with a clearance between each other.

The transformer chip 190X and the control chip 48 are connected via a plurality of wires 361. Respective first end portions of the plurality of wires 361 are connected to the center of the transformer chip 190X in the first direction X. The first end portions of the plurality of wires 361 are spaced apart from each other, in the second direction Y. Respective second end portions of the plurality of wires 361 are connected to the end portion of the control chip 48 on the side of the first edge 33 in the first direction X. The second end portions of the plurality of wires 361 are spaced apart from each other, in the second direction Y. In an example, the plurality of wires 361 include a plurality of sets, each composed of three wires, as shown in FIG. 100. Such sets, each including three wires 361, are arranged along the second direction Y, with a clearance between each other. The three wires 361 constituting one set are aligned along the second direction Y, with a clearance between each other. The wires 360 and 361 may be, for example, formed of the same material as that of the wires 211 and 212 according to the eighth embodiment.

The wirings 355J to 355R are formed around the island portion 353. The wiring 355J is connected to the lead frame 28K. The wiring 355K is connected to the lead frame 28L. The wiring 355L is connected to the lead frame 28M. The wiring 355M is connected to the lead frame 28N. The wiring 355N is connected to the lead frame 28O. The wiring 355O is connected to the lead frame 28P. The wiring 355P is connected to the lead frame 28Q. The wiring 355Q is connected to the lead frame 28R. The wiring 355R is connected to the lead frame 28S.

The wiring 355J is the power source pattern that supplies, for example, the source voltage VCC to the primary-side circuit chip 160X. The wiring 355K is the first signal pattern that transmits, for example, the control signal for the semiconductor chip 41X to the primary-side circuit chip 160X. The wiring 355L is the first signal pattern that transmits, for example, the control signal for the semiconductor chip 42X to the primary-side circuit chip 160X. The wiring 355M is the first signal pattern that transmits, for example, the control signal for the semiconductor chip 43X to the primary-side circuit chip 160X. The wiring 355N is the second signal pattern that transmits, for example, the control signal for the semiconductor chip 44X to the primary-side circuit chip 160X. The wiring 355O is the second signal pattern that transmits, for example, the control signal for the semiconductor chip 45X to the primary-side circuit chip 160X. The wiring 355P is the second signal pattern that transmits, for example, the control signal for the semiconductor chip 46X to the primary-side circuit chip 160X. The wiring 355Q is the signal pattern that transmits, for example, the fault detection signal FO to the lead frame 28R. The wiring 355R is the signal pattern that transmits, for example, the temperature detection signal VOT to the primary-side circuit chip 160X.

The second land portion 355*b* of the wiring 355J is located in the first cutaway portion 353*b* of the island portion 353. The second land portion 355*b* of the wiring 355K is located on the side of the first edge 33 of the substrate 30, with respect to the second land portion 355*b* of the wiring 355J. The second land portion 355*b* of the wiring 355J and the second land portion 355*b* of the wiring 355K are located so as to overlap with each other, as viewed in the second direction Y. In other words, the respective second land portions 355*b* of the wirings 355J and 355K are aligned in the first direction X, with a clearance therebetween. The second land portion 355*b* of the wiring 355J is formed so as to overlap with the primary-side circuit chip 160X, as viewed in the second direction Y. The second land portion 355*b* of the wiring 355K is located on the side of the first edge 33 of the substrate 30, with respect to the primary-side circuit chip 160X. The second land portion 355*b* of the wiring 355K is located so as to overlap with the end portion of the island portion 353 on the side of the first edge 33 of the substrate 30, as viewed in the second direction Y. The second land portion 355*b* of the wiring 355J is located on the side of the second edge 34, with respect to the first land portion 355*a* of the wiring 355J. The second land portion 355*b* of the wiring 355K is located on the side of the second edge 34 of the substrate 30, with respect to the first land portion 355*a* of the wiring 355K. Further, the second land portion 355*b* of the wiring 355K is formed so as to overlap with the first land portion 355*a* of the wiring 355J, as viewed in the second direction Y.

The connection wiring 355*c* of the wiring 355J extends obliquely toward the second edge 34 and the third edge 35 of the substrate 30, so as to secure a space for forming the second land portion 355*b* and the connection wiring 355*c* of the wiring 355K, between the island portion 353 and the lead frame 28K in the second direction Y. The connection wiring 355*c* of the wiring 355K includes a first portion, a second portion, and a third portion, each of which will be described hereunder. The first portion extends obliquely so as to be closer to the third edge 35, toward the second edge 34 of the substrate 30. The second portion extends along the first direction X, from the first portion toward the second edge 34. The third portion extends obliquely from the second portion, so as to be closer to the third edge 35 toward the second edge 34. The third portion is connected to the second land portion 355*b*.

The respective second land portions 355*b* of the wirings 355L to 355R are located on the side of the first edge 33 of the substrate 30, with respect to the island portion 353. The second land portions 355*b* of the wirings 355L to 355R are opposed in the first direction X to a region of the island portion 353 where the primary-side circuit chip 160X is mounted, with a clearance therebetween. These second land portions 355*b* are aligned in a row in the second direction Y, with a clearance between each other. The second land portions 355*b* of the wirings 355L to 355R are aligned in the order of second land portion 355*b* of the wiring 355L, second land portion 355*b* of the wiring 355M, second land portion 355*b* of the wiring 355N, second land portion 355*b* of the wiring 355O, second land portion 355*b* of the wiring 355P, second land portion 355*b* of the wiring 355Q, and second land portion 355*b* of the wiring 355R, from the side of the fourth edge 36 toward the third edge 35 of the substrate 30. These second land portions 355*b* are formed on the side of the second edge 34 of the substrate 30 in the first direction X, with respect to the lead frame 28L (first land portion 355*a* of the wiring 355K).

The respective connection wirings 355*c* of the wirings 355L to 355N each include a first portion, a second portion, and a third portion, each of which will be described hereunder. The first portion extends along the second direction Y, from the first land portion 355*a* toward the third edge 35. The second portion extends along the first direction X, from the second land portion 355*b* toward the first edge 33. The third portion is connecting the first portion and the second portion. The third portion extends obliquely, so as to be closer to the third edge 35 toward the second edge 34 of the substrate 30.

The connection wiring 355*c* of the wiring 355O includes a first portion and a second portion, each of which will be described hereunder. The first portion extends obliquely from the first land portion 355*a*, so as to be closer to the third edge 35 toward the second edge 34 of the substrate 30. The second portion extends along the first direction X, from the first portion toward the second edge 34. The second portion is connected to the second land portion 355*b*.

The respective connection wirings 355*c* of the wirings 355P to 355R each include a first portion, a second portion, and a third portion, each of which will be described hereunder. The first portion extends along the first direction X, from the first land portion 355*a* toward the second edge 34. The second portion extends along the first direction X, from the second land portion 355*b* toward the first edge 33. The third portion is connecting the first portion and the second portion. The third portion extends obliquely, so as to be closer to the third edge 35 toward the second edge 34 of the substrate 30. The respective second portions of the connection wirings 355*c* of the wirings 355L to 355N, the first portion of the connection wiring 355*c* of the wiring 355O, and the respective third portions of the wirings 355P to 355R are parallel to each other.

In addition, the intermediary wirings 357A to 357C are formed around the island portion 352 and the island portion 353. The intermediary wirings 357A to 357C each include a first land portion 357*a*, a second land portion 357*b*, and a connection wiring 357*c*. The intermediary wiring 357A electrically connects, for example, the control chip 47 and the second electrode GP of the semiconductor chip 45X. The intermediary wiring 357C electrically connects, for example, the control chip 47 and the second electrode GP of the semiconductor chip 46X. The intermediary wiring 357A electrically connects, for example, the control chip 47 and the second electrode GP of the semiconductor chip 44X.

The respective second land portions 357*b* of the intermediary wirings 357A to 357C are located on the side of the second edge 34 of the substrate 30, with respect to the island portion 352. The second land portions 357*b* of the intermediary wirings 357A to 357C are opposed to the island portion 352 in the first direction X, with a clearance between each other. These second land portions 357*b* are aligned in the second direction Y, with a clearance between each other. Further, these second land portions 357*b* are located, in the first direction X, in a region surrounded by the island portion 352 and the connection wiring 354, from the side of the first edge 33, the side of the fourth edge 36, and the side of the second edge 34 of the substrate 30. These second land portions 357*b* are aligned in the order of second land portion 357*b* of the intermediary wiring 357A, second land portion 357*b* of the intermediary wiring 357B, and second land portion 357*b* of the intermediary wiring 357C, from the side of the fourth edge 36 of the substrate 30 toward the third edge 35. The second land portion 357*b* of the intermediary wiring 357A is larger in size in the first direction X, than the second land portion 357*b* of the intermediary wiring 357B and the second land portion 357*b* of the intermediary wiring 357C. The second land portion 357*b* of the intermediary wiring 357B is larger in size in the first direction X, than the second land portion 357*b* of the intermediary wiring 357C. The size of the second land portion 357*b* of the intermediary wiring 357A in the second direction Y, the size of the second land portion 357*b* of the intermediary wiring 357B in the second direction Y, and the size of the second land portion 357*b* of the intermediary wiring 357C in the second direction Y, are equal to each other. Here, the respective sizes of the second land portion 357*b* of the intermediary wiring 357A, the second land portion 357*b* of the intermediary wiring 357B, and the second land portion 357*b* of the intermediary wiring 357C in the second direction Y, expressed as "equal to each other", may differ by within ±5% from the size of the second land portion 357*b* of the intermediary wiring 357A in the second direction Y.

The respective first land portions 357*a* of the intermediary wirings 357A to 357C are formed on the side of the third edge 35 of the substrate 30, with respect to the island portion 352 and the island portion 353. The first land portions 357*a* of the intermediary wirings 357A to 357C are aligned in the first direction X, with a clearance between each other. The first land portion 357*a* of the intermediary wiring 357A is located between the island portion 352 and the island portion 351, in the first direction X. The first land portion 357*a* of the intermediary wiring 357A is located so as to overlap with the second land portion 357*b* of the intermediary wiring 357A, as viewed in the second direction Y. The edge of the first land portion 357*a* of the intermediary wiring 357A on the side of the second edge 34 is located on the side of the second edge 34 of the substrate 30 in the first direction X, with respect to the edge of the second land portion 357*b* of the intermediary wiring 357A on the side of the second edge 34. The first land portion 357*a* of the intermediary wiring 357B is formed so as to overlap with a region of the island portion 353 where the primary-side circuit chip 160X is mounted, as viewed in the second direction Y. The first land portion 357*a* of the intermediary wiring 357B is located so as to overlap with the first land portion 355*a* of the wiring 355J, the second land portion 355*b* of the wiring 355K, and the bonding portion 28*a* of the lead frame 28K, as viewed in the second direction Y. The first land portion 357*a* of the intermediary wiring 357C is located on the side of the first edge 33 of the substrate 30, with respect to the island portion 353. The first land portion 357*a* of the intermediary wiring 357C is located so as to overlap with the lead frame 28O, as viewed in the second direction Y.

Figure 97:
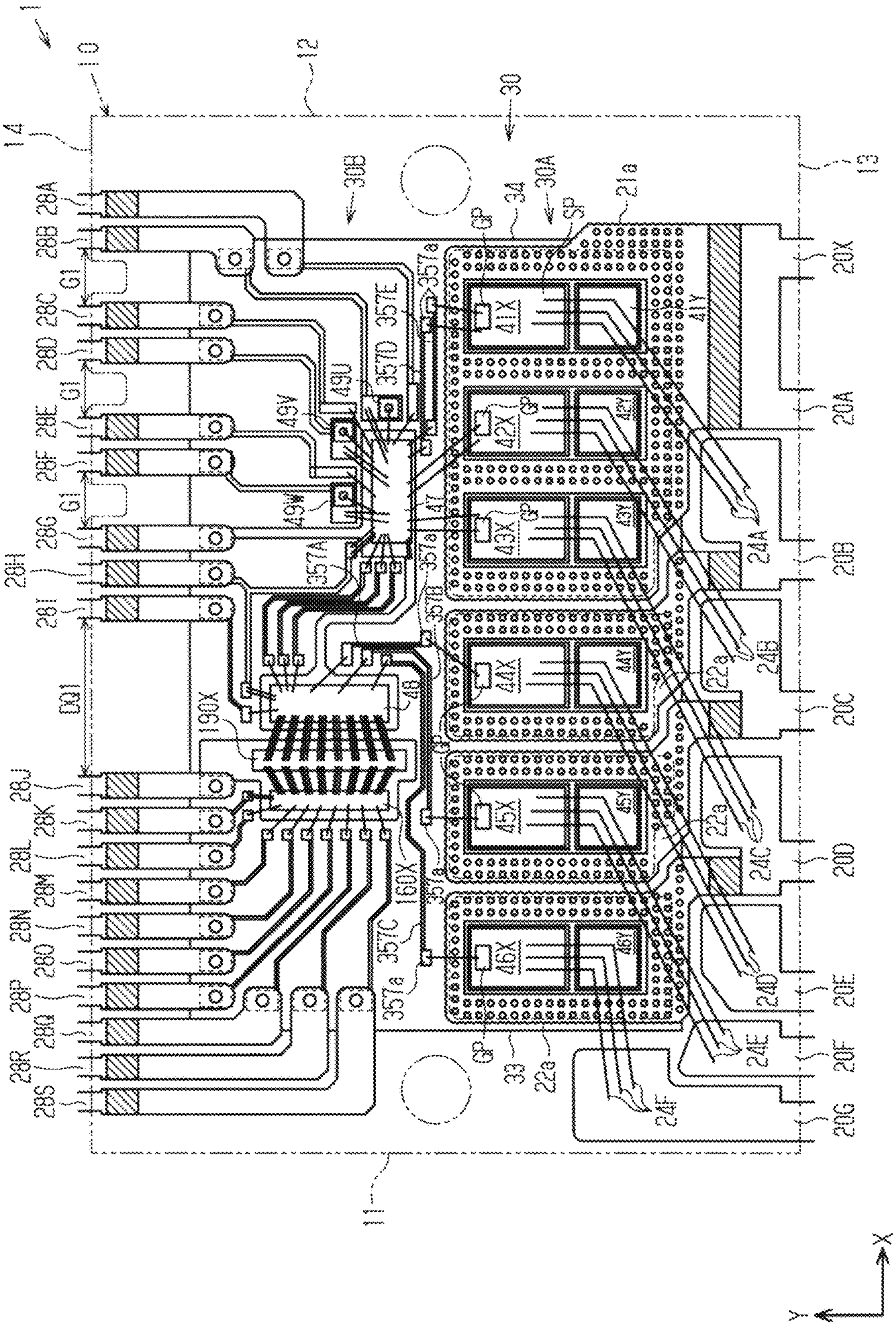
FIG. 97 is a plan view showing an internal configuration of a semiconductor package according to a twelfth embodiment.

Further, as shown in FIG. 97, the first land portion 357*a* of the intermediary wiring 357A is located so as to overlap with the edge of the semiconductor chip 44X on the side of the second edge 34, as viewed in the second direction Y. In other words, this first land portion 357*a* is located on the side of the second edge 34 of the substrate 30 in the first direction X, with respect to the second electrode GP of the semiconductor chip 44X. The first land portion 357*a* of the intermediary wiring 357A and the second electrode GP of the semiconductor chip 44X are connected via the wire 362A (see FIG. 98).

The first land portion 357*a* of the intermediary wiring 357B is formed so as to overlap with the second electrode GP of the semiconductor chip 45X, as viewed in the second direction Y. The first land portion 357*a* of the intermediary wiring 357B and the second electrode GP of the semiconductor chip 45X are connected via the wire 362B (see FIG. 98).

The first land portion 357*a* of the intermediary wiring 357C is formed so as to overlap with the second electrode GP of the semiconductor chip 46X, as viewed in the second direction Y. The first land portion 357*a* of the intermediary wiring 357C and the second electrode GP of the semiconductor chip 46X are connected via the wire 362C (see FIG. 98).

As shown in FIG. 100, the control chip 48, and the wirings 355H and 355I, the intermediary wirings 356A to 356C, and the intermediary wirings 357A to 357C are connected via wires 359A to 359H.

Two wires 359A are connecting the control chip 48 and the second land portion 355*y* of the wiring 355H. The wire 359B is connecting the control chip 48 and the second land portion 355*b* of the wiring 355I. Respective first end portions of the two wires 359A are connected to the end portion of the control chip 48 on the side of the fourth edge 36, in the second direction Y. The first end portions of the two wires 359A are connected to positions on the control chip 48 on the side of the second edge 34 in the first direction X, with respect to the center of the control chip 48 in the first direction X. Respective second end portions of the two wires 359A are connected to the second land portion 355*y* of the wiring 355H. A first end portion of the wire 359B is connected to the end portion of the control chip 48 on the side of the fourth edge 36, in the second direction Y. The first end portion of the wire 359B is connected to a position on the control chip 48 on the side of the first edge 33 in the first direction X, with respect to the center of the control chip 48 in the first direction X. A second end portion of the wire 359B is connected to the second land portion 355*b* of the wiring 355I.

The wire 359C is connecting the control chip 48 and the second land portion 356*b* of the intermediary wiring 356A. The wire 359D is connecting the control chip 48 and the second land portion 356*b* of the intermediary wiring 356B. The wire 359E is connecting the control chip 48 and the second land portion 356*b* of the intermediary wiring 356C.

Respective first end portions of the wires 359C to 359E are connected to the end portion of the control chip 48 on the side of the second edge 34, in the first direction X. The first end portions of the wires 359C to 359E are each connected to a position on the control chip 48 on the side of the fourth edge 36 in the second direction Y, with respect to the center of the control chip 48 in the second direction Y. The first end portions of the wires 359C to 359E are aligned in the second direction Y, with a clearance between each other. The first end portion of the wire 359C is located at a position of the control chip 48 on the side of the fourth edge 36 in the second direction Y, with respect to the first end portion of the wire 359D and the first end portion of the wire 359E. The first end portion of the wire 359D is located at a position of the control chip 48 on the side of the fourth edge 36 in the second direction Y, with respect to the first end portion of the wire 359E. A second end portion of the wire 359C is connected to the second land portion 356*b* of the intermediary wiring 356A. A second end portion of the wire 359D is connected to the second land portion 356*b* of the intermediary wiring 3563. A second end portion of the wire 359E is connected to the second land portion 356*b* of the intermediary wiring 356C.

The wire 359F is electrically connecting the control chip and the intermediary wiring 357A. The wire 359G is electrically connecting the control chip 48 and the intermediary wiring 357B. The wire 359H is electrically connecting the control chip 48 and the intermediary wiring 357C.

A first end portion of the wire 359F is connected to the end portion of the control chip 48 on the side of the second edge 34 of the substrate 30, in the first direction X. The first end portion of the wire 359F is connected to a position on the control chip 48 on the side of the fourth edge 36 in the second direction Y, with respect to the center of the control chip 48 in the second direction Y. A second end portion of the wire 359F is connected to the second land portion 357*b* of the intermediary wiring 357A. More specifically, the second end portion of the wire 359F is connected to a position on the second land portion 357*b* of the intermediary wiring 357A on the side of the first edge 33, with respect to the center of the second land portion 357*b* in the first direction X. A first end portion of the wire 359G is connected to the end portion of the control chip 48 on the side of the second edge 34 in the first direction X. The first end portion of the wire 359G is connected to a position on the control chip 48 on the side of the third edge 35 in the second direction Y, with respect to the center of the control chip 48 in the second direction Y. A second end portion of the wire 359G is connected to the second land portion 357*b* of the intermediary wiring 357B. A first end portion of the wire 359H is connected to the end portion of the control chip 48 on the side of the second edge 34, in the first direction X. The first end portion of the wire 359H is connected to the end portion of the control chip 48 on the side of the third edge 35, in the second direction Y. A second end portion of the wire 359H is connected to the second land portion 357*b* of the intermediary wiring 357C.

The primary-side circuit chip 160X and the wirings 355J to 355R are connected via wires 363A to 363I. Respective first end portions of two wires 363A are connected to the end portion of the primary-side circuit chip 160X on the side of the fourth edge 36, in the second direction Y. The first end portions of the two wires 363A are each connected to a position on the primary-side circuit chip 160X on the side of the second edge 34 in the first direction X, with respect to the center of the primary-side circuit chip 160X in the first direction X. Respective second end portions of the two wires 363A are connected to the second land portion 355*b* of the wiring 355J.

A first end portion of the wire 363B is connected to a position on the primary-side circuit chip 160X on the side of the fourth edge 36 in the second direction Y, with respect to the center of the primary-side circuit chip 160X in the second direction Y. The first end portion of the wire 363B is connected to a position on the primary-side circuit chip 160X on the side of the first edge 33 in the first direction X, with respect to the center of the primary-side circuit chip 160X in the first direction X. A second end portion of the wire 363B is connected to the second land portion 355*b* of the wiring 355K.

A first end portion of the wire 363C is connected to a position on the primary-side circuit chip 160X on the side of the fourth edge 36 in the second direction Y, with respect to the center of the primary-side circuit chip 160X in the second direction Y. The first end portion of the wire 363C is connected to the position on the primary-side circuit chip 160X on the side of the fourth edge 36 in the second direction Y, with respect to the first end portion of the wire 363B. The first end portion of the wire 363C is connected to a position on the primary-side circuit chip 160X on the side of the first edge 33 in the first direction X, with respect to the center of the primary-side circuit chip 160X in the first direction X. A second end portion of the wire 363C is connected to the second land portion 355*b* of the wiring 355L.

A first end portion of the wire 363D is connected to a position on the primary-side circuit chip 160X on the side of the fourth edge 36 in the second direction Y, with respect to the center of the primary-side circuit chip 160X in the second direction Y. The first end portion of the wire 363D is connected to the position on the primary-side circuit chip 160X on the side of the fourth edge 36 in the second direction Y, with respect to the first end portion of the wire 363C. The first end portion of the wire 363D is connected to a position on the primary-side circuit chip 160X on the side of the first edge 33 in the first direction X, with respect to the center of the primary-side circuit chip 160X in the first direction X. A second end portion of the wire 363D is connected to the second land portion 355*b* of the wiring 355M.

A first end portion of the wire 363E is connected to a position on the primary-side circuit chip 160X on the side of the third edge 35 in the second direction Y, with respect to the center of the primary-side circuit chip 160X in the second direction Y. The first end portion of the wire 363E is connected to a position on the primary-side circuit chip 160X on the side of the first edge 33 in the first direction X, with respect to the center of the primary-side circuit chip 160X in the first direction X. A second end portion of the wire 363E is connected to the second land portion 355*b* of the wiring 355N.

A first end portion of the wire 363F is connected to a position on the primary-side circuit chip 160X on the side of the third edge 35 in the second direction Y, with respect to the center of the primary-side circuit chip 160X in the second direction Y. The first end portion of the wire 363F is connected to the position on the primary-side circuit chip 160X on the side of the third edge 35 in the second direction Y, with respect to the first end portion of the wire 363E. The first end portion of the wire 363F is connected to a position on the primary-side circuit chip 160X on the side of the first edge 33 in the first direction X, with respect to the center of the primary-side circuit chip 160X in the first direction X. A second end portion of the wire 363F is connected to the second land portion 355*b* of the wiring 355O.

A first end portion of the wire 363G is connected to a position on the primary-side circuit chip 160X on the side of the third edge 35 in the second direction Y, with respect to the center of the primary-side circuit chip 160X in the second direction Y. The first end portion of the wire 363G is connected to the position on the primary-side circuit chip 160X on the side of the third edge 35 in the second direction Y, with respect to the first end portion of the wire 363F. The first end portion of the wire 363G is connected to a position on the primary-side circuit chip 160X on the side of the first edge 33 in the first direction X, with respect to the center of the primary-side circuit chip 160X in the first direction X. A second end portion of the wire 363G is connected to the second land portion 355*b* of the wiring 355P.

A first end portion of the wire 363H is connected to a position on the primary-side circuit chip 160X on the side of the third edge 35 in the second direction Y, with respect to the center of the primary-side circuit chip 160X in the second direction Y. The first end portion of the wire 363H is connected to the position on the primary-side circuit chip 160X on the side of the third edge 35 in the second direction Y, with respect to the first end portion of the wire 3630. The first end portion of the wire 363H is connected to a position on the primary-side circuit chip 160X on the side of the first edge 33 in the first direction X, with respect to the center of the primary-side circuit chip 160X in the first direction X. A second end portion of the wire 363H is connected to the second land portion 355*b* of the wiring 355Q.

A first end portion of the wire 363I is connected to a position on the primary-side circuit chip 160X on the side of the third edge 35 in the second direction Y, with respect to the center of the primary-side circuit chip 160X in the second direction Y. The first end portion of the wire 363I is connected to the position on the primary-side circuit chip 160X on the side of the third edge 35 in the second direction Y, with respect to the first end portion of the wire 363H. The first end portion of the wire 363I is connected to a position on the primary-side circuit chip 160X on the side of the first edge 33 in the first direction X, with respect to the center of the primary-side circuit chip 160X in the first direction X. A second end portion of the wire 363I is connected to the second land portion 355*b* of the wiring 355R.

Further, as shown in FIG. 97, in this embodiment the wires 24A to 24F, connecting the semiconductor chips 41X to 46X, the diodes 41Y to 46Y, and the lead frames 20B to 20G, are each composed of three wires. In this case, the wire diameter of the wires 24A to 24F may be finer than the wire diameter of the wires 24A to 24F adopted when the wires 24A to 24F are each formed of a single wire.

Advantageous Effects

This embodiment provides the following advantageous effects, in addition to those described in (2-1) of the eighth embodiment, and those provided by the eleventh embodiment.

(12-1) The wiring pattern 350 includes the intermediary wirings 357A to 357E. The respective second land portions 357*b* of the intermediary wirings 357A to 357C are formed close to the corresponding one of the semiconductor chips 44X to 46X. Therefore, the wire 362A for connecting the second land portion 357*b* of the intermediary wiring 357A and the second electrode GP of the semiconductor chip 44X, the wire 362B for connecting the second land portion 357*b* of the intermediary wiring 357B and the second electrode GP of the semiconductor chip 45X, and the wire 362C for connecting the second land portion 357*b* of the intermediary wiring 357C and the second electrode GP of the semiconductor chip 46X, can each be shortened. Likewise, the respective second land portions 357*b* of the intermediary wirings 357D and 357E are formed close to the semiconductor chip 41X. Therefore, the wire 362D for connecting the second land portion 357*b* of the intermediary wiring 357D and the first electrode SP of the semiconductor chip 41X, and the wire 362E for connecting the second land portion 357*b* of the intermediary wiring 357E and the second electrode GP of the semiconductor chip 41X can each be shortened.

As described above, the wires 362A to 362E can each be shortened. Therefore, when the material for forming the first resin 10 flows into the cavity of a mold, in the forming process of the first resin 10, the wires 362A to 362E can be prevented from being deformed by the flow of the resin, thereby being electrically connected to other elements of the semiconductor package 1.

(12-2) The respective first land portions 357*a* of the intermediary wirings 357D and 357E overlap with each other, and the respective second land portions 357*b* of the intermediary wirings 357D and 357E overlap with each other, as viewed in the first direction X. Such a configuration allows the space for locating the intermediary wirings 357D and 357E to be made smaller in the second direction Y, and also allows the distance between the control chip 47 and the semiconductor chips 42X and 43X to be shortened. Therefore, the wire 358A for connecting the control chip 47 and the second electrode GP and first electrode SP of the semiconductor chip 42X, and the wire 358B for connecting the control chip 47 and the second electrode GP and first electrode SP of the semiconductor chip 43X can each be shortened.

Thirteenth Embodiment

Referring to FIG. 101 to FIG. 104, a semiconductor package 1 according to a thirteenth embodiment will be described. The semiconductor package 1 according to this embodiment is different from the semiconductor package 1 according to the eighth embodiment, mainly in including control chips 47U, 47V, and 47W, primary-side circuit chips 160Y and 160Z, and transformer chips 190U, 190V, and 190W, in place of the control chip 47, the primary-side circuit chip 160X, and the transformer chip 190X, compared with the semiconductor package 1 according to the eighth embodiment. In the description given hereunder, similar elements to those of the eighth embodiment will be given the same numeral, and a part or the whole of the description thereof may be omitted.

In this embodiment, the terminal arrangement of the lead frames 28A to 28U is as follows. The lead frame 28A constitutes the VSU terminal. The lead frame 28B constitutes the VBU terminal. The lead frame 28C constitutes the VSV terminal. The lead frame 28D constitutes the VBV terminal. The lead frame 28E constitutes the VSW terminal. The lead frame 28F constitutes the VBW terminal. The lead frame 28G, 28H constitutes the non-connection terminal. The lead frame 28I constitutes the HINU terminal. The lead frame 28J constitutes the HINV terminal. The lead frame 28K constitutes the HINW terminal. The lead frame 28L constitutes the third VCC terminal. The lead frame 28M constitutes the LINU terminal. The lead frame 28N constitutes the LINV terminal. The lead frame 28O constitutes the LINW terminal. The lead frame 28P constitutes the FO terminal. The lead frame 28Q constitutes the VCT terminal. The lead frame 28R constitutes the third GND terminal. The lead frame 28S constitutes the CIN terminal (detection terminal CIN). The lead frame 28T constitutes the second VCC terminal. The lead frame 28U constitutes the second GND terminal.

The primary-side circuit chip 160Y is electrically connected to each of the transformer chips 190U to 190W. The primary-side circuit chip 160Y is located on the side of the fourth edge 36 of the substrate 30 in the second direction Y, with respect to the transformer chips 190U to 190W. To the primary-side circuit chip 160Y, the control signal for controlling the operation of the semiconductor chips 41X to 43X is inputted. The primary-side circuit chip 160Y is located on the side of the third edge 35 of the substrate 30 in the second direction Y, with respect to the lead frames 28H and 28G. The primary-side circuit chip 160Y is located so as to overlap with the lead frames 28H and 28G, as viewed in the second direction Y. The primary-side circuit chip 160Y is located between the lead frame 28B and the lead frame 28C, in the second direction Y.

The transformer chips 190U to 190W are each formed by encapsulating the transformer 190 with the encapsulating resin. In this embodiment, the transformer chips 190U to 190W each have, for example, a rectangular shape in a plan view. The transformer chips 190U to 190W are each larger in size in the second direction Y, than the primary-side circuit chip 160Y. The transformer chips 190U to 190W are each smaller in size in the first direction X, than the primary-side circuit chip 160Y. The transformer chips 190U to 190W are aligned in the first direction X, with a clearance between each other. In this embodiment, the transformer chip 190V and the primary-side circuit chip 160Y overlap with each other, as viewed in the second direction Y. The transformer chip 190U is located on the side of the second edge 34 of the substrate 30, with respect to the transformer chip 190V. The transformer chip 190W is located on the side of the first edge 33 of the substrate 30, with respect to the transformer chip 190V. The transformer chip 190U is located on the side of the second edge 34 of the substrate 30, with respect to the primary-side circuit chip 160Y. The transformer chip 190W is located on the side of the first edge 33 of the substrate 30, with respect to the primary-side circuit chip 160Y. The transformer chips 190U to 190W are located so as to overlap with the lead frame 28B, as viewed in the first direction X.

The control chips 47U to 47W are each formed by encapsulating the secondary-side circuit 170 with the encapsulating resin. The control chips 47U to 47W are each located on the side of the third edge 35 of the substrate 30, with respect to the transformer chips 190U to 190W. The control chips 47U to 47W are aligned in the first direction X, with a clearance between each other. In this embodiment, the center of the control chip 47V in the first direction X accords with the center of the transformer chip 190V in the first direction X. The control chip 47U is located on the side of the second edge 34 of the substrate 30 in the first direction X, with respect to the control chip 47V. The control chip 47W is located on the side of the first edge 33 of the substrate 30, with respect to the control chip 47W. The control chip 47U is located on the side of the first edge 33 of the substrate 30 in the first direction X, with respect to the semiconductor chip 41X. In addition, the control chip 47U is located so as to overlap with a portion of the semiconductor chip 42X on the side of the second edge 34 with respect to the center of the semiconductor chip 42X in the first direction X, as viewed in the second direction Y. The control chip 47V is located on the side of the third edge 35 of the substrate 30, with respect to the semiconductor chip 43X. The control chip 47V is located so as to overlap with the end portion of the semiconductor chip 42X, on the side of the first edge 33 with respect to the center of the semiconductor chip 42X in the first direction X, as viewed in the second direction Y. The control chip 47V is located on the side of the first edge 33 of the substrate 30 in the first direction X, with respect to the second electrode GP of the semiconductor chip 42X. The control chip 47W is located so as to overlap with the second electrode GP of the semiconductor chip 43X, as viewed in the second direction Y. The control chip 47W is located on the side of the first edge 33, with respect to the center of the semiconductor chip 43X in the first direction X.

The diodes 49U to 49W are located in the region between the control chip 47W and the control chip 48, in the first direction X. The diodes 49U to 49W are each located on the side of the control chip 48 in the first direction X, with respect to the center of the region between the control chip 47W and the control chip 48 in the first direction X. The diodes 49U to 49W are located so as to overlap with the island portion 22*a* of the lead frame 20B, as viewed in the second direction Y. The diodes 49U and 49W are aligned in the second direction Y with a clearance therebetween. The diodes 49U and 49W are located so as to overlap with each other, as viewed in the second direction Y. The diode 49V is located on the side of the second edge 34 of the substrate 30, with respect to the diodes 49U and 49W. The diodes 49U and 49W are located so as to overlap with a portion of the semiconductor chip 44X on the side of the first edge 33, with respect to the center of the semiconductor chip 44X in the first direction X, as viewed in the second direction Y. More specifically, the diodes 49U and 49W are located on the side of the first edge 33 of the substrate 30 in the first direction X, with respect to the second electrode GP of the semiconductor chip 44X. The diode 49V is located so as to overlap with the second electrode GP of the semiconductor chip 44X, as viewed in the second direction Y. The diode 49V is located so as to overlap with the diode 49U, as viewed in the first direction X. In the second direction Y, the diode 49V is located on the side of the third edge 35 of the substrate 30, with respect to the diode 49W. The diodes 49V and 49W are located so as to overlap with the control chips 47U to 47W, as viewed in the first direction X. The diode 49U is located on the side of the third edge 35 of the substrate 30 in the second direction Y, with respect to the control chips 47U to 47W. The diodes 49U and 49V are located so as to overlap with the control chip 48, as viewed in the first direction X. The diode 49W is located on the side of the fourth edge 36 of the substrate 30 in the second direction Y, with respect to the control chip 48.

The respective positions of the control chip 48, the primary-side circuit chip 160Y, and the transformer chip 190Y with respect to the substrate 30 are the same as those of the control chip 48, the primary-side circuit chip 160Y, and the transformer chip 190Y according to the eighth embodiment. However, the primary-side circuit chip 160Y and the transformer chip 190Y according to this embodiment are smaller in size in the first direction X, compared with the primary-side circuit chip 160X and the transformer chip 190X according to the eighth embodiment. The transformer chip 1902 is smaller in size in the first direction X, than the control chip 48. The primary-side circuit chip 160Y is smaller in size in the first direction X, than the transformer chip 190Y.

The center of the primary-side circuit chip 160Z in the second direction Y is located on the side of the third edge 35 of the substrate 30, with respect to the center of the primary-side circuit chip 160Y in the second direction Y. The primary-side circuit chip 160Z is located so as to overlap with the transformer chips 190U to 190W, as viewed in the first direction X.

The transformer chip 190Z is located on the side of the third edge 35 of the substrate 30 in the second direction Y, with respect to the transformer chips 190U to 190W. The transformer 190Z is also located on the side of the fourth edge 36 of the substrate 30 in the second direction Y, with respect to the control chips 47U to 47W. The transformer chip 190Z is located on the side of the fourth edge 36 of the substrate 30 in the second direction Y, with respect to the diodes 49U and 49V. The center of the transformer chip 190Z in the second direction Y is located on the side of the fourth edge 36 in the second direction Y, with respect to the center of the diode 49W in the second direction Y.

On the substrate 30, a wiring pattern 370 is formed to connect the lead frames 28A to 28F and 28I to 28U and the primary-side circuit chips 160I and 160Z, the transformer chips 190X and 190U to 190W, and the control chips 47U to 47W and 48. For example, the conductive material MP is employed to form the wiring pattern 370. The wiring pattern 370 is formed by sintering the conductive material MP. Examples of the material of the conductive material MP include silver (Ag), copper (Cu), and gold (Au). In this embodiment, the conductive material MP is formed of silver.

The wiring pattern 370 includes island portions 371U, 371V, and 371W, an island portion 372, an island portion 373, and island portions 374U, 374V, and 374W. The wiring pattern 370 also includes wirings 375A to 375S and an intermediary wiring 376.

The island portions 371U to 371W are aligned in the first direction X with a clearance between each other. In this embodiment, the island portions 371U to 371W have the same shape. On the island portion 371U, the control chip 47U is mounted via the conductive material MP. On the island portion 371V, the control chip 47V is mounted via the conductive material MP. On the island portion 371W, the control chip 47W is mounted via the conductive material MP. The island portions 371U to 371W each include a land portion 371*a*. The land portion 371*a* includes a first portion and a second portion, each of which will be described hereunder. The first portion is connected to the end portion of each of the island portions 371U to 371W, on the side of the first edge 33. The first portion is connected to the end portion of each of the island portions 371U to 371W on the side of the third edge 35. The first portion extends along the first direction X, from each of the island portions 371U to 371W toward the first edge 33. The second portion extends along the second direction Y from the first portion toward the fourth edge 36. The width of the second portion (thickness of the second portion in the first direction X) is wider than the width of the first portion (thickness of the first portion in the second direction Y).

The island portion 372 is similar to the island portion 302 according to the fourth embodiment. The island portions 374U to 374W are formed between the island portion 372 and the island portion 371W in the first direction X. In this embodiment, the island portions 374U to 374W have the same shape. The island portions 374U to 374W are, for example, each formed in a quadrate (square) shape in a plan view. On the island portion 374U, the diode 49U is mounted via the conductive material MP. On the island portion 374V, the diode 49V is mounted via the conductive material MP. On the island portion 374W, the diode 49W is mounted via the conductive material MP. Examples of the material of the conductive material MP, employed to mount the control chips 47U to 47W and the diode 49U to 49W, include silver (Ag), copper (Cu), and gold (Au). In this embodiment, silver is employed to form the conductive material MP.

The intermediary wiring 376 is formed between the island portion 374U and the island portion 374W in the second direction Y. The intermediary wiring 376 is electrically connecting, for example, the control chip 48 and the diode 49V. The intermediary wiring 376 includes a first land portion 376*a*, a second land portion 376*b*, and a connection wiring 376*c* connecting the first land portion 376*a* and the second land portion 376*b*. The intermediary wiring 376 is located so as to overlap with the island portion 374V, as viewed in the first direction X. The first land portion 376*a* is formed between the island portions 374U, 374W and the island portion 372, in the first direction X. The second land portion 376*b* is formed between the island portions 374U, 374W and the island portion 374V, in the first direction X. The center of the second land portion 376*b* in the first direction X is located on the side of the second edge 34 in the first direction X, with respect to the center of the region between the island portion 374V and the island portion 374U in the first direction X. The first land portion 376*a* and the second land portion 376*b* are located so as to overlap with the edge of the island portion 374U on the side of the fourth edge 36, as viewed in the first direction X.

The island portion 373 extends along the first direction X, through the region from the lead frame 28G as far as the lead frame 28R. On the island portion 373, the primary-side circuit chips 160Y and 160Z, and the transformer chips 190Y and 190U to 190W are mounted via the conductive material MP. The island portion 373 includes a first portion 373*a* where the primary-side circuit chip 160Y and the transformer chip 190Y are mounted, and a second portion 373*b* extending along the first direction X, from the first portion 373*a* toward the second edge 34 of the substrate 30. In addition, the island portion 373 includes a cutaway portion 373*c* and protruding portions 373*d* and 373*e*. Examples of the material of the conductive material MP, employed to mount the primary-side circuit chips 160Y and 160Z, and the transformer chips 190Y and 190U to 190W, include silver (Ag), copper (Cu), and gold (Au). In this embodiment, silver is employed to form the conductive material MP.

The first portion 373*a* is formed over a region between the lead frame 28L and the lead frame 28R, in the first direction X. The first portion 373*a* is located on the side of the fourth edge 36 of the substrate 30 in the second direction Y, with respect to the island portion 372. The first portion 373*a* is opposed to the island portion 372, in the second direction Y. The first portion 373*a* is larger in size in the first direction X, than the island portion 372. In this embodiment, the edge of the first portion 373*a* on the side of the second edge 34 of the substrate 30 in the first direction X accords with the edge of the island portion 372 on the side of the second edge 34 of the substrate 30 in the first direction X. The first portion 373*a* is formed so as to overlap with the island portion 374W and the island portions 371U to 371W, as viewed in the first direction X. More specifically, the edge of the first portion 373*a* on the side of the third edge 35 in the second direction Y is located on the side of the fourth edge 36, with respect to the center of the island portion 374W in the second direction Y, and the center of the island portions 371U to 371W in the second direction Y, as viewed in the first direction X. Further, the first portion 373*a* is formed so as to overlap with the respective bonding portions 28*a* of the lead frames 28A and 28B, as viewed in the first direction X.

The protruding portion 373*d* is formed at the end portion of the first portion 373*a* on the side of the fourth edge 36, so as to extend from the first portion 373*a* toward the fourth edge 36. The cutaway portion 373*c* is formed in a portion of the island portion 373 on the side of the second edge 34 with respect to the protruding portion 373*d*, at the position adjacent thereto. The cutaway portion 373*c* is formed so as to stride over the boundary between the first portion 373*a* and the second portion 373*b*. The protruding portion 373*d* is larger in size in the first direction X, than the primary-side circuit chip 160Z. The protruding portion 373*d* is smaller in size in the first direction X, than the transformer chip 190Z.

The primary-side circuit chip 160Z is mounted on the first portion 373*a* and the protruding portion 373*d*. More specifically, the edge of the primary-side circuit chip 160Z on the side of the fourth edge 36 is located in the protruding portion 373*d*. The edge of the primary-side circuit chip 160Z on the side of the third edge 35 is located in the first portion 373*a*. The transformer chip 190Z is located in a region of the first portion 373*a* on the side of the third edge 35 (on the side of the control chip 48).

The second portion 373*b* is formed over a region between the lead frame 28G and the lead frame 28L, in the first direction X. The second portion 373*b* extends along the first direction X. The second portion 373*b* is larger in size in the first direction X, than the first portion 373*a*. However, the second portion 373*b* is smaller in size in the second direction Y, than the first portion 373*a*. The protruding portion 373*e* is formed at the end portion of the second portion 373*b* on the side of the second edge 34, at the position corresponding, in this embodiment, to a portion of the second portion 373*b* overlapping with the lead frames 28G and 28H, as viewed in the second direction Y. The protruding portion 373*e* extends along the second direction Y, from the second portion 373*b* toward the fourth edge 36. The protruding portion 373*e* is larger in size in the first direction X, than the primary-side circuit chip 160Y. The protruding portion 373*e* is located on the side of the second edge 34 of the substrate 30 in the first direction X, with respect to the transformer chip 190W. The protruding portion 373*e* is located so as to overlap with the transformer chip 190V, as viewed in the second direction Y. The protruding portion 373*e* is located so as to overlap with a portion of the transformer chip 190U on the side of the first edge 33, with respect to the center of the transformer chip 190U in the first direction X, as viewed in the second direction Y.

The transformer chips 190U to 190W are mounted on the end portion of the second portion 373*b* on the side of the second edge 34 in the second direction Y. In other words, the transformer chips 190U to 190W are each located on the side of the third edge 35 of the substrate 30, with respect to the protruding portion 373*e*. The primary-side circuit chip 160Y is mounted on the second portion 373*b* and the protruding portion 373*e*. More specifically, the edge of the primary-side circuit chip 160Y on the side of the fourth edge 36 is located on the protruding portion 373*e*.

The wirings 375A to 375S can be grouped into the wirings 375A to 375F and 375Q to 375S connected to the secondary-side circuit 170, and the wirings 375G to 375P connected to the primary-side circuit 160.

The wirings 375A to 375F are respectively connected to the lead frames 28A to 28F, via the bonding material SD9. The wirings 375Q to 375S are respectively connected to the lead frames 28S to 28U, via the bonding material SD9. More specifically, the wiring 375Q is connected to the lead frame 28S. The wiring 375R is connected to the lead frame 28T. The wiring 375S is connected to the lead frame 28U. The wirings 375A to 375F each include a first land portion 375*a*, a second land portion 375*b*, and a connection wiring 375*c* connecting the first land portion 375*a* and the second land portion 375*b*.

The wirings 375A and 375B are, for example, wiring patterns constituting the boot strap circuit including the diode 49U. The wirings 375C and 375D are, for example, wiring patterns constituting the boot strap circuit including the diode 49V. The wirings 375E and 375F are, for example, wiring patterns constituting the boot strap circuit including the diode 49W. The respective first land portions 375*a* of the wirings 375A to 375C are spaced apart from each other in the second direction Y. The first land portion 375*a* of the wiring 375C is located on the side of the fourth edge 36 of the substrate 30 in the second direction Y, with respect to the first land portions 375*a* of the wirings 375A and 375B. The first land portion 375*a* of the wiring 375B is located on the side of the fourth edge 36 of the substrate 30 in the second direction Y, with respect to the first land portion 375*a* of the wiring 375A. The first land portions 375*a* of the wirings 375A to 375C each have, for example, a rectangular shape in a plan view. In an example, the first land portions 375*a* of the wirings 375A to 375C each have the long sides extending along the first direction X. Further, the first land portions 375*a* of the wirings 375A to 375C are located on the side of the second edge 34 of the substrate 30 in the first direction X, with respect to the semiconductor chip 41X. As indicated by a dash-dot auxiliary line drawn in the second direction Y from the island portion 21*a* of the lead frame 20A in FIG. 101, the first land portions 375*a* of the wirings 375A to 375C are formed so as to overlap with the end portion of the island portion 21*a* of the lead frame 20A on the side of the second edge 34, as viewed in the second direction Y.

The respective first land portions 375*a* of the wirings 375D to 375F are located on the side of the fourth edge 36 of the substrate 30 in the second direction Y, with respect to the first land portion 375*a* of the wiring 375C. The first land portions 375*a* of the wirings 375D to 375F are spaced apart from each other in the first direction X. These first land portions 375*a* each have a rectangular shape, with the long sides extending along the second direction Y.

The wiring 375A is located closest to the second edge 34 of the substrate 30 in the first direction X, among the wirings 375A to 375F. The wiring 375A is located closest to the third edge 35 of the substrate 30 in the second direction Y, among the wirings 375A to 375F. To the first land portion 375*a* of the wiring 375A, the bonding portion 28*a* of the lead frame 28A is connected. The second land portion 375*b* of the wiring 375A is located on the side of the third edge 35 of the substrate 30 in the second direction Y, with respect to the island portion 371U. This second land portion 375*b* is formed so as to overlap with a portion of the control chip 47U on the side of the first edge 33 with respect to the center of the control chip 47U in the first direction X, as viewed in the second direction Y. The connection wiring 375*c* of the wiring 375A is formed so as to secure a space for forming the connection wirings 375*c* of the wirings 375B to 375F, between the lead frame 28A and the island portion 371U in the second direction Y. In addition, the connection wiring 375*c* of the wiring 375A is formed so as to secure a space for forming the connection wirings 375*c* of the wirings 375B to 375F, between the island portion 371U and the lead frame 20A in the second direction Y. The connection wiring 375*c* of the wiring 375A includes a first portion and a second portion, each of which will be described hereunder. The first portion extends along the second direction Y, from the first land portion 375*a* toward the third edge 35. The second portion extends along the first direction X, from the first portion toward the first edge 33. The second portion is connected to the second land portion 375*b*.

The wiring 375B is formed adjacent to the wiring 375A, both in the first direction X and in the second direction Y. To the first land portion 375*a* of the wiring 375B, the bonding portion 28*a* of the lead frame 28B is connected. The second land portion 375*b* of the wiring 375B is located on the side of the third edge 35 of the substrate 30 in the second direction Y, with respect to the island portion 371U. The second land portion 375*b* of the wiring 375B is located on the side of the first edge 33 of the substrate 30 in the first direction X, with respect to the second land portion 375*b* of the wiring 375A. The second land portion 375*b* of the wiring 375B is formed adjacent to the second land portion 375*b* of the wiring 375A, in the second direction Y. The second land portion 375*b* of the wiring 375B is located on the side of the first edge 33 of the substrate 30 in the first direction X, with respect to the control chip 47U. The second land portion 375*b* of the wiring 375B is located so as to overlap with the land portion 371*a* of the island portion 371U, as viewed in the second direction Y. The connection wiring 375*c* of the wiring 375B is formed so as to secure a space for forming the respective connection wirings 375*c* of the wirings 375C to 375F, between the lead frames 28A, 28B and the island portion 371U in the first direction X. The connection wiring 375*c* of the wiring 375B is also formed so as to secure a space for forming the connection wirings 375*c* of the wirings 375C to 375F, between the island portion 371U and the lead frame 20A in the second direction Y. Accordingly, the connection wiring 375*c* of the wiring 375B has a similar shape to that of the connection wiring 375*c* of the wiring 375A. The connection wiring 375*c* of the wiring 375B includes a first portion, a second portion, a third portion, a fourth portion, and a fifth portion, each of which will be described hereunder. The first portion extends along the first direction X, from the first land portion 375*a* toward the first edge 33. The second portion extends along the second direction Y. The third portion is connecting the first portion and the second portion. The fourth portion extends along the second direction Y, from the second land portion 375*b* toward the second edge 34. The fifth portion is connecting the second portion and the fourth portion. The third portion and the fifth portion each extend obliquely, so as to be closer to the fourth edge 36 toward the second edge 34 of the substrate 30.

The wiring 375B further includes an extension wiring 375*d*, extending from the second land portion 375*b* of the wiring 375B, to be connected to the island portion 374U. The extension wiring 375*d* extends along the first direction X from the second land portion 375*b*. The extension wiring 375*d* is connected to the end portion of the island portion 374U on the side of the second edge 34 in the first direction X. Further, the extension wiring 375*d* is connected to the end portion of the island portion 374U on the side of the third edge 35 in the second direction Y.

The wiring 375C is formed adjacent to the wiring 375B on the opposite side of the wiring 375A, both in the first direction X and in the second direction Y. To the first land portion 375*a* of the wiring 375C, the bonding portion 28*a* of the lead frame 28C is connected. The second land portion 375*b* of the wiring 375C is located on the side of the third edge 35 of the substrate 30 in the second direction Y, with respect to the island portion 371V. The second land portion 375*b* of the wiring 375C is formed so as to overlap with a portion of the control chip 47V on the side of the first edge 33, with respect to the center of the control chip 47V in the first direction X, as viewed in the second direction Y. The connection wiring 375*c* of the wiring 375C is formed so as to secure a space for forming the respective connection wirings 375*c* of the wirings 375D to 375F, between the lead frames 28A to 28C and the island portion 371U in the first direction X. The connection wiring 375*c* of the wiring 375C is also formed so as to secure a space for forming the connection wirings 375*c* of the wirings 375D to 375F, between the island portions 371U, 371V and the lead frame 20A in the second direction Y. Accordingly, the connection wiring 375*c* of the wiring 375C has a similar shape to that of the connection wiring 375*c* of the wiring 375B, connecting the first land portion 357*a* and the second land portion 375*b*. Making the fourth portion of the connection wiring 375*c* of the wiring 375C longer than that of the connection wiring 375*c* of the wiring 375B allows the connection wiring 375*c* of the wiring 375C to be located on the side of the first edge 33 of the substrate 30, with respect to the connection wiring 375*c* of the wiring 375B.

The wiring 375D is formed adjacent to the wiring 375C on the opposite side of the wiring 375B, both in the first direction X and in the second direction Y. To the first land portion 375*a* of the wiring 375D, the bonding portion 28*a* of the lead frame 28D is connected. This first land portion 375*a* is formed so as to overlap with the respective first land portions 375*a* of the wirings 375A to 375C, as viewed in the second direction Y. The second land portion 375*b* of the wiring 375D is located on the side of the third edge 35 of the substrate 30 in the second direction Y, with respect to the island portion 371V. The second land portion 375*b* of the wiring 375D is located on the side of the first edge 33 of the substrate 30 in the first direction X, with respect to the second land portion 375*b* of the wiring 375C. The second land portion 375*b* of the wiring 375D is formed adjacent to the second land portion 375*b* of the wiring 375C, in the first direction X. The second land portion 375*b* of the wiring 375D is located so as to overlap with the second land portion 375*b* of the wiring 375C, as viewed in the second direction Y. The center of the second land portion 375*b* of the of the wiring 375D in the second direction Y is located on the side of the fourth edge 36 in the second direction Y, with respect to the center of the second land portion 375*b* of the of the wiring 375C in the second direction Y. The second land portion 375*b* of the wiring 375D is located on the side of the first edge 33 of the substrate 30 in the first direction X, with respect to the control chip 47V. The second land portion 375*b* of the wiring 375D is formed so as to overlap with the land portion 371*a* of the island portion 371V, as viewed in the second direction Y. The connection wiring 375*c* of the wiring 375D is formed so as to secure a space for forming the respective connection wirings 375*c* of the wirings 375E and 375F, between the lead frames 28A to 28C and the island portion 371U in the first direction X. The connection wiring 375*c* of the wiring 375C is also formed so as to secure a space for forming the connection wirings 375*c* of the wirings 375E and 375F, between the island portions 371U, 371V and the lead frame 20A in the second direction Y. Accordingly, the connection wiring 375*c* of the wiring 375D has a similar shape to that of the connection wiring 375*c* of the wiring 375C. Making the fourth portion of the connection wiring 375*c* of the wiring 375D longer than that of the connection wiring 375*c* of the wiring 375C allows the connection wiring 375*c* of the wiring 375D to be located on the side of the first edge 33 of the substrate 30, with respect to the connection wiring 375*c* of the wiring 375C.

The wiring 375D also includes the extension wiring 375*d*, like the wiring 375B. The extension wiring 375*d* is connecting the second land portion 375*b* of the wiring 375D and the island portion 374V. The extension wiring 375*d* is connected to the end portion of the island portion 374V on the side of the second edge 34 of the substrate 30, in the first direction X. The extension wiring 375*d* is connected to the end portion of the island portion 374V on the side of the third edge 35 of the substrate 30, in the second direction Y. The extension wiring 375*d* is formed on the side of the fourth edge 36 of the substrate 30 with respect to the extension wiring 375*d* of the wiring 375B, with a clearance therefrom.

The first land portion 375*a* of the wiring 375E is located on the side of the first edge 33 of the substrate 30 in the first direction X, with respect to the first portion of the connection wiring 375*c* of the wiring 375A to 375D. To this first land portion 375*a*, the bonding portion 28*a* of the lead frame 28E is connected. The second land portion 375*b* of the wiring 375E is located on the side of the third edge 35 of the substrate 30 in the second direction Y, with respect to the island portion 371W. The second land portion 375*b* of the wiring 375E is located so as to overlap with a portion of the control chip 47W on the side of the first edge 33, with respect to the center of the control chip 47W in the first direction X, as viewed in the second direction Y. The connection wiring 375*c* of the wiring 375E is formed so as to secure a space for forming the connection wiring 375*c* of the wiring 375F, between the lead frames 28A to 28C and the island portion 371U in the first direction X. The connection wiring 375*c* of the wiring 375E is also formed so as to secure a space for forming the connection wiring 375*c* of the wiring 375F, between the island portions 371U to 371W and the lead frame 20A in the second direction Y. The connection wiring 375*c* of the wiring 375E has a similar shape to that of the connection wiring 375*c* of the wiring 375A.

The first land portion 375*a* of the wiring 375F is formed so as to overlap with the island portion 371U and the control chip 47, as viewed in the second direction Y. More specifically, the first land portion 375*a* of the wiring 375F is located so as to overlap with a portion of the island portion 371U on the side of the second edge 34, with respect to the center of the island portion 371U in the first direction X, as viewed in the second direction Y. The first land portion 375*a* of the wiring 375F is formed so as to overlap with a portion of the control chip 47 on the side of the second edge 34, with respect to the center of the control chip 47 in the first direction X, as viewed in the second direction Y. The second land portion 375*b* of the wiring 375F is located on the side of the third edge 35 of the substrate 30 in the second direction Y, with respect to the island portion 371W. The second land portion 375*b* of the wiring 375F is located on the side of the first edge 33 of the substrate 30 in the first direction X, with respect to the second land portion 375*b* of the wiring 375E. The second land portion 375*b* of the wiring 375F is located adjacent to the second land portion 375*b* of the wiring 375E, in the first direction X. The second land portion 375*b* of the wiring 375F is located on the side of the first edge 33 of the substrate 30 in the first direction X, with respect to the control chip 47W. The second land portion 375*b* of the wiring 375F is located so as to overlap with the land portion 371*a* of the island portion 371W, as viewed in the second direction Y. The connection wiring 375*c* of the wiring 375F, connecting between the first land portion 375*a* and the second land portion 375*b*, includes a first portion, a second portion, a third portion, a fourth portion, and a fifth portion, each of which will be described hereunder. The first portion extends along the second direction Y, from the first land portion 375*a* toward the third edge 35. The second portion extends obliquely from the first portion, so as to be closer to the third edge 35 toward the second edge 34 of the substrate 30, to be routed in the region on the side of the second edge 34 of the substrate 30 with respect to the island portion 371U. The third portion extends along the second direction Y, from the second portion toward the third edge 35. The fourth portion extends along the first direction X. The fourth portion is located on the side of the third edge 35 of the substrate 30, with respect to the island portion 371U. The fifth portion is connecting the third portion and the fourth portion. The fifth portion extends obliquely, so as to be closer to the third edge 35 toward the first edge 33 of the substrate 30.

The wiring 375F also includes the extension wiring 375*d* connecting the second land portion 375*b* of the wiring 375F and the island portion 374W. The extension wiring 375*d* includes a first portion, a second portion, and a third portion, each of which will be described hereunder. The first portion extends along the second direction Y, from the second land portion 375*b* of the wiring 375F toward the fourth edge 36. The first portion is located on the side of the first edge 33 of the substrate 30, with respect to the land portion 371*a* of the island portion 371U. The first portion is located adjacent to the land portion 371*a* of the island portion 371U, in the first direction X. The second portion extends along the first direction X. The second portion overlaps with the island portion 374W, as viewed in the first direction X. The second portion is connected to the end portion of the island portion 374W on the side of the second edge 34 of the substrate 30, in the first direction X. The second portion is connected to the center of the island portion 374W in the second direction Y. The third portion is connecting the first portion and the second portion. The third portion extends obliquely, so as to be closer to the fourth edge 36 toward the first edge 33 of the substrate 30.

The wirings 375G to 375P are each connected to the corresponding one of the lead frames 28I to 28R. More specifically, the wiring 375G is connected to the lead frame 28I. The wiring 375H is connected to the lead frame 28J. The wiring 375I is connected to the lead frame 28K. The wiring 375J is connected to the lead frame 28L. The wiring 375K is connected to the lead frame 28M. The wiring 375L is connected to the lead frame 28N. The wiring 375M is connected to the lead frame 28O. The wiring 375N is connected to the lead frame 28P. The wiring 375O is connected to the lead frame 28Q. The wiring 375P is connected to the lead frame 28R.

The wirings 375G to 375P are each formed in a region between the fourth edge 36 of the substrate 30 and the island portion 373, in the second direction Y. The wirings 375G to 375O each include, like the wiring 375A, the first land portion 375*a*, the second land portion 375*b*, and the connection wiring 375*c*. The wiring 375P includes the first land portion 375*a* and the connection wiring 375*c*. The respective first land portions 375*a* of the wirings 375G to 375P are aligned in the first direction X, with a clearance between each other. These first land portion 375*a* each have a rectangular shape in a plan view. In an example, the first land portions 375*a* of the wirings 375G to 375P each have the long sides extending along the second direction Y.

The wiring 375G is the first signal pattern that transmits, for example, the control signal from the lead frame 28I for the semiconductor chip 41X, to the primary-side circuit chip 160Z. The wiring 375H is the first signal pattern that transmits, for example, the control signal from the lead frame 28J for the semiconductor chip 42X, to the primary-side circuit chip 160Z. The wiring 375I is the first signal pattern that transmits, for example, the control signal from the lead frame 28K for the semiconductor chip 43X, to the primary-side circuit chip 160Z.

The respective second land portions 375*b* of the wirings 375G to 375I are located between the lead frames 28G and 28H and the protruding portion 373*e* formed in the island portion 373, in the second direction Y. These second land portion 375*b* are aligned in the first direction X, with a clearance between each other. These second land portion 375*b* are aligned in the order of second land portion 375*b* of the wiring 375G, second land portion 375*b* of the wiring 375H, and second land portion 375*b* of the wiring 375I, from the side of the second edge 34 of the substrate 30 toward the first edge 33. The second land portion 375*b* of the wiring 375G is the largest in size in the second direction Y, the second land portion 375*b* of the wiring 375H being the second largest, and the second land portion 375*b* of the wiring 375I being the smallest.

The respective second land portions 375*b* of the wiring 375G to 375I are located so as to overlap with the primary-side circuit chip 160Y, as viewed in the second direction Y. The second land portion 375*b* of the wiring 375H is located so as to overlap with the center of the primary-side circuit chip 160Y in the first direction X, as viewed in the second direction Y. The second land portion 375*b* of the wiring 375G is formed so as to overlap with a portion of the primary-side circuit chip 160Y on the side of the second edge 34, with respect to the center of the primary-side circuit chip 160Y in the first direction X, as viewed in the second direction Y. The second land portion 375*b* of the wiring 375I is formed so as to overlap with the end portion of the primary-side circuit chip 160Y on the side of the first edge 33, with respect to the center of the primary-side circuit chip 160Y in the first direction X, as viewed in the second direction Y.

The respective connection wirings 375*c* of the wirings 375G to 375I have a similar shape to each other. The connection wirings 375*c* of the wirings 375G to 375I are formed adjacent to each other in the second direction Y. The connection wiring 375*c* of the wiring 375G is formed in a region on the side of the fourth edge 36 of the substrate 30, with respect to the connection wiring 375*c* of the wiring 375H. The connection wiring 375*c* of the wiring 375I is formed in a region on the side of the third edge 35 of the substrate 30, with respect to the connection wiring 375*c* of the wiring 375H.

The wiring 375J is the power source pattern that supplies, for example, the source voltage VCC from the lead frame 28L to each of the primary-side circuit chips 160Y and 160Z. The second land portion 375*b* of the wiring 375J is located in the cutaway portion 373*c* of the island portion 373. The connection wiring 375*c* of the wiring 375J extends along the second direction Y. This connection wiring 375*c* is thicker than the respective connection wirings 375*c* of the wirings 375G to 375P.

The wiring 375J further includes a branch wiring 375*x* and a second land portion 375*y*. The branch wiring 375*x* extends along the first direction X, from the end portion of the connection wiring 375*c* on the side of the third edge 35 (portion overlapping with the second land portion 375*b* of the wiring 375J, as viewed in the first direction X) toward the second edge 34. The branch wiring 375*x* is formed between the island portion 373 and the connection wiring 375*c* of the wiring 375I, in the second direction Y. The branch wiring 375*x* is formed on the side of the island portion 373 in the second direction Y, with respect to the center of a region between the island portion 373 and the connection wiring 375*c* of the wiring 375I in the second direction Y. The branch wiring 375*x* is thicker than the respective connection wirings 375*c* of the wirings 375G to 375I. The branch wiring 375*x* is finer than the connection wiring 375*c* of the wiring 375J. The second land portion 375*y* is located on the side of the first edge 33 of the substrate 30, with respect to the protruding portion 373*e*. The second land portion 375*y* is located so as to overlap with the protruding portion 373*e*, as viewed in the first direction X. The second land portion 375*y* is formed so as to overlap with the transformer chip 190W, as viewed in the second direction Y.

The wiring 375K is the second signal pattern that transmits, for example, the control signal from the lead frame 28M for the semiconductor chip 44X, to the primary-side circuit chip 160Y'. The wiring 375L is the second signal pattern that transmits, for example, the control signal from the lead frame 28N for the semiconductor chip 45X, to the primary-side circuit chip 160Y. The wiring 375M is the second signal pattern that transmits, for example, the control signal from the lead frame 28O for the semiconductor chip 46X, to the primary-side circuit chip 160Y. The wiring 375N is the signal pattern that transmits, for example, the fault detection signal FO from the lead frame 28P, to the primary-side circuit chip 160Y. The wiring 375O is the signal pattern that transmits, for example, the temperature detection signal VOT from the lead frame 28Q to the primary-side circuit chip 160Y.

The respective second land portions 375*b* of the wirings 375K to 375N are formed between the protruding portion 373*d* of the island portion 373 and the respective bonding portions 28*a* of the lead frames 28M to 28O, in the second direction Y. These second land portions 375*b* are aligned in the first direction X, with a clearance between each other. These second land portions 375*b* are aligned in the order of second land portion 375*b* of the wiring 375K, second land portion 375*b* of the wiring 375L, second land portion 375*b* of the wiring 375M, and second land portion 375*b* of the wiring 375N, from the side of the second edge 34 of the substrate 30 toward the first edge 33. The second land portion 375*b* of the wiring 375K is located so as to overlap with a portion of the protruding portion 373*d* on the side of the second edge 34, with respect to the center of the protruding portion 373*d* in the first direction X, as viewed in the second direction Y. The second land portion 375*b* of the wiring 375L is located so as to overlap with a portion of the protruding portion 373*d* on the side of the second edge 34, with respect to the center of the protruding portion 373*d* in the first direction X, as viewed in the second direction Y. The second land portion 375*b* of the wiring 375L is located on the side of the first edge 33 of the substrate 30 in the first direction X, with respect to the second land portion 375*b* of the wiring 375K. The second land portion 375*b* of the wiring 375M is located so as to overlap with a portion of the protruding portion 373*d* on the side of the first edge 33, with respect to the center of the protruding portion 373*d* in the first direction X, as viewed in the second direction Y. The second land portion 375*b* of the wiring 375N is located so as to overlap with a portion of the protruding portion 373*d* on the side of the first edge 33, with respect to the center of the protruding portion 373*d* in the first direction X, as viewed in the second direction Y. The second land portion 375*b* of the wiring 375N is located on the side of the first edge 33 of the substrate 30 in the first direction X, with respect to the second land portion 375*b* of the wiring 375M.

The first land portion 375*a* of the wiring 375K is located so as to overlap with the second land portion 375*b* of the wiring 375K, as viewed in the second direction Y. The first land portion 375*a* of the wiring 375L is located so as to overlap with the second land portion 375*b* of the wiring 375K, as viewed in the second direction Y. The first land portion 375*a* of the wiring 375M is located so as to overlap with the second land portion 375*b* of the wiring 375M, as viewed in the second direction Y. The respective connection wirings 375*c* of the wirings 375K to 375M extend along the second direction Y.

The first land portion 375*a* of the wiring 375N is located on the side of the first edge 33 of the substrate 30 in the first direction X, with respect to the second land portion 375*b* of the wiring 375N. The connection wiring 375*c* of the wiring 375N includes a first portion, a second portion, and a third portion, each of which will be described hereunder. The first portion extends along the second direction Y, from the first land portion 375*a* toward the third edge 35. The second portion extends along the first direction X, from the second land portion 375*b* toward the first edge 33. The third portion is connecting the first portion and the second portion. The third portion extends obliquely, so as to be closer to the fourth edge 36 toward the first edge 33 of the substrate 30.

The second land portion 375*b* of the wiring 375O is located in the cutaway portion 373*c* of the island portion

373. This second land portion 375*b* is located so as to overlap with the protruding portion 373*d*, as viewed in the first direction X. The first land portion 375*a* of the wiring 375O is located on the side of the first edge 33 of the substrate 30 in the first direction X, with respect to the second land portion 375*b* of the wiring 375O. The connection wiring 375*c* of the wiring 375O has a similar shape to that of the connection wiring 375*e* of the wiring 375N.

The connection wiring 375*c* of the wiring 375P extends along the second direction Y, from the first land portion 375*a* of the wiring 375P toward the third edge 35. The connection wiring 375*c* of the wiring 375P is connected to the end portion of the island portion 373 on the side of the first edge 33 in the first direction X. The connection wiring 375*c* of the wiring 375P is connected to the end portion of the first portion 373*a* of the island portion 373, on the side of the fourth edge 36 in the second direction Y. This connection wiring 375*c* is thicker than the respective connection wirings 375*c* of the wirings 375K to 375O.

The wirings 375Q to 375S are, for example, electrically connected to the control chip 48. The wiring 375Q is the signal pattern that supplies, for example, the detection voltage CIN from the lead frame 28S to the control chip 48. The wiring 375R is the power source pattern that supplies, for example, the source voltage VCC to the control chip 48. The wiring 375S is, for example, the ground pattern connected to the island portion 372.

The respective first land portions 375*a* of the wirings 375Q to 375S are aligned in the second direction Y, with a clearance between each other. These first land portions 375*a* have, for example, a rectangular shape in a plan view. In an example, the first land portions 375*a* of the wirings 375Q to 375S each have the long sides extending along the first direction X. These first land portions 375*a* are aligned in the order of first land portion 375*a* of the wiring 375Q, first land portion 375*a* of the wiring 375R, and first land portion 375*a* of the wiring 375S, from the side of the fourth edge 36 of the substrate 30, toward the third edge 35.

The respective second land portions 375*b* of the wirings 375Q and 375R are located on the side of the first edge 33 of the substrate 30, with respect to the island portion 372. The second land portions 375*b* of the wirings 375Q and 375R are aligned in the second direction Y, with a clearance therebetween. These second land portions 375*b* are formed so as to overlap with the island portion 372, as viewed in the first direction X.

The respective connection wirings 375*c* of the wirings 375Q and 375R have a similar shape to each other. These connection wirings 375*c* include a first portion, a second portion, a third portion, a fourth portion, and a fifth portion, each of which will be described hereunder. The first portion extends along the first direction X, from the first land portion 375*a* toward the second edge 34. The second portion extends along the first direction X, from the second land portion 375*b* toward the first edge 33. The third portion extends along the second direction Y. The fourth portion is connecting an end of the third portion and the first portion. The fifth portion is connecting the other end of the third portion and the second portion. The fourth portion and the fifth portion each extend obliquely, so as to be closer to the fourth edge 36, toward the first edge 33 of the substrate 30.

The connection wiring 375*c* of the wiring 375S is formed so as to surround the connection wirings 375*c* of the wirings 375Q and 375R, from the side of the first edge 33 and the side of the third edge 35. The connection wiring 375*c* of the wiring 375S is located on the side of the third edge 35 of the substrate 30, with respect to the second land portions 375*b* of the wirings 375Q and 375R. The connection wiring 375*c* of the wiring 375S is connected to the end portion of the island portion 372 on the side of the first edge 33, in the first direction X. The connection wiring 375*c* of the wiring 375S is connected to the end portion of the island portion 372 on the side of the third edge 35, in the second direction Y. The connection wiring 375*c* of the wiring 375S is thicker than the connection wirings 375*c* of the wirings 375Q and 375R. The connection wiring 375*c* of the wiring 375S is finer than the connection wiring 375*c* of the wiring 375J.

Figure 103:
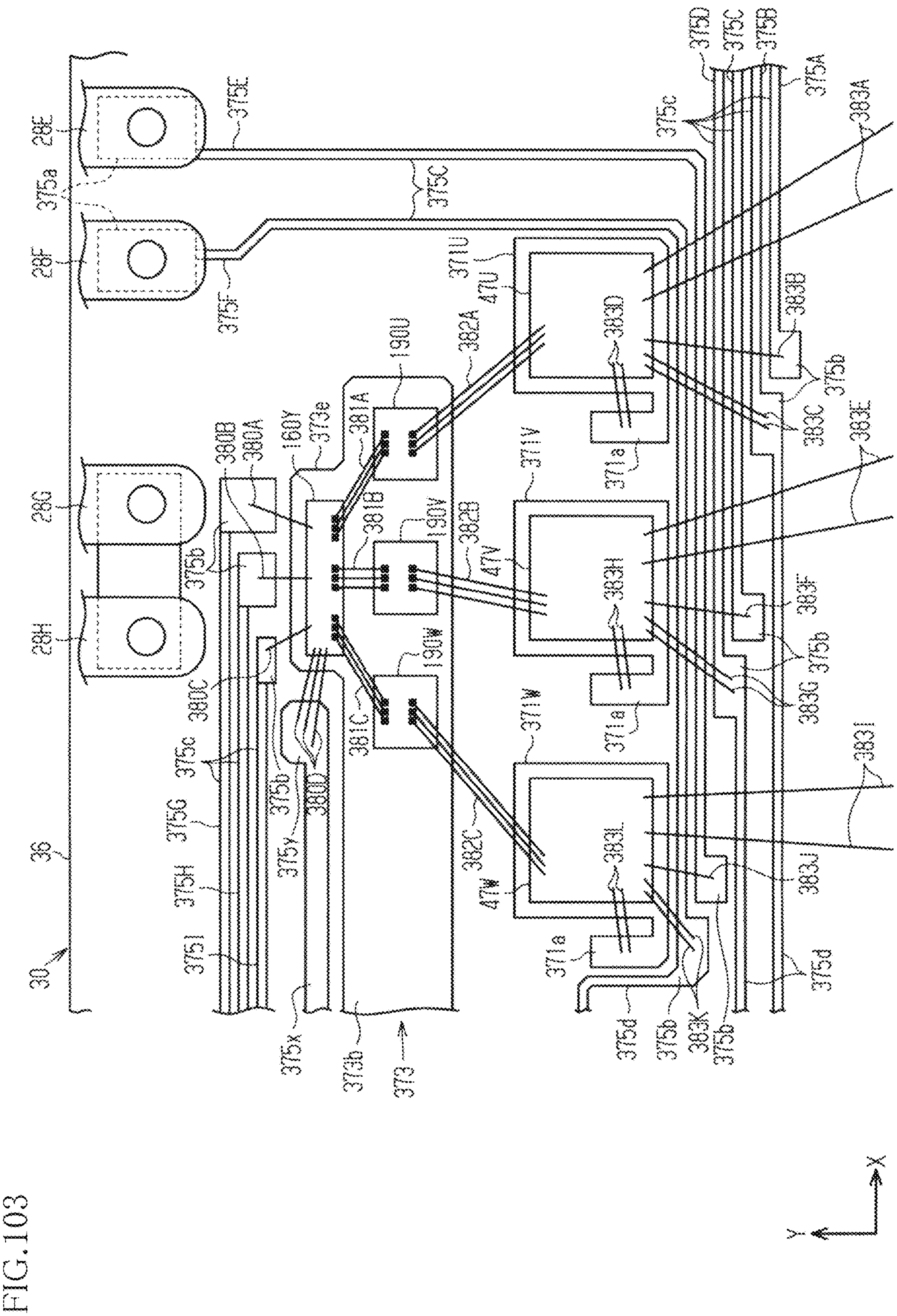
FIG. 103 is an enlarged view of a control circuit chip and a periphery thereof in FIG. 101.

As shown in FIG. 103, the primary-side circuit chip 160Y is connected to the respective second land portions 375*b* of the wirings 375G to 375I, via wires 380A to 380C. A first end portion of the wire 380A is connected to the second land portion 375*b* of the wiring 375G. A second end portion of the wire 380A is connected to the end portion of the primary-side circuit chip 160Y on the side of the fourth edge 36, in the second direction Y. The second end portion of the wire 380A is connected to a position on the primary-side circuit chip 160Y on the side of the second edge 34 in the first direction X, with respect to the center of the primary-side circuit chip 160Y in the first direction X. A first end portion of the wire 3803 is connected to the second land portion 375*b* of the wiring 375H. A second end portion of the wire 380B is connected to the end portion of the primary-side circuit chip 160Y on the side of the fourth edge 36, in the second direction Y. The second end portion of the wire 380A is connected to the center of the primary-side circuit chip 160Y in the first direction X. A first end portion of the wire 380C is connected to the second land portion 375*b* of the wiring 375I. A second end portion of the wire 380C is connected to the end portion of the primary-side circuit chip 160Y on the side of the fourth edge 36, in the second direction Y. The second end portion of the wire 380C is connected to a position on the primary-side circuit chip 160Y on the side of the first edge 33 in the first direction X, with respect to the center of the primary-side circuit chip 160Y in the first direction X.

The primary-side circuit chip 160Y is connected to the second land portion 375*y* of the wiring 375J, via three wires 380D. A first end portion of the wire 380D is connected to the second land portion 375*y* of the wiring 375J. A second end portion of the wire 380D is connected to the end portion of the primary-side circuit chip 160Y on the side of the first edge 33, in the first direction X.

The primary-side circuit chip 160Y and the transformer chips 190U to 190W are connected via wires 381A to 381C. Respective first end portions of three wires 381A are connected to the end portion of the primary-side circuit chip 160Y on the side of the third edge 35, in the second direction Y.

The first end portions of the three wires 381A are each connected to a position on the primary-side circuit chip 160Y on the side of the second edge 34 in the first direction X, with respect to the center of the primary-side circuit chip 160Y in the first direction X. Respective second end portions of the three wires 381A are connected to the end portion of the transformer chip 190U on the side of the fourth edge 36, in the second direction Y. The second end portions of the three wires 381A are connected to the center of the transformer chip 190U in the first direction X.

Respective first end portions of three wires 381B are connected to the end portion of the primary-side circuit chip 160Y on the side of the third edge 35, in the second direction Y. The first end portions of the three wires 381B are connected to the center of the primary-side circuit chip 160Y in the first direction X. Respective second end portions of the three wires 381B are connected to the end portion of the transformer chip 190V on the side of the fourth edge 36, in the second direction Y. The second end portions of the three wires 381B are connected to the center of the transformer chip 190V in the first direction X.

Respective first end portions of three wires 381C are connected to the end portion of the primary-side circuit chip 160Y on the side of the third edge 35, in the second direction Y. The first end portions of the three wires 381B are each connected to a position on the primary-side circuit chip 160Y on the side of the first edge 33, with respect to the center of the primary-side circuit chip 160Y in the first direction X. Respective second end portions of the three wires 381C are connected to the end portion of the transformer chip 190W on the side of the fourth edge 36, in the second direction Y. The second end portions of the three wires 381C are connected to the center of the transformer chip 190W in the first direction X.

The transformer chip 190U and the control chip 47U are connected via three wires 382A. The transformer chip 190V and the control chip 47V are connected via three wires 382B. The transformer chip 190W and the control chip 47W are connected via three wires 382C.

Respective first end portions of the three wires 382A are connected to a position on the transformer chip 190U on the side of the third edge 35 in the second direction Y, with respect to the center of the transformer chip 190U in the second direction Y. The first end portions of the three wires 382A are each connected to the center of the transformer chip 190U in the first direction X. Respective second end portions of the three wires 382A are connected to the end portion of the control chip 47U on the side of the fourth edge 36, in the second direction Y. The second end portions of the three wires 382A are each connected to a position on the control chip 47U on the side of the first edge 33 in the first direction X, with respect to the center of the control chip 47U in the first direction X.

Respective first end portions of the three wires 382B are connected to a position on the transformer chip 190V on the side of the third edge 35 in the second direction Y, with respect to the center of the transformer chip 190V in the second direction Y. The first end portions of the three wires 382B are each connected to the center of the transformer chip 190V in the first direction X. Respective second end portions of the three wires 382B are connected to the end portion of the control chip 47V on the side of the fourth edge 36, in the second direction Y. The second end portions of the three wires 382B are each connected to a position on the control chip 47V on the side of the first edge 33 in the first direction X, with respect to the center of the control chip 47V in the first direction X.

Respective first end portions of the three wires 382C are connected to a position on the transformer chip 190W on the side of the third edge 35 in the second direction Y, with respect to the center of the transformer chip 190W in the second direction Y. The first end portions of the three wires 382C are each connected to the center of the transformer chip 190W in the first direction X. Respective second end portions of the three wires 382C are connected to the end portion of the control chip 47W on the side of the fourth edge 36, in the second direction Y. The second end portions of the three wires 382C are each connected to a position on the control chip 47W on the side of the first edge 33 in the first direction X, with respect to the center of the control chip 47W in the first direction X.

The control chips 47U to 47W are connected to the semiconductor chips 41X to 43X, the wirings 375A to 375F, and the land portion 371*a*, via wires 383A to 383L. To the control chip 47U, the wires 383A to 383D are connected. Two wires 383A are connecting the control chip 47U, and the second electrode GP and first electrode SP of the semiconductor chip 41X. Respective first end portions of two wires 383A are connected to the end portion of the control chip 47U on the side of the third edge 35 of the substrate 30, in the second direction Y. The first end portions of the two wires 383A are connected to the end portion of the control chip 47U on the side of the second edge 34 in the first direction X, with respect to the center of the control chip 47U in the first direction X. The first end portions of the two wires 383A are spaced apart from each other in the first direction X. A second end portion of one of the wires 383A is connected to the second electrode GP of the semiconductor chip 41X. A second end portion of the other wire 383A is connected to a position on the first electrode SP of the semiconductor chip 41X, on the side of the first edge 33 of the substrate 30 in the first direction X, with respect to the second electrode GP.

A first end portion of the wire 383B is connected to the end portion of the control chip 47U on the side of the third edge 35, in the second direction Y. The first end portion of the wire 383B is connected to a position on the control chip 47U on the side of the first edge 33 in the first direction X, with respect to the center of the control chip 47U in the first direction X. A second end portion of the wire 383B is connected to the second land portion 375*b* of the wiring 375A.

Respective first end portions of two wires 383C are connected to the end portion of the control chip 47U on the side of the third edge 35 of the substrate 30, in the second direction Y. The first end portions of the two wires 383C are connected to the end portion of the control chip 47U on the side of the first edge 33 in the first direction X, with respect to the center of the control chip 47U in the first direction X. The first end portions of the two wires 383C are spaced apart from each other in the first direction X. The first end portions of the two wires 383C are each located at a position on the control chip 47U on the side of the first edge 33, with respect to the first end portion of the wire 383B. Respective second end portions of the two wires 383C are connected to the second land portion 375*b* of the wiring 375B.

Respective first end portions of two wires 383D are connected to the end portion of the control chip 47U on the side of the first edge 33, in the first direction X. The first end portions of the two wires 383D are each connected to a position on the control chip 47U on the side of the third edge 35 in the second direction Y, with respect to the center of the control chip 47U in the second direction Y. The first end portions of the two wires 383D are spaced apart from each other in the second direction Y. Respective second end portions of the two wires 383D are connected to the land portion 371*a* of the island portion 371U.

To the control chip 47V, the wires 383E to 383H are connected. Two wires 383E are connecting the control chip 47V, and the second electrode GP and first electrode SP of the semiconductor chip 42X. Respective first end portions of two wires 383E are connected to the end portion of the control chip 47V on the side of the third edge 35, in the second direction Y. The first end portions of the two wires 383E are each connected to a position on the control chip 47V on the side of the second edge 34 in the first direction X, with respect to the center of the control chip 47V in the first direction X. The first end portions of the two wires 383E are spaced apart from each other in the first direction X. A second end portion of one of the wires 383E is connected to the second electrode GP of the semiconductor chip 42X. A second end portion of the other wire 383E is connected to a position on the first electrode SP of the semiconductor chip 42X, on the side of the first edge 33 in the first direction X, with respect to the second electrode GP.

A first end portion of the wire 383F is connected to the end portion of the control chip 47V on the side of the third edge 35, in the second direction Y. The first end portion of the wire 383F is connected to a position on the control chip 47V on the side of the first edge 33 in the first direction X, with respect to the center of the control chip 47V in the first direction X. A second end portion of the wire 383F is connected to the second land portion 375*b* of the wiring 375C.

Respective first end portions of two wires 383G are connected to the end portion of the control chip 47V on the side of the third edge 35, in the second direction Y. The first end portions of the two wires 383G are each connected to a position on the control chip 47V on the side of the first edge 33 in the first direction X, with respect to the center of the control chip 47V in the first direction X. The first end portions of the two wires 383G are spaced apart from each other in the first direction X. The first end portions of the two wires 383G are each located at a position on the control chip 47V on the side of the first edge 33, with respect to the first end portion of the wire 383F. Respective second end portions of the two wires 383G are connected to the second land portion 375*b* of the wiring 375D.

Respective first end portions of two wires 383H are connected to the end portion of the control chip 47V on the side of the first edge 33, in the first direction X. The first end portions of the two wires 383H are each connected to a position on the control chip 47V on the side of the third edge 35 in the second direction Y, with respect to the center of the control chip 47V in the second direction Y. Respective second end portions of the two wires 383H are connected to the land portion 371*a* of the island portion 371V.

To the control chip 47W, the wires 383I to 383L are connected. Two wires 383I are connecting the control chip 47W, and the second electrode GP and first electrode SP of the semiconductor chip 43X. Respective first end portions of two wires 383I are connected to the end portion of the control chip 47W on the side of the third edge 35, in the second direction Y. The first end portions of the two wires 383I are each connected to a position on the control chip 47W on the side of the second edge 34 in the first direction X, with respect to the center of the control chip 47W in the first direction X. The first end portions of the two wires 383I are spaced apart from each other in the first direction X. A second end portion of one of the wires 383I is connected to the second electrode GP of the semiconductor chip 43X. A second end portion of the other wire 383I is connected to a position on the first electrode SP of the semiconductor chip 43X, on the side of the first edge 33 in the first direction X, with respect to the second electrode GP.

A first end portion of the wire 383J is connected to the end portion of the control chip 47W on the side of the third edge 35, in the second direction Y. The first end portion of the wire 383J is connected to a position on the control chip 47W on the side of the first edge 33 in the first direction X, with respect to the center of the control chip 47W in the first direction X. A second end portion of the wire 383J is connected to the second land portion 375*b* of the wiring 375E.

Respective first end portions of two wires 383K are connected to the end portion of the control chip 47W on the side of the third edge 35, in the second direction Y. The first end portions of the two wires 383K are each connected to a position on the control chip 47W on the side of the first edge 33 in the first direction X, with respect to the center of the control chip 47W in the first direction X. The first end portions of the two wires 383K are spaced apart from each other in the first direction X. The first end portions of the two wires 383K are each located at a position on the control chip 47W on the side of the first edge 33, with respect to the first end portion of the wire 383J. Respective second end portions of the two wires 383K are connected to the second land portion 375*b* of the wiring 375F.

Respective first end portions of two wires 383L are connected to the end portion of the control chip 47W on the side of the first edge 33, in the first direction X. The first end portions of the two wires 383L are each connected to a position on the control chip 47W on the side of the third edge 35 in the second direction Y, with respect to the center of the control chip 47W in the second direction Y. Respective second end portions of the two wires 383L are connected to the land portion 371*a* of the island portion 371W.

Figure 104:
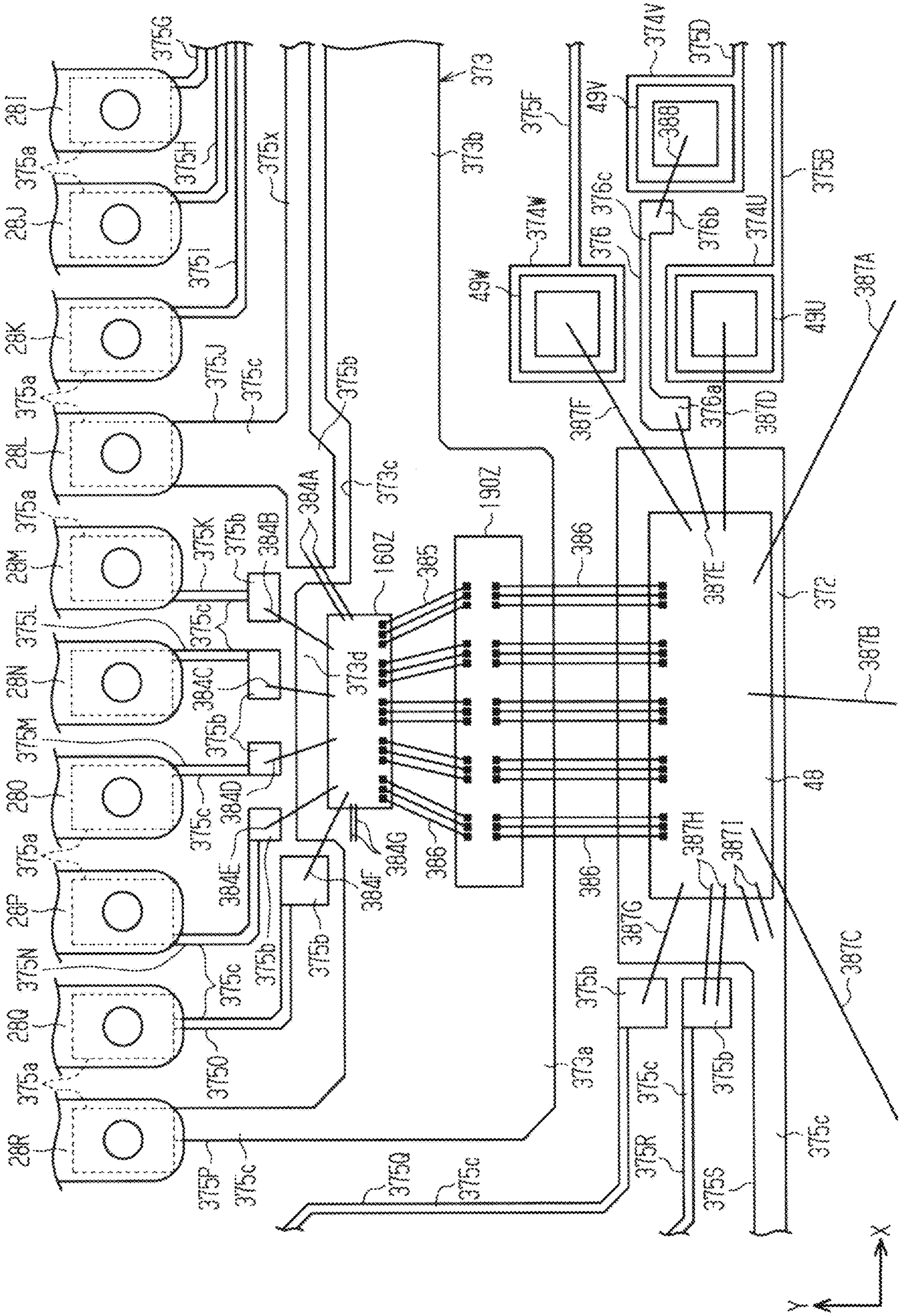
FIG. 104 is an enlarged view of another control circuit chip and a periphery thereof in FIG. 101.

As shown in FIG. 104, the primary-side circuit chip 160Z is connected to the respective second land portions 375*b* of the wirings 375L to 375O, and the island portion 373, via wires 384A to 384G.

Respective first end portions of two wires 384A are connected to the end portion of the primary-side circuit chip 160Z on the side of the second edge 34, in the first direction X. The first end portions of the two wires 384A are each located at a position on the primary-side circuit chip 160Z on the side of the fourth edge 36 in the second direction Y, with respect to the center of the primary-side circuit chip 160Z in the second direction Y. Respective second end portions of the two wires 384A are connected to the second land portion 375*b* of the wiring 375L.

A first end portion of the wire 384B is connected to the end portion of the primary-side circuit chip 160Z on the side of the fourth edge 36, in the second direction Y. The first end portion of the wire 384B is connected to a position on the primary-side circuit chip 160Z on the side of the second edge 34 in the first direction X, with respect to the center of the primary-side circuit chip 160Z in the first direction X. A second end portion of the wire 384B is connected to the second land portion 375*b* of the wiring 375K. The second end portion of the wire 384B is connected to a position on the second land portion 375*b* of the wiring 375K on the side of the first edge 33 in the first direction X, with respect to the center of the second land portion 375*b* in the first direction X.

A first end portion of the wire 384C is connected to the end portion of the primary-side circuit chip 160Z on the side of the fourth edge 36, in the second direction Y. The first end portion of the wire 384C is connected to a position on the primary-side circuit chip 160Z on the side of the second edge 34 in the first direction X, with respect to the center of the primary-side circuit chip 160Z in the first direction X. The first end portion of the wire 384C is located at a position on the primary-side circuit chip 160Z on the side of the first edge 33, with respect to the first end portion of the wire 384B. A second end portion of the wire 384C is connected to the second land portion 375*b* of the wiring 375L. The second end portion of the wire 384C is connected to a position on the second land portion 375*b* of the wiring 375L on the side of the first edge 33 in the first direction X, with respect to the center of the second land portion 375*b* in the first direction X.

A first end portion of the wire 384D is connected to the end portion of the primary-side circuit chip 160Z on the side of the fourth edge 36, in the second direction Y. The first end portion of the wire 384D is connected to a position on the primary-side circuit chip 160Z on the side of the first edge 33 in the first direction X, with respect to the center of the primary-side circuit chip 160Z in the first direction X. A second end portion of the wire 384D is connected to the second land portion 375*b* of the wiring 375M.

A first end portion of the wire 384E is connected to the end portion of the primary-side circuit chip 160Z on the side of the fourth edge 36, in the second direction Y. The first end portion of the wire 384E is connected to a position on the primary-side circuit chip 160Z on the side of the first edge 33 in the first direction X, with respect to the center of the primary-side circuit chip 160Z in the first direction X. The first end portion of the wire 384E is located at a position on the primary-side circuit chip 160Z on the side of the first edge 33, with respect to the first end portion of the wire 384D. A second end portion of the wire 384E is connected to the second land portion 375*b* of the wiring 375N.

A first end portion of the wire 384F is connected to the end portion of the primary-side circuit chip 160Z on the side of the first edge 33, in the first direction X. The first end portion of the wire 384F is located at a position on the primary-side circuit chip 160Z on the side of the fourth edge 36 in the second direction Y, with respect to the center of the primary-side circuit chip 160Z in the second direction Y. A second end portions of the wire 384F is connected to the second land portion 375*b* of the wiring 375O.

Respective first end portions of two wires 384G are connected to the end portion of the primary-side circuit chip 160Z on the side of the first edge 33, in the first direction X. The first end portions of the two wires 384G are each connected to a position on the primary-side circuit chip 160Z on the side of the fourth edge 36 in the second direction Y, with respect to the center of the primary-side circuit chip 160Z in the second direction Y. Respective second end portions of the two wires 384G are connected to the first portion 373*a* of the island portion 373. The second end portions of the two wires 384G are each located on the side of the second edge 34 of the substrate 30 in the first direction X, with respect to the second land portion 375*b* of the wiring 375O.

The primary-side circuit chip 160Y is connected to the transformer chip 190Y, via a plurality of wires 385. The transformer chip 190Y is connected to the control chip 48, via a plurality of wires 386. Respective first end portions of the plurality of wires 385 are connected to the end portion of the primary-side circuit chip 160Y, on the side of the third edge 35 in the second direction Y. The first end portions of the plurality of wires 385 are spaced apart from each other, in the first direction X. Respective second end portions of the plurality of wires 385 are connected to the end portion of the transformer chip 190Y on the side of the fourth edge 36, in the second direction Y. The second end portions of the plurality of wires 385 are spaced apart from each other, in the first direction X. Respective first end portions of the plurality of wires 386 are connected to a position on the transformer chip 190Y on the side of the third edge 35 in the second direction 1, with respect to the center of the transformer chip 190Y in the second direction Y. The first end portions of the plurality of wires 386 are spaced apart from each other, in the first direction X. Respective second end portions of the plurality of wires 386 are connected to the end portion of the control chip 48 on the side of the fourth edge 36, in the second direction Y. The second end portions of the plurality of wires 386 are spaced apart from each other, in the first direction X. The plurality of wires 386 are longer than the plurality of wires 385.

To the control chip 48, wires 387A to 387I are connected. A first end portion of the wire 387A is connected to the end portion of the control chip 48 on the side of the third edge 35, in the second direction Y. The first end portion of the wire 387A is connected to a position on the control chip 48 on the side of the second edge 34 in the first direction X, with respect to the center of the control chip 48 in the first direction X. A second end portion of the wire 387A is connected to the second electrode GP of the semiconductor chip 44X.

A first end portion of the wire 387B is connected to the end portion of the control chip 48 on the side of the third edge 35, in the second direction Y. The first end portion of the wire 387B is connected to the center of the control chip 48 in the first direction X. A second end portion of the wire 387B is connected to the second electrode GP of the semiconductor chip 45X.

A first end portion of the wire 387C is connected to the end portion of the control chip 48 on the side of the third edge 35, in the second direction Y. The first end portion of the wire 387C is connected to a position on the control chip 48 on the side of the first edge 33 in the first direction X, with respect to the center of the control chip 48 in the first direction X. A second end portion of the wire 387C is connected to the second electrode GP of the semiconductor chip 46X.

Respective first end portions of the wires 387D to 387F are connected to the end portion of the control chip 48 on the side of the second edge 34, in the first direction X. The first end portions of the wires 387D to 387F are spaced apart from each other, in the second direction Y. The first end portion of the wire 387D is located at a position on the control chip 48 on the side of the third edge 35 in the second direction Y, with respect to the center of the control chip 48 in the second direction Y. The first end portion of the wire 387E is located at the center of the control chip 48 in the second direction Y. The first end portion of the wire 387F is located at a position on the control chip 48 on the side of the fourth edge 36 in the second direction Y, with respect to the center of the control chip 48 in the second direction Y. A second end portion of the wire 387D is connected to the diode 49U. A second end portion of the wire 387F is connected to the diode 49W. A second end portion of the wire 387E is connected to the first land portion 376*a* of the intermediary wiring 376. The second land portion 376*b* of the intermediary wiring 376 and the diode 49V are connected via a wire 388. A first end portion of the wire 388 is connected to the second land portion 376*b* of the intermediary wiring 376. A second end portion of the wire 388 is connected to the diode 49V.

A first end portion of the wire 387G is connected to the end portion of the control chip 48 on the side of the first edge 33, in the first direction X. The first end portion of the wire 387G is connected to a position on the control chip 48 on the side of the fourth edge 36 in the first direction X, with respect to the center of the control chip 48 in the second direction Y. A second end portion of the wire 387G is connected to the second land portion 375*b* of the wiring 375Q.

Respective first end portions of two wires 387H are connected to the end portion of the control chip 48 on the side of the first edge 33, in the first direction X. The first end portions of the two wires 387H are spaced apart from each other, in the second direction Y. The first end portion of one of the wires 387H is located at the center of the control chip 48 in the second direction Y. The first end portion of the other wire 387H is located at a position on the control chip 48 on the side of the third edge 35 in the second direction Y, with respect to the center of the control chip 48 in the second direction Y. Respective second end portions of the two wires 387H are connected to the second land portion 375*b* of the wiring 375R.

Respective first end portions of two wires 387I are connected to the end portion of the control chip 48 on the side of the first edge 33, in the first direction X. The first end portions of the two wires 387I are each connected to a position on the control chip 48 on the side of the third edge 35 in the second direction Y, with respect to the center of the control chip 48 in the second direction Y. The first end portions of the two wires 387I are spaced apart from each other, in the second direction Y. Respective second end portions of the two wires 387I are connected to the island portion 372. The second end portions of the two wires 387I are each connected to a position on the island portion 372 between the edge thereof on the side of the first edge 33 and the control chip 48, in the first direction X. The second end portions of the two wires 387I are spaced apart from each other, in the second direction Y.

<Variations>

The description of the foregoing embodiments represents examples of the semiconductor package and the manufacturing method thereof according to the present disclosure, with no limitation whatsoever. The semiconductor package and the manufacturing method thereof according to the present disclosure may be configured, without limitation to the foregoing embodiments, through a combination of at least two of the following variations, unless contradiction is incurred. In the description of the following variations, the elements that are common to the foregoing embodiments will be given the same numeral, and the description thereof will not be repeated.

Figure 105:
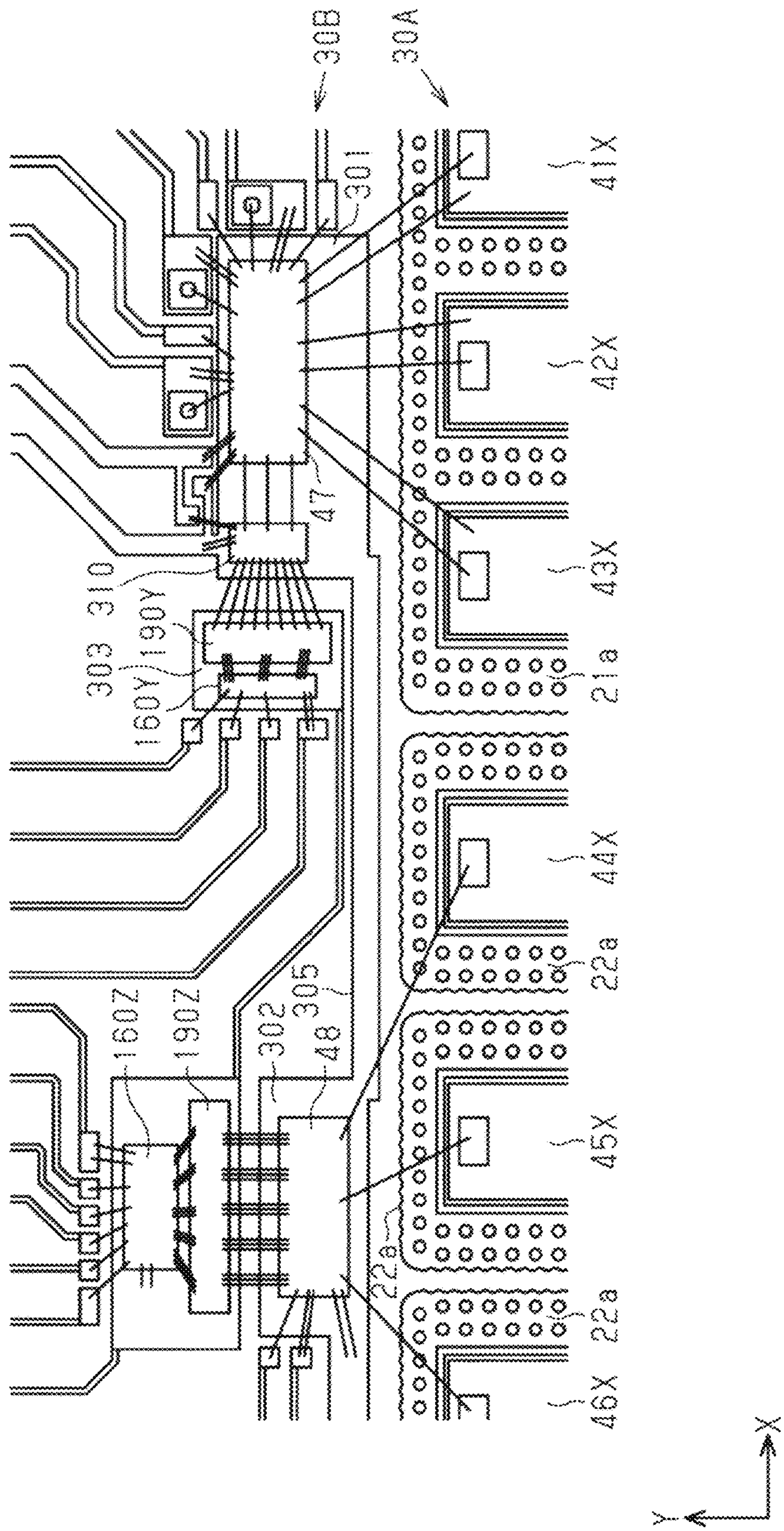
FIG. 105 is a plan view showing a part of an internal configuration of a variation of the semiconductor package.
Figure 106:
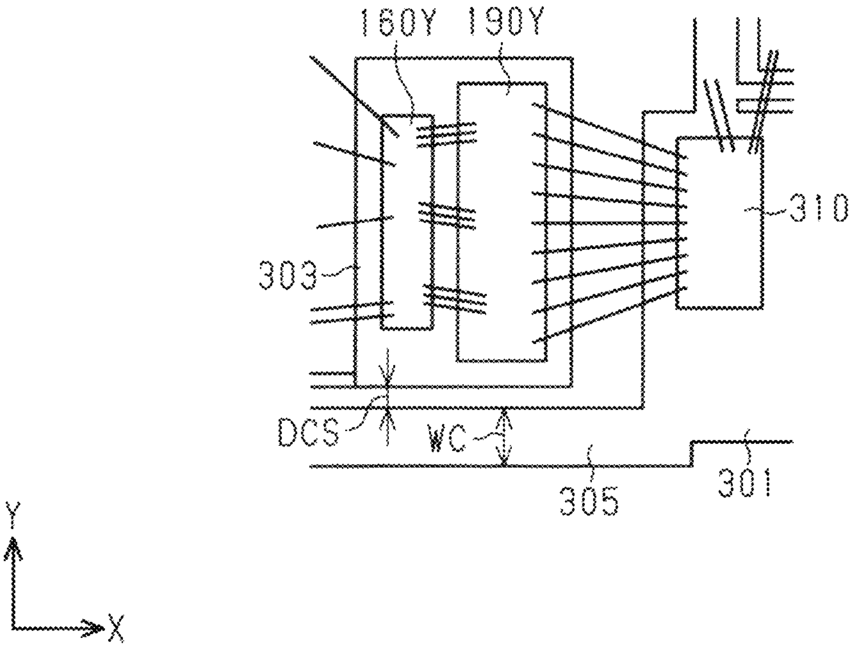
FIG. 106 is an enlarged view of an intermediary chip and a periphery thereof in the variation of the semiconductor package.

In the tenth embodiment, the thickness of the connection wiring 305 may be modified as desired. In an example, the connection wiring 305 may be made thicker as shown in FIG. 105, compared with the connection wiring 305 according to the tenth embodiment (see FIG. 90). In this case, the clearance between the connection wiring 305 and the island portion 303 in the second direction Y is narrowed. In an example, the thickness WC of the connection wiring 305 may be larger than the distance DCS between the connection wiring 305 and the island portion 303 in the second direction Y, as shown in FIG. 106.

In addition, as shown in FIG. 105, connection wiring 305 may be formed so as to protrude toward the second region 30A, from the island portion 301. The connection wiring 305 may also be formed so as to protrude toward the second region 30A, from the island portion 302. The shape of the connection wiring 305 may be modified as desired, without limitation to the linear shape extending along the first direction X. In an example, a portion of the connection wiring 305 on the side of the island portion 302 may be formed farther away from the second region 30A in the second direction Y, compared with the connection wiring 305 shown in FIG. 105 and FIG. 106, so as to keep the portion of the connection wiring 305 on the side of the island portion 302 from protruding toward the island portion 302 in the second direction Y.

Figure 107:
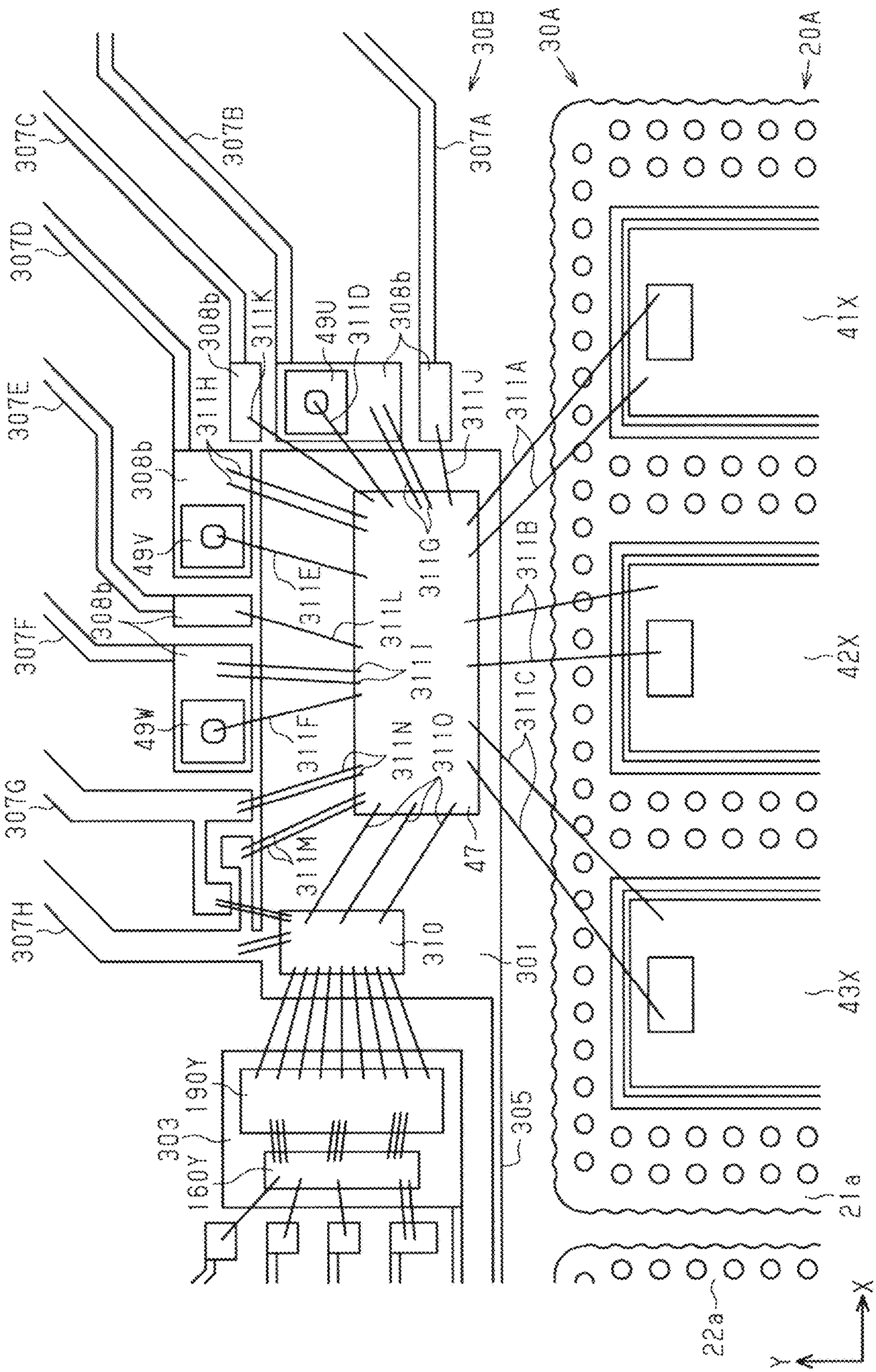
FIG. 107 is an enlarged view of a control circuit chip and a periphery thereof in an internal configuration of the variation of the semiconductor package.

In the tenth embodiment, the position of the control chip 47 on the island portion 301 may be modified as desired. In an example, as shown in FIG. 107, the control chip 47 may be located in a region of the island portion 301 on the side of the lead frame 20A, in the second direction Y. More specifically, the control chip 47 may be located on the side of the lead frame 20A, with respect to the intermediary chip 310. In this case, the control chip 47 is located closer to the semiconductor chips 41X to 43X, compared with the configuration according to the tenth embodiment, and therefore the wires 311A to 311C connecting the control chip 47 and the semiconductor chips 41X to 43X can each be shortened. Here, the position of the control chip 47 in the second direction Y and the position of the control chip 48 in the second direction Y (see FIG. 90) may be the same as each other. In addition, the position of the control chip 47 may also be modified, in the variation shown in FIG. 65.

Further, the positions of the wirings 307A to 307C in the second direction Y may be shifted toward the lead frame 20A. In an example, the edge of the second land portion 308*b* wiring 307A on the side of the lead frame 20A may be located at the same position as the edge of the island portion 301 on the side of the lead frame 20A, in the second direction Y. In this case, the wires 311J, 311G, and 311K can be shortened. In addition, a portion of the island portion 301 overlapping, as viewed in the second direction Y, with the second land portions 308*b* of the wirings 307D to 307F, may be cut away, so as to allow the second land portions 308*b* of the wirings 307D to 307F to be shifted toward the lead frame 20A, in the second direction Y. In this case, the second land portions 308*b* of the wirings 307D to 307F, as well as the diodes 49V and 49W, are brought closer to the control chip 47, and therefore the wires 311H, 311E, 311L, 311I, and 311F can be shortened.

In the tenth embodiment, the position of the intermediary chip 310 on the island portion 301 may be modified as desired. In an example, the intermediary chip 310 may be located in a region of the island portion 301 on the side of the lead frame 20A, in the second direction Y. Here, the position of the intermediary chip 310 may also be modified, in the variation shown in FIG. 65.

Figure 108:
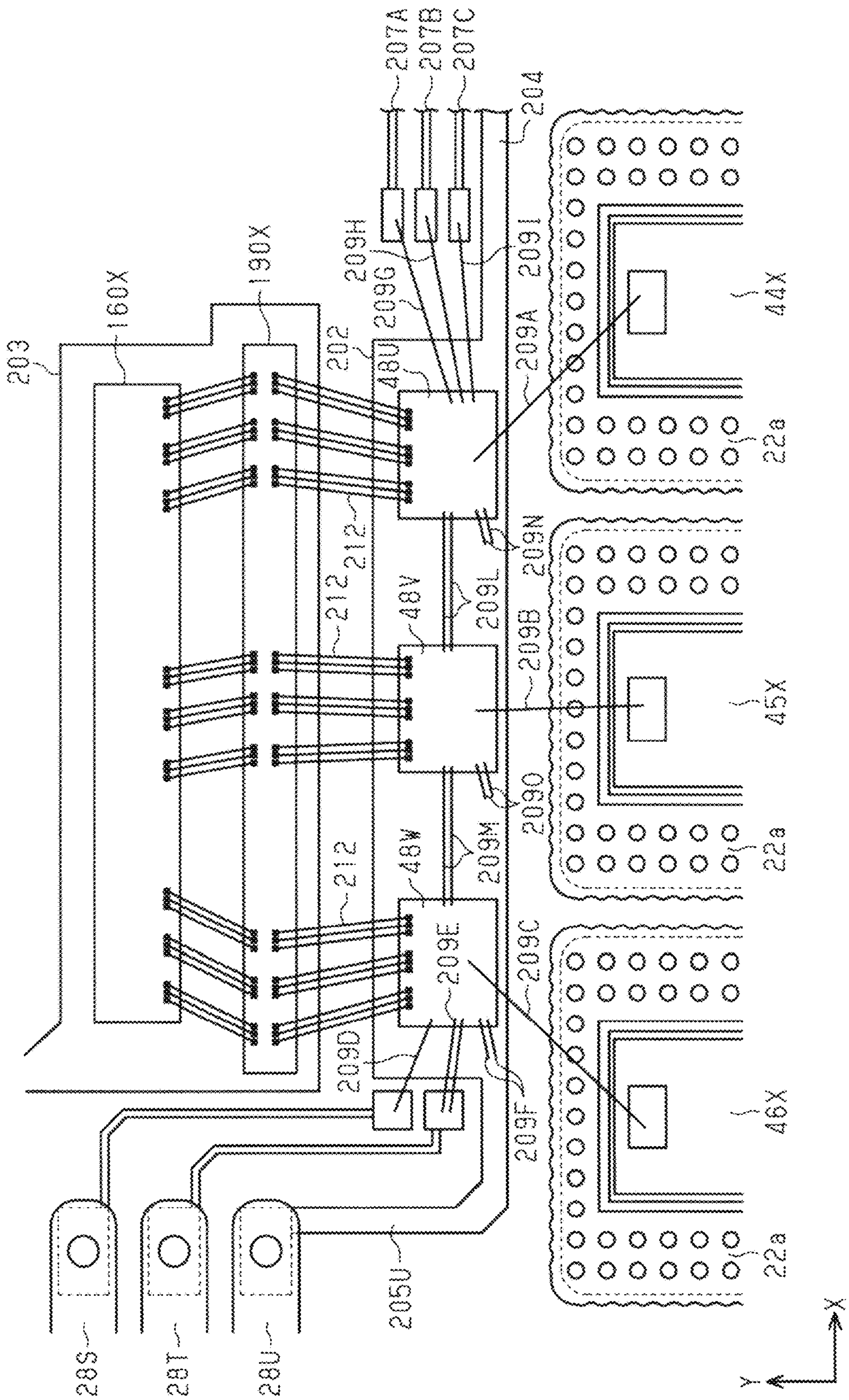
FIG. 108 is an enlarged view of the control circuit chip, a signal transmission chip, and a periphery thereof, in the internal configuration of the variation of the semiconductor package.

In the first to fourth, and the seventh to ninth embodiments, the number of control chips 47 and the number of control chips 48 may each be modified as desired. In an example, the semiconductor package 1 may include three control chips 48U, 48V, 48W, as shown in FIG. 108. The three control chips 48 are aligned in the first direction X, with a clearance between each other. The respective positions of the three control chips 48 in the second direction Y are equal to each other. Accordingly, the island portion 202 is longer in the first direction X, than the island portions 52, 202, and 302 according to the eighth to tenth, and the eleventh to thirteenth embodiments. In FIG. 108, the end portion of the island portion 202 on the side of the first edge 33 overlaps with the semiconductor chip 46X, as viewed in the second direction Y. The end portion of the island portion 202 on the side of the second edge 34 overlaps with the semiconductor chip 44X, as viewed in the second direction Y.

The control chip 48U is located at the end portion of the island portion 202 on the side of the second edge 34, in the first direction X. The control chip 48V is located at the center of the island portion 202 in the first direction X. The control chip 48W is located at the end portion of the island portion 202 on the side of the first edge 33, in the first direction X. More specifically, the control chip 48U is located between the semiconductor chip 44X and the semiconductor chip 45X, in the first direction X. The control chip 48U is located on the side of the semiconductor chip 44X in the first direction X, with respect to the center of the region between the semiconductor chip 44X and the semiconductor chip 45X in the first direction X. The control chip 48V is located so as to overlap with the semiconductor chip 45X, as viewed in the second direction Y. The control chip 48W is located between the semiconductor chip 45X and the semiconductor chip 46X, in the first direction X. The control chip 48W is located on the side of the semiconductor chip 46X in the first direction X, with respect to the center of the region between the semiconductor chip 45X and the semiconductor chip 46X in the first direction X. The control chips 48U, 48V, and 48W are electrically connected to each other. In an example, the control chip 48V is connected to the control chip 48U via the wire 209L. The control chip 48U is connected to the intermediary wirings 207A to 207C, via the wires 209G, 209H, and 209I. The control chip 48U is connected to the island portion 202 via the wire 209N. The control chip 48V is connected to the island portion 202 via the wire 209O.

The control chips 48U, 48V, and 48W are each electrically connected to the transformer chip 190X, via the wire 212. As shown in FIG. 108, the transformer chip 190X is longer in the first direction X, than the transformer chips 190X and 190Z according to the eighth to tenth, and the eleventh to thirteenth embodiments. The transformer chip 190X shown in FIG. 108 is located such that the end portion thereof on the side of the first edge 33 is located on the side of the first edge 33 of the substrate 30 in the first direction X, with respect to the semiconductor chip 46X. The transformer chip 190X is located such that the end portion thereof on the side of the second edge 34 is located on the side of the second edge 34 of the substrate 30 in the first direction X, with respect to the semiconductor chip 44X. Here, the end portion of the transformer chip 190X on the side of the first edge 33 may be located on the side of the second edge 34 of the substrate 30 in the first direction X, with respect to the semiconductor chip 46X. In addition, the end portion of the transformer chip 190X on the side of the second edge 34 may be located on the side of the first edge 33 of the substrate 30 in the first direction X, with respect to the semiconductor chip 44X.

The mentioned configuration allows the control chip 48U to be located closer to the semiconductor chip 44X, to thereby shorten the wire 209A connecting the control chip 48U and the semiconductor chip 44X. Further, the control chip 48W can be located closer to the semiconductor chip 46X, and therefore the wire 209C connecting the control chip 48W and the semiconductor chip 46X can be shortened.

Figure 109:
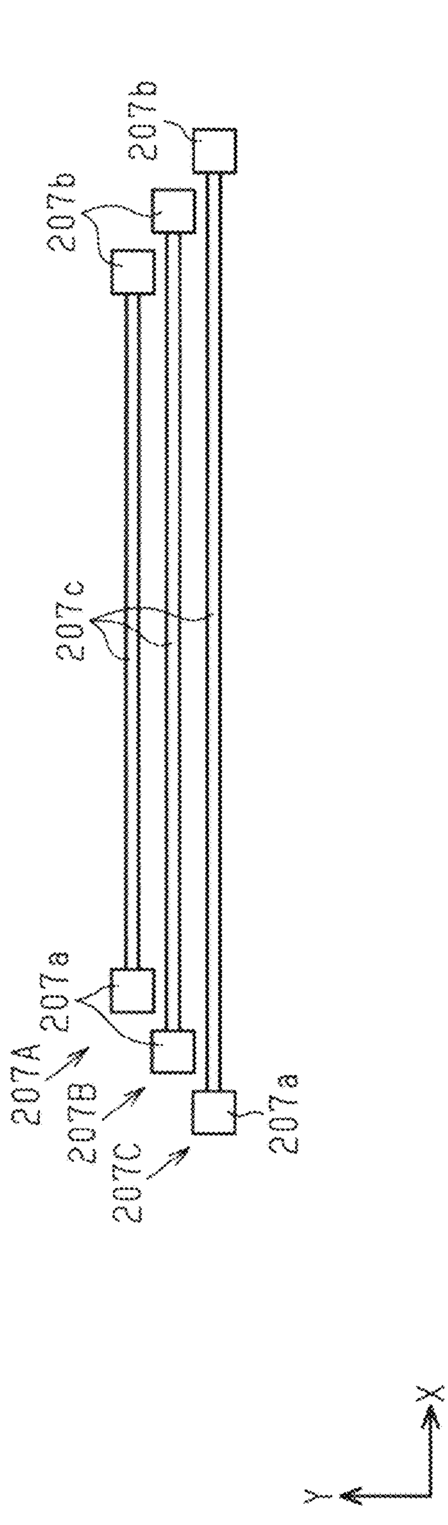
FIG. 109 is a plan view showing an example of an intermediary wiring in the variation of the semiconductor package.
Figure 110:
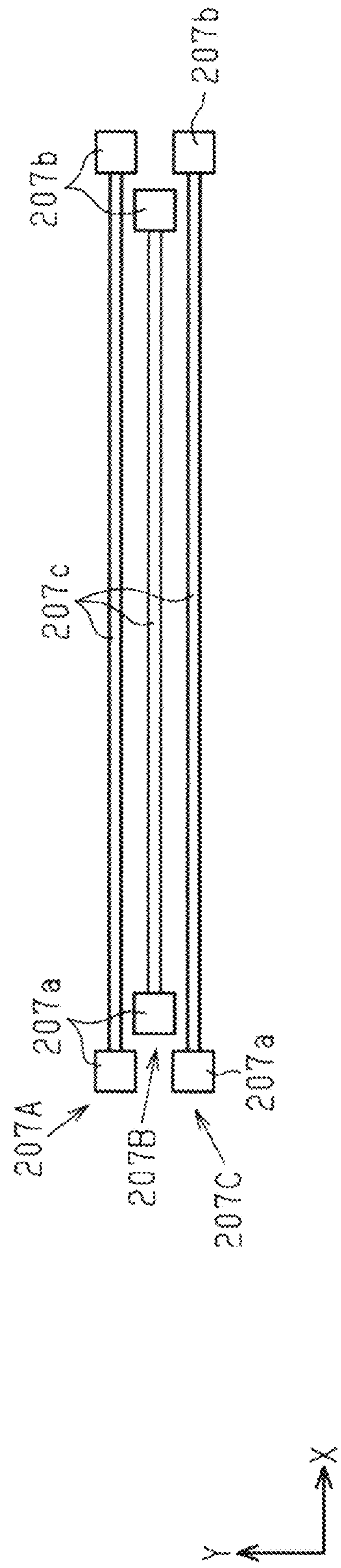
FIG. 110 is a plan view showing another example of the intermediary wiring in the variation of the semiconductor package.
Figure 111:
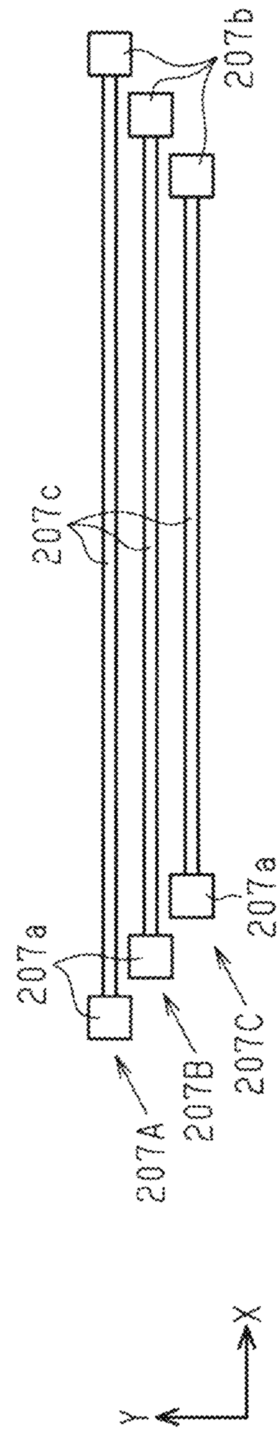
FIG. 111 is a plan view showing still another example of the intermediary wiring in the variation of the semiconductor package.

In the eighth and eleventh embodiments, the shape of the intermediary wirings 207A to 207C may be modified as desired. In an example, as shown in FIG. 109 to FIG. 111, the length of at least one of the intermediary wirings 207A to 207C in the first direction X may be different. More specifically, as shown in FIG. 109, the intermediary wiring 207A may be shorter in the first direction X, than the intermediary wirings 207B and 207C. The intermediary wiring 207B may be shorter in the first direction X, than the intermediary wiring 207C. The end portions of the intermediary wiring 207B in the first direction X may be located so as to overlap with the end portions of the intermediary wirings 207A and 207C in the first direction X, as viewed in the first direction X. In this case, the distance between the intermediary wiring 207A and the intermediary wiring 207C in the second direction Y can be shortened. As shown in FIG. 110, the intermediary wiring 207B may be shorter in the first direction X, than the intermediary wirings 207A and 207C. The intermediary wiring 207A and the intermediary wiring 207C may have the same length in the first direction X. The end portions of the intermediary wiring 207B in the first direction X may be located so as to overlap with the end portions of the intermediary wirings 207A and 207C in the first direction X, as viewed in the first direction X. In this case, the distance between the intermediary wiring 207A and the intermediary wiring 207C in the second direction Y can be shortened. As shown in FIG. 111, the intermediary wiring 207A is longer in the first direction X, than the intermediary wirings 207B and 207C. The intermediary wiring 207B may be longer in the first direction X, than the intermediary wiring 207C. The end portions of the intermediary wiring 207B in the first direction X may be located so as to overlap with the end portions of the intermediary wirings 207A and 207C in the first direction X, as viewed in the first direction X. In this case, the distance between the intermediary wiring 207A and the intermediary wiring 207C in the second direction Y can be shortened.

In the foregoing embodiments, the lead frames located in the first region 303 are connected to the end portions of the substrate 30 on the sides of the first edge 33, the second edge 34, and the fourth edge 36. However, the arrangement of the lead frames located in the first region 308 is not limited to the above. For example, a part of the wirings formed in the first region 30B may be substituted with the lead frame. In an example, at least one of the island portions 201, 202, 301, and 302, and the connection wirings 204 and 305 may be constituted of the lead frame. In addition, the island portion 203 or 303 may be constituted of the lead frame.

Figure 112:
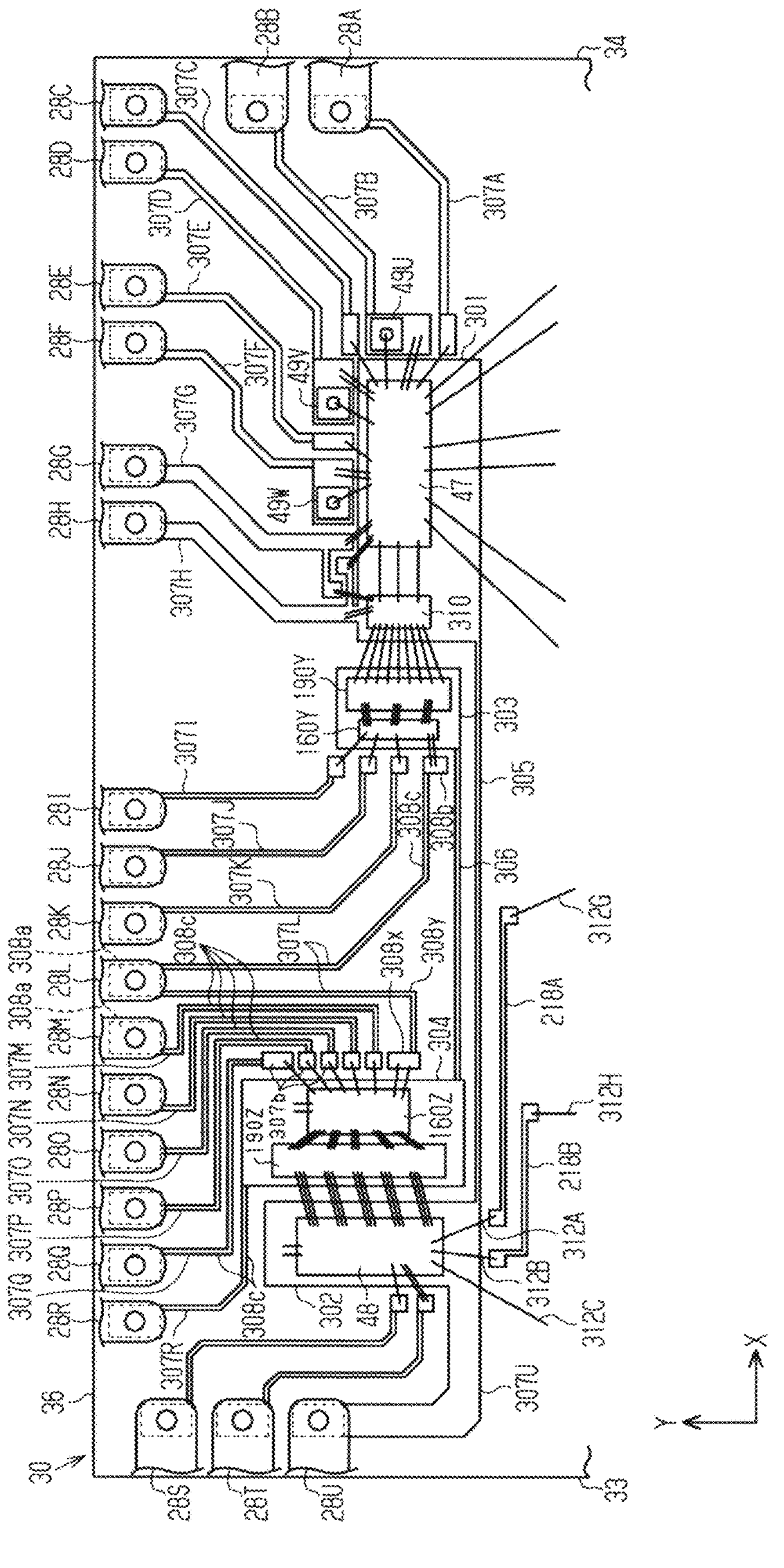
FIG. 112 is a plan view showing a part of the internal configuration of the variation of the semiconductor package.

In the tenth embodiment, the positional arrangement of the control chip 48, the primary-side circuit chip 160Z, and the transformer chip 190Z may be modified as desired. In an example, as shown in FIG. 112, the control chip 48, the primary-side circuit chip 160Z, and the transformer chip 190Z may be aligned in the first direction X. In this case, the control chip 48 is located such that the long sides thereof extend along the second direction Y. The primary-side circuit chip 160Z is located such that the long sides thereof extend along the second direction Y. The transformer chip 190Z is located such that the long sides thereof extend along the second direction Y. The primary-side circuit chip 160Z is located on the side of the second edge 34 of the substrate 30 in the first direction X, with respect to the control chip 48 and the transformer chip 190Z. The control chip 48 is located on the side of the first edge 33 of the substrate 30, with respect to the transformer chip 190Z. In addition, the island portion 302 and the island portion 303 are aligned in the first direction X. The island portion 302 and the island portion 303 each have, for example, a rectangular shape in a plan view. In an example, the island portion 302 and the island portion 303 each have the long sides extending along the second direction Y. The island portion 304 overlaps with the lead frames 28N and 28O, as viewed in the second direction Y. The primary-side circuit chip 160Z is located so as to overlap with the lead frame 28N, as viewed in the second direction Y. The transformer chip 190Z is located so as to overlap with the lead frame 28O. The island portion 302 and the control chip 48 are located so as to overlap with the lead frames 28P and 28Q, as viewed in the second direction Y.

The respective second land portions 308*b* of the wirings 307L to 307Q are located on the side of the second edge 34 of the substrate 30, with respect to the island portion 302. The second land portions 308*b* of the wirings 307L to 307Q are located adjacent to the island portion 302, in the second direction Y. The second land portions 308*b* of the wirings 307L to 307Q overlap with the island portion 302, as viewed in the first direction X. The second land portions 308*b* of the wirings 307L to 307P overlap with the primary-side circuit chip 160Z, as viewed in the first direction X. The second land portion 308*b* of the wiring 307Q is located on the side of the fourth edge 36 of the substrate 30, with respect to the primary-side circuit chip 160Z. The second land portion 308*x* of the wiring 307L, the second land portion 308*b* of the wiring 307M, the second land portion 308*b* of the wiring 307N, the second land portion 308*b* of the wiring 307O, the second land portion 308*b* of the wiring 307P, and the second land portion 308*b* of the wiring 307Q, are aligned in this order in a row, from the side of the third edge 35 of the substrate 30, toward the fourth edge 36.

The connection wiring 308*y* of the wiring 307L includes a first portion and a second portion, each of which will be described hereunder. The first portion extends along the second direction Y, from the first land portion 308*a* toward the third edge 35. The second portion extends along the first direction X, from the second land portion 308*x* toward the second edge 34. The second portion is connected to the first portion.

The respective connection wirings 308*c* of the wirings 307M to 307O include a first portion, a second portion, a third portion, and a fourth portion, each of which will be described hereunder. The first portion extends along the second direction Y, from the first land portion 308*a* toward the third edge 35. The second portion extends from the first portion along the first direction X, toward the second edge 34. The third portion extends from the second portion along the second direction Y, toward the third edge 35. The fourth portion extends from the third portion toward the first edge 33. The fourth portion is connected to the second land portion 308*b*.

The wiring 307P includes a first portion, a second portion, and a third portion, each of which will be described hereunder. The first portion extends along the second direction Y, from the first land portion 308*a* toward the third edge 35. The second portion extends from the first portion along the first direction X, toward the second edge 34. The third portion extends from the second portion along the second direction Y, toward the third edge 35. The third portion is connected to the second land portion 308*b*.

The control chip 48 is electrically connected to the second electrode GP of the semiconductor chip 44X, via an intermediary wiring 218A. The control chip 48 is also electrically connected to the second electrode GP of the semiconductor chip 45X, via an intermediary wiring 218B. The intermediary wiring 218A extends along the first direction X. The intermediary wiring 218A extends toward the second edge 34, beyond the island portion 304. The end portion of the intermediary wiring 218A on the side of the second edge 34 is located so as to overlap with the semiconductor chip 44X (see FIG. 89), as viewed in the second direction Y. The intermediary wiring 218B includes a first portion and a second portion, each of which will be described hereunder. The first portion extends along the first direction X. The first portion is located on the side of the third edge 35 of the substrate 30, with respect to the intermediary wiring 218A. The end portion of the first portion on the side of the second edge 34 overlaps with the semiconductor chip 45X (see FIG. 89), as viewed in the second direction Y. The second portion extends along the second direction Y, from the end portion of the first portion on the side of the first edge 33, toward the control chip 48. The control chip 48 and a first end portion of the intermediary wiring 218A are connected via the wire 312A. A second end portion of the intermediary wiring 218A and the semiconductor chip 44X are connected via the wire 312G. The control chip 48 and a first end portion of the intermediary wiring 218B are connected via the wire 312B. A second end portion of the intermediary wiring 218B and the semiconductor chip 46X are connected via the wire 312H.

In the variation shown in FIG. 112, the position of the control chip 48 in the second direction Y may be modified as desired. In an example, the control chip 48 may be located such that an end portion thereof in the second direction Y is located at the end portion of the island portion 302 on the side of the second region 30A.

In the variation shown in FIG. 112, the position of the control chip 47 on the island portion 301 may be modified as desired. In an example, the control chip 47 may be located at a position on the island portion 301, on the side of the lead frame 20A in the second direction Y. More specifically, the control chip 47 may be located on the side of the lead frame 20A, with respect to the intermediary chip 310. In this case, the control chip 47 is located closer to the semiconductor chips 41X to 43X, and therefore the wires 311A to 311C, connecting the control chip 47 and the semiconductor chips 41X to 43, can each be shortened, compared with the configuration according to the tenth embodiment.

In the foregoing embodiments, at least one of the island portions 21*a* and 22*a* of the lead frames 20A to 20D may be without the recess 21*g* (recess 22*h*).

In the foregoing embodiments, the positional arrangement of the semiconductor chips 41X to 43X may be modified as desired. In an example, the semiconductor chip 41X may be located on the side of the first edge 33 of the substrate 30, with respect to the semiconductor chips 42X and 43X. In addition, the semiconductor chip 43X may be located on the side of the first edge 33 of the substrate 30, with respect to the semiconductor chip 42X.

In the foregoing embodiments, the positional arrangement of the semiconductor chips 44X to 46X may be modified as desired. In an example, the semiconductor chip 44X may be located on the side of the first edge 33 of the substrate 30, with respect to the semiconductor chips 45X and 46X. In addition, the semiconductor chip 45X may be located on the side of the first edge 33 of the substrate 30, with respect to the semiconductor chip 46X.

Although the semiconductor chips 41X to 43X are located on the side of the second edge 34 of the substrate 30, with respect to the semiconductor chips 44X to 46X, in the foregoing embodiments, the semiconductor chips 41X to 43X may be located on the side of the first edge 33 of the substrate 30, with respect to the semiconductor chips 44X to 46X. In this case, the lead frame 20A is located on the side of the first edge 33 of the substrate 30, with respect to the lead frames 20B to 20G. In addition, the lead frames 20E to 20G may be located on the side of the second edge 34 of the substrate 30, with respect to the lead frames 20B to 20D.

In the foregoing embodiments, the substrate 30 may be formed of a metal, instead of a ceramic. In this case, the insulation layer is formed on the surface of the metal substrate, and the wiring pattern 50 (200, 300, 330, 350, and 370) is formed on the insulation layer.

[Clauses]

The technical concepts perceived on the basis of the foregoing embodiments and variations thereof will be itemized as follows.

[Clause A1]

A semiconductor device including:

a substrate;

a conductive section formed on the substrate and including a conductive material;

a first lead located on the substrate and more heat-dissipative than the substrate;

a semiconductor chip located on the first lead;

a control chip that controls an operation of the semiconductor chip, the control chip being electrically connected to the conductive section and the semiconductor chip and being located on the substrate so as to be spaced apart from the semiconductor chip and the first lead in a plan view; and a resin covering the semiconductor chip, the control chip, at least a part of the substrate, and a part of the lead.

[Clause A2]

The semiconductor device according to clause A1, in which the substrate includes a first face, and the conductive section is formed on the first face.

[Clause A3]

The semiconductor device according to clause A2, in which the substrate includes a second face opposite to the first face of the substrate, and the second face is exposed from the resin.

[Clause A4]

The semiconductor device according to clause A2 or A3, in which the first lead is located on the first face.

[Clause A5]

The semiconductor device according to clause A4, in which the first lead is bonded to the substrate via a first bonding material.

[Clause A6]

The semiconductor device according to clause A5, further including a bonding section formed on the first face of the substrate, in which the first lead is connected to the bonding section via the first bonding material.

[Clause A7]

The semiconductor device according to clause A6, in which the bonding section includes a conductive material that forms the conductive section.

[Clause A8]

The semiconductor device according to any one of clauses A4 to A7, in which the first lead has a part covered with the resin and another part exposed from the resin.

[Clause A9]

The semiconductor device according to any one of clauses A2 to A8, further including a second lead spaced apart from the first lead and located on and electrically connected to the conductive section.

[Clause A10]

The semiconductor device according to clause A9, in which the second lead has a part covered with the resin and another part exposed from the resin.

[Clause A11]

The semiconductor device according to clause A9 or 10, in which the second lead and the conductive section are bonded to each other via a first conductive bonding material.

[Clause A12]

The semiconductor device according to any one of clauses A9 to A11, in which the control chip is located between the semiconductor chip and the second lead as viewed in a first direction orthogonal to a normal direction of the first face of the substrate.

[Clause A13]

The semiconductor device according to any one of clauses A9 to A12, in which the semiconductor chip is bonded to the first lead via a second conductive bonding material.

[Clause A14]

The semiconductor device according to clause A13, in which the semiconductor chip is connected to the first lead via a first conductive material.

[Clause A15]

The semiconductor device according to any one of clauses A9 to A14, in which the control chip is bonded to the conductive section via a third conductive bonding material.

[Clause A16]

The semiconductor device according to any one of clauses A9 to A15, in which the control chip is connected to the conductive section via a second conductive material.

[Clause A17]

The semiconductor device according to any one of clauses A9 to A16, in which a first voltage level of an electrical signal applied to the second lead is lower than a second voltage level for driving the control chip.

[Clause A18]

The semiconductor device according to any one of clauses A9 to A17, further including a first transmission circuit having a transformer structure including at least two coils opposed to each other with a spacing therebetween, the first transmission circuit being configured to transmit an electrical signal, in which the first transmission circuit transmits the electrical signal between the control chip and the second lead.

[Clause A19]

The semiconductor device according to clause A18, in which the first transmission circuit is covered with the resin.

[Clause A20]

The semiconductor device according to any one of clauses A1 to A19, in which the conductive section contains silver.

[Clause A21]

The semiconductor device according to any one of clauses A1 to A19, in which the conductive section contains copper.

[Clause A22]

The semiconductor device according to any one of clauses A1 to A19, in which the conductive section contains gold.

[Clause A23]

The semiconductor device according to any one of clauses A1 to A22, in which the substrate contains a ceramic.

[Clause A24]

The semiconductor device according to any one of clauses A1 to A23, in which the semiconductor chip includes a SiC substrate.

[Clause A25]

The semiconductor device according to any one of clauses A1 to A23, in which the semiconductor chip includes a Si substrate.

[Clause A26]

The semiconductor device according to clause A18, in which the control chip is located between the semiconductor chip and the second lead as viewed in the first direction orthogonal to the normal direction of the first face of the substrate.

[Clause A27]

The semiconductor device according to clause A26, further including a primary-side circuit chip that transmits a command signal to the control chip through the first transmission circuit, in which as viewed in the first direction, a second lead, among a plurality of second leads, that is electrically connected to the primary-side circuit chip has a portion sticking out from the resin, and another second lead electrically connected to the control chip has a portion sticking out from the resin, and the former portion is greater in length than the latter portion.

[Clause A28]

The semiconductor device according to clause A27, in which the semiconductor chip and the control chip overlap with each other, as viewed in a second direction orthogonal to the normal direction of the first face and the first direction.

[Clause A29]

The semiconductor device according to clause A27, in which the semiconductor chip, the control chip, and the first transmission circuit overlap with each other, as viewed in a second direction orthogonal to the normal direction of the first face and the first direction.

[Clause A30]

The semiconductor device according to clause A27, including two control chips, in which the two control chips overlap with each other, as viewed in the first direction.

[Clause A31]

The semiconductor device according to clause A27, further including a plurality of wires connected to the control chip, in which, in a second direction orthogonal to the normal direction of the first face and the first direction, the number of the wires extending from the control chip toward the first transmission circuit is larger than the number of the wires extending from the control chip toward the semiconductor chip.

[Clause A32]

The semiconductor device according to clause A27, in which an edge of a lead oriented in the first direction includes a portion rougher than a portion of an edge of a lead oriented in a second direction orthogonal to the normal direction of the first face and the first direction.

[Clause A33]

The semiconductor device according to clause A27, in which the conductive section includes a base portion on which the control chip is located, and in a second direction orthogonal to the normal direction of the first face and the first direction, a portion of the base portion extending from the control chip toward the first transmission circuit is longer than a portion of the base portion extending from the control chip toward the semiconductor chip.

[Clause A34]

The semiconductor device according to clause A27, in which the conductive section includes a plurality of second portions respectively bonded to the plurality of second leads, and a clearance between the plurality of second leads in the first direction is narrower than a clearance between the plurality of second portions of the conductive section.

[Clause A35]

The semiconductor device according to clause A27, in which a clearance in the first direction between two adjacent ones of the plurality of second leads, one electrically connected to the control chip and the other electrically connected to the primary-side circuit chip, is wider than a clearance between second leads electrically connected to the control chip and a clearance between second leads electrically connected to the primary-side circuit chip.

[Clause A36]

The semiconductor device according to any one of clauses A1 to A23, in which the semiconductor chip includes a GaN substrate.

[Clause B1]

A semiconductor package including: a substrate having a wiring pattern formed on a surface thereof; a first lead frame located on the substrate; a first semiconductor chip located on the first lead frame; a first control chip located on the substrate, electrically connected to the wiring pattern and the first semiconductor chip, and configured to control an operation of the first semiconductor chip; and a first resin covering the first semiconductor chip, the first control chip, and a part of the first lead frame.

[Clause B2]

The semiconductor package according to clause B1, further including a second lead frame spaced apart from the first lead frame and located on and electrically connected to the wiring pattern.

[Clause B3]

The semiconductor package according to clause B2, in which the second lead frame has a portion covered with the first resin and another portion exposed from the first resin.

[Clause B4]

The semiconductor package according to clause B2 or B3, in which the second lead frame and the wiring pattern are connected via a first conductive material.

[Clause B5]

The semiconductor package according to any one of clauses B2 to B4, in which the first control chip is located between the second lead frame and the first semiconductor chip as viewed in a first direction perpendicular to a planar direction of the surface of the substrate.

[Clause B6]

The semiconductor package according to any one of clauses B2 to B5, further including a first transmission circuit having a transformer structure including at least two coils opposed to each other with a spacing therebetween, the first transmission circuit being configured to transmit an electrical signal, in which the first transmission circuit transmits the electrical signal between the control chip and the second lead frame.

[Clause B7]

The semiconductor package according to clause B6, in which the first transmission circuit is located between the second lead frame and the first control chip as viewed in the first direction perpendicular to the planar direction of the surface of the substrate.

[Clause B8]

The semiconductor package according to clause B6 or B7, in which a first voltage of an electrical signal applied to the second lead frame is lower than a second voltage for driving the first control chip.

[Clause B9]

The semiconductor package according to any one of clauses B6 to B8, in which the first transmission circuit is located on the substrate and electrically connected to the wiring pattern.

[Clause B10]

The semiconductor package according to clause B9, in which the first transmission circuit is located on a part of the wiring pattern.

[Clause B11]

The semiconductor package according to any one of clauses B1 to B10, in which the first lead frame is connected to the substrate via a second conductive material.

[Clause B12]

The semiconductor package according to any one of clauses B1 to B11, in which the first control chip is located on a part of the wiring pattern.

[Clause B13]

The semiconductor package according to any one of clauses B1 to B12, in which the first control chip is connected to the wiring pattern via a third conductive material.

[Clause B14]

The semiconductor package according to any one of clauses B1 to B13, in which the first lead frame and the first semiconductor chip are connected via a fourth conductive material.

[Clause B15]

The semiconductor package according to any one of clauses B1 to B14, in which the wiring pattern contains silver.

[Clause B16]

The semiconductor package according to any one of clauses B1 to B14, in which the wiring pattern contains copper.

[Clause B17]

The semiconductor package according to any one of clauses B1 to B14, in which the wiring pattern contains gold.

[Clause B18]

The semiconductor package according to any one of clauses B1 to B14, in which the substrate contains a ceramic.

[Clause B19]

The semiconductor package according to any one of clauses B1 to B18, in which the first semiconductor chip includes a SiC substrate.

[Clause B20]

The semiconductor package according to any one of clauses B1 to B18, in which the first semiconductor chip includes a Si substrate.

[Clause B21]

The semiconductor package according to clause B20, in which the first semiconductor chip includes an IGBT element.

[Clause B22]

A semiconductor package including: a substrate having a wiring pattern formed on a surface thereof; a first lead frame located on the substrate; a semiconductor chip located on the first lead frame; a second lead frame connected to the wiring pattern; a control chip electrically connected to the second lead frame via the wiring pattern and configured to control an operation of the semiconductor chip; and an encapsulating resin that encapsulates the wiring pattern, the semiconductor chip, and the control chip.

[Clause B23]

The semiconductor package according to clause B22, in which the first lead frame is connected to a plate-shaped bonding section formed on the substrate.

[Clause B24]

The semiconductor package according to clause B23, in which the wiring pattern and the bonding section are formed of a same material.

[Clause B25]

The semiconductor package according to any one of clauses B22 to B24, in which the substrate is a ceramic substrate.

[Clause B26]

The semiconductor package according to any one of clauses B22 to B25, in which the substrate is divided into a first region and a second region, the first region being formed with the wiring pattern and connected to the second lead frame, the second region being connected to the first lead frame.

[Clause B27]

The semiconductor package according to any one of clauses B22 to B26, in which the wiring pattern and the control chip are electrically connected to each other via a first connection material.

[Clause B28]

The semiconductor package according to clause B27, in which the first connection material is connected to a face of the control chip that is opposite to another face via which the control chip is connected to the wiring pattern.

[Clause B29]

The semiconductor package according to any one of clauses B22 to B28, further including a third lead frame unconnected to the wiring pattern and the substrate, in which the third lead frame is electrically connected to the semiconductor chip via a second connection material.

[Clause B30]

The semiconductor package according to any one of clauses B22 to B29, in which, in one planar direction of the substrate, the first lead frame is provided so as to stick out from one side of the substrate, and the second lead frame is provided so as to stick out from the other side of the substrate.

[Clause B31]

The semiconductor package according to any one of clauses B22 to B30, further including a signal transmission unit, a transformer, and a signal reception unit, in which the signal transmission unit and the transformer are connected to each other via a third connection material, and the transformer and the signal reception unit are connected to each other via a fourth connection material.

[Clause B32]

The semiconductor package according to clause B31, in which the third connection material is shorter than the fourth connection material.

[Clause B33]

The semiconductor package according to clause B29 or B30, further including a signal transmission unit, a transformer, and a signal reception unit, in which the second lead frame includes a plurality of primary-side lead frames to which the signal transmission unit is electrically connected, and a plurality of secondary-side lead frames to which the signal reception unit is electrically connected, and the plurality of primary-side lead frames and the plurality of secondary-side lead frames are located adjacent to each other, with a clearance therebetween, in a direction orthogonal to the one planar direction of the substrate in which the first lead frame sticks out from the substrate.

[Clause B34]

The semiconductor package according to clause B33, in which a distance between the plurality of primary-side lead frames and the plurality of secondary-side lead frames is longer than an array pitch of the plurality of secondary-side lead frames.

[Clause B35]

The semiconductor package according to clause B33 or B34, in which the array pitch of the plurality of secondary-side lead frames is larger than an array pitch of the plurality of primary-side lead frames.

[Clause B36]

The semiconductor package according to any one of clauses B33 to B35, in which a distal end of the primary-side lead frame and a distal end of the secondary-side lead frame in the second direction are located at different positions.

[Clause B37]

The semiconductor package according to clause B36, in which the distal end of the primary-side lead frame is more distant from the substrate in the second direction than the distal end of the secondary-side lead frame.

[Clause B38]

The semiconductor package according to any one of clauses B22 to B37, in which the semiconductor chip includes a first transistor and a second transistor, and the control chip includes a first control circuit chip that controls an operation of the first transistor, and a second control circuit chip that controls an operation of the second transistor.

[Clause B39]

The semiconductor package according to clause B38, in which the wiring pattern includes a ground pattern on which the first control circuit chip and the second control circuit chip are mounted.

[Clause B40]

The semiconductor package according to clause B38 or B39, in which the wiring pattern includes a first ground pattern connected to the first control circuit chip, and a first power source pattern that supplies a source voltage to the first control circuit chip.

[Clause B41]

The semiconductor package according to any one of clauses B38 to B40, in which the wiring pattern includes a second ground pattern connected to the second control circuit chip, and a second power source pattern that supplies a source voltage to the second control circuit chip.

[Clause B42]

The semiconductor package according to any one of clauses B38 to B41, in which the wiring pattern includes a signal pattern electrically connected to the first control circuit chip or the second control circuit chip.

[Clause B43]

The semiconductor package according to clause B42, in which the wiring pattern includes a first signal pattern that transmits a control signal for the first transistor to the second control circuit chip.

[Clause B44]

The semiconductor package according to clause B42 or B43, in which the wiring pattern includes a second signal pattern that transmits a control signal for the second transistor to the second control circuit chip.

[Clause B45]

The semiconductor package according to clause B44, in which the wiring pattern includes at least one first intermediary wiring configured to relay the control signal for controlling the operation of the first transistor from the second control circuit chip to the first control circuit chip.

[Clause B46]

The semiconductor package according to clause B45, in which the first control circuit chip and the second control circuit chip are disposed with a clearance therebetween, a plurality of the first intermediary wirings are formed between the first control circuit chip and the second control circuit chip, and the plurality of first intermediary wirings each extend along an array direction of the first control circuit chip and the second control circuit chip and are disposed with a clearance between each other in the direction orthogonal to the array direction, as viewed in a plan view of the substrate.

[Clause B47]

The semiconductor package according to clause B46, in which the plurality of first intermediary wirings each include land portions formed at respective end portions in the extending direction, and the first intermediary wirings adjacent to each other are located so as to overlap with at least one of the land portions of the plurality of first intermediary wirings, as viewed in the array direction.

[Clause B48]

The semiconductor package according to clause B46 or B47, in which the wiring pattern includes a second intermediary wiring that supplies a source voltage from one of the first control circuit chip and the second control circuit chip to the other, and the second intermediary wiring is formed adjacent to the first intermediary wiring in the direction orthogonal to the array direction, as viewed in a plan view of the substrate.

[Clause B49]

The semiconductor package according to clause B39, in which the second lead frame includes a plurality of lead frames electrically connected to the first control circuit chip and the second control circuit chip, at least a number of the plurality of lead frames are arranged along one of edges constituting the periphery of the substrate, and a lead frame of the plurality of lead frames that is connected to the ground pattern is located at an extremity of the plurality of lead frames in the direction along the edge of the substrate.

[Clause B50]

The semiconductor package according to any one of clauses B38 to B49, further including a signal transmission unit and a transformer, in which the signal transmission unit outputs a control signal for controlling the operation of the first and second transistors to the second control circuit chip through the transformer.

[Clause B51]

The semiconductor package according to clause B50, in which the signal transmission unit, the transformer, and the second control circuit chip are arranged in the direction orthogonal to the array direction of the second control circuit chip and the first control circuit chip, as viewed in a plan view of the substrate.

[Clause B52]

The semiconductor package according to clause B50, in which the signal transmission unit, the transformer, and the second control circuit chip are arranged along the array direction of the second control circuit chip and the first control circuit chip.

[Clause B53]

The semiconductor package according to any one of clauses B50 to B52, in which the wiring pattern includes a ground pattern on which the signal transmission unit and the transformer are mounted.

[Clause B54]

The semiconductor package according to clause B53, in which the second control circuit chip is mounted on another ground pattern electrically insulated from the signal transmission unit and the transformer.

[Clause B55]

The semiconductor package according to any one of clauses B50 to B54, in which the wiring pattern includes a first signal pattern that transmits a control signal for the first transistor to the first control circuit chip, and a second signal pattern that transmits a control signal for the second transistor to the second control circuit chip, and the first signal pattern and the second signal pattern are each electrically connected to the signal transmission unit.

[Clause B56]

The semiconductor package according to any one of clauses B50 to B55, in which the transformer includes a first transformer that transmits a control signal for controlling an operation of the first transistor to the first control circuit chip, and a second transformer that transmits a control signal for controlling an operation of the second transistor to the second control circuit chip, and the first transformer and the second transformer are provided in separate chips.

[Clause B57]

The semiconductor package according to clause B56, in which the signal transmission unit includes a first signal transmission unit that transmits the control signal for the first transistor to the first control circuit chip, and a second signal transmission unit that transmits the control signal for the second transistor to the second control circuit chip, and the first signal transmission unit and the second signal transmission unit are provided in separate chips, the first signal transmission unit is located adjacent to the first transformer, and the second signal transmission unit is located adjacent to the second transformer.

[Clause B58]

The semiconductor package according to clause B57, in which the wiring pattern includes a first signal pattern that transmits the control signal for the first transistor to the first control circuit chip, and a second signal pattern that transmits the control signal for the second transistor to the second control circuit chip, and the first signal pattern is electrically connected to the first signal transmission unit, and the second signal pattern is electrically connected to the second signal transmission unit.

[Clause B59]

The semiconductor package according to clause B57 or B58, in which the wiring pattern includes a first island portion, a second island portion, a third island portion, and a fourth island portion, the first control circuit chip is mounted on the first island portion, the second control circuit chip is mounted on the second island portion, the first signal transmission unit and the first transformer are mounted on the third island portion, the second signal transmission unit and the second transformer are mounted on the fourth island portion, the first island portion is formed adjacent to the third island portion, and the second island portion is formed adjacent to the fourth island portion.

[Clause B60]

The semiconductor package according to clause B59, in which the wiring pattern further includes a connection wiring connecting the first island portion and the second island portion to each other.

[Clause B61]

The semiconductor package according to any one of clauses B50 to B55, in which the signal transmission unit includes a first signal transmission unit that transmits the control signal for controlling an operation of the first transistor to the first control circuit chip, and a second signal transmission unit that transmits the control signal for controlling an operation of the second transistor to the second control circuit chip, the transformer includes a first transformer that transmits a signal of the first signal transmission unit to the first control circuit chip, and a second transformer that transmits a signal of the second signal transmission unit to the second control circuit chip, the semiconductor package further including a first signal reception unit that receives the signal from the first transformer, the first signal transmission unit, the first transformer, and the first signal reception unit are integrated into a first signal transmission circuit in a single chip, and the second signal transmission unit, the second transformer, and the second control circuit chip are integrated into a second signal transmission circuit in a single chip.

[Clause B62]

The semiconductor package according to clause B61, in which the wiring pattern includes a first signal pattern that transmits the control signal for the first transistor to the first control circuit chip, and a second signal pattern that transmits the control signal for the second transistor to the second control circuit chip, the first signal pattern is electrically connected to the first signal transmission circuit, and the second signal pattern is electrically connected to the second signal transmission circuit.

[Clause B63]

The semiconductor package according to clause B61 or B62, in which the wiring pattern includes a ground pattern that electrically connects the first signal transmission circuit and the second signal transmission circuit.

[Clause B64]

The semiconductor package according to any one of clauses B61 to B63, in which the wiring pattern includes a power source pattern that electrically connects the first signal transmission circuit and the second signal transmission circuit, and supplies a source voltage to the first signal transmission circuit and the second signal transmission circuit.

[Clause B65]

The semiconductor package according to any one of clauses B57 to B60, including a plurality of the first transistors, in which a plurality of the first signal transmission units, a plurality of the first transformers, and a plurality of the first control circuit chips are provided, in accordance with the number of the first transistors.

[Clause B66]

The semiconductor package according to any one of clauses B38 to B65, further including a diode electrically connected to the first control circuit chip.

[Clause B67]

The semiconductor package according to clause B66, further including a capacitor connected to the diode.

[Clause B68]

The semiconductor package according to clause B67, in which the capacitor is mounted on the wiring pattern.

[Clause B69]

The semiconductor package according to any one of clauses B38 to B68, in which the wiring pattern includes at least one of a third intermediary wiring provided halfway on a connection path between a control terminal that controls an operation of the first transistor and the first control circuit chip, and a fourth intermediary wiring provided halfway on a connection path between a control terminal that controls an operation of the second transistor and the second control circuit chip.

[Clause B70]

The semiconductor package according to clause B69, in which the wiring pattern includes the third intermediary wiring, and the semiconductor chip includes a plurality of the first transistors, the third intermediary wiring is formed on a connection path between a control terminal of the first transistor, most distant from the first control circuit chip among the plurality of first transistors, and the first control circuit chip.

[Clause B71]

The semiconductor package according to clause B69 or B70, in which the wiring pattern includes the fourth intermediary wiring, and the semiconductor chip includes a plurality of the second transistors, and the fourth intermediary wiring is formed on a connection path between a control terminal of the second transistor, most distant from the second control circuit chip among the plurality of second transistors, and the second control circuit chip.

[Clause B72]

The semiconductor package according to clause B71, in which the wiring pattern includes the fourth intermediary wiring, the semiconductor chip includes a plurality of the second transistors, the fourth intermediary wiring is individually formed on each of the connection paths between the plurality of second transistors and the second control circuit chip.

[Clause B73]

The semiconductor package according to any one of clauses B22 to B72, in which the semiconductor chip is a SiC MOSFET.

The invention claimed is:

1. A semiconductor device comprising:

a substrate including a first face;

a conductive section formed on the substrate and including a conductive material, the conductive section being in direct contact with the first face of the substrate;

a first lead that is located on the substrate and is more heat-dissipative than the substrate;

a semiconductor chip located on a portion of the first lead, said portion of the first lead being disposed between the semiconductor chip and the first face of the substrate;

a control chip that controls an operation of the semiconductor chip, the control chip being electrically connected to the conductive section and the semiconductor chip and being located on the substrate so as to be spaced apart from the semiconductor chip and the first lead in plan view; and a resin covering the semiconductor chip, the control chip, at least a part of the substrate and a part of the lead.

2. The semiconductor device according to claim 1, wherein the substrate includes a second face opposite to the first face of the substrate, and the second face is exposed from the resin.

3. The semiconductor device according to claim 1, wherein the first lead is located on the first face.

4. The semiconductor device according to claim 1, further comprising a second lead spaced apart from the first lead and located on and electrically connected to the conductive section.

5. The semiconductor device according to claim 1, wherein the conductive section contains silver.

6. The semiconductor device according to claim 3, wherein the first lead is bonded to the substrate via a first bonding material.

7. The semiconductor device according to claim 3, wherein the first lead has a part covered with the resin and another part exposed from the resin.

8. The semiconductor device according to claim 4, wherein the second lead has a part covered with the resin and another part exposed from the resin.

9. The semiconductor device according to claim 4, wherein the second lead and the conductive section are bonded to each other via a first conductive bonding material.

10. The semiconductor device according to claim 4, wherein the control chip is located between the semiconductor chip and the second lead as viewed in a first direction orthogonal to a normal direction of the first face of the substrate.

11. The semiconductor device according to claim 4, wherein the semiconductor chip is bonded to the first lead via a second conductive bonding material.

12. The semiconductor device according to claim 4, wherein the control chip is bonded to the conductive section via a third conductive bonding material.

13. The semiconductor device according to claim 4, wherein the control chip is connected to the conductive section via a second conductive material.

14. The semiconductor device according to claim 4, wherein a first voltage level of an electrical signal applied to the second lead is lower than a second voltage level for driving the control chip.

15. The semiconductor device according to claim 6, further comprising a bonding section formed on the first face of the substrate, wherein the first lead is connected to the bonding section via the first bonding material.

16. The semiconductor device according to claim 15, wherein the bonding section includes a conductive material that forms the conductive section.

17. The semiconductor device according to claim 11, wherein the semiconductor chip is connected to the first lead via a first conductive material.

18. A semiconductor device comprising:

a substrate;

a conductive section formed on the substrate and including a conductive material;

a first lead that is located on the substrate and more heat-dissipative than the substrate;

a second lead spaced apart from the first lead and located on and electrically connected to the conductive section;

a semiconductor chip located on the first lead;

a control chip that controls an operation of the semiconductor chip, the control chip being electrically connected to the conductive section and the semiconductor chip and being located on the substrate so as to be spaced apart from the semiconductor chip and the first lead in plan view;

a resin covering the semiconductor chip, the control chip, at least a part of the substrate and a part of the lead; and a first transmission circuit having a transformer structure including at least two coils opposed to each other with a spacing therebetween, the first transmission circuit being configured to transmit an electrical signal, wherein the first transmission circuit transmits the electrical signal between the control chip and the second lead.

19. The semiconductor device according to claim 18, wherein the first transmission circuit is covered with the resin.

* * * * *